US008004921B2

(12) United States Patent
(10) Patent No.: US 8,004,921 B2
(45) Date of Patent: Aug. 23, 2011

Kawakubo et al.

(54) MEMORY DEVICE, MEMORY CONTROLLER AND MEMORY SYSTEM

(75) Inventors: Tomohiro Kawakubo, Kawasaki (JP); Syusaku Yamaguchi, Kawasaki (JP); Hitoshi Ikeda, Kawasaki (JP); Toshiya Uchida, Kawasaki (JP); Hiroyuki Kobayashi, Kawasaki (JP); Tatsuya Kanda, Kawasaki (JP); Yoshinobu Yamamoto, Kawasaki (JP); Satoru Shirakawa, Kawasaki (JP); Tetsuo Miyamoto, Kawasaki (JP); Tatsushi Otsuka, Kawasaki (JP); Hidenaga Takahashi, Kawasaki (JP); Masanori Kurita, Kawasaki (JP); Shinnosuke Kamata, Kawasaki (JP); Ayako Sato, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 31 days.

(21) Appl. No.: 12/612,247

(22) Filed: Nov. 4, 2009

(65) Prior Publication Data

US 2010/0172200 A1 Jul. 8, 2010

Related U.S. Application Data

(62) Division of application No. 11/709,867, filed on Feb. 23, 2007, now abandoned.

(30) Foreign Application Priority Data

Dec. 22, 2006 (JP) ................................ 2006-345415
Jan. 19, 2007 (JP) ................................ 2007-010763
Feb. 7, 2007 (JP) ................................ 2007-027827

(51) Int. Cl.
*G11C 7/00* (2006.01)

(52) U.S. Cl. .................... 365/222; 365/230.03; 365/226

(58) Field of Classification Search .................. 365/222, 365/230.03, 226, 230.02, 189.05, 230.06, 365/230.08, 233, 236, 285.24, 185.18, 185.22, 365/185.29, 185.24, 185.21
See application file for complete search history.

(56) References Cited

U.S. PATENT DOCUMENTS

| | | | | |
|---|---|---|---|---|
| 6,219,292 | B1 | 4/2001 | Jang | |
| 2005/0265104 | A1 | 12/2005 | Remaklus et al. | |
| 2006/0004955 | A1 * | 1/2006 | Ware et al. | 711/106 |
| 2006/0087903 | A1 | 4/2006 | Riho et al. | |
| 2007/0086258 | A1 | 4/2007 | Freebern | |
| 2008/0239851 | A1 * | 10/2008 | Lin | 365/222 |

FOREIGN PATENT DOCUMENTS

JP 08-115594 A 5/1996

(Continued)

*Primary Examiner* — Dang T Nguyen
(74) *Attorney, Agent, or Firm* — Arent Fox LLP

(57) ABSTRACT

Provided is a memory device in which the decrease of the effective bandwidth caused by the refresh operation of the memory device has been solved, a memory controller of the memory device, and a memory system thereof. A memory device that is operated in response to a command from a memory controller has a plurality of banks that respectively have memory cores including memory cell arrays and decoders and are selected by bank addresses; and a control circuit, which, in response to a background refresh command, causes the memory cores within refresh target banks set by the memory controller to successively execute refresh operation a number of times corresponding to refresh burst length that is set by the memory controller, and, in response to a normal operation command, further causes the memory cores within banks other than the refresh target banks and selected by the bank addresses to execute normal memory operation corresponding to the normal operation command, during the refresh operation executed by the memory cores within the refresh target banks.

4 Claims, 184 Drawing Sheets

FOREIGN PATENT DOCUMENTS

| | | | |
|---|---|---|---|
| JP | 08-129881 | A | 5/1996 |
| JP | 08-180675 | A | 7/1996 |
| JP | 09-231745 | A | 9/1997 |
| JP | 10-11348 | A | 1/1998 |
| JP | 10-105367 | A | 4/1998 |
| JP | 2001-312885 | A | 11/2001 |
| JP | 2002-132577 | A | 5/2002 |
| KR | 2006-0053426 | A | 5/2006 |

* cited by examiner

FIG.1 Memory Mapping

IMAGE PROCESSING SYSTEM

411

| In | | Out |
|---|---|---|
| CountType | SB[1:0] | SV[1:0] |
| 0 (UpMode) | 00 | 00 |
| | 01 | 01 |
| | 10 | 10 |
| | 11 | 11 |
| 1 (DownMode) | 00 | 11 |
| | 01 | 10 |
| | 10 | 01 |
| | 11 | 00 |

MULTI-BANK ACCESS (A)

(B)

| SA'1 | SA'0 | Number of activated banks | Activation logic |
|---|---|---|---|
| L | L | 1 | |
| L | H | 2(Horizontal ) | Degenerate BA0 |
| H | L | 2(Vertical ) | Degenerate BA1 |
| H | H | 4 | Degenerate BA0, 1 |

(B)

| | Bank to be selected | Activation logic |
|---|---|---|
| SA'0 | Right bank | Invert BA0 |
| SA'1 | Lower bank | Invert BA1 |
| SA'2 | Lower right bank | Invert BA0, 1 |

FIG.77 ACTIVATING BANK DETERMINATION ALGORITHM (A)

MAPPING INFORMATION

COLUMN ADDRESS: M BITS (CA[M-1:0])
NUMBER OF STEPS OF COLUMN ADDRESS : CST, $2^S$=CS

LATERAL DIRECTION: S BITS OF CA[S − 1:0],

VERTICAL DIRECTION: M-S BITS OF CA[M-1:S]

RECTANGLE SIZE: LATERAL W * VERTICAL H

CA[0:S-1] (columns), CA[S:M-1] (rows), 14

| | 0 | 1 | 2 | …… | $2^S$-3 | $2^S$-2 | $2^S$-1 |
|---|---|---|---|---|---|---|---|
| 0 | 0 | 1 | 2 | …… | $2^S$-3 | $2^S$-2 | $2^S$-1 |
| 1 | $2^S$ | $2^S$+1 | $2^S$+2 | …… | $2^{S+1}$-3 | $2^{S+1}$-2 | $2^{S+1}$-1 |
| 2 | $2^{S+1}$ | $2^{S+1}$+1 | $2^{S+1}$+2 | …… | $2^{S+2}$-3 | $2^{S+2}$-2 | $2^{S+2}$-1 |
| ⋮ | ⋮ | ⋮ | ⋮ | | ⋮ | ⋮ | ⋮ |
| $2^{M-S}$-3 | $2^{M-3}$ | $2^{M-3}$+1 | $2^{M-3}$+2 | …… | $2^{M-2}$-3 | $2^{M-2}$-2 | $2^{M-2}$-1 |
| $2^{M-S}$-2 | $2^{M-2}$ | $2^{M-2}$+1 | $2^{M-2}$+2 | …… | $2^{M-1}$-3 | $2^{M-1}$-2 | $2^{M-1}$-1 |
| $2^{M-S}$-1 | $2^{M-1}$ | $2^{M-1}$+1 | $2^{M-1}$+2 | …… | $2^M$-3 | $2^M$-2 | $2^M$-1 |

(B)

ACTIVATING BANK DETERMINATION LOGIC (1) CONDITION OF STRADDLING BANKS IN HORIZONTAL DIRECTION $2^S$ – CA[S-1:0] < W → DEGENERATE B0

(2) CONDITION OF STRADDLING BANKS IN VERTICAL DIRECTION $2^{M-S}$ – CA[M-S:1] < H → DEGENERATE B1

(C)

EXAMPLE

CA[6:0] : 7BIT, CST=16 (S=4), CA=77, W=8, H=8

(1) HORIZONTAL DIRECTION $2^4$ – 13 = 3 < W →STRADDLE BANKS (2) VERTICAL DIRECTION $2^{7-4}$ – 4 = 4 < H →STRADDLE BANKS

CA[3:0] (columns), CA[6:4] (rows), 14X

| | 0 | …… | 12 | 13 | 14 | 15 |
|---|---|---|---|---|---|---|
| 0 | 0 | …… | 12 | 13 | 14 | 15 |
| ⋮ | ⋮ | | ⋮ | ⋮ | ⋮ | ⋮ |
| 4 | 64 | …… | 76 | 77 | 78 | 79 |
| 5 | 80 | …… | 92 | 93 | 94 | 95 |
| 6 | 96 | …… | 108 | 109 | 110 | 111 |
| 7 | 112 | …… | 124 | 125 | 126 | 127 |

FIG.80
[Activating 4 banks ]
SA'[1:0]=11
800
| | BA1,BA0 | | | |
|---|---|---|---|---|
| | 0,0 | 0,1 | 1,0 | 1,1 |
| Bank0 | 00 | 01 | 10 | 11 |
| Bank1 | 01 | 00 | 11 | 10 |
| Bank2 | 10 | 11 | 00 | 01 |
| Bank3 | 11 | 10 | 01 | 00 |
[Activating 2 banks horizontally ]
SA'[1:0]=01
801
| | BA1,BA0 | | | |
|---|---|---|---|---|
| | 0,0 | 0,1 | 1,0 | 1,1 |
| Bank0 | 00 | 01 | | |
| Bank1 | 01 | 00 | | |
| Bank2 | | | 00 | 01 |
| Bank3 | | | 01 | 00 |
[Activating 2 banks vertically ]
SA'[1:0]=10
802
| | BA1,BA0 | | | |
|---|---|---|---|---|
| | 0,0 | 0,1 | 1,0 | 1,1 |
| Bank0 | 00 | | 10 | |
| Bank1 | | 00 | | 10 |
| Bank2 | 10 | | 00 | |
| Bank3 | | 10 | | 00 |
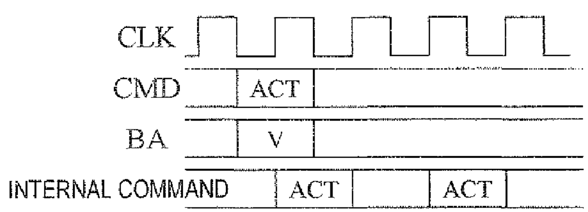
803
[Activating 2 banks vertically ]
804
| | BA1,BA0 | | | |
|---|---|---|---|---|
| | 0,0 | 0,1 | 1,0 | 1,1 |
| Bank0 | 00 | | 01 | |
| Bank1 | | 00 | | 01 |
| Bank2 | 01 | | 00 | |
| Bank3 | | 01 | | 00 |
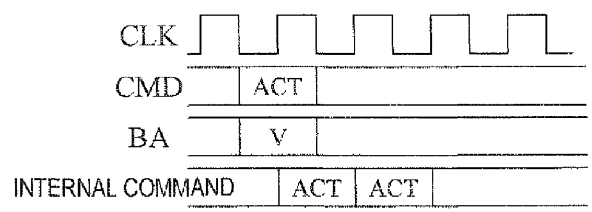
805

820

| | | WL to be activated | | | | |
|---|---|---|---|---|---|---|
| | | Bank0 | Bank1 | Bank2 | Bank3 | |
| BA1,BA0 | 0,0 | RA | RA | RA | RA | RC0 |
| | 0,1 | RA+1 | RA | RA+1 | RA | RC1 |
| | 1,0 | RA+RS | RA+RS | RA | RA | RC2 |
| | 1,1 | RA+RS+1 | RA+RS | RA+1 | RA | RC3 |

821

| | | 835 | | | | |
|---|---|---|---|---|---|---|
| | | Bank0 | Bank1 | Bank2 | Bank3 | |
| BA1,BA0 | 0,0 | 00 | 00 | 00 | 00 | RC0 |
| | 0,1 | 01 | 00 | 01 | 00 | RC1 |
| | 1,0 | 10 | 10 | 00 | 00 | RC2 |
| | 1,1 | 11 | 10 | 01 | 00 | RC3 |

97. ROW ADDRESS COMPUTER

97. ROW ADDRESS COMPUTER

| | | | |
|---|---|---|---|
| Bank0<br>RA | Bank1<br>RA | Bank0<br>RA+1 | Bank1<br>RA+1 |
| Bank2<br>RA | Bank3<br>RA | Bank2<br>RA+1 | Bank3<br>RA+1 |
| Bank0<br>RA+RS | Bank1<br>RA+RS | Bank0<br>RA+RS+1 | Bank1<br>RA+RS+1 |
| Bank2<br>RA+RS | Bank3<br>RA+RS | Bank2<br>RA+RS+1 | Bank3<br>RA+RS+1 |

AR=L

12B

| | | | |
|---|---|---|---|
| Bank0<br>RA | Bank2<br>RA | Bank0<br>RA+1 | Bank2<br>RA+1 |
| Bank1<br>RA | Bank3<br>RA | Bank1<br>RA+1 | Bank3<br>RA+1 |
| Bank0<br>RA+RS | Bank2<br>RA+RS | Bank0<br>RA+RS+1 | Bank2<br>RA+RS+1 |
| Bank1<br>RA+RS | Bank3<br>RA+RS | Bank1<br>RA+RS+1 | Bank3<br>RA+RS+1 |

AR=H

REQ: ACCESS REQUEST SIGNAL

ACK: ACCESS RESPONSE SIGNAL

RXW: READ/WRITE INSTRUCTION SIGNAL

X_POS: RECTANGLE X COORDINATE

Y_POS: RECTANGLE Y COORDINATE

X_SIZE: X-DIRECTION SIZE OF RECTANGLE

Y_SIZE: Y-DIRECTION SIZE OF RECTANGLE

ADR: HORIZONTAL ACCESS LEADING ADDRESS

SIZE: HORIZONTAL ACCESS SIZE

EN: READ/WRITE DATA ENABLE

RDATA: READ DATA

WDATA: WRITE DATA

FIG.93
(A)
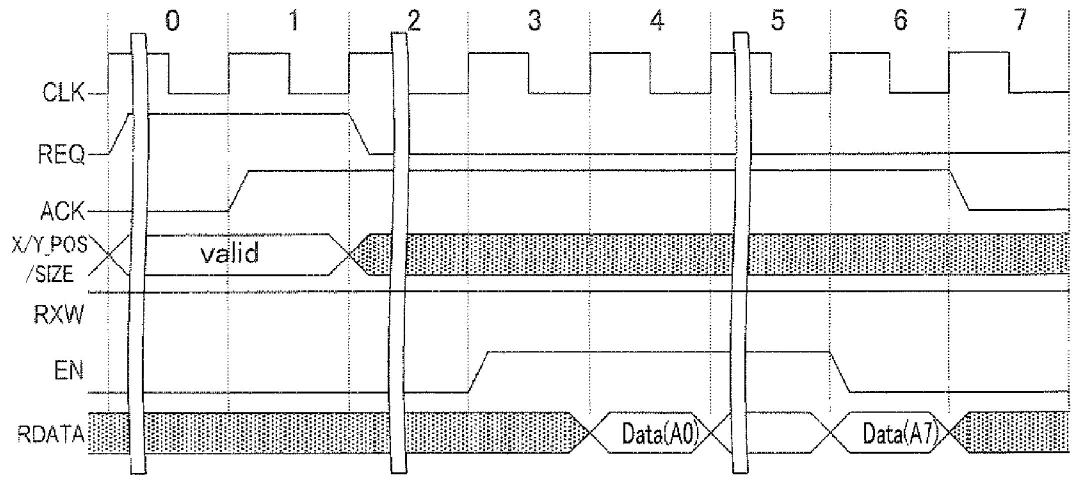
RECTANGULAR ACCESS (AT THE TIME OF READING)
(B)
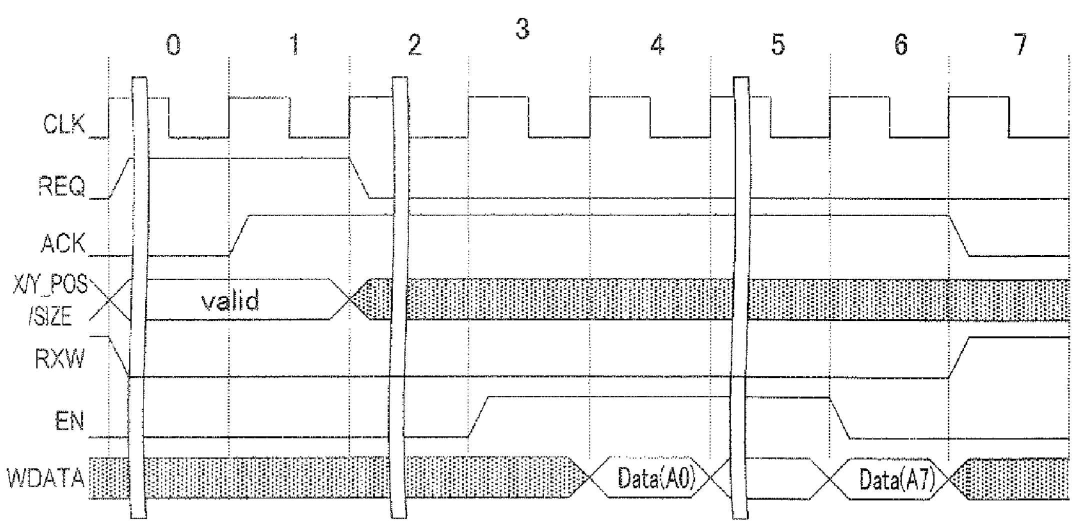
RECTANGULAR ACCESS (AT THE TIME OF WRITING)

(A)

(B)

| modez <1:0> | BA<1> | BA<0> | Operation |
|---|---|---|---|
| 11 | V | V | 1bank Refresh |
| 10 | V | X | 2bank Refresh (BANK0,1 or BANK2,3) |
| 01 | X | V | 2bank Refresh (BANK0,2 or BANK1,3) |
| 00 | X | X | 4bank Refresh |

| BA<1> | BA<0> | A<1> | A<0> | Operation |
|---|---|---|---|---|
| V | V | 1 | 1 | 1bank Refresh |
| V | X | 1 | 0 | 2bank Refresh (BANK0,1 or BANK2,3) |
| X | V | 0 | 1 | 2bank Refresh (BANK0,2 or BANK1,3) |
| X | X | 0 | 0 | 4bank Refresh |

1082(5)

| BA<1> | BA<0> | Operation |
|---|---|---|
| 0 | 0 | Refresh BANK0 and BANK1 |
| 0 | 1 | Refresh BANK1 and BANK3 |
| 1 | 0 | Refresh BANK0 and BANK2 |
| 1 | 1 | Refresh BANK2 and BANK3 |

| BA<1> | BA<0> | A<13:4> | A<3> | A<2> | A<1> | A<0> |
|---|---|---|---|---|---|---|
| X | X | X | BANK 3 | BANK 2 | BANK 1 | BANK 0 |

1085 Core Control

1231T

Register Truth Table

| A<7> | A<6> | A<5> | A<4> | Refresh Burst Length |
|---|---|---|---|---|
| 0 | 0 | 0 | 0 | 1 |
| 0 | 0 | 0 | 1 | 2 |
| 0 | 0 | 1 | 0 | 3 |
| 0 | 0 | 1 | 1 | 4 |
| 0 | 1 | 0 | 0 | 5 |
| 0 | 1 | 0 | 1 | 6 |
| 0 | 1 | 1 | 0 | 7 |
| 0 | 1 | 1 | 1 | 8 |
| 1 | 0 | 0 | 0 | 9 |
| 1 | 0 | 0 | 1 | 10 |
| 1 | 0 | 1 | 0 | 11 |
| 1 | 0 | 1 | 1 | 12 |
| 1 | 1 | 0 | 0 | 13 |
| 1 | 1 | 0 | 1 | 14 |
| 1 | 1 | 1 | 0 | 15 |
| 1 | 1 | 1 | 1 | 16 |

1085 Core Control

FIG.138

Truth Table

| A<3> | A<2> | A<1> | A<0> | Refresh Burst Length |
|---|---|---|---|---|
| 0 | 0 | 0 | 0 | 0 |
| 0 | 0 | 0 | 1 | 1 |
| 0 | 0 | 1 | 0 | 2 |
| 0 | 0 | 1 | 1 | 3 |
| 0 | 1 | 0 | 0 | 4 |
| 0 | 1 | 0 | 1 | 5 |
| 0 | 1 | 1 | 0 | 6 |
| 0 | 1 | 1 | 1 | 7 |
| 1 | 0 | 0 | 0 | 8 |
| 1 | 0 | 0 | 1 | 9 |
| 1 | 0 | 1 | 0 | 10 |
| 1 | 0 | 1 | 1 | 11 |
| 1 | 1 | 0 | 0 | 12 |
| 1 | 1 | 0 | 1 | 13 |
| 1 | 1 | 1 | 0 | 14 |
| 1 | 1 | 1 | 1 | 15 |

1085 Core Control

1085.Core Control

Diagram of timing when Refresh Burst Length = 3 (A<3:0> = 0011)

Diagram of timing for the case in which after Refresh Burst Length = 3 (A<3:0> = 0011) is set and REF is executed twice, Counter is reset by means of the combination of AREF command and Address Key (A5 =1)

Diagram of timing for the case in which after Refresh Burst Length = 3 (A<3:0> = 0011) is set and REF is executed twice, Counter is reset by means of REFSTOP command Diagram of timing for the case in which Refresh All Command is inputted Diagram of timing for the case in which after Refresh Burst Length (RBL) = 14 (A<3:0> = 1100) is inputted, RBL = 2 (A<3:0> = 0010) is additionally inputted before the counter becomes 0000b (circuit system in which the input to the Counter is added)

Diagram of timing for the case in which after Refresh Burst Length (RBL) = 14 (A<3:0> = 1110) is inputted, RBL = 2 (A<3:0> = 0010) is additionally inputted before the counter becomes 0000b (circuit system in which the input to the Counter is added)

ACTIVE AND REFRESH INTERLOCKING

1085.Core Control

| modez <1:0> | Operation |
|---|---|
| 11 | 4 BLK activation |
| 01 | 2 BLK activation |
| 00 | 1 BLK activation |

| modez <1:0> | Operation | When Refreshing | |
|---|---|---|---|
| 11 | 4 BLK activation | rax<13>=H , raz<13>=H , rax<12>=H, raz<12>=H | ⇒ All of rblkz<0:3> are H (selected) |
| 01 | 2 BLK activation | rax<13>=H , raz<13>=H | ⇒ rblkz<0, 2> are selected or rblkz<1, 3> are selected |
| 00 | 1 BLK activation | | ⇒ Any one of rblkz<0, 1, 2, 3> is selected |

DEC0 & SEL0

| SIZE+ADR[2:0] | ADR[9] | ADR[3] | DEC0 Out, SEL0 Select | SEL0 Input |
|---|---|---|---|---|
| <=8 | 0 | 0 | 0 | ACTBA0 |
| <=8 | 0 | 1 | 1 | ACTBA1 |
| <=8 | 1 | 0 | 2 | ACTBA2 |
| <=8 | 1 | 1 | 3 | ACTBA3 |
| >8 | 0 | 0 | 4 | ACTBA4 |
| >8 | 0 | 1 | 5 | ACTBA5 |
| >8 | 1 | 0 | 6 | ACTBA6 |
| >8 | 1 | 1 | 7 | ACTBA7 |

FIG.163

| Register, SEL0 Input | Set Value | Active Bank | 2BankBR(Map1) | 1BankBR(Map1) | 2BankBR(Map2) | 1BankBR(Map2) |
|---|---|---|---|---|---|---|
| ACTBA | 0(000b) | BA0 | BA2&3 | BA2 | BA1&3 | BA1 |
| ACTBA | 1(001b) | BA1 | BA2&3 | BA3 | BA0&2 | BA0 |
| ACTBA | 2(010b) | BA2 | BA0&1 | BA0 | BA1&3 | BA3 |
| ACTBA | 3(011b) | BA3 | BA0&1 | BA1 | BA0&2 | BA2 |
| ACTBA | 4(100b) | BA0&1 | BA2&3 | BA2 or 3 | | |
| ACTBA | 5(101b) | BA0&2 | | | BA1&3 | BA1 or 3 |
| ACTBA | 6(110b) | BA2&3 | BA0&1 | BA0 or 1 | | |
| ACTBA | 7(111b) | BA1&3 | | | BA0&2 | BA0 or 2 |

| | |
|---|---|
| 0 | 1 |
| 2 | 3 |

Map1

| | |
|---|---|
| 0 | 2 |
| 1 | 3 |

Map2

FIG.164

DEC1 Table

| SEL0 output, DEC1 Input | Active Bank |
|---|---|
| 0(000b) | BANK0 |
| 1(001b) | BANK1 |
| 2(010b) | BANK2 |
| 3(011b) | BANK3 |
| 4(100b) | BANK0 & 1 |
| 5(101b) | BANK0 & 2 |
| 6(110b) | BANK2 & 3 |
| 7(111b) | BANK1 & 3 |

FIG.165

Register Set Value 1

| | |
|---|---|
| ACTBA0 | 0(000b) |
| ACTBA1 | 1(001b) |
| ACTBA2 | 2(010b) |
| ACTBA3 | 3(011b) |
| ACTBA4 | 4(100b) |
| ACTBA5 | 4(100b) |
| ACTBA6 | 6(110b) |
| ACTBA7 | 6(110b) |

Map 1

| | |
|---|---|
| 0 | 1 |
| 2 | 3 |

FIG.166

DEC1

| SIZE＋ADR[2:0] | ADR[9] | ADR[3] | DEC0 Out, SEL0 Select | SEL0 Input | SEL0 Output | DEC1 Output | NOTE |
|---|---|---|---|---|---|---|---|
| <=8 | 0 | 0 | 0 | ACTBA0 | 0(000b) | BANK0 Select | 1 Bank Select |
| <=8 | 0 | 1 | 1 | ACTBA1 | 1(001b) | BANK1 Select | 1 Bank Select |
| <=8 | 1 | 0 | 2 | ACTBA2 | 2(010b) | BANK2 Select | 1 Bank Select |
| <=8 | 1 | 1 | 3 | ACTBA3 | 3(011b) | BANK3 Select | 1 Bank Select |
| >8 | 0 | 0 | 4 | ACTBA4 | 4(100b) | BANK0 & 1 Select | 2Bank Select |
| >8 | 0 | 1 | 5 | ACTBA5 | 4(100b) | BANK0 & 1 Select | 2Bank Select |
| >8 | 1 | 0 | 6 | ACTBA6 | 6(110b) | BANK2 & 3 Select | 2Bank Select |
| >8 | 1 | 1 | 7 | ACTBA7 | 6(110b) | BANK2 & 3 Select | 2Bank Select |

Register Set Value 2

| | |
|---|---|
| ACTBA0 | 0(000b) |
| ACTBA1 | 2(010b) |
| ACTBA2 | 1(001b) |
| ACTBA3 | 3(011b) |
| ACTBA4 | 5(101b) |
| ACTBA5 | 5(101b) |
| ACTBA6 | 7(111b) |
| ACTBA7 | 7(111b) |

Map 2

| | |
|---|---|
| 0 | 2 |
| 1 | 3 |

FIG.167

DEC1

| SIZE＋ADR[2:0] | ADR[9] | ADR[3] | DEC0 Out, SEL0 Select | SEL0 Input | SEL0 Output | DEC1 Output | NOTE |
|---|---|---|---|---|---|---|---|
| <=8 | 0 | 0 | 0 | ACTBA0 | 0(000b) | BANK0 Select | 1 Bank Select |
| <=8 | 0 | 1 | 1 | ACTBA1 | 2(010b) | BANK2 Select | 1 Bank Select |
| <=8 | 1 | 0 | 2 | ACTBA2 | 1(001b) | BANK1 Select | 1 Bank Select |
| <=8 | 1 | 1 | 3 | ACTBA3 | 3(011b) | BANK3 Select | 1 Bank Select |
| >8 | 0 | 0 | 4 | ACTBA4 | 5(101b) | BANK0 & 2 Select | 2Bank Select |
| >8 | 0 | 1 | 5 | ACTBA5 | 5(101b) | BANK0 & 2 Select | 2Bank Select |
| >8 | 1 | 0 | 6 | ACTBA6 | 7(111b) | BANK1 & 3 Select | 2Bank Select |
| >8 | 1 | 1 | 7 | ACTBA7 | 7(111b) | BANK1 & 3 Select | 2Bank Select |

SEL0

| SEL0 Output | SEL1 Selected Input |
|---|---|
| 0(00b) | BRBA0 |
| 1(01b) | BRBA1 |
| 2(10b) | BRBA2 |
| 3(11b) | BRBA3 |

FIG.168

DEC2 Table

| SEL1 Output, DEC2 Input | DEC2 Output | | | | | | NOTE |
|---|---|---|---|---|---|---|---|
| | BA[1] | BA[0] | A[3] | A[2] | A[1] | A[0] | |
| 0 | * | * | * | * | * | 1 | 1Bank BR, BANK0 |
| 1 | * | * | * | * | 1 | * | 1Bank BR, BANK1 |
| 2 | * | * | * | 1 | * | * | 1Bank BR, BANK2 |
| 3 | * | * | 1 | * | * | * | 1Bank BR, BANK3 |
| 4 | 0 | 0 | * | * | * | * | 2Bank BR, BANK0&1 |
| 5 | 1 | 0 | * | * | * | * | 2Bank BR, BANK0&2 |
| 6 | 1 | 1 | * | * | * | * | 2Bank BR, BANK2&3 |
| 7 | 0 | 1 | * | * | * | * | 2Bank BR, BANK1&3 |

FIG.169

Register Set Value 11

| | |
|---|---|
| BRBA0 | 6 |
| BRBA1 | 6 |
| BRBA2 | 4 |
| BRBA3 | 4 |

Map 1

| | |
|---|---|
| 0 | 1 |
| 2 | 3 |

FIG.170

DEC2

| SEL0 Output, SEL1 Select | SEL1Selected Input | SEL1 Output, DEC2 Input | DEC2 Output | | | | | | NOTE |
|---|---|---|---|---|---|---|---|---|---|
| | | | BA[1] | BA[0] | A[3] | A[2] | A[1] | A[0] | |
| 0(00b) | BRBA0 | 6 | 1 | 1 | * | * | * | * | 2Bank BR、BANK2&3 |
| 1(01b) | BRBA1 | 6 | 1 | 1 | * | * | * | * | 2Bank BR、BANK2&3 |
| 2(10b) | BRBA2 | 4 | 0 | 0 | * | * | * | * | 2Bank BR、BANK0&1 |
| 3(11b) | BRBA3 | 4 | 0 | 0 | * | * | * | * | 2Bank BR、BANK0&1 |

Register Set Value 12

| | |
|---|---|
| BRBA0 | 7 |
| BRBA1 | 7 |
| BRBA2 | 5 |
| BRBA3 | 5 |

Map 2

| | |
|---|---|
| 0 | 2 |
| 1 | 3 |

FIG.171

DEC2

| SEL0 Output, SEL1 Select | SEL1Selected Input | SEL1 Output, DEC2 Input | DEC2 Output | | | | | | NOTE |
|---|---|---|---|---|---|---|---|---|---|
| | | | BA[1] | BA[0] | A[3] | A[2] | A[1] | A[0] | |
| 0(00b) | BRBA0 | 7 | 0 | 1 | * | * | * | * | 2Bank BR、BANK1&3 |
| 1(01b) | BRBA1 | 7 | 0 | 1 | * | * | * | * | 2Bank BR、BANK1&3 |
| 2(10b) | BRBA2 | 5 | 1 | 0 | * | * | * | * | 2Bank BR、BANK0&2 |
| 3(11b) | BRBA3 | 6 | 1 | 0 | * | * | * | * | 2Bank BR、BANK0&2 |

FIG.172

Register Set Value 13

| | |
|---|---|
| BRBA0 | 2 |
| BRBA1 | 3 |
| BRBA2 | 0 |
| BRBA3 | 1 |

Map 1

| | |
|---|---|
| 0 | 1 |
| 2 | 3 |

DEC2

| SEL0 Output, SEL1 Select | SEL1Selected Input | SEL1 Output, DEC2 Input | DEC2 Output | | | | | | NOTE |
|---|---|---|---|---|---|---|---|---|---|
| | | | BA[1] | BA[0] | A[3] | A[2] | A[1] | A[0] | |
| 0(00b) | BRBA0 | 2 | * | * | * | 1 | * | * | 1Bank BR, BANK2 |
| 1(01b) | BRBA1 | 3 | * | * | 1 | * | * | * | 1Bank BR, BANK3 |
| 2(10b) | BRBA2 | 0 | * | * | * | * | * | 1 | 1Bank BR, BANK0 |
| 3(11b) | BRBA3 | 1 | * | * | * | * | 1 | * | 1Bank BR, BANK1 |

FIG.173

Register Set Value 14

| | |
|---|---|
| BRBA0 | 1 |
| BRBA1 | 3 |
| BRBA2 | 0 |
| BRBA3 | 2 |

Map 2

| | |
|---|---|
| 0 | 2 |
| 1 | 3 |

DEC2

| SEL0 Output, SEL1 Select | SEL1Selected Input | SEL1 Output, DEC2 Input | DEC2 Output | | | | | | NOTE |
|---|---|---|---|---|---|---|---|---|---|
| | | | BA[1] | BA[0] | A[3] | A[2] | A[1] | A[0] | |
| 0(00b) | BRBA0 | 1 | * | * | * | * | 1 | * | 1Bank BR, BANK1 |
| 1(01b) | BRBA1 | 3 | * | * | 1 | * | * | * | 1Bank BR, BANK0 |
| 2(10b) | BRBA2 | 0 | * | * | * | * | * | 1 | 1Bank BR, BANK3 |
| 3(11b) | BRBA3 | 2 | * | * | * | 1 | * | * | 1Bank BR, BANK2 |

FIG.175

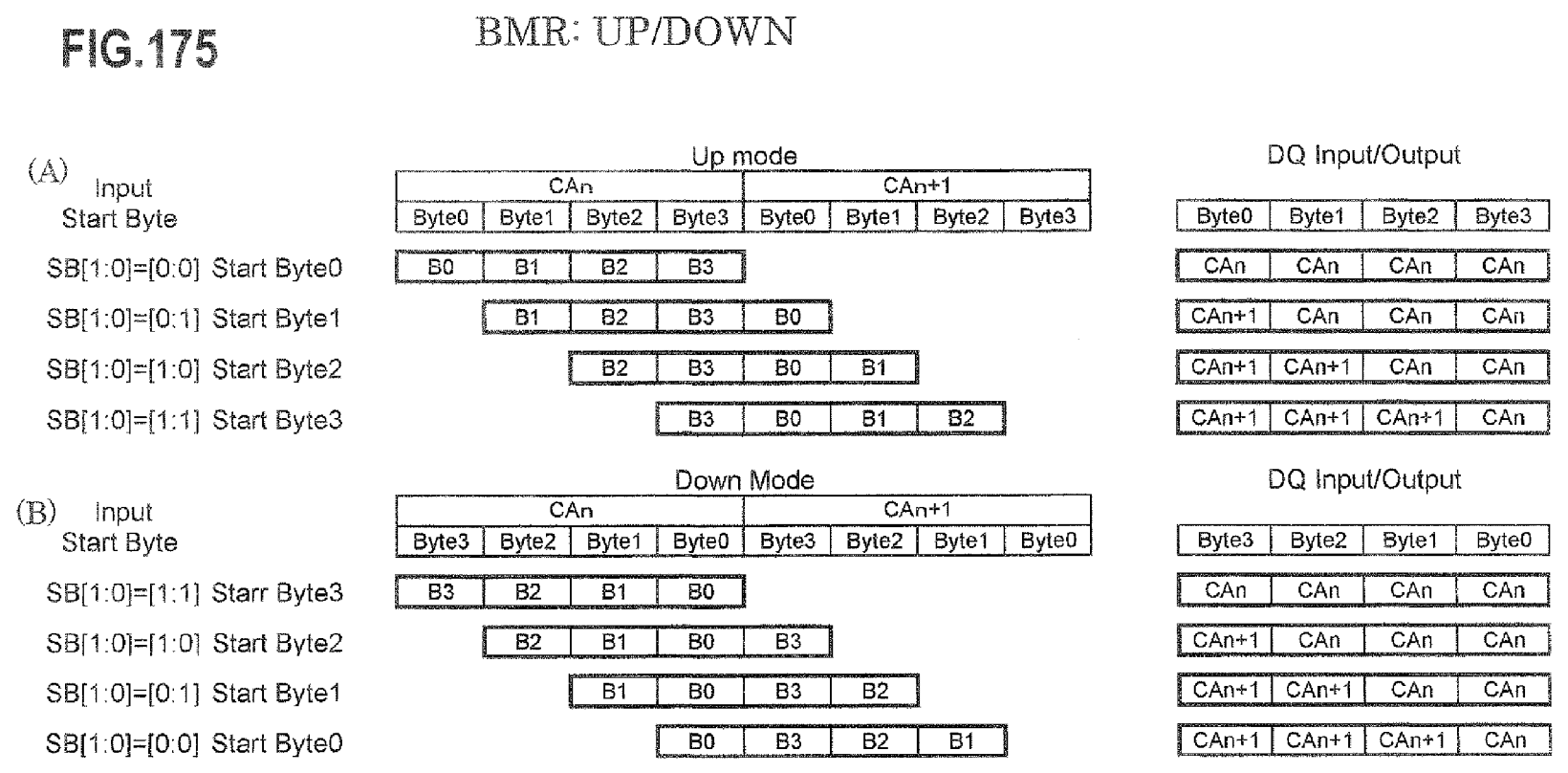

BMR: UP/DOWN (A)

Up mode

| Input Start Byte | CAn Byte0 | CAn Byte1 | CAn Byte2 | CAn Byte3 | CAn+1 Byte0 | CAn+1 Byte1 | CAn+1 Byte2 | CAn+1 Byte3 |
|---|---|---|---|---|---|---|---|---|
| SB[1:0]=[0:0] Start Byte0 | B0 | B1 | B2 | B3 | | | | |
| SB[1:0]=[0:1] Start Byte1 | | B1 | B2 | B3 | B0 | | | |
| SB[1:0]=[1:0] Start Byte2 | | | B2 | B3 | B0 | B1 | | |
| SB[1:0]=[1:1] Start Byte3 | | | | B3 | B0 | B1 | B2 | |

DQ Input/Output

| Byte0 | Byte1 | Byte2 | Byte3 |
|---|---|---|---|
| CAn | CAn | CAn | CAn |
| CAn+1 | CAn | CAn | CAn |
| CAn+1 | CAn+1 | CAn | CAn |
| CAn+1 | CAn+1 | CAn+1 | CAn |

(B)

Down Mode

| Input Start Byte | CAn Byte3 | CAn Byte2 | CAn Byte1 | CAn Byte0 | CAn+1 Byte3 | CAn+1 Byte2 | CAn+1 Byte1 | CAn+1 Byte0 |
|---|---|---|---|---|---|---|---|---|
| SB[1:0]=[1:1] Starr Byte3 | B3 | B2 | B1 | B0 | | | | |
| SB[1:0]=[1:0] Start Byte2 | | B2 | B1 | B0 | B3 | | | |
| SB[1:0]=[0:1] Start Byte1 | | | B1 | B0 | B3 | B2 | | |
| SB[1:0]=[0:0] Start Byte0 | | | | B0 | B3 | B2 | B1 | |

DQ Input/Output

| Byte3 | Byte2 | Byte1 | Byte0 |
|---|---|---|---|
| CAn | CAn | CAn | CAn |
| CAn+1 | CAn | CAn | CAn |
| CAn+1 | CAn+1 | CAn | CAn |
| CAn+1 | CAn+1 | CAn+1 | CAn |

FIG.177

AR: Memory Map Arrangement

*TypeA* (AR=0)

| | | | | | | | | |
|---|---|---|---|---|---|---|---|---|
| Bank0 RA0 | Bank1 RA0 | Bank0 RA1 | Bank1 RA1 | ..... | Bank0 RA6 | Bank1 RA6 | Bank0 RA7 | Bank1 RA7 |
| Bank2 RA0 | Bank3 RA0 | Bank2 RA1 | Bank3 RA1 | ..... | Bank2 RA6 | Bank3 RA6 | Bank2 RA7 | Bank3 RA7 |
| Bank0 RA8 | Bank1 RA8 | Bank0 RA9 | Bank1 RA9 | ..... | Bank0 RA14 | Bank1 RA14 | Bank0 RA15 | Bank1 RA15 |
| Bank2 RA8 | Bank3 RA8 | Bank2 RA9 | Bank3 RA9 | ..... | Bank2 RA14 | Bank3 RA14 | Bank2 RA15 | Bank3 RA15 |

*TypeB* (AR=1)

| | | | | | | | | |
|---|---|---|---|---|---|---|---|---|
| Bank0 RA0 | Bank2 RA0 | Bank0 RA1 | Bank2 RA1 | ..... | Bank0 RA6 | Bank2 RA6 | Bank0 RA7 | Bank2 RA7 |
| Bank1 RA0 | Bank3 RA0 | Bank1 RA1 | Bank3 RA1 | ..... | Bank1 RA6 | Bank3 RA6 | Bank1 RA7 | Bank3 RA7 |
| Bank0 RA8 | Bank2 RA8 | Bank0 RA9 | Bank2 RA9 | ..... | Bank0 RA14 | Bank2 RA14 | Bank0 RA15 | Bank2 RA15 |
| Bank1 RA8 | Bank3 RA8 | Bank1 RA9 | Bank3 RA9 | ..... | Bank1 RA14 | Bank3 RA14 | Bank1 RA15 | Bank3 RA15 |

RBL: Refresh Burst Length
RBC: Refresh Block Count

MEMORY DEVICE, MEMORY CONTROLLER AND MEMORY SYSTEM

CROSS-REFERENCE TO RELATED APPLICATIONS

This application is a Divisional Application of U.S. patent application Ser. No. 11/709,867, filed Feb. 23, 2007 now abandoned, which is based upon and claims the benefit of priority from the prior Japanese Patent Application No. 2006-345415, filed on Dec. 22, 2006, Japanese Patent Application No. 2007-10763 filed on Jan. 19, 2007, and Japanese Patent Application No. 2007-27827, filed on Feb. 7, 2007, the entire contents of which are incorporated herein by reference.

BACKGROUND OF THE INVENTION

1. Technical Field

The present invention relates to a memory device for recording two-dimensionally arrayed data including digital image data, a memory controller of the memory device, and a memory system. Particularly, the present invention relates to a memory device, memory controller and memory system for increasing an effective bandwidth indicating the number of data items that can be processed per unit time.

2. Prior Art

The market size of the memory devices for recording two-dimensionally arrayed data, like digital image data, has been gradually increasing along with the popularization of video distribution through digital broadcasting or the Internet. Digital image data is a group of data obtained by constituting gradation information of pixels using a plurality of bits (e.g., 256 gradation levels of 8 bits). For example, one frame of image data for high-definition broadcasting is constituted by 1920×1040 pixels. Each frame of this image data is arranged in an address space within image memory in accordance with a predetermined mapping method.

Such memory mapping is defined so that the most efficient access can be made, on the basis of the configuration and operation of synchronous DRAM (SDRAM) that is presently popular. For example, SDRAM has a plurality of banks, and each bank has a plurality of word lines and bit lines, a plurality of memory cells that are at the intersections of the word lines and bit lines, and sense amplifiers corresponding to the bit lines. The plurality of banks can independently execute active operation. The active operation performed in the SDRAM is a series of operations for selecting a word line and activating the corresponding sense amplifier on the basis of a row address. Further, read operation performed in the SDRAM is a series of operations for outputting a bit-line potential as read data to an input/output terminal on the basis of a column address, the bit-line potential being amplified by the sense amplifier, while write operation is a series of operations for inputting selected write data, which is inputted from the input/output memory, to a bit line that is selected based on the column address.

An address space within a memory of the SDRAM is constituted by a plurality of page areas each of which can be selected by a bank address and a row address, and each of the page areas has a group of bits or a group of bytes that can be selected by a column address. The group of bytes (or the group of bits) that are selected by the column address are inputted/outputted via a plurality of input/output terminals.

According to a generally known mapping method, a pixel of digital image data is associated with each byte (or bits) of the group of bytes (or the group of bits) that can be selected by the column address within a page area. Moreover, according to this mapping method, each of the banks of the SDRAM can independently execute the active operation and the read or write operation, thus the plurality of page areas associated with an arrangement of pixels of the digital image data are arranged so that page areas that are vertically and horizontally adjacent to each other on the image correspond to different bank addresses respectively. For example, if the SDRAM is constituted by four banks, the page areas corresponding to bank addresses BA=0, 1 are alternately arranged in the odd-numbered rows, while the page areas corresponding to bank addresses BA=2, 3 are alternately arranged in the even-numbered rows. By arranging the page areas in this manner, when reading or writing one frame of image data, different banks can execute the active operation and the read or write operation alternately and temporally overlapped, and a bandwidth, which is the number of processable pixels per a unit time, can be increased remarkably.

Patent Documents 1 and 2 describe that the access efficiency is improved by allowing simultaneous access to a plurality of rows in a semiconductor memory for storing image data.

Furthermore, Patent Document 3 describes a memory device that is provided with a sub-array selection circuit for performing control to activate, simultaneously, a sub-array allocated to an input row address and a sub-array allocated to a row address right above the input row address, in order to solve the increased reading time and power consumption since the data in every other row need to be read when using the DRAM in image expansion processing.

However, Patent Document 3 is designed to enhance the efficiency of horizontal accesses that are made continuously in a row direction of the image, and thus does not describe the rectangular access.

Moreover, Patent Document 4 describes a data processing system in which a bus controller issues an address active command, in response to an access instruction sent from a data processing section, to a storage area different from a storage area accessed in a burst mode, and thereby setting of an access address is made possible. Specifically, while the memory controller activates and accesses one bank, an active command is issued to other bank to perform active operation before hand on this bank, whereby acceleration of read/write operation can be realized.

Also, Patent Document 5 discloses an image processing device having: an image memory; and a control unit for continuously generating a column address while accessing an arbitrary bank, to continuously access an arbitrary address within the same page, and row-activating a bank to be subsequently accessed in advance and thereby immediately accessing the bank to be newly accessed even if accessed bank is switched to another bank. Specifically, there is described that the memory controller has an address order prediction circuit to predict a bank to be subsequently accessed and issue an active command to the memory.

Patent Literature 6 describes a memory system, wherein a volatile memory is provided in a plurality of banks, a refresh target bank is specified by an auto-refresh command, and, during a refresh operation performed by the refresh target bank, the banks other than the refresh target bank execute a normal memory operation in response to a normal memory operation command. However, Patent Literature 6 does not describe that a plurality of refresh counts are set beforehand to perform refresh control.

Patent Literature 7 describes a memory device in which a dual port DRAM is divided into a plurality of banks, and a data read transfer cycle is performed on one bank in synchronization with a refresh cycle performed on other banks.

Patent Literature 8 describes that the memory controller executes access control on the SDRAM with two banks to read and write-data, and performs refresh operation by issuing an active command and a pre-charge command to a bank different from the accessed bank.

Patent Literature 9 describes that in the case in which access and refresh are generated simultaneously in a DRAM with two blocks, or in the case in which access has been already generated in one block, an arbiter causes the other block to execute refresh operation, and causes the former block to execute access operation.

[Patent Literature 1] Japanese Unexamined Patent Application Publication No. 2001-312885

[Patent Literature 2] Japanese Unexamined Patent Application Publication No. H08-180675

[Patent Literature 3] Japanese Unexamined Patent Application Publication No. H09-231745

[Patent Literature 4] Japanese Unexamined Patent Application Publication No. 2002-132577

[Patent Literature 5] Japanese Unexamined Patent Application Publication No. H10-105367

[Patent Literature 6] U.S. Patent Application Publication No. US2005/0265104A1

[Patent Literature 7] Japanese Unexamined Patent Application Publication No. H08-115594

[Patent Literature 8] Japanese Unexamined Patent Application Publication No. H09-129881

[Patent Literature 9] Japanese Unexamined Patent Application Publication No. H10-11348

The occurrence of a decrease of the effective bandwidth is not limited in the rectangular access. In a generally-used synchronous DRAM (SDRAM), in response to an auto-refresh command issued from the memory controller, refresh operation is performed in all banks in parallel on the basis of the refresh addresses of the refresh address counters that are commonly provided in the memory. For this reason, once the refresh operation is started, neither horizontal access nor rectangular access can be executed, and the access operation needs to be kept in standby until the refresh operation is ended. As a result, the effective bandwidth decreases.

An object of the present invention, therefore, is to provide a memory device in which the decrease of the effective bandwidth caused by the refresh operation of the memory device has been solved, a memory controller of the memory device, and a memory system thereof.

DISCLOSURE OF THE INVENTION

In order to achieve the above object, according to a first aspect of the present invention, there is provided a memory device having: a plurality of banks that respectively have memory cores including memory cell arrays and are selected by bank addresses; and a control circuit, which, in response to a background refresh command and refresh burst length information, causes the memory cores within refresh target banks to successively execute refresh operation a number of times corresponding to the refresh burst length information.

In order to achieve the above object, according to a second aspect of the present invention, there is provided a memory device that operates in response to a command sent from a memory controller, the memory device having: a plurality of banks that respectively have memory cores including memory cell arrays and are selected by bank addresses; and a control circuit, which, in response to a background refresh command, causes the memory cores within refresh target banks set by the memory controller to successively execute refresh operation a number of times corresponding to refresh burst length that is set by the memory controller, and, in response to a normal operation command, further causes the memory cores within banks other than the refresh target banks and selected by the bank addresses to execute normal memory operation corresponding to the normal operation command, during the refresh operation executed by the memory cores within the refresh target banks.

In the second aspect of the present invention, according to a first preferred embodiment, the memory device further has: a refresh address counter that counts refresh target addresses within each of the plurality of banks or within each of a plurality of groups of the plurality of banks. Also, the control circuit has: a background refresh controller that outputs refresh control signals to the set refresh target banks in response to the background refresh command; a refresh burst length register in which the refresh burst length is set; and a core controller that is provided in each of the plurality of banks, and, in response to the background refresh control signals, causes the memory cores to execute refresh operation on the addresses of the refresh address counter a number of times corresponding to the refresh burst length set in the refresh burst length register.

In the second aspect of the present invention, according to a second preferred embodiment, a refresh block count that indicates the number of memory blocks activated simultaneously in a single refresh cycle is set by the memory controller, and the control circuit causes the refresh target banks to execute the refresh operation a number of times corresponding to the set refresh burst length, in response to the background refresh command, the refresh operation being performed for simultaneously activating the blocks for the number of the refresh block count. The refresh block count is set by a mode register in advance. Alternatively, the refresh block count is inputted and set along with the background refresh command.

In the second aspect of the present invention, according to a third preferred embodiment, the refresh burst length and the refresh block count are inputted simultaneously with the background refresh command. Alternatively, the refresh burst length and the refresh block count are inputted simultaneously with a mode register setting command. In the first case, the refresh burst length register is provided in each of the banks, and the inputted refresh burst length is set in the refresh burst length register with in the refresh target banks. Further, a refresh block count register is provided, and the refresh block count that is inputted is set in the refresh block count register. In the latter case, the refresh burst length register is provided within the mode register, and the inputted refresh burst length is set in the mode register. Similarly, the refresh block count register is provided within the mode register, and the refresh block count that is inputted is set in the mode register.

In the second aspect of the present invention, according to the third preferred embodiment, during the refresh operation executed a number of times corresponding to the refresh burst length, the core controller causes, in response to a newly inputted background refresh command, the memory cores within the refresh target banks to successively execute the refresh operation a number of times that is obtained by adding the refresh burst length to the remaining number of times of the refresh operation.

Alternatively, during the refresh operation executed a number of times corresponding to the refresh burst length, the core controller causes, in response to a newly inputted background refresh command, the memory cores within the refresh target banks to successively execute the refresh operation a number of times corresponding to the refresh burst length, regardless of the remaining number of times of the refresh operation.

Furthermore, the core controller causes, in response to a refresh-all command, the memory cores within the refresh target banks to repeatedly execute the refresh operation on the addresses of the refresh address counter as well as the remaining addresses.

In the second aspect of the present invention, according to a fourth preferred embodiment, during the refresh operation performed a number of times corresponding to the refresh burst length, the core controller causes the memory cores within the refresh target banks to stop the refresh operation, in response to a background refresh stop command. The stop control of the refresh operation is performed so as not to start a subsequent refresh operation after the memory cores within the refresh target banks end the refresh operation that is being executed.

In the second aspect of the present invention, according to a fifth preferred embodiment, on the basis of the setting of an active refresh interlock flag in the mode register, the background refresh controller supplies the background refresh control signals to banks other than an access target bank corresponding to a bank address to be inputted, in response to a normal memory operation command. Accordingly, the memory controller can execute the refresh operation on the banks other than the access target bank by issuing the normal memory operation command without issuing the background refresh command.

In order to achieve the above object, according to a third aspect of the present invention, a memory device has a plurality of banks that respectively have memory cores including memory cell arrays and are selected by bank addresses, wherein a memory logical space has a plurality of page areas that are selected by the bank addresses and row addresses, and each of the plurality of banks stores two-dimensionally arrayed data on the basis of a memory mapping in which the plurality of page areas are arranged in rows and columns, and in which adjacent page areas are associated with different bank addresses. The memory device also has a control circuit that causes the memory cores within banks selected by the bank addresses to execute normal memory operation corresponding to a normal operation command in response to the normal operation command during a period of horizontal access in which the two-dimensionally arrayed data is accessed horizontally, and further causes a memory core within a refresh target bank other than the horizontal access target bank to execute refresh operation in response to a background refresh command. Moreover, during a period of rectangular access in which an arbitrary rectangular area is accessed for the two-dimensionally arrayed data, the control circuit causes the memory cores within the banks selected by the bank addresses and within banks adjacent to the selected banks, to execute the normal memory operation in response to the normal operation command, and prohibits the refresh operation during the normal memory operation.

According to the third aspect described above, the memory device performs the normal memory operation on the selected bank because the normal memory operation is repeated on a specific bank during the horizontal access period, and performs the refresh operation on the refresh target bank other than the horizontal access target bank. However, during the rectangular access period, a memory access target bank cannot be predicted, thus the refresh operation that is performed along with the normal memory operation is prohibited. Accordingly, the horizontal access can be continued even during the background refresh operation, whereby the effective bandwidth can be increased.

In order to achieve the above object, according to a fourth aspect of the present invention, the memory system has the memory device of the first and second aspects and the memory controller that supplies commands to the memory device.

In order to achieve the above object, according to a fifth aspect of the present invention, the memory controller supplies the commands, refresh bank information, and refresh burst length to the memory device of the first and second aspects.

BRIEF DESCRIPTION OF THE DRAWINGS

FIG. 77 A figure showing the third example of the multi-bank activation controller 88.

FIG. 80 A figure for explaining the logic of the bank activation timing control performed by the activating bank control circuit 88C.

FIG. 85 A figure showing two examples of memory mapping.

FIG. 93 A timing chart of the signals between the access source blocks and the interfaces.

Figure 120:
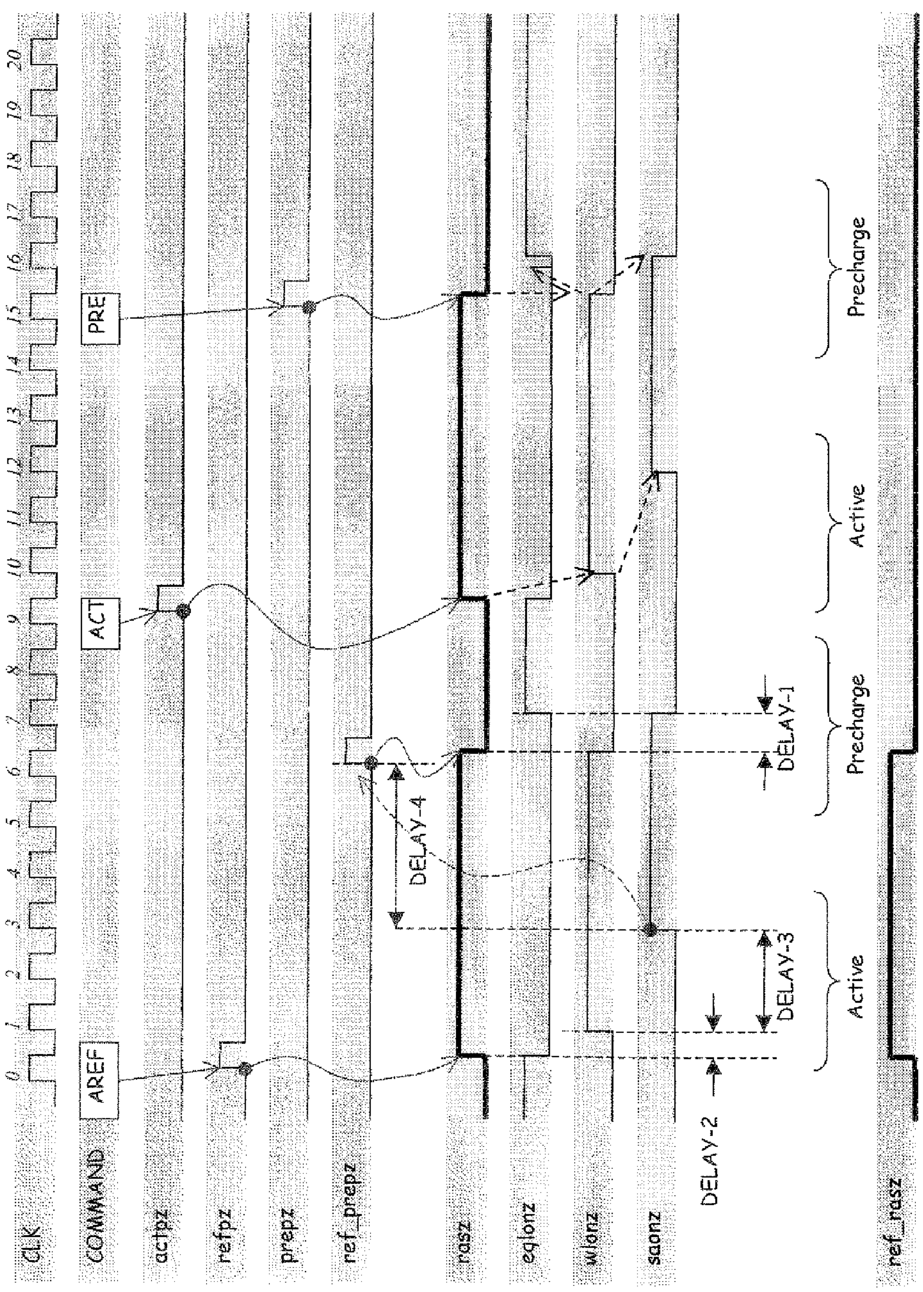

FIG. 120 A timing chart showing an operation of the core control circuit.

Figure 121:
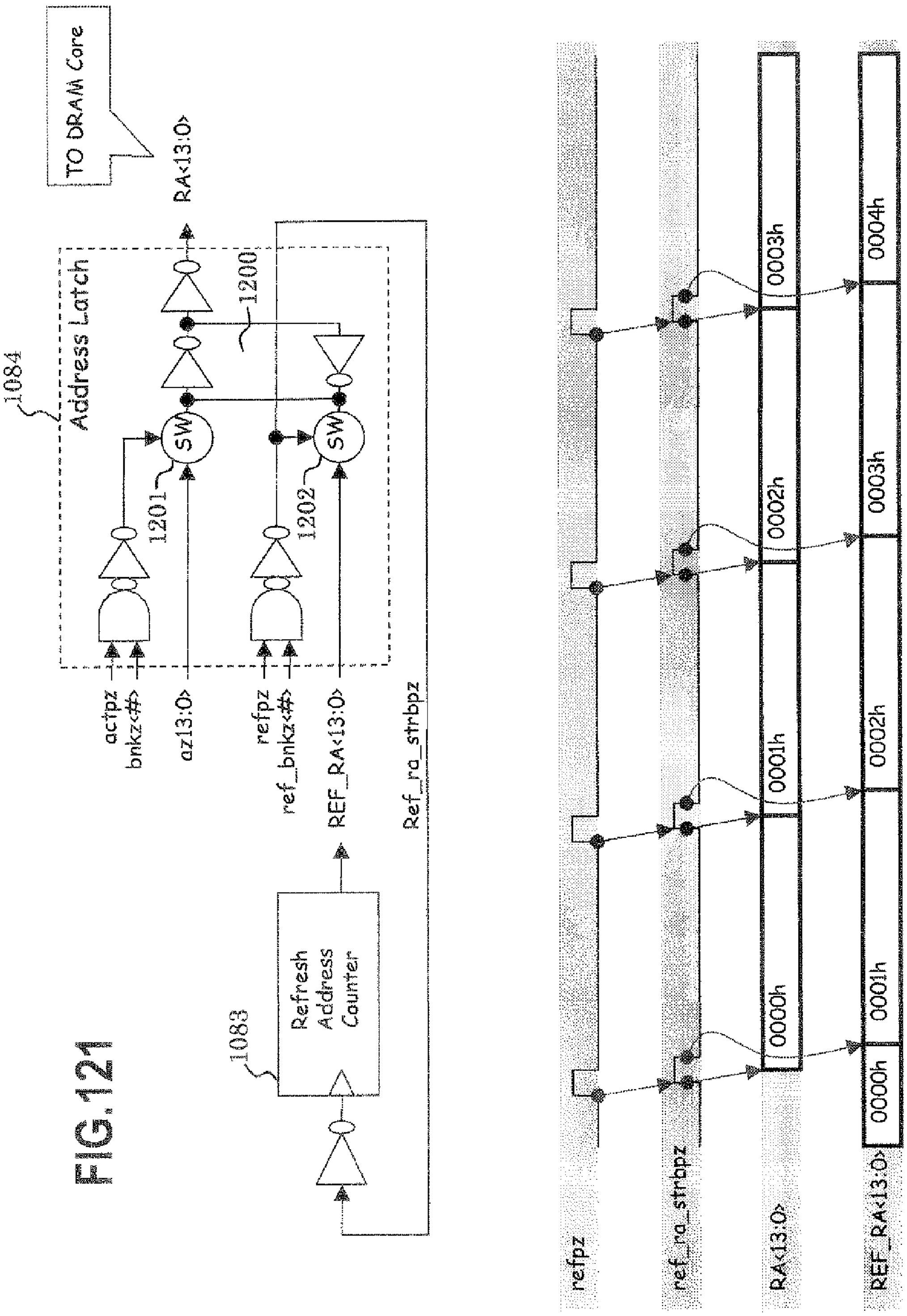

FIG. 121 A figure showing a configuration and an operation of the address latch circuit.

Figure 122:
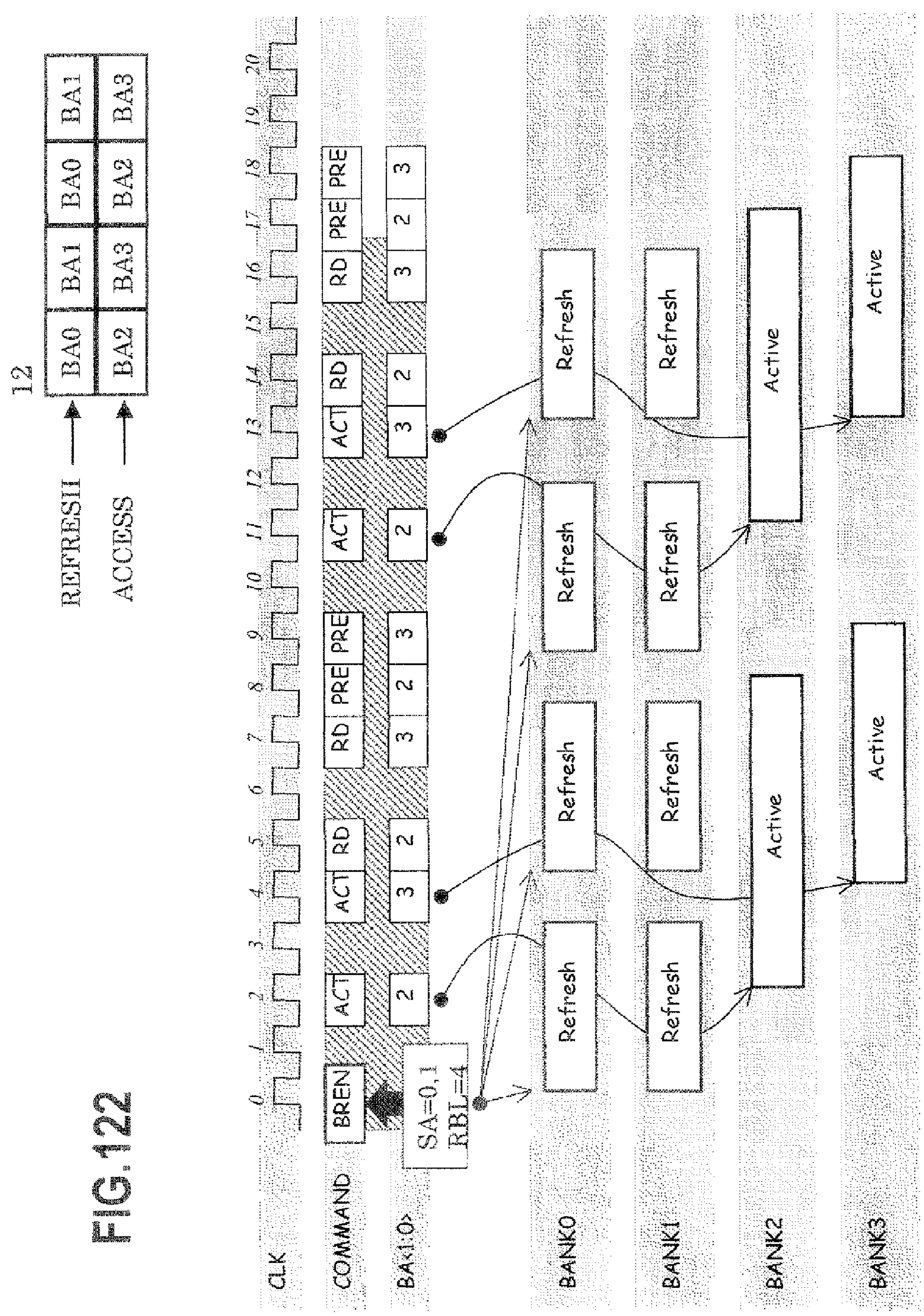

FIG. 122 A timing chart showing a refresh burst operation.

Figure 123:
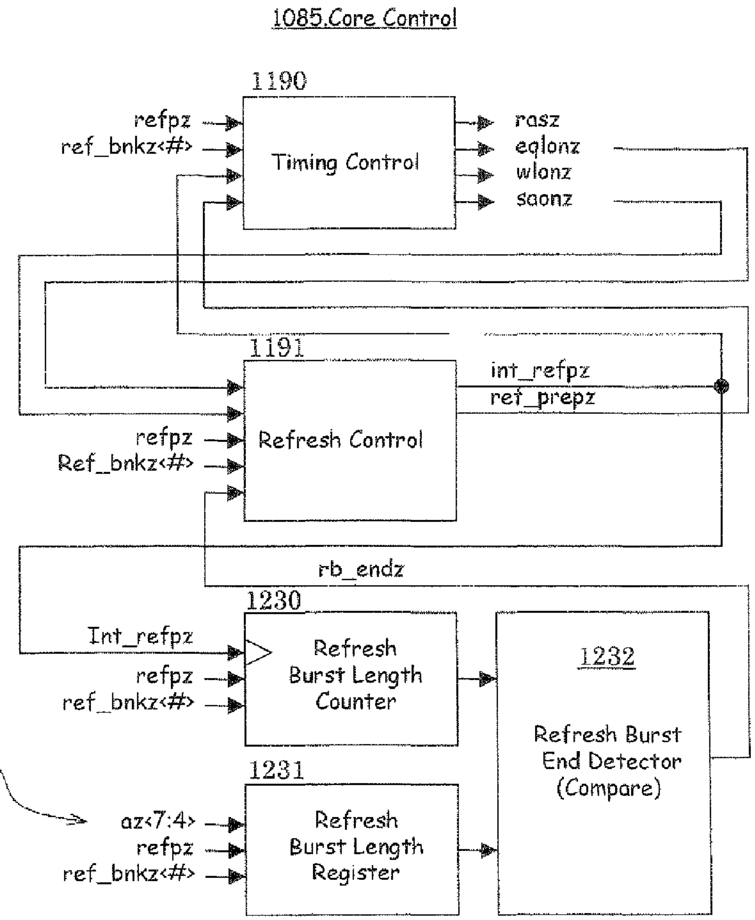

FIG. 123 A configuration diagram of the core control circuit that controls the refresh burst operation.

Figure 124:
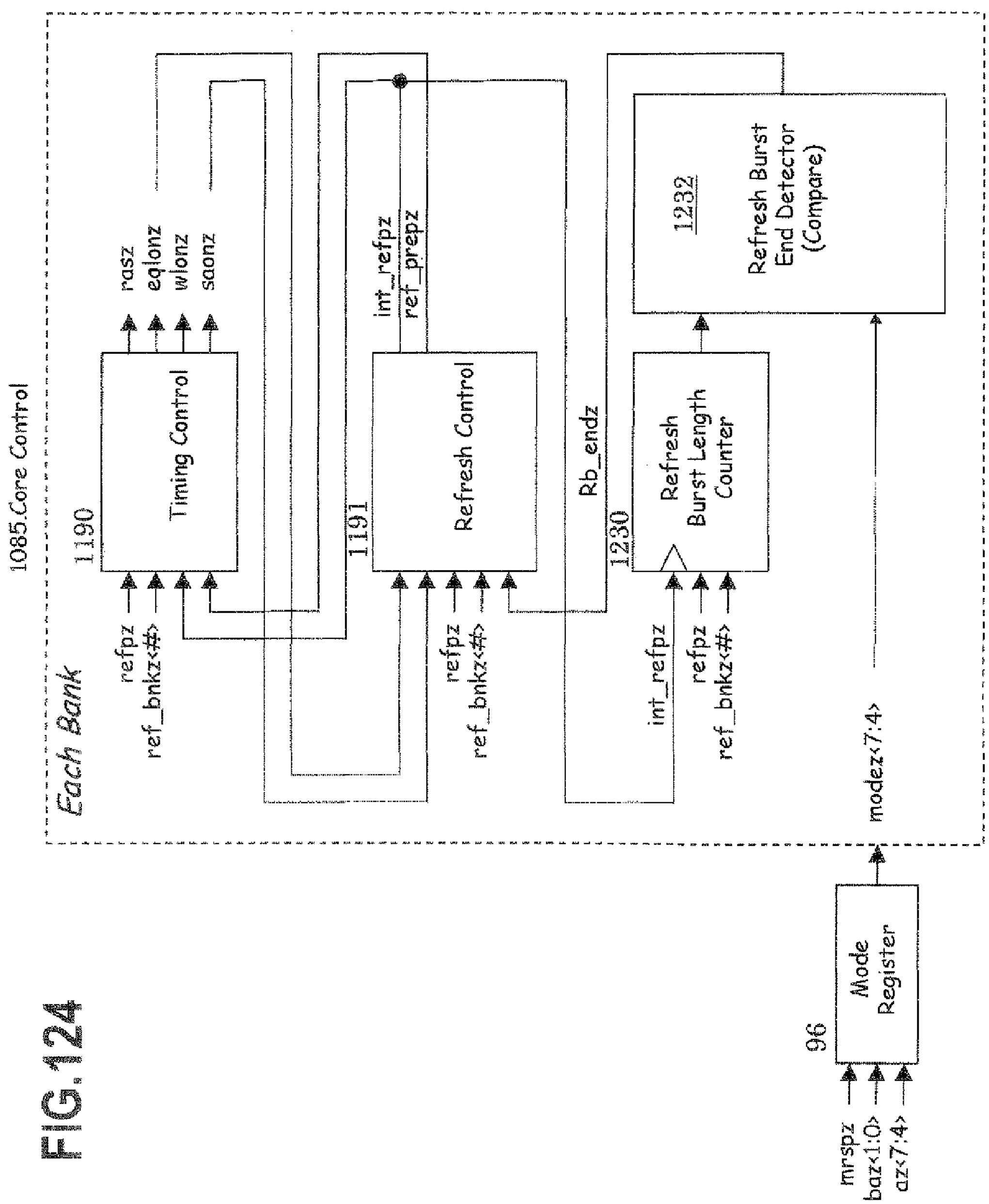

FIG. 124 Another configuration diagram of the core control circuit that controls the refresh burst operation.

Figure 125:
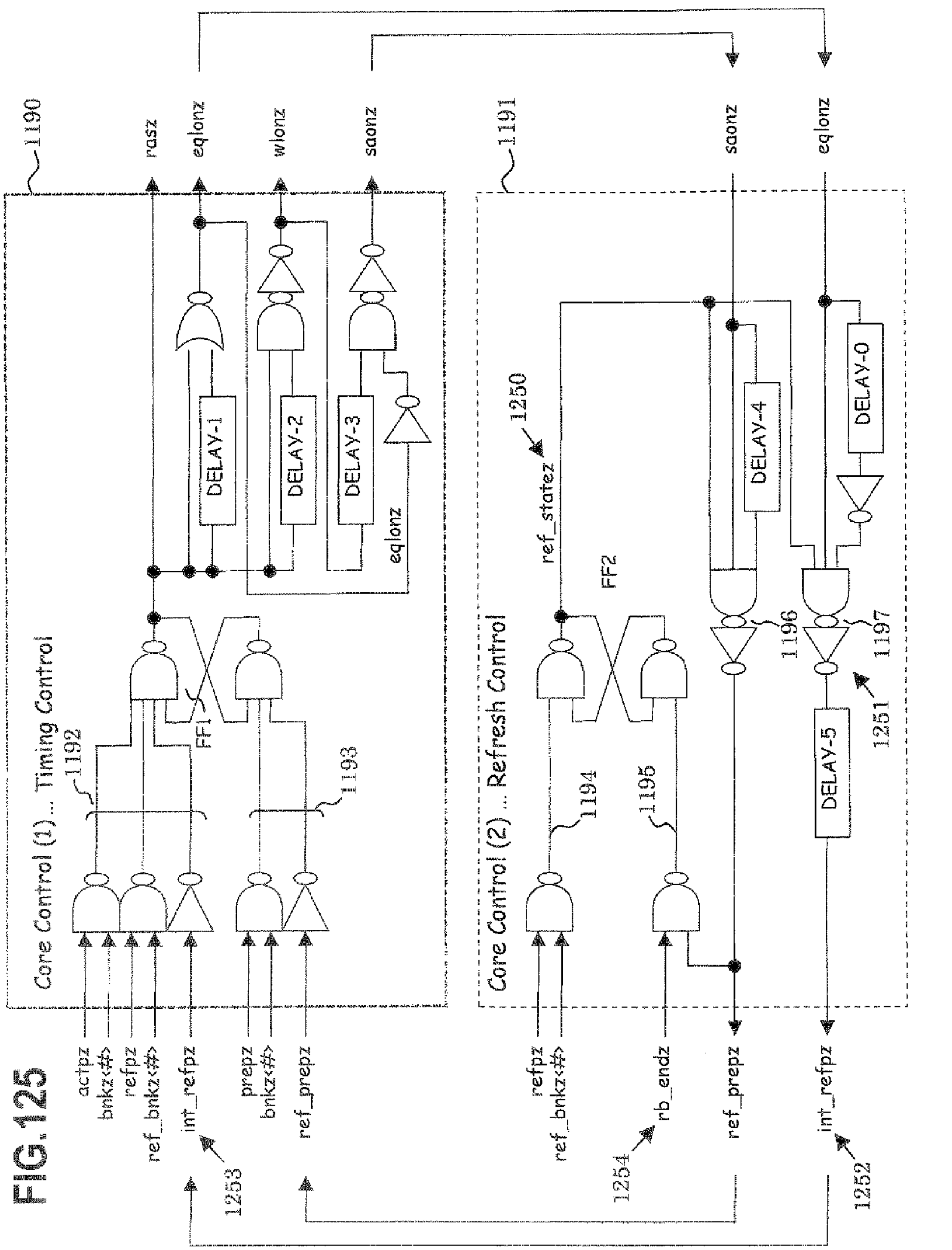

FIG. 125 A detailed circuit diagram of the timing control circuit 1190 and of the refresh control circuit 1191 within the core control circuit.

Figure 126:
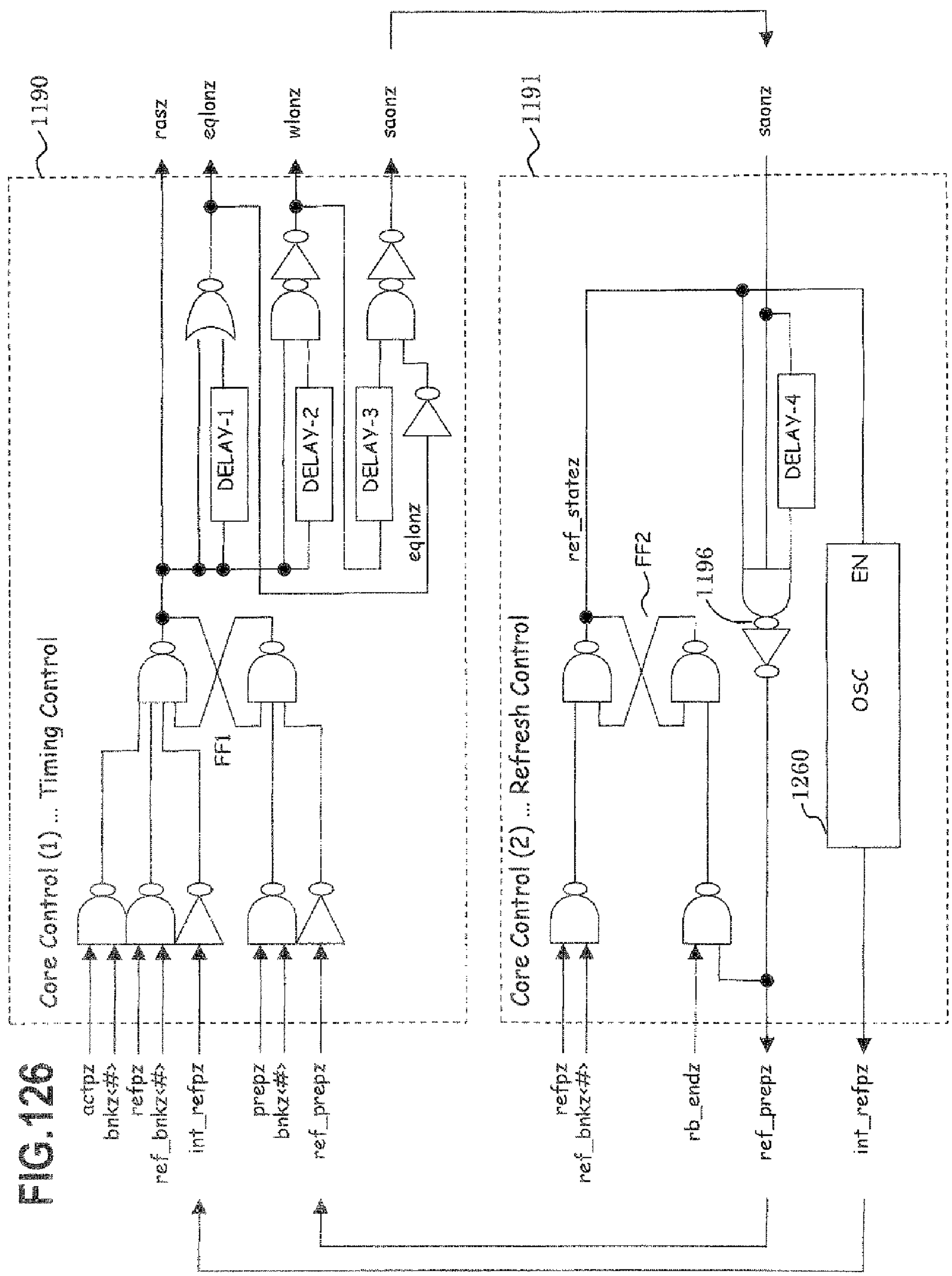

FIG. 126 Another detailed circuit diagram of the timing control circuit 1190 and of the refresh control circuit 1191 within the core control circuit.

Figure 127:
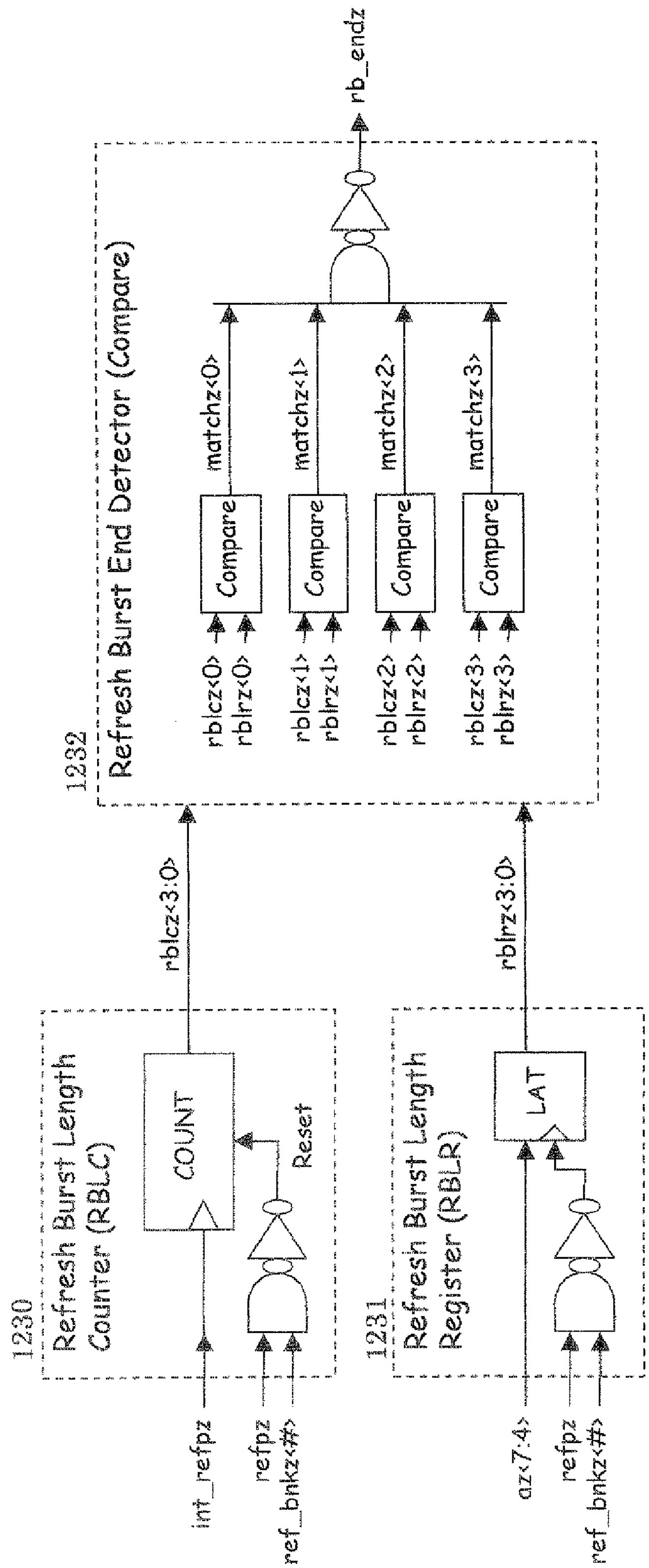

FIG. 127 A configuration diagram showing the refresh burst length counter 1230, refresh burst length register 1231, and refresh burst end detection circuit 1232.

Figure 128:
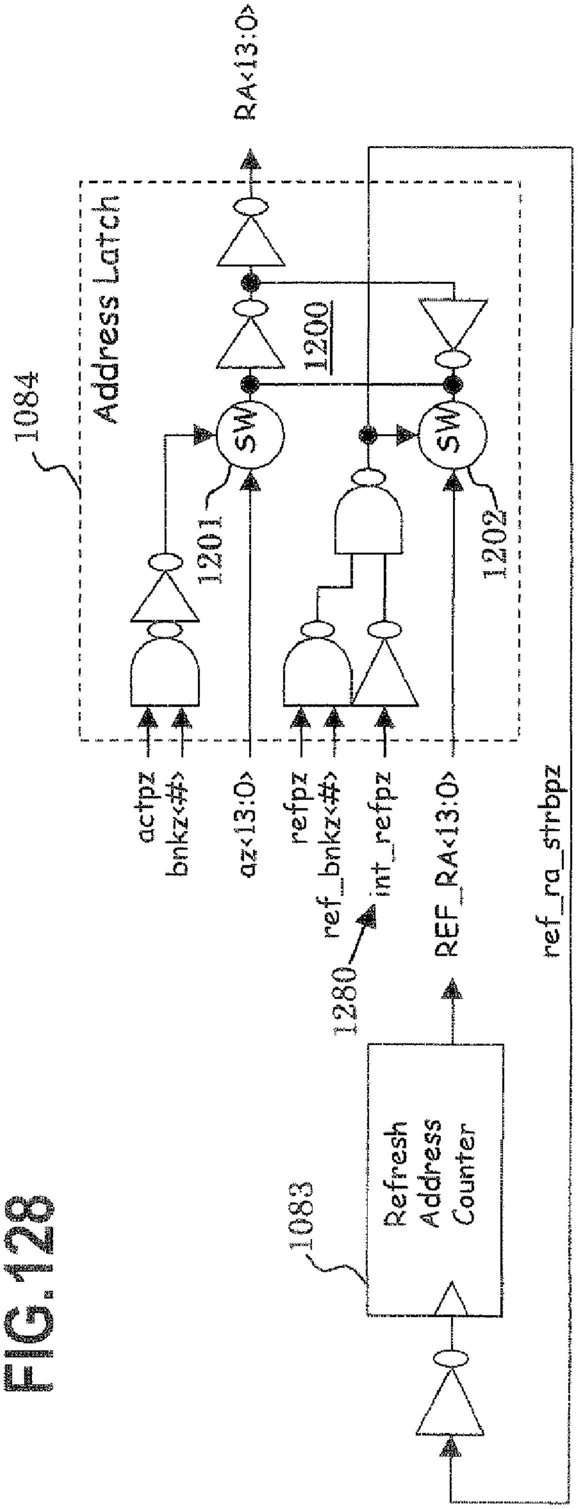

FIG. 128 A configuration diagram of the address latch circuit.

Figure 129:
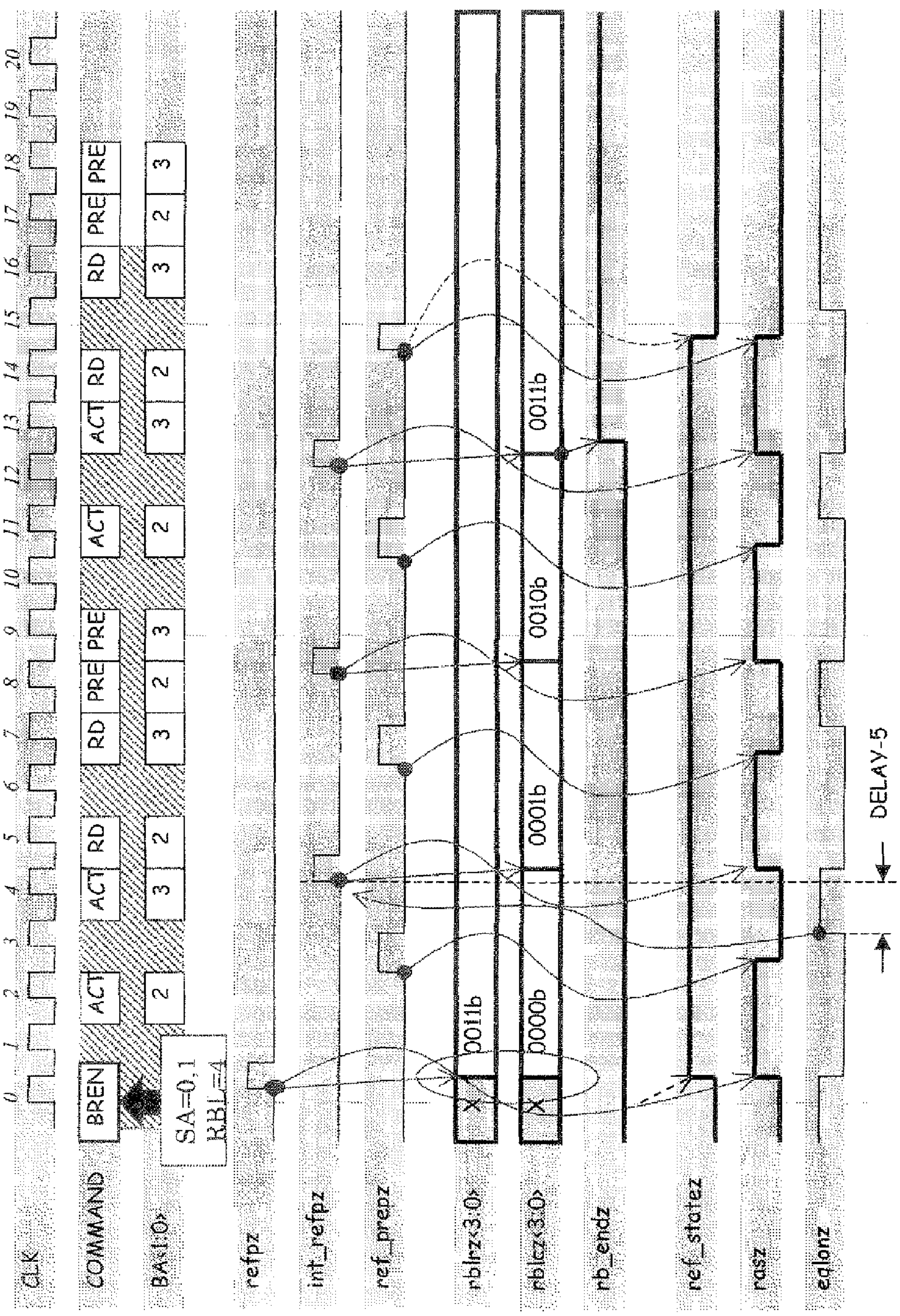

FIG. 129 A timing chart of the refresh burst operation.

Figure 130:
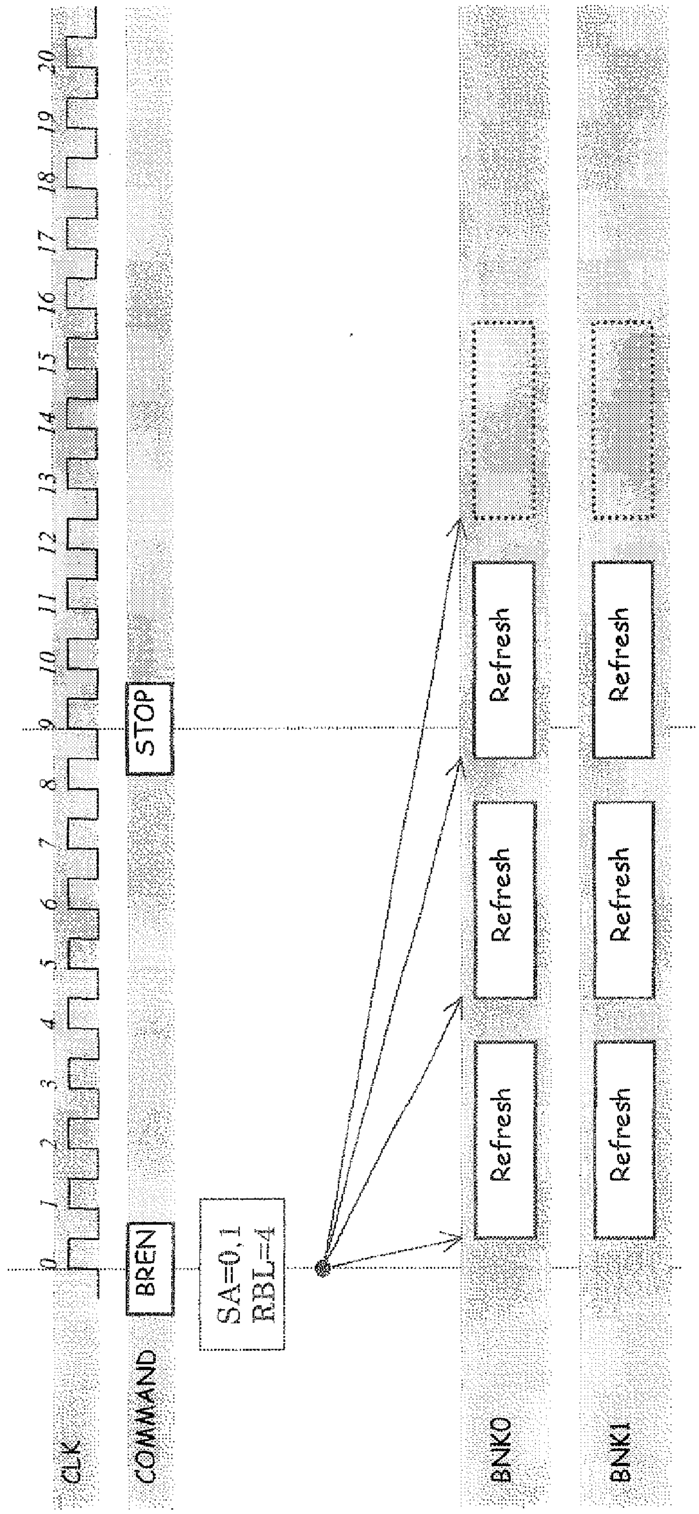

FIG. 130 A figure showing an overview of refresh burst stop operation.

Figure 131:
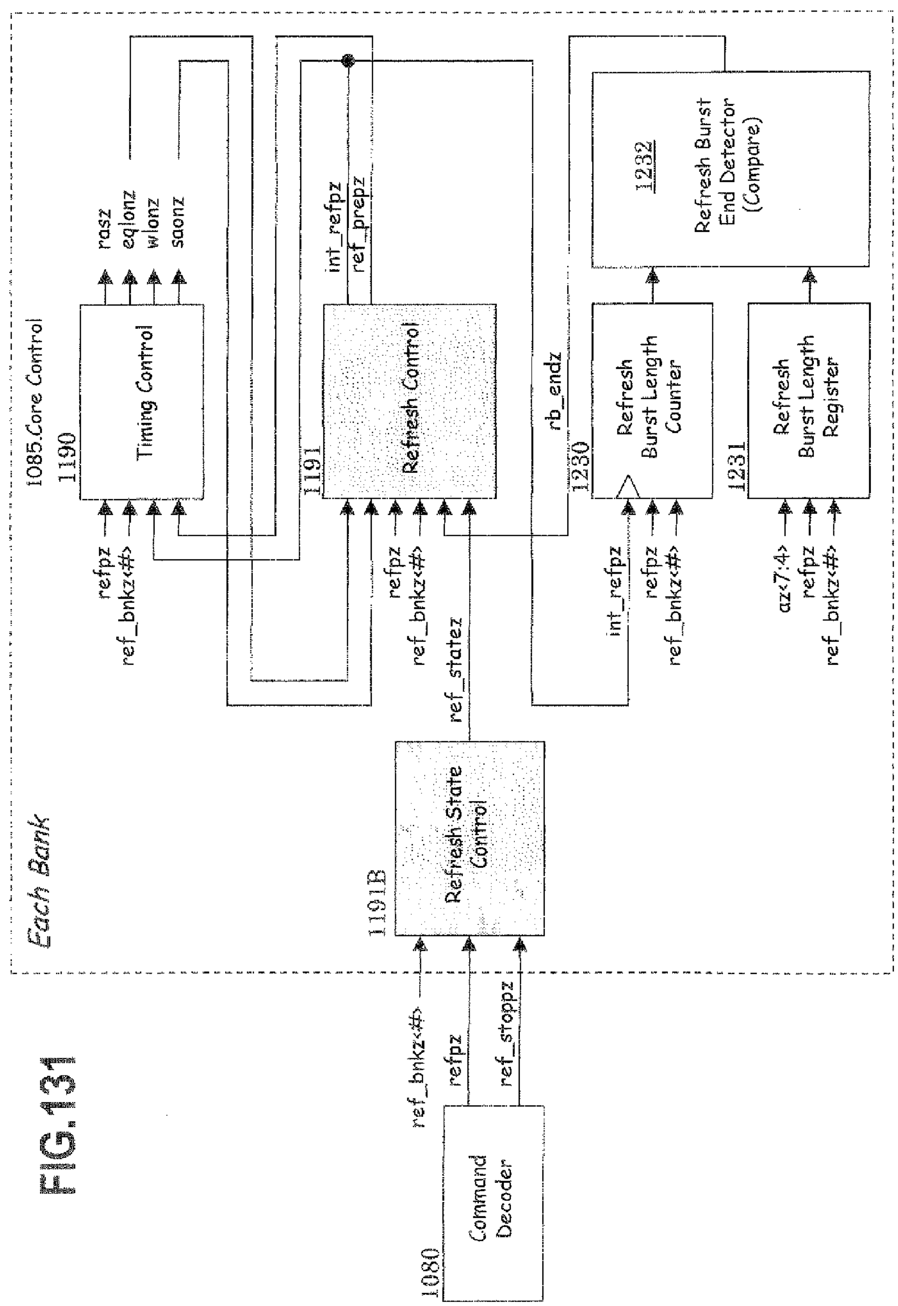

FIG. 131 A configuration diagram of the core control circuit having the refresh burst stop function.

Figure 132:
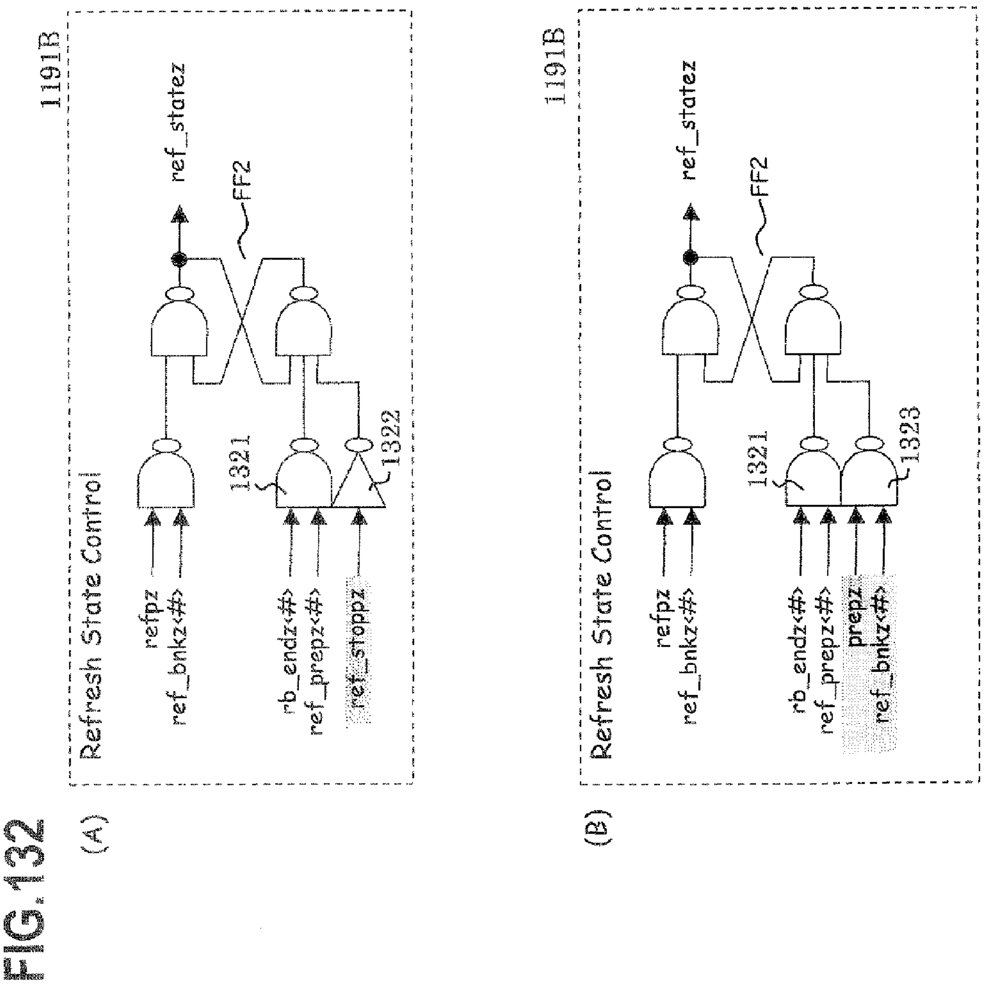

FIG. 132 A circuit diagram of the refresh state control circuit.

Figure 133:
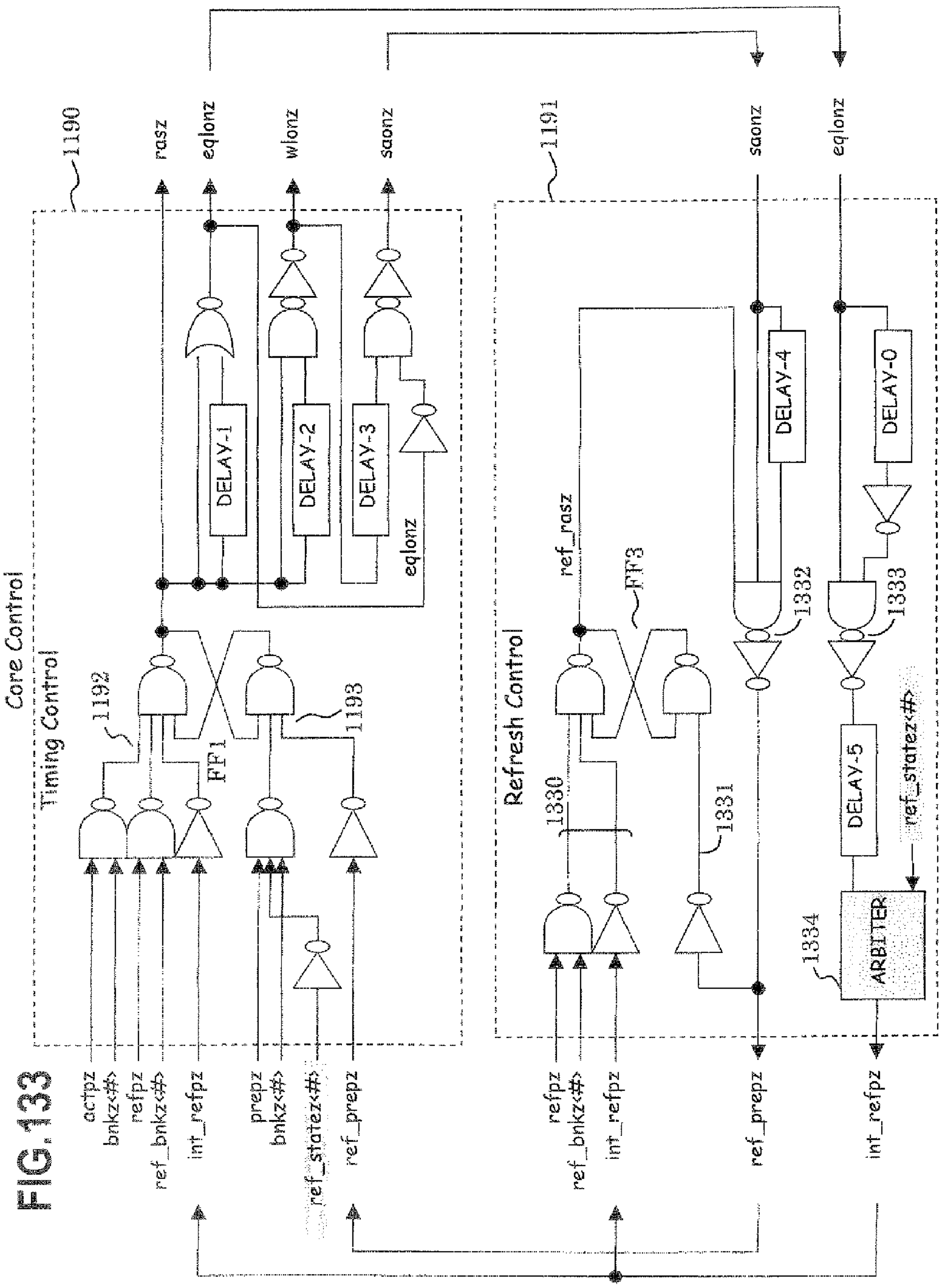

FIG. 133 A circuit diagram of the timing control circuit 1190 and of the refresh control circuit 1191 of the core control circuit.

Figure 134:
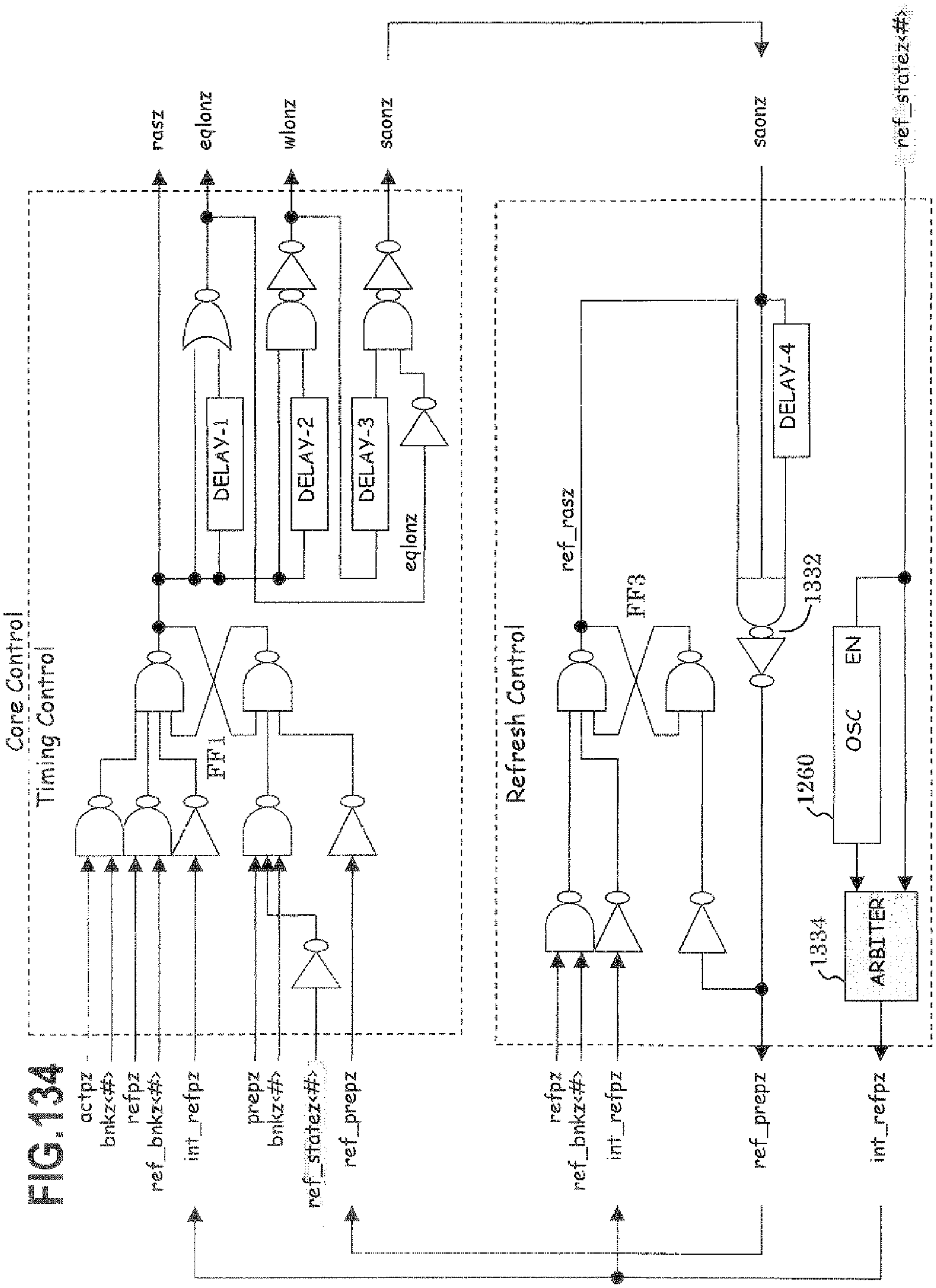

FIG. 134 Another circuit diagram of the timing control circuit 1190 and of the refresh control circuit 1191 of the core control circuit.

Figure 135:
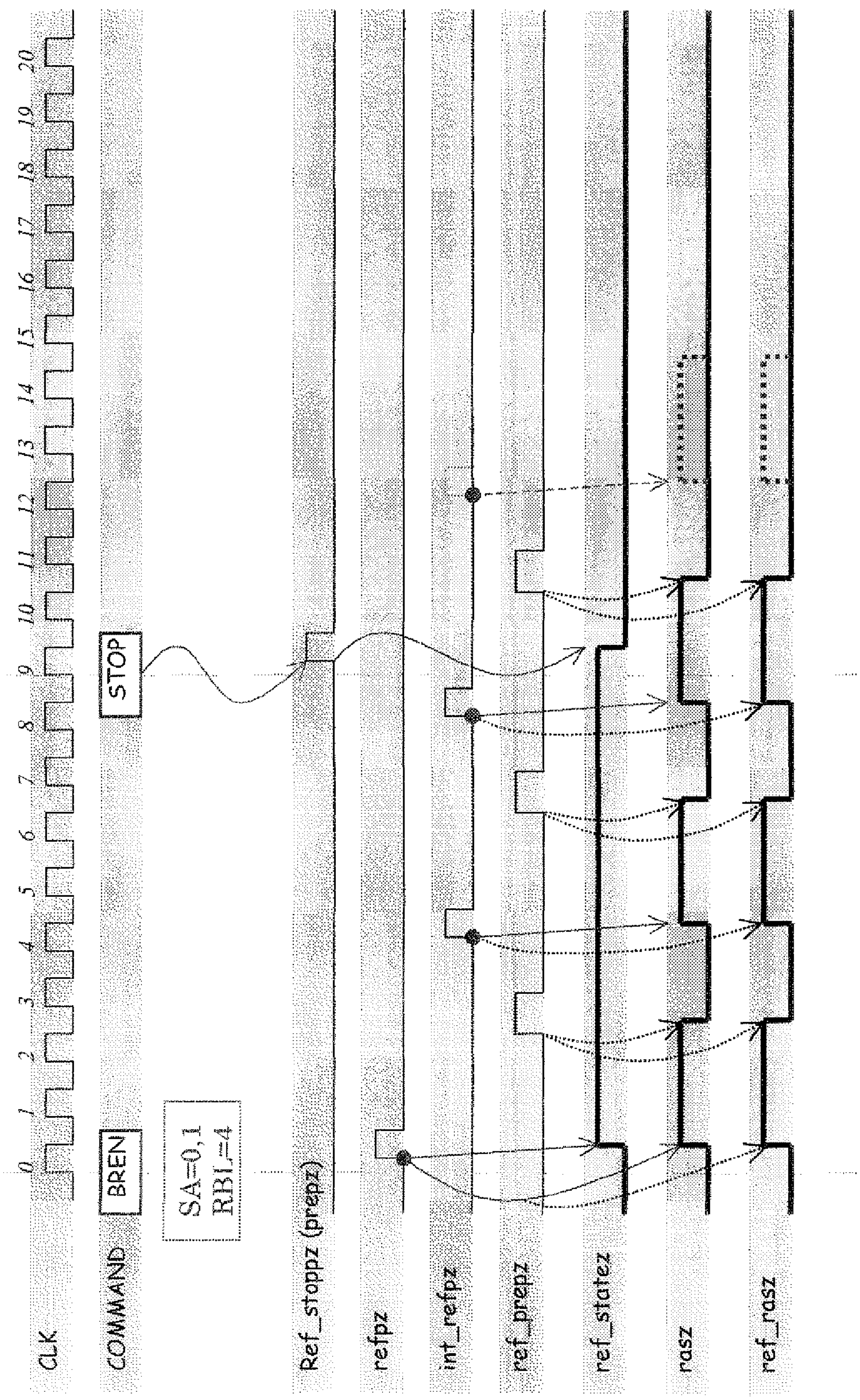

FIG. 135 A timing chart showing an operation of FIG. 133.

Figure 136:
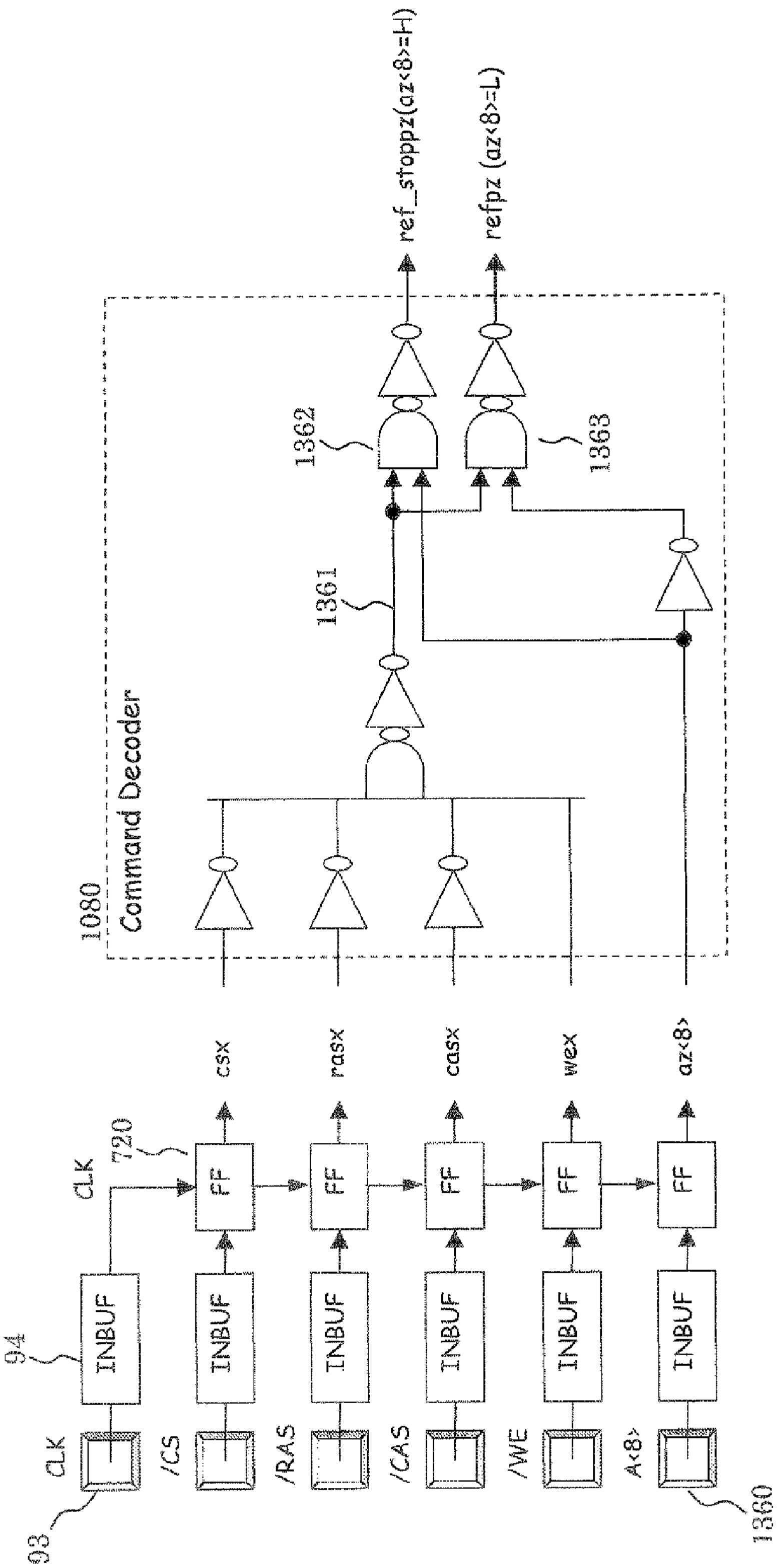

FIG. 136 A circuit diagram of the command decoder that realizes the refresh stop function.

Figure 137:
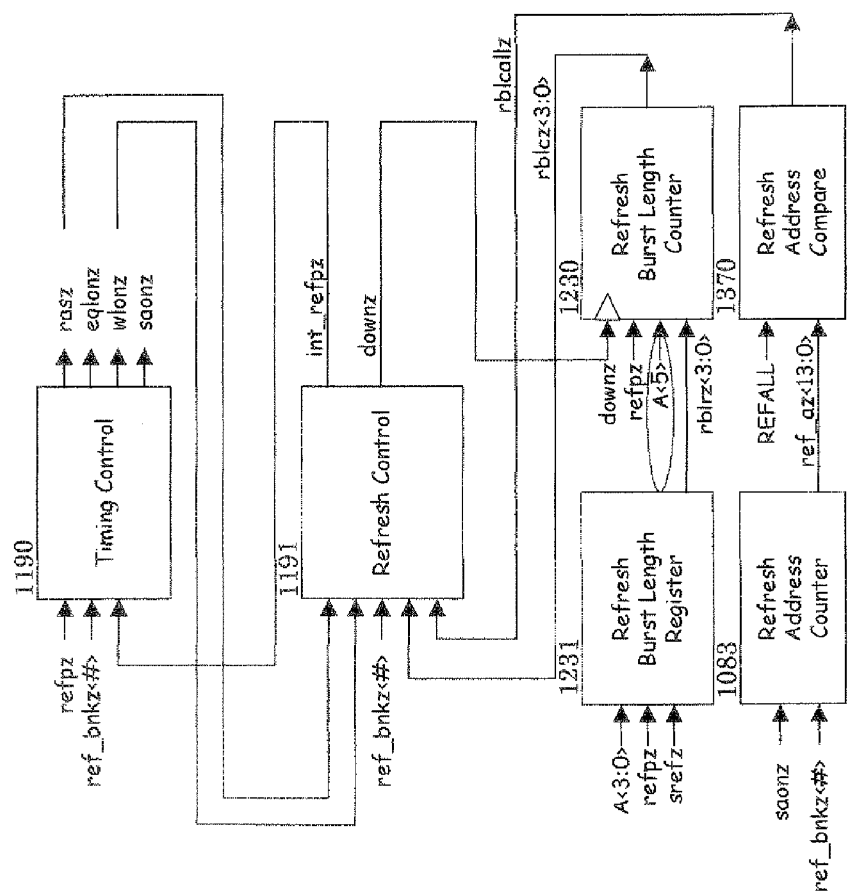

FIG. 137 A configuration diagram of the core control circuit 1085 that performs countdown refresh burst control.

FIG. 138 A truth table showing a relationship between a refresh burst length set in the refresh burst length register 1231 and the address terminals A<3:0>.

Figure 139:
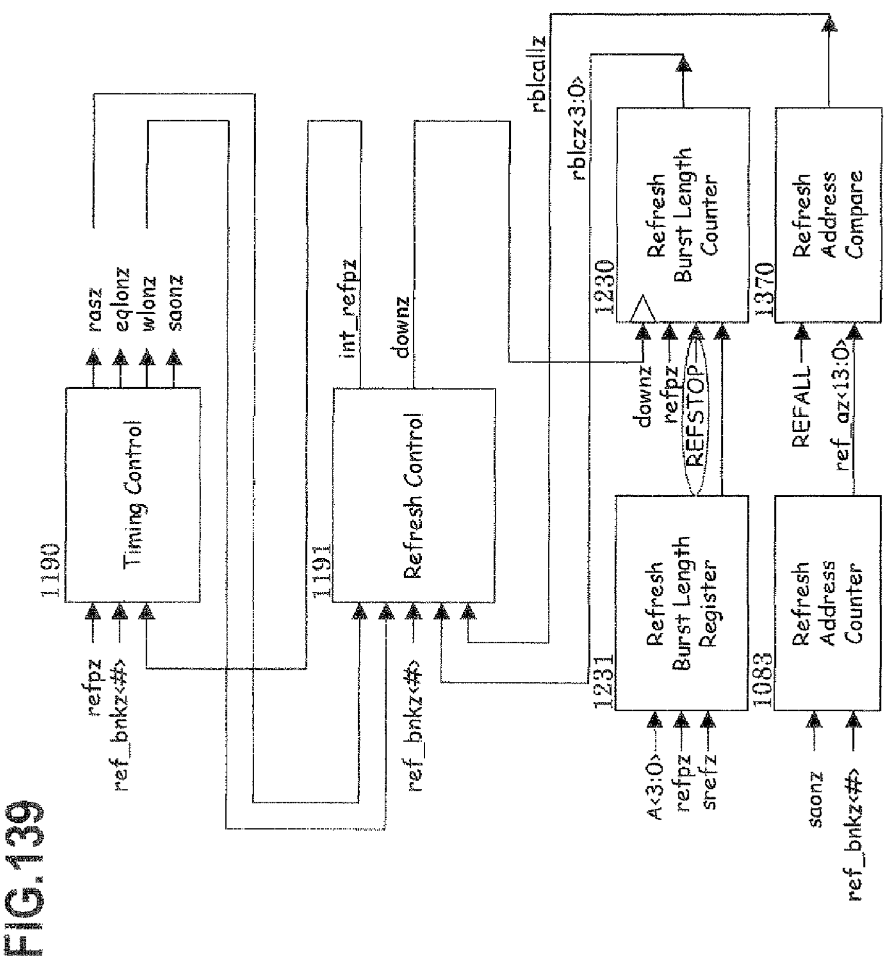

FIG. 139 Another configuration diagram of the core control circuit 1085 that performs the countdown refresh burst control.

Figure 140:
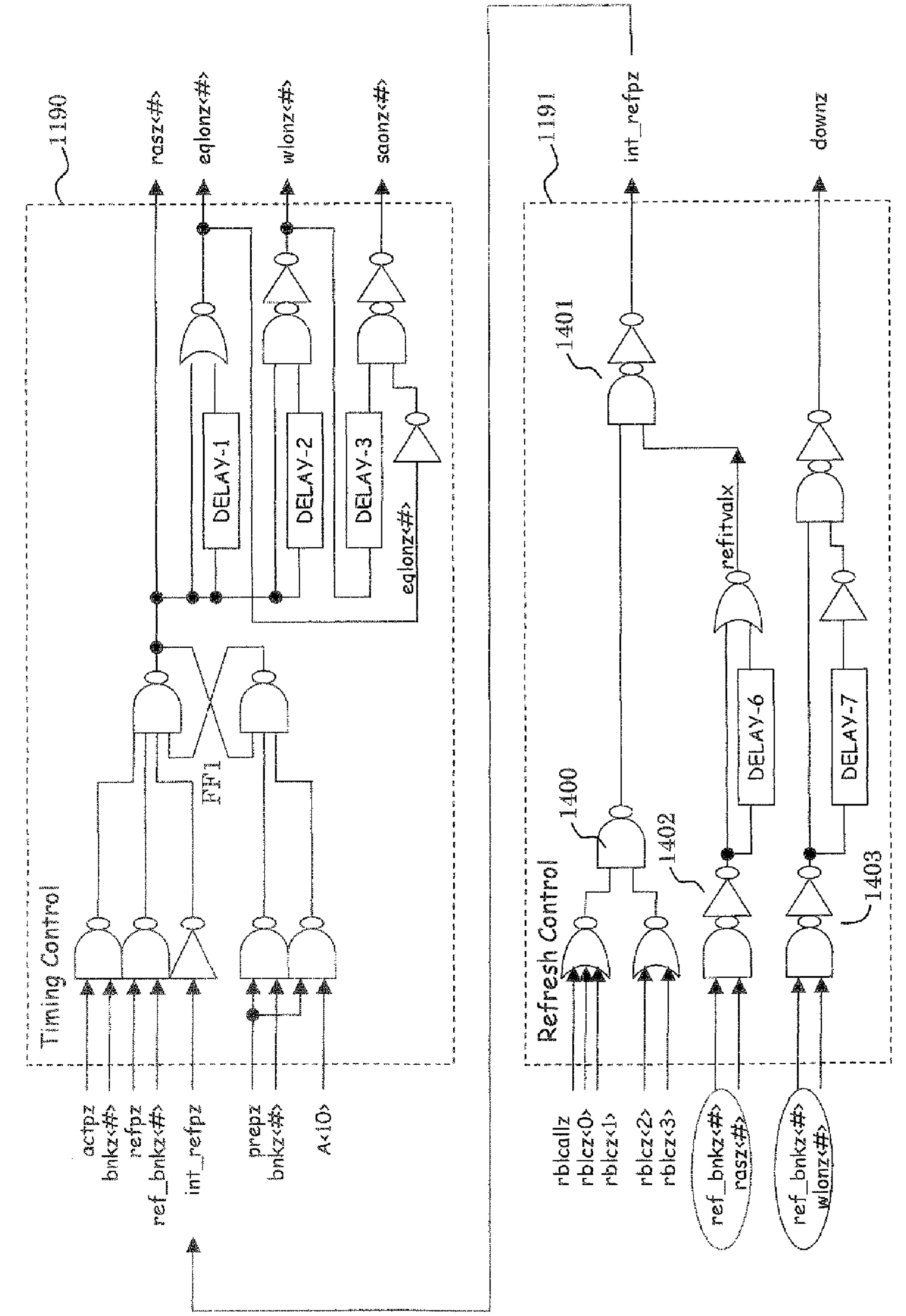

FIG. 140 A circuit diagram of the timing control circuit 1190 and of the refresh control circuit 1191 within the core control circuit 1085.

Figure 141:
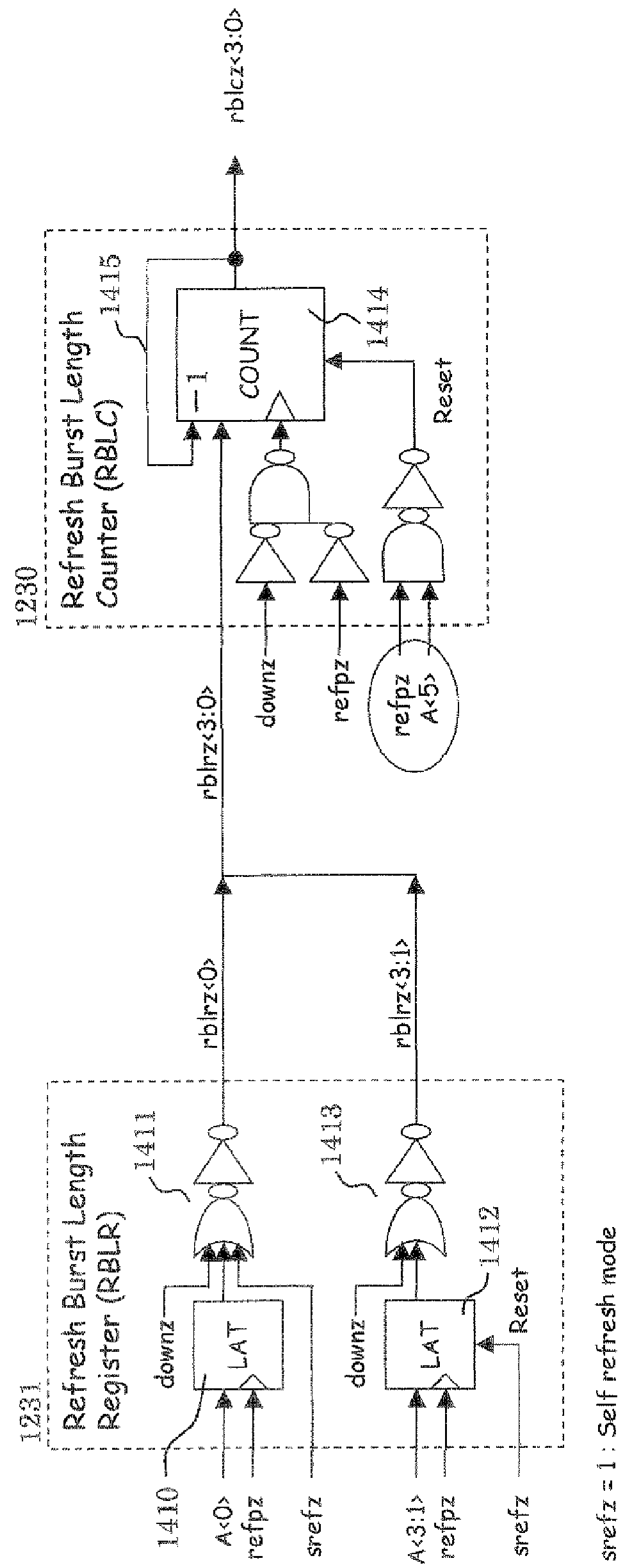

FIG. 141 A circuit diagram of the refresh burst length register 1231 and of the refresh burst length counter 1230.

Figure 142:
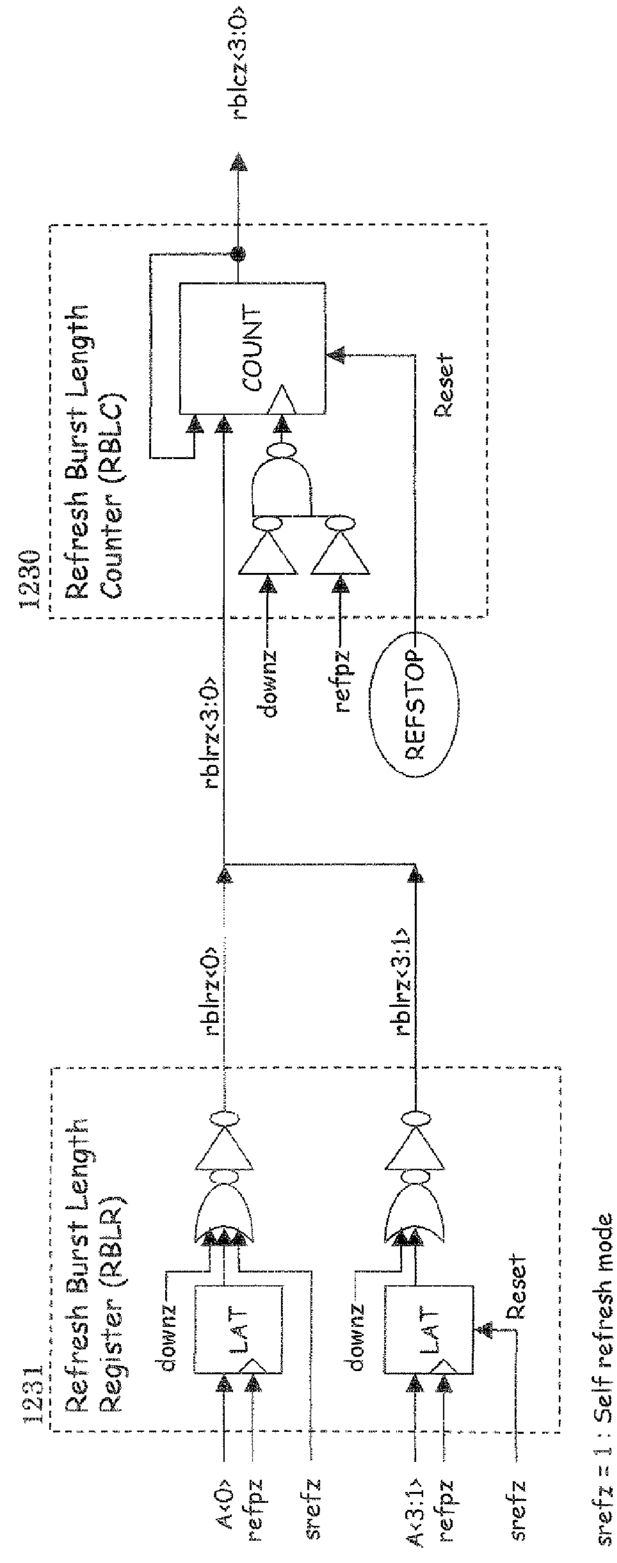

FIG. 142 A circuit diagram of the refresh burst length register 1231 and of the refresh burst length counter 1230.

Figure 143:
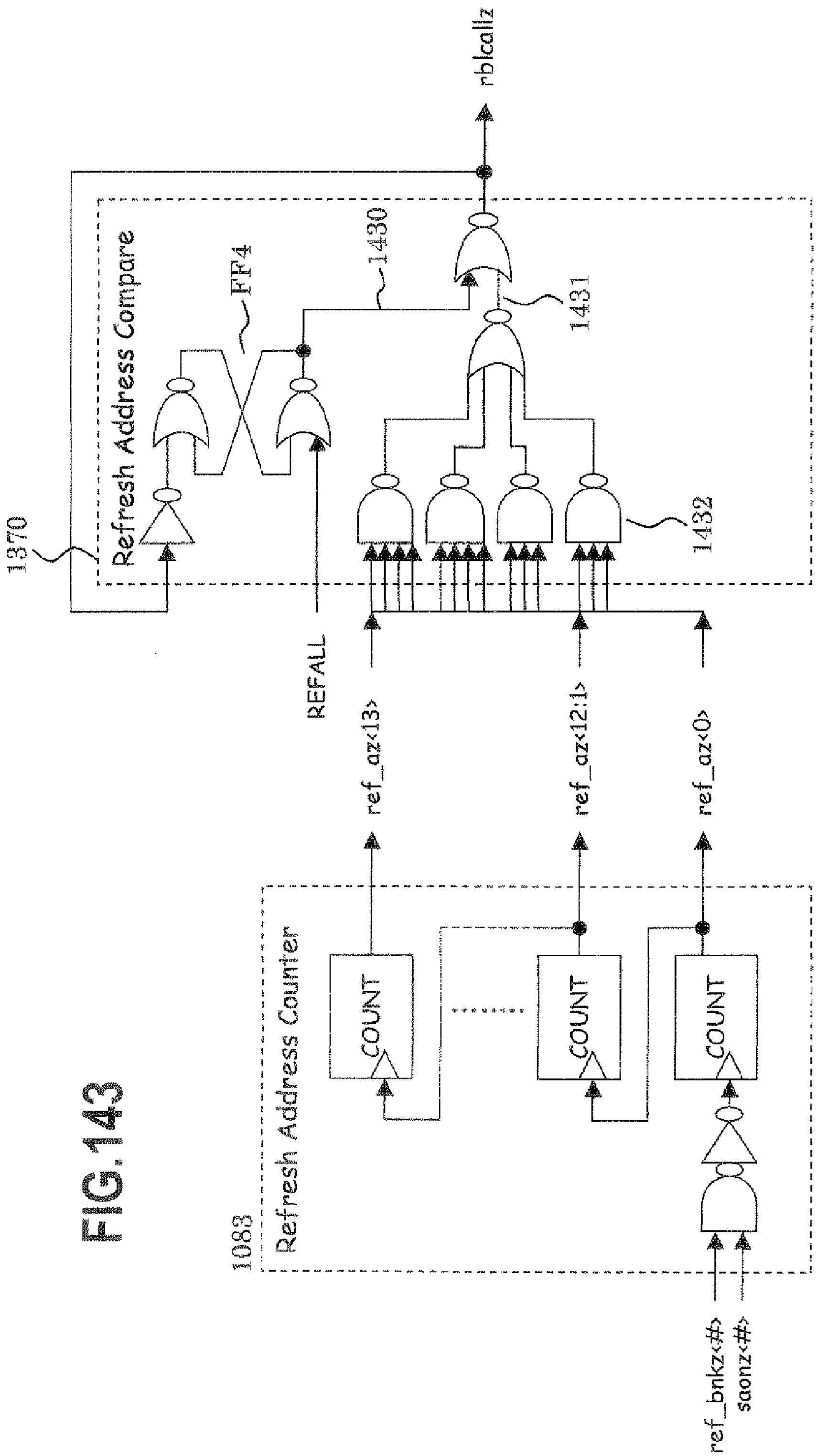

FIG. 143 A circuit diagram of the refresh address counter 1083 and of the refresh address comparison circuit 1370.

Figure 144:
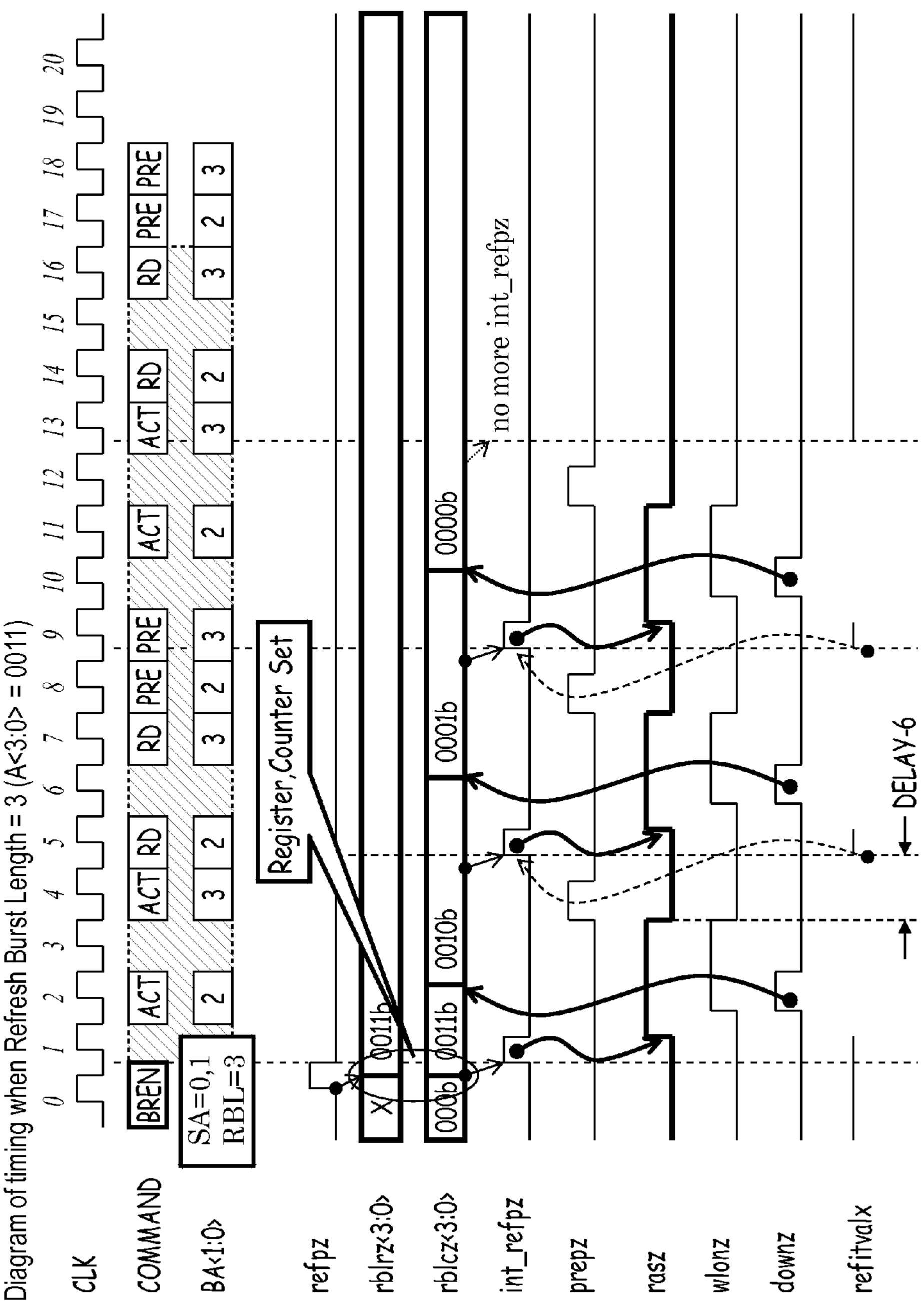

FIG. 144 A timing chart showing the case in which the RBL of the countdown core control circuit is 3.

Figure 145:
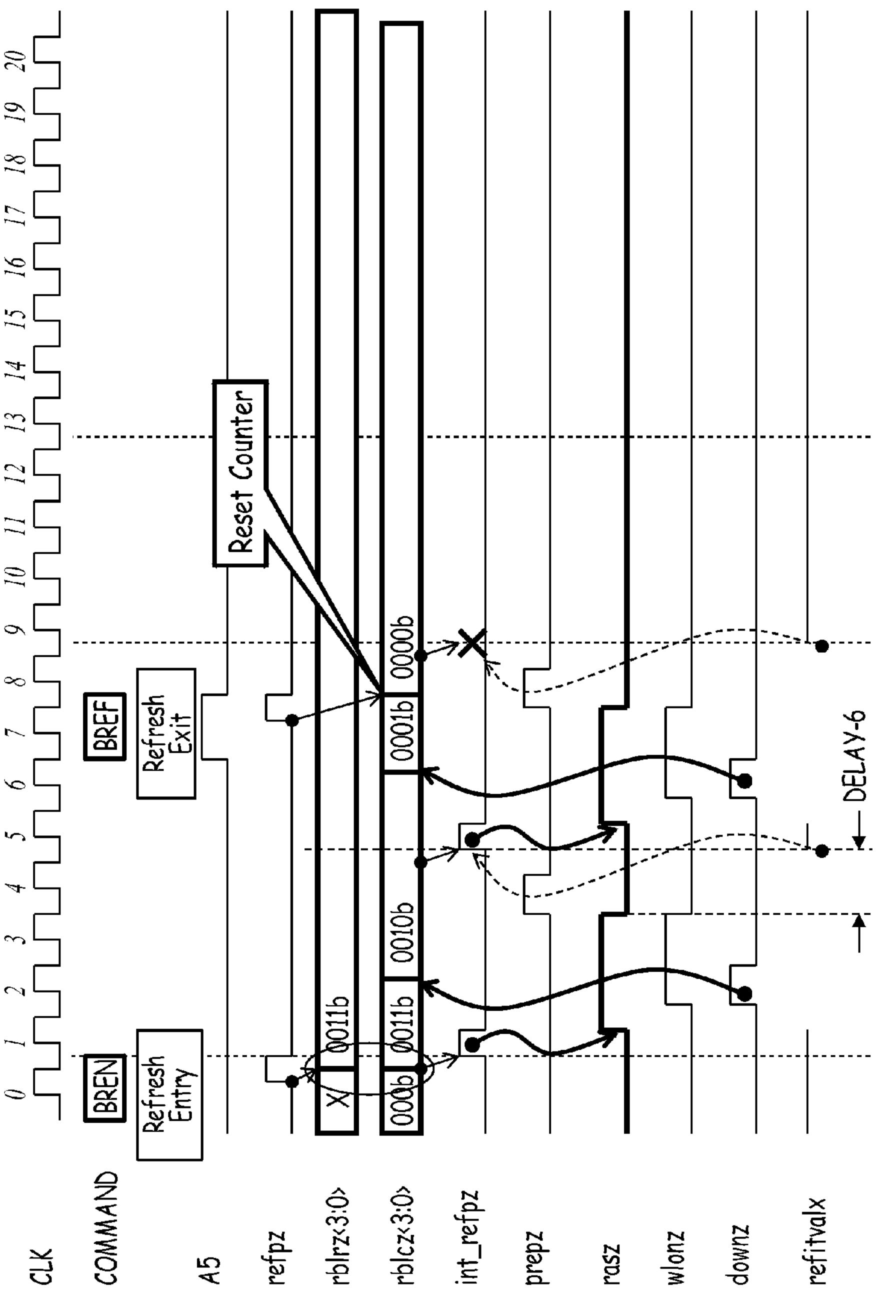

FIG. 145 A timing chart of a refresh stop operation performed by the countdown core control circuit.

Figure 146:
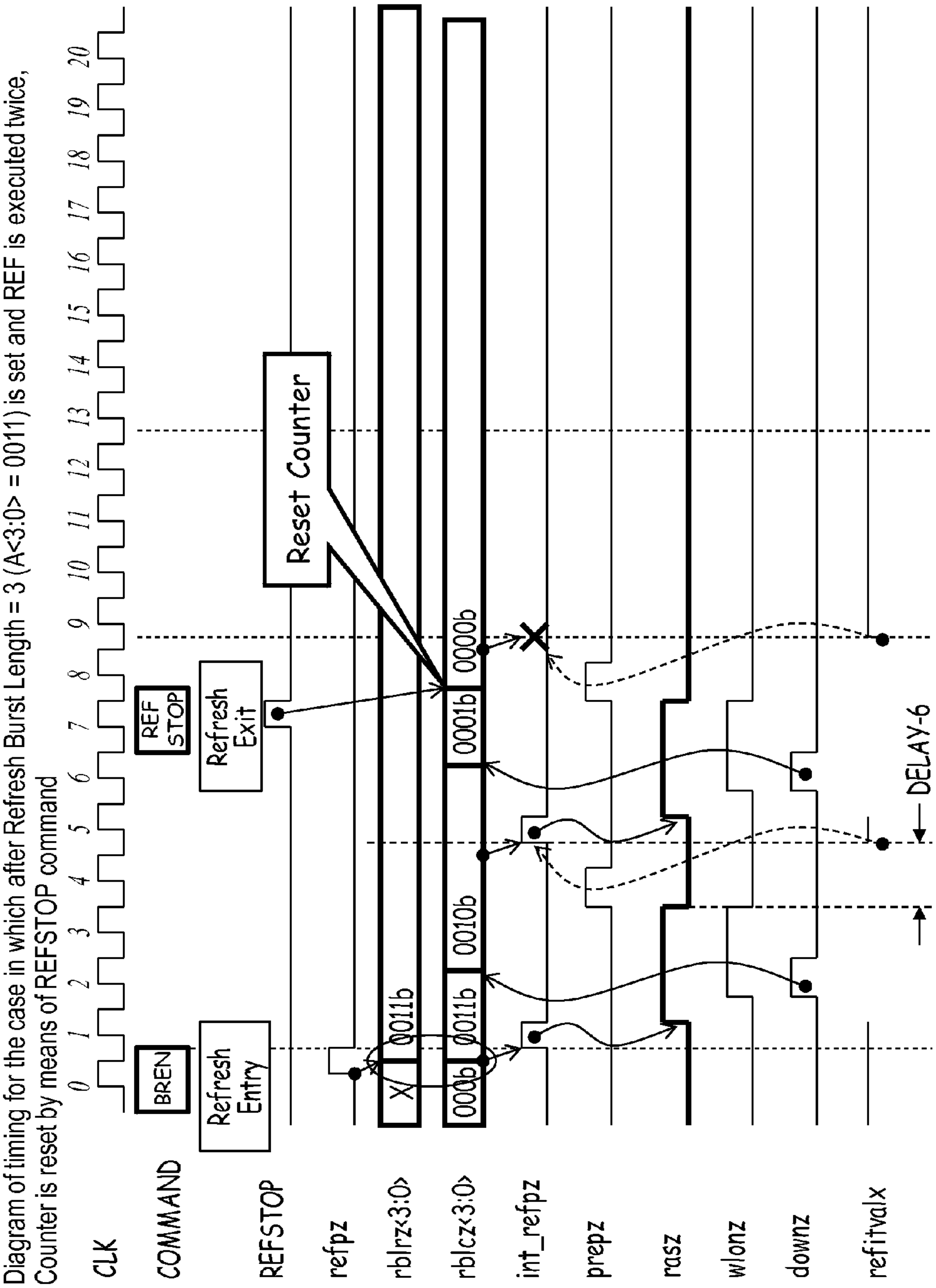

FIG. 146 A timing chart of the refresh stop operation of the countdown core control circuit.

Figure 147:
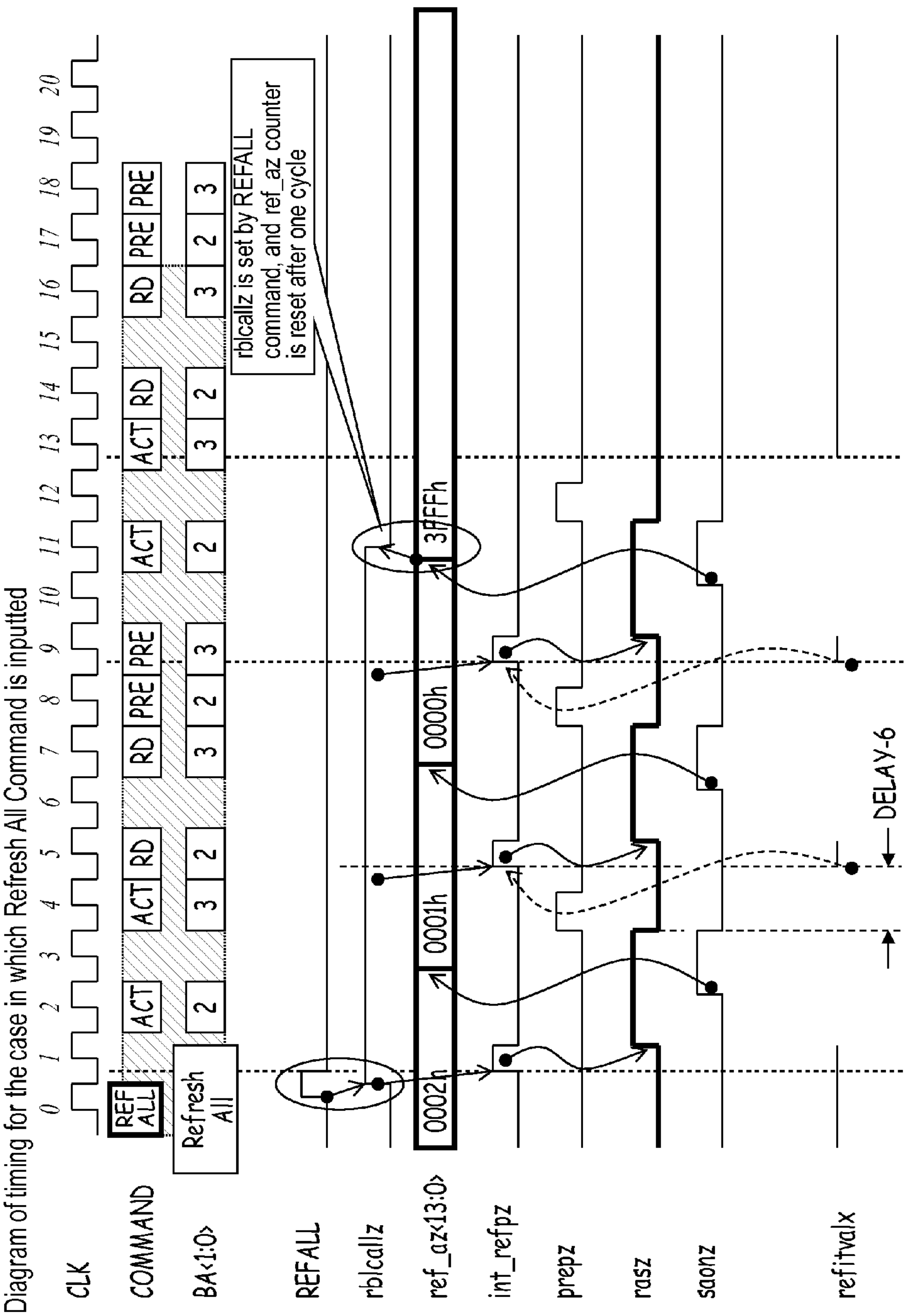

FIG. 147 A timing chart showing the refresh-all operation of the countdown core control circuit.

Figure 148:
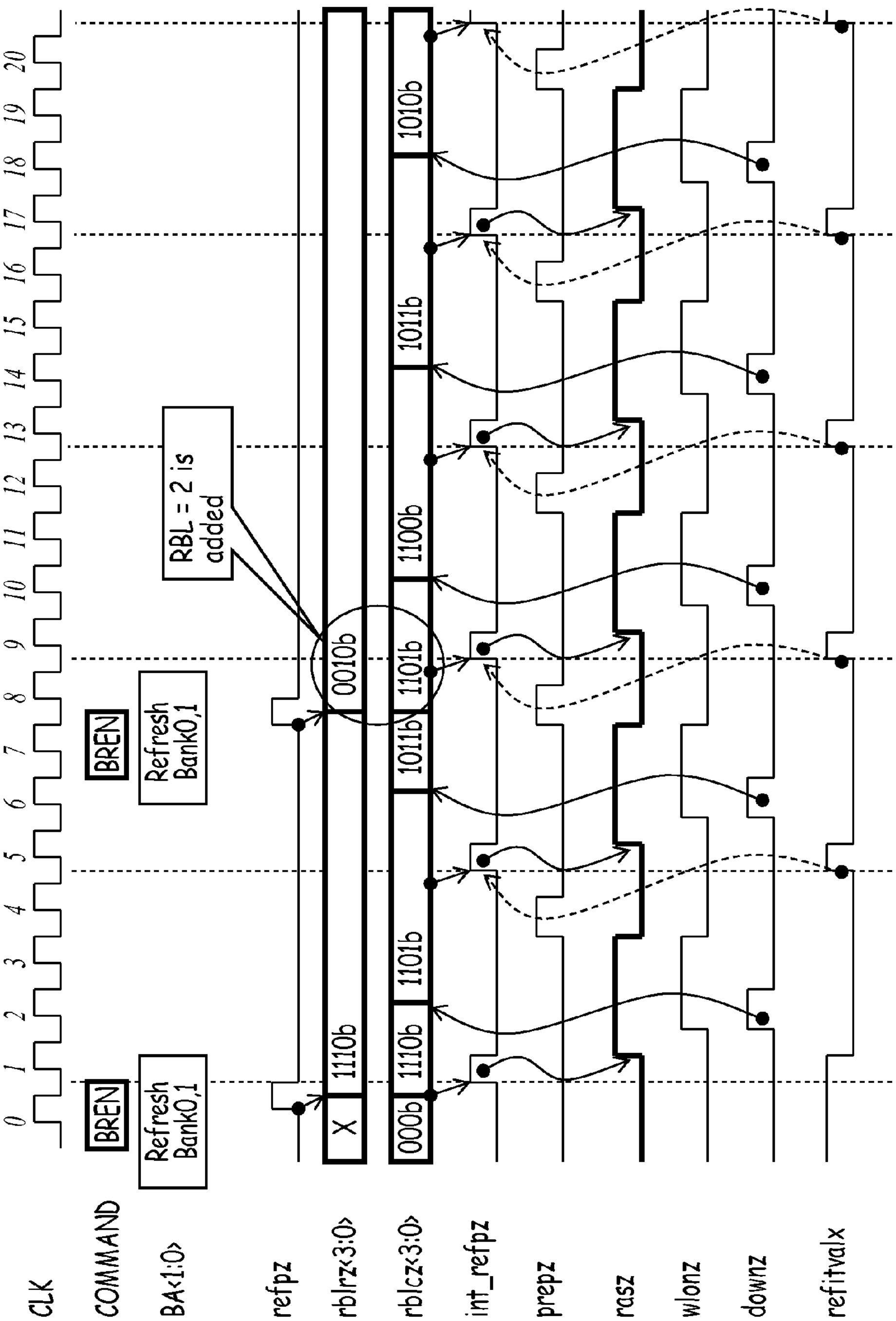

FIG. 148 A timing chart showing an operation for resetting the refresh command, the operation being performed by the countdown core control circuit.

Figure 149:
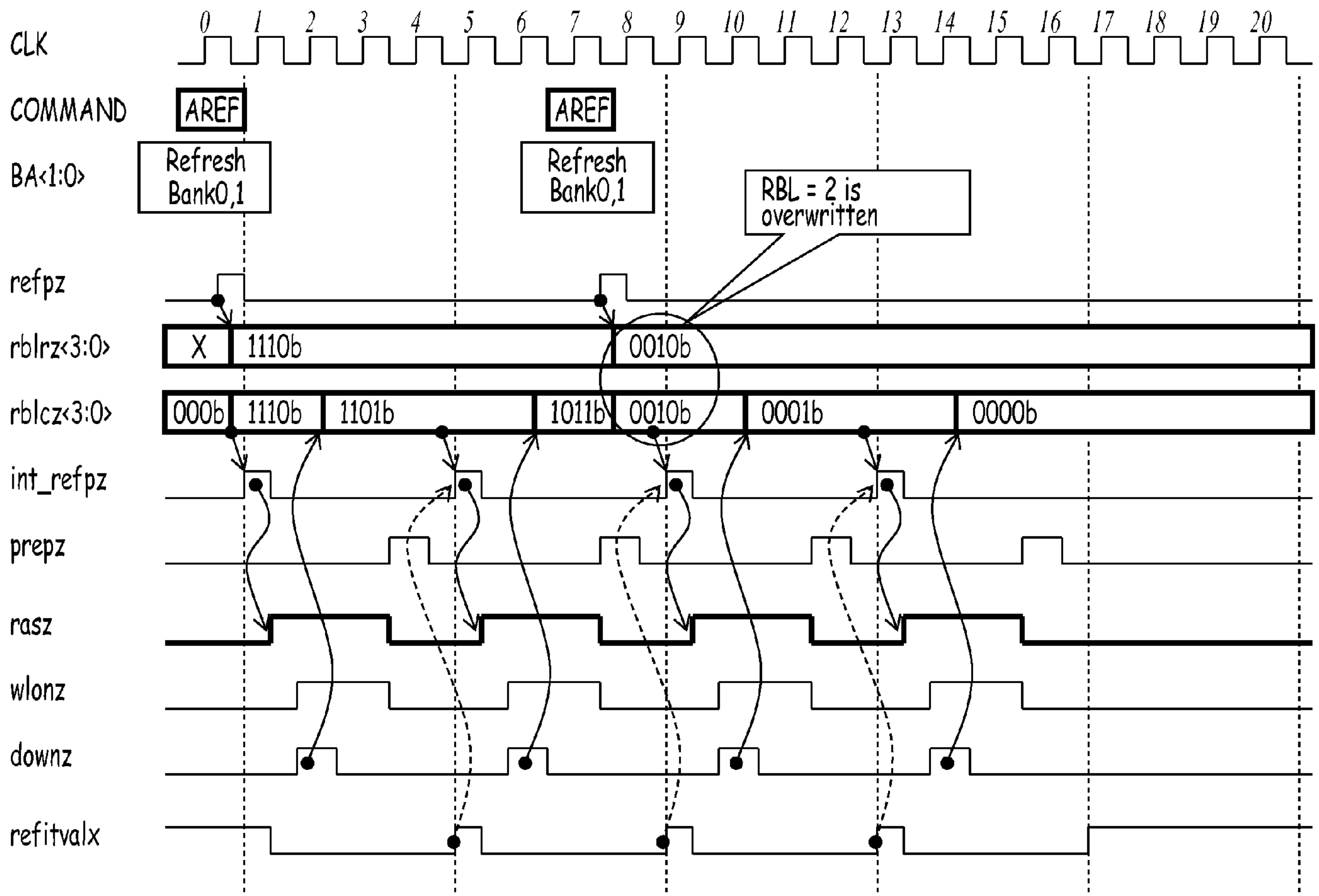

FIG. 149 A timing chart showing an operation for resetting the refresh command, the operation being performed by the countdown core control circuit.

Figure 150:
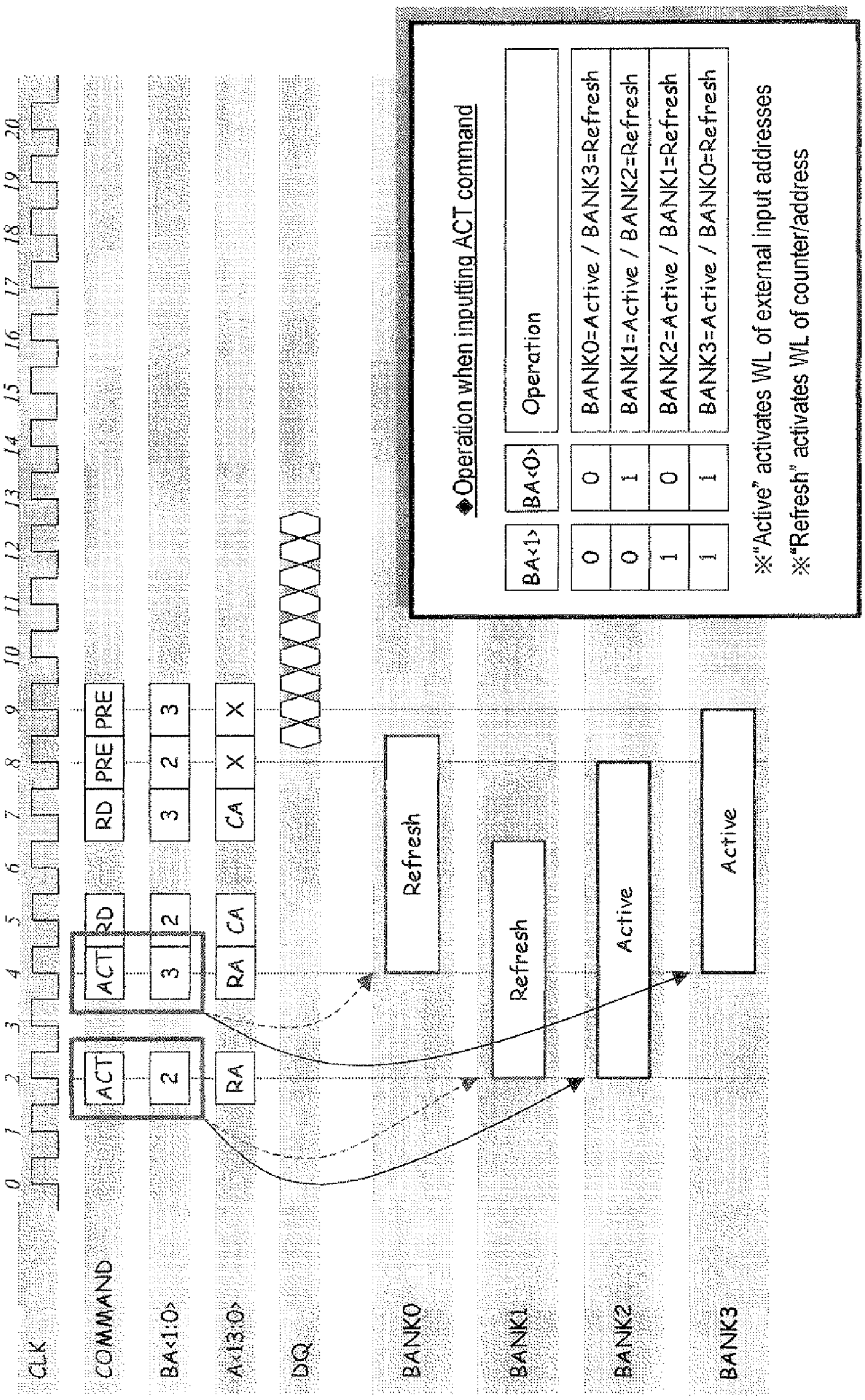

FIG. 150 A timing chart showing the active and refresh interlocking control.

Figure 151:
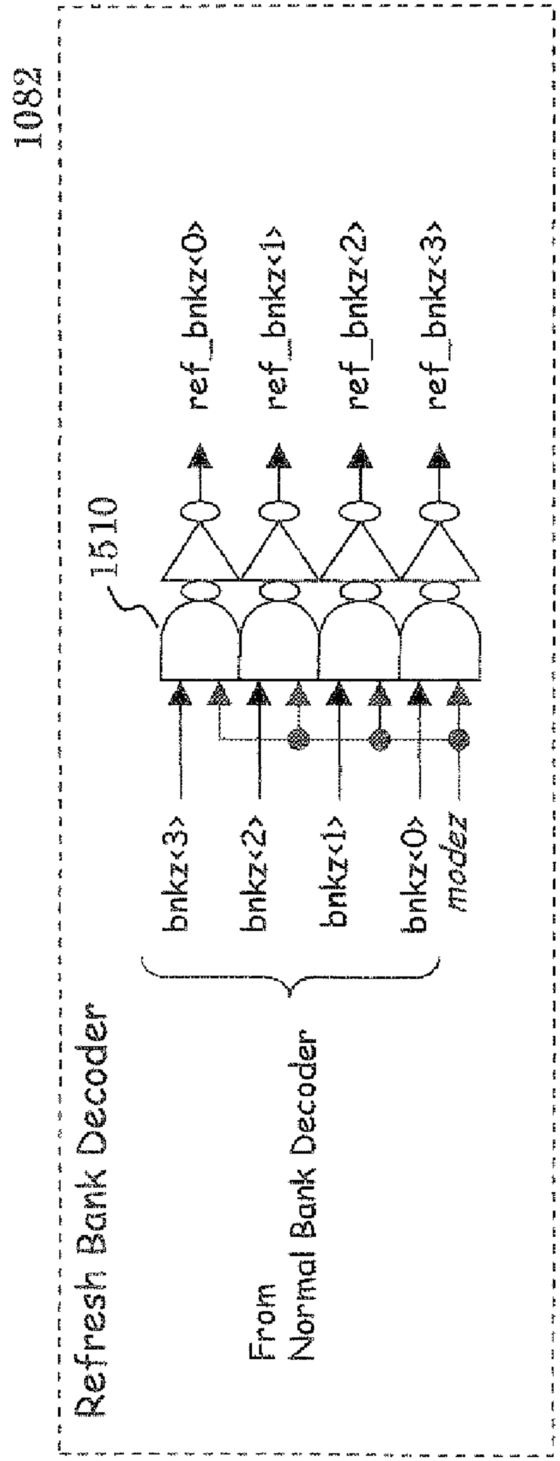

FIG. 151 A circuit diagram of the refresh bank decoder in the active and refresh interlocking control.

Figure 152:
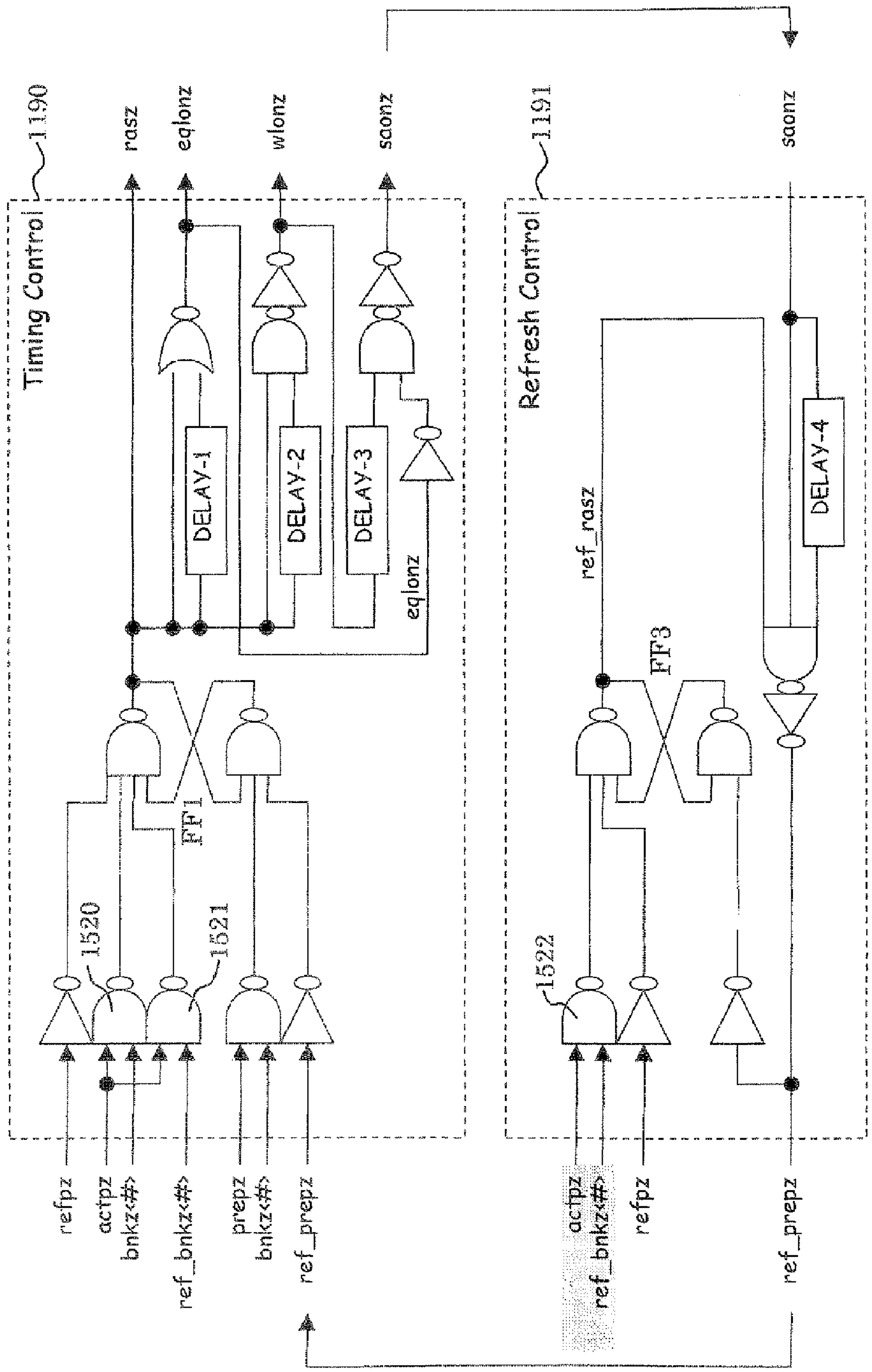

FIG. 152 A circuit diagram of the core control circuit in the active and refresh interlocking control.

Figure 153:
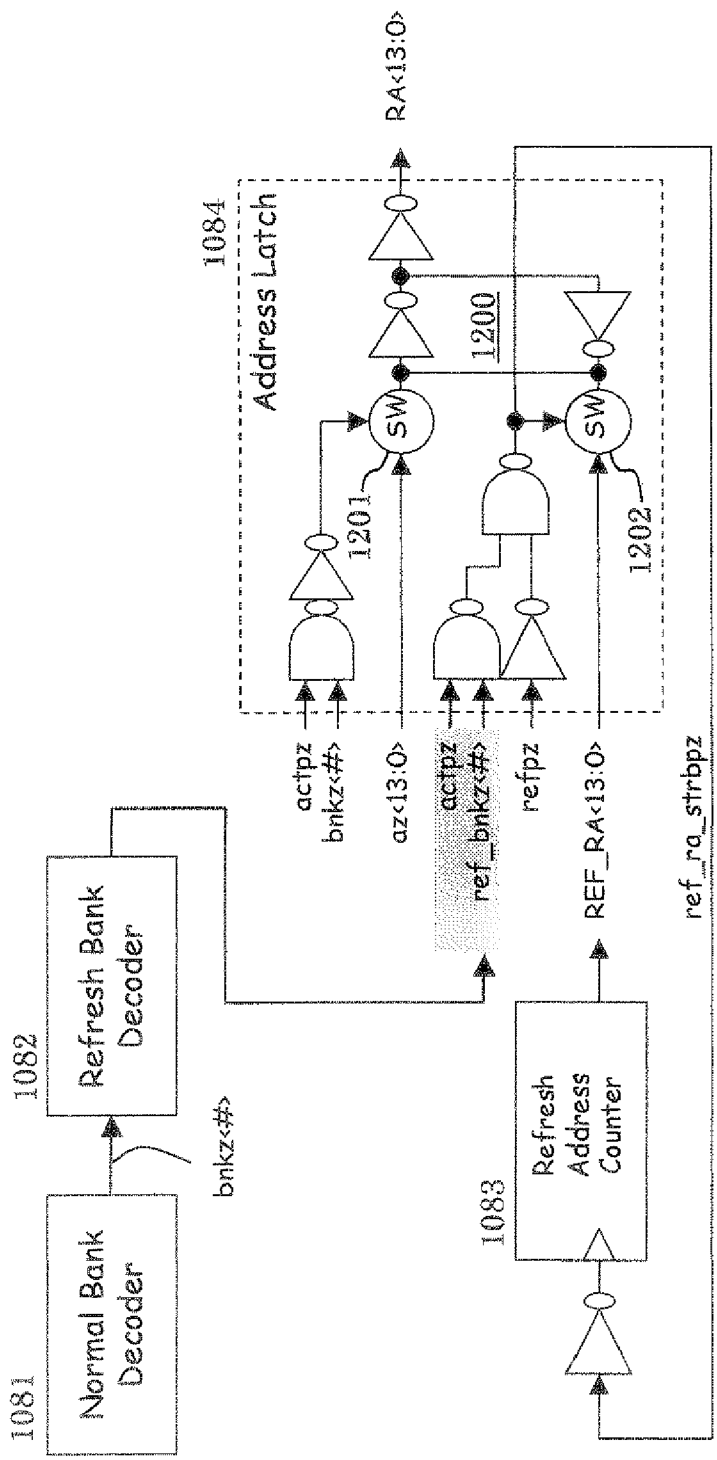

FIG. 153 A circuit diagram of the address latch circuit in the active and refresh interlocking control.

Figure 154:
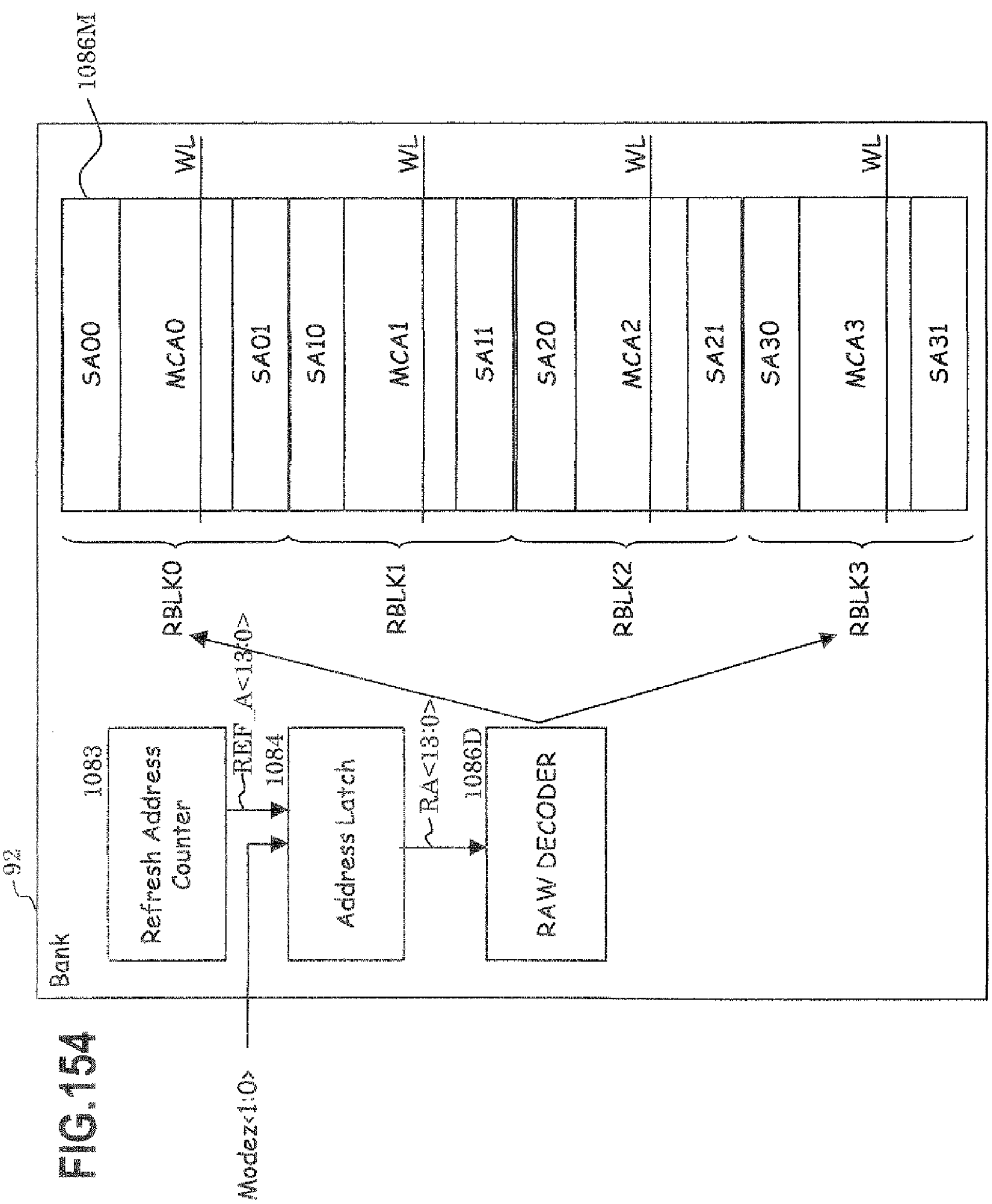

FIG. 154 A configuration diagram of a bank circuit.

Figure 155:
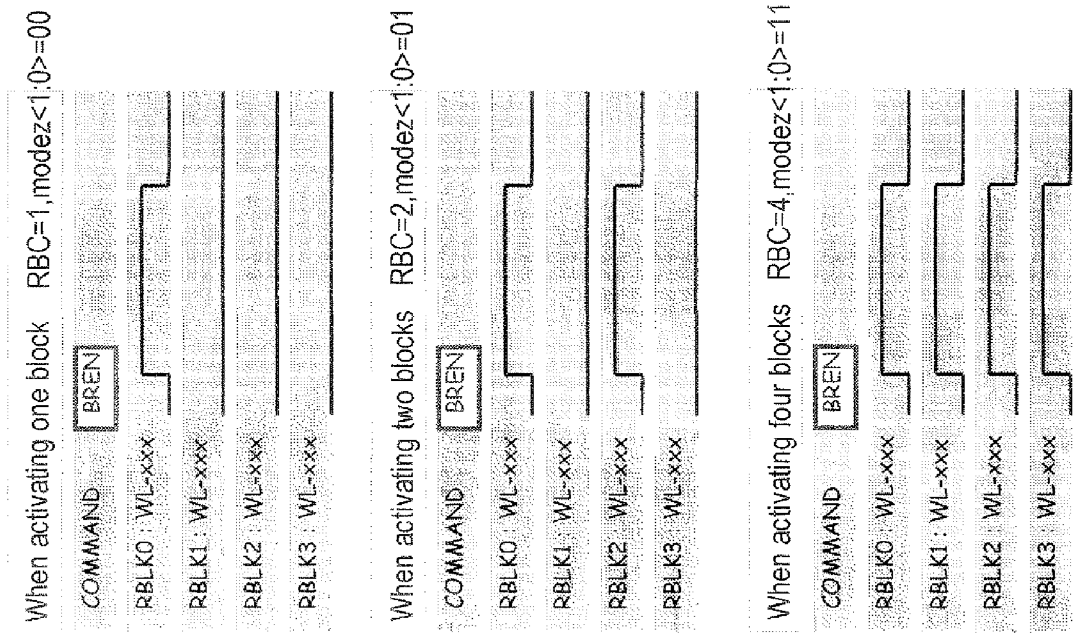

FIG. 155 A figure showing control of the memory block within the core corresponding to the refresh block count.

Figure 156:
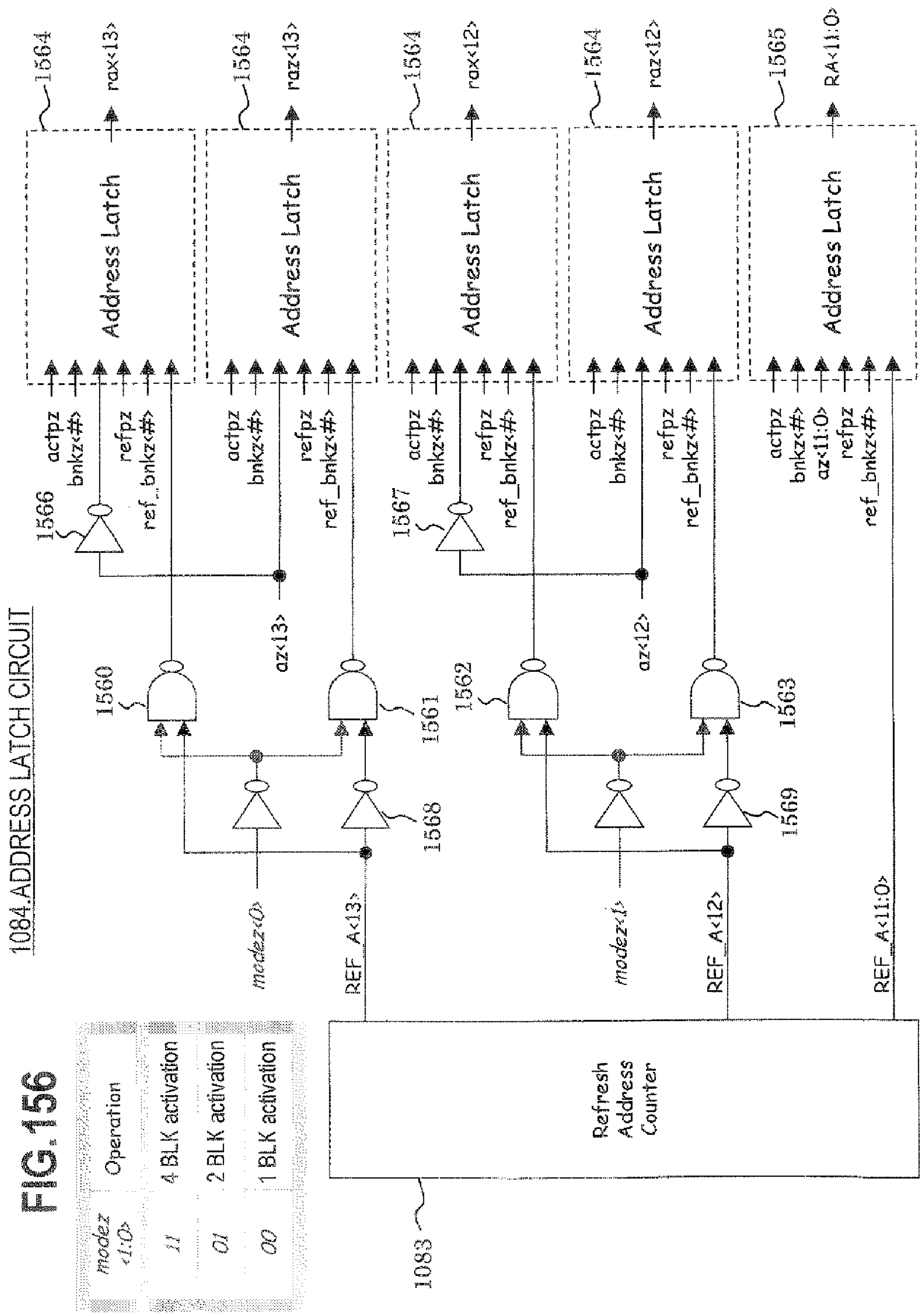

FIG. 156 A circuit diagram of the address latch circuit.

Figure 157:
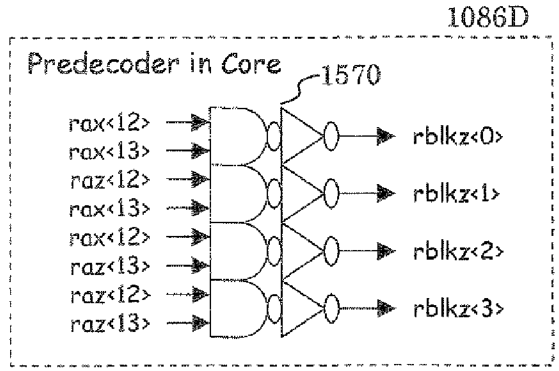

FIG. 157 A circuit diagram of a predecoder circuit within the row decoder.

Figure 158:
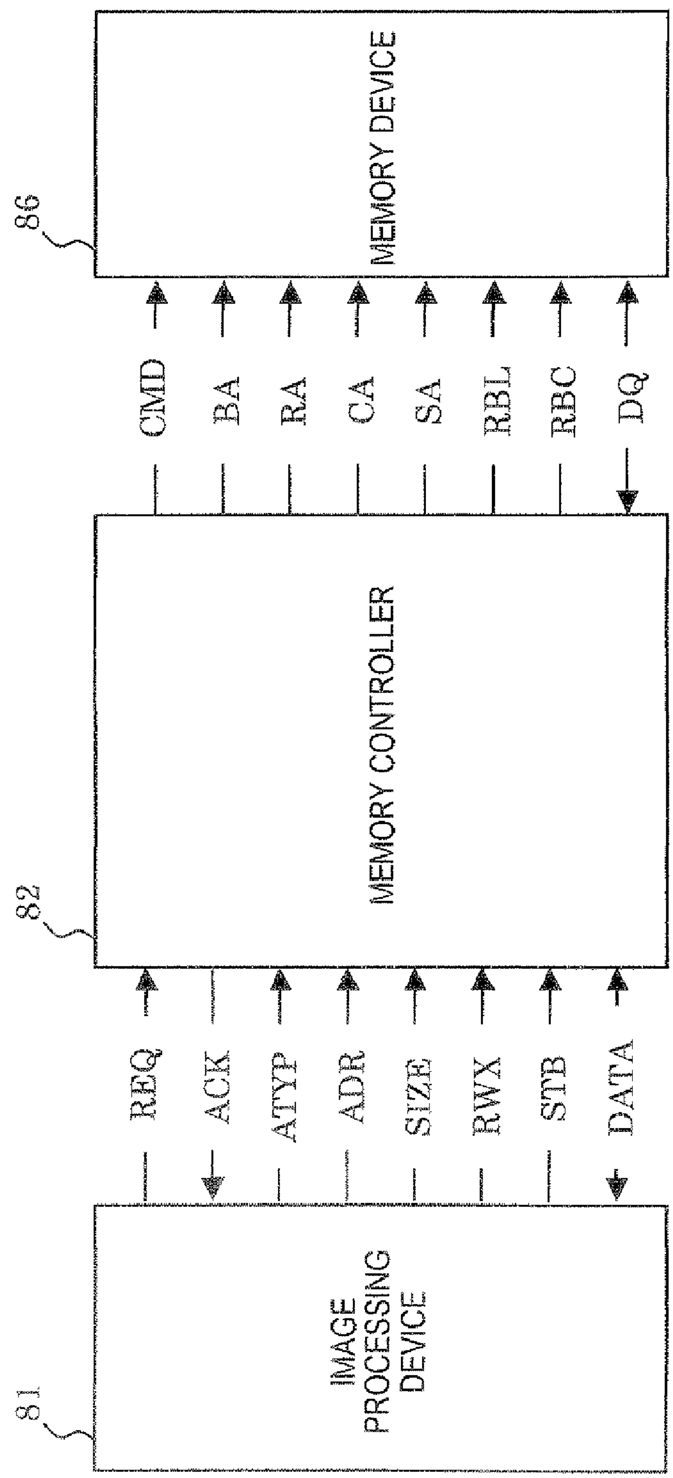

FIG. 158 A configuration diagram of a memory system having the background refresh function.

Figure 159:
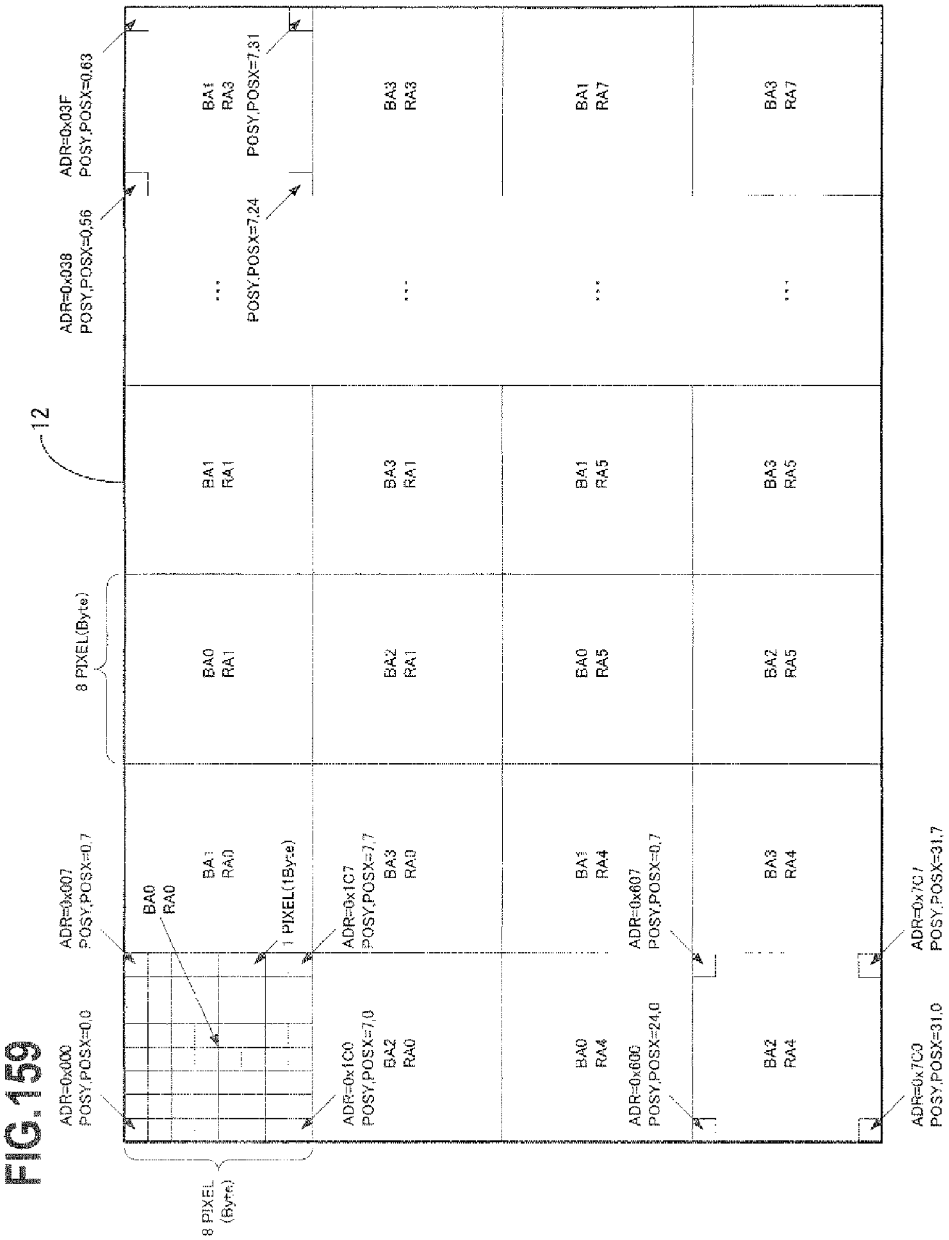

FIG. 159 A figure showing an example of memory mapping.

Figure 160:
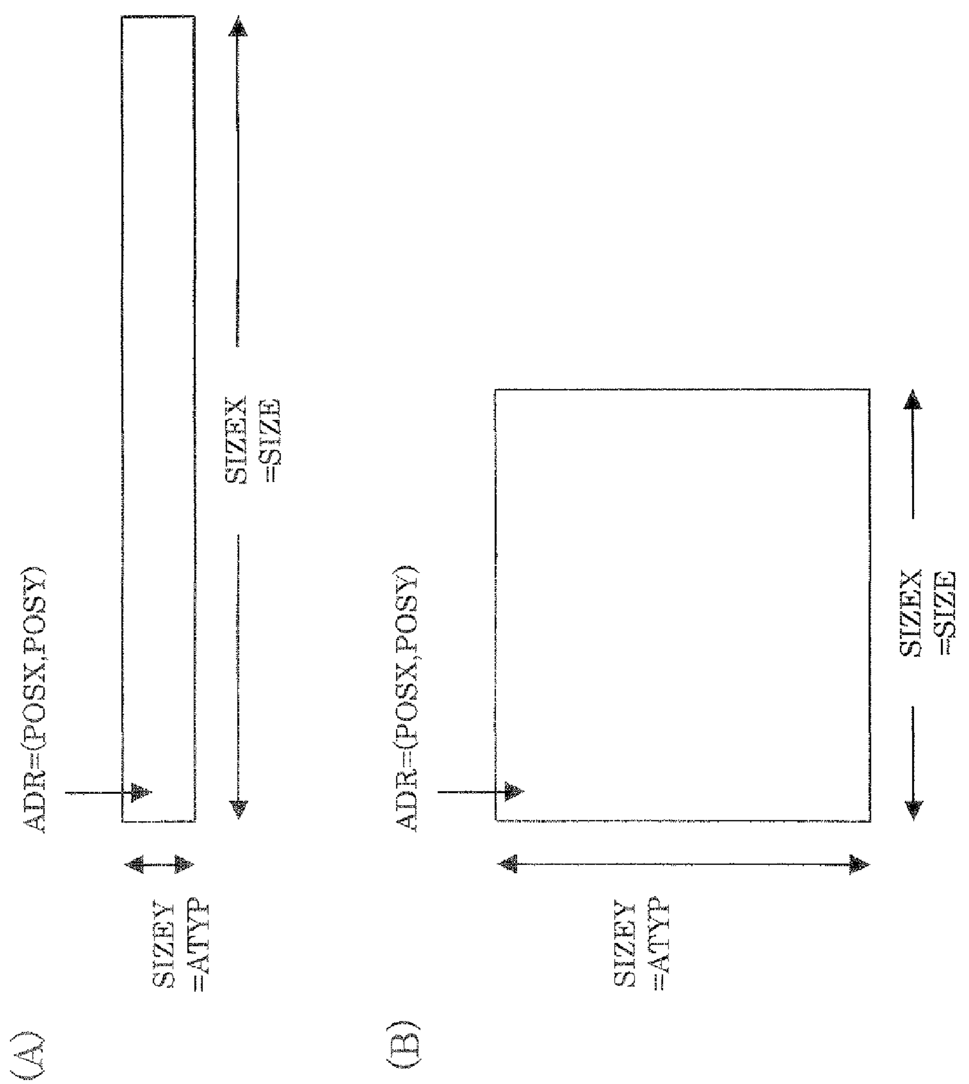

FIG. 160 A figure showing a front pixel address and the size information in a horizontal access and a rectangular access.

Figure 161:
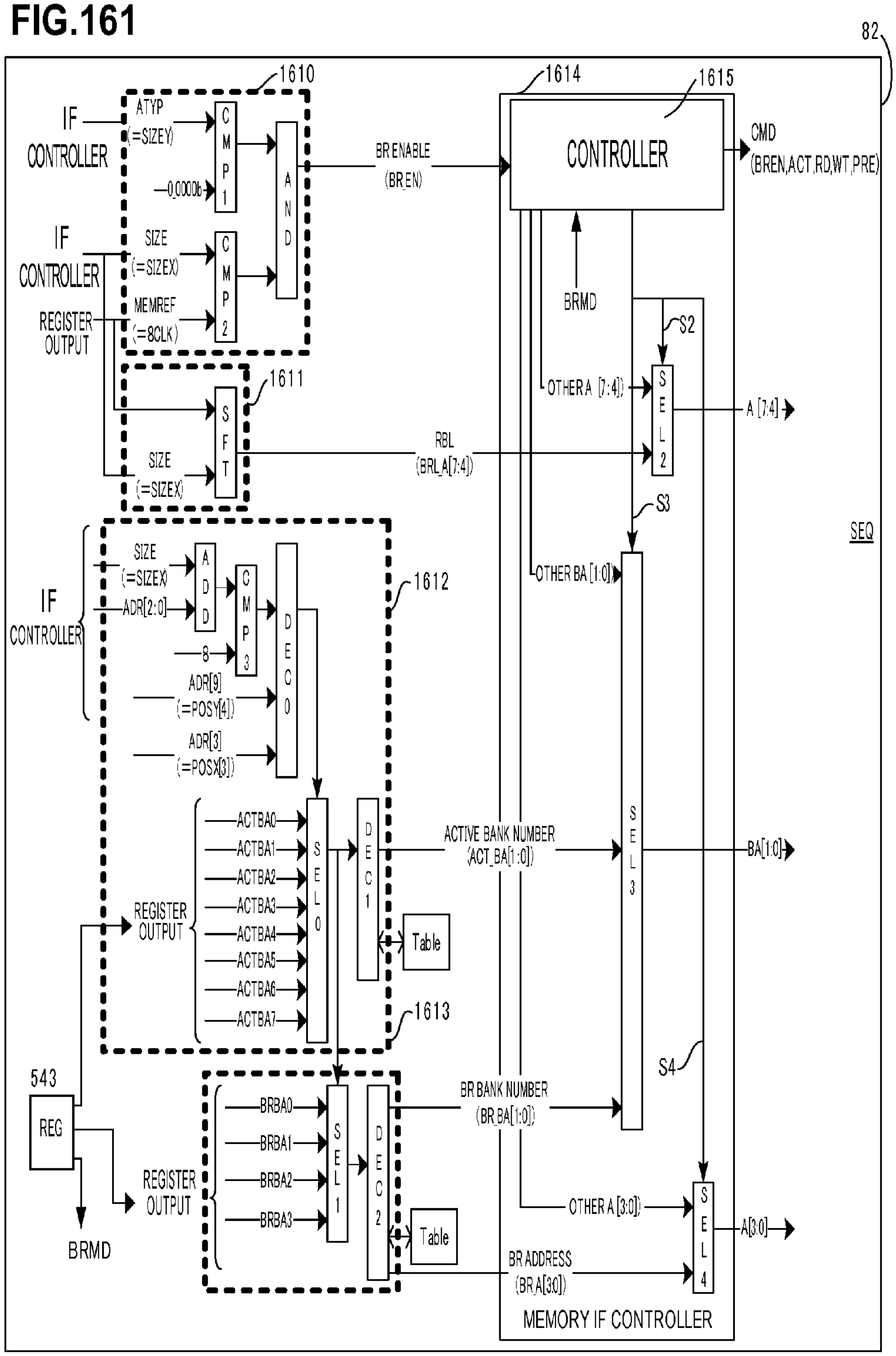

FIG. 161 A configuration diagram of the memory controller.

Figure 162:
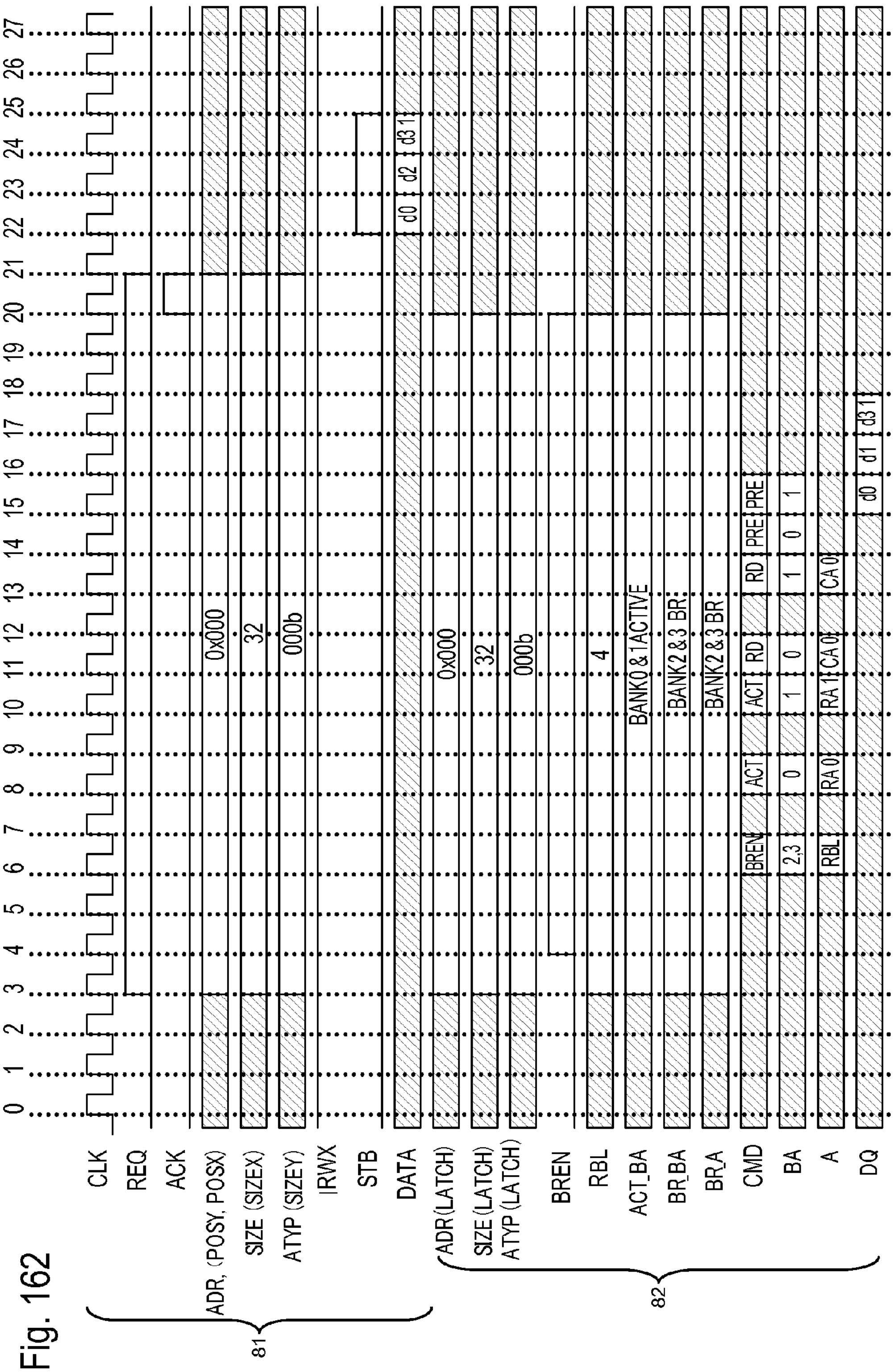

FIG. 162 A timing chart of the operation of the memory controller.

FIG. 163 A table for explaining the decoder DEC0 and selector SEL0 of the active bank number generating section.

FIG. 164 A table for explaining the meanings of values 000b through 111b that can be set to ACTBL of the register 543.

FIG. 165 A figure showing a conversion table of the decoder DEC1.

FIG. 166 A table showing a conversion operation performed by the decoder DEC1 corresponding to a first example of the register set values.

FIG. 167 A table showing a conversion operation of the decoder DEC1 corresponding to a second example of the register set values.

FIG. 168 A table showing an operation of the selector SEL1.

FIG. 169 A table showing a conversion table of the decoder DEC2.

FIG. 170 A figure showing an operation of the decoder DEC2 in the case of the first register set value.

FIG. 171 A figure showing an operation of the decoder DEC2 in the case of the second register set value.

FIG. 172 A figure showing an operation of the decoder DEC2 in the case of the third register set value.

FIG. 173 A figure showing an operation of the decoder DEC2 in the case of the fourth register set value.

Figure 174:
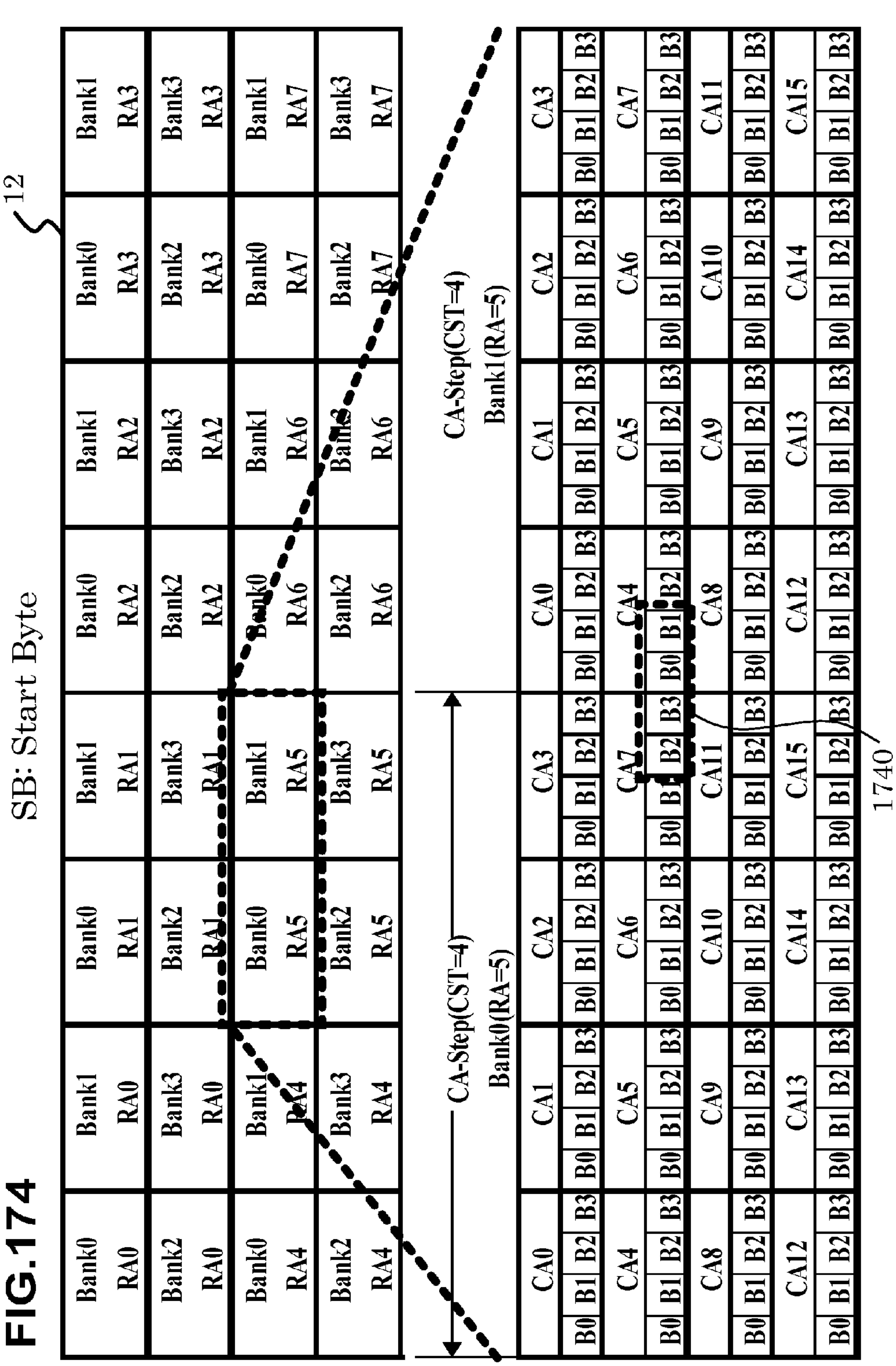

FIG. 174 A figure showing a start byte signal SB in a byte boundary.

FIG. 175 A figure showing a relationship between second information BMR and first information SB of the byte combination data (start byte).

Figure 176:
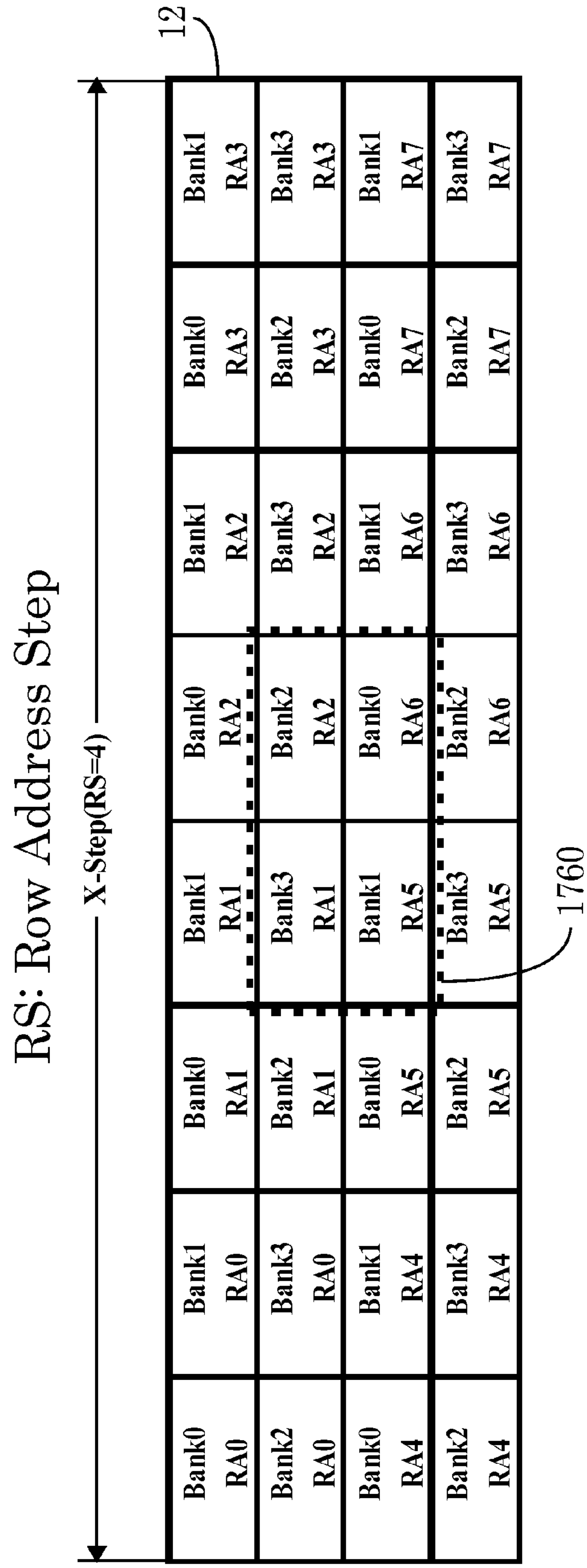

FIG. 176 A figure showing the row address step RS.

FIG. 177 A figure showing the memory mapping information AR.

Figure 178:
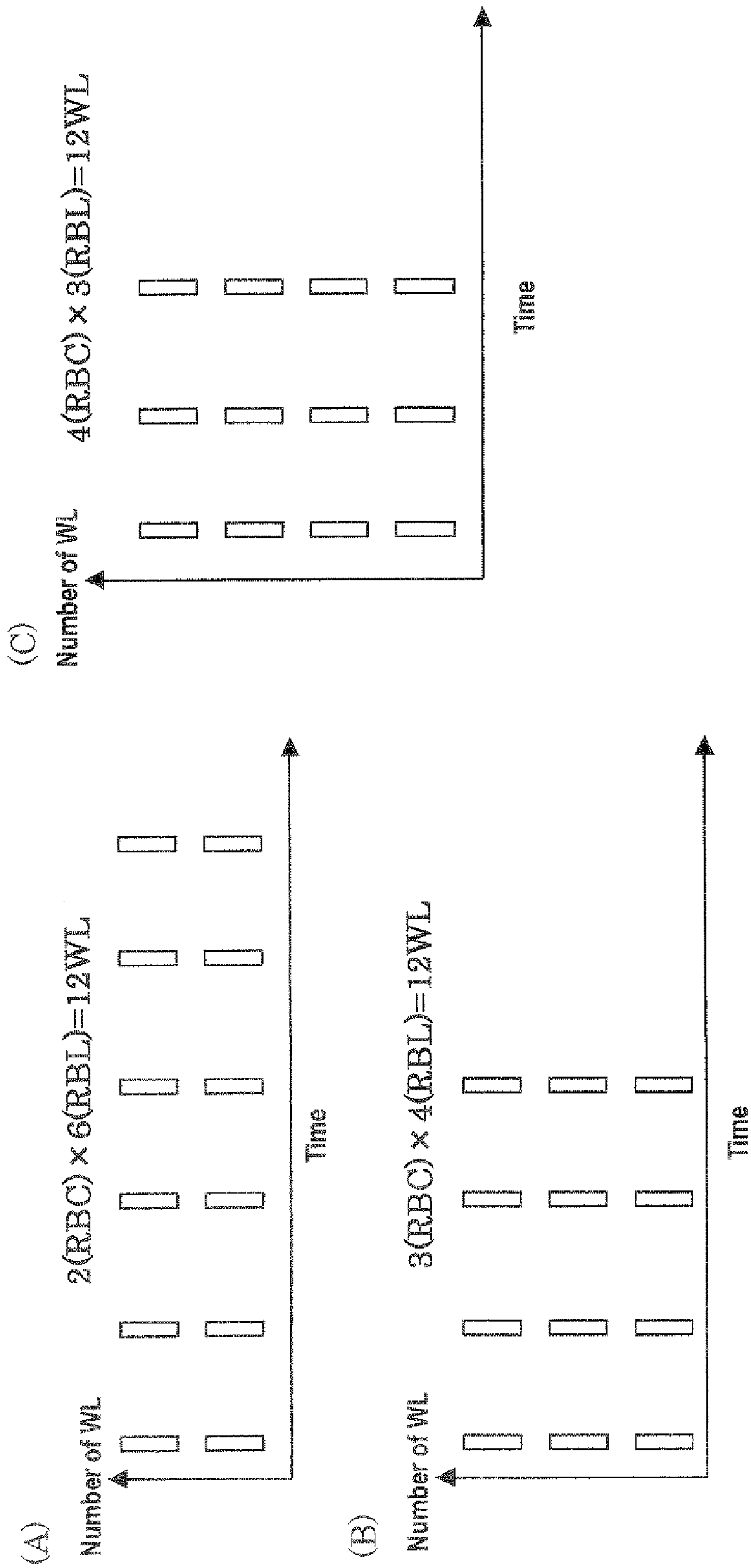

FIG. 178 A figure showing the refresh burst length RBL and the refresh block count RBC in a background refresh.

Figure 179:
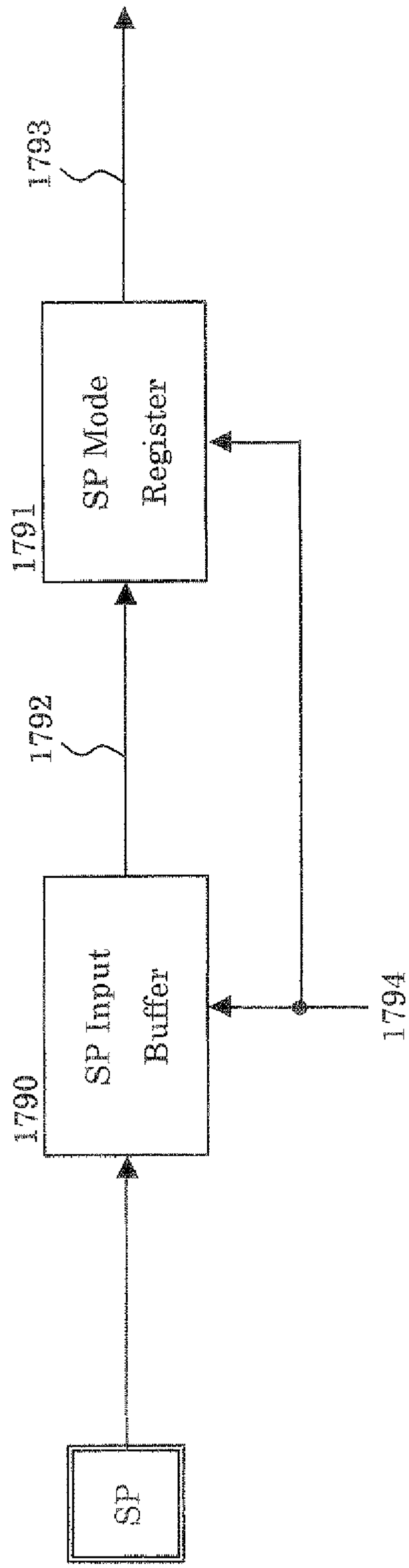

FIG. 179 A figure showing a configuration of the special input terminal, an input buffer thereof, and a mode register within the memory device.

Figure 180:
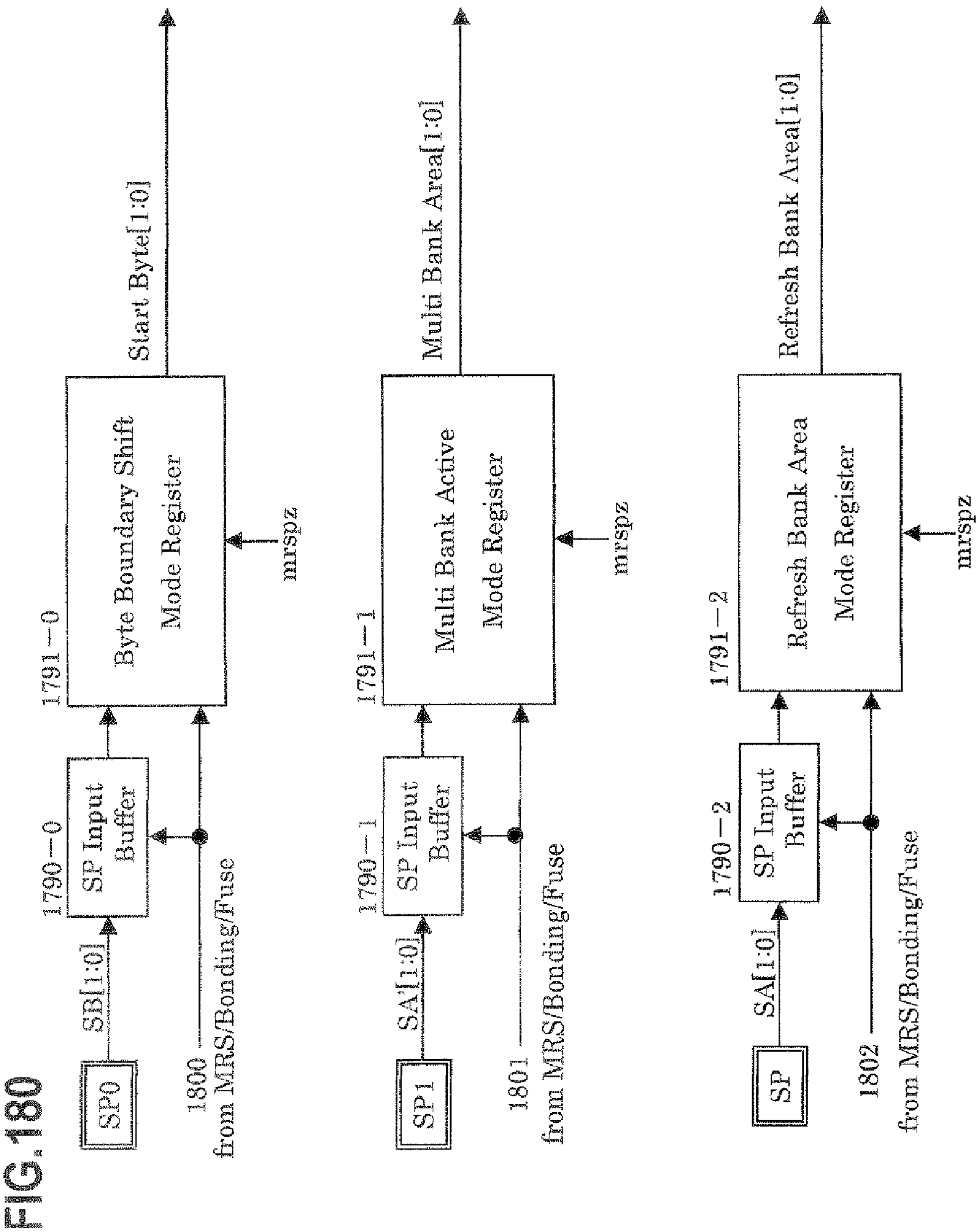

FIG. 180 A figure showing a configuration of the special input terminal, input buffer thereof, and mode register within the memory device.

Figure 181:
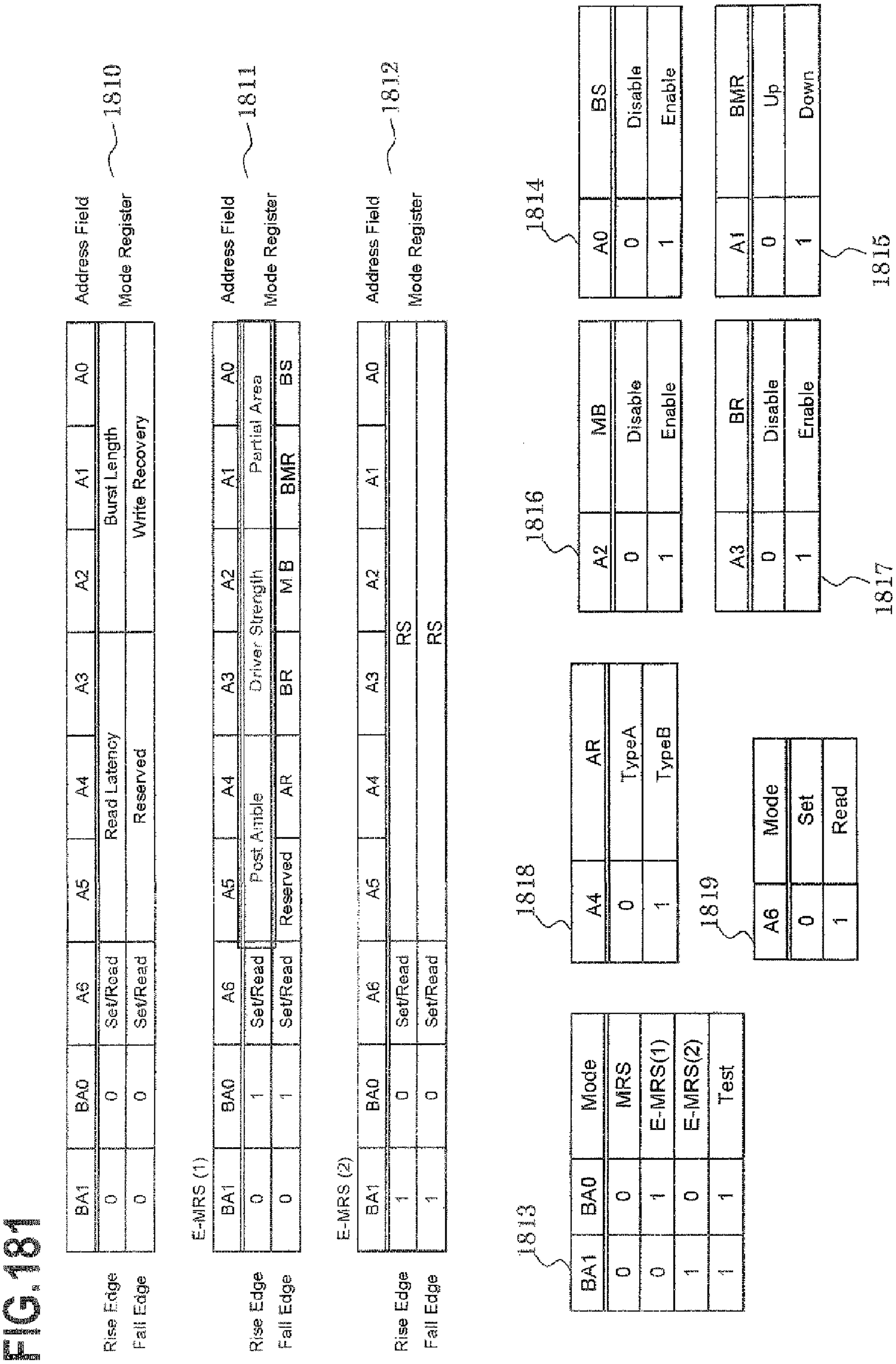

FIG. 181 A figure showing an example of the mode register.

Figure 182:
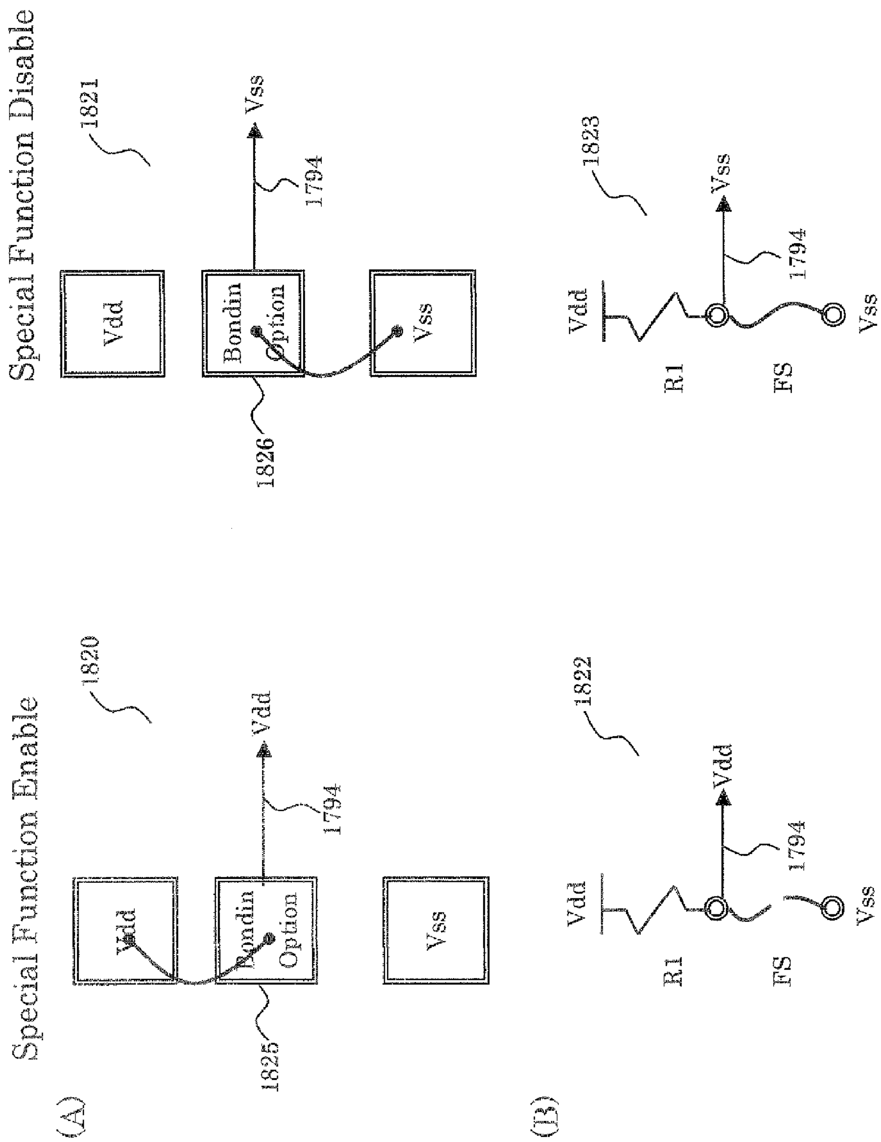

FIG. 182 A figure showing an example of an enable signal generating circuit.

Figure 183:
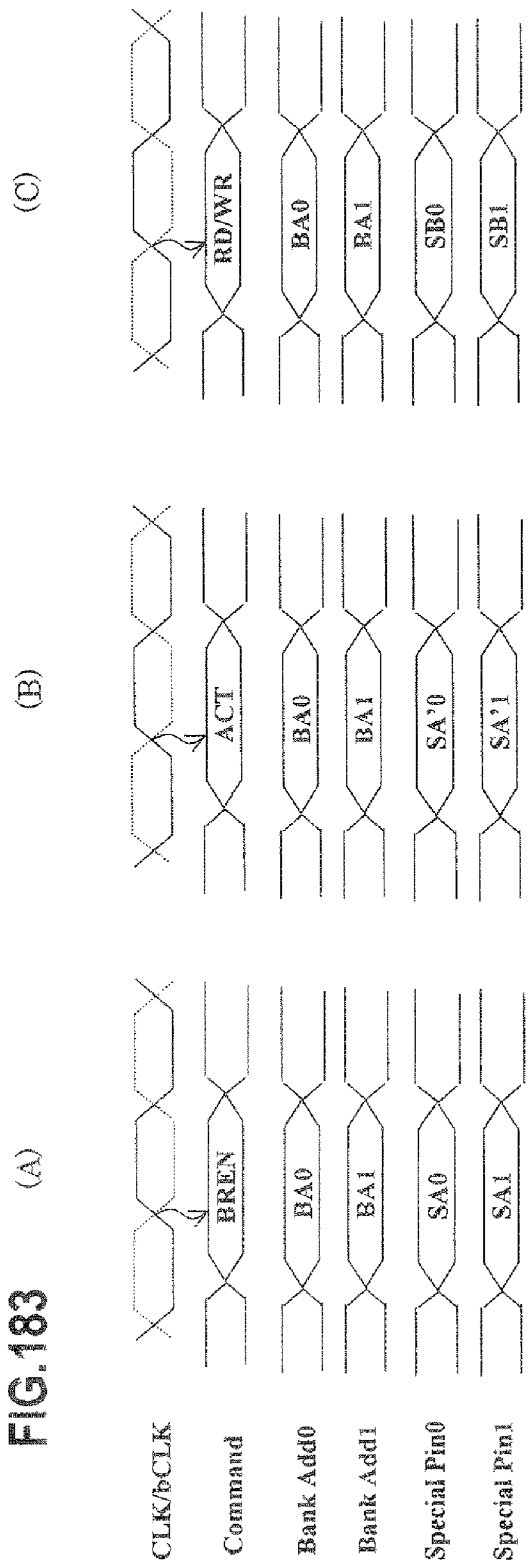

FIG. 183 A figure showing an input method in a single data rate (SDR).

Figure 184:
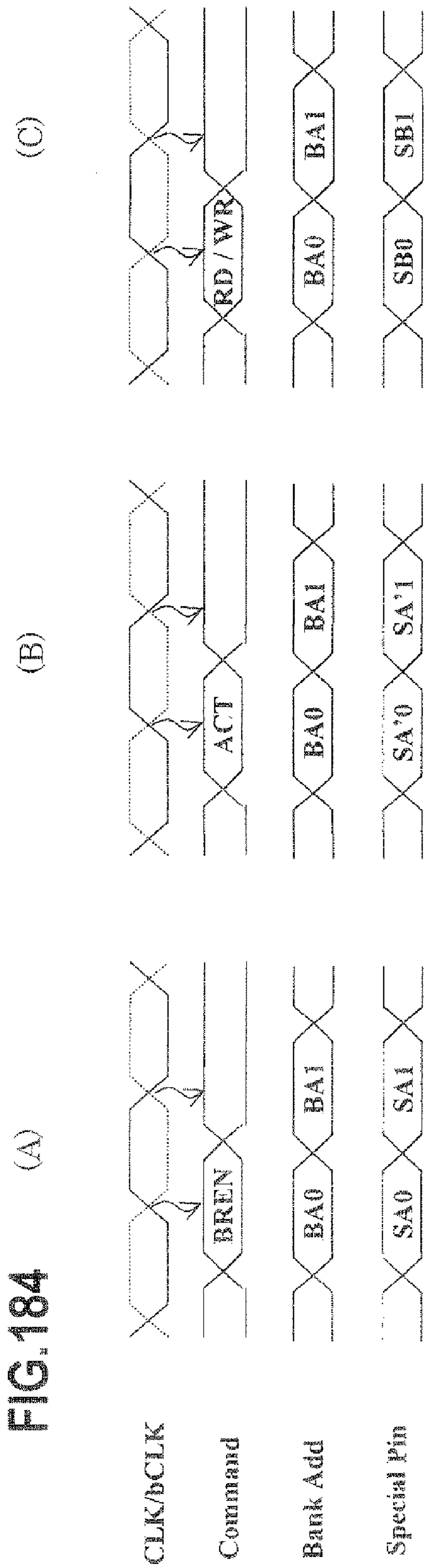

FIG. 184 A figure showing an input method in a double data rate (DDR).

Figure 185:
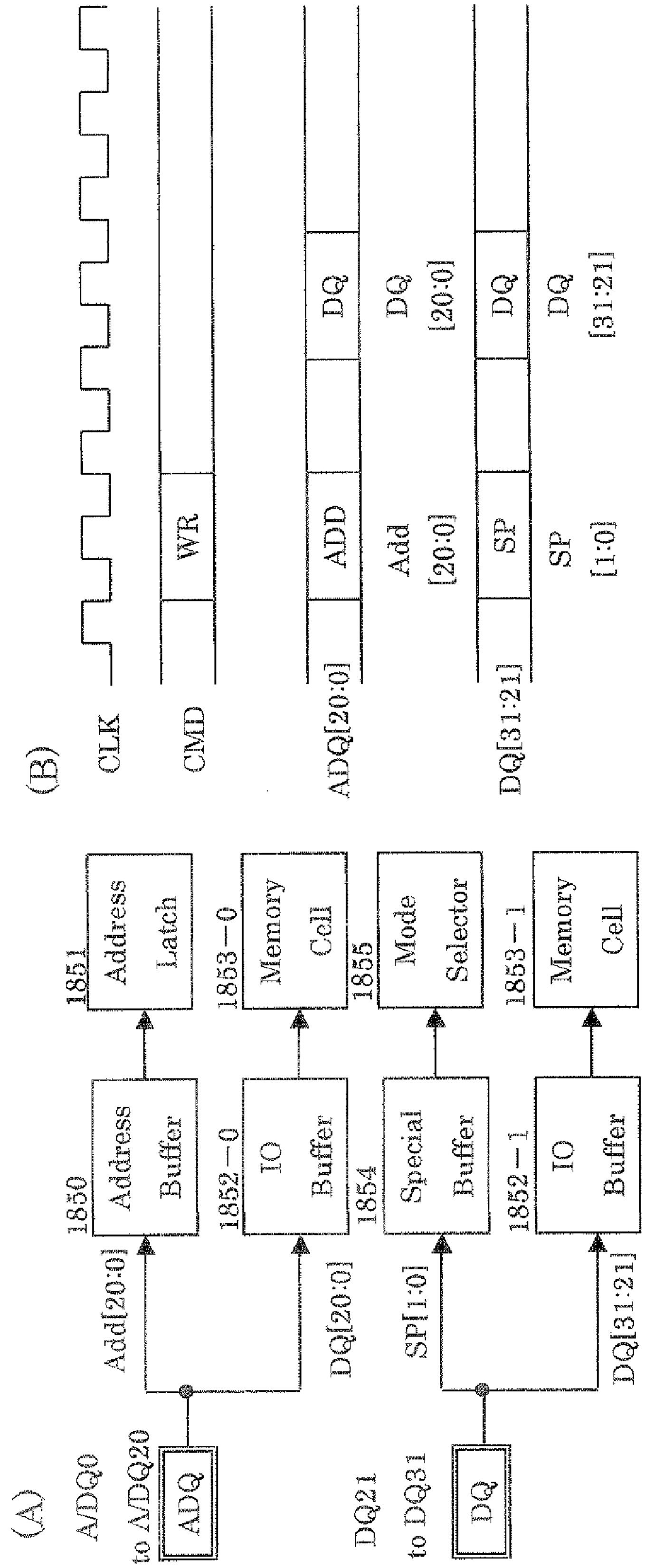

FIG. 185 A figure showing an input method using an ADQ multiplex input system.

Figure 186:
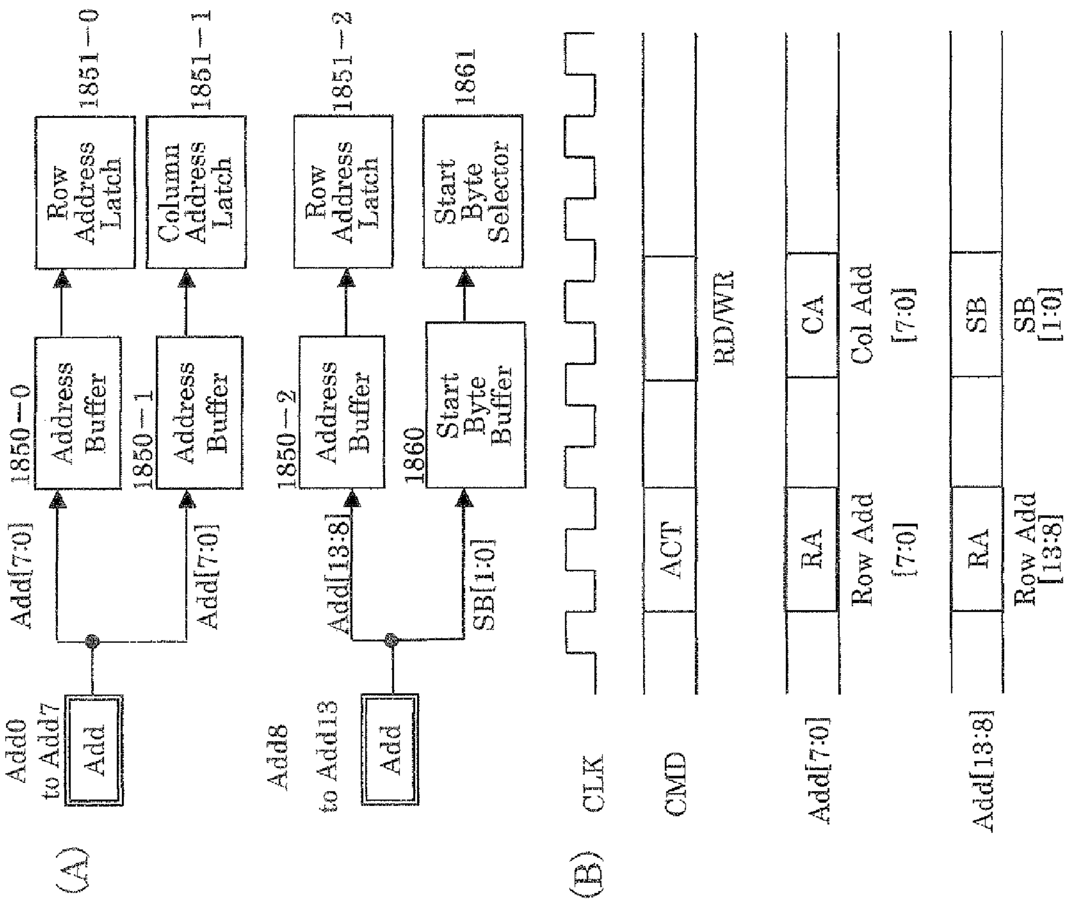

FIG. 186 A figure showing an in input method using an address multiplex input system.

Figure 187:
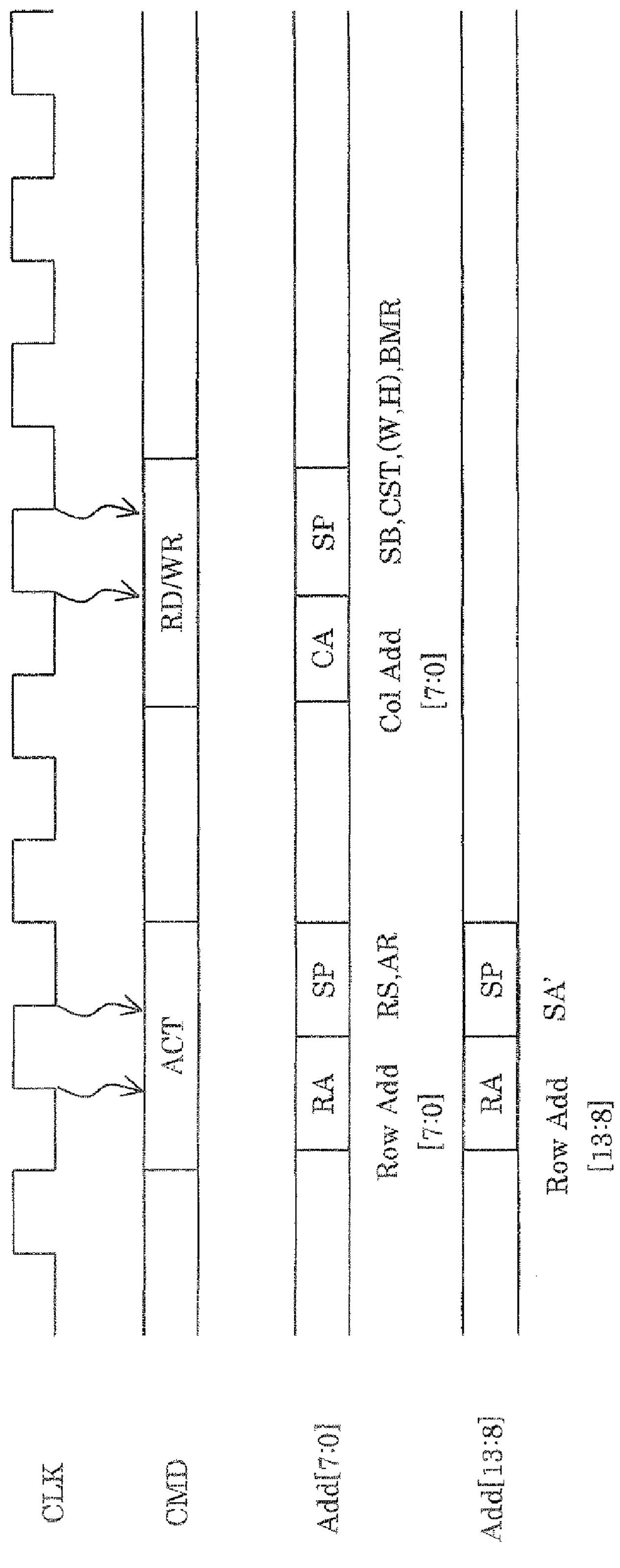

FIG. 187 A figure showing the input method using the address multiplex system in the double data rate (DDR)

Figure 188:
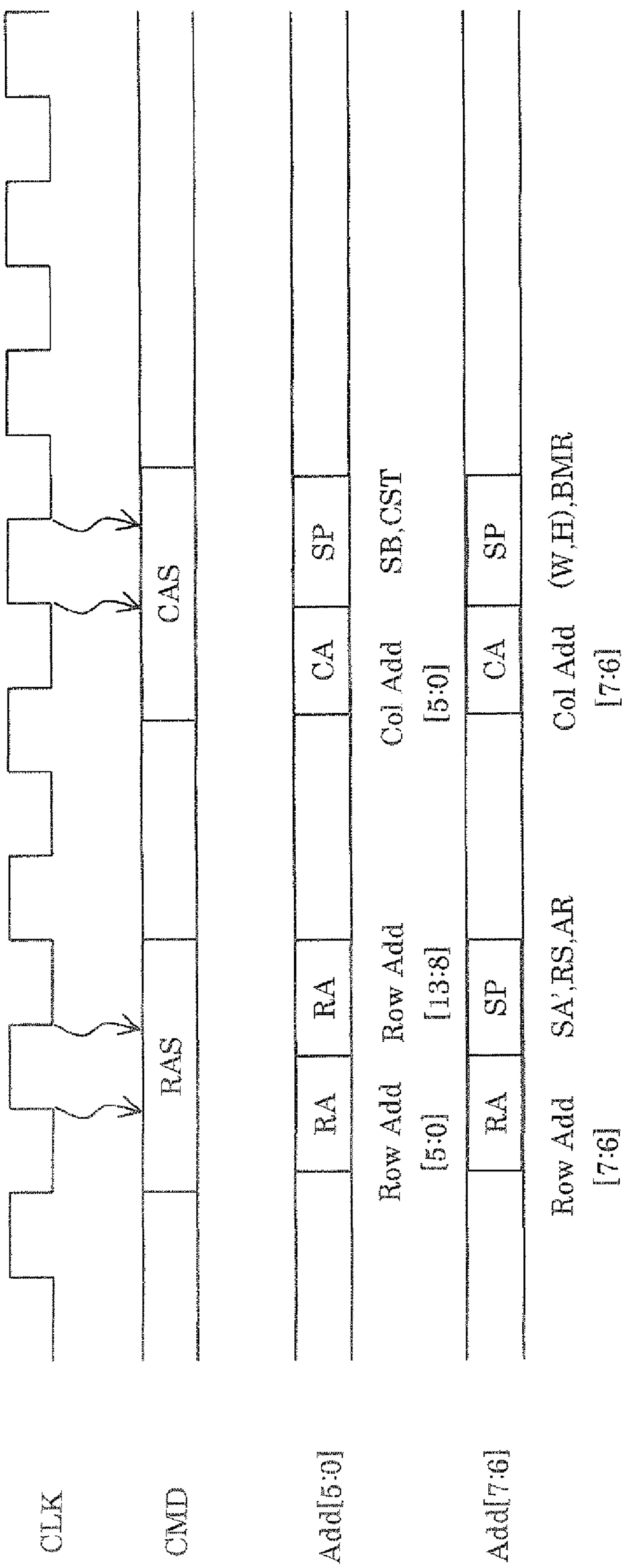

FIG. 188 A figure showing the input method using the address multiplex system in the double data rate (DDR).

BEST MODE FOR CARRYING OUT THE INVENTION

Embodiments of the present invention are described with reference to the drawings. However, the technical field of the present invention is not limited to these embodiments, and thus covers the matters described in the patent claims and equivalents thereof.

[Memory Mapping of Image Memory, and Problems involved in the Mapping Memory]

Figure 1:
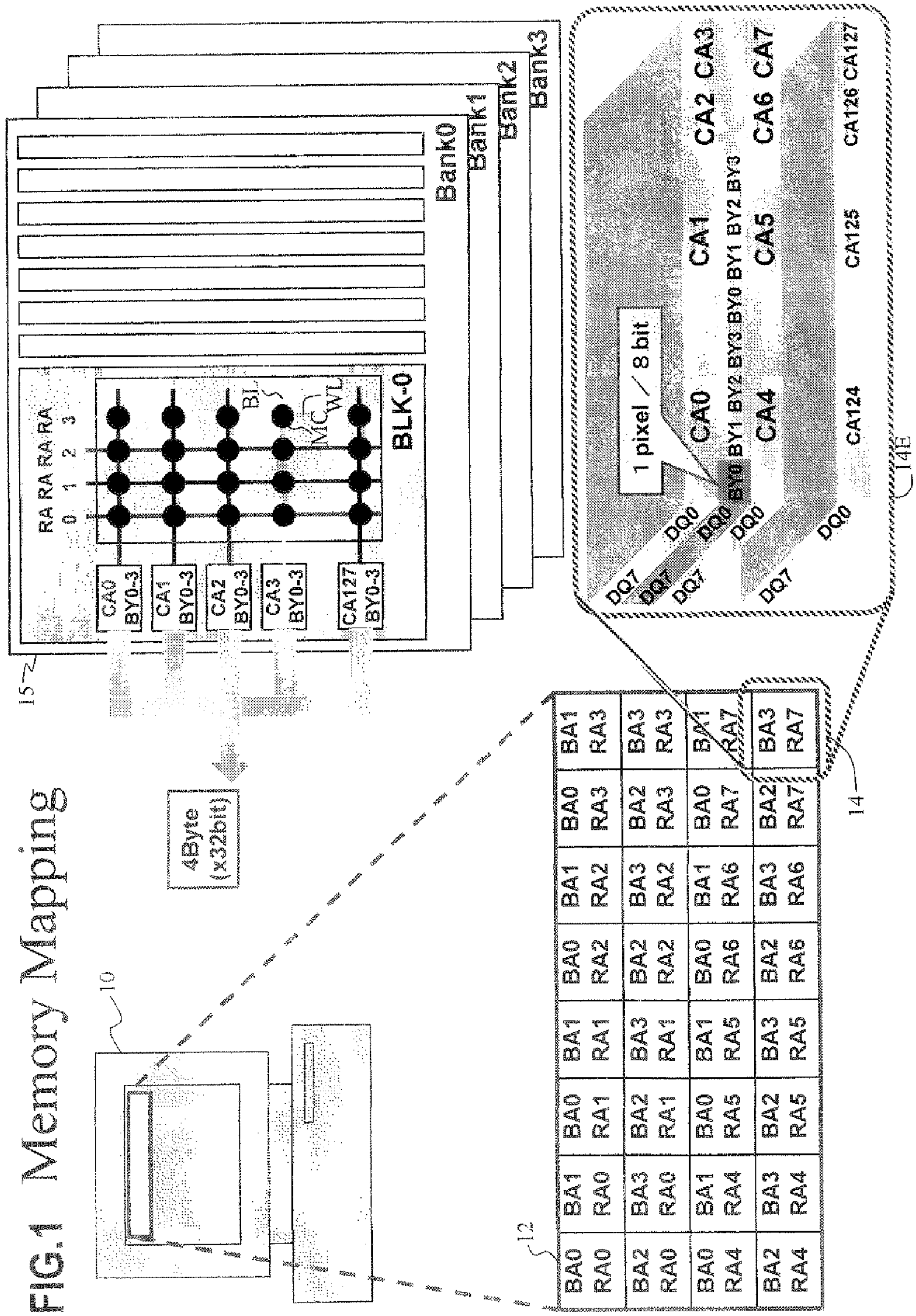
FIG. 1 A figure showing memory mapping of an image memory according to the present embodiment.

FIG. 1 shows memory mapping of an image memory according to the present embodiment. In FIG. 1, display image data in an image processing system having a display device 10 is stored in image memory 15. The display image data is constituted by data on a luminance signal Y and color-difference signals Ca and Cb of each pixel and RGB gradation signals of each pixel, wherein each signal is constituted by data of, for example, 8 bits (1 byte).

Meanwhile, the image memory 15 is generally constituted by a high-capacity and high-speed semiconductor memory device in which an integrated circuit is formed on a semiconductor substrate such as SDRAM. Such image memory is constituted by a plurality of banks Bank 0 through 3 (four banks as shown in FIG. 1), wherein each Bank 0-3 has a plurality of blocks BLK-0, and each of the blocks has a plurality of word lines WL, bit lines BL, and memory cells MC which are at the intersections of the word lines and bit lines. Each memory cell is constituted by an unshown MOS transistor of which gate is connected to a word line, and a capacitor that is connected to the transistor. In the example shown in FIG. 1, the four banks are associated with bank addresses BA 0 through 3 respectively, the word lines are associated with row addresses RA 0 through 7, and the bit lines are associated with column addresses CA 0 through 127. A word line within a bank is selected by a combination of a bank address BA and a row address RA, and a bit line is selected by a column address CA. 4 bytes of data items, BY 0 through 3, are accessed by the bank address BA, row address RA and column address CA. Since 1 byte consists of 8 bits, 4 bytes of data items, i.e., 4×8=32 bits of data, are associated with an input/output terminals of the memory at one access, and then reading or writing is performed. Generally, the abovementioned 1 byte of data (8 bits of data) corresponds to a signal of a pixel. By inputting/outputting 4 bytes of data items at one access, a bandwidth, which indicates the number of pixels that can be processed per unit time with respect to the image data, can be increased.

According to the memory mapping 12 for the display image data, page areas 14, each of which is specified by the bank address BA and row address RA, are placed in rows and columns. As shown in an enlarged area 14E, one page area 14 has 128 memory unit areas that are specified by the column addresses CA0 through 127, and each of the memory unit areas stores the 4 bytes of data items, BY 0 through 3. The 4 bytes of data items, BY 0 through 3, are inputted/outputted via a total of 32 input/output terminals of a memory, i.e., via input/output terminals DQ 0 through 7, DQ 8 through 15, DQ 16 through 23, and DQ 24 through 31. 8-bit data of each byte corresponds to signal data of a pixel.

The memory map 12 is suitable for operating, at high speed, the image memory 15 such as the SDRAM constituted by a plurality of banks. In response to an active command provided along with both the bank address BA and the row address RA, the SDRAM performs the active operation that drives the selected word line within the selected bank, reads the data stored in a memory cell into the bit line, activates the sense amplifier associated with the bit line to amplify the bit line potential, and thereafter, in response to a read command provided along with the column address CA, performs the read operation for reading the data from the selected bit line. Alternatively, after performing the active operation the SDRAM responds to a write command provided along with the column address CA and write data, to perform the write operation for writing the write data into the selected bit line. Precharge operation using a precharge command is performed after the read operation or the write operation, and then the active operation and the read or write operation are performed again. In this manner, in the SDRAM each bank can independently perform the active operation, read operation and write operation.

According to the memory map 12 shown in FIG. 1, different bank addresses BA 0 through 3 are assigned to the page areas 14 that are vertically and horizontally adjacent to each other. Specifically, bank addresses BA 0 and 1 are alternately arranged in the odd-numbered rows in the memory map 12, while bank addresses BA 2 and 3 are alternately arranged in the even-numbered rows. Moreover, the row addresses RA 0 through 7 are repeatedly incremented by two in the raster direction (row direction) of the memory map 12, and each of the rows in the memory map 12 is wrapped after every four row addresses RA 0 through 3 and RA 4 through 7.

By adopting the memory mapping for allocating the page areas on an image without causing the page areas having the same bank to be adjacent to each other in the row direction or the column direction, the horizontal access that is a representative access made to the image memory, i.e., the access in which the page areas 14 are moved in the row direction and one page area is selected, can be made to the image memory, while the active operation and the read/write operation are executed simultaneously by using two banks, whereby the access efficiency can be improved. The same is true for the case where the image memory is accessed in a vertical direction.

Figure 2:
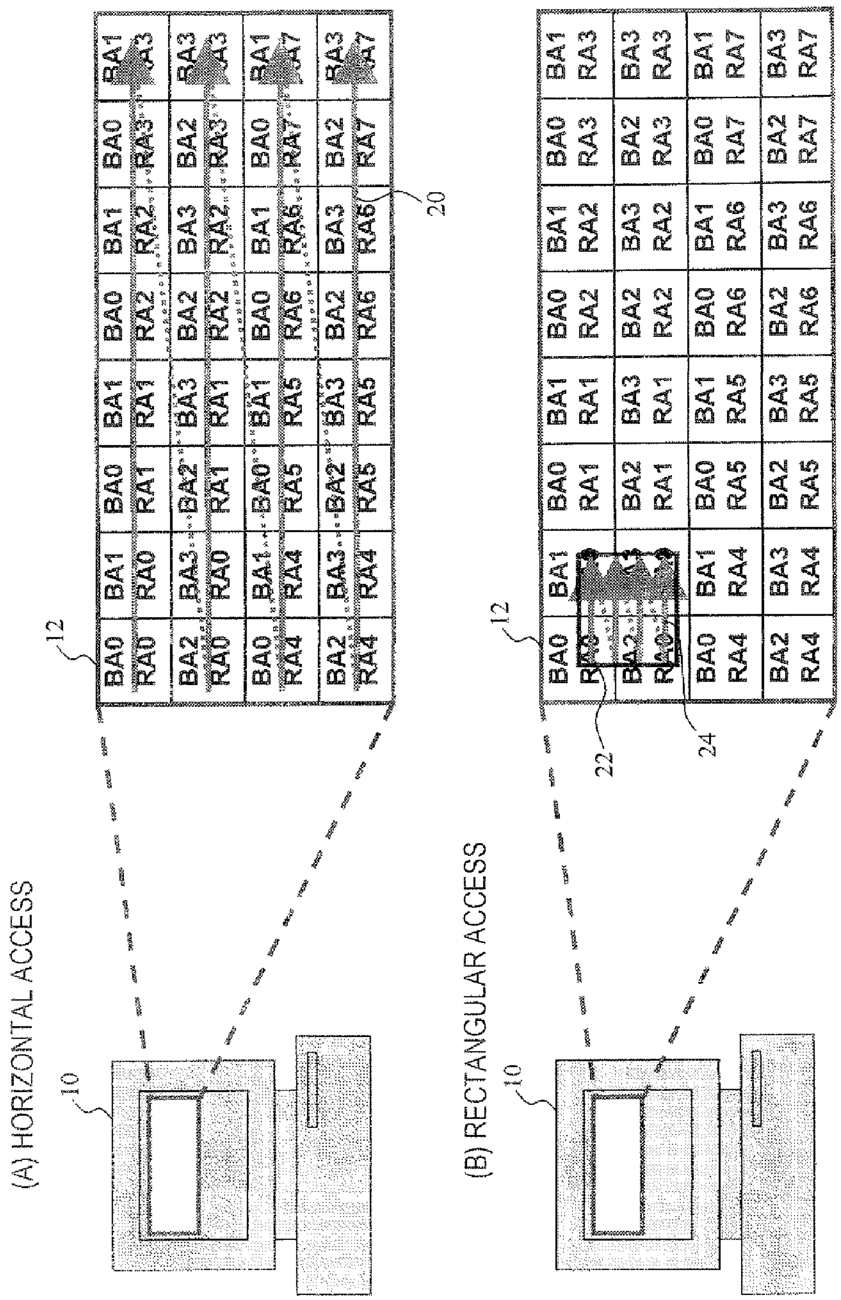
FIG. 2 A figure showing two accesses in the image memory.

FIG. 2 shows two accesses in the image memory. The horizontal access shown in FIG. 2(A) is an access that occurs mostly when inputting/outputting a video frame image, and corresponds to raster scanning for accessing the image in a horizontal direction 20 from the upper left to the lower right. On the other hand, the rectangular access shown in FIG. 2(B) is an access that occurs mostly when compressing or expanding an MPEG image or the like, and corresponds to an operation for accessing the image from the upper left to the lower right in a direction of an arrow 24 within a rectangle 22 with an arbitrary aspect ratio. The rectangular area 22 corresponds to a block or the like that is a target for extracting a motion vector of the MPEG image.

Generally, in an image system using an image memory, the transfer rate of transferring the image memory, which is a frame memory, is set faster than the speed of image display operation, so that, while the image data read by horizontally accessing the image memory is displayed on a screen, new frame data is created by means of the rectangular access, and that frame data is continuously created and outputted. Therefore, both horizontal access and rectangular access are made in an actual image system.

In the horizontal access, scanning is performed in the horizontal direction 20, thus memory access can be made efficiently, while activating adjacent banks simultaneously. In the rectangular access, on the other hand, the position of the rectangular area 22 to be accessed is not caused to go beyond a single bank and a page area within the bank, whereby the data within the rectangular area 22 can be accessed by performing single active operation for specifying the bank address BA and the row address RA, thus efficient memory access can be performed, as with the horizontal access.

Figure 3:
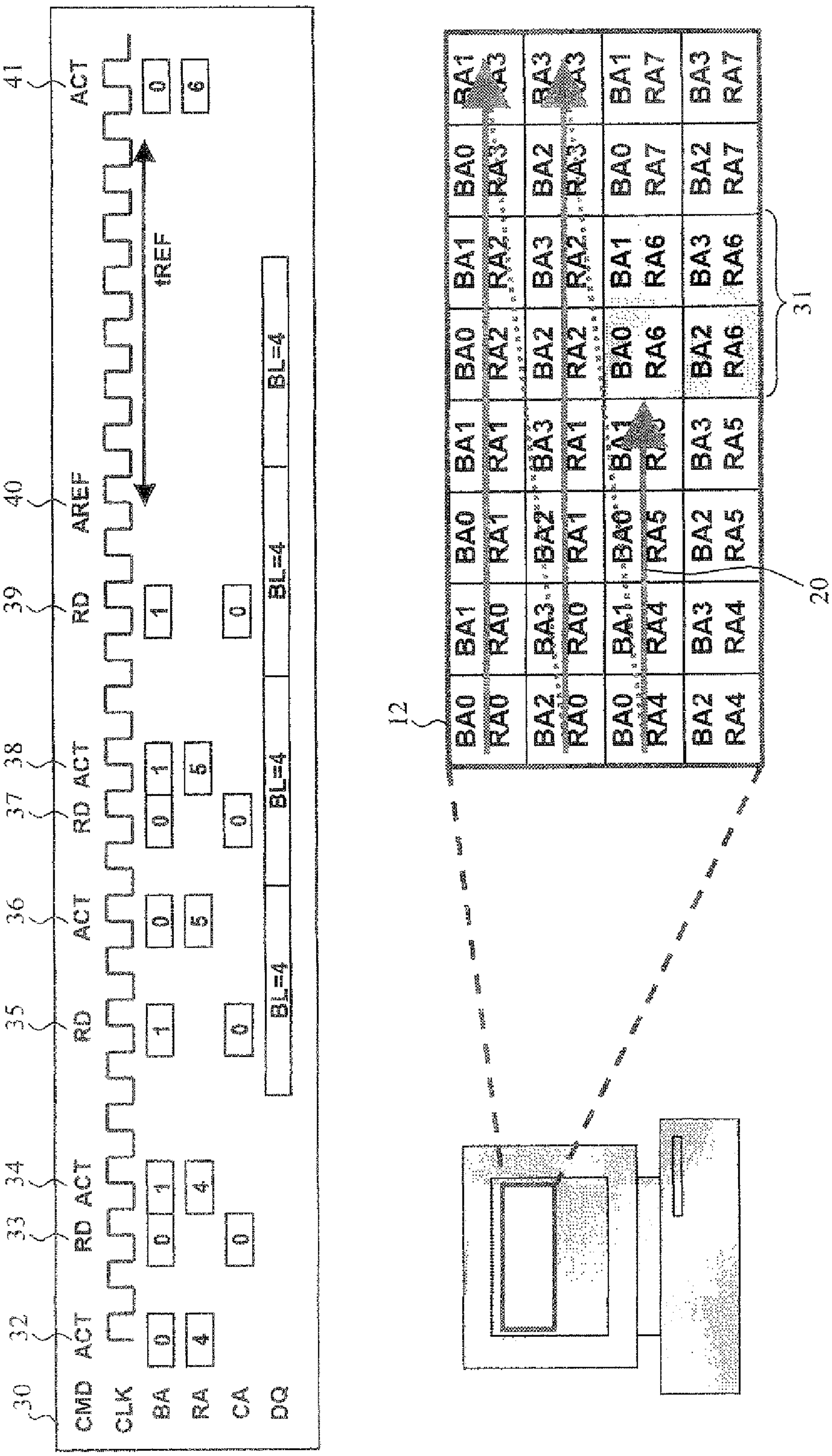
FIG. 3 A figure showing a problem of a horizontal access.

FIG. 3 shows a problem of the horizontal access. There is shown a timing chart 30 of the horizontal access made in the horizontal direction 20 in the abovementioned memory map 12. In this timing chart, an automatic refresh command AREF is generated when horizontally accessing (20 in the figure) the page area in the fourth row of the memory map 12 (BA 0/RA 4, BA 1/RA 4, BA 0/RA 5, BA 1/RA 5). The timing chart 30 shows a command CMD, clock CLK, bank address BA, row address RA, column address CA, and input/output terminals DQ.

A burst length BL is set to 4 as a premise. When the active operation is performed on the page area with BA 0/RA 4 by an active command ACT 32 and an instruction is issued by a read command RD 33 to read the page area with BA 0/CA 0, four 32-bit data items are successively outputted from the input/output terminals DQ in four clock cycles after a predetermined latency (four clock in the figure). Specifically, each of the four 32-bit data items in the respective column addresses CA 0 through 3 within the page area BA 0/RA 4 is outputted four times successively. This burst operation is required to the SDRAM as a standard. The above-described operation suggests that each 4 byte (32-bit) data item of each of the column addresses CA 0 through 3 within the page area 14E enlarged in FIG. 1 is outputted four times successively.

Next, 4 bytes of data items of the page area BA 1/RA 4 are outputted by means of an active command ACT 34 and a read command RD 35. Similarly, 4 bytes of data items of the page area BA 0/RA 5 are outputted by means of an active command ACT 36 and a read command RD 37, and 4 bytes of data items of the page area BA 1/RA 5 are outputted by means of an active command ACT 38 and a read command RD 39.

At this point, when an automatic refresh command AREF 40 for specifying a row address RA 6 is generated, the SDRAM memory configuring the image memory executes a refresh operation on all incorporated banks, i.e., four banks BA 0 through 3, in parallel. Specifically, the word lines of the respective row addresses RA 6 within the respective four banks are driven simultaneously, the corresponding sense amplifiers are activated, rewriting is performed, and then the precharge operation is performed. This refresh operation is performed on four page areas 31 within the memory map 12 shown in FIG. 3. Therefore, the horizontal access (arrow 20) is stopped temporarily during a refresh operation period tREF. After the refresh operation period tREF, the next page area BA 0/RA 6 is accessed again by means of an active command ACT 41 and a read command RD (not shown), whereby the horizontal access is restarted.

Since the refresh operation is performed for four banks simultaneously by means of the refresh command AREF, the horizontal access is stopped temporarily when the refresh command is generated while the horizontal access is made, thus the effective bandwidth becomes narrow. This is the problem occurring in the horizontal access.

Figure 4:
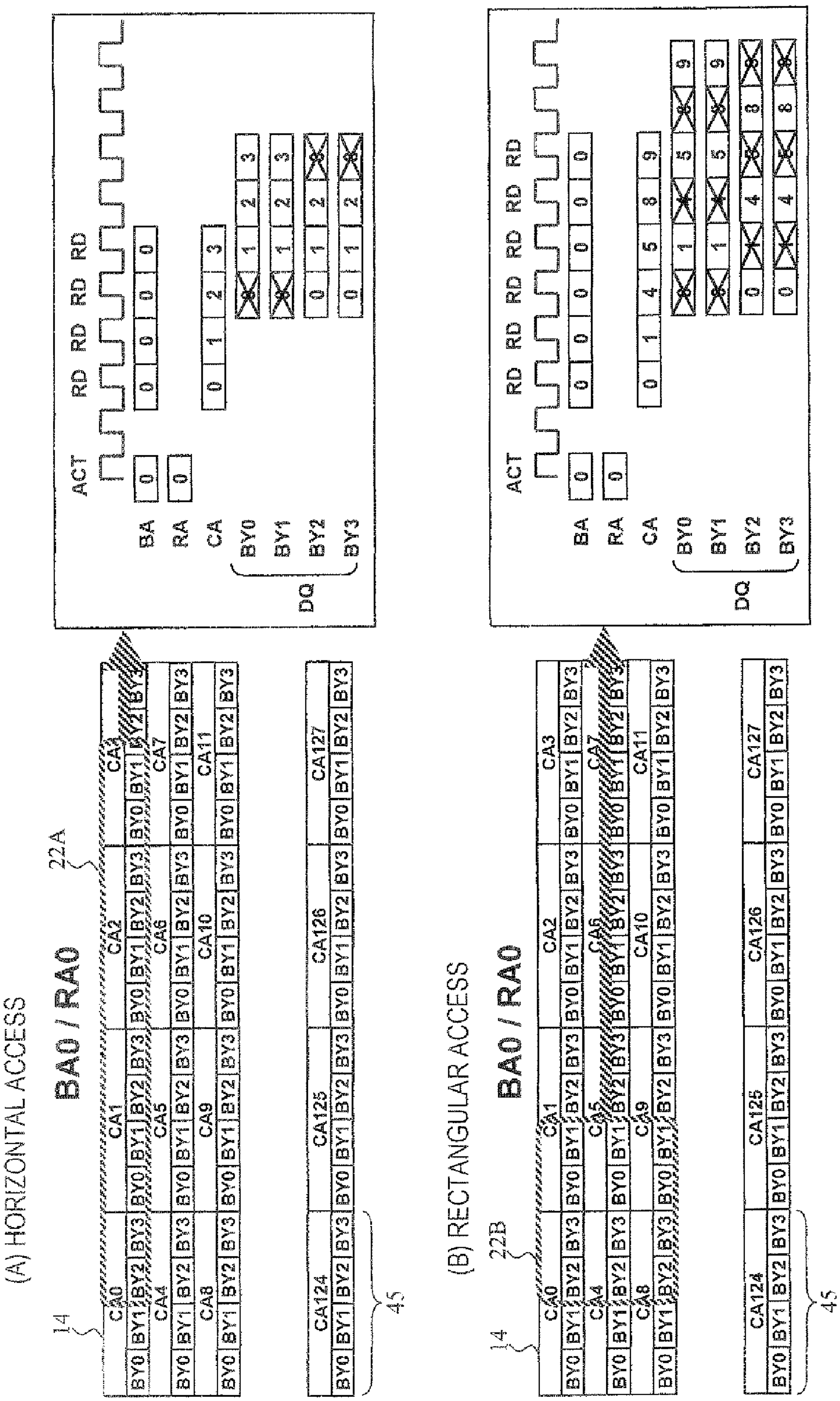
FIG. 4 A figure showing a first problem of a rectangular access.

FIG. 4 shows a first problem of the rectangular access. FIG. 4(A) shows an example of the horizontal access, and FIG. 4(B) shows an example of the rectangular access. Both examples are the accesses exceeding the boundary of a memory unit area (4-byte area) 45 selected by a column address CA. As described above, according to a generally-known memory map, the page area 14 that is specified by a bank address BA and a row address RA is sectioned into a plurality of memory unit areas 45 selected by the column addresses CA 0 through 127, and 4 bytes of data items BY 0 through 3 are accessed simultaneously by a single column address CA. 8-bit data of each byte corresponds to a signal of a pixel.

Therefore, although the horizontal access is made relatively economically, unnecessary input/output of data occurs in the rectangular access, thus the effective bandwidth decreases.

In the horizontal access shown in FIG. 4(A), when accessing an area 22A, four read commands RD are issued for the column addresses CA 0 through 3 subsequent to the active command ACT for specifying the page area BA 0/RA 0, and 4 bytes of data items BY 0 through 3 of each of the column addresses CA 0 through 3 are inputted/outputted successively. In this case, the area 22A contains a section from bytes BY 2 and 3 of the column address CA 0 to bytes BY 0 and 1 of the column address CA 3. Therefore, of the input/output DQ of 4 bytes of data corresponding to the column address CA 0, the data items of the bytes BY 0 and 1 are not required, and, of the input/output DQ of 4 bytes of data corresponding to the column address CA 3, the data items of the bytes BY 2 and 3 also are not required. Therefore, the volume of the effective output data is 12 bytes/16 bytes.

On the other hand, in the rectangular access shown in FIG. 4(B), when accessing a rectangular area 22B, six read commands RD are issued for the column addresses CA 0, 1, 4, 5, 8 and 9 subsequent to the active command ACT for specifying the page area BA 0/RA 0, and 4 bytes of data items BY 0 through 3 of each of the column addresses CA 0 1, 4, 5, 8 and 9 are inputted/outputted successively. However, the rectangular area 22B does not match with the boundary of the memory unit area (4-byte area) 45 selected by the column addresses and exceeds the boundary of the 4-byte area, thus half of each of the 4-byte data items BY 0 through 3 is unnecessary data. Specifically, the volume of the effective output data is 12 bytes/24 bytes. FIG. 4(B) shows the worst case.

As described above, even if the data to be accessed has the same number of bytes, in the rectangular access 24 bytes of data need to be inputted/outputted by sending the read command RD six times, but in the horizontal access 16 bytes of data may be inputted/outputted by sending the read command RD four times. Therefore, in the rectangular access that exceeds the boundary of the 4-byte area (memory unit area) 45 selected by a single column address, the effective bandwidth decreases. This is the first problem of the rectangular access.

Figure 5:
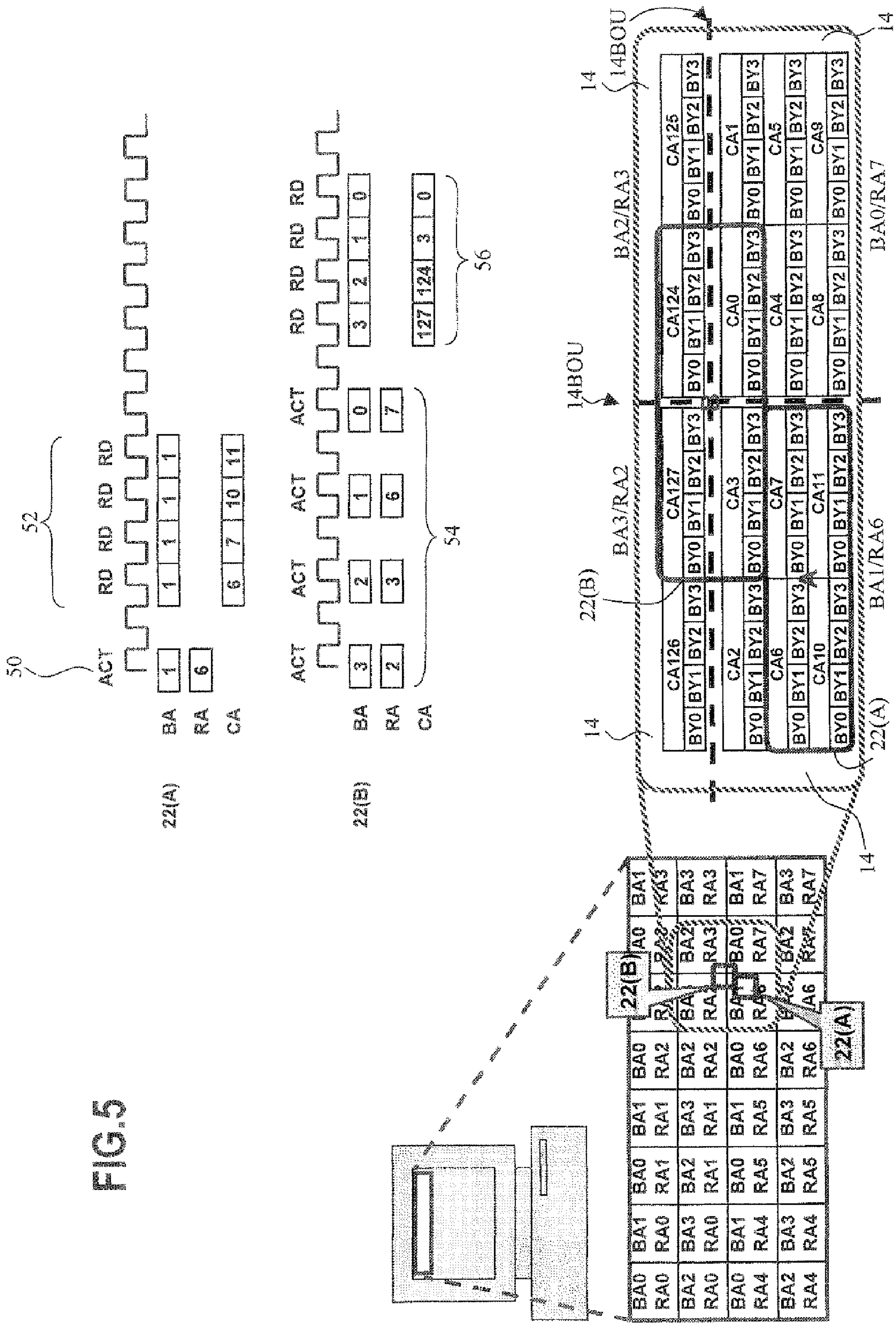
FIG. 5 A figure showing a second problem of a rectangular access.

FIG. 5 shows a second problem of the rectangular access. The rectangular access is an access made to an arbitrary rectangular area and sometimes exceeds a boundary 14BOU of adjacent page areas 14. FIG. 5 shows a case in which a rectangular area 22(A) is a 16-byte area within the same page area BA 1/RA 6, and a case in which a rectangular area 22(B) is a 16-byte area covering four adjacent page areas BA 3/RA 2, BA 2/RA 3, BA 1/RA 6 and BA 0/RA 7.

In the case of the rectangular area 22(A), 16 bytes of data can be inputted/outputted by issuing an active command ACT (50 in the figure) once for the page area BA 1/RA 6 and a read command RD (52 in the figure) four times for the column addresses CA 6, 7, 10 and 11, as shown in the timing chart.

In the case of the rectangular area 22(B), on the other hand, 16 bytes of data cannot be inputted/outputted unless an active command ACT (54 in the figure) is issued four times for the page areas BA 3/RA 2, BA 2/RA 3, BA 1/RA 6 and BA 0/RA 7 and unless a read command RD (56 in the figure) is issued four times for the column addresses CA 127 (BA 3), CA 124 (BA 2), CA 3 (BA 1) and CA 0 (BA 0), as shown in the timing chart. Specifically, in the case where the rectangular area 22 includes adjacent page areas, the active commands ACT are issued a number of times in order to perform the active operation on different banks, and the read commands RD or write commands WR have to be issued for the column addresses within the respective banks. Therefore, the amount of data that can be accessed per unit time is reduced, and the effective bandwidth is narrowed.

In the case where the rectangular area 22(B) shown in FIG. 5 is sectioned at the middle of the memory unit area (4-byte area) selected by a column address, the first problem illustrated in FIG. 4 occurs at the same time, thus a plurality of active commands are required (second problem), and unnecessary data is contained in the input/output data DQ corresponding to the read commands (first problem), causing decrease of the effective bandwidth.

As described above, in the case of adopting the memory mapping, that utilizes the structural characteristics of the SDRAM, in the image memory, there are the first problem in which the horizontal access is stopped due to the occurrence of the refresh command when the horizontal access is performed, the second problem in which unnecessary input/output data is generated when the rectangular access area exceeds the boundary of the memory unit area (4-byte area) selected by a column address, and a third problem in which a plurality of bank active commands are required to be issued when the rectangular access area exceeds the boundary of the page areas specified by the bank addresses.

GENERAL DESCRIPTION OF THE PRESENT EMBODIMENT

Hereinafter, configurations and operations for solving these problems are described briefly.

The present embodiment is to solve the discontinuation of the access that is caused by the refresh operation, the decrease of the access efficiency that is caused by the rectangular access, and other problems, wherein, first of all, the refresh operation can be performed in the background along with an access operation at the time of the horizontal access, secondly, at the time of the rectangular access, a function of efficiently accessing an area straying from or exceeding the memory unit (4-byte area) selected by a column address is made possible, and, thirdly, a function of efficiently accessing a rectangular area exceeding the boundary of the page areas and containing a plurality of page areas is made possible.

Figure 6:
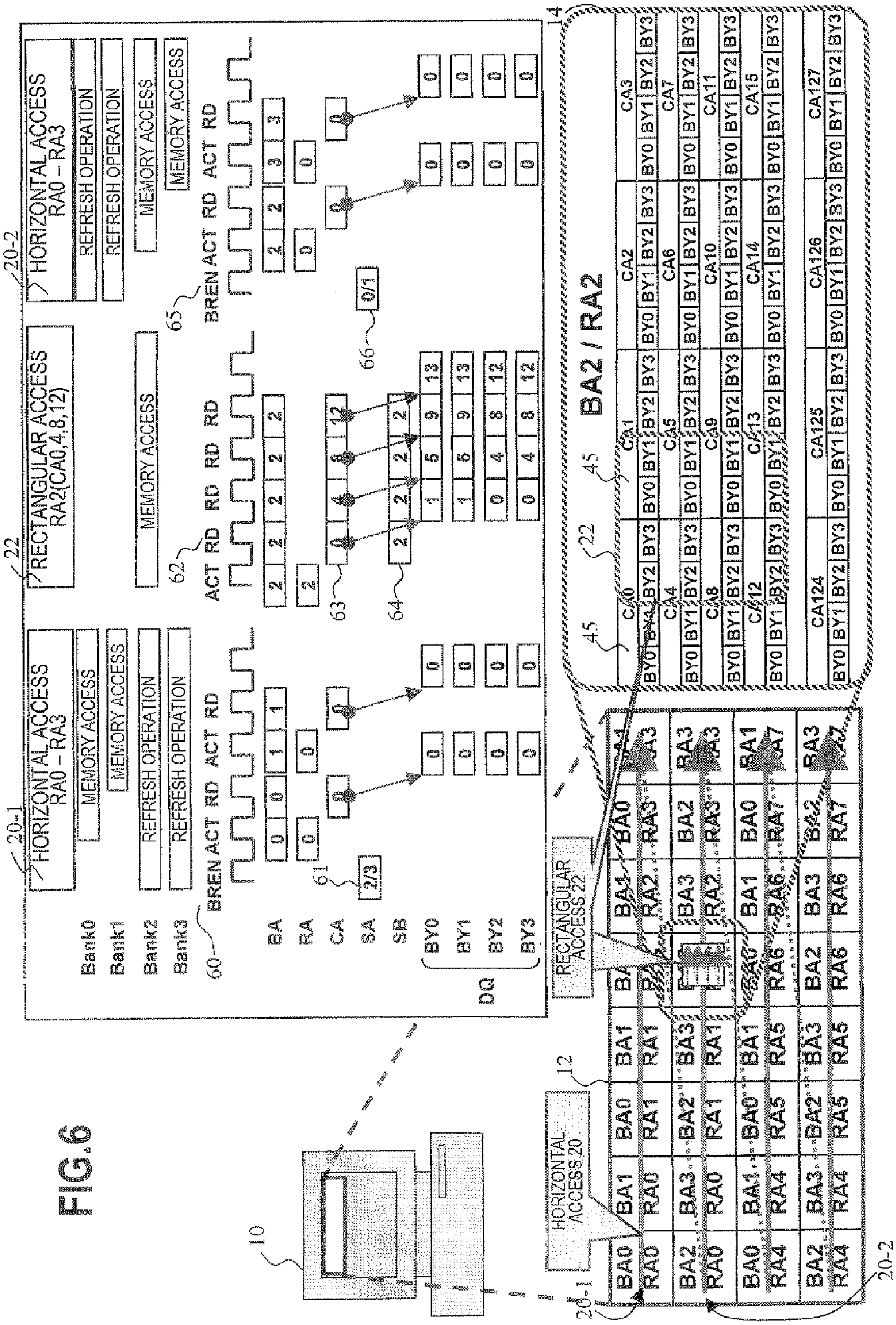
FIG. 6 A figure showing the entire operation performed in the present embodiment.

FIG. 6 shows the entire operation performed in the present embodiment. As described above, in an image system utilizing an image memory, both the horizontal access and the rectangular access are generated. The example shown in FIG.

6 is an example in which a horizontal access 20-1 to page areas with the bank addresses BA 0 and BA 1 in the first row of the memory map 12, a rectangular access 22 to a page area BA 2/RA 2 in the second row, and a horizontal access 20-2 to page areas with the bank addresses BA 2 and BA 3 in the second row are generated sequentially. In the rectangular access 22, access is made to a rectangular area exceeding the memory unit area (4-byte area) 45 within one page area BA 2/RA 2.

In this case, in the rectangular access, access is generated in an arbitrary bank of the memory, while, in the horizontal access, access is generated only in a predetermined bank for a certain period of time. For example, in the horizontal access in the first row of the memory map 12, access is generated only in the banks BA 0 and 1, and no access is generated in the banks BA 2 and 3 in the second row. On the other hand, in the horizontal access in the second row, access is generated only in the banks BA 2 and 3, and no access is generated in the banks BA 0 and 1 in the first row.

Therefore, in the horizontal access 20-1, a background refresh command BREN for specifying a bank in which no access is generated for some time to come is issued before memory access is made, and information of the bank in which no access is generated, SA=2/3, is notified to the memory. Specifically, subsequent automatic refresh operation is allowed in the bank SA specified by the background refresh command BREN. Therefore, normal access is not allowed to the bank SA=2, 3 to which the refresh operation is applied.

In the horizontal access 20-1 shown in FIG. 6, refresh bank information SA (61 in the figure) for allowing subsequent refresh operation to be performed is issued along with the background refresh command BREN (60 in the figure), thereafter the active operation is performed on the page area BA 0/RA 0 by means of the active command ACT, and then 4 bytes of data items BY 0 through 3 of the column address CA 0 are outputted to the input/output terminal DQ by the read command RD (BA 0, CA 0). Similarly, the active operation is performed on the page area BA 1/RA 0 by means of the active command ACT, and then 4 bytes of data items BY 0 through 3 of the column address CA 0 are outputted to the input/output terminal DQ by the read command RD (BA 1, CA 0). However, FIG. 6 omits the illustration of output of four 4-byte data items corresponding to BL=4.

During the period of this horizontal access 20-1, when an automatic refresh request (not shown), which is activated by the background refresh command BREN within the image memory, is issued, the refresh operation is started on the banks BA 2 and 3. However, in the horizontal access, access is generated only in the banks BA 0 and 1 and different banks can independently perform the active operation in the SDRAM, thus the horizontal access can be prevented from being disturbed and stopped by the refresh operation performed on the banks BA 2 and 3.

Next, in the rectangular access shown in FIG. 6, the rectangular area 22 is in the same page area BA2/RA2 and contains 2 bytes, BY 2 and 3, i.e., the second half of the column address CA 0, and 2 bytes, BY 0 and 1, i.e., the first half of the column address CA 1. In this case, according to a general read command of the SDRAM, a read command RD needs to be issued twice to the column addresses CA 0 and 1.

However, in the present embodiment, a read command RD (62 in the figure) is issued to the column address CA 0 (63 in the figure), and byte combination information SB (64 in the figure) on the access is supplied, whereby 4 bytes corresponding to the byte combination information SB can be automatically associated with the input/output terminal DQ. In the example described above, byte shift information SB=2, which means the bytes following 2 bytes, is specified as the byte combination information SB, whereby, out of the 4 bytes of data items of the column address CA 0, the data items of the bytes BY 2 and 3 subsequent to the 2 bytes are automatically outputted along with the data items of the first two bytes BY 0 and 1 of the 4 bytes of data items of the adjacent column address CA 1.

In the rectangular access shown in FIG. 6, after the active command ACT for the page area BA 2/RA 2 is issued, the read command RD 62 for specifying BA 2/CA 0 (63 in the figure) is issued along with the byte combination information SB=2 (64 in the figure). This byte combination information SB=2 indicates a combination of 4 bytes of data items including the byte BY 2 that follows the first 2 bytes within the 4-byte area. In other words, this byte combination information SB=2 indicates that the first byte position (start byte) of the 4-byte area is the BY 2. In response to this, the image memory associates the data items of the bytes BY 2 and 3 following the first 2 bytes (or from the start byte BY 2) of the 4 bytes of data items of the column address CA 0, and the data items of the bytes BY 0 and 1 of the column address CA 1, with the 4 bytes of input/output terminals DQ, for outputting thereto. The memory controller does not need to issue the read command RD twice to the column addresses CA 0 and 1. Moreover, only required data is outputted to all of the 4 bytes of input/output terminals DQ, thus unnecessary data is not outputted, and the access efficiency improves.

Furthermore, when the read command RD specifying BA 2/CA 4 is issued along with the combination information SB=2, the image memory outputs 4 bytes of data constituted by 2 bytes of data of column addresses CA 4 and 5. When the read command RD specifying BA 2/CA 8 is issued along with the combination information SB=2, the image memory outputs 4 bytes of data constituted by 2 bytes of data of column addresses CA 8 and 9. When the read command RD specifying BA 2/CA 12 is issued along with the combination information SB=2, the image memory outputs 4 bytes of data constituted by 2 bytes of data of column addresses CA 12 and 13.

As a result, even if the rectangular access area 22 includes the memory unit areas (four byte areas) of the eight column addresses CA 0, 1, 4, 5, 8, 9, 12 and 13, it is only necessary to issue the read command RD to the column addresses CA 0, 4, 8 and 12 four times, and unnecessary data is not outputted to the input/output terminals, thus the access efficiency can be improved by two times.

In the horizontal access 20-2 subsequent to the rectangular access, since the page areas in the second row of the memory map 12 are accessed, thus normal access is not generated in the banks BA 0 and 1 for awhile. Therefore, as with the above explanation, SA=1 is specified along with the background refresh command BREN (65 in the figure) as the bank information SA on a bank (66 in the figure) in which the fresh operation can be performed, and the automatic refresh operation is allowed in the banks BA 0 and 1 in parallel with normal access to the subsequent banks BA 2 and 3.

As described above, the horizontal accesses 20-1 and 20-2 allow the automatic refresh operation in the background when normal access is made, but the rectangular access does not allow the automatic refresh operation in the background. As a result, in the horizontal access 20-1, the normal access operation can be performed in the banks BA 0 and 1 in parallel with the refresh operation in the banks BA 2 and 3, and in the horizontal access 20-2, the normal access operation can be performed in the banks BA 2 and 3 in parallel with the refresh operation in the banks BA 0 and 1. Accordingly, the horizontal accesses can be prevented from being disturbed by the refresh operation, and the effective bandwidth can be prevented from decreasing.

Furthermore, in the rectangular access, the background refresh operation is prohibited. Accordingly, the rectangular access made to an arbitrary area can be prevented from being stopped by the refresh operation. Therefore, the effective bandwidth can be totally prevented from decreasing.

Also, in the rectangular access, the byte combination information SB is specified along with the read command, whereby combined byte data, which is obtained by combining arbitrary bytes with a column address CA of the read command as a start area, can be outputted to the 4 bytes of input/output terminals DQ. The byte combination information SB can also be specified along with a command for setting a mode register in advance of the active command.

Figure 7:
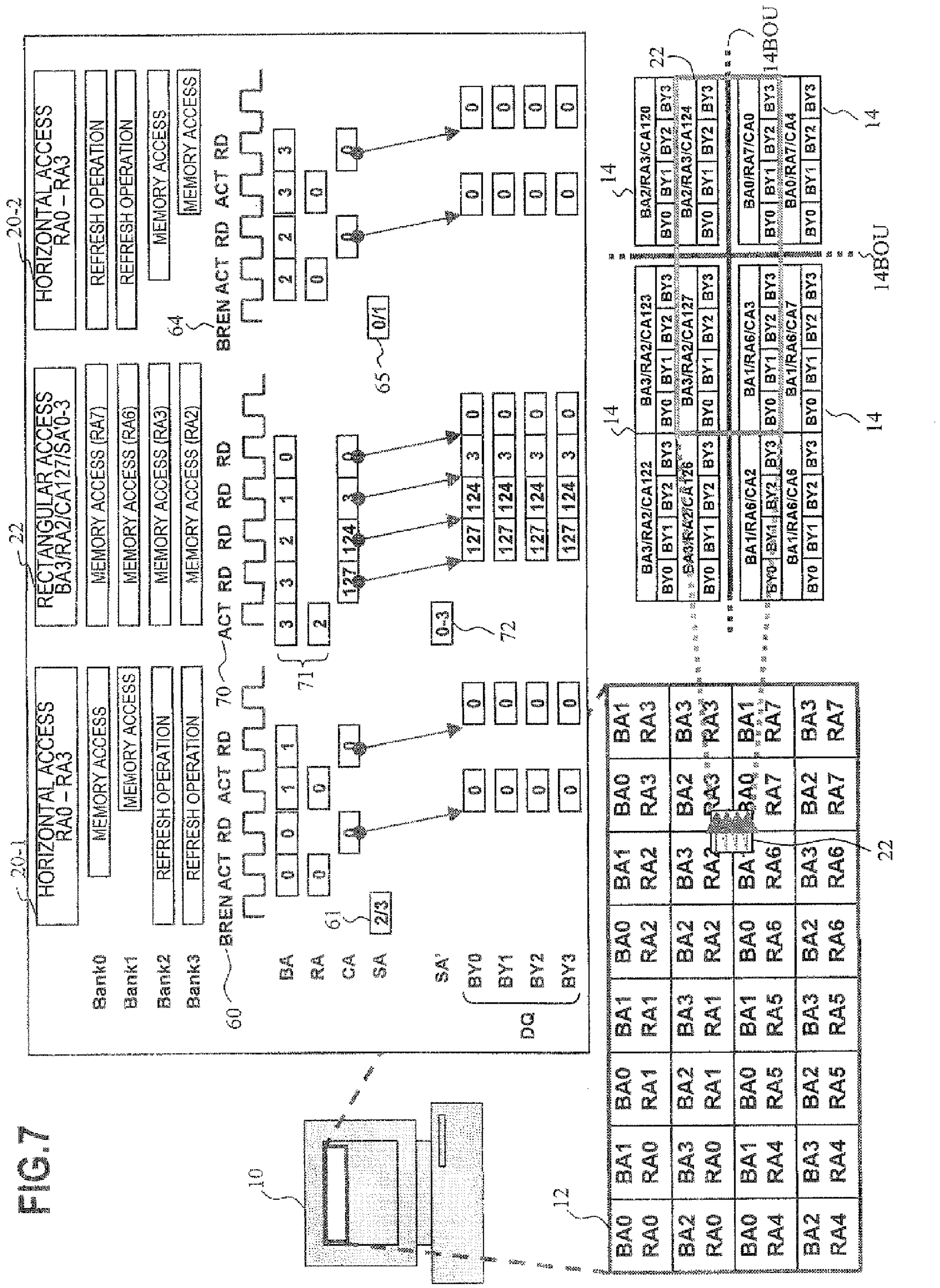
FIG. 7 A figure showing another example of the entire operation of the present embodiment.

FIG. 7 shows another example of the entire operation of the present embodiment. This example is an example in which the horizontal access 20-1 to page areas in the first row of the memory map, the rectangular access 22, and the horizontal access 20-2 to page areas in the second row of the memory map are performed sequentially. In the rectangular access 22, the rectangular area 22 exceeds the boundary 14BOU of the page areas and contains four page areas BA 3/RA 2, BA 2/RA 3, BA 1/RA 6 and BA 0/RA 7.

As with FIG. 6, in the horizontal accesses 20-1 and 20-2, the refresh bank information SA is issued along with the background refresh command BREN, whereby subsequent automatic refresh operation is allowed in the subject banks, and the horizontal accesses are prevented from being disturbed by the refresh operation. In the rectangular access to the rectangular area 22 having a plurality of areas, i.e. a plurality of banks, multi-bank information SA' is issued along the active command ACT, as bank information on the banks that are subjected to the active operation simultaneously. In response to this, the image memory, performs the active operation on the page areas of the plurality of banks specified by the multi-bank information SA' and having upper left bank of address information BA, RA issued along with the active command ACT, simultaneously. As a result, in response to one active command ACT, the active operation can be performed on the plurality of banks simultaneously. Thereafter, the read command RD for each bank is issued along with the bank address BA and column address CA, whereby four bank data items of a memory unit area (4 bank area) selected by the column address CA of each bank can be outputted to the input/output terminals DQ.

In the example of the rectangular access shown in FIG. 7, address information items BA 3 and RA 2 (71 in the figure) for specifying the page areas in the upper left section are issued along with an active command ACT (70 in the figure), and at the same time the multi-bank information SA'=0-3 (72 in the figure) is issued. In response to this, the image memory, performs the active operation on four banks BA 3, BA 2, BA 1 and BA 0 simultaneously, the four banks being specified by the multi-bank information SA', placing a bank BA 3 of the upper-left page area in front and sequentially outputs 4 bytes of data items of the banks BA/columns CA that are specified by the subsequent four read commands RD. The same applies to the write command. In the figure, BA 3/CA 127, BA 2/CA 124, BA 1/CA 3, and BA 0/CA 0 are supplied in response to the four read commands, and 4 bytes of data items of these memory areas are outputted.

If the multi-bank information SA' indicates "two banks in the lateral direction", a bank on the right side of an upper left bank corresponding to the bank address BA supplied by the active command ACT is also subjected to the active operation simultaneously. If the multi-bank information SA' indicates "two banks in the vertical direction", a bank that is located below the upper left bank is also subjected to the active operation simultaneously. Similarly, if the multi-bank information SA' indicates "four banks in the lateral and vertical directions", four banks that are located on the right side, below, and on the lower right side of the upper left bank are also subjected to the active operation simultaneously. Therefore, in order to perform the active operation automatically on multiple banks, it is preferred to previously set, in the register or the like, information indicating how the row addresses RA in the respective rows of the memory map are arranged, or indicating, specifically, in what unit the row addresses RA are wrapped (row address step information).

In the rectangular access method shown in FIG. 7, when the byte combination information SB described in FIG. 6 is issued along with the read command RD in addition to the multi-bank information SA' at the active command ACT, a partial byte combination of the memory unit areas (four bank areas) exceeding the boundary 14BOU of a page area 14 and selected by a column address CA can be associated automatically with the input/output terminals DQ.

Figure 8:
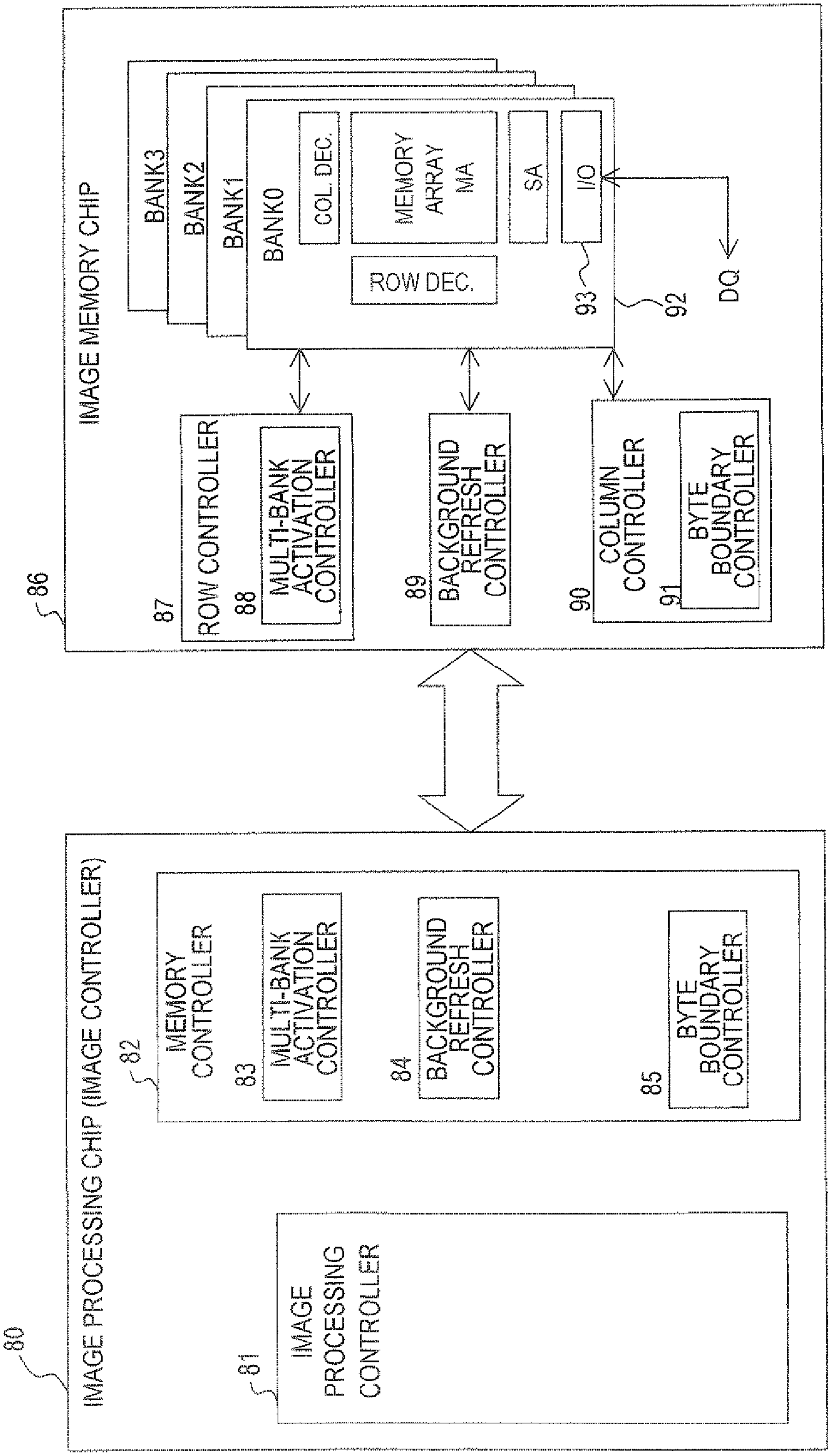
FIG. 8 A configuration diagram of an image processing system according to the present embodiment.

FIG. 8 is a configuration diagram of an image processing system according to the present embodiment. The image processing system is constituted by an image processing chip 80 corresponding to the memory controller, and an image memory chip 86 for storing image data which is a target of image processing. The image processing chip 80 and the memory chip 86 are each a semiconductor chip wherein an integrated circuit is formed on a single semiconductor substrate.

The image processing chip 80 has: an image processing controller 81 for performing image processing, such as an encoder or decoder that responds to image compression and expansion of, for example, MPEG; and a memory controller 82 for controlling an access to the image memory chip 86 in response to a memory access request that includes image area specification issued from the image processing controller 81. The memory controller 82 has: a background refresh controller 84 for controlling the background refresh operation in the horizontal access; a byte boundary controller 85 for controlling an access to an arbitrary combination of bytes in the memory unit area (4-byte area) in the rectangular access; and a multi-bank activating controller 83 for controlling accesses to a plurality of areas in the rectangular access. By performing these control operations, commands required in each operation, bank addresses, row addresses, column addresses, byte combination information SB, refresh bank information SA, multi-bank information SA' and the like are issued to the image memory 86.

The image memory 86 has a plurality of banks Bank 0 through 3 within memory core 92, and further has a row controller 87 for controlling mainly the active operation, a column controller 90 for controlling the read or write operation, and a background refresh controller 89, there controllers performing control with respect to the memory core 92. The row controller 87 has a multi-bank activation controller 88, and the column controller 90 has a byte boundary controller 91. A row decoder RowDec, column decoder ColDec, memory area MA, sense amplifier group SA, and input/output unit 93 for associating the memory area MA with the input/output terminals DQ are provided in each of the banks Bank 0 through 3.

Figure 9:
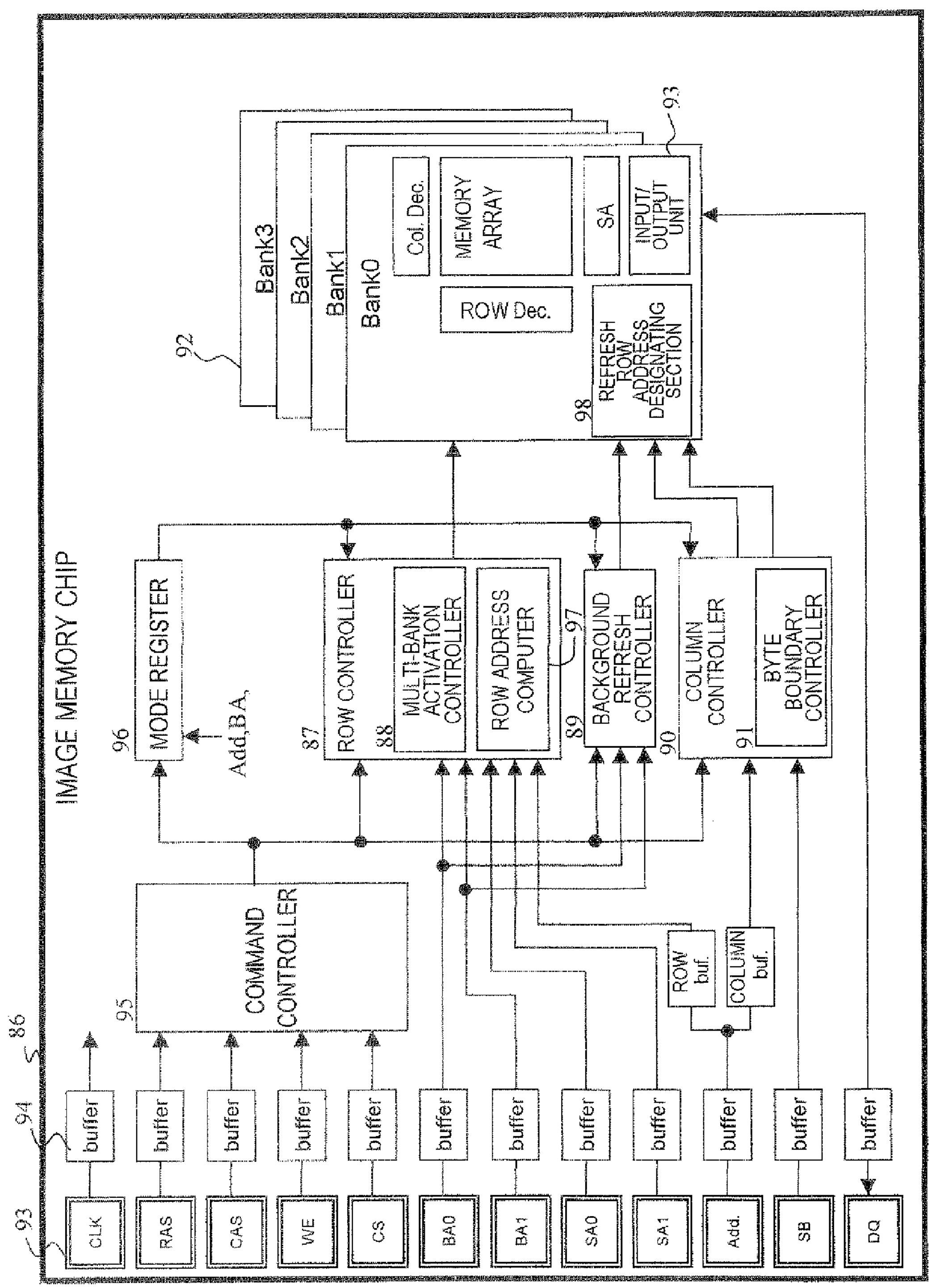
FIG. 9 A configuration diagram of an image memory according to the present embodiment.

FIG. 9 is a configuration diagram of the image memory according to the present embodiment. In the memory chip 86, the input/output terminal group 93 has, not only the clock CLK, but also command terminals constituted by RAS, CAS, WE and CS, bank address terminals BA 0 and BA 1, refresh bank information terminals SA 0 and SA 1, a plurality of address terminals Add, a byte combination information terminal SB with a predetermined number of bits, a data input/output terminals DQ with a predetermined number of bits, and a multi-bank information terminal SA' which is not shown.

It should be noted that the terminals SB, SA' and SA, that are required in the abovementioned byte boundary function, a multi-bank access function, and the background refresh function, can be realized using a common special pin. These information items are supplied along with different commands, thus input data at special pin may be set to a corresponding register in response to the supplied commands.

Also, these terminals SB, SA' and SA can be realized using unused terminals. For example, in the case where row addresses are inputted at address terminals Add 0 through 12 and column addresses are inputted at the address terminals Add 0 through 9, the address terminals Add 10 through 12 are not used when the column addresses are inputted. Therefore, control data SB, SA' and SA can be inputted from the address terminals Add 10 through 12 that are not used when inputting the column addresses.

The group of external terminals 93 are connected to internal circuits via buffers 94 respectively. The abovementioned group of commands is inputted to a command controller 95, and control signals corresponding to the commands are supplied to the internal circuits. Also, in response to a mode register set command, the command controller 95 sets a predetermined set value to a mode register 96 on the basis of a set data supplied to an address pin Add. The set information that is set by the mode register 96 is supplied to the internal circuits. The row controller 87 has the multi-bank activation controller 88 and a row address calculator 97 required for multi-bank activation. An active pulse is supplied from the multi-bank activation controller 88 to a bank to be activated. Furthermore, a row address to be activated is supplied from the row address calculator 97 to each bank. The bank Bank is provided with a refresh row address designator 98 that designates a row address to be refreshed within the bank. The refresh row address designator 98 has, for example, a refresh counter for generating a row address required when automatically generating a refresh command. The internal configuration of the bank is as explained above.

Hereinafter, image memory and memory controller are described in detail with reference to the byte boundary function, multi-bank active function, background refresh function illustrated in FIG. 6 and FIG. 7 sequentially.

<<Byte Boundary>>

Figure 10:
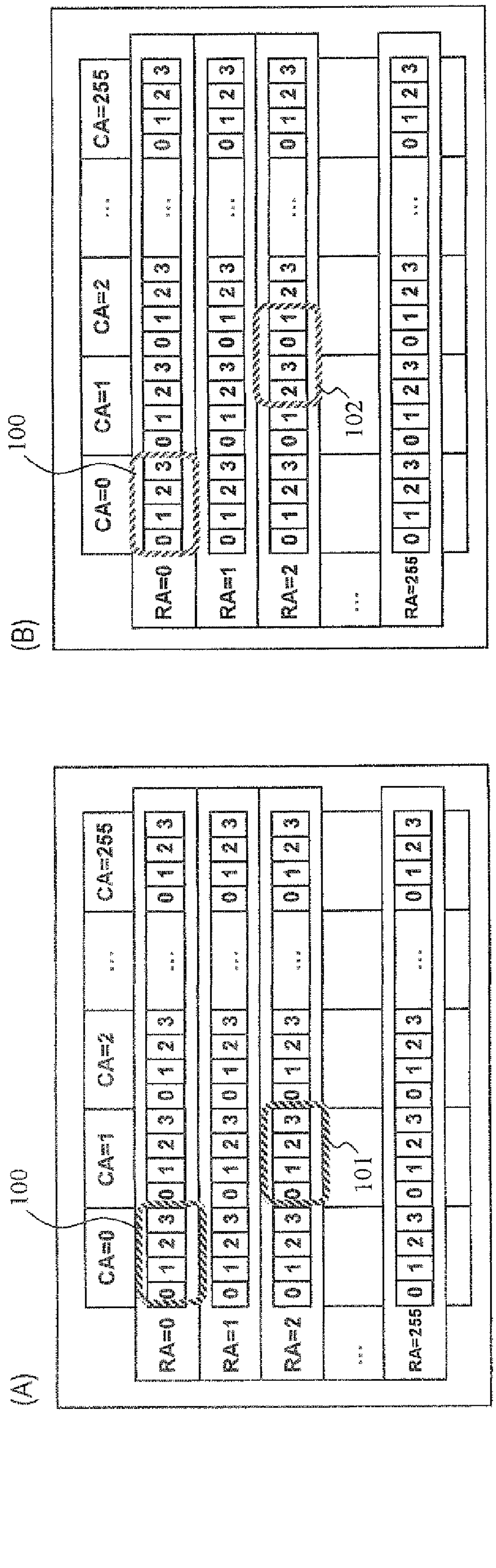
FIG. 10 A figure for explaining byte boundary functions.

FIG. 10 is a figure for explaining the byte boundary functions. This figure shows a group of bytes (or a group of bits) selected by a row address RA and a column address CA within a certain bank. As described above, in this example as well, 4 bytes of a data area (memory unit area) is selected by a row address RA and a column address CA and associated with the 32 bits of input/output terminals DQ 0 through 31. Therefore, the numbers in an intersection of the row address RA and the column address CA, i.e., "0123", indicate the bytes BY 0, BY 1, BY 2, and BY3 respectively. Also, the volume of the data area may be 4 bits, instead of 4 bytes. In this case, 4 bits of a data area (memory unit area) is selected by a row address RA and a column address CA and associated with 4 bits of input/output terminals DQ 0 through 3. For simplification, the following is an example of the 4-byte data area.

FIG. 10(A) is a conventional example in which 4 bytes of a data area is uniquely determined by a row address RA and a column address CA, and 32 bits of each of 4-byte data areas (memory unit areas) 100 and 101 are always associated with the input/output terminals DQ 0 through 31.

On the other hand, FIG. 10(B) shows the present embodiment in which a 4-byte area specified by a row address RA and a column address CA is placed in front, and any combinations of bytes are made to be associated with the input/output terminals DQ 0 through 31. In the figure, the 4-byte area 100 selected by RA=0 and CA=0 is entirely associated with the input/output terminals DQ 0 through 31. On the other hand, a 4-byte area 102, which starts from the third byte after the two byte shift of the 4-byte area selected by RA=2 and CA=1, is associated with the input/output terminals DQ 0 through 31. In this case, first information (start byte) for determining which byte of the 4-byte area selected by RA=2 and CA=1 to be placed in front, and second information on a byte order (big endian or little endian) in which 4 bytes are arranged continuously in an incrementing direction or decrementing direction from the front byte, or arranged every other byte in the incrementing direction or decrementing direction are provided along with a read command or a write command.

Then, the input/output unit of the image memory extracts a total of 4 bytes out of byte data corresponding to a different column address CA within a page, on the basis of byte combination information consisting of the first and second information, and associates the 4 bytes with the input/output terminals DQ 0 through 31. Then, required 4-byte data is inputted/outputted once from 32 bit input/output terminals DQ.

Figure 11:
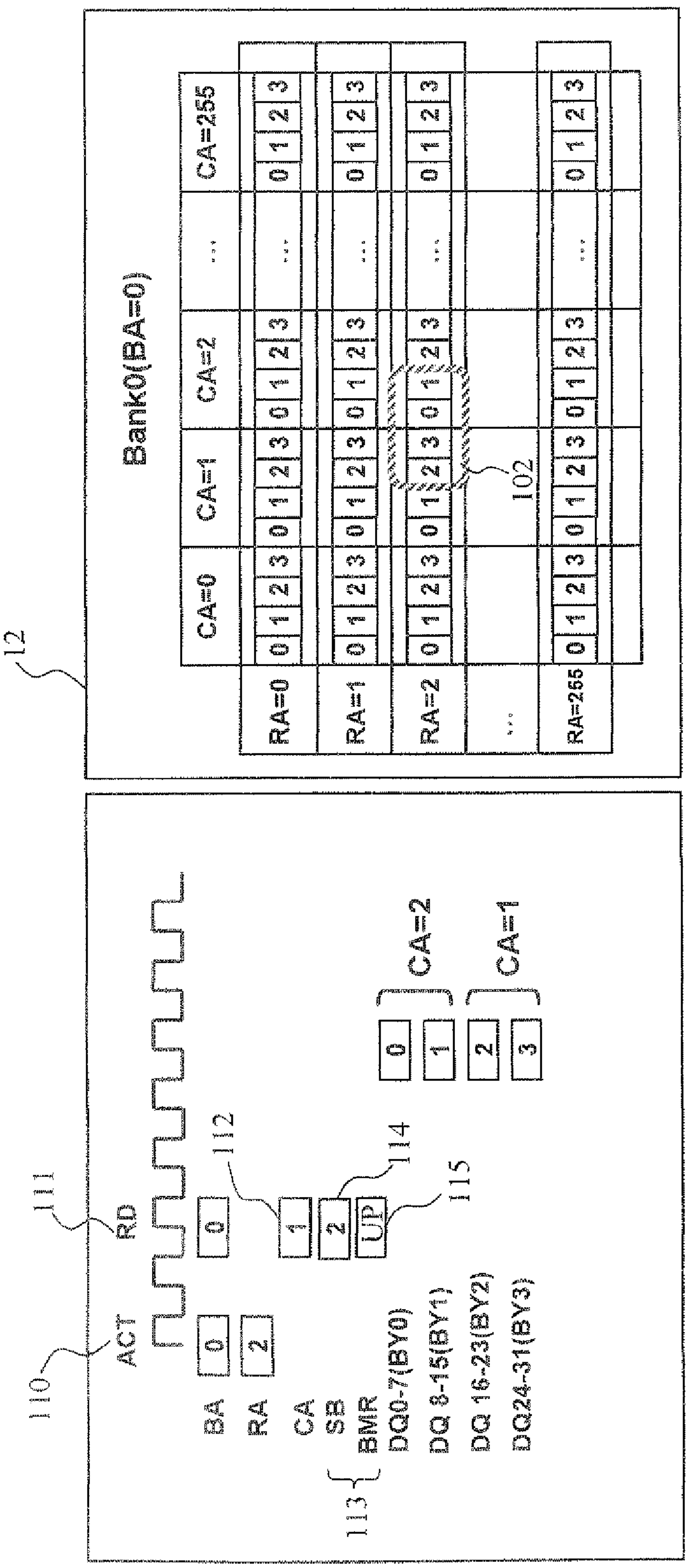
FIG. 11 A timing chart of the byte boundary functions.

FIG. 11 is a timing chart of the byte boundary functions. This example shows an example of accessing the 4-byte area 102 within the memory map 12. First of all, an active command ACT (110 in the figure) is provided along with a bank address BA=0 and a row address RA=2, the corresponding page area is then subjected to the active operation, a read command RD (111 in the figure) is provided along with the bank address BA=0 and a column address CA=1 (112 in the figure), and, as byte combination information 113, the first information SB=2 (114 in the figure) indicating the amount of byte shift or start byte is provided along with the second information BMR=UP (115 in the figure) indicating the combination pattern.

The image memory associates 2-byte data (BY 2, 3), which is the second half of the 4-byte area selected by a column address CA=1, with 2-byte data (BY 0, 1), which is the first half of the 4-byte area selected by a column address CA=2, in a manner shown by DQ 16-23, DQ 24-31, DQ 0-7, and DQ 8-15, on the basis of the byte combination information SB=2 and BMR=UP. This association is performed in the input/output unit 93 by the byte boundary controller 91 shown in FIG. 9. Therefore, even in the case of data with a different column address, 4-byte data in any combination can be associated with the input/output terminals DQ by providing the read command RD once. The same is true for the write command.

In FIG. 11, the same byte boundary functions can be applied, although the 4-byte area selected by the row address RA and column address CA is 4 bit area. In this case, 4 bit data of the 4 bit area is associated with the input/output terminals DQ 0 through 3.

Figure 12:
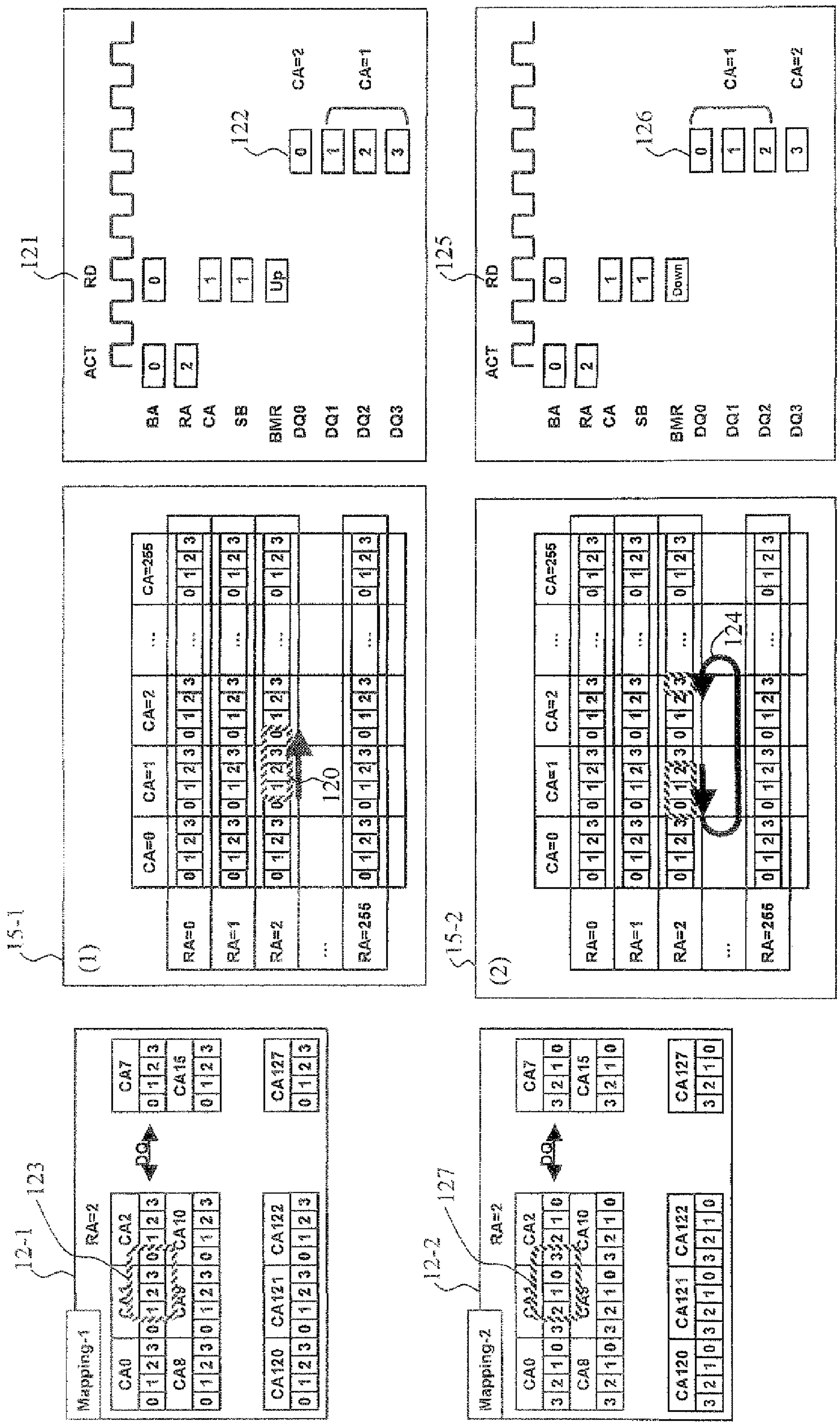
FIG. 12 A figure for explaining the byte boundary functions for different mapping.

FIG. 12 is a figure for explaining the byte boundary functions for different mapping. In FIG. 12, a memory unit area to be selected by a row address RA and a column address CA is constituted by 4 bits for simplification. The left side of FIG. 12 shows memory mapping 12-1 and 12-2 showing the relationship between pixels of the image and a memory space, the center of FIG. 12 shows logical spaces 15-1 and 15-2 of the memory, and the right side of FIG. 12 shows a timing chart corresponding to the left and center sides of FIG. 12.

"0 through 3", which indicate 4 bits within a 4-bit area selected by a row address RA and a column address CA, are shown within each of the memory logical spaces 15-1 and 15-2, and correspond to the input/output terminals DQ 0 through 3 respectively. Also, "0 through 3", which indicate 4 bits within each memory logical space corresponding to the pixels of the image, are shown in each of the memory mappings 12-1 and 12-2 on the left side. Specifically, the memory mapping shows how each pixel of the image is associated with each of the input/output terminals DQ 0 through 3 of the memory.

In the image system, a system designer can freely associate an image pixel with any of the 4 bit input/output terminal DQ 0 through 3 that are simultaneously accessed using certain addresses BA, RA and CA. The mapping 12-1 is an example of mapping four pixels arranged from left to right in the figure onto the input/output terminals DQ 0 through 3 arranged in the same direction as the incrementing direction of the addresses (from left to right), and this mapping is called "big endian". On the other hand, the mapping 12-2 is an example of mapping four pixels onto the input/output terminals DQ 3 through 0 arranged in the direction opposite to the incrementing direction of the addresses, and this mapping is called "little endian".

In mapping 12-1 and mapping 12-2, the rectangular access is generated in four pixels 123 and 127 between the $6^{th}$ pixel to the $9^{th}$ pixel on the upper left corner of the image. However, such mapping is performed in the direction opposite to that of 4 bits within the memory, thus different accesses are required. Specifically, in the case of the mapping 12-1, it is necessary to input/output data with respect to the pixels arranged from left to right in the image, in order of DQ1 within CA=1, DQ2 within CA=1, DQ3 within CA=1, and DQ0 within CA=2, as shown by the arrow 120. In the case of the mapping 12-2, on the other hand, it is necessary to input/output data with respect to the pixels arranged from left to right in the image, in order of DQ2 within CA=1, DQ1 within CA=1, DQ0 within CA=1, and DQ3 within CA=2, as shown by the arrow 124.

The bit combination information items SB, BMR are set in order to respond to such different types of mapping. Specifically, in the case of the mapping 12-1, as shown by 121 in the figure, a starting address constituted by BA=0 and CA=1 and bit combination information constituted by SB=1 and BMR=UP are issued along with a read command RD, and, in response to this issuance, 3 bits of CA=1, i.e., DQ 1, 2 and 3, and DQ 0 of CA=2 are simultaneously outputted as shown by 122 in the figure.

In the case of the mapping 12-2, on the other hand, as shown by 125 in the figure, a starting address constituted by BA=0 and CA=1 and bit combination information constituted by SB=1 and BMR=DOWN are issued along with a read command RD, and, in response to this issuance, 3 bits of CA=1, i.e., DQ0, 1 and 2, and DQ 3 of CA=2 are simultaneously outputted as shown by 126 in the figure.

In this manner, the bit combination information SB and BMR are specified in accordance with the different memory mappings such as big endian and little endian, whereby the image memory can input/output 4 bits simultaneously in response to the memory mapping on the system side. By increasing the types of such bit combination information, a flexible 4 bit access can be realized on various mapping types.

Figure 13:
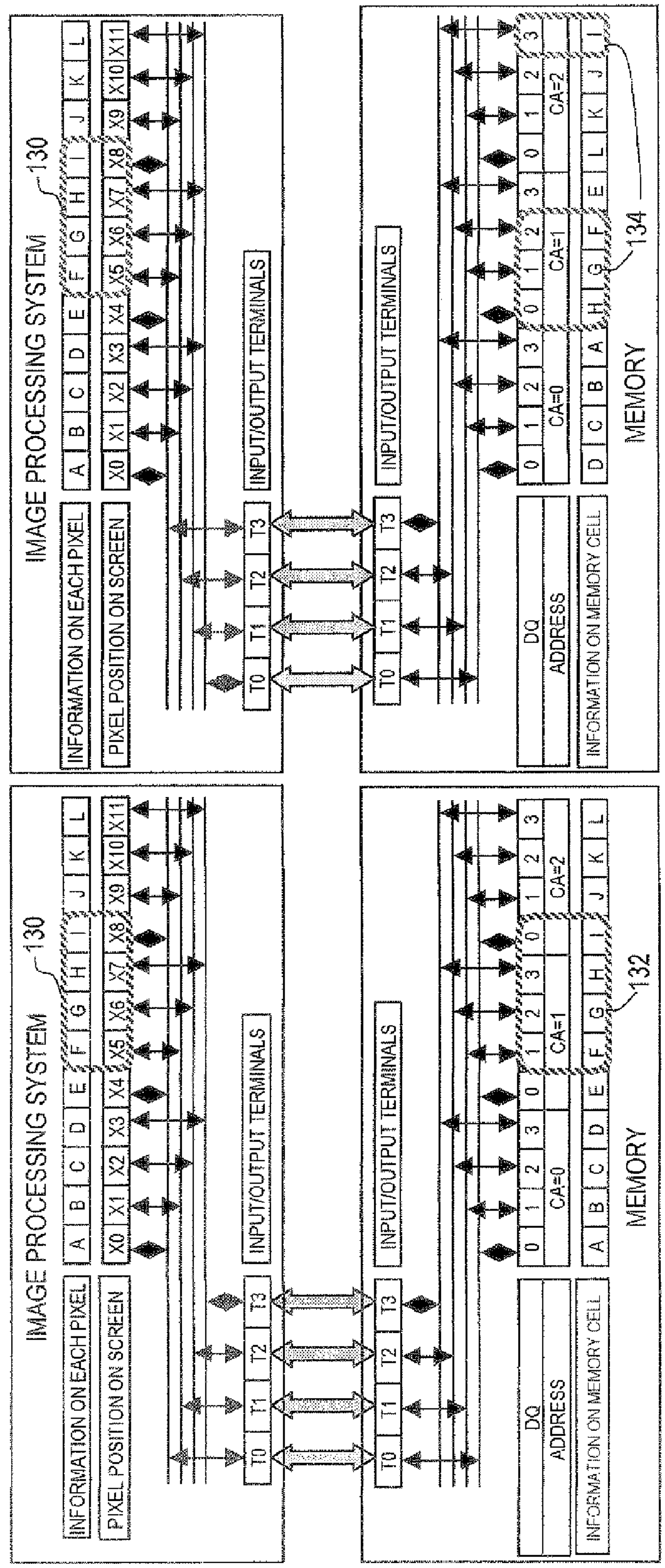
FIG. 13 A figure for explaining a big endian and little endian shown in FIG. 12.

FIG. 13 is a figure for explaining the big endian and little endian shown in FIG. 12. FIG. 13 shows the image processing system at right and left that uses a memory of which input/output bit widths consist of 4 bits, wherein the left side is a big endian system that uses the direction of the input/output terminals DQ of the memory, i.e., DQ 0 through 3, as a forward direction, while the right side is a little endian system that uses the direction of the DQ of the memory, i.e., DQ 3 through DQ 0, as the forward direction.

Pixel positions (X 0 through X 11) in the screen indicate physical positions on the same screen. "Information on each pixel" that each pixel position has is designated as "A" through "L" in both systems, and this means that both systems display the same image.

In the big endian system, the pixel positions X 0 through 3 are associated with DQ 0 through 3 of address CA 0 of the memory, the pixel positions X 4 through 7 are associated with DQ 0 through 3 of address CA 1 of the memory, and the pixel positions X 8 through 11 are associated with DQ 0 through 3 of address CA 2 of the memory.

In the little endian system, on the other hand, the pixel positions X 0 through 3 are associated with DQ 3 through 0 of the address CA 0 of the memory, the pixel positions X 4 through 7 are associated with DQ 3 through 0 of the address CA 1 of the memory, and the pixel positions X 8 through 11 are associated with DQ 3 through 0 of the address CA 2 of the memory.

Specifically, when comparing the both systems, the relationship between each of the pixels X 0 through 3 within the image processing system and each of the input/output terminals T 0 through 3 in the big endian is opposite to that in the little endian. Therefore, the pixel information "A" of the pixel position X0 is stored in the physical positions (DQ 0 of CA0 and DQ3 of CA0) of different memory cells in the big endian system and the little endian system.

Here, in the case where the image processing system generates a rectangular access (130 in the figure) to pixel information "F-G-H-I" of the pixel positions X 5 through 8, the memory has to access the physical positions 132 and 134 of different memory cells in the big endian system and the little endian system. Therefore, the minimum amount of information items that are required to be supplied to the memory are three information items, i.e., the information BMR on whether the system is the big endian (Up) or the little endian (Down), the address CA having a bit as a starting point, and the positional information SB of the bit which is the starting point within an address.

Figure 14:
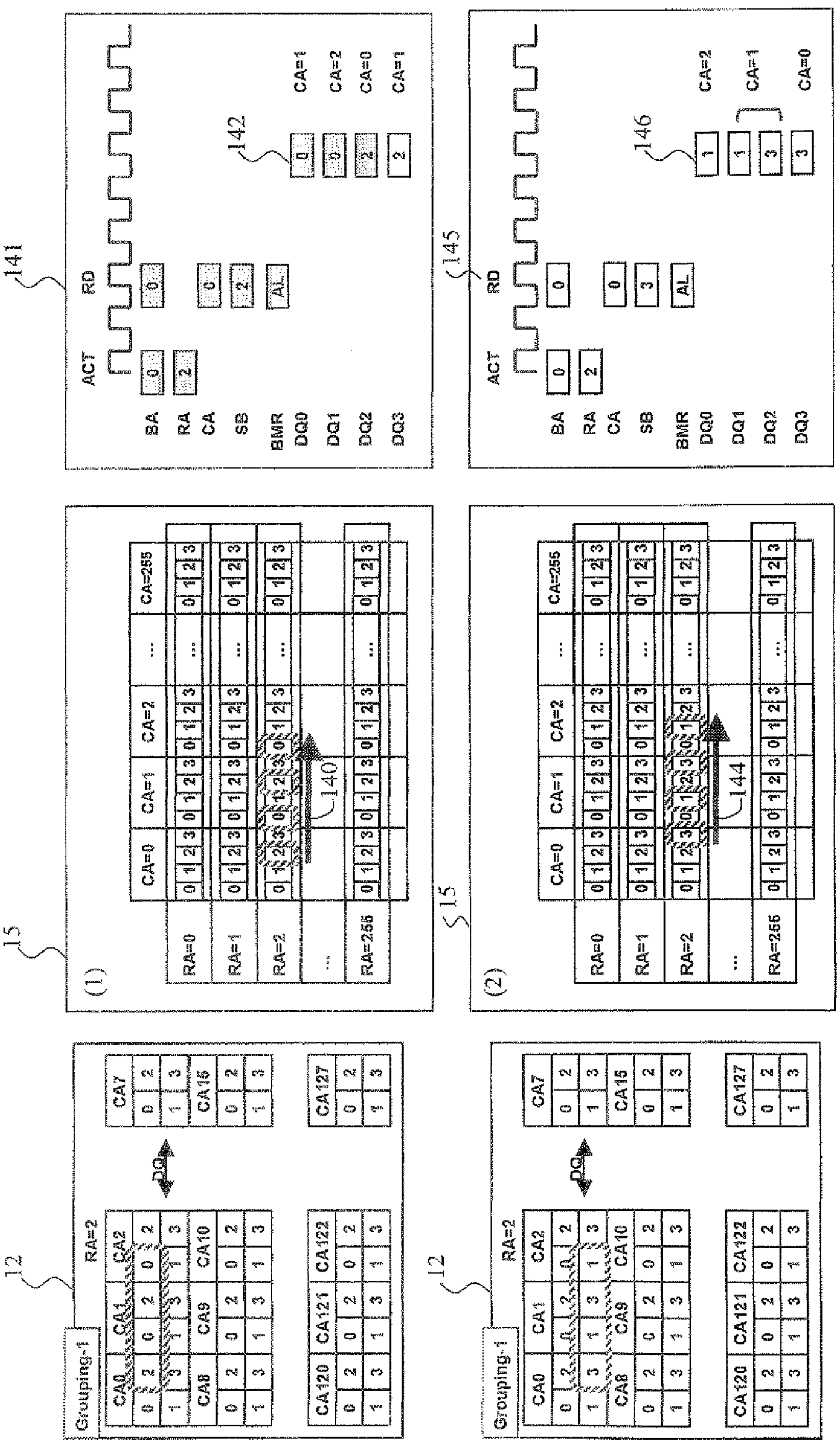
FIG. 14 A figure for explaining the byte boundary functions in a special memory mapping.

The big endian and the little endian are the same when the memory unit area that is accessed with the addresses RA, CA is a 4-byte area (byte group). FIG. 14 is a figure for explaining the byte boundary functions in a special memory mapping. As FIG. 12, FIG. 14 shows the memory mappings 12 on the left side, the memory logical spaces 15 at the center, and corresponding timing charts on the right side.

In the figure, the memory mappings 12 on the left side each shows which bit of the memory is allocated to each pixel within a frame image. In this example, one pixel is constituted by 2 bits of information. For example, an even-numbered bit holds data on luminance, while an odd-numbered bit holds data on a color difference.

Grouping-1 means a rectangular access that collects only the luminance information (even-numbered bits) of pixels from the second pixel through the fifth pixel, and Grouping-2 means a rectangular access that collects only the color difference information (odd-numbered bits) of pixels from the second pixel to the fifth pixel on the upper left corner. In this case, although both Grouping-1/2 are rectangular accesses made to the second pixel through the fifth pixel on the upper left corner of the image, the accesses from the image processing system to the memory and the input/output terminals DQ that are shown in the timing charts are as follows, due to the difference between the luminance (even-numbered bits) shown by the arrow 140 and the color difference (odd-numbered bits) shown by the arrow 144.

Grouping-1: DQ 0 of CA=1, DQ 0 of CA=2, DQ 2 of CA=0, and DQ 2 of CA=1 are associated with the input/output terminals DQ 0 through 3 respectively (142 in the figure), with respect to the access with CA=0/SB=2, BMR=AL (designation for collecting 4 bits every other bit) (141 in the figure).

Grouping-2: DQ 1 of CA=2, DQ 1, 3 of CA=1, and DQ 3 of CA=0 are associated with the input/output terminals DQ 0 through 3 respectively (146 in the figure), with respect to the access with CA=0/SB=3, BMR=AL (designation for collecting 4 bits every other bit) (145 in the figure).

In this manner, the same DQs (DQ0 and DQ2 in Grouping-1, for example) are accessed simultaneously within the 4-bit area of different column addresses, thus the input/output units for transferring the data to the input/output terminals DQ need to perform processing of switching the terminals for some data, i.e., processing of using a data bus of a different DQ.

Figure 15:
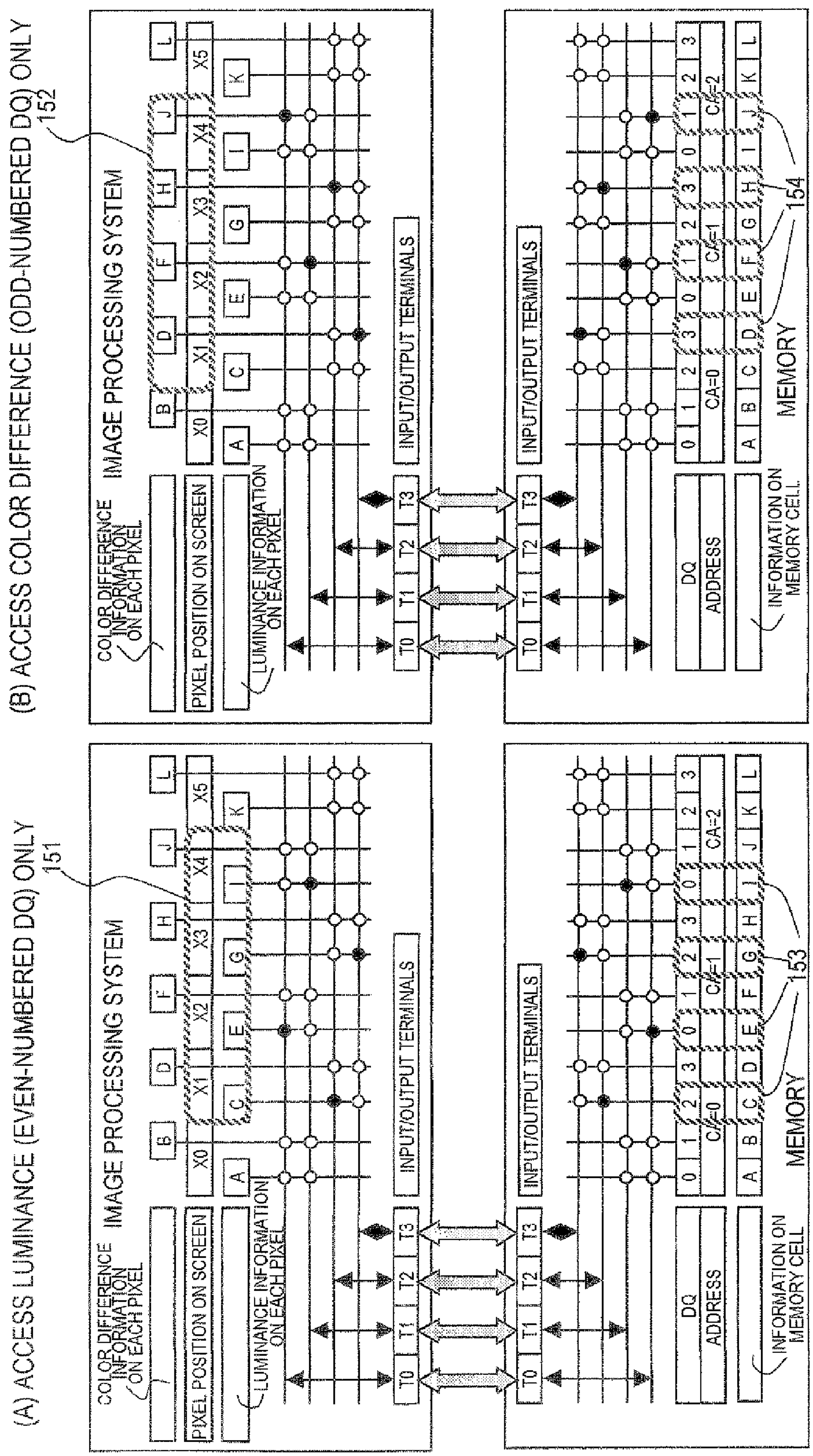
FIG. 15 A figure for explaining the special memory mapping shown in FIG. 14.

FIG. 15 is a figure for explaining the special memory mapping shown in FIG. 14. FIG. 15 shows an image processing system that uses a memory of which the input/output bit width consists of 4 bits, and particularly shows the image processing system that uses an even-numbered DQ of the memory as the luminance information on each pixel, and an odd-numbered DQ as the color difference information on each pixel. FIG. 15(A) shows a case where only the luminance information is accessed, while FIG. 15(B) shows a case where only the color difference information is accessed.

The pixel positions (X 0 through 5) on the screen indicate the same physical positions on the screen on both right and left. The pixel positions hold “A, C, E, G, I, K” respectively as “luminance information”, and “B, D, F, H, J, L” respectively as “color difference information”.

Here, in the case where the image processing system generates a rectangular access 151 to the luminance information “C-E-G-I” of the pixel positions X 1 through 4, the memory has to access only the even-numbered DQs (153 in the figure) as shown in FIG. 15(A). In the case where the image processing system generates a rectangular access 152 to the color difference information “D-F-H-J”, the memory has to access only the odd-numbered DQs (154 in the figure) as shown in FIG. 15(B).

The minimum information items that the memory needs to receive in order to make such accesses are three information items, i.e., information indicating whether the system adopts a method of holding the luminance information in the even-numbered DQs and the color difference information on the odd-numbered DQs (whether access needs to be made every other DQ) (BMR=AL), the address having a bit as a starting point (CA), and position information (SB) of the bit which is the starting point in the 4-bit area of the address. The column address CA and bit combination information SB and BMR are already explained in FIG. 14.

In this case, since the same DQs (DQ0 and DQ2 in Grouping-1, for example) are accessed with different addresses, the input/output unit for transferring the data to the input/output terminals needs to perform the processing of switching the terminals so as to use the data bus of a different DQ. Therefore, a plurality of switches shown by white circles and black circles are provided in the memory, and these switches are controlled based on the above-described information SB and MBR.

Figure 16:
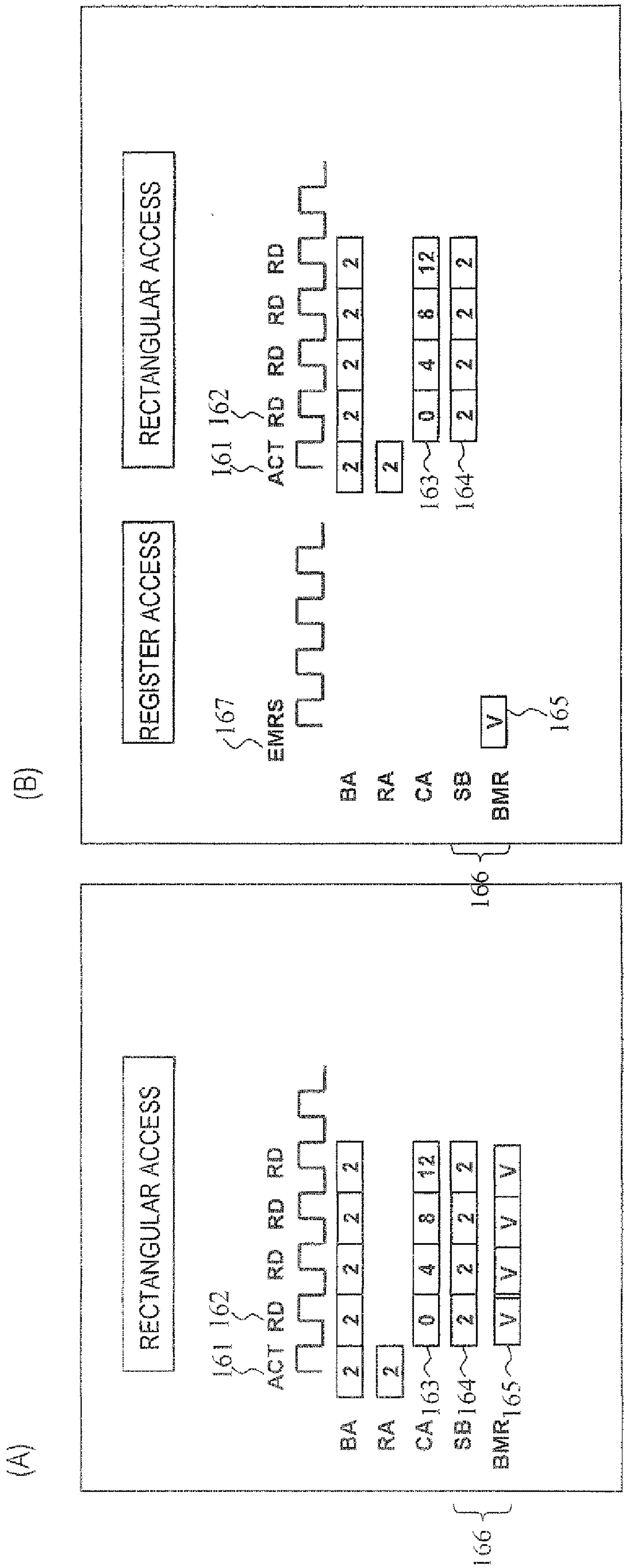
FIG. 16 Timing charts showing the byte boundary functions in a rectangular access.

FIG. 16 shows timing charts showing the byte boundary functions in the rectangular access. This rectangular access is an example of accessing the rectangular area 22 shown in FIG. 6. As described above, in the rectangular access, in order to read an arbitrary combination of byte data (bit data) from an arbitrary byte position (or bit position) within a memory unit area (4-byte area or 4-bit area) selected by a column address CA, the starting column address CA and, the first information SB and the second information BMR, byte combination information 166, are required.

FIG. 16(A) is an example in which the byte combination information items SB and BMR are supplied along with a read command RD. A bank address BA=2 and a row address RA=2 are supplied with an active command ACT (161 in the figure), and the first information SB=2 (164 in the figure) indicating the position of the start byte (start bit) and the second information BMR=V (165 in the figure) indicating a combination of bytes (bits) are supplied along with the bank address BA=2 and the column address CA=0 with a following read command RD (162 in the figure). Accordingly, the first 4 bytes (4 bits) of the rectangular area 22 shown in FIG. 6 are outputted to the input/output terminals DQ. The rest of three combinations of 4 bytes (4 bits) of the rectangular area 22 are also specified by the same bank address BA, column address CA, and the byte combination information items SB and BMR.

In FIG. 16(B), out of the bite combination information items SB and BMR, the second information BMR (165 in the figure) is supplied simultaneously with the mode register set command EMRS (167 in the figure) in a register access mode before the active command ACT is issued, and this second information BMR is recorded in the mode register. In a subsequent rectangular access, column access is made based on this second information BMR. The active command ACT (161 in the figure) and a read command RD (162 in the figure) in this rectangular access are the same as those shown in FIG. 16(A) except for the second information BMR.

The abovementioned second information BMR=V can have various information on the big endian (V=UP), little endian (V=DOWN), and the cases where the luminance information is stored in the even-numbered DQs and the color difference information is stored in the odd-numbered DQs (V=AL).

The image system can realize the byte boundary functions in the rectangular access in any methods of (A) and (B) of FIG. 16.

Figure 17:
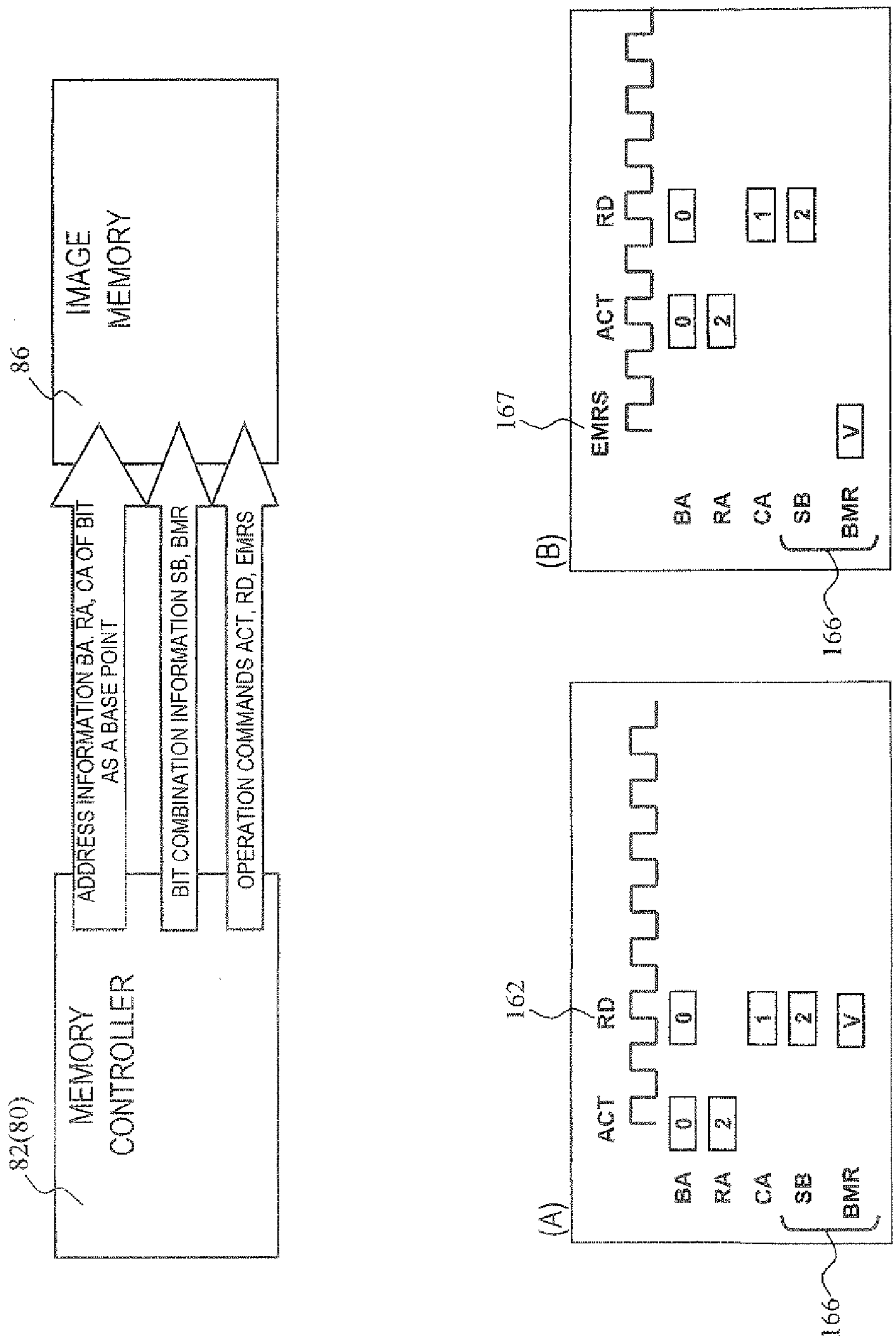
FIG. 17 A configuration diagram of an image processing system for realizing the byte boundary functions.

FIG. 17 is a configuration diagram of the image processing system for realizing the byte boundary functions. As with FIG. 8, the memory controller 82 for controlling the image memory 86 is provided in the image memory 86. The address information BA, RA and CA, the byte combination information (bit combination information) 166 that is constituted by the first information SB indicating the start byte (start bit) within a 4-byte area (or a 4-bit area) selected by the address information and the second information BMR indicating a byte combination, and the operation commands ACT, RD and EMRS are supplied from the memory controller 82 to the image memory 86.

As described above, in the timing chart (A), a read command RD or a write command WT, which is not shown, is supplied simultaneously with the byte combination information SB and BMR (166 in the figure). Also, in the timing chart (B), a mode register set command EMRS (167 in the figure) is supplied simultaneously with the second information BMR, and the read command RD or the write command WT, which is not shown, is supplied simultaneously with the first information SB.

Figure 18:
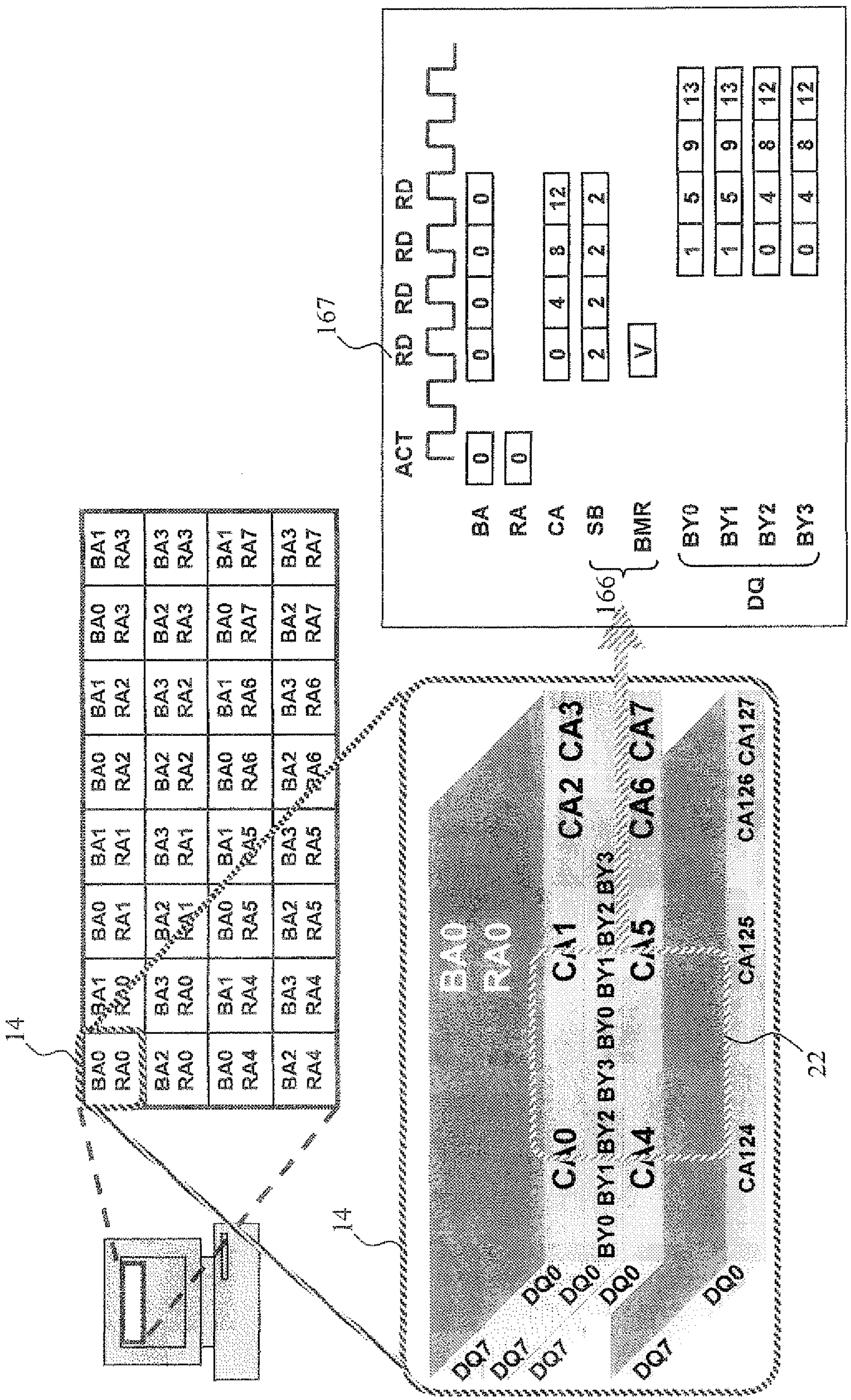
FIG. 18 A figure showing the byte boundary functions.

FIG. 18 shows the byte boundary functions. This figure shows the same rectangular access as that of FIG. 6. The figures after FIG. 10 explain the examples of a 4 bit memory unit area selected by the column address CA. However, the rectangular access can be made by the byte boundary functions also in the case where the memory unit area consists of 4 bytes as described above. FIG. 18 shows such a case.

In the example shown in FIG. 18, a bank address BA, column address CA, and the byte combination information 166 constituted by the first information SB and second information BMR are issued along with the read command RD (167 in the figure) in order to effectively access the rectangular area 22 within the page area 14 (BA=0, RA=0). In response to this issuance, 4 bytes of data items BY 0 through 3 within the rectangular area 22 are outputted simultaneously to the input/output terminals DQ. The same operation is performed in the case of a write command WT. Specifically, byte data items within CA1, CA1, CA0 and CA0 are associated with the four 4-byte terminals BY 0 through 3 of the input/output terminals DQ respectively in response to the first read command RD, and byte data items within CA5, CA5, CA4 and CA4 are associated with the four 4-byte terminals BY 0 through 3 of the input/output terminals DQ respectively in response to the next read command RD. The relationship between each column address and each input/output terminal in response to the rest of the read commands RD is as shown in the figure.

In this manner, the bit boundary or byte boundary functions can be realized even in the case where the width of the input/output terminals DQ is 4 bits or 32 bits (4 bytes).

Figure 19:
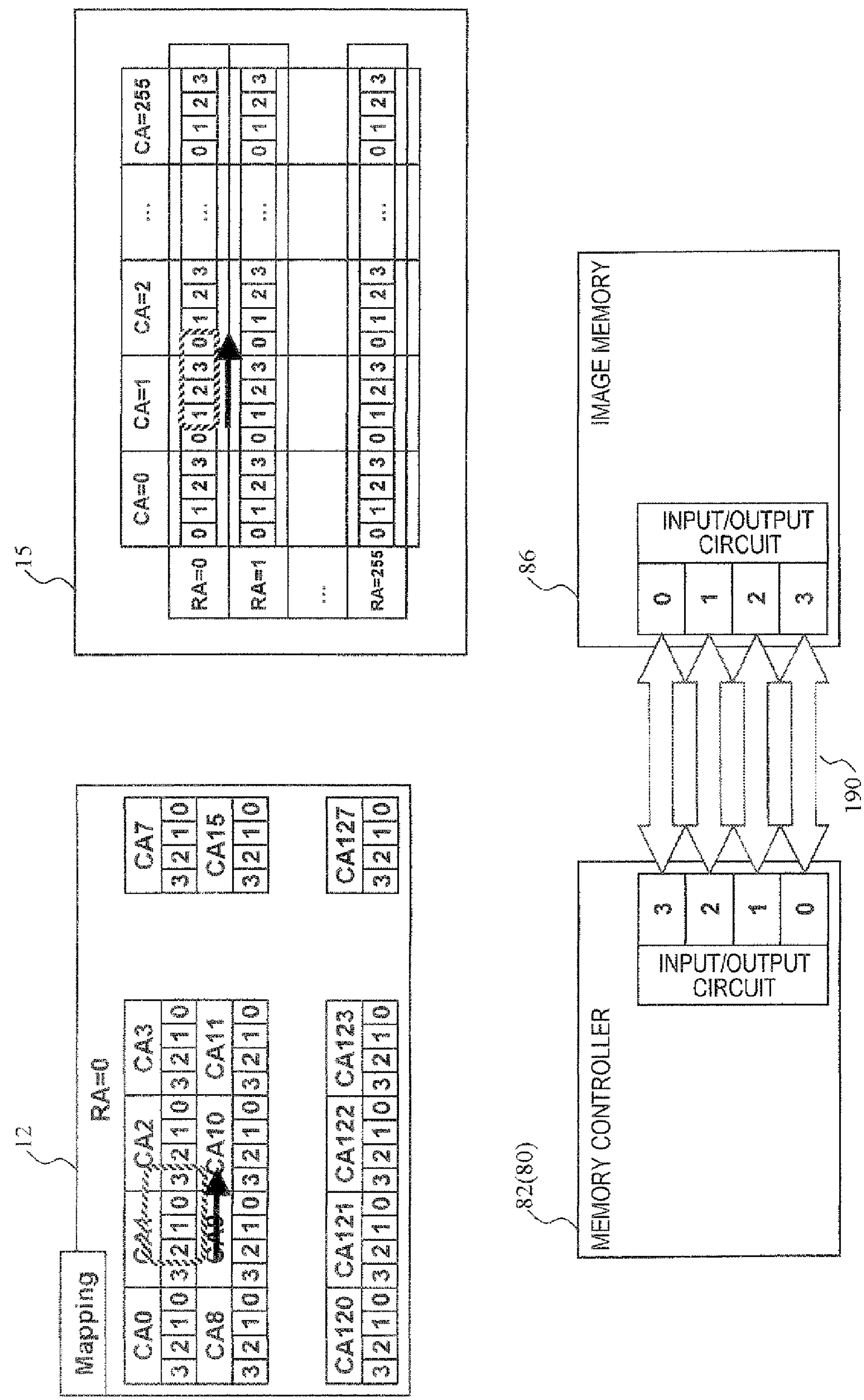
FIG. 19 A configuration diagram of the image processing system that realizes simplified byte boundary functions.

FIG. 19 is a configuration diagram of the image processing system that realizes simplified byte boundary functions. As described above, in the system designing, either one of the two memory mapping types, i.e., the big endian and the little endian, can be selected. In the above-described embodiment, accordingly, BMR=UP is specified for the big endian and BMR=DOWN is specified for little endian as the second information BMR of the byte combination information so that each pixel of the image can be associated with a byte position within the memory space even when the rectangular access is made shifting from byte to byte.

In the example shown in FIG. 19, in the case where the system in the memory mapping 12 is designed to have a configuration corresponding to the little endian, even if the byte boundary functions for only the big endian can be performed to the system in the memory space 15, the entire system can realize the byte boundary functions for the little endian by providing, between the image memory 86 and the memory controller 82, switching means 190 for switching the input/output terminals.

Specifically, in the case where the memory mapping on the system side is designed for the little endian, the switching means 190 is provided to switch the input/output terminals 0 through 3 in the image memory 86 to 3 through 0 in the memory controller 82. As a result, to the image memory, the system side appears to respond to the big endian. Therefore, even if the system is configured to have a memory only for the second information BMR=UP, the byte boundary functions for the little endian can be realized.

Figure 20:
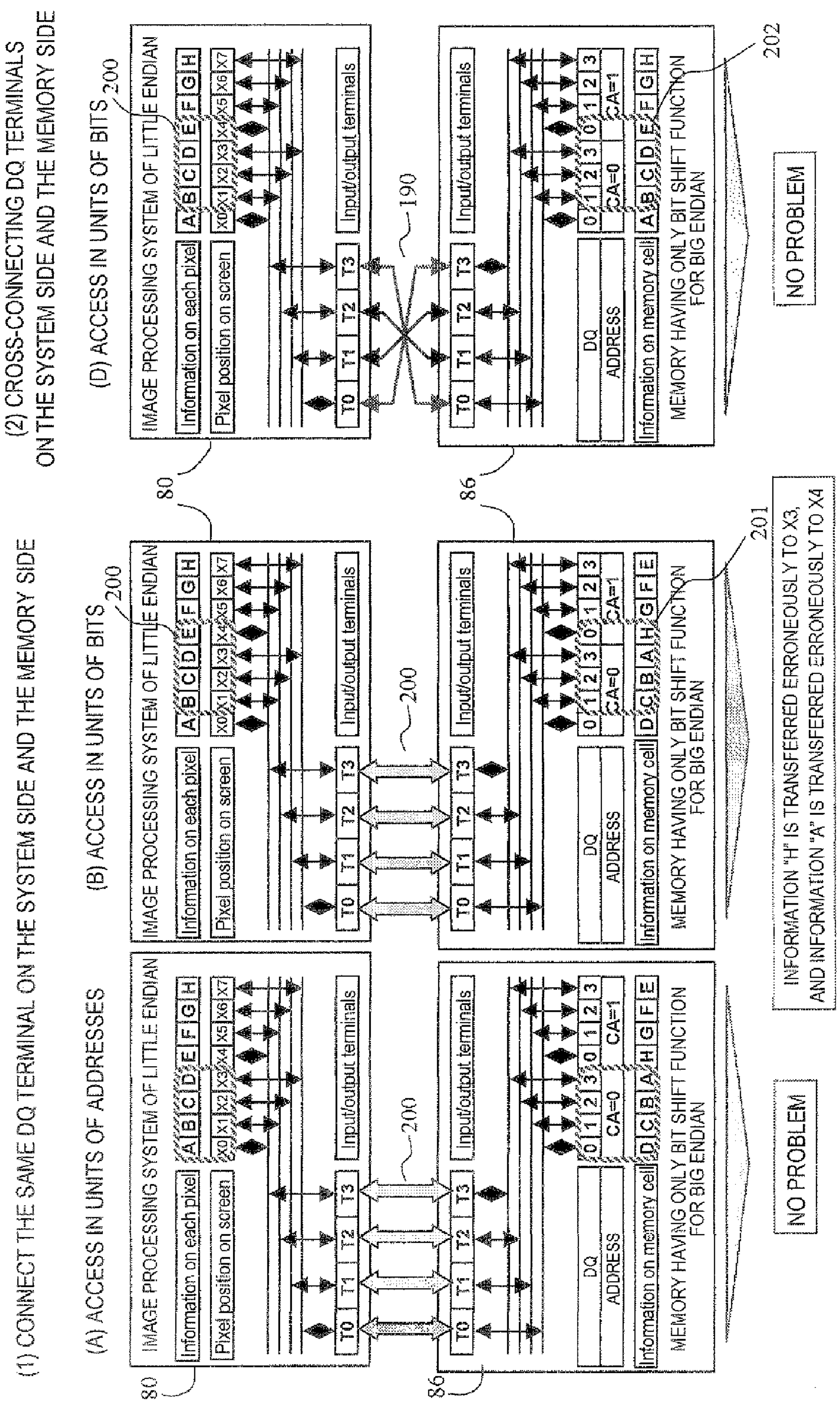
FIG. 20 A figure for explaining the image processing system that realizes the simplified byte boundary functions shown in FIG. 19.

FIG. 20 is a figure for explaining the image processing system that realizes the simplified byte boundary functions shown in FIG. 19. FIG. 20(1) shows an example in which the image processing system 80 and the image memory 86 are connected to each other via a connecting unit 200 that connects input/output terminals T 0 through 3 without switching them. FIG. 20(2) shows an example in which the image processing system 80 and the image memory 86 are connected to each other via a connecting unit 190 that switches the input/output terminals. In either case, the image memory 86 has the bit boundary functions for only the big endian, while the image processing system 80 is a little endian type which, for associating the 4 bit data, an input/output bit width, associates the pixel positions X 0 through 3 to the input/output terminals T 3 through 0.

In FIG. 20(1), in the case where an access is made in units of addresses (A), the pixel positions (X 0 through 7) on the screen are associated one-on-one with addresses (CA) on the memory side (X 0 through 3 and CA=0, X 4 through 7 and CA=1), thus there is no problem. However, in the case where a signal SB is specified to make an access in units of bits (B), a shift in the pixel positions (X 1 through 4 (BCDE), 200 in the figure) does not match with a shift in the physical positions of memory cells (CBAH, 201 in the figure) in the memory where the only bit boundary functions (BMR=UP only) corresponding to the big endian exists, thus wrong data CBAH is transferred. In this case, the BCDE on the memory cells can be outputted by means of the bit boundary functions (BMR=DOWN) corresponding to the little endian. However, if the bit boundary functions that are capable of responding to both the big endian and the little endian are provided in the memory, increase in costs is caused.

Therefore, as shown in FIG. 20(2), the connecting unit 190 for cross-connecting the input/output terminals on the system side and the memory side is provided so that the pixels X 0 through 3 on the image correspond to the DQ 0 through 3 on the memory cells, whereby the image processing system 80 for little endian appears to the memory 86 to be a system for big endian. Accordingly, the shift 200 of the pixel positions matches with the shift 202 of the physical positions of the memory cells, and thereby normal data BCDE can be transferred even if an access is made while shifting bits so as to respond to the big endian.

As described above, by using the connecting unit 190 capable of performing cross-conversion to switch the terminals connecting the system and the memory, even in the case of the memory having the bit boundary (or byte boundary) functions for big endian, the bit boundary (or byte boundary) functions can be realized in the image processing system for little endian. Moreover, in the case of the memory having the bit boundary (byte boundary) functions for both big endian and little endian, the memory and the system may be connected to each other via the connecting unit 200 that makes connection without switching the terminals.

Figure 21:
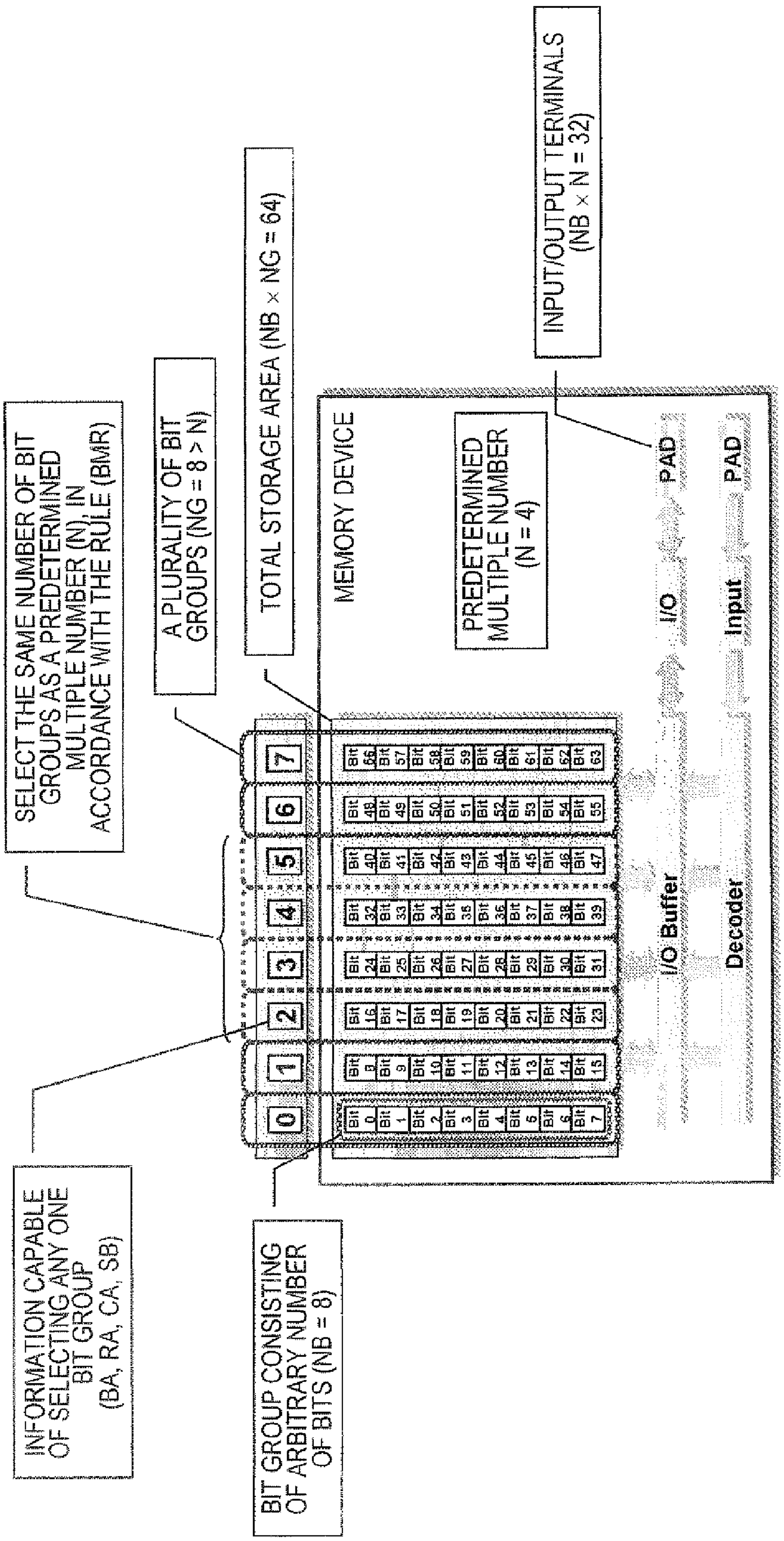
FIG. 21 A figure showing a schematic configuration of a memory having the byte boundary functions.

FIG. 21 is a figure showing a schematic configuration of the memory having the byte boundary functions. This memory is configures a bit group with at least one or an arbitrary number (Nb) of bits, and has input/output terminals (Nb×N), which is the multiples (N), that is two or more of the arbitrary number (Nb) of bits. A plurality of bit groups (Ng), the number of which is higher than the predetermined multiple number (N), configures the entire storage area (Nb×Ng). Address information that can select any one of the plurality of bit groups (Ng) is received in synchronization with a first operation code. The one bit group that is selected by the address information is taken as a starting point, and the same number of bit groups as the multiple number (N) are selected in accordance with a predetermined rule. A plurality of bits (Nb×N) corresponding to the selected bit groups simultaneously deliver and receive stored information via input/output terminals (Nb×N).

The arbitrary number of bits (Nb) described above means concept including both bit units and byte units, and Nb=8 (1 byte) is set according to the above-described embodiment. Also, the multiple number (N) explains that data items of many times of the arbitrary number of bits (Nb) are accessed from one address, and Nb×N corresponds to the number of input/output terminals. N=4 is set according to the above-described embodiment, thus the multiple number corresponds to the input/output terminals, the number of which is equivalent to 4 bytes. More concretely, the number of input/output terminals is Nb×N, thus the number of input/output terminals=32 (=8×4).

Also, Ng indicating the plurality (Ng) of bit groups is the number of groups of all bits or bytes (groups of Nb bits) that the memory has, and is equivalent to the number obtained by dividing the capacity of the entire storage area by Nb. Normally, the number of Ng is much larger than the multiple number (N) that is the number of bit groups inputted/outputted at once. For example, in the case of a 64 M-bit memory, if Nb=1, Ng=64M, and if Nb=8, Ng=8M. According to the previous examples, when considering the 64 M-bit memory, if Nb=8, Ng=8M. According to the previous examples, the address information that can select any one bit group is information (SB) indicating a bit which is a starting point of an address (BA, RA, CA), wherein data that is narrowed down to 4 bytes by the address (BA, RA, CA) is limited to a byte as a starting point by the information (SB) indicating a byte as a starting point.

Selecting the same number of bit groups as the multiple number (N) in accordance with a rule means that, according to the previous examples, a plurality of bytes are selected in accordance with the information on a combination of bytes (BMR) that are selected simultaneously with a start byte. Since N=4, when BMR=Up, 4 bytes that continue in the Up direction can be accessed simultaneously from an arbitrary byte.

The image processing system accesses, via 32-bit (=Nb×N) input/output terminals, 4 bytes that are selected by the information capable of selecting any one bit group (1 byte according to the previous examples) (BA, RA, CA), the information on a byte that is a starting point (SB), and the information on a combination of bytes (BMR) that are accessed simultaneously.

The amount of memory of a memory device shown in FIG. 21 is 64 bits. Therefore, eight (Ng=8) bit groups with Nb=8 bits exist. The address (BA, RA, CA) and the start byte (SB) are constituted by a total of 3 bits, thus one bit group is selected from the Ng=8 bit groups. Moreover, the bit groups (N=4) that are accessed simultaneously are determined by the combination information (BMR). Therefore, in the example shown in FIG. 21, a second group is selected by the address (BA, RA, CA) and the start byte (SB), and four groups (group 2 through group 5) following the second group are accessed simultaneously from the input/output terminals by means of the combination information BMR=UP.

If the address is incremented by one bit in the same 64 bit memory, the number of bit groups with a bit unit of 4 (Nb=4) is 16 (Ng=16), and if the input/output terminals remain Nb×N=32, the predetermined multiple number becomes 8 (N=8), thus seven other bit groups are selected by the combination information BMR.

[Memory with Byte Boundary Functions]

The configuration of the image memory having the byte boundary functions is described next in detail. According to the byte boundary functions, 4 bytes of data beyond a memory unit area (4-byte area) can be selected, the memory unit area being selected by the column address. Therefore, functions for inputting/outputting 4-byte to be required data are added to the memory. Hereinafter, for simplification, there is described an example in which only the first information SB (referred to as "start byte" or "start bit") is provided as the byte combination information. The second information BMR is an example of UP only.

[Example of Internal Column Control]

First of all, several specific examples of column control performed on the inside of the memory are described.

Figure 22:
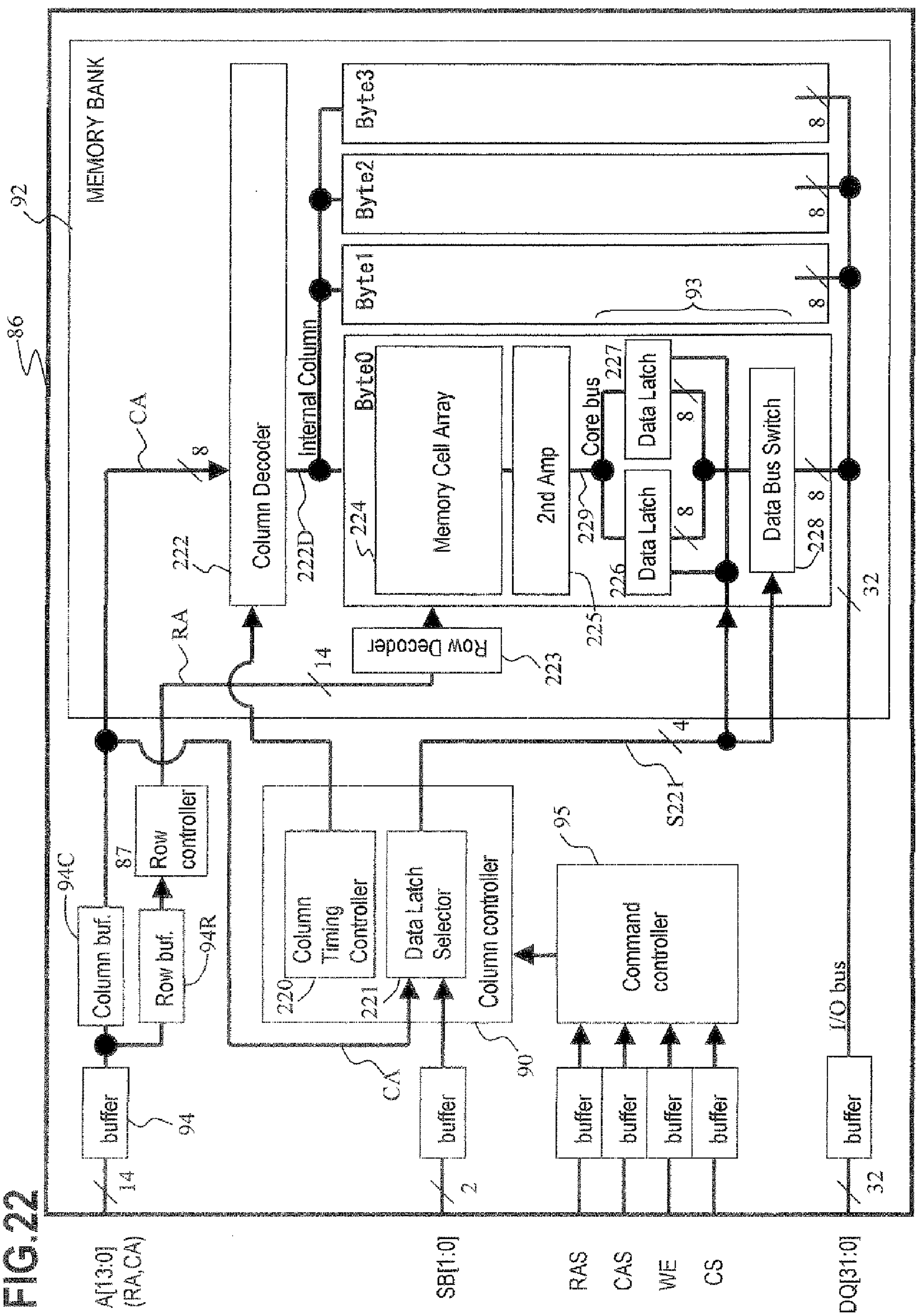
FIG. 22 A figure showing a first example of the image memory having the byte boundary functions.
Figure 23:
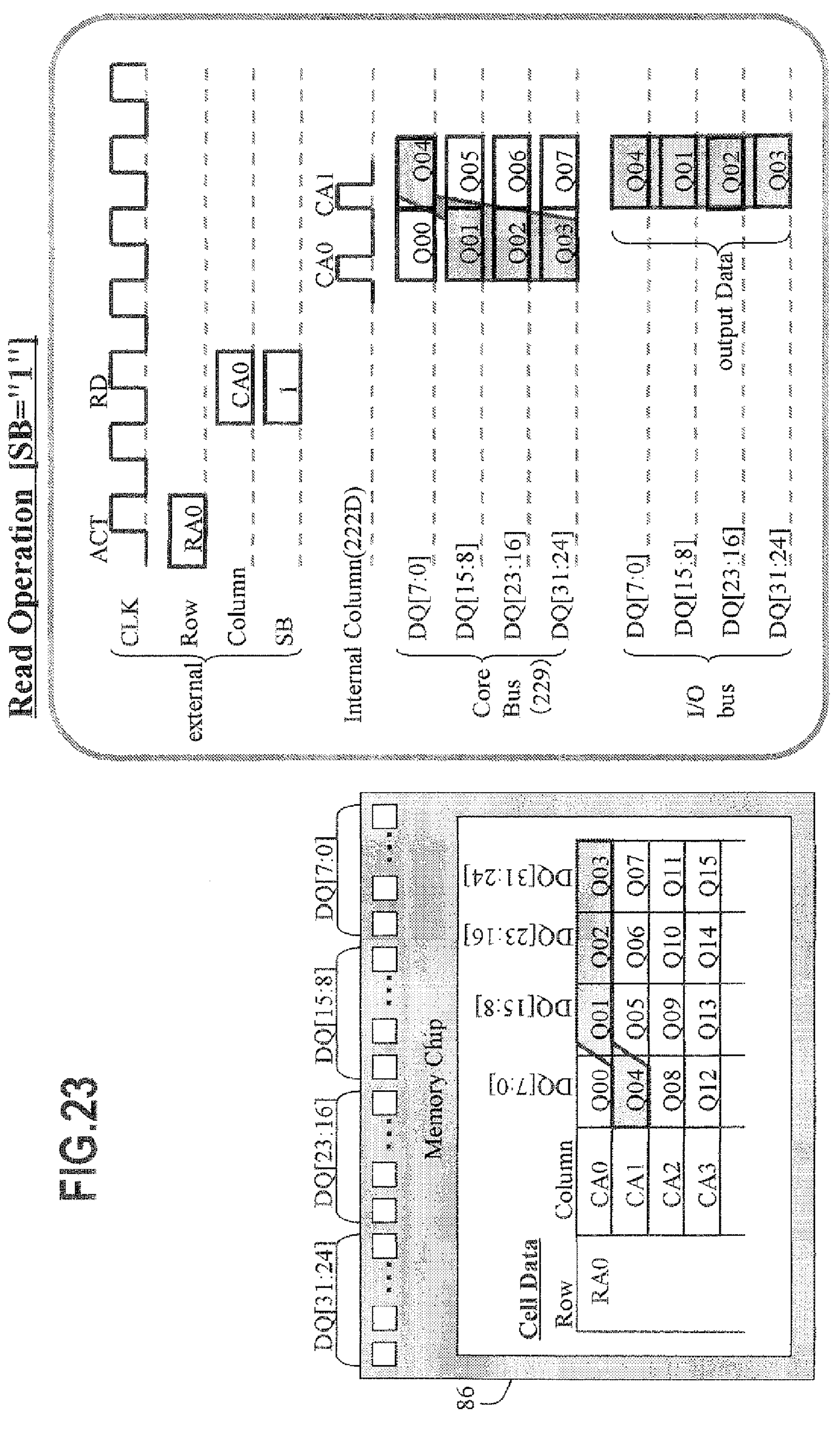
FIG. 23 A figure for explaining the operation shown in FIG. 22.

FIG. 22 shows a first example of the image memory having the byte boundary functions. FIG. 23 is a figure for explaining the operation in FIG. 22.

As shown in FIG. 22, the same components as the image memory shown in FIG. 9 are applied with the same reference numbers. An address signal A is inputted by a multiple system. A row address RA is latched into a row address buffer 94R, and a column address CA is latched into a column address buffer 94C. The row controller 87 supplies the row address RA to a row decoder 223 of a selected memory bank 92. The column address CA within the column buffer 94C is also supplied to a column decoder 222 of the selected memory bank.

The memory bank 92 is divided into byte areas 0 through 3, which are four memory blocks. Each byte area has a memory cell array 224, a second amplifier 225, a pair of data latches 226 and 227, and a data bus switch 228, and inputs/outputs one byte (8 bits) of data at one access. A total of 32 bits (4 bytes) of data are inputted/outputted to an I/O bus from the four byte areas. The I/O bus is connected to 32 bits of input/output terminals DQ 0 through 31 via buffers. It should be noted that FIG. 22 shows only one memory bank 92, and the remaining three memory banks are omitted.

The column controller 90 has a column timing controller 220 for controlling the timing for operating the column decoder 222, and a data latch selector 221 for controlling the data latch circuits 226 and 227 and the data bus switch 228. The data latch selector 221 controls the data latch circuits 226 and 227 and data bus switch 228 within each of the byte areas 0 through 3 in response to a column address CA and a start byte SB.

As shown in FIG. 23, suppose that 4 bytes of data from the second byte of a column address CA 0 to the first byte of a column address CA 1 within a page area of a row address RA 0 are accessed. Therefore, start byte SB=1 is established.

The memory chip 86 shown in FIG. 23 shows the relationship between the memory space and input/output terminals DQ. In FIG. 23, a 4-byte data item of a memory unit area that is selected by a column address CA once is indicated by Q 00 through 15. Specifically, 4-byte data items Q 00 through 03 are selected by a column address CA 0, and 4-byte data items Q 04 through 07 are selected by a column address CA 1.

The right side of FIG. 23 shows a timing chart. First, a bank address, which is not shown, and a row address RA 0 are provided along with an active command ACT, so that a word line within a corresponding bank is driven, and then a sense amplifier is activated. Thereafter, the column address CA 0 and a start byte signal SB=1 as the bank combination information are provided along with a read command RD. In response to this, the column decoder 222 within the selected memory bank 92 outputs an internal decode signal 222D corresponding to the column address CA 0 and an internal decode signal 222D corresponding to CA 1 obtained by incrementing CA 0 by one to four byte areas 0 through 3 in a time-sharing manner. Two 1-byte data items corresponding to CA 0 and CA 1 respectively are cached to the data latch circuits 226 and 227 in each byte area. Then, the data bus switch 228 outputs either one of the 1-byte data items, which are selected in accordance with the combination of CA 0 and SB 1 in each byte area, from the data latch circuit 226 and 227 to the I/O bus. Specifically, the data items Q 01, Q 02 and Q

03 of CA 0 and the data item Q 04 of CA 1 are outputted to the I/O bus. When the write operation is performed, the 1-byte data is inputted to either one of the data latch circuits from the I/O bus.

Specifically, the column decoder selects column lines (bit lines) equivalent to one byte in each byte area at one access. When the read operation is performed, data equivalent to 1 bytes are selected from the memory cell array 224 of each byte area, are then amplified by the second amplifier 225 and cached to the data latch circuits 226 and 227. At this moment, memory cells that are mapped by the same column address CA are accessed in each byte area. In order to realize a byte boundary access made across the boundaries of the memory unit areas (four byte areas) that can be selected by the column address, the column decoder 222 selects a column line again after ending the first access. The address of this column line is CA 1, which is an address after the previous address CA 0. 1 byte of data that is read from the memory cell array 224 is amplified by the second amplifier, and cached to the data latch circuit 227 different from the first access.

Therefore, 8 bytes of data items, which are twice as large as the 4-byte data required by the input/output terminals DQ in one access, are present in the data latch circuits 226 and 227, thus the data bus switch 228 selects 1 byte of data, i.e., half data, from 2-byte data cached to the data latch circuits of each byte area, and transfers this data to the I/O bus. The data latch selector 221 controls cache operation on the data latch circuits 226 and 226 within each byte area and switching operation on the data bus switch 228, in response to the column address CA0 and the start byte signal SB=1. Accordingly, byte data corresponding to different column address CA 0 and CA 1 can be transferred from each byte area to the I/O bus.

As a result, as shown in FIG. 23, 4-byte data items Q 04, Q 01, Q 02 and Q 03 are transferred to the input/output terminals DQ respectively via the I/O bus. In this manner, the input/output unit 93 is configured by the second amplifier 225, data latch circuits 226 and 227, and data bus switch 228.

Figure 24:
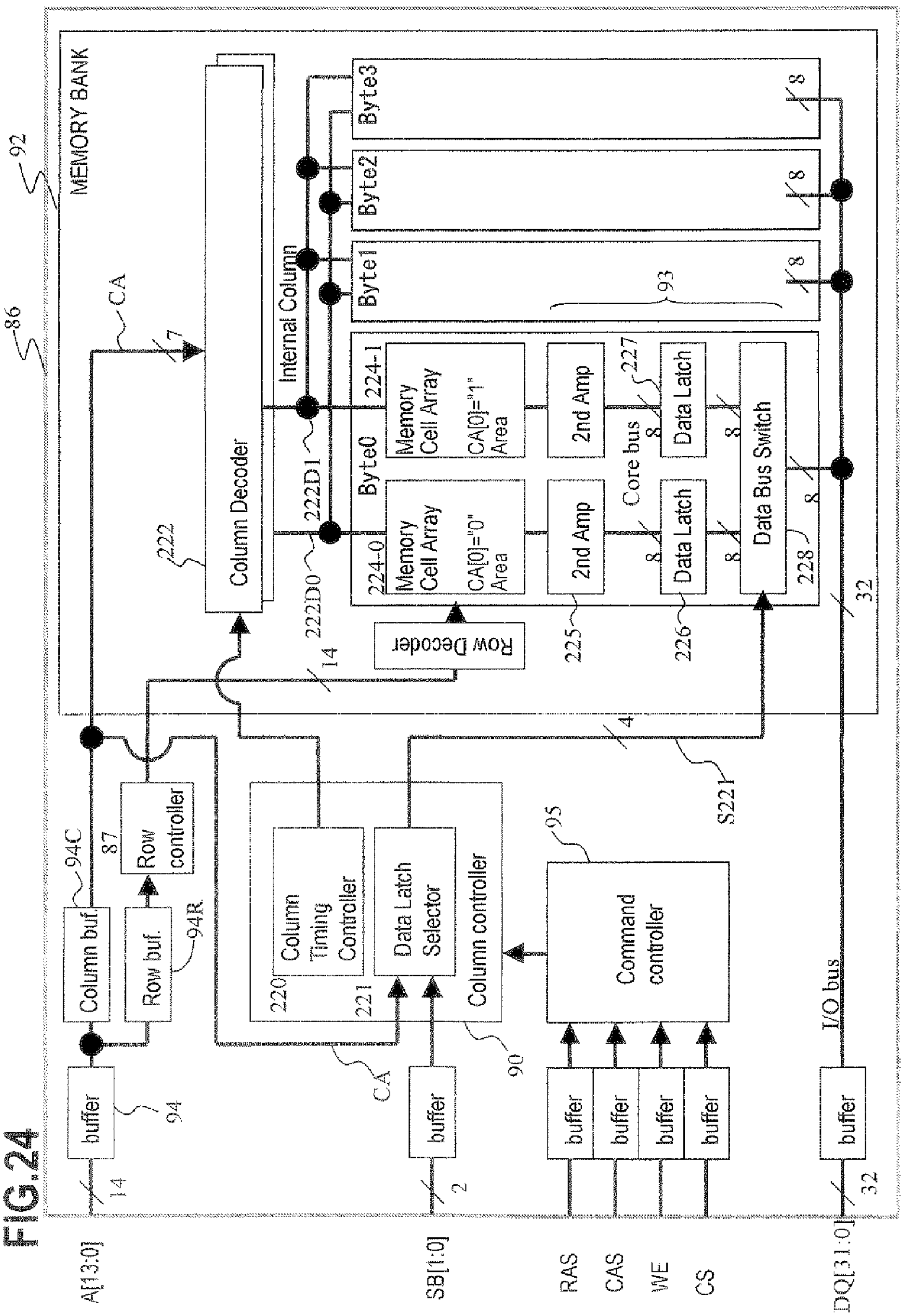
FIG. 24 A figure showing a second example of the image memory having the byte boundary functions.
Figure 25:
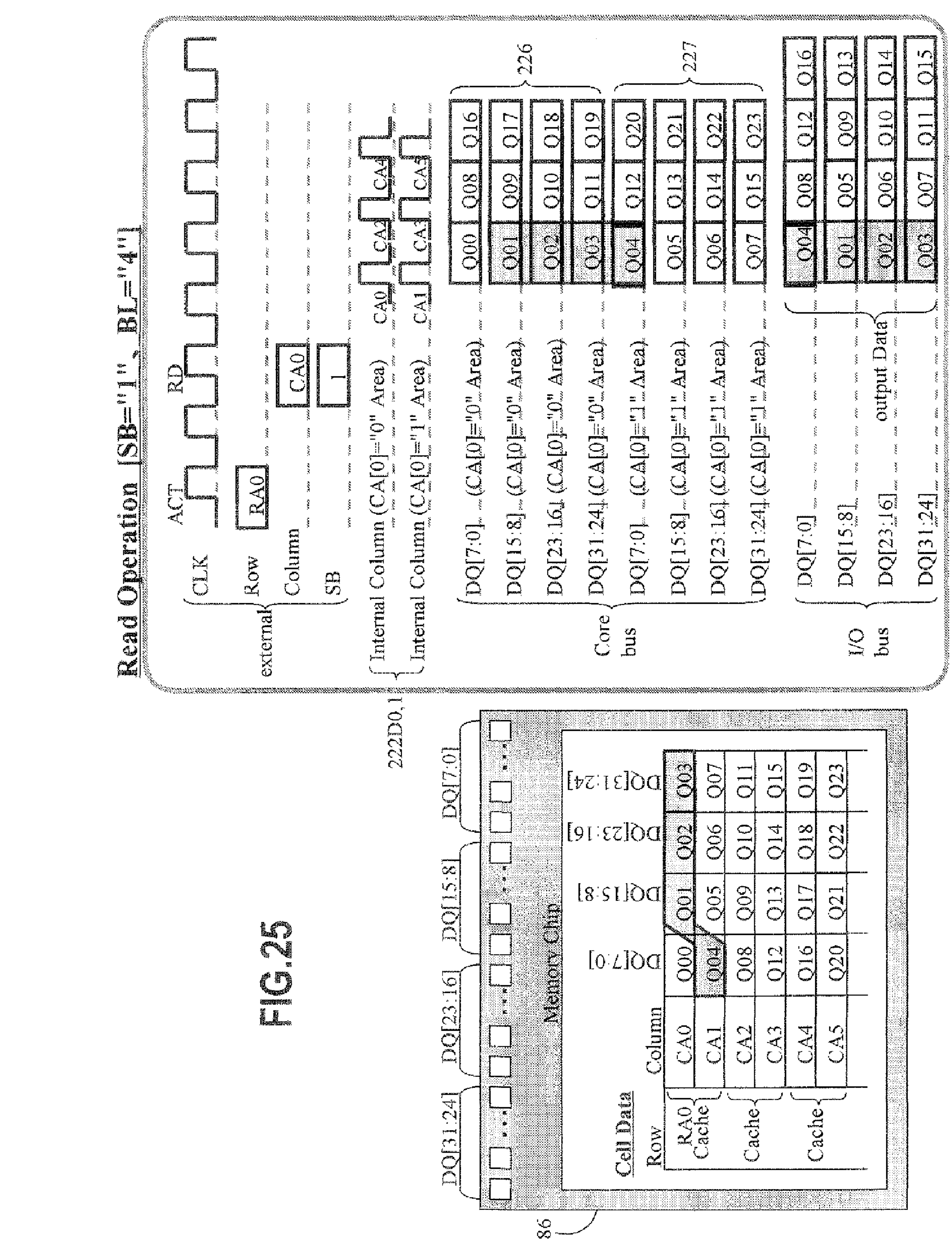
FIG. 25 A figure for explaining the operation shown in FIG. 24.

FIG. 24 shows a second example of the image memory having the byte boundary functions. FIG. 25 is a figure for explaining the operation shown in FIG. 24.

The configuration shown in FIG. 24, which is different from that of FIG. 22, is that, in each of the byte areas 0 through 3 within the memory bank 92, the memory cell array is divided into two arrays, 224-0 and 224-1, and the second amplifier 225 and the data latch circuits 226 and 227 are provided in each array. A pair of memory cell arrays 224-0 and 224-1, corresponds to an even number column address CA (CA[0]=0) and to an odd number column address CA (CA[0]=1). The column decoder 222 does not output decode signals of CA 0 and CA 1 from the given column address CA 0 in a time sharing manner, but outputs two decode signals 222D0 and 222D1 simultaneously to the pair of memory cell arrays 224-0 and 224-1. In response to this, the pair of memory cell arrays each outputs 1-byte data to the data latch circuits 226 and 227. Accordingly, byte areas cache simultaneously 2-byte data of a provided column address CA and, the column address obtained by incrementing the column address CA by one. Then, the data latch selector 221 controls switching of the data bus switch 228 in response to the column address CA and the start byte signal SB, and transfers required 1-byte data to the input/output bus. Each of the four byte areas outputs 1-byte data, thus a total of 4 bytes of data are outputted from the input/output terminals DQ.

In the case of a write command, the 4-byte data that is supplied to the input/output terminals DQ is stored into the two data latch circuits 226 or 226 via the data bus switch 228 that is switched and controlled in response to the column address CA and the start byte signal SB, and then written to the two memory cell arrays 224-0 or 224-1.

FIG. 25 shows an operation performed when start byte signal SB=1 and burst length BL=4. The column address CA 0 and the start byte signal SB=1 are supplied along with a read command RD, and, when the burst length BL=4 is set by the mode register, the column decoder 222 supplies decode signals 222D0, 222D1 corresponding to the column addresses CA 0 and CA 1 to each of the byte areas 0 through 3 simultaneously, the column address CA 1 being obtained by incrementing the column address CA 0 by one. In response to this, the pair of memory cell arrays 224-0 and 224-1 of each byte area each outputs 1-byte data to the data latch circuits 226 and 227 via the second amplifier 225. Accordingly, 2 bytes of data are cached from each byte area. Then, based on the column data CA and the start byte signal SB, the data latch selector 221 supplies to the data bus switch 228 a control signal S221 for selecting data of either one of the data latch circuits in each byte area (1 bit in four byte areas, i.e., a total of 4 bits), and then controls the switching operation within the data bus switch. As a result, 4 bytes of data items Q 04 and Q 01 through 03 are transferred to the I/O bus in the first cycle.

In FIG. 25, since the burst length BL=4, the column decoder 222 issues the decode signals 222D0 and 222D1 corresponding to column addresses CA 2, CA 3 in response to the control performed by the column timing controller 220, so as to further caches 8 bytes of data to the data latch circuits 226 and 227. Since the data latch circuits 226 and 227 need to hold 8-byte data of CA 0 and CA 1 as well, each of the data latch circuits is configured so as to be able to hold 2 bytes of data. As a result, new 8-byte data Q 08 through 15 are latched to the data latch circuits. Then, the data bus switch 228 transfers to the input/output bus 4-byte data Q 05 through 08 among the 8-byte data Q 00 through 07 held in the previous clock cycle and 8-byte data Q 08 through 15 held in the present clock cycle. Therefore, the selected signal S221 of the data latch selector 221 in this case consists of 8 bits (2 bits in each byte area).

In the next clock cycle, the column decoder 222 issues decode signals 222D0 and 222D1 corresponding to column address CA 4 and CA 5, and further caches 8 bytes of data Q16 through Q23 to the data latch circuits. Then, the data bus switch 228 transfers 4 bytes of data Q 09 through 12. In the next clock cycle, the data bus switch 228 transfers 4 bytes of data Q 13 through 16 to the input/output bus. At this moment, it is not necessary to cache new 8-byte data from the memory cell arrays.

As with the above explanation, the write operation is performed such that, if the burst length BL is 4, 4 bytes of data are supplied to the input/output terminals DQ in four cycles, and then stored in the data latch circuits 226 and 227 via the data bus switch 228. Then, in response to the decode signals of the column addresses CA 0, 1, CA 2, 3, and CA 4, 5 from the column decoder 222, a total of 16 bytes of data are written to the memory cell arrays in three cycles.

Figure 26:
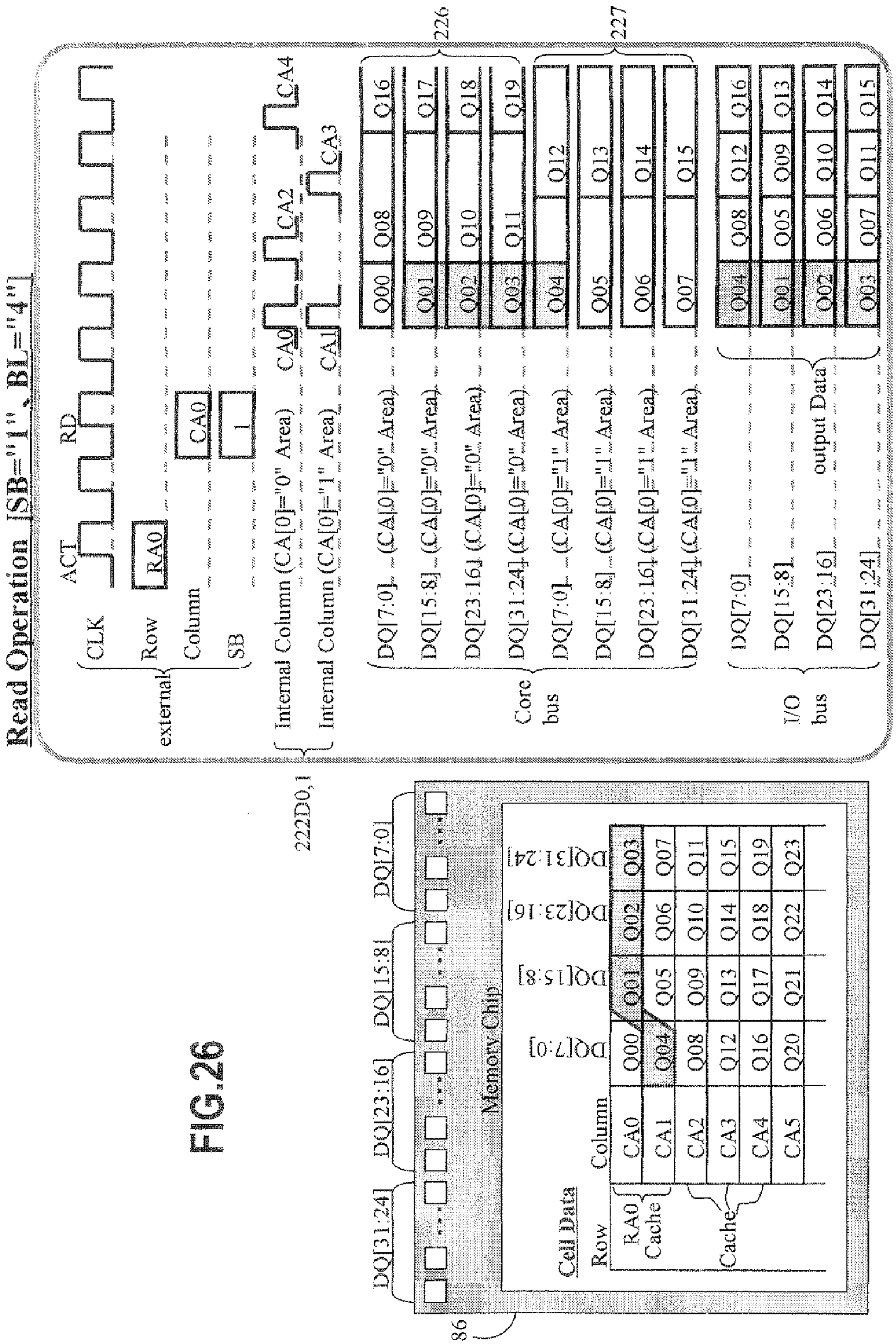
FIG. 26 A figure showing an operation of a modified example (1) of the second example of the image memory having the byte boundary functions.

FIG. 26 shows an operation of a modified example (1) of the second example of the image memory having the byte boundary functions. In the example shown in FIG. 25, each of the byte areas 0 through 3 caches 2-byte data to the pair of data latch circuits 226 and 227. However, in the modified example shown in FIG. 26, in a first column control after a read command RD, the column decoder 222 issues the internal decode signals 222D0 and 222D1 of the column address CA 0 and CA 1 simultaneously and each byte area caches 2-byte data to the pair of data latch circuits simultaneously. Then, in the subsequent cache operation, the column decoder 222 issues the internal decode signal 222D0 of the even numbers (CA 2, CA 4) and the internal decode signal 222D1 of the odd number (CA 3) alternately, and each byte area caches 1-byte data to the pair of data latch circuits 226 and 227 alternately.

Specifically, 8 bytes of data Q 00 through 07 are cached first, and thereafter 4 bytes of data Q 08 through 11, Q 12 through 15, and Q 16 through 19 are cached to the data latch circuits. Then, the data bus switch 228 transfers the 4 bytes of data DQ 1 through 4, Q 05 through 08, Q 09 through 12, and Q 13 through 16 to be transferred, to the input/output bus sequentially. In this case as well, the selected signal S221 of the data latch selector 221 consists of 8 bits (2 bits in each byte area). As described above, in the read operation, the memory cell arrays cache the data to the data latch circuits in four cycles by means of the decode signals of the column addresses, and the data transfer operation with respect to the input/output bus from the data latch circuits is also performed in four cycles.

In the case of writing operation as well, 4 bytes of data are supplied to the input/output terminals DQ in four cycles, and stored in the data latch circuits 226 and 227 via the data bus switch 228 in four cycles. Thereafter, in response to the decode signals of the column addresses CA 0/1, CA 2, CA 3 and CA 4 from the column decoder 222, a total of 16 bytes of data are written to the memory cell arrays in four cycles.

Figure 27:
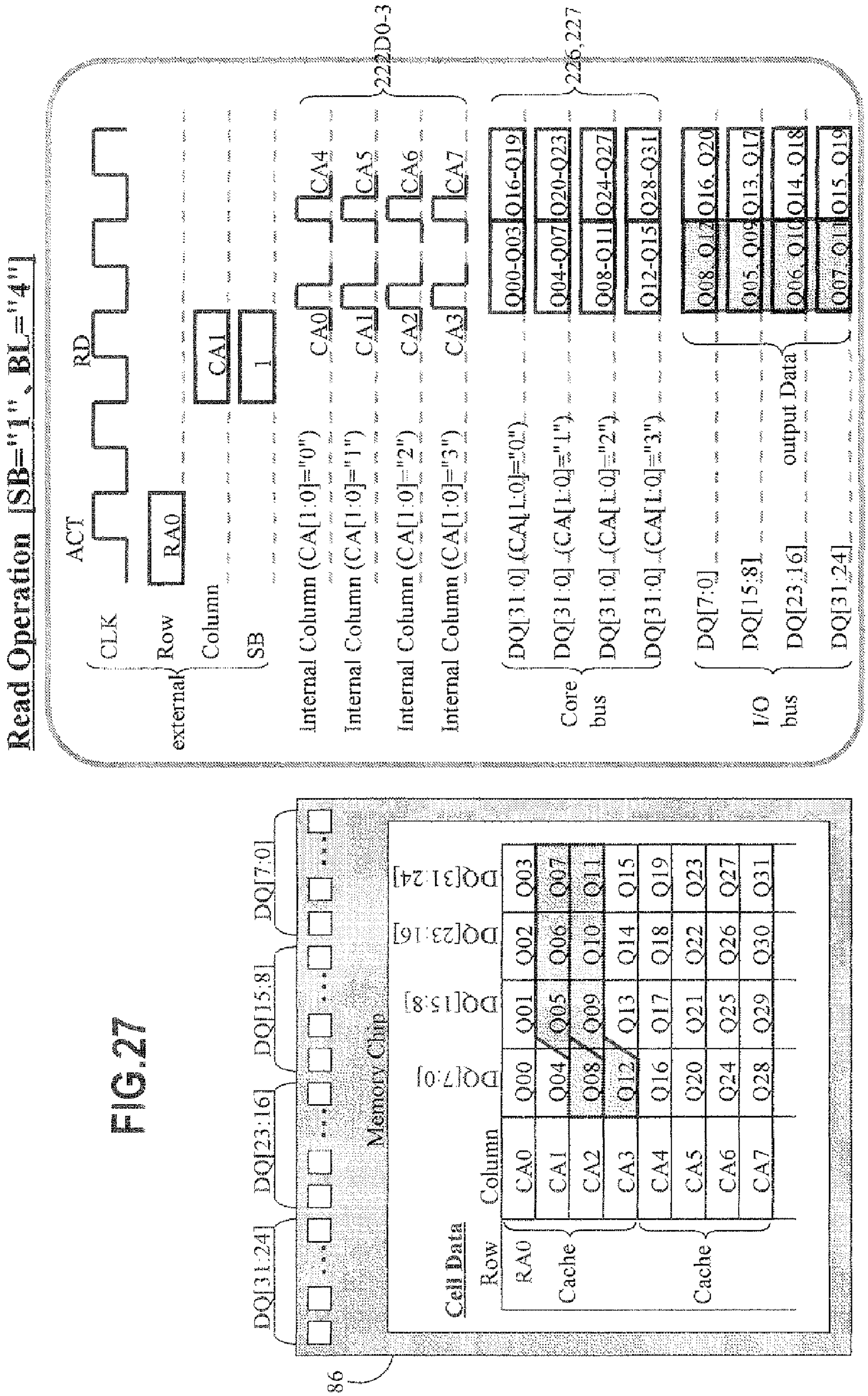
FIG. 27 A figure showing an operation of a modified example (2) of the second example of the image memory having the byte boundary functions.

FIG. 27 shows an operation of a modified example (2) of the second example of the image memory having the byte boundary functions. This example is applied to a DDR (Double Data Rate). An SDRAM of the DDR performs input and output of data from DQ terminals at both rising edge and a trailing edge of a clock CLK. Specifically, 4 bytes of data Q 05 through 08 are inputted/outputted at the rising edge, and 4 bytes of data Q 09 through 12 are inputted/outputted at the trailing edge.

Since the input/output rate is doubled in this manner, it is necessary to double the amount of data in the memory that needs to be cached. In the example shown in FIG. 27, 16 bytes of data Q 00 through 03, Q 04 through 07, Q08 through 11, and Q 12 through 15 are cached simultaneously to the data latch circuits in a first cache cycle after a read command RD, and 4 bytes out of the 16 bytes of data, i.e., Q 05 through 08, are transferred to the I/O bus at the rising edge of a clock, and the next 4 bytes of data Q 09 through 12 are transferred to the I/O bus at the trailing edge of the clock.

In order to enable such collective caching of the 16-byte data as shown in FIG. 27, the memory is divided into four memory cell arrays within each of the byte areas 0 through 3 shown in FIG. 24, and the second amplifier and the data latch circuits are provided in each array. Then, in each of the byte areas, the column decoder 222 provides internal decode signals of the respective column addresses CA 0 through 3 to the four memory cell arrays in response to the starting column address CA 1, and then 4 bytes of data are cached to four data latch circuits. Thereafter, 1-byte data of the data latch circuit selected by the data bus switch 228 is transferred to the input/output bus from the four data latch circuits by the data latch select signal S221. In the figure, a core bus corresponds to the input/output bus of the memory cell arrays, and the data of the core bus is cached to the data latch circuits.

It should be noted that the example shown in FIG. 27 is configured without considering an LSB (CA[0]) of an input column address CA, and that data items corresponding to column addresses CA 0 through 3 are always accessed in the case of input column address CA 0 or CA 1. Specifically, column addresses to be paired are fixed regardless of whether the input column addresses are designated as odd numbers or even numbers.

Moreover, in the next clock cycle, the column decoder 222 issues internal decode signals of column addresses CA 4 through 7 to the four memory cell arrays, and further caches 4 bytes of data to the four data latch circuits. Accordingly, 16 bytes of data Q 16 through 31 are latched to the data latch circuits, and selected 4 bytes of data out of the 16 bytes of data, i.e., Q 13 through 16, and 4 bytes of data Q 17 through 20 are outputted at the rising edge and the trailing edge of the clock respectively.

In the write operation, write data is written in a direction opposite to the above-described direction into the memory cell arrays from the input/output terminals DQ via the data latch circuits.

In the case of FIG. 27 as well, the data latch select signal S221 is a control signal consisting of 2 bits in each byte area, i.e., a total of 8 bits. Such data latch select signal is generated by the data latch selector 220 within the column controller 90 in response to a column address CA and start byte signal SB.

Figure 28:
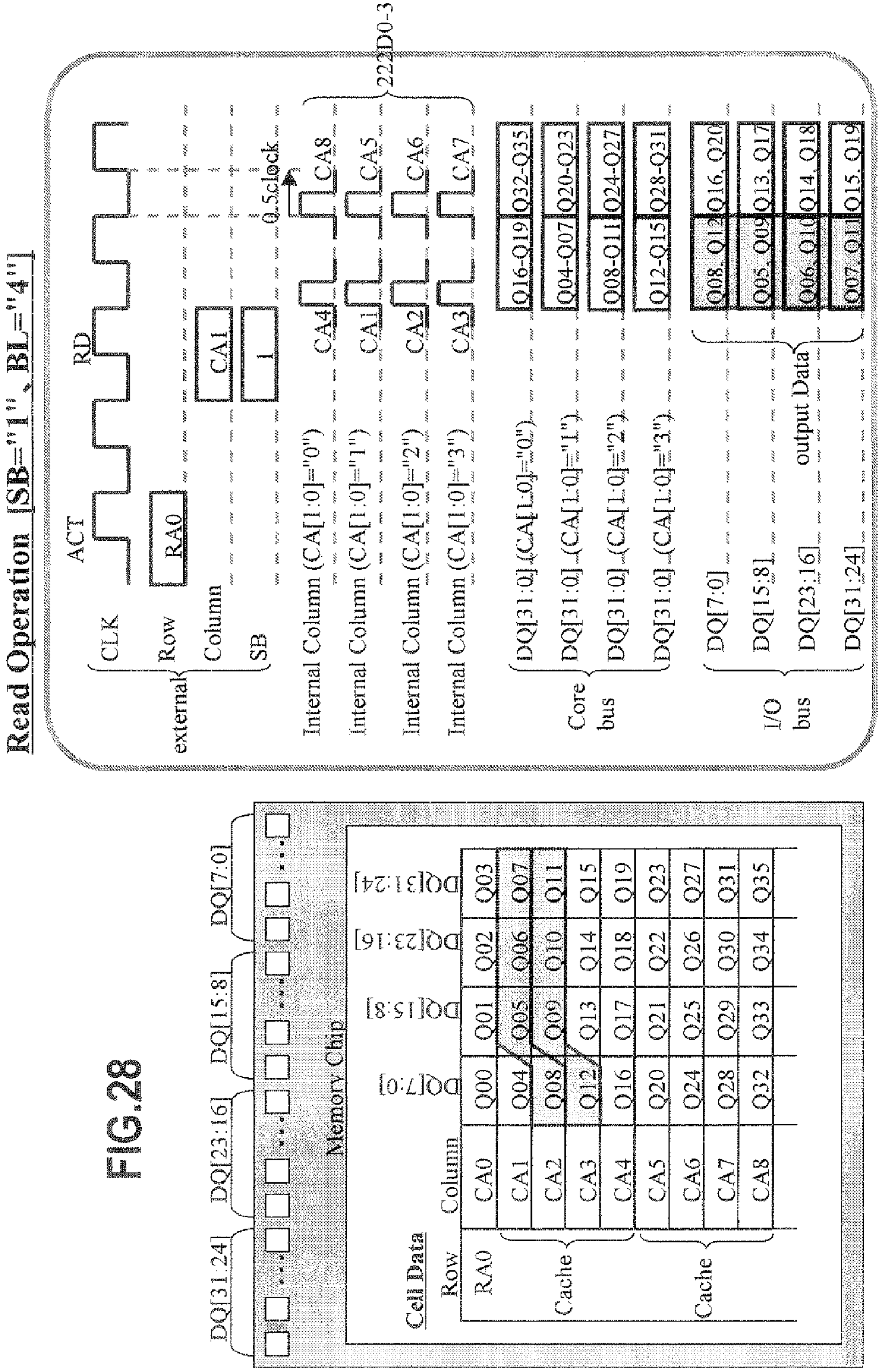
FIG. 28 A figure showing an operation of a modified example (3) of the second example of the image memory having the byte boundary functions.

FIG. 28 shows an operation of a modified example (3) of the second example of the image memory having the byte boundary functions. As with FIG. 27, FIG. 28 is an operation example corresponding to the DDR, and the difference with FIG. 27 is that a combination of column addresses to be accessed simultaneously in a column direction is different in accordance with whether an input-column address CA is designated as an odd number or even number. Specifically, data items that correspond to CAs obtained by incrementing the input column address CA by one, two and three are accessed simultaneously. In other words, in the case of an input column address CA 1, data items of CA 1, CA 2, CA 3 and CA 4 are accessed. Specifically, the column decoder monitors the LSB (CA[0]) of the input column address CA to determine column addresses to be accessed simultaneously.

As shown in FIG. 28, the column decoder generates internal decode signals 222D 0 through 3 of CA 1 through 4 for the input column address CA 1, then 4 bytes of data for each byte area, i.e., a total of 16 bytes of data, are cached to the data latch circuits. Then, internal decode signals 222D 0 through 3 of CA 5 through 8 are generated in the next clock cycle, and 6 bytes of data are cached. Therefore, the 16-byte data to be cached are obtained by shifting 4 bytes in FIG. 27.

Therefore, the read operation and write operation shown in FIG. 28 can be realized in the same memory configuration as the one shown in FIG. 27.

Figure 29:
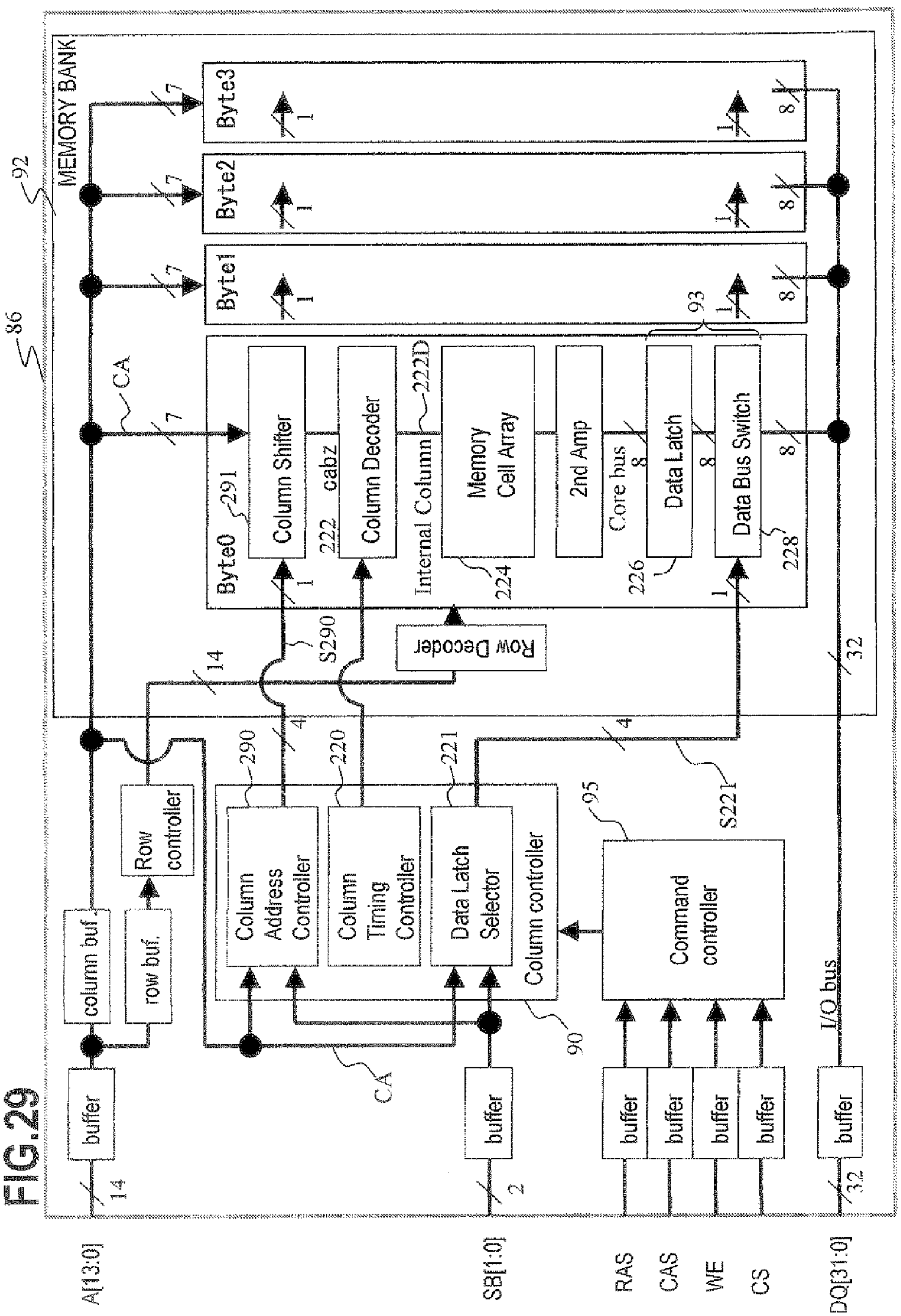
FIG. 29 A figure showing a third example of the image memory having the byte boundary functions.
Figure 30:
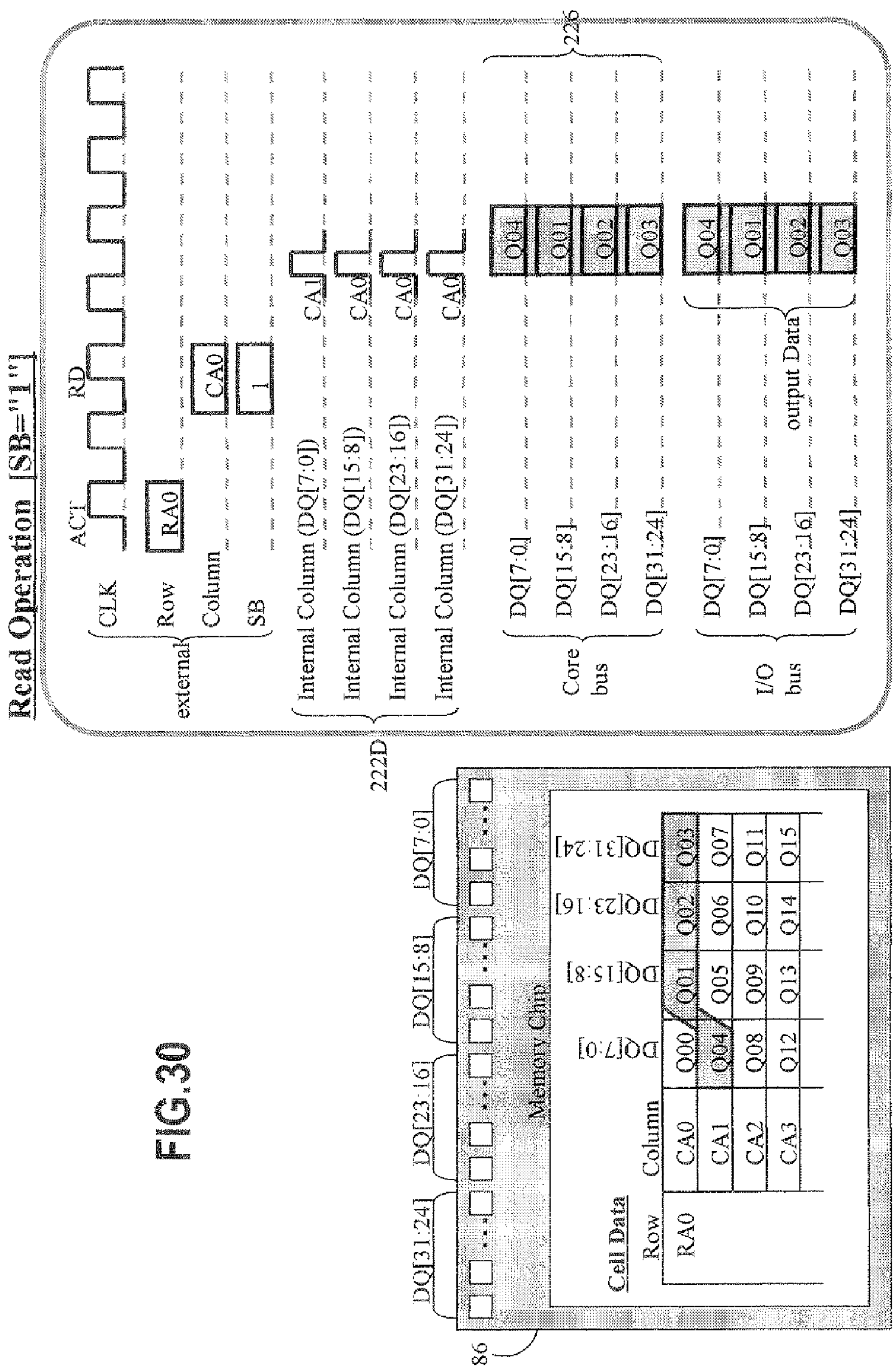
FIG. 30 A figure for explaining the operation shown in FIG. 29.

FIG. 29 shows a third example of the image memory having the byte boundary functions. Also, FIG. 30 is a figure for explaining the operation shown in FIG. 29. In the third example, 4 bytes of data Q 01 through 04 to be inputted/outputted by the byte boundary functions are transferred to/from the input/output bus by accessing each of the byte areas 0 through 3 in one column access. Specifically, unlike the first and second examples described above, in order to access 4 bytes of data corresponding to memory unit areas of adjacent column addresses, 8 bytes of data or 16 bytes of data are not cached from a plurality of memory unit areas of the adjacent column addresses.

As shown in FIG. 29, the column controller 90 has a column address controller 290, and supplies, to a column shifter circuit 291 within each of the byte areas 0 through 3 within the memory bank 92, a shift control signal S290 indicating whether to shift a column address CA by one. Each byte area has the column shifter 291, the column decoder 222 for decoding an output of the column shifter, the memory cell array 224 for inputting/outputting 1 byte of data by means of the internal decoded signal 222D, the second amplifier, the data latch circuit 226, and the data bus switch 228. The column shifter 291 within each byte area outputs a column address to the column decoder 222 by shifting or without shifting the column address CA by one, in response to the shift control signal S290. The data latch circuit 226 is only required to hold only 1 byte of data. Therefore, the data bus switch 228 always selects 1-byte data within the data latch circuit 226 and transfers the data to the I/O bus.

According to FIG. 30 showing the operation, the column address controller 290 performs control so as to shift the column address CA 0 by one to the column shifter 291 of the byte area 0 to generate CA 1 in response to the input column address CA 0 and start byte signal SB, and further performs control so as not to shift the column address CA 0 by one to the column shifters of other byte areas 1 through 3. As a result, in the byte area 0, 1-byte data Q 04 is accessed on the basis of the internal decode signal 222D corresponding to the column address CA 1, and latched to the data latch circuit 226. Also, in the other byte areas 1 through 3, 1-byte data Q 01, Q 02 and Q 03 are accessed respectively on the basis of the internal decode signal 222D corresponding to the column address CA 0, and latched to the data latch circuit 226.

As described above, in the third example shown in FIG. 29 and FIG. 30, the column address has a complex configuration because the column addresses are generated inside the memory associated with the 4-byte data to be accessed, but the cache operation of byte data larger than the 4-byte data can be eliminated. Therefore, the configuration in the input/output unit 93 can be simplified and the power consumption within the memory bank can be reduced.

In the read operation, 1-byte data corresponding to a column address provided from the column decoder 222 in each byte area is outputted to the data latch circuit 226, and then transferred to the input/output terminals DQ via the data bus switch 228. In the write operation, the 4-byte data that is inputted to the input/output terminals DQ is latched to the data latch circuit 226 via the data bus switch 228 in each byte area. Thereafter, the latched data is written to a memory corresponding to the column address from the column decoder 222 in each byte area.

In the case where the memory unit area selected by a column address is constituted by 4 bits, the four byte areas within the bank shown in FIGS. 22 through 31 are configured as 4-bit areas, and a plurality of combinations or one combination of data are accessed from each bit area in a bit unit of 1.

[Control of Relationship with Input/Output Terminals]

Next, there is described an example of control of a relation between the input/output terminals DQ within the image memory and a bus or data latch circuit within the memory cell array.

Figure 31:
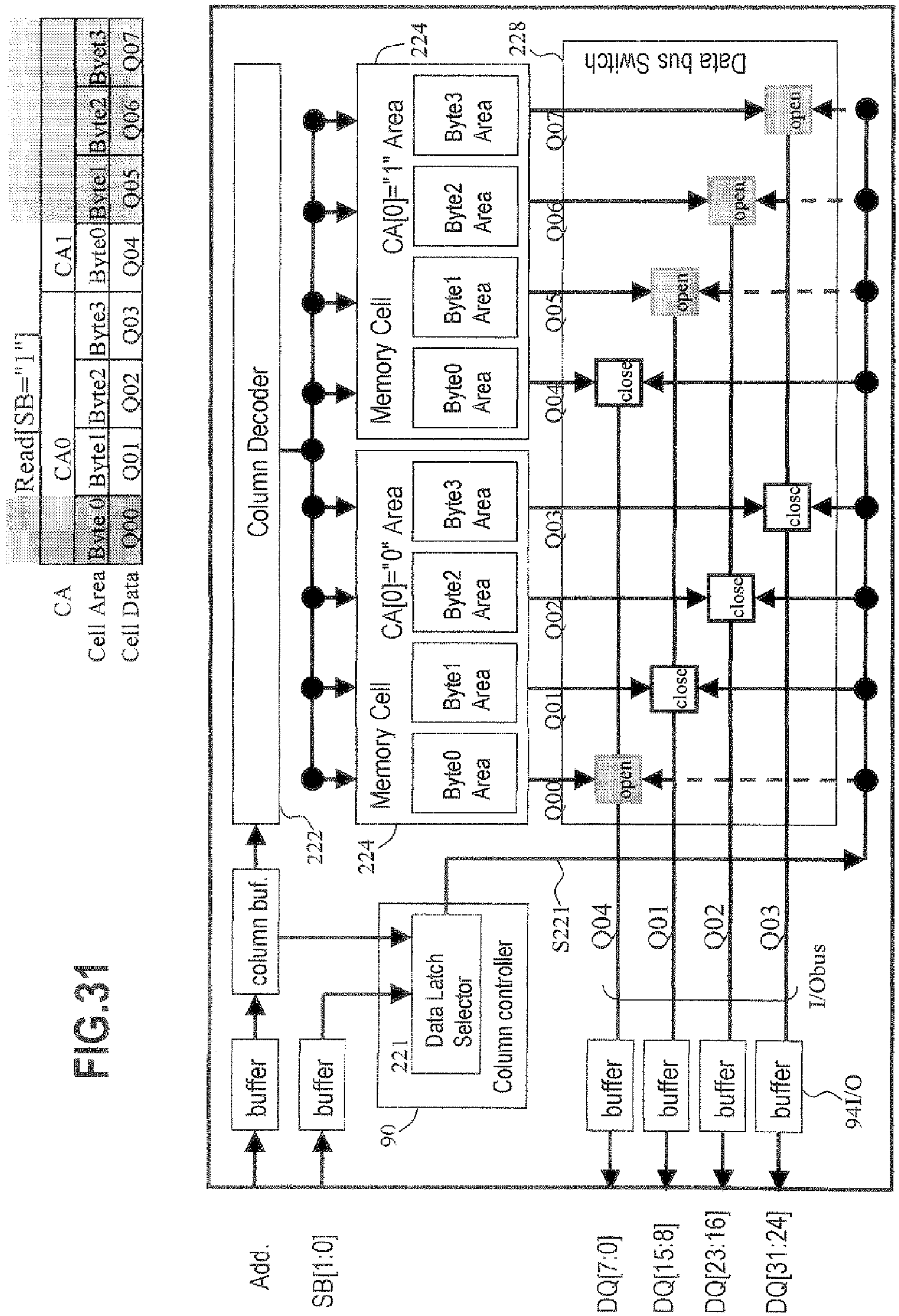
FIG. 31 A figure showing relation means of input/output terminals of the image memory having the byte boundary functions.
Figure 32:
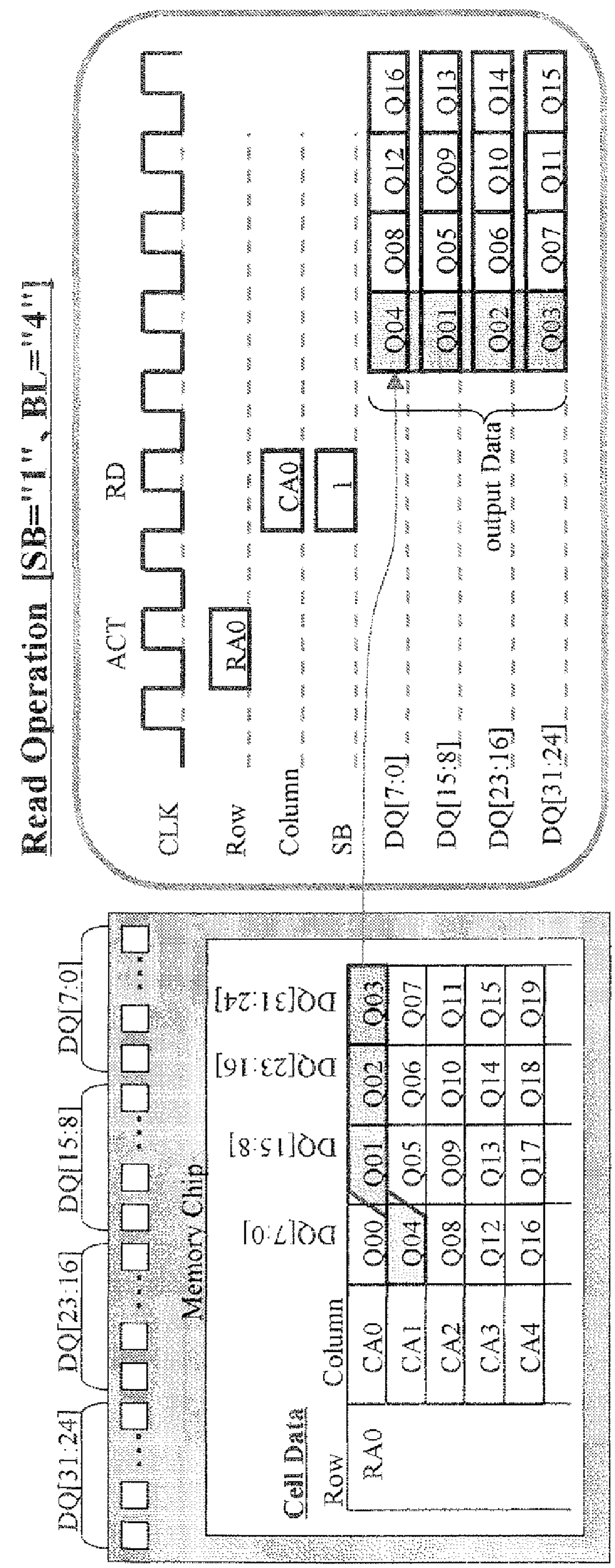
FIG. 32 A figure showing the operation show in FIG. 31.

FIG. 31 shows relation means to the input/output terminals of the image memory having the byte boundary functions. FIG. 32 shows the operation of FIG. 31. In the relation means to the input/output terminals, as shown in FIG. 32, 4 bytes of data corresponding to a column address CA within the memory space are always associated with a group of input/output terminals DQ[7:0] through DQ[31:24], and relationships therebetween are not switched around dynamically. Specifically, each relationship (allocation relation) between the input/output terminal DQ and the bus within the memory (input/output bus of the memory cell array 224) is always fixed without being effected by the start byte signal SB. Therefore, even if the start byte signal SB is different at the time of writing and at the time of reading, the input/output terminals DQ to be inputted at the time of writing are the same as the input/output terminals DQ to be outputted at the time of reading.

FIG. 31 shows a method of connecting the DQ terminals when accessing the 4-byte data extending across a 4-byte area selected by a column address CA. This figure assumes the read operation (SB=1) performed from Byte 1 (Q01) in the 4-byte area of a column address CA 0.

In the case where the input/output terminals DQ are not switched around, data that is stored as the data of Byte 1 is outputted to the DQ terminal corresponding to Byte 1, without depending on the start byte signal SB. Therefore, connections between the memory cell array 224 and input/output buffers 94I/O are always fixedly allocated. Therefore, designation of the start byte signal SB is performed for simply determining which bus of the column address CA in the memory cell array 224 should be connected to the input/output butter 94I/O.

The example shown in FIG. 31 is a configuration example corresponding to the first example shown in FIG. 22 and the second example shown in FIG. 24, wherein each of the byte areas 0 through 3 is allocated to a pair of areas (odd-numbered column address, CA[0]=0, and even-numbered column address, CA[0]=1). Specifically, as with FIG. 24, there exists a memory cell area corresponding two column addresses CA, i.e., odd-numbered column address and even-numbered column address, and this memory cell area is further divided into four byte areas. The byte areas, Byte 0 Area through Byte 3 Area, include the column decoder through data latch circuits. In the case of the read operation, data that is twice as large the data required for one-time access is outputted from the byte areas, and half of the data, i.e., 4-byte data, is connected to the input/output buffer 94I/O at each of a group of switches (eight squares in the figure) of the data bus switch 228.

In this manner, if the input/output terminals DQ are not switched around, the data Q 01 that is outputted from Byte 1 Area of the memory cell is definitely connected to the input/output terminal DQ[15:8] corresponding to Byte 1 of the input/output buffer 94I/O. Therefore, the control of the data bus switch 228 using the byte start signal SB means control of connecting the input/output buffers 94I/O to either one of the data latch circuits of an area corresponding to the two column addresses CA.

The data bus switches 228 within the respective four byte areas 0 through 3 shown in FIG. 24 are collectively shown as the data bus switch 228 of FIG. 31. Therefore, the data bus switch 228 of each byte area is constituted by a pair of switches corresponding to the same input/output terminal DQ within FIG. 31.

Figure 33:
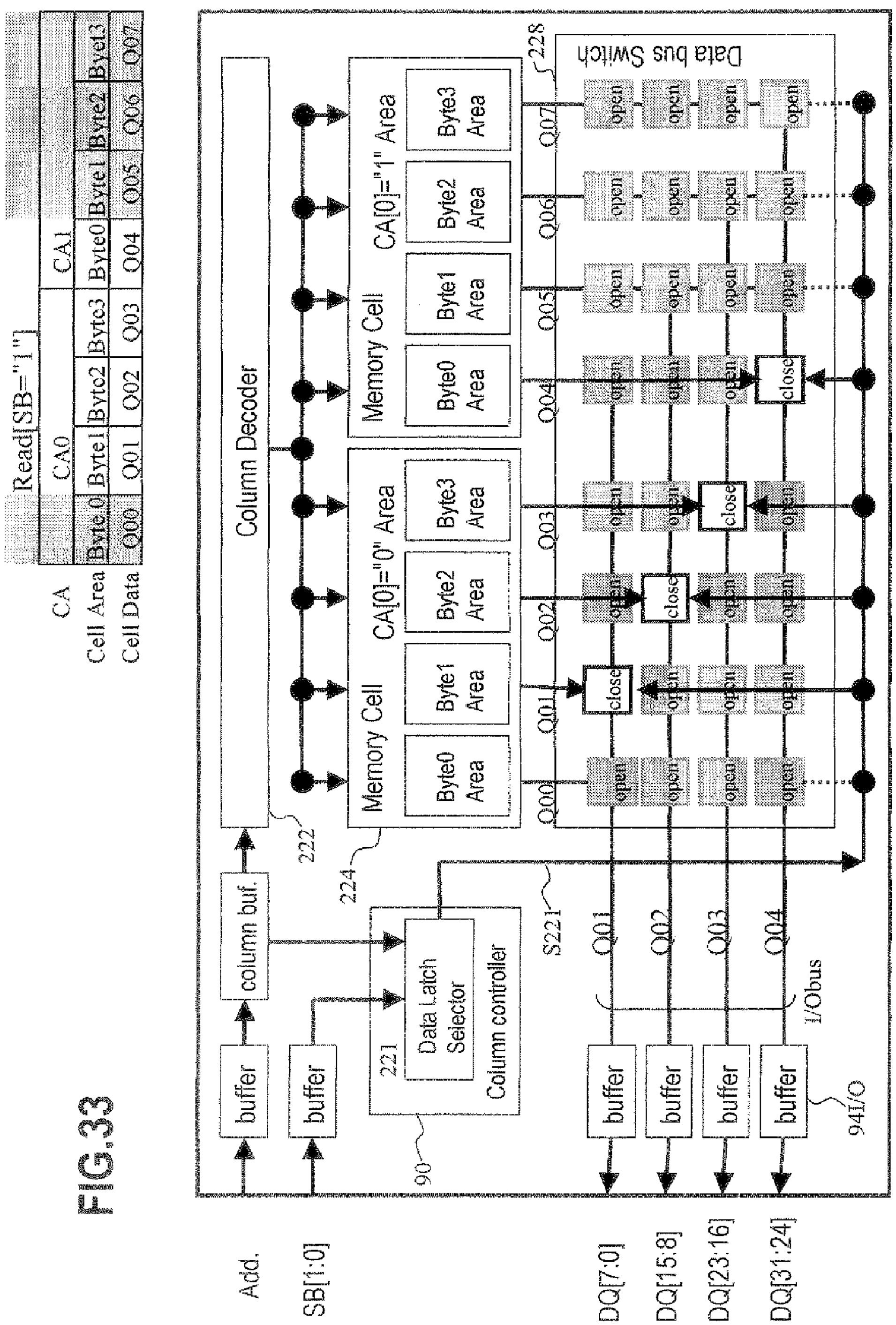
FIG. 33 A figure showing relation means for controlling the input/output terminals of the image memory having the byte boundary functions.
Figure 34:
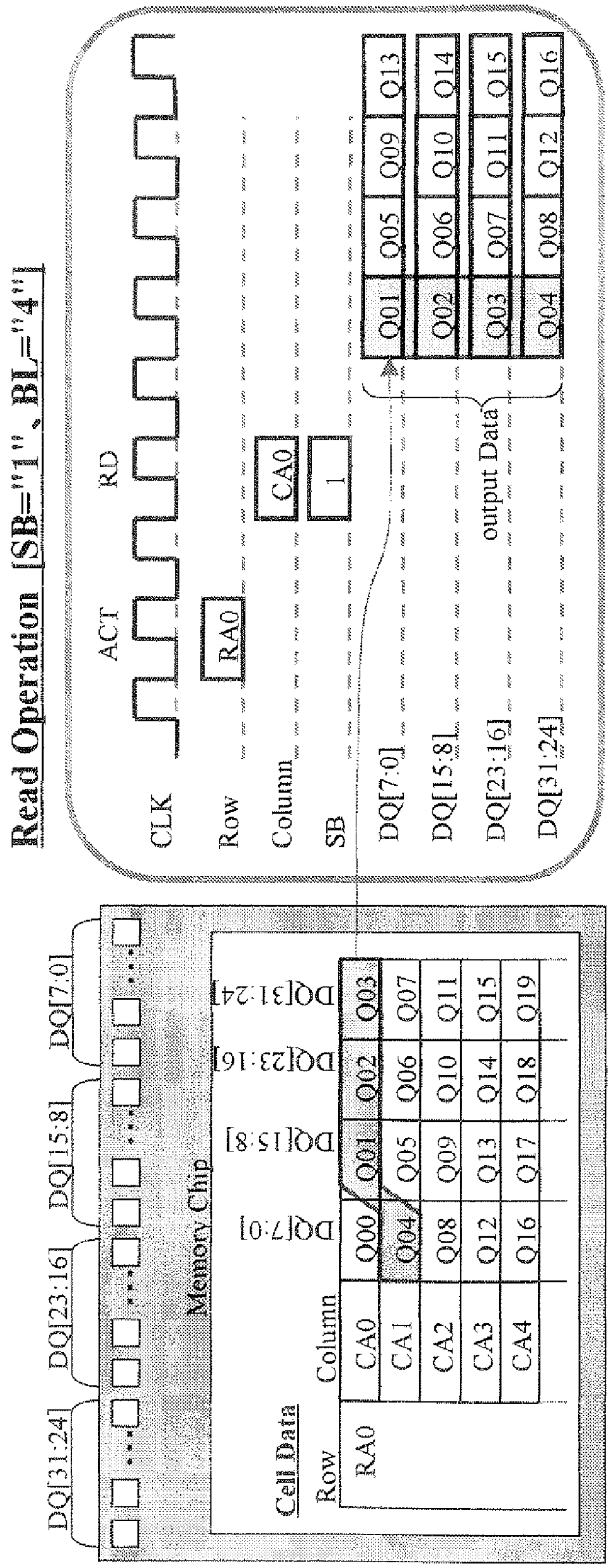
FIG. 34 A figure showing the operation shown in FIG. 33.

FIG. 33 shows relation means to the input/output terminals of the image memory having the byte boundary functions. FIG. 34 shows the operation shown in FIG. 33. In the relation means to the input/output terminals, as shown in FIG. 34, 4 bytes of data corresponding to a column address CA within the memory space are associated sequentially with the group of input/output terminals DQ[7:0] through DQ[31:24], starting from the start byte, according to the start byte signal SB, and a relationship between the memory cell array 224 and each group of input/output terminals DQ is switched around dynamically. Specifically, each relationship (allocation relation) between the input/output terminal DQ and the bus within the memory is influenced by the start byte signal SB and thus changed. Therefore, if the start byte signal SB is different at the time of writing and at the time of reading, the input/output terminals DQ to be inputted at the time of writing are different from the input/output terminals DQ to be outputted at the time of reading.

As is clear from FIG. 34, in the case where the start byte SB=1, the data items Q 01 through 04 within the memory are associated with the input/output terminal groups DQ[7:0]

through DQ[31:24]. Specifically, the relation between the bus or data latch circuit within the memory cell array and the input/output terminal group is configured such that the starting byte data is associated with the input/output terminal DQ[7:0] and the remaining 3-byte data is associated with the remaining input/output terminals DQ sequentially according to the start byte signal SB. Therefore, the data bus switch 228 shown in FIG. 33 is provide with a group of input/output buses I/O bus, the buses or data latch circuits of the memory cell array 224, and switched at all intersecting positions. The group of these switches are subjected to ON/OFF control by the data latch selector 221 using the data latch select signal S221, whereby the above-described dynamic association can be realized.

In this manner, the input/output terminals DQ are switched around with respect to the busses or data latch circuits within the memory cell array according to the start byte signal SB. Specifically, the byte data Q 01 that is outputted from the byte area Byte 1 within the memory cell array is connected to the DQ[7:0] corresponding to Byte 0 of the input/output buffer 94I/O when SB="1", and is also connected to DQ[15:8] if SB="0". The byte data Q05 of the byte area Byte 1 is connected to DQ[23:16] when SB="3", and is also connected to DQ[31:24] when SB="2". Specifically, the positions of the four switches in the closed state as shown in FIG. 33 are shifted to the right according to the start byte signal SB.

Next, control of a relation between the big endian and little endian is described with reference to the control of the relation with the input/output terminals.

Figure 35:
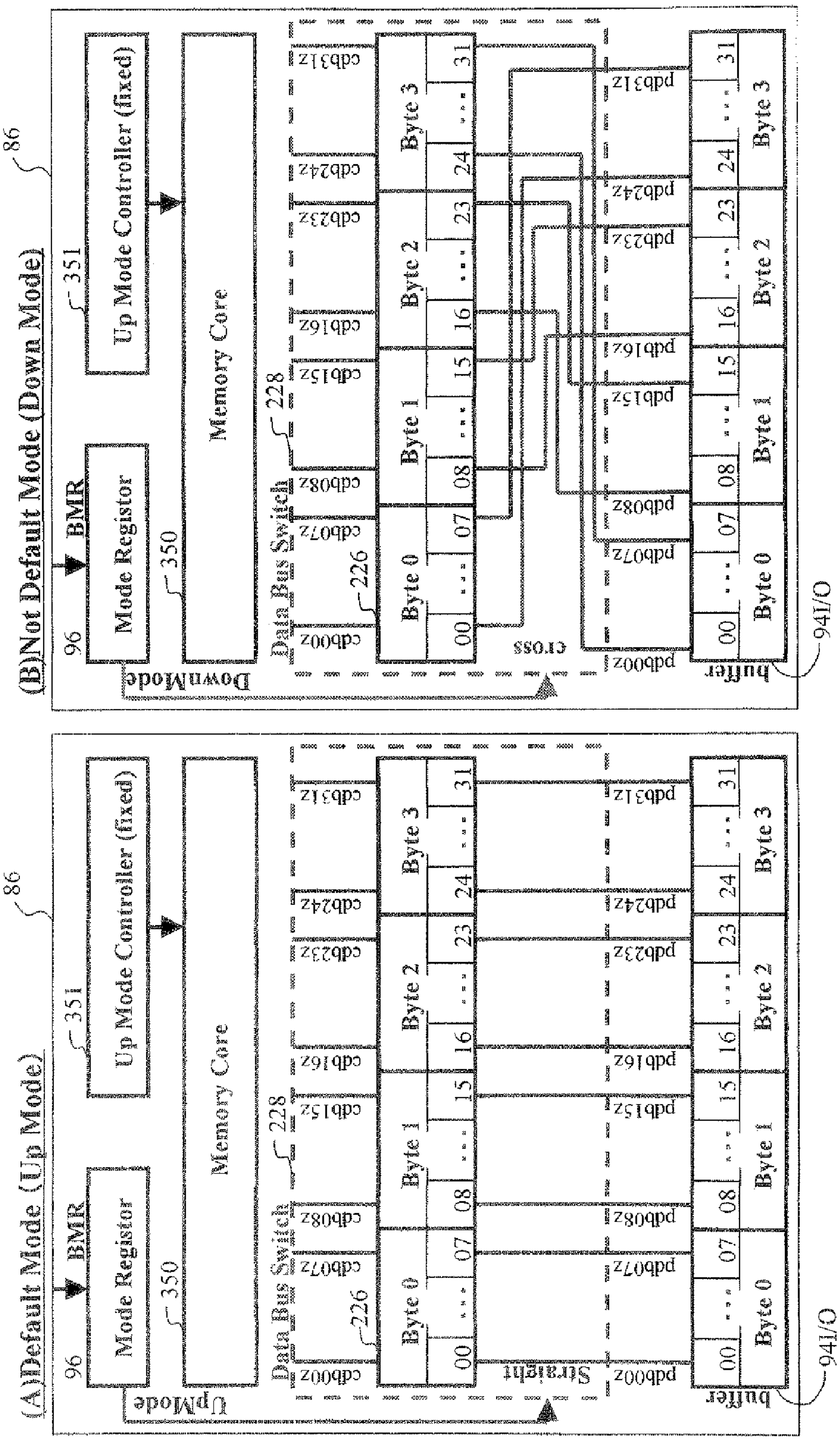
FIG. 35 A configuration diagram (1) of the image memory having the byte boundary functions and capable of responding to the endians.

FIG. 35 is a configuration diagram (1) of the image memory having the byte boundary functions and capable of corresponding to the endians. In this example, as with the image memory described with reference to FIG. 19 and FIG. 20, the configuration within a memory core 350 corresponds to the big endian (up mode) only. Specifically, only a function of accessing 4 bytes of data in the up mode from byte positions corresponding to the start byte signal SB in byte boundary operation is described. Even in this case, the group of switches of the data bus switch 228 are controlled, whereby the image system for the big endian and the image system for the little endian both can realize input and output of proper data.

In the figure, the mode register 96 is provided with the second information BMR as the byte combination information indicating the up mode or down mode, and the mode is set to either one of the modes. However, the memory core 350 having the column decoder, memory cell array, and second amplifier that are shown in FIG. 29 and the like respond to up mode control only. Specifically, a column control circuit has an up mode controller 351 only and does not have a down mode controller.

FIG. 35(A) shows the data bus switch 228 for the up mode. Specifically, in the case of the up mode, which is the big endian, the memory core 350 is controlled to be the up mode by the up mode controller 351. Therefore, the data bus switch 228 connects the 4 bytes of data of the data latch circuit 226, i.e., Byte 0 through 3, to the input/output buffers 94I/O directly. Specifically, core data buses cdb00*z* through cdb31*z* of the memory core 350 are connected directly to I/O data bus pdb00*z* through pdb31*z*.

On the other hand, FIG. 35(B) shows the data bus switch 228 in the case of the down mode. Specifically, in the case of the down mode, which is the little endian, the memory core 350 is controlled to be the up mode by the up mode controller 351, but the data bus switch 228 associates 4 bytes of data of the data latch circuit 226, i.e., Bytes 0, 1, 2 and 3, to 4 bytes of data of the input/output buffers 94I/O, i.e., Bytes 3, 2, 1 and 0. In this case, a core bus cdbxxz and an I/O bus pdbxxz are interchanged in units of bytes.

In the example in FIG. 35(B) showing the data bus switch 228, the same means as the switching means 190 of the input/output terminals shown in FIGS. 19 and 20 is provided within the image memory 86. In this manner, the memory core is configured so as to be able to respond to either the big endian or little endian, and the above-described data bus switch 228 is provided to interchange the switches thereof in accordance with the down mode or the up mode, whereby the image memory can respond to both endians.

Figure 36:
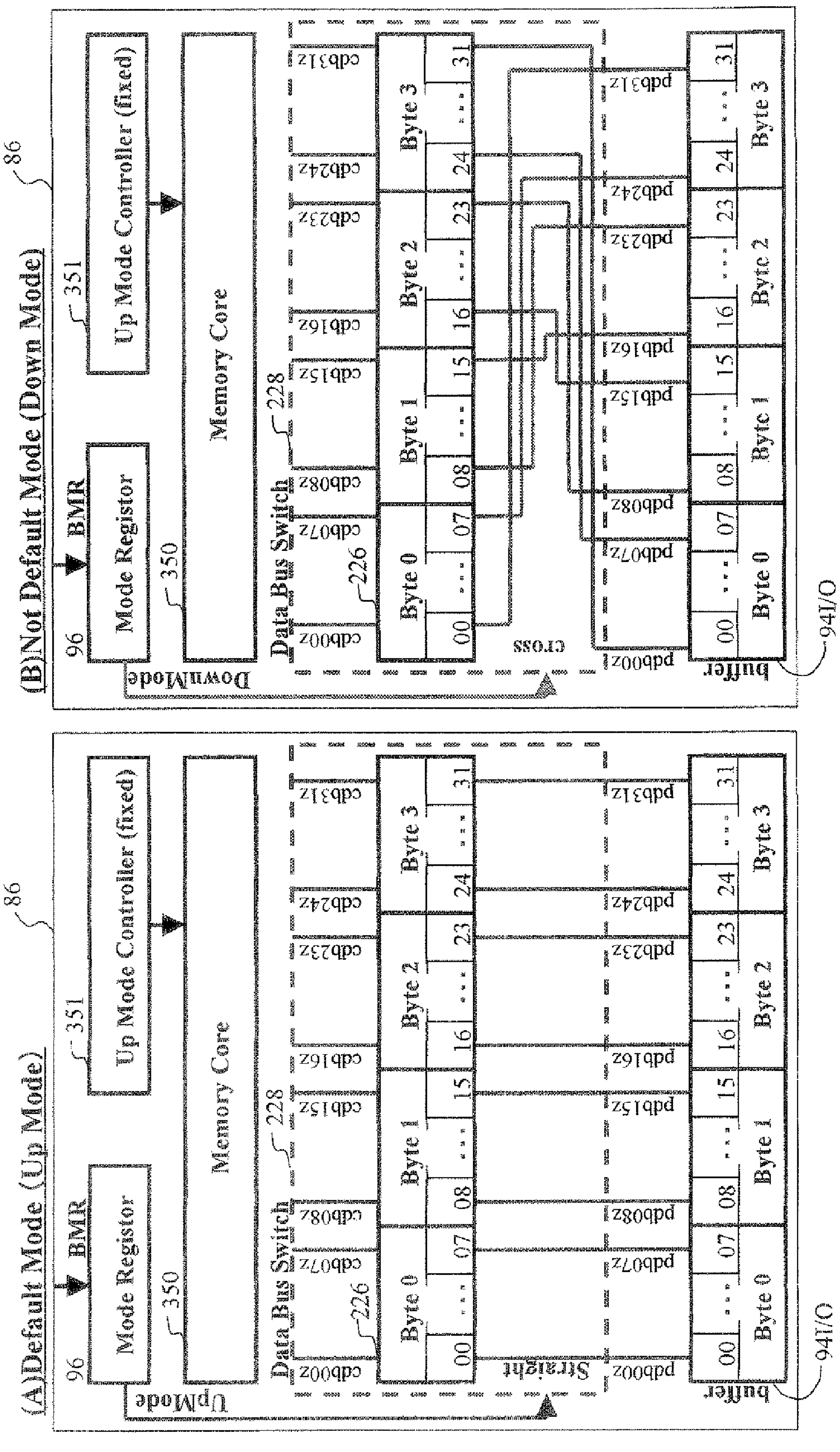
FIG. 36 A configuration diagram (2) of the image memory having the byte boundary functions and capable of responding to the endians.

FIG. 36 is a configuration diagram (2) of the image memory having the byte boundary functions and capable of corresponding to the endians. As with FIG. 35, this image memory has a memory core configuration capable of corresponding to the up mode control only, and the data bus switch 228 is switched in accordance with the second information BMR=UP/DOWN that is set in the mode register 96, whereby the image memory can respond to both modes. The difference with FIG. 35 is that switching of data performed by the data bus switch 228 is carried out so that MSB (DQ 31) and LSB (DQ 00) are interchanged. Specifically, in addition to 4 bytes, 8 bits of data in each byte are also changed.

Figure 37:
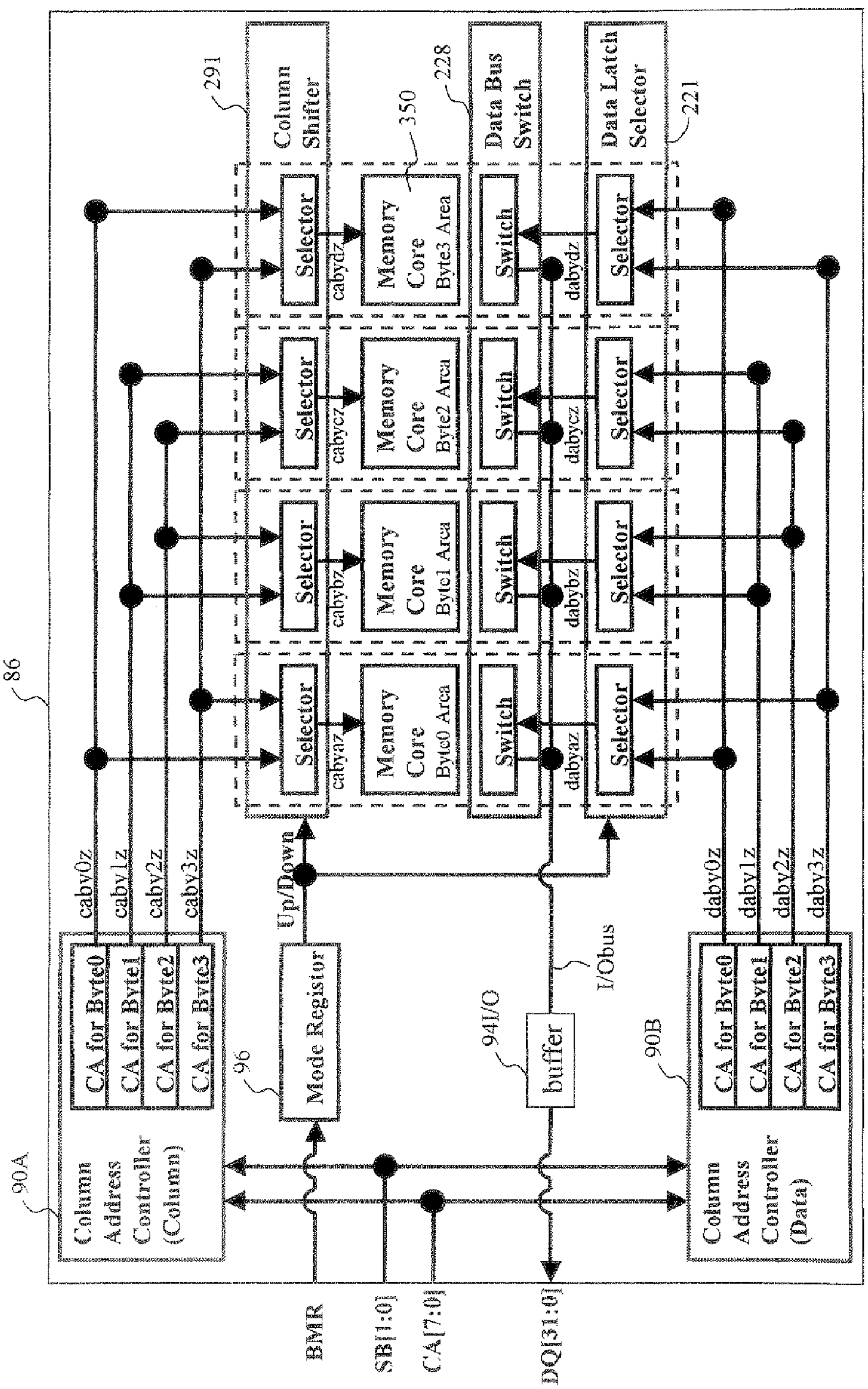
FIG. 37 A configuration diagram (3) of the image memory having the byte boundary functions and capable of responding to the endians.

FIG. 37 is a configuration diagram (3) of the image memory having the byte boundary functions and capable of corresponding to the endians. This image memory corresponds to the image memory shown in FIG. 29, wherein a combination of column addresses of respective four byte areas within the respective memory cores 350 is controlled to be changed in response to the operation mode, and 4 bytes of data extending in the up direction or down direction from the byte corresponding to the start byte signal SB are inputted/outputted from the four memory arrays.

For example, when the column address CA 0 and start byte SB=1 as shown in FIG. 30, the internal column addresses of the four byte areas Byte 0 through 3 become CA 1, CA 0, CA 0 and CA 0 respectively in the case of the up mode, and data items Q 04, Q 01, Q 02 and Q 03 are inputted/outputted from 4 bytes of input/output terminals DQ. In the case of the down mode, on the other hand, the column addresses become CA 0, CA 0, CA 1 and CA 1 respectively, and data items Q 00, Q 01, Q 06 and Q 07 are inputted/outputted from 4 bytes of input/output terminals DQ.

In this manner, the column address to be provided to the four byte areas Byte 0 through 3 within the respective memory cores are switched around by the column shifter 291 in accordance with the up mode or down mode. Then, a combination of column addresses, which is uniquely determined by the start byte signal SB and the mode signal BMR, is supplied to each byte area of each memory core 350 via the column shifter 291. This column shifter 291 selects one of the two column addresses required to be switched around, in accordance with the up mode/down mode Up/Down, the two column addresses being selected from four column addresses caby0*z* through caby3*z* from a column address controller 90A. Specifically, in the byte area Byte 0, either cabyoz or caby3*z* is selected. In the byte area Byte 1, either caby1*z* or caby2*z* is selected. In the byte area Byte 2, either caby1*z* or caby2*z* is selected. Also, in the byte area Byte 3, either caby0*z* or caby3*z* is selected.

In the case of a single data rate (SDR), 4 bytes of data is only able to be accessed at one access, thus, as described with reference to FIG. 29, 1-byte data that is held in the data latch circuit corresponding to each byte area may be transferred directly to the input/output bus.

In the case of a double data rate (DDR), on the other hand, 4 bytes of 8-byte data need to be inputted/outputted at one access. Therefore, in the configuration shown in FIG. 29, each of the byte areas Byte 0 through 3 is provided with a block of even column addresses (CA[0]=0) and a block of odd column addresses (CA[0]=1), then a combination of column address, which is uniquely determined by the start byte signal SB and the mode signal BMR, is supplied from the column shifter 291 to the pair of blocks, and required 4 bytes of data are selected by the data bus switch 228 and transferred to the input/output bus I/O bus. In this case, each switch within the data bus switch 228 selects the data of the even block or odd block in response to control signals dabyaz through dabydz sent from the data latch selector 221, and transfers the selected data to the input/output bus I/O bus. For this reason, column addresses daby0*z* through daby3*z* for the data bus are supplied from a column address controller 90B to the data latch selector 221, and the data latch selector 221 selects, or the four byte areas, one of two byte required to be switched in accordance with the up mode/down mode Up/Down. The combination of candidates for switching is same as the column shifter 291 described above.

As shown in FIG. 37, by controlling the combination of column addresses, the number of switches within the data bus switch 228 can be reduced. Specifically, in the data bus switch shown in FIGS. 35 and 36, 2N*8 switches are required when the number of input/output terminals DQ is N bytes. However, by controlling the combination of column addresses, as shown in FIG. 37, 2N number of switches are required in the column shifter 291 and in the data bus switch 228, respectively thus a total of 4N number of switches are required. Therefore, the number of switches can be reduced to ¼ from the number of switches shown in FIGS. 35 and 36.

Figure 38:
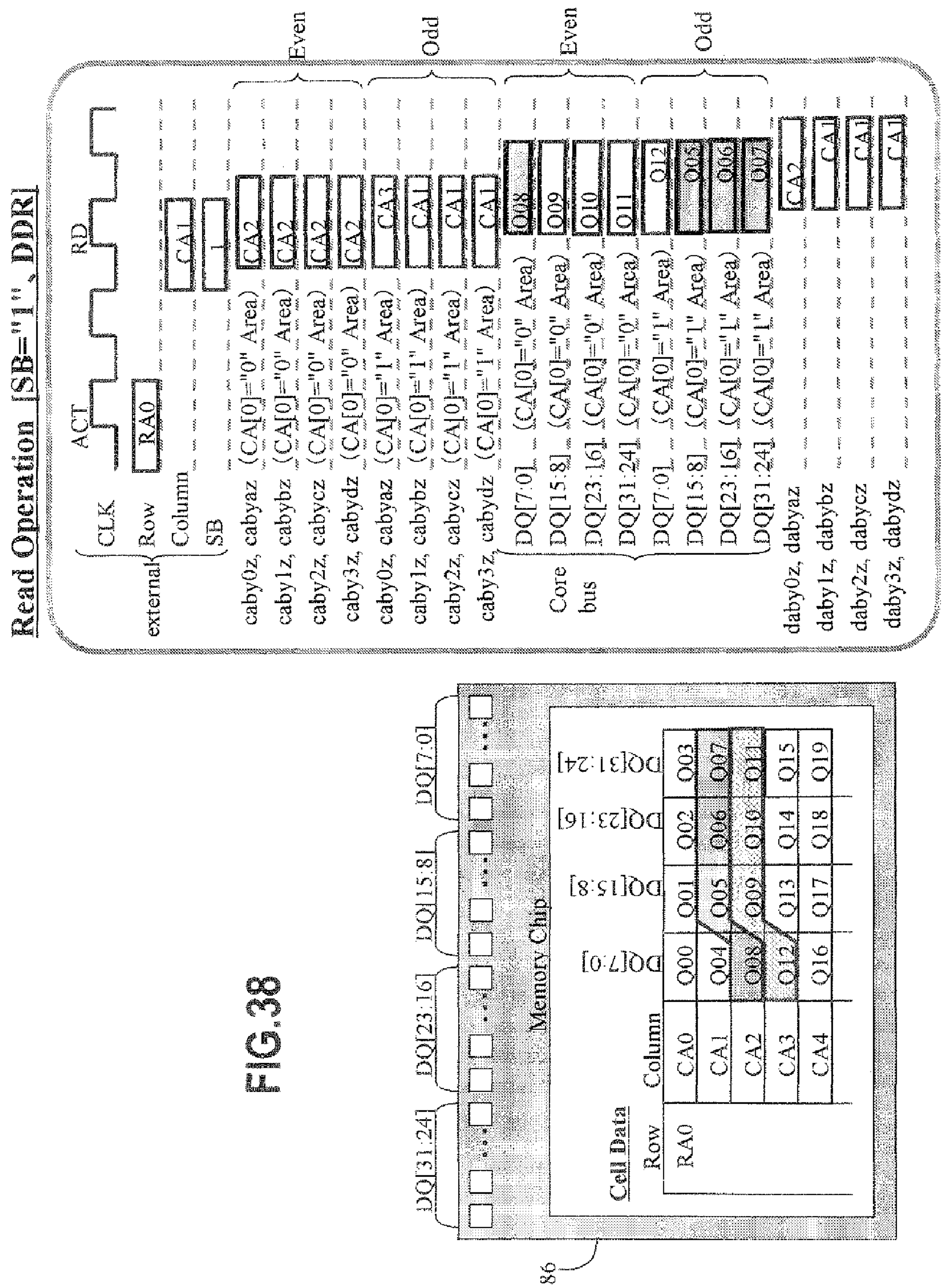
FIG. 38 An operation timing chart of the up mode of a DDR memory shown in FIG. 37.

FIG. 38 is an operation timing chart of the up mode of the DDR memory shown in FIG. 37. In this example, the column address is CA1 and the start byte signal SB is 1, and the data items DQ 05 through 08 stored in the memory 86 in the big endian are read out. Specifically, the relationships between the data items Q 00 through 19 and the input/output terminals DQ corresponding to the column addresses within the memory 86 are as shown in the figure.

As described above, in the case of the DDR memory, each byte area within the memory cell array has the block of even column addresses (CA[0]=0) and a block of odd column addresses (CA[0]=1), then a controlled combination of column addresses caby is supplied to these blocks, and a controlled combination of column addresses for switching the data buses, daby, is supplied to the data bus switch 228.

Specifically, CA 1 is inputted as a base column address CA. Along with this input, the column addresses CA that are supplied to the even block (CA[0]="0") and odd block (CA[0]="1") within each of the byte areas Byte 0 through 3 are controlled. A column line of the column address CA 2 is activated in the area of the even block (CA[0]="0"). A column line of the column address CA 3 is activated in the byte area Byte 0, and column lines of the column addresses CA 1 are activated in the byte areas Bytes 1, 2 and 3 in the area of the odd block (CA[0]="1").

As a result, the data items Q 05 through 12 are outputted to the core buses of the memory cores. Specifically, the data items Q 08 through 11 are outputted to the core buses of the even block, and the data items Q 5 through 7 and also Q 12 are outputted to the core buses of the odd block.

In the DDR memory, it is necessary to transfer 4 bytes of data from this 8-byte data to the I/O bus. Here, on the basis of the start byte signal SB and the column address CA, the data bus switch selects the data of the even block (CA[0]="0") in the byte area Byte 0 only. As a result, the data items Q 05 through 08 can be outputted to the input/output terminals DQ.

Here, in each of even block area and odd block area (CA[0]="0"/"1"), the internal column address cabyaz selects caby0*z*, an internal column address cabybz selects caby1*z*, cabycz selects caby2*z*, and cabydz selects caby3*z*. Similarly, in each of even block area and odd block area (CA[0]="0"/"1"), the column address for data bus, dabyaz, selects daby0*z*. Similarly, dabybz selects daby1*z*, dabycz selects daby2*z*, and dabydz selects daby3*z*.

Figure 39:
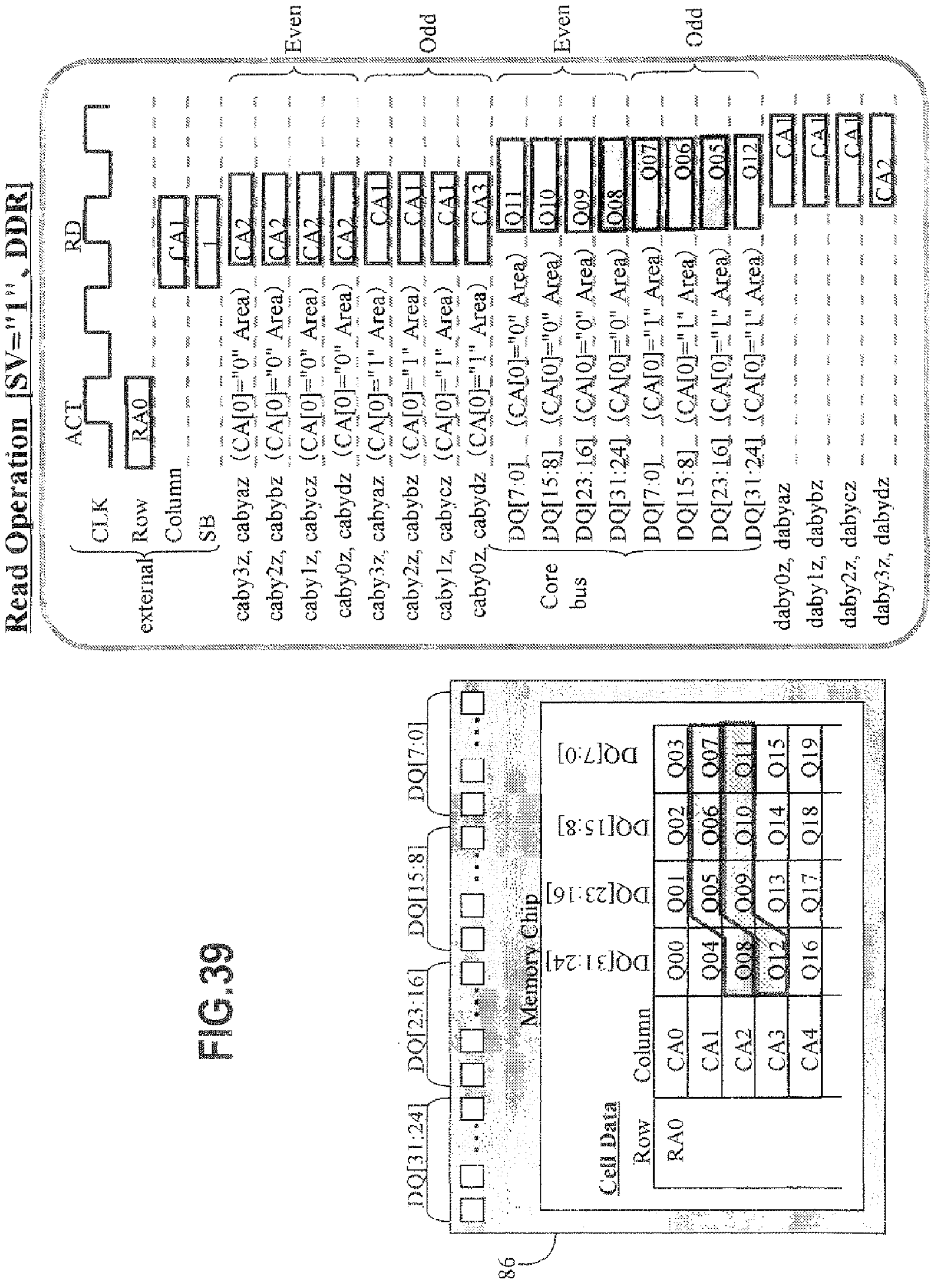
FIG. 39 An operation timing chart of the down mode of the DDR memory shown in FIG. 37.

FIG. 39 is an operation timing chart of the down mode of the DDR memory shown in FIG. 37. In this example, the column address is CA1 and the start byte signal SB is 2, and the data items DQ 05 through 08 stored in the memory 86 in the little endian are read out. Specifically, the relationships between the data items Q 00 through 19 and the input/output terminals DQ corresponding to the column addresses within the memory 86 are as shown in the figure. The difference with FIG. 38 is that the relationships between 4 bytes of data and the input/output terminals DQ are opposite to those shown in FIG. 38.

In this case, CA 1 is inputted as the base column address CA. Along with this input, the column addresses CA that are supplied to the even block (CA[0]="0") and odd block (CA[0]="1") within each of the byte areas Byte 0 through 3 are controlled. A column line of the column address CA 2 is activated in the even block (CA[0]="0"). A column line of the column address CA 3 is activated in the byte area Byte 3, and column lines of the column addresses CA 1 are activated in the byte areas Bytes 2, 1 and 0 in the odd block (CA[0]="1").

As a result, the data items Q 05 through 12 are outputted to the core buses of the memory cores. Specifically, the data items Q 08 through 11 are outputted to the core buses of the even block, and the data items Q 5 through 7 and also Q 12 are outputted to the core buses of the odd block.

In the DDR memory, it is necessary to transfer 4 bytes of data from this 8-byte data to the I/O bus. Here, on the basis of the start byte signal SB and the column address CA, the data bus switch selects the data Q 08 of the even block (CA[0]="0") in the byte area Byte 3 only, and selects the data items Q 05 through 07 from the odd block for the rest of the byte areas. Accordingly, 4 bytes of data items Q 05 through 08 can be outputted to the input/output terminals DQ.

Here, in each of even block area and odd block area (CA[0]="0"/"1"), the internal column address cabyaz selects caby3*z*, an internal column address cabybz selects caby2*z*, cabycz selects caby1*z*, and cabydz selects cabyoz. Similarly, in each of even block area and odd block area (CA[0]="0"/"1"), the column address for data bus, dabyaz selects daby3*z*. Similarly, dabybz selects daby2*z*, dabycz selects daby1*z*, and dabydz selects daby0*z*.

As described above, when comparing the down mode shown in FIG. 39 with the up mode shown in FIG. 38, cabyz and dabyz are switched between the byte areas Byte 0 and Byte 3 and between the byte areas Byte 1 and Byte 2, whereby the mode can correspond to the arrangement of byte data items in two types of endians, the big endian and little endian.

Figure 40:
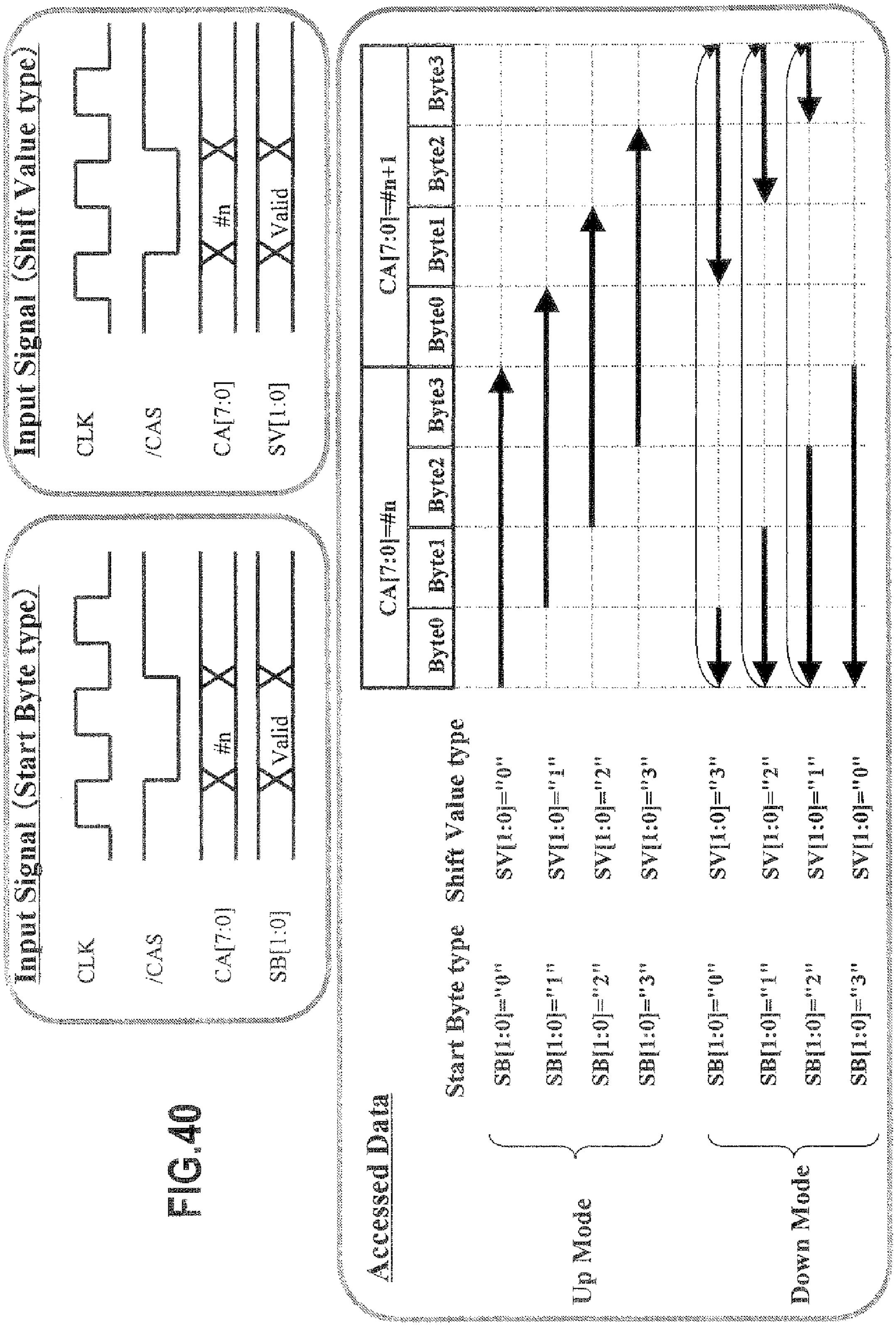
FIG. 40 A figure for explaining a method of designating a boundary of the byte boundary functions.

FIG. 40 is a figure for explaining a method of designating a boundary of the byte boundary functions. In the figure, in the byte boundary function where an access is made across the boundaries of adjacent four byte areas of the column address CA[7:0]=#n and #n+1, a case in which the boundary designation method is performed based on the start byte SB and a case where the boundary designation method is performed based on a shift value SV are considered. The start byte SB=N means that an access is made across 4 bytes from a byte N, and the shift value SV=N means that an access is made across 4 bytes from a position shifted by N bytes from a border of 4-byte areas of column address.

In this case, the relationship between the start byte SB and the shift value SV changes in the up mode and the down mode in accordance with the two modes of the endian. Specifically, in the case of the up mode, since the byte data items are arranged in the manner of Byte 0 through 3, SB and SV are the same. However, in the case of the down mode, the byte data items are arranged in the manner of Byte 3 through 0, thus SB and SV are different and in an opposite relationship.

Therefore, in the case where the image memory has a start byte signal SB terminal only and the internal structure is controlled in accordance with the shift value SV, it is necessary to non-invert or invert the start byte signal SB so as to obtain the shift value SV depending on whether the mode is the up mode or down mode. The same is true for the case where the image memory has a shift value SV terminal only and the internal structure is controlled in accordance with the start byte SB.

Figure 41:
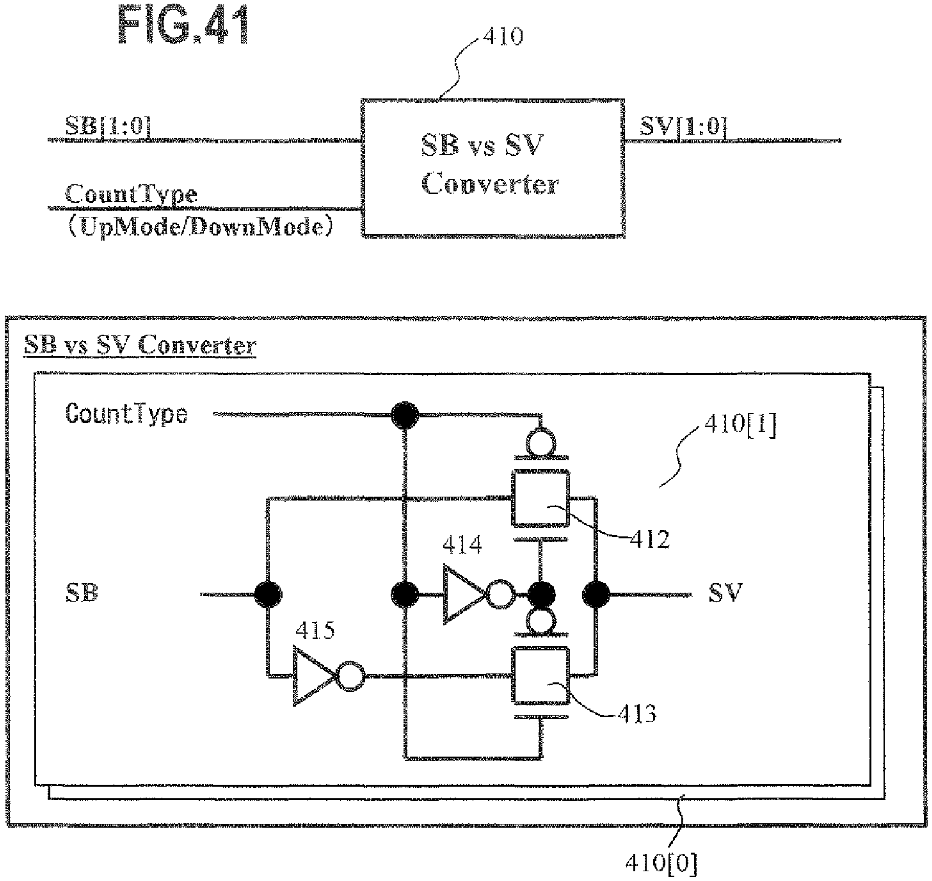
FIG. 41 A figure for showing a conversion circuit of a start byte SB and a shift value SV.

FIG. 41 shows a conversion circuit of the start byte SB and the shift value SV. A conversion circuit 410 consists of 2 bits 410[0], 410 [1], and is constituted by CMOS transfer gates 412 and 413, and inverters 414 and 415. An input start byte SB is non-inverted or inverted so as to obtain the shift value SV according to a count-type signal indicating the up mode or the down mode. As shown in a truth table 411 of the conversion circuit 410, the SB is not inverted to becomes SV in the case of the up mode, but SB is inverted to becomes SV in the case of the down mode.

[Column Address Control in Rectangular Access]

As shown in FIG. 1, in the memory mapping 12 and 14E for associating the memory space of the image memory with the pixels of the image, within the page area 14 selected by a bank address BA and a row address RA, the mapping is performed so as to wrap a memory unit area (4-byte area) selected by the column address CA at a predetermined wrap width (CA Wrap), in accordance with the arrangement of the matrix of pixels in the image. In the example shown in FIG. 1, the column address CA is wrapped in units of 4 within the page area 14. That is, the wrap width CA Wrap of the column address is 4. This wrap width of the column address is also called "step" of the column address.

By this mapping of wrapping the memory unit area selected by the column address at a predetermined wrap width, efficiency of a rectangular access that is made frequently in the image memory can be improved. Specifically, while a page area is subjected to active operation by an active command, a read command and a write command are repeatedly issued in accordance with a rectangular area to be accessed, whereby an access can be made to the rectangular area within the same page area. Since an access can be made to the rectangular area within the same page area by performing the active operation once, an efficient access can be made.

As shown in FIG. 16, in such rectangular access, it is necessary to repeatedly issue the read command RD, bank address BA, column address CA, and start byte signal SB. However, if the mapping information of the memory, or particularly the wrap width (CA Wrap) of the column address CA of the page area is already known, the starting column address CA of the rectangular area, rectangular width and the rectangle size can be provided so that the image memory can internally and automatically issue the column address to be accessed, whereby the image data of the rectangular area can be accessed. In this case, the read command and the column address may be issued once, thus it is not necessary to issue them a number of times as in FIG. 16.

Figure 42:
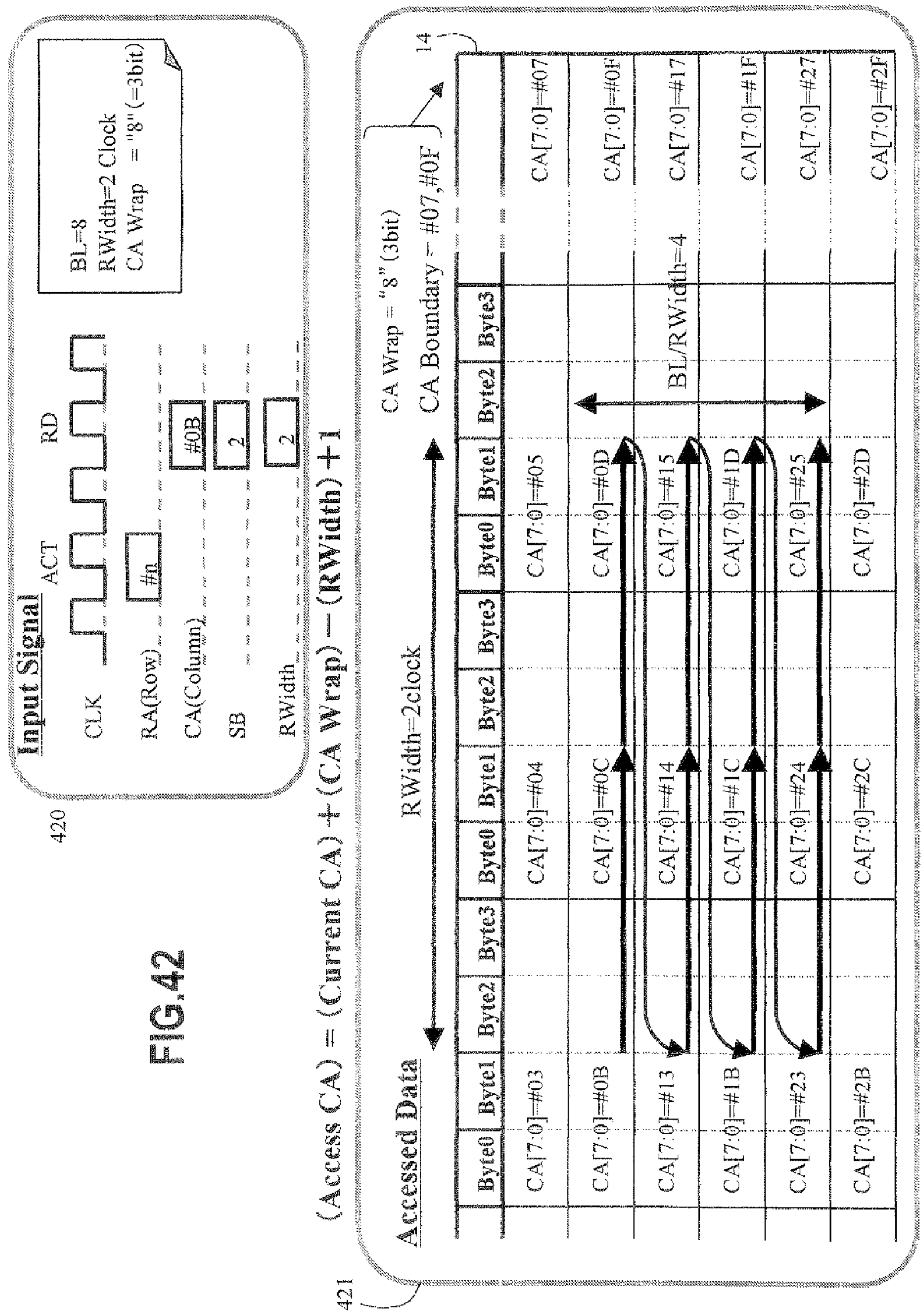
FIG. 42 A figure for explaining an automatic rectangular access using the byte boundary functions.

FIG. 42 is a figure for explaining an automatic rectangular access using the byte boundary functions. In this example, data areas to be accessed are shown by arrows in a memory mapping 421. In this memory mapping, column addresses CA are wrapped at 8 within a page area 14. Thus, the column address wrap width CAWrap is 8. Therefore, column addresses CA on a right end of the page area 14 are #07, #0F, #17 and #1F (Hexadecimal), and the wrap width CAWrap is 8. Also, the starting address CA of the rectangular area to be accessed is CA=#B, the start byte SB=2, the width of the rectangular area Rwidth=2 clocks (4 bytes×2 clocks=8 bytes), and the size of the rectangular area is burst length BL=8 (4×8=32). Therefore, the height of the rectangular area is BL/Rwidth=4.

Figure 43:
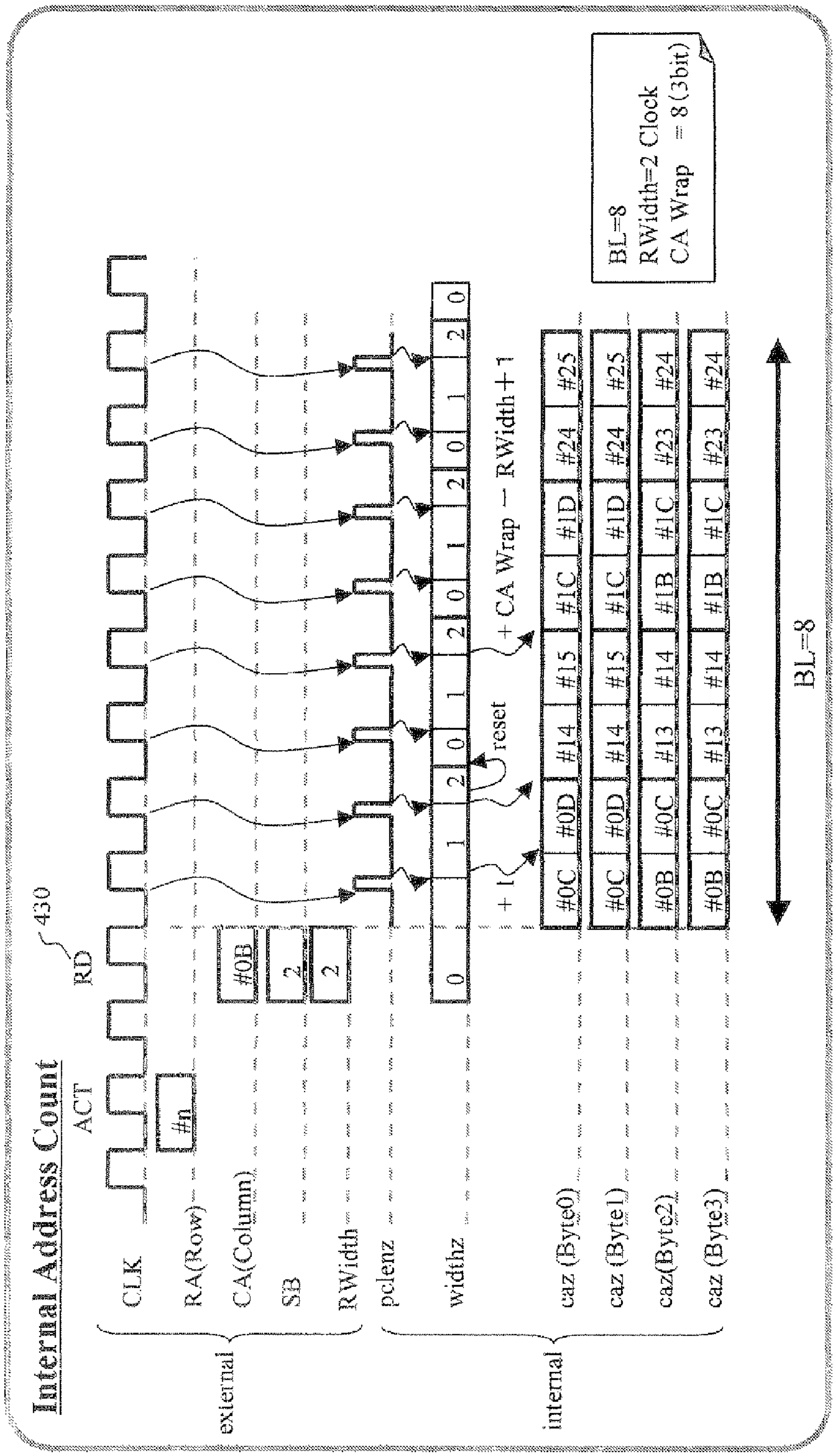
FIG. 43 A timing chart of an automatic rectangular access.
Figure 44:
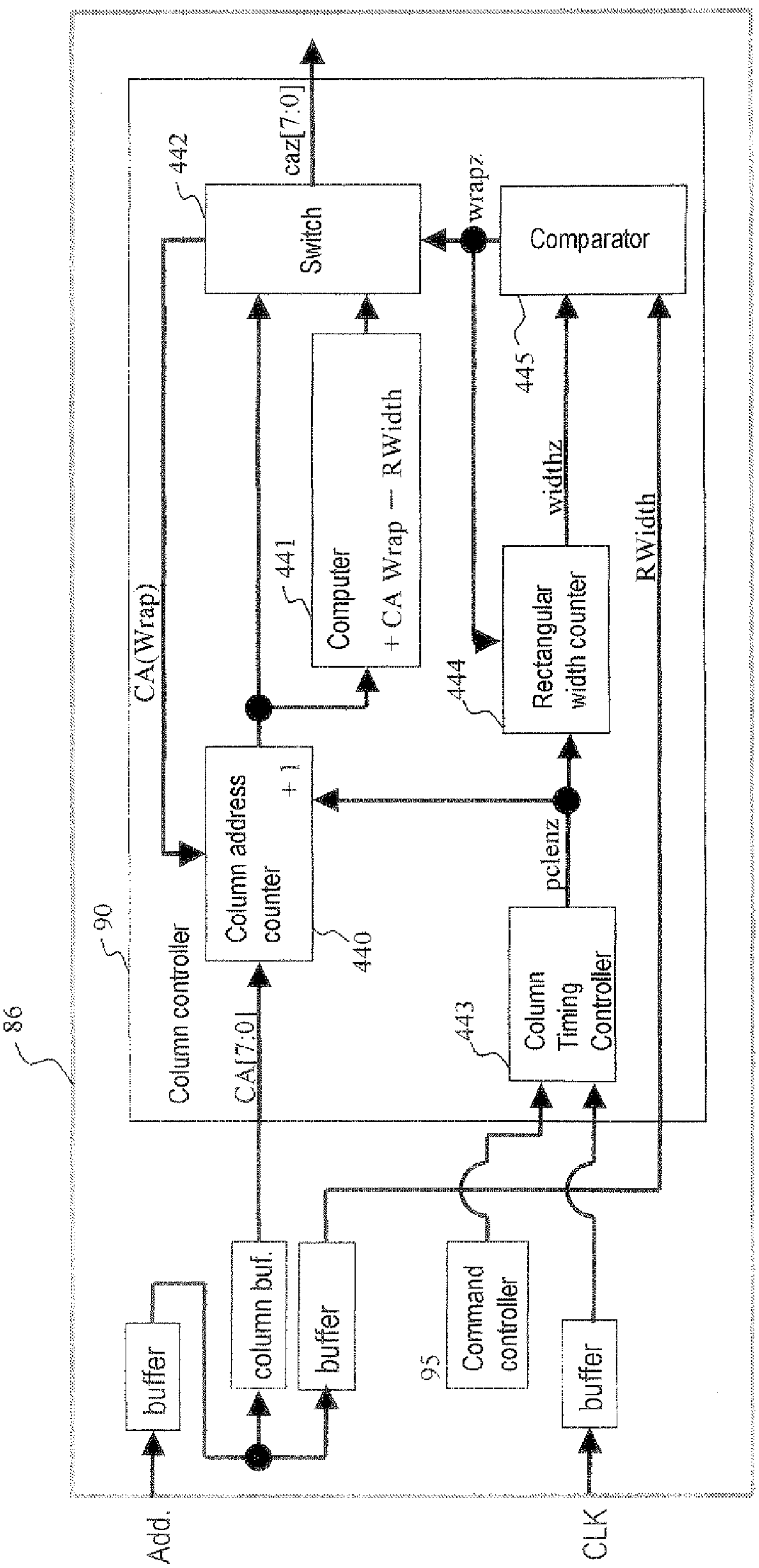
FIG. 44 A configuration diagram of an internal column address calculator that is required in the automatic rectangular access.

FIG. 43 is a timing chart of an automatic rectangular access. FIG. 44 is a configuration diagram of an internal column address calculator that is required in the automatic rectangular access. In order to perform the rectangular access shown in FIG. 42, column addresses CA=#0B/#0C, #0C/#0D, #13/#14, #14/#15, #1B/#1C, #1C/#1D, #23/#24, and #24/#25 may be issued within the memory in response to supplied column addresses CA=#0B and SB=2. Specifically, in the first access, Bytes 2 and 3 access to CA=#0B, and Bytes 0 and 1 access to CA=#0C. In the second access, progress is made in the column address CA by 1, thus Bytes 2 and 3 access to CA=#0C, and Bytes 0 and 1 access to CA=#0D. In this example, since the rectangular width RWidth=2, the third access is made to wrapped column addresses CA=#13 and #14 in place of the position after the column address CA is shifted by 1. Therefore, it is necessary to compute the third column address from the column address wrap width CAWrap and the rectangular width Rwidth. When considering this third address with Bytes 2 and 3, third CA to be accessed is obtained as CA=12+8−2+1=19 (Decimal)=#13 (Hexadecimal) by an equation shown in FIG. 43 (CA+CAWrap−Rwidth+1) on the basis of the current column address CA=#0C (=12 (Decimal)), CAWrap=8, and RWidth=2. FIG. 44 shows the column address calculator within the column controller 90. This calculator has a column address counter 440 that increments by one a column address CA supplied from the outside and a wrapped column address CA (Wrap), in synchronization with an internal clock pclenz that synchronizes with the timing of a clock, a computer 441 that adds CA Rwap to a count value of the column address counter and subtracts Rwidth, a switch 442 for selecting an output of the computer 441 when the rectangular area is wrapped, a rectangular width counter 444 that counts the synchronizing clock pclenz and counts count values in the horizontal direction during an access, and a comparator 445 that detects that the horizontal count value widthz of the rectangular width counter 444 matches with the rectangular width Rwidth, and generates a switching signal wrapz for the switch 442.

Explanation is provided with reference to the timing chart shown in FIG. 43. First, suppose that the rectangular area size is set as burst length BL=8 in the mode register, and the wrap width of a column address CAWrap=8 within a page area is also set in the mode register. Then, the starting column address CA=#0B, start byte SB=2, and rectangular width of the rectangular area to be accessed Rwidth=2 are supplied along with a read command 430 following an active command. In response to this, the timing clock pclenz is generated in synchronization with a clock, the rectangular width counter 444 then counts up the count values widthz in the horizontal direction during the access, and the column address counter 440 counts up starting from the starting column address CA=#0B.

An internal column address caz[7:0] that is issued for the first access is CA=#0B/#0C, as shown in FIG. 43. In the second access, #0C/#0D is outputted in response to the column address caz[7:0]=#0C obtained by incrementing caz=#B by one by the column address counter 440. In the third access, the rectangular area needs to be wrapped at a rectangular width, thus a computed value of the computer 441 is selected by the switch 442, column address caz[7:0]=#03 is outputted, and, after wrapping is performed in response to this output, column address CA=#13/#14 is generated. In the fourth access, #14/#15 is generated. In the fifth access the rectangular area is wrapped and #1B/#1C is generated. Thereafter, #1C/#1D, #23/#24 and #24/#25 are generated similarly.

The configuration of the image memory corresponding to this automatic rectangular access is as shown in, for example, FIG. 29, wherein a combination of four column addresses corresponding to the byte boundary functions is supplied to four byte areas Bytes 0 through 3. Specifically, a combination of the internal column addresses caz shown in FIG. 43 is supplied to the column decoder in each byte area. As a result, the data items of these column addresses are outputted from the four byte areas respectively.

In the above example, the rectangular width Rwidth at the time of rectangular access is supplied along with the read command, but the rectangular width Rwidth may be set beforehand by means of the mode register set command in the mode register. Alternatively, the rectangle size BL and rectangular width Rwidth may be supplied along with the read command. The wrap width CAWrap of the column address is set by the image system beforehand, thus it is preferred that the wrap width CAWrap is set by means of the mode register set command.

In this manner, in the case of the rectangular access, if the column address CA as a starting point, the rectangular width Rwidth, and the rectangle size (BL) are provided, an internal column address to be accessed can be generated automatically on the basis of the wrap width CAWrap of the column address that is set beforehand. Therefore, the rectangular access can be made by issuing a read command once.

[Byte Boundary Functions of Page Area Boundary]

The byte boundary functions can efficiently access predetermined bytes (4 bytes) of data across the boundary of a memory unit area (4-byte area) selected by a column address. However, in the case of performing a rectangular access across a page area boundary, adjacent page areas need to be subjected to the active operation again by means of another active command.

Figure 45:
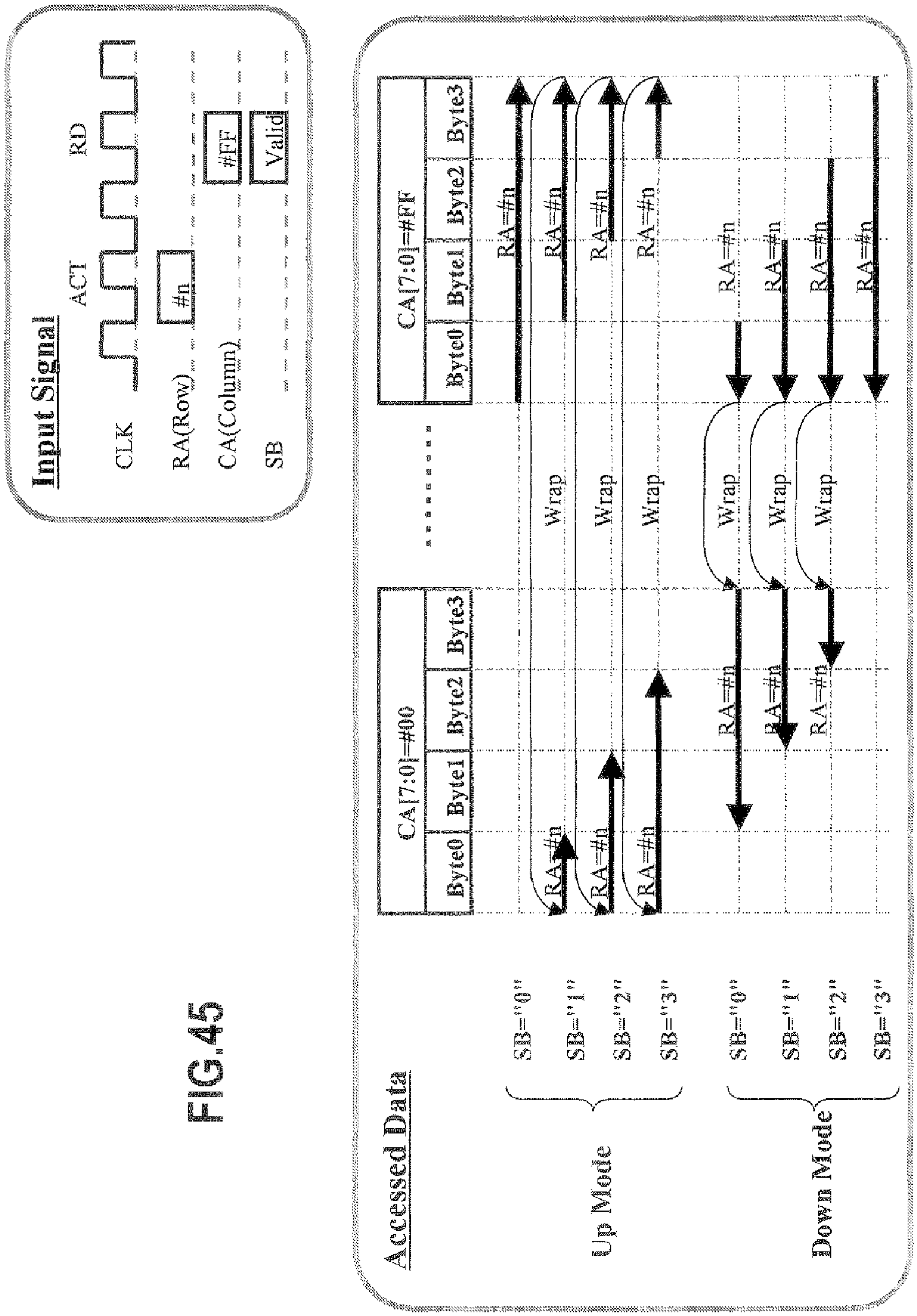
FIG. 45 A figure showing an example of memory operation performed when an access made by the byte boundary functions reaches the end of a page area.

FIG. 45 shows an example of memory operation performed when an access made by the byte boundary functions reaches the end of a page area. This figure shows an example in which the page area is constituted by column address CA[7:0]=#00 through #FF and CA=#FF at a right end. In this case, when 4 bytes of data items shown by arrows in the figure are accessed using the byte boundary functions, the 4 bytes of data can be outputted in the up mode when SB=0, but when SB=1, 2 and 3 the byte data at a left end are accessed after turning at the right end of the page area. Specifically, in this example, the access is performed again within the same page area without performing new active operation. In the case of the down mode, on the other hand, it is necessary to turn at the left end to move to the right end (Wrap) when SB=0, 1 and 2, turning does not need to be performed only when SB=3.

If the abovementioned access is made, unnecessary data is outputted. In order to make an access to an adjacent page area from the end of the above page area, it is necessary to issue a new active command to perform active operation on the adjacent page area.

Figure 46:
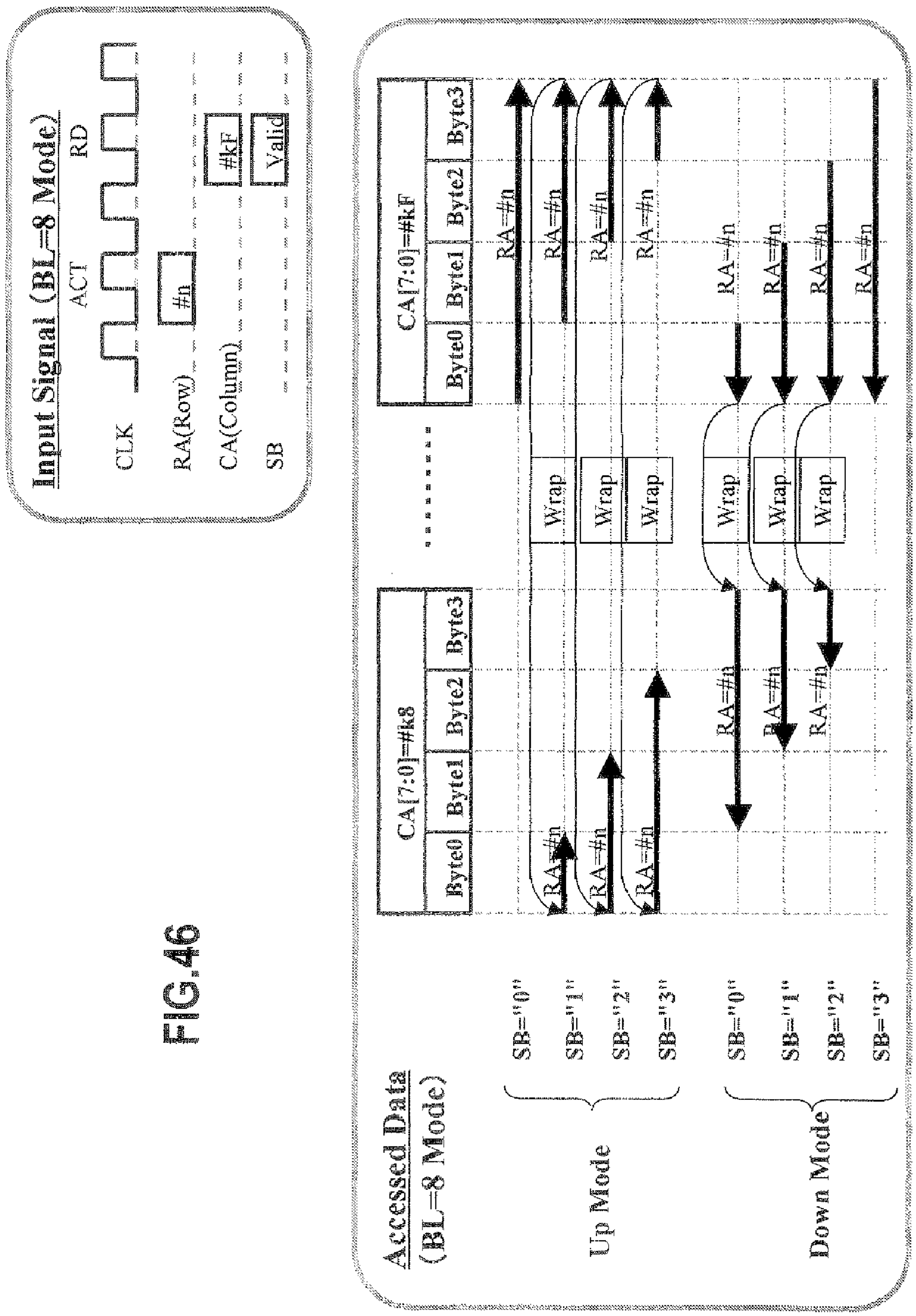
FIG. 46 A figure showing another example of the memory operation performed when an access made by the byte boundary functions reaches the end of a page area.

FIG. 46 shows another example of the memory operation performed when an access made by the byte boundary functions reaches the end of a page area. In this example, the burst length BL is set to 8. When BL=8 is established, a burst counter within each bank repeatedly counts internal column addresses by means of the counter width of BL=8. Specifically, in the example shown in FIG. 46, the internal column addresses that are generated by the burst counter are constituted by a width 8 of CA=#k8 through #kF (16-bit notation). Even in the case of a memory in which the access area is divided by such counter into rectangular areas that use the burst length BL as the base, when, as with FIG. 45, the byte boundary functions are used at the right end where the burst length area CA=#k8 through #kF, the same problem as FIG. 45 is generated. In the example shown in FIG. 46, wrapping occurs at SB=1, 2 and 3 at the time of the up mode, and wrapping occurs at SB=0, 1 and 2 at the time of the down mode. Accordingly, unnecessary data is outputted.

Figure 47:
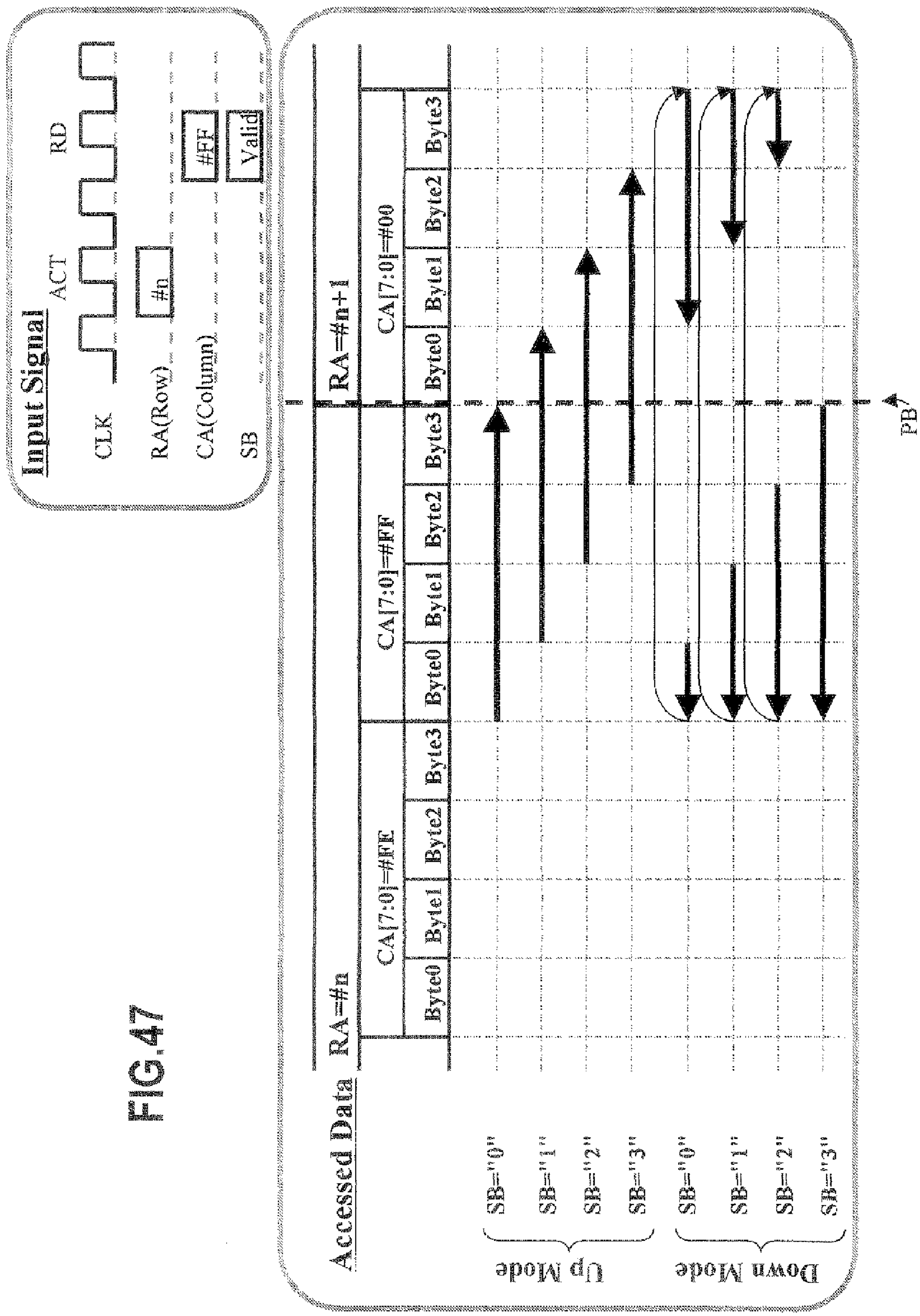
FIG. 47 A figure showing yet another example of the memory operation performed when an access made by byte the boundary functions reaches the end of a page area.

FIG. 47 shows yet another example of the memory operation performed when an access made by the byte boundary functions reaches the end of a page area. In this example, the byte boundary functions are realized using the multi-bank access function in the rectangular access described with reference to FIG. 7. Specifically, the row address RA=#n is specified by the active command ACT. If the column address CA as the base point is CA=#FF at the right end of the page area when the read command RD is issued, an access is made beyond a boundary PB of the page area as shown by the arrows.

Specifically, in the up mode, when SB=1, 2 and 3, an access is made to the byte data of CA=#FF within the page area where RA=#n and to the byte data of CA=#00 within the page area where RA=#n+1. In the down mode, when SB=0, 1 and 2, an access is made to the byte data of CA=#FF within the page area where RA=#n and to the byte data of CA=#00 within the page area where RA#n+1. In this case, an access needs to be made to adjacent page areas, thus the page area with the row address RA=#n that is provided along with the active command ACT is activated, and, in response to the column address CA=#FF and start byte signal SB=2 that are supplied along with the read command RD, the page area with the adjacent row address RA=#n+1 is activated. Thus, word lines within a plurality of banks are activated in response to one active command ACT.

When control is performed such that the plurality of banks are activated simultaneously, data of required areas can be inputted/outputted economically, even if the byte boundary functions are requested at the end of the page area.

[Other Application of Byte Boundary Functions]

The byte boundary functions can input/output data efficiently when storing the image data to the memory and accessing the data corresponding to an arbitrary pixel. The byte boundary functions have the same benefits in an application other than the image memory.

Figure 48:
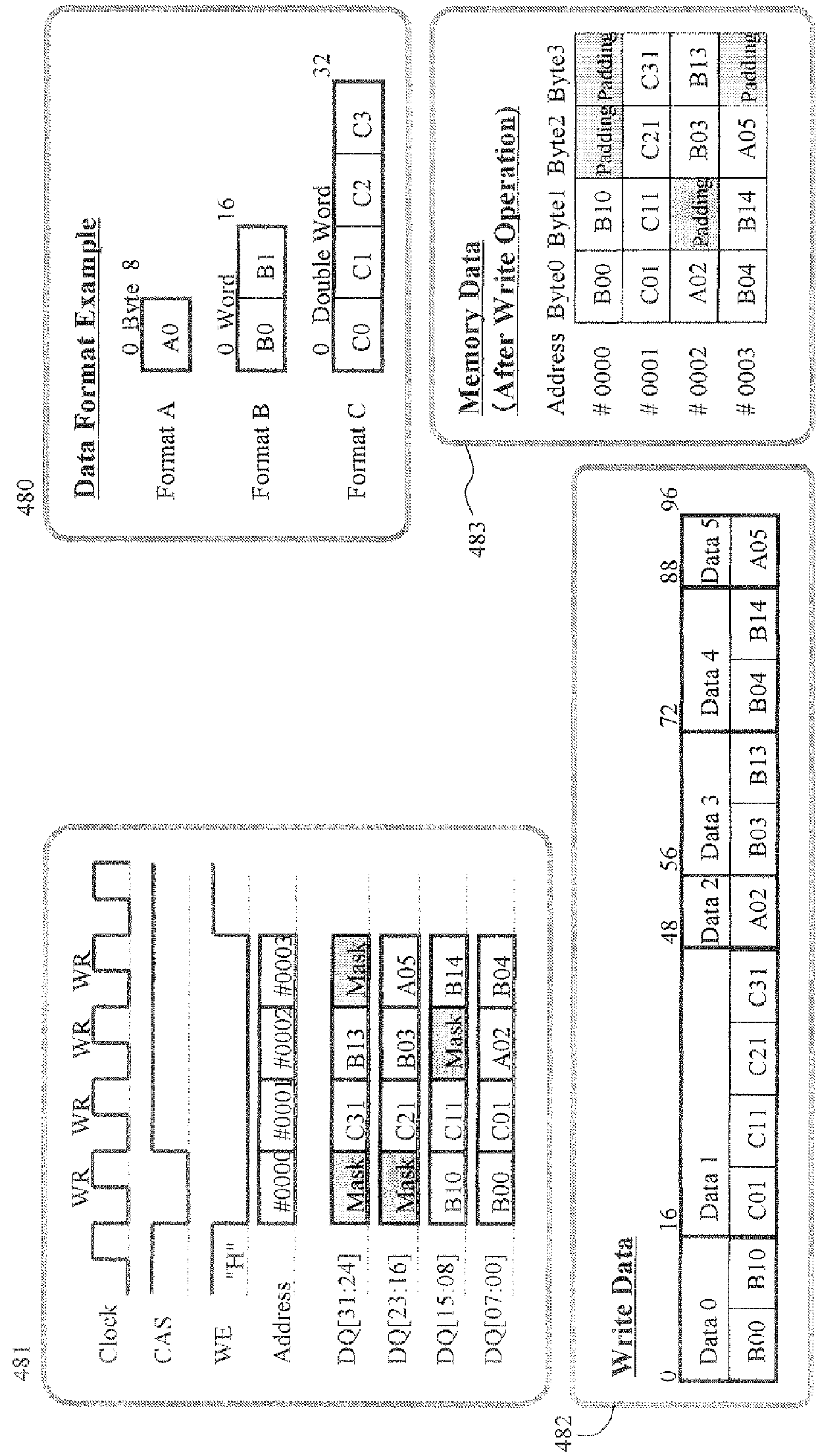
FIG. 48 A figure for explaining other application of the byte boundary functions.
Figure 49:
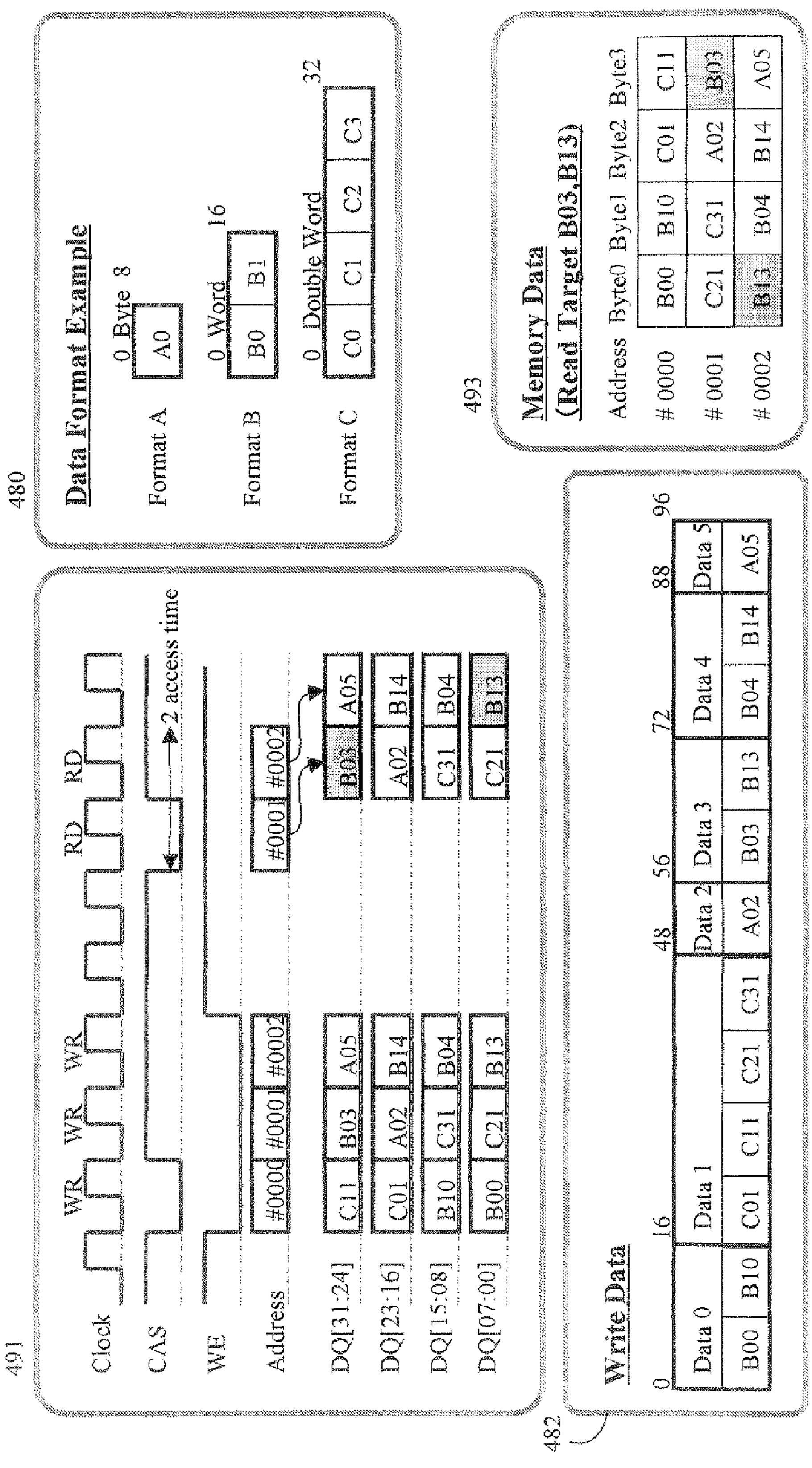
FIG. 49 A figure for explaining other application of the byte boundary functions.
Figure 50:
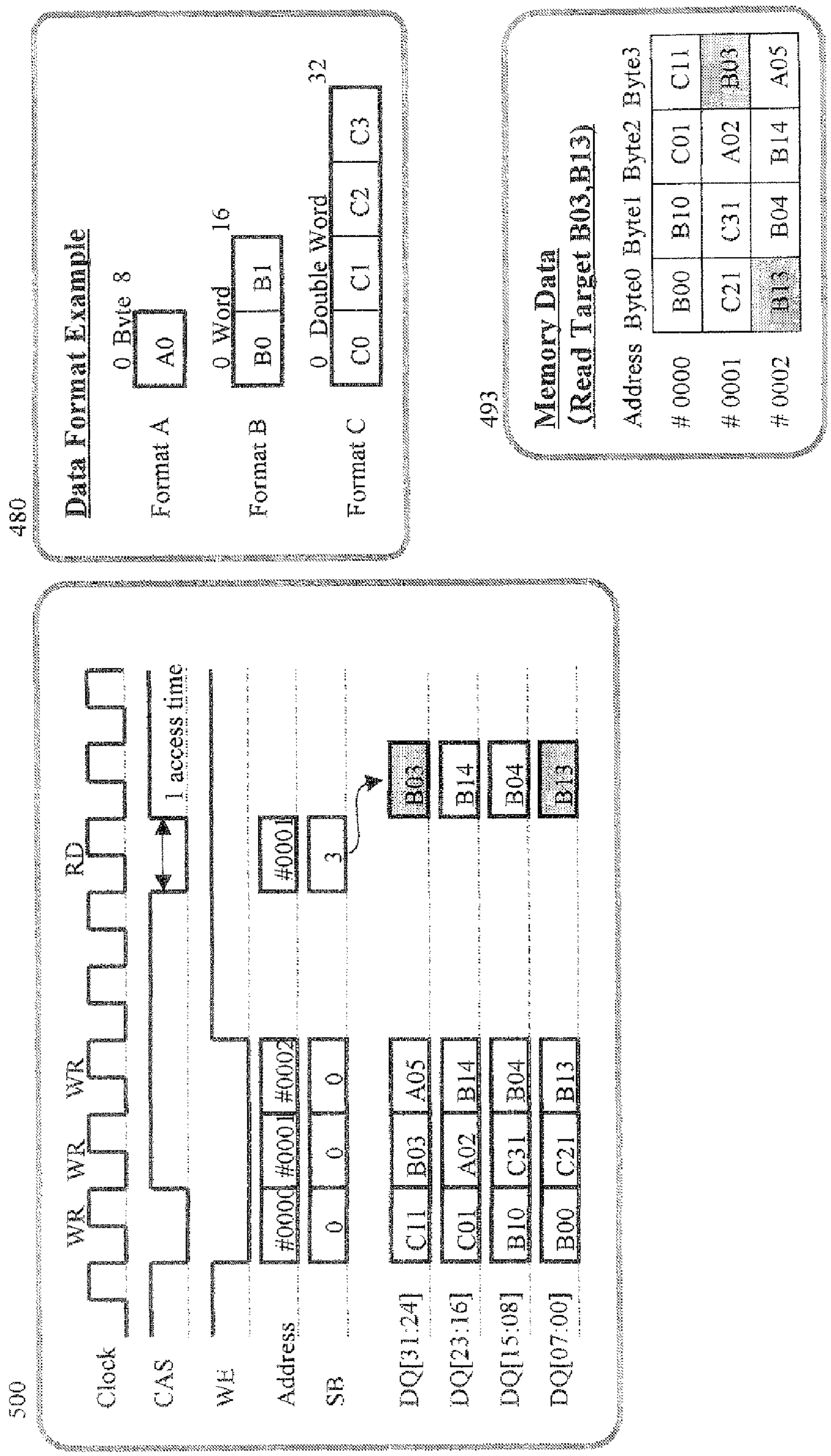
FIG. 50 A figure for explaining other application of the byte boundary functions.

FIG. 48 through FIG. 50 are figures for explaining other application of the byte boundary functions. FIGS. 48 and 49 correspond to a conventional example, and FIG. 50 corresponds to the present embodiment. According to the configuration of the memory, a plurality of byte areas are allocated to the same column address CA, and an access is made to a plurality of byte data items that are allocated to the same column address CA at one access. In such structure, the memory can be accessed efficiently when processing data of fixed byte size (word configuration) allocated to the same column address CA.

However, there is a case where the size of data to be processed by the system is less than that of the word configuration of the memory. As a countermeasure for such a case, there is a method padding so that the data of the word configuration size or smaller does not extend across a plurality of column address CA areas. In the example shown in FIG. 48, the word configuration of the memory is set to 4 bytes (see 483 in the figure), and the units of the size of the data to be processed may be 1 byte (format A of 280 in the figure), 2 bytes (format B of same), or 4 bytes (format C of same). Therefore, the data of 4 bytes is prevented from extending across the column addresses CA by storing the data in the position where Byte 0 is the base point. The data of 2 bytes is stored in the positions where Byte 0 and Byte 2 are the base points. The data of 1 byte can be stored in the positions where any of Byte 0, Byte 1, Byte 2 and Byte 3 is the base point.

Suppose that there is a case where data 0 through 5 of the sizes, 2 Byte, 4 Byte, 1 Byte, 2 Byte, 2 Byte and 1 Byte, are continuously stored in the memory, as with the write data 482 shown in the figure. In this case, by performing the write operation as in 481 in the figure, padding is performed in several byte areas within the memory as shown in 483 in the figure, and a total of 4 bytes of areas are not used effectively for storing the data. In this case, the amount of memory is not used effectively. However, by outputting data in a unit of 4 bytes by the column address CA, each data item can be read at one column address access, thus reading speed increases.

However, in order to eliminate the above mentioned redundant storage capacity, the data items may be stored continuously in to the byte areas of the memory without performing padding. For example, the data is written in three cycles by means of a write command WR as shown in 491 in FIG. 49, and then the data can be stored in the byte areas within the memory as shown in 493 in the figure.

By writing the data in the manner shown in FIG. 49, the storage capacity of the memory can be utilized effectively. However, in the case where the data is stored across different column address areas, such as 2-byte data items B03 and B13 in data 3 or 4-byte data items C 01 through 31 in data 1, reading and writing cannot be performed at one access in a conventional memory, thus access needs to be made twice. As shown in 491 in the figure, the read command RD needs to be issued twice to read data 4, deteriorating the access efficiency.

Therefore, as shown in 500 in FIG. 50, by issuing the read command RD once and specifying the start byte signal SB=3 by means of the byte boundary functions, data 3 (B03 and B 13) extending across the different column addresses can be accessed. Therefore, the memory having the byte boundary functions can realize the improvement of the memory availability without reducing the access performance.

[Memory Controller for Byte Boundary Functions]

Next, the memory controller for the byte boundary functions is described. The image processing system is described with reference to FIG. 8, wherein the image processing controller 81 and the memory controlling section (memory controller) 82 are included in the image processing chip 80 within the image processing system.

Figure 51:
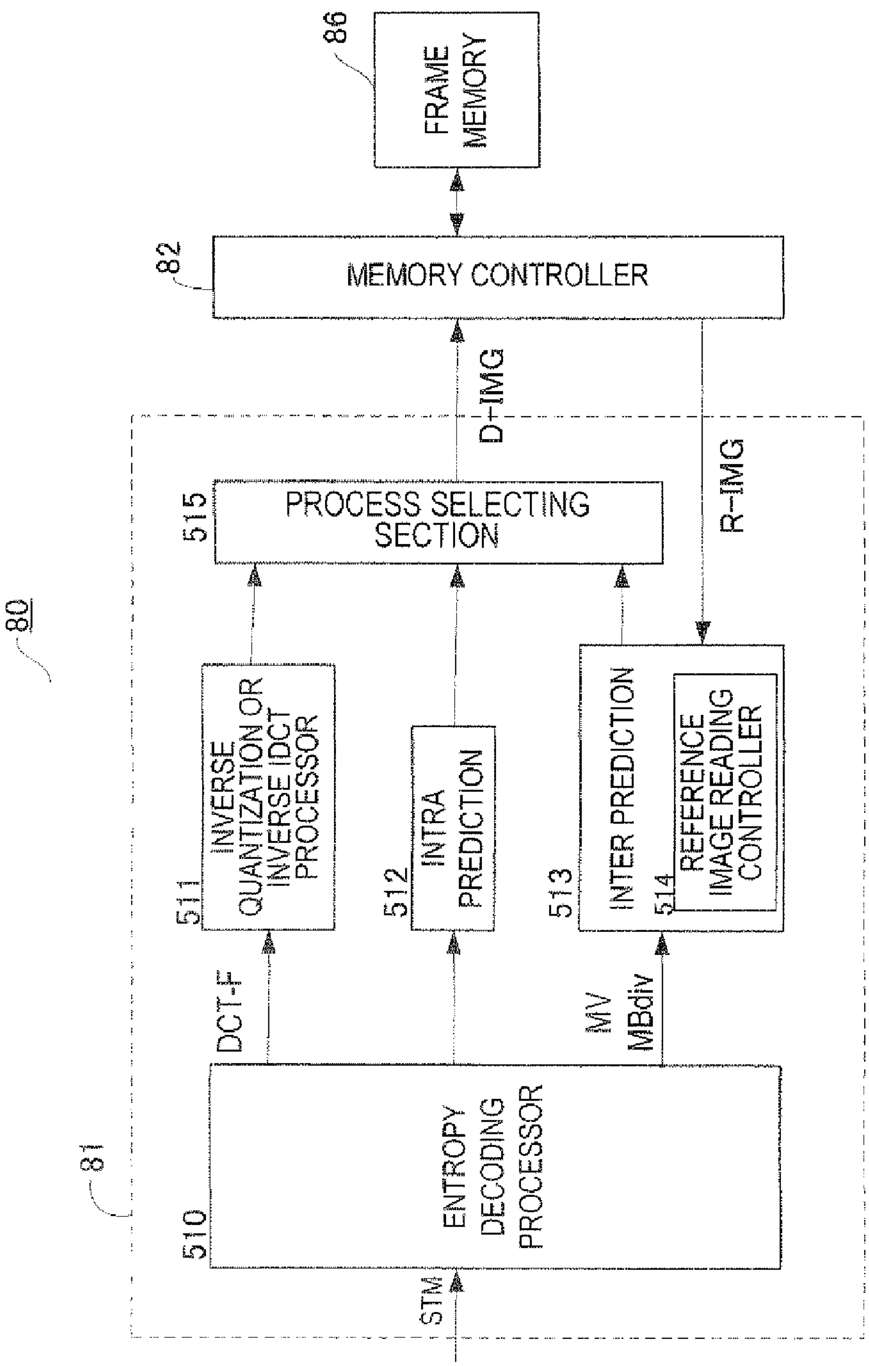
FIG. 51 A configuration diagram of the image processing system.

FIG. 51 is a configuration diagram of the image processing system. As with FIG. 8, the image processing system is constituted by the image processing controller 81, memory controller 82, and image memory 86. The image processing controller 81 is configured so as to perform, for example, MPEG decoding processing. The image processing-section 81 has an entropy decoding processor 510 to which a coded and compressed stream data S™ is inputted, an inverse quantization and inverse IDC processor 511 for performing data processing on the basis of a DCT coefficient DCT-F, an intra prediction section 512, an inter prediction section 513 for having the memory controller 82 read a reference image on the basis of a motion vector MV and a micro-block division information MBdiv, and a process selecting section 515. The memory controller 82 performs memory control including issuance of commands and addresses between the image processing controller 81 and the image memory 86. Decoded image data D-IMG that is outputted from the process selecting section 515 is stored into the image memory 86 by the memory controller 82. Also, the a reference image read controller 514 of the inter prediction section 513 acquires data of a reference image R-IMG from the image memory 86 via the memory controller 82, and sends the data of the reference image to the process selecting section 515.

An MPEG decoder decodes current image data on the basis of the reference image R-IMG within a past image or future image that is read from the memory on the basis of the motion vector, and on the basis of differential data between the reference image and the current image data. Therefore, an operation is frequently performed in which a rectangular reference image located in the position of the motion vector is read out from the image that is temporarily stored in the image memory 86. In this rectangular access control, the access efficiency can be improved by using the image memory 86 having the byte boundary functions and the memory controller 82 corresponding to the byte boundary functions.

Figure 52:
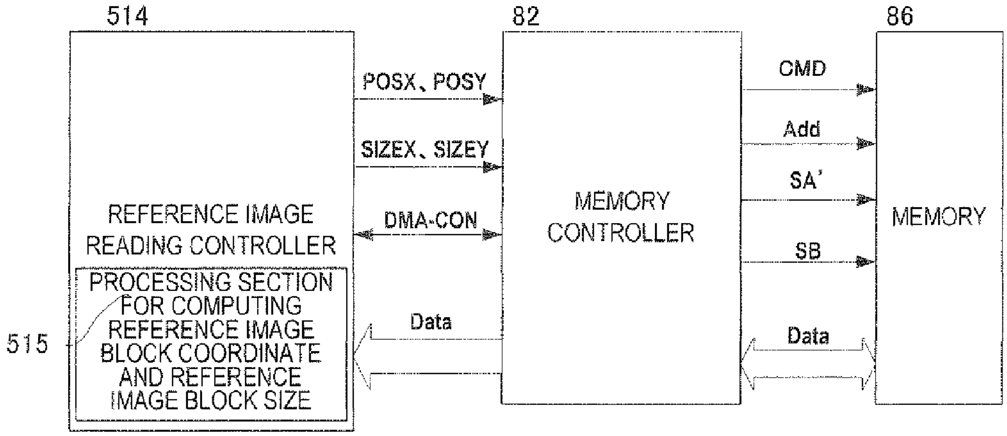
FIG. 52 A figure showing input and output signals of a memory controlling section (memory controller).
Figure 53:
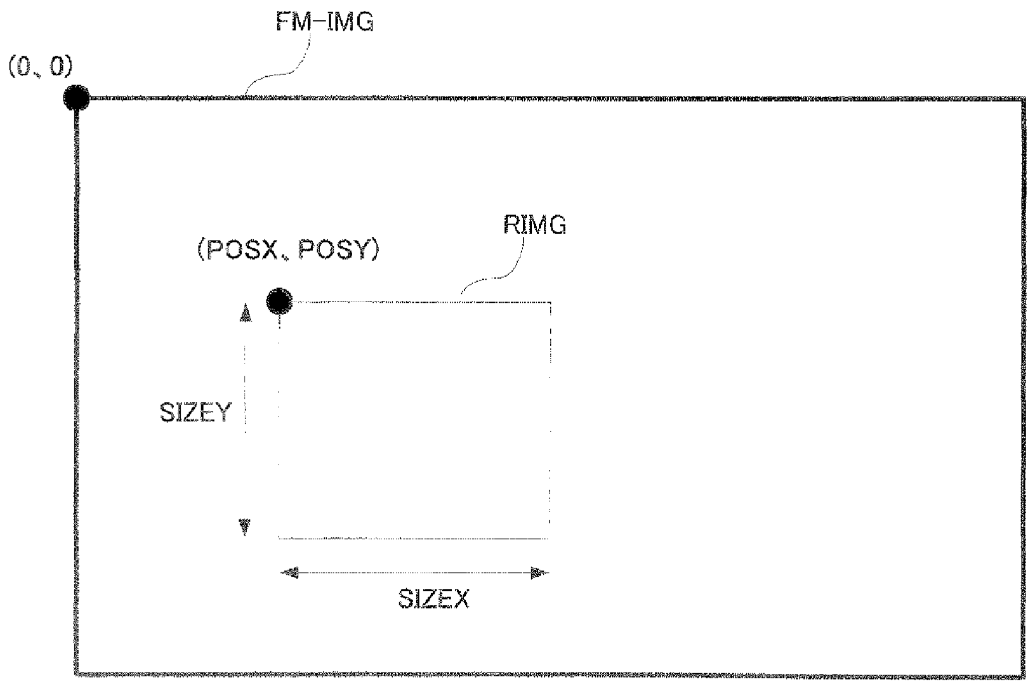
FIG. 53 A figure for explaining a reference image area, which is a target of reading within a frame image.

FIG. 52 shows input and output signals of the memory controlling section (memory controller). FIG. 53 is a figure for explaining a reference image area, which is a target of reading within a frame image. In a frame image FM-IMG, the upper left indicates the origin (0, 0) of a pixel coordinate. In order to specify an area for the rectangular reference image RIMG, a coordinate (POSX, POSY) at the upper left of the rectangle and the size in length and width, i.e., SIZEY and SIZEX, are required. Therefore, the reference image reading controller 514 within the image processing section supplies the above information items (POSX, POSY), SIZEY and SIZEX specifying the area of the reference image RIMG, to the memory controller 82. Moreover, a direct memory access control signal DMA-CON is inputted/outputted between the reference image reading controller 514 and the memory controller 82.

On the other hand, the memory controller 82 computes addresses Add within the memory space (bank address, row address, column address) on the basis of the information items (POSX, POSY), SIZEY and SIZEX specifying the reference image area, and supplies the command CMD, addresses Add, multi-bank access information SA', start byte signal SB, write data Data and the like to the memory 86. Also, the memory controller 82 receives the read data Data read from the memory 86.

Figure 54:
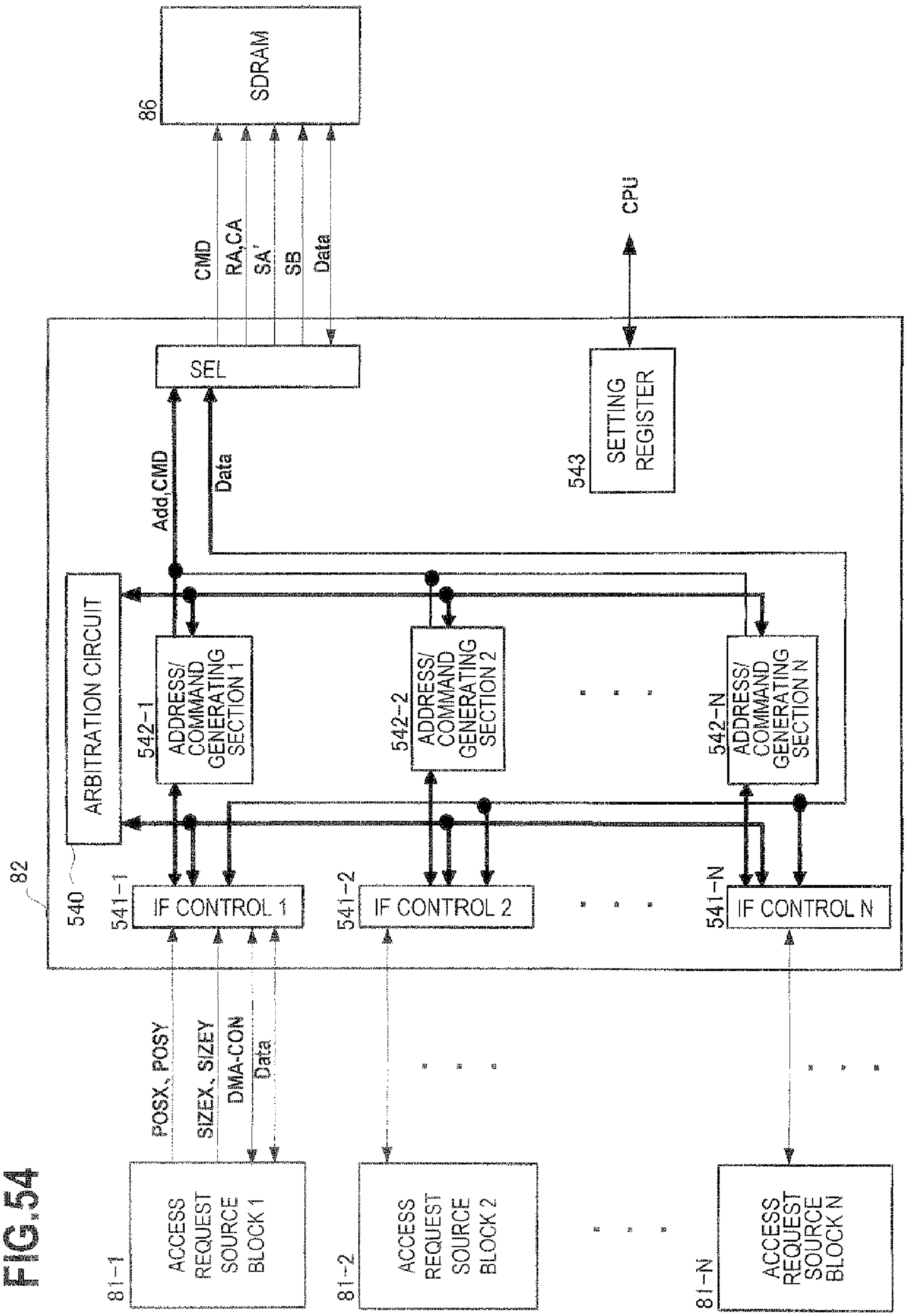
FIG. 54 A detailed configuration diagram of the memory controller.

FIG. 54 is a detailed configuration diagram of the memory controller. The memory controller 82 has interface controllers 541-1 through N that receive the information items POSX, POSY, SIZEX and SIZEY for an image area to be accessed, and the write data Data from access request source blocks 81-1 through 81-N that requests an access to the memory as in the abovementioned image processing controller, and address/command generating sections 542-1 through N that receive the abovementioned reference image information items via these interface sections and generate addresses and commands. These interface controllers and the address/command generating sections should be activated or arbitrated by an arbitration circuit 540. The address/command generating sections 542 that are selected and activated by the arbitration circuit 540 issue the command CMD, addresses Add (bank address, row address, column address), multi-bank access information SA', start byte signal SB and the like to the memory 86 via a selector SEL. Accordingly, for the access request source blocks that are selected by the arbitration, the memory controller 82 controls an access made to the memory 86 and writes or reads the data. Also, the memory controller 82 makes a refresh request to the memory with required frequency.

The command CMD issued by the memory controller 82 includes, for example, the mode register set command, active command, read command, write command, precharge command, refresh command, and other commands required in normal SDRAM. Furthermore, in a setting register 543 within the memory controller 82, the address of an upper-left pixel of the frame image FM-IMG, the memory mapping information, and information on the functions provided in the memory 86 are set. The functions provided in the memory are the multi-bank access function, the function of switching around the arrangements of the data corresponding to the endians, and other functions. The presence of the functions provided in the memory, the target of control, is set in the setting register 543.

Figure 55:
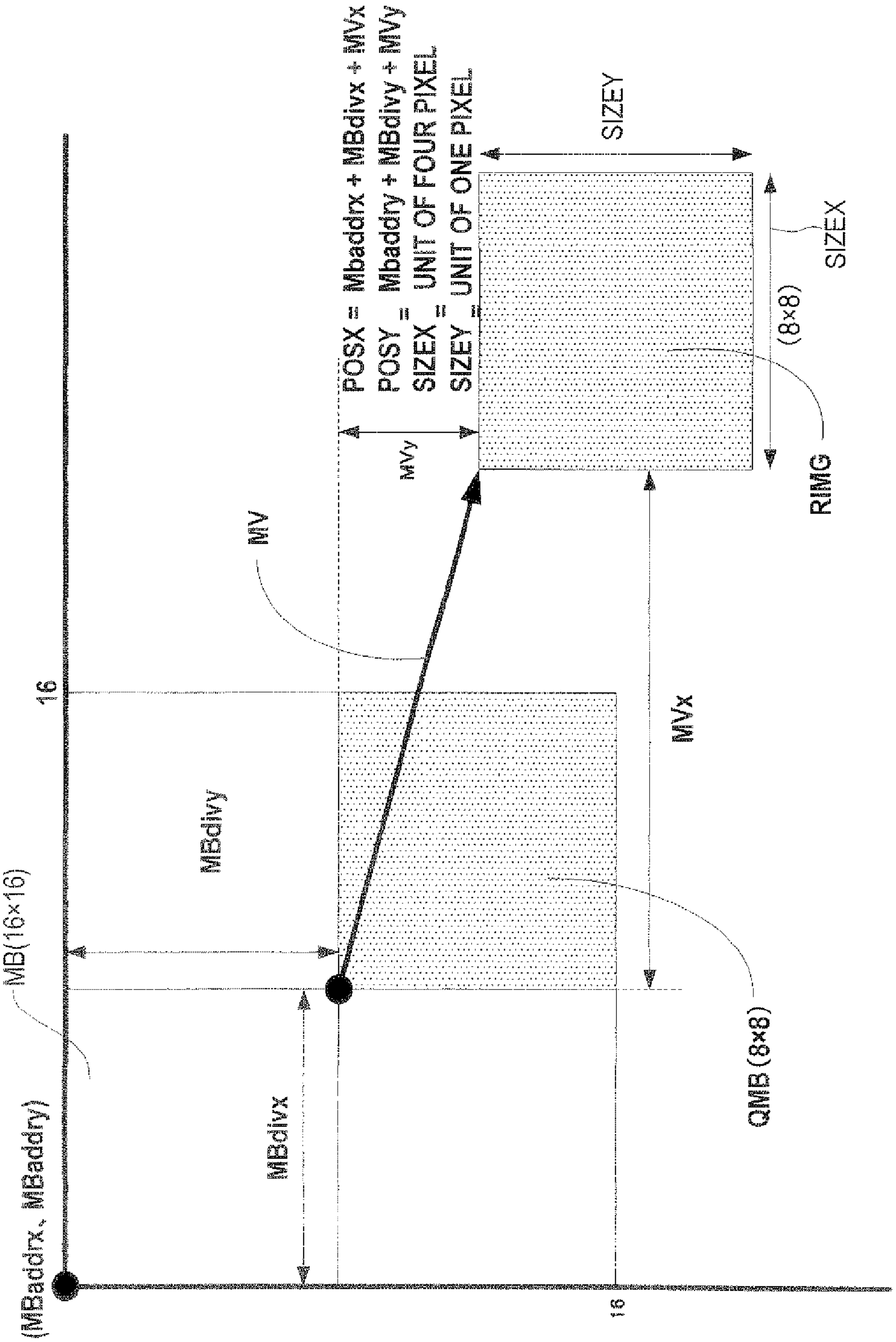
FIG. 55 A figure for explaining computation performed by the inter prediction section 513 in the reference image reading controller 514.

FIG. 55 is a figure for explaining computation performed by the inter prediction section 513 in the reference image reading controller 514. In the case of an MPEG image, macroblock MB is the unit for processing. The macroblock MB is constituted by luminance data of 16×16 pixels, and a color difference (Cb, Cr) data of 8×8 pixels (Y:U:V=4:2:0). ¼ macroblock QMB, which includes luminance data of 8×8 pixels obtained by dividing the macroblock MB into four, is the unit for processing the motion vector MV and the reference image RIMG. When an upper-left coordinate of the macroblock MB, that is being processed currently, is (MBaddrx, MBaddry) macroblock division information thereof is Mbdivx, Mbdivy and the motion vector is MV=(MVx, MVy), a computation processor 515 uses an computing equation shown in the figure to obtain the upper-left coordinate (POSX, POSY), width SIZEX, and height SIZEY of the reference image RIMG. This width SIZEX is set as a multiple number of the number of bytes inputted/outputted at one access to the memory, and the height SIZEY is set as the number of pixels in the vertical direction.

The reference image specifying information (POSX, POSY), SIZEY, and SIZEX that are computed in the manner described above are outputted from the reference image controller 514 to the memory controller 82, and, on the basis of the reference image specifying information, memory mapping information, and upper-left addresses in the frame area that are set in the setting register 543, the command/address generating sections 542 within the memory controller 82 generates an address of the memory space required in rectangular access.

Figure 56:
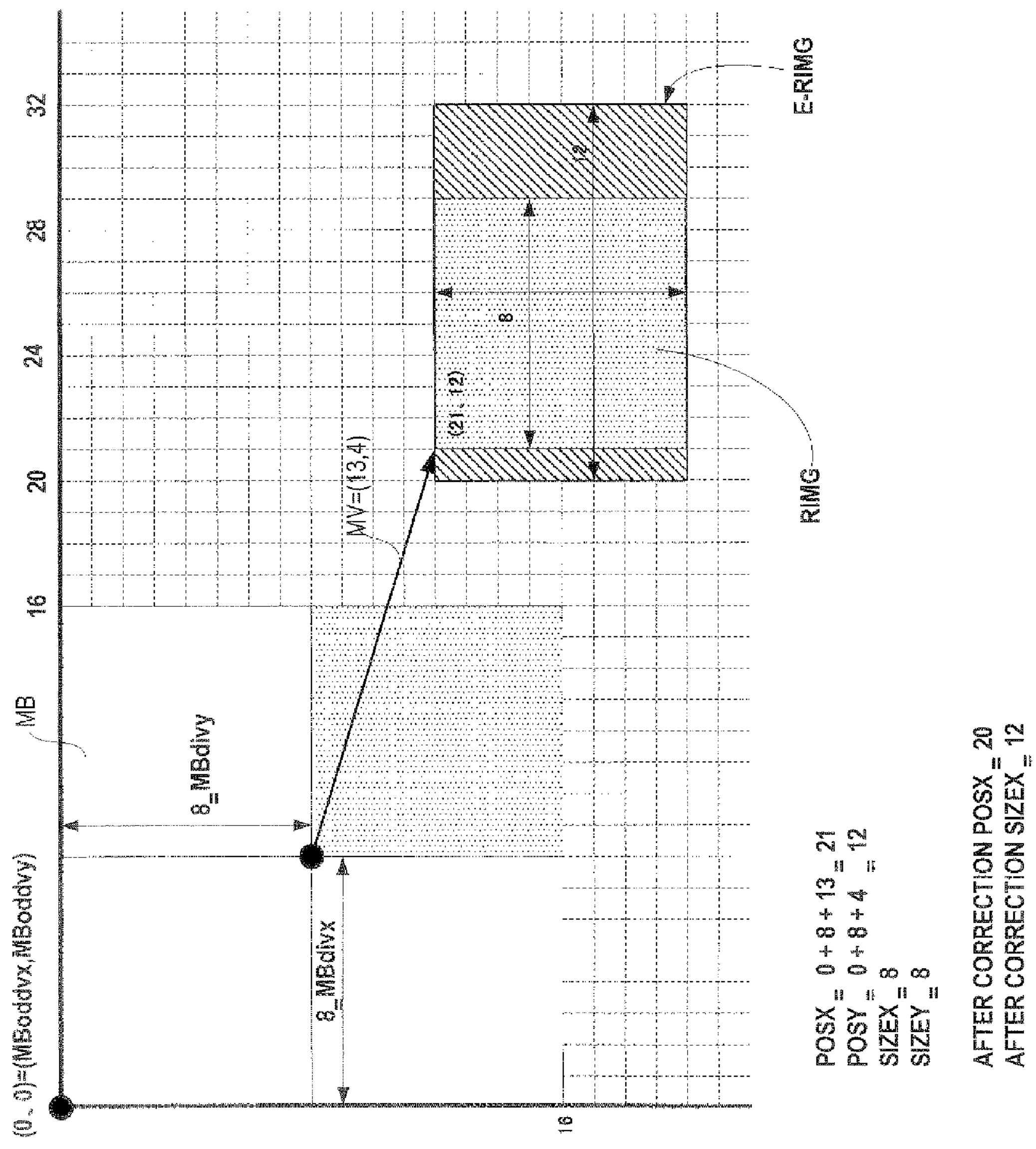
FIG. 56 A figure showing an example of computation performed by the inter prediction section 513 in the reference image reading controller 514.

FIG. 56 shows an example of computation performed by the inter prediction section 513 in the reference image reading controller 514. This is a specific example of FIG. 55. First, the upper-left coordinate of the macroblock MB is (MBaddrx, MBaddry)=(0 and 0), macroblock division information is Mbdivx, Mbdivy=8, and motion vector MV=(MVx, Mvy)=(13 and 4), thus the upper-left coordinate of the reference image RIMG (POSX, POSY), width SIZEX, and height SIZEY are obtained in the following computation:

$$POSX=0+8+13=21$$

$$POSY=0+8+4=12$$

$$SIZEX=8, SIZEY=8$$

The rectangular area of the reference image RIMG does not conform to the unit of a 4-byte area selected by a column address. In order to conform the rectangular area to the unit of the 4-byte area, an access needs to be made to the area with the upper-left coordinate (20 and 12), width 12 and height 8, such as an enlarged area E-RIMG in FIG. 56. However, by using the byte boundary functions, an access with byte unit can be made across the boundary of the 4-byte unit. In this manner, when making an access to reference image data such as an MPEG image, the byte boundary functions contribute to improving the access efficiency.

Figure 57:
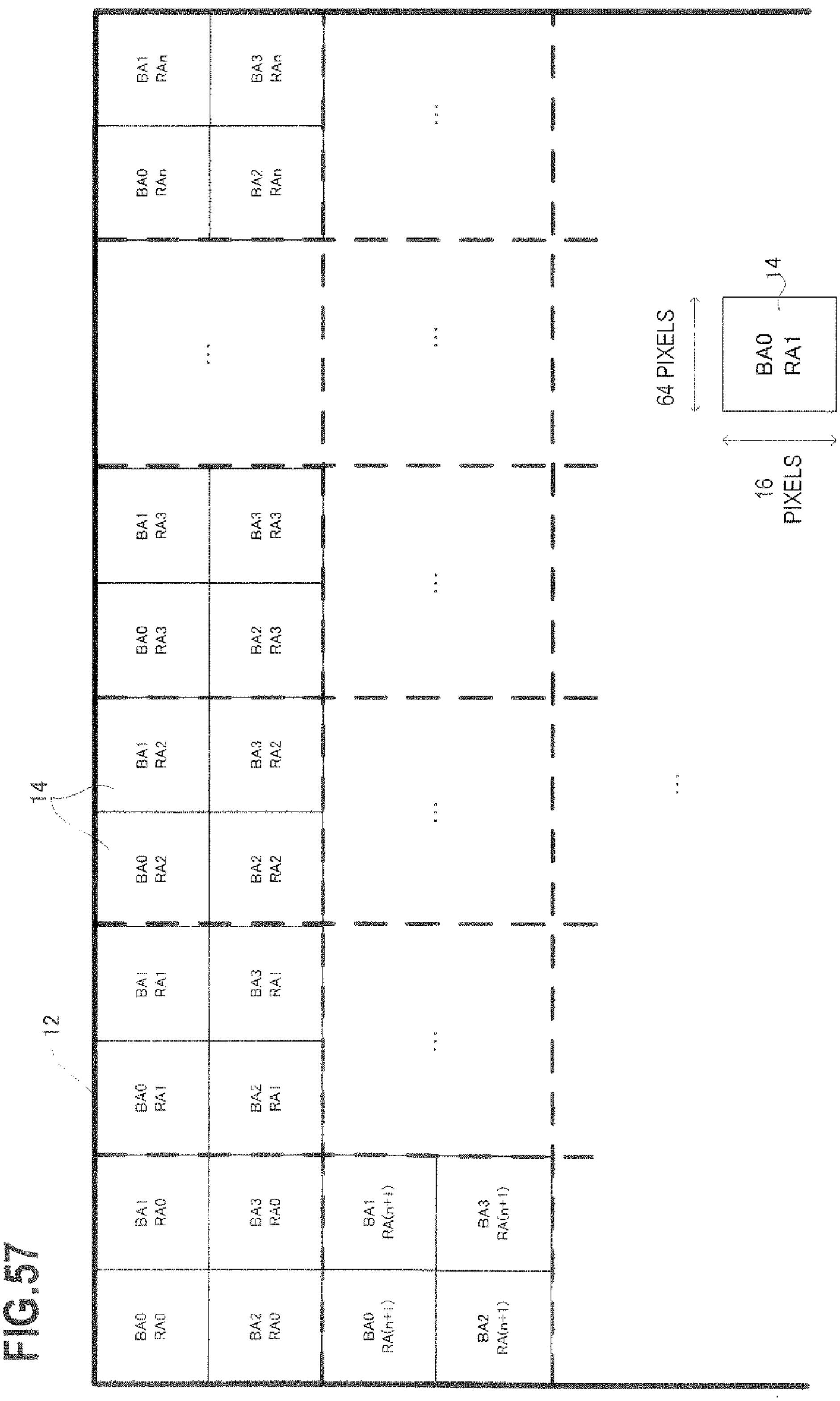
FIG. 57 A figure showing an example of memory mapping.

FIG. 57 shows an example of memory mapping. As with the memory mapping 12 shown in FIG. 1, a pixel of the image and the page area 14 within the memory space are associated with each other as in the memory mapping 12, and adjacent page areas are disposed so as to have different bank addresses BA. The page area 14 is an area selected by a bank address BA and a row address RA, and each page area 14 is constituted by a plurality of memory unit areas (4-byte areas) selected by column addresses respectively. In the example shown in FIG. 57, each page area 14 is a unit for storing image data of 64 pixels×16 pixels.

Figure 58:
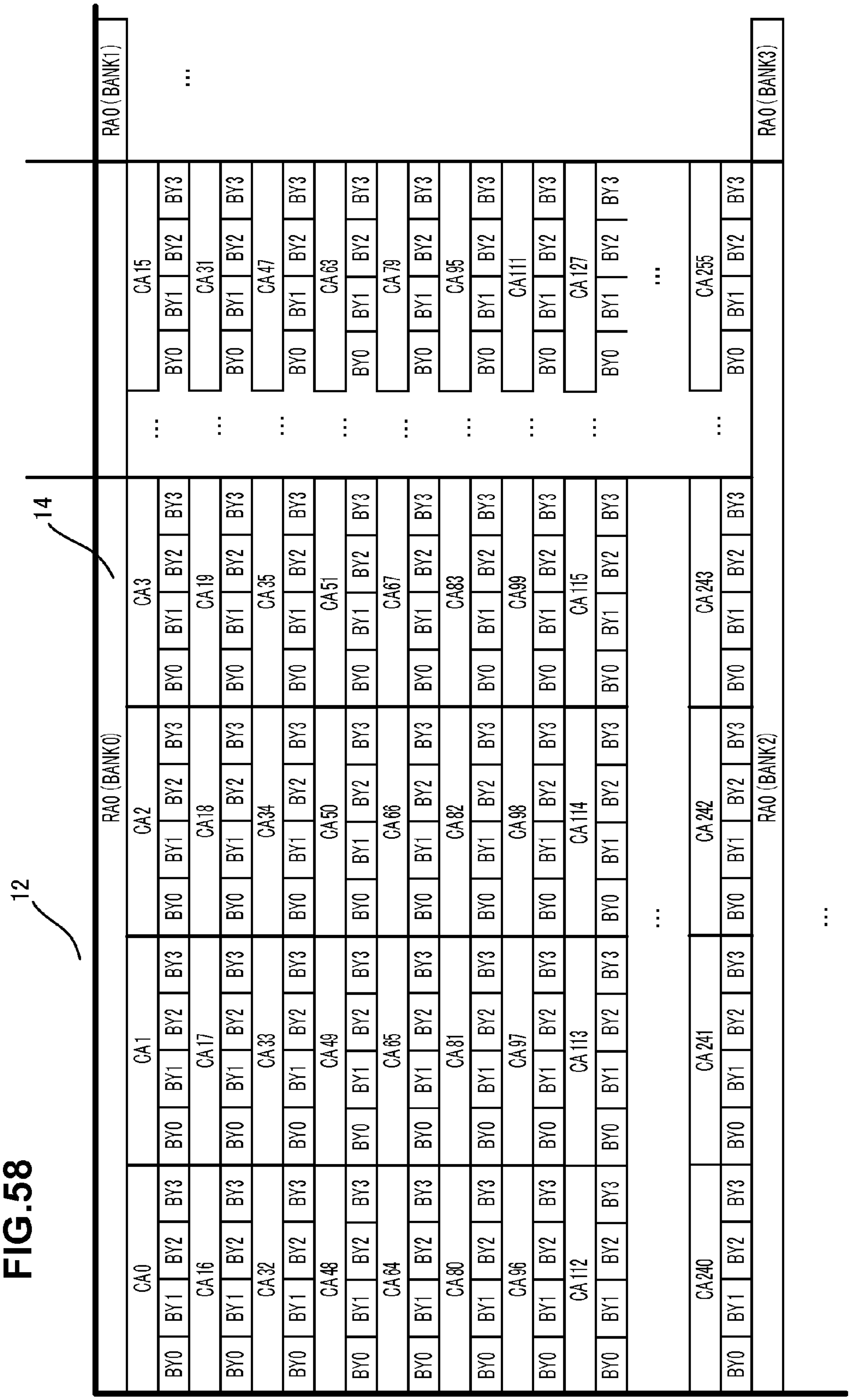
FIG. 58 A figure showing a configuration of the page area 14 in the memory mapping 12.

FIG. 58 shows the configuration of the page area 14 in the memory mapping 12. The page area 14 that is specified by a row address RA 0 within a bank BANK0 has memory unit areas indicated by column addresses CA 0 through 255. 4 bytes are selected by each column address, and a wrap width (step width) of each column address CA is 16. Therefore, the page area 14 has a width of 64 (=4×16) bytes and a height of 16 (=256/16) bytes.

Figure 59:
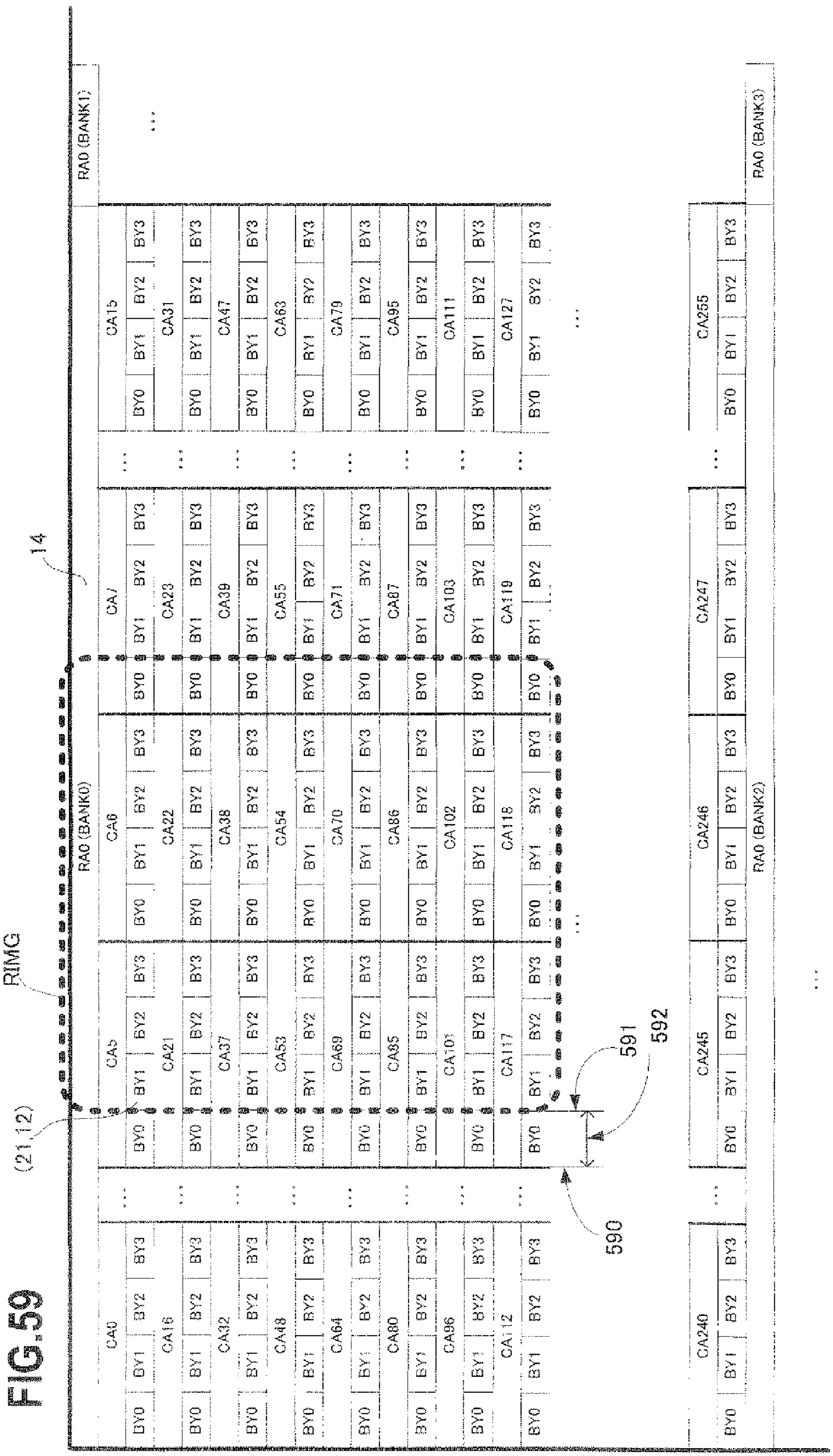
FIG. 59 A figure showing an arrangement of the reference image areas on the memory map, the reference image areas being shown in FIG. 56.

FIG. 59 shows an arrangement of the reference image area being shown in FIG. 56 on the memory map. As shown in FIG. 59, the reference image area RIMG has the upper-left coordinate (21 and 12), a width of 8 and a height of 8, and thus corresponds to a memory area with a width of 8 bytes and a height of 8 bytes, the memory area being formed starting from a byte BY 1 in a leading address of a column address CA 5. Specifically, a left end 591 in a rectangular access area is shifted by 1 byte (592 in the figure) from a boundary 590 obtained from a column address CA. Therefore, a bank address BA 0 and a row address RA 0 is issued along with the active command ACT to the memory having the above-described byte boundary functions, and the starting column address CA 5, CA 6 through 117, and CA 118 and the start byte signal SB=1 is continuously issued along with the read command RD (or write command WR). Also, for the memory having the automatic internal column address generating functions shown in FIGS. 42 through 44, the column address wrap width CAWrap=16 is set, and the starting column address CA 5, start byte signal SB=1, rectangular width Rwidth=2, and burst length BL=16 are issued along with the read command RD (or write command WR).

Figure 60:
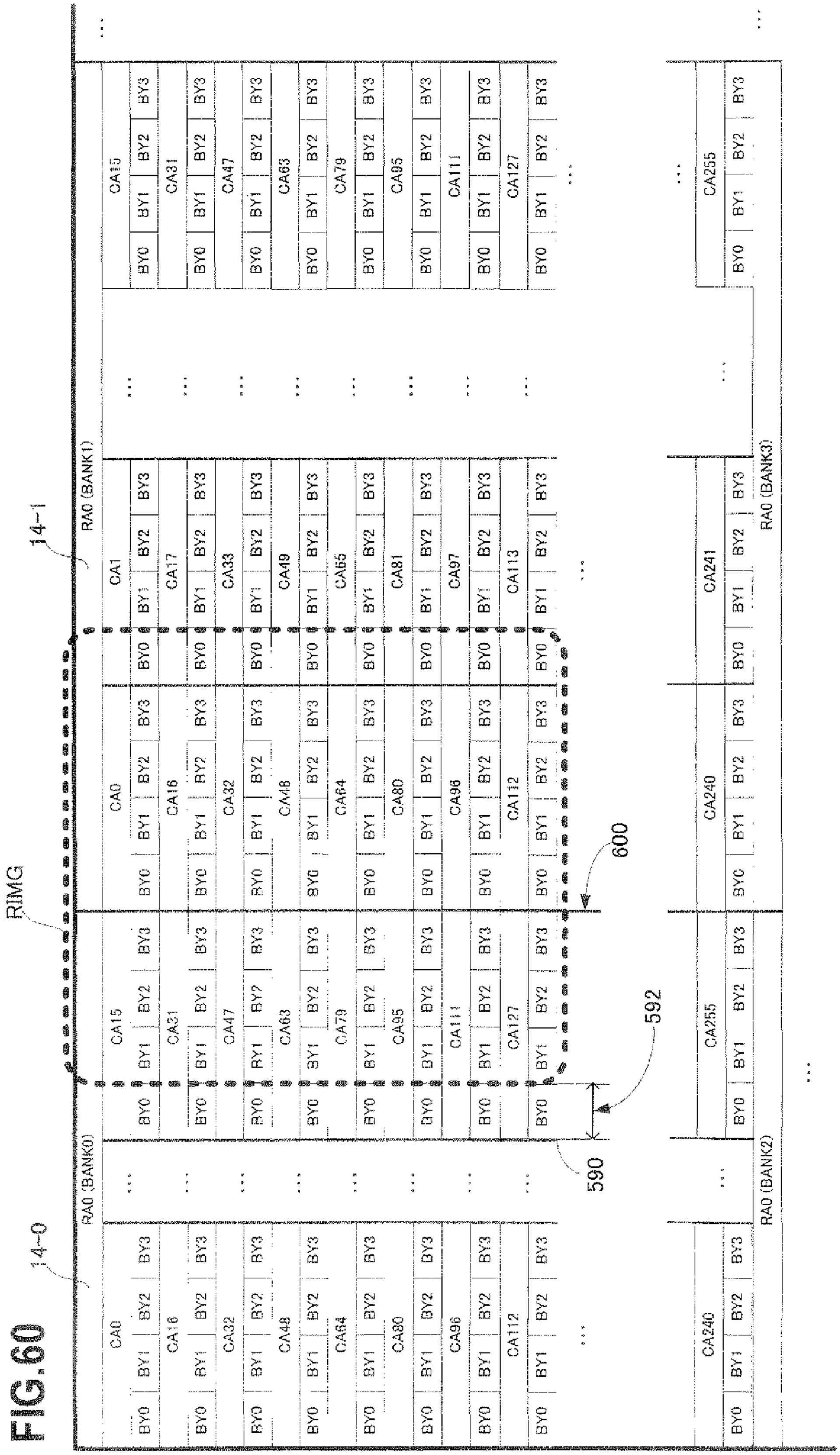
FIG. 60 A figure showing an example of another arrangement of the reference image areas on the memory map.

FIG. 60 shows an example of another arrangement of the reference image areas on the memory map. In this figure, the reference image area RIMG extends across adjacent page areas 14-0 and 14-1. Specifically, the reference image area RIMG exceeds a boundary 600 of the page area. In this case, if the memory has the multi-bank access function described in FIG. 7, by issuing the multi-bank access information SA', an access can be made using the active command once. In the case where the memory does not have the multi-bank access function, the active command needs to be issued a number of times to the banks BANK 0 and 1 to make an access. Therefore, the memory controller previously needs to set, in the register, whether the image memory to be controlled has the multi-bank access function or not, and then the access control to the image memory needs to be changed in response to this set information.

Figure 61:
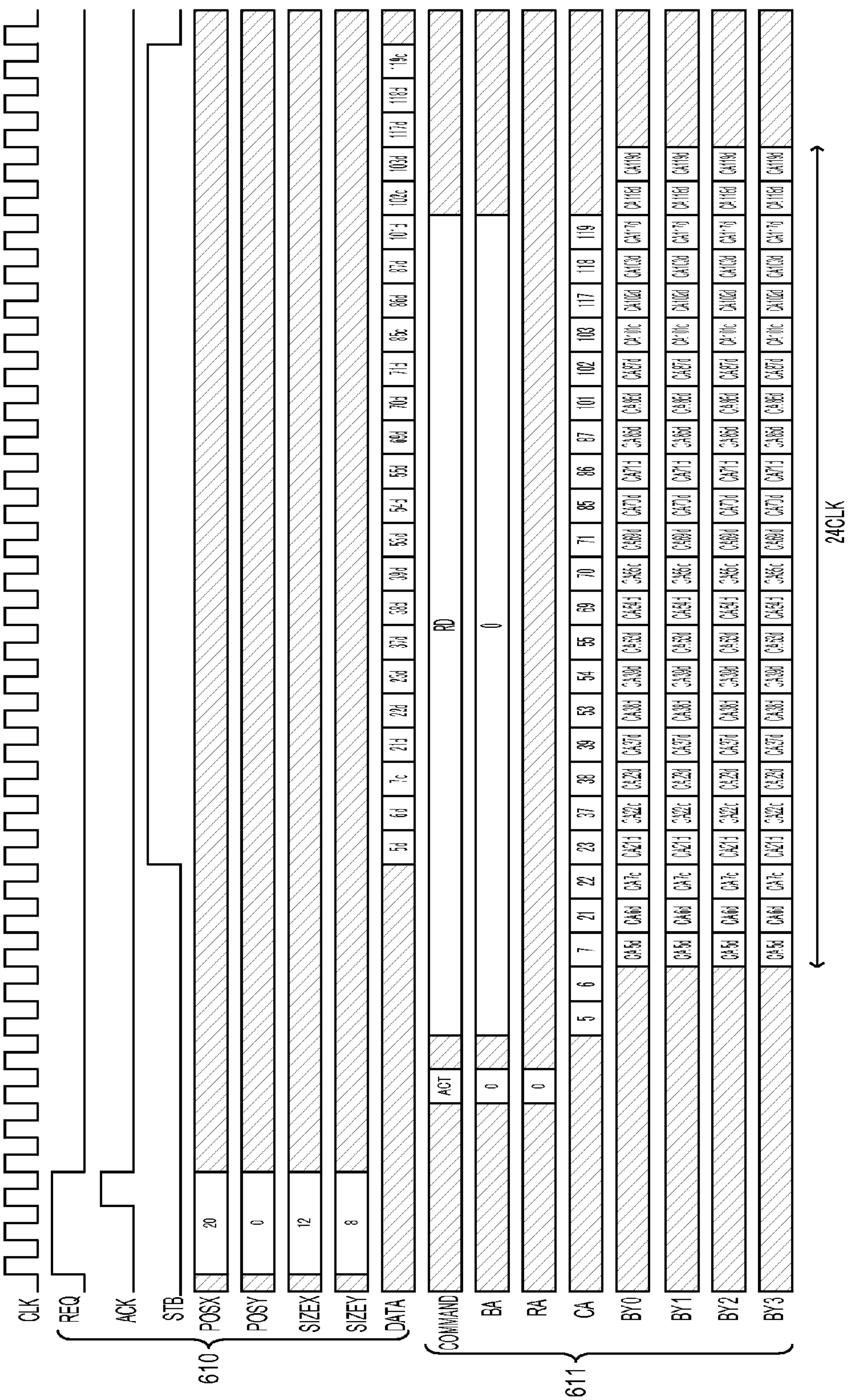
FIG. 61 A timing chart of the memory controller with respect to the memory without the byte boundary functions.

FIG. 61 is a timing chart of the memory controller with respect to the memory without the byte boundary functions. This is an example of access to the reference image RIMG shown in FIG. 59. A conventional SDRAM is not provided with the byte boundary functions. In this case, the memory controller has to perform control shown in FIG. 61.

In FIG. 61, there are shown signals 610 exchanged between the reference image reading controller and the memory controller, and signals 611 exchanged between the memory controller and the image memory. As described above, the reference image reading controller 514 sends to the memory controller the information on the upper-left coordinate POSX, POSY, width SIZEX and height SIZEY along with an access request REQ to the memory, and the memory controller then returns an acknowledge signal ACK in response to the sent information. It is assumed that the memory mapping information and the address of the upper-left origin of the frame image are set in the setting register beforehand.

In response to this access request REQ, the memory controller issues an active command ACT, bank address BA=0, and row address RA=0 to the image memory, and causes the memory to perform active operation. Thereafter, the memory controller issues an read command RD, bank address BA=0, and column address CA=5, 6, 7 through 117, 118, 119 (24 times) in synchronization with a clock CLK, and receives 4-byte data twenty-four times. Then, the memory controller changes the level of a strobe signal STB to H level, and sends the received data to the reading controller.

Figure 62:
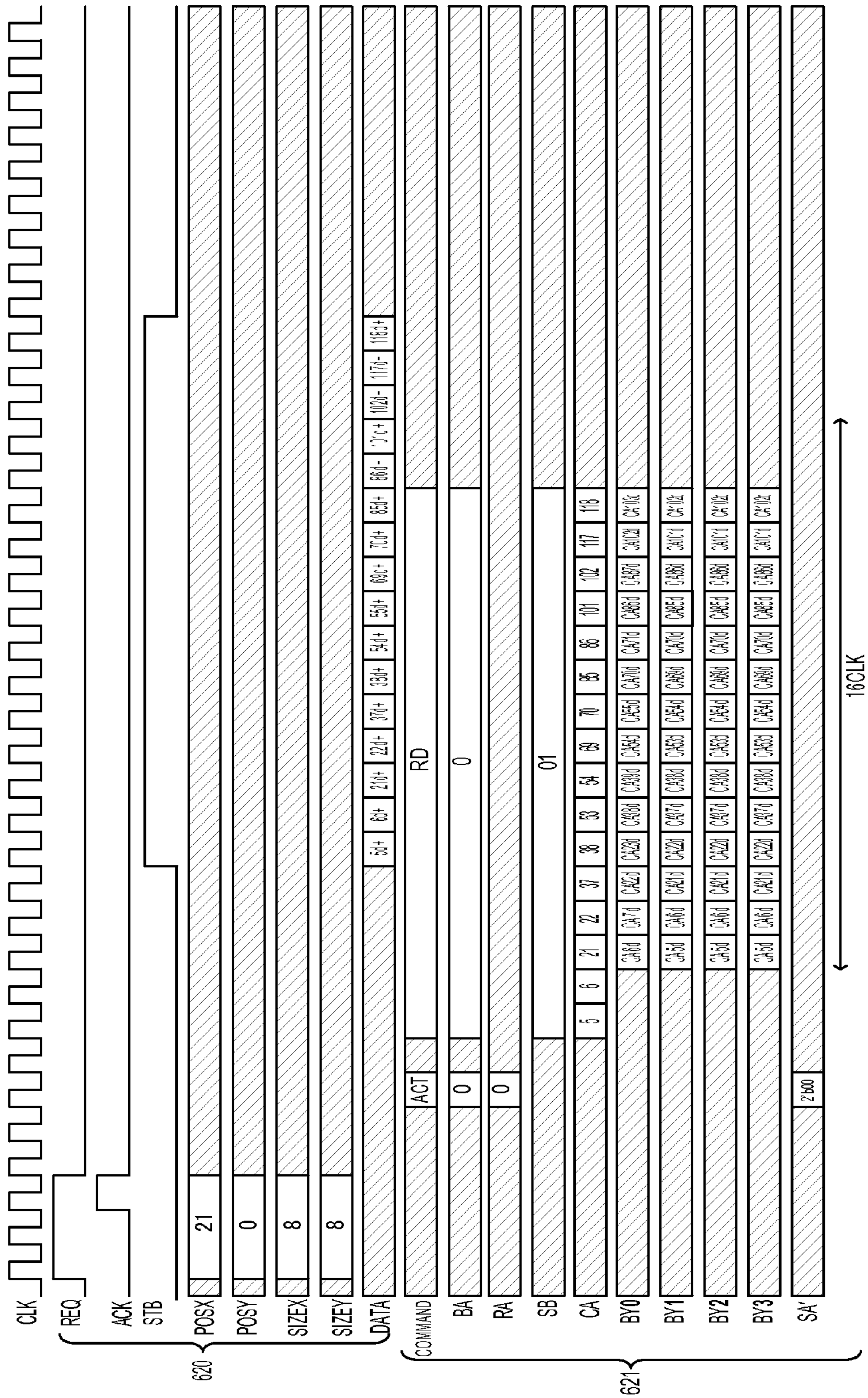
FIG. 62 A timing chart of the memory controller with respect to the memory having the byte boundary functions.

FIG. 62 is a timing chart of the memory controller with respect to the memory having the byte boundary functions. This figure shows an example of access to the reference image RIMG shown in FIG. 59, and is a control performed when the memory has the byte boundary functions. In the figure, there are shown signals 620 exchanged between the reference image reading controller and the memory controller, and signals 621 exchanged between the memory controller and the image memory.

In this case, the same signal as the one shown in FIG. 61 is sent from the reference image reading controller to the memory controller. The memory controller issues an active command ACT, bank address BA=0, and row address RA=0 to the image memory, and causes the memory to perform active operation. Thereafter, the memory controller issues an read command RD, bank address BA=0, column address CA=5, 6 through 117, 118 (16 times), and start byte signal SB=01, and receives 4-byte data sixteen times. Furthermore, the memory controller changes the level of a strobe signal STB to H level, and sends the received 64-byte data to the reading controller. Since the memory has the byte boundary functions, the read command may be issued only sixteen times, improving the access efficiency.

Also, although not shown, in the memory having the automatic internal column address generating function shown in FIGS. 42 through 44, the column address wrap width CAWrap=16 may be set beforehand, and the starting column address CA 5, start byte signal SB=01, rectangular width Rwidth=2, and burst length BL=16 may be issued along with a read command RD. In response to this issuance, the image memory internally generates column address automatically, and outputs 4-byte data of the rectangular area in 16 cycles. The memory controller receives the 4-byte data sixteen times continuously.

Figure 63:
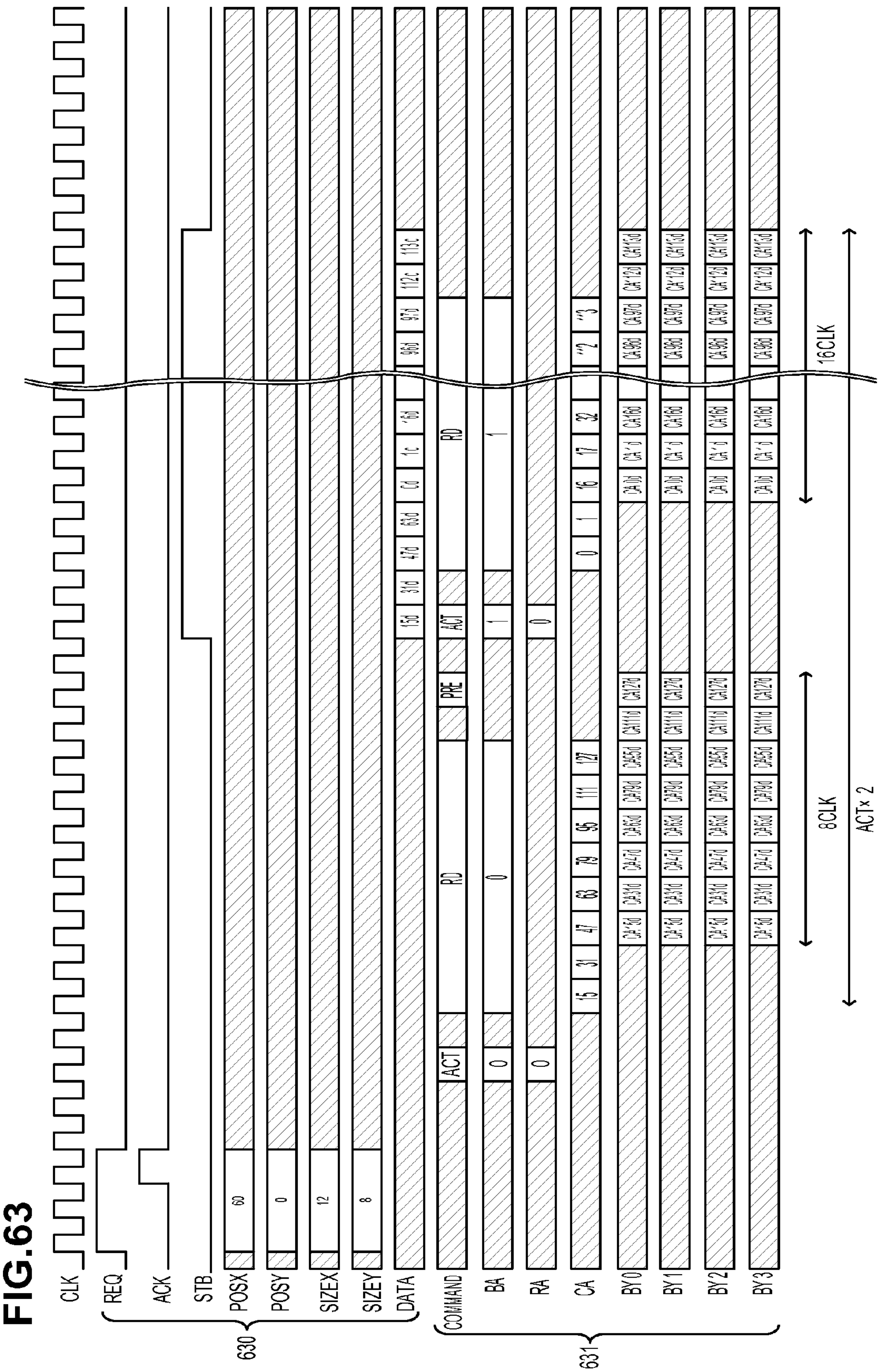
FIG. 63 A timing chart of the memory controller with respect to the memory without the byte boundary functions and the multi-bank access function.

FIG. 63 is a timing chart of the memory controller with respect to the memory without the byte boundary functions and the multi-bank access function. This example is an example in which the reference image RIMG shown in FIG. 60 is accessed, and shows a control performed on the image memory that does not have the multi-bank access function. In the figure, there are shown signals 630 exchanged between the reference image reading controller and the memory controller, and signals 631 exchanged between the memory controller and the image memory.

As shown in FIG. 45, the memory without the multi-bank function cannot access an area across a bank boundary. In this case, therefore, the memory controller issues an active command ACT, BA=0 and RA=0, to have the page area 14-0 perform active operation, further issues a read command RD, bank address BA=0, and column addresses CA=15 through 127, and receives 8 bytes of data. Moreover, the memory controller issues an active command ACT, BA=1, and RA=0, to have the page area 14-1 perform active operation, further issues a read command RD, bank address BA=1, and column addresses CA=0, 1 through 112 and 113, and receives 16 bytes of data. The memory controller then sends the receive 24-byte data to the reference image reading controller.

Figure 64:
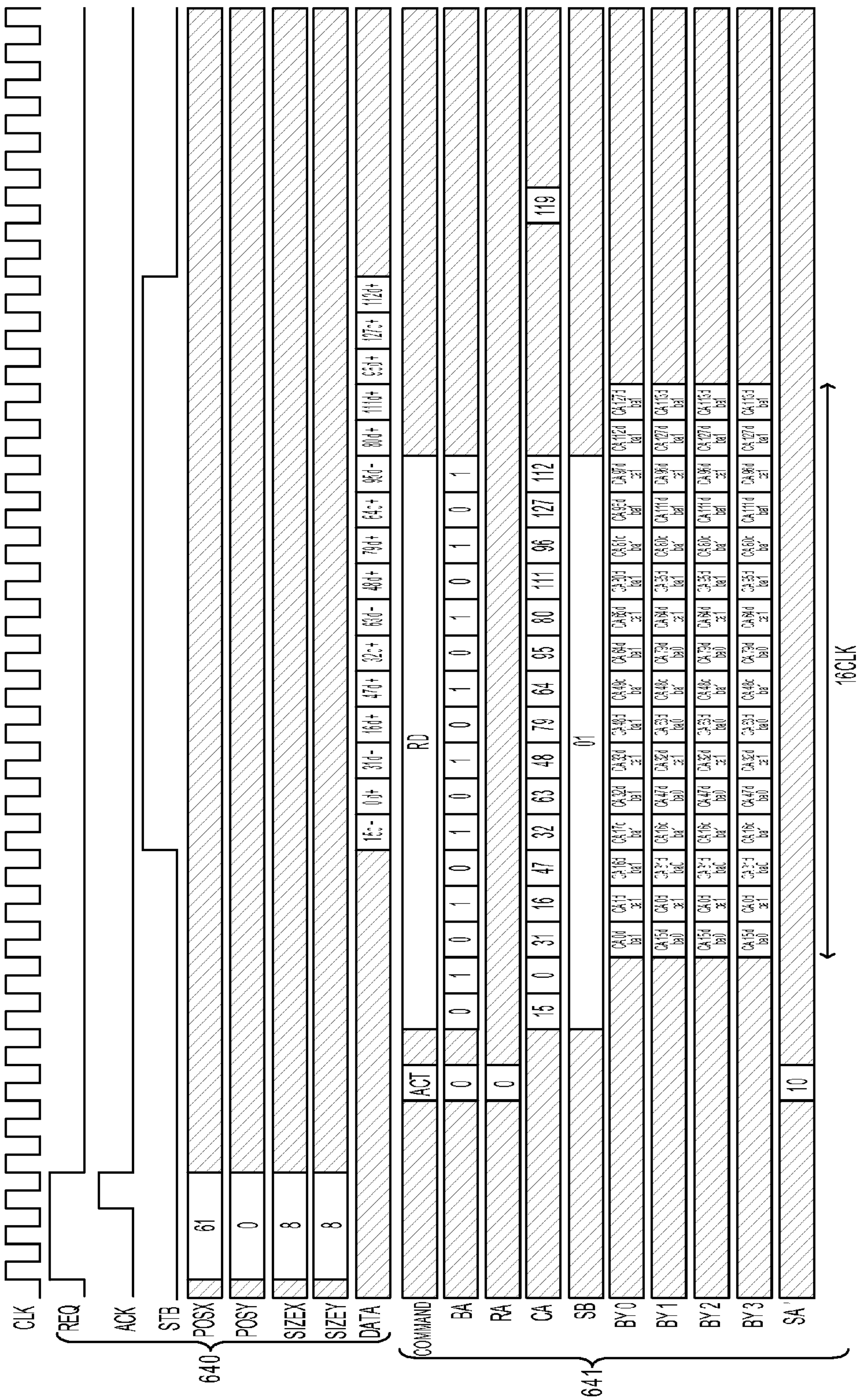
FIG. 64 A timing chart of the memory controller with respect to the memory having the multi-bank access function and the byte boundary functions.

FIG. 64 is a timing chart of the memory controller with respect to the memory having the multi-bank access function and the byte boundary functions. This figure is also an example in which the reference image RIMG shown in FIG. 60 is accessed. In the figure, there are shown signals 640 exchanged between the reference image reading controller and the memory controller, and signals 641 exchanged between the memory controller and the image memory.

The memory controller issues a bank address BA=0, row address RA=0, and multi-bank access information SA'=10 (showing an access to two adjacent banks in a lateral direction) along with an active command ACT. In response to this issuance, the image memory performs active operation on the bank BA=0. The memory controller then issues start byte signal SB=01, bank address BA, and column address CA sequentially along with a read command RD. In response to this column address CA=15, the image memory performs active operation on the bank of BA=1. The memory controller receives 16 bytes of data in response to the read command RD issued 16 times. Moreover, the memory controller sends the received 16-byte data to the reference image reading controller.

In this manner, the memory controller may issue the active command once to the memory having the multi-bank access function, even in the case of data across a different bank boundary.

Figure 65A:
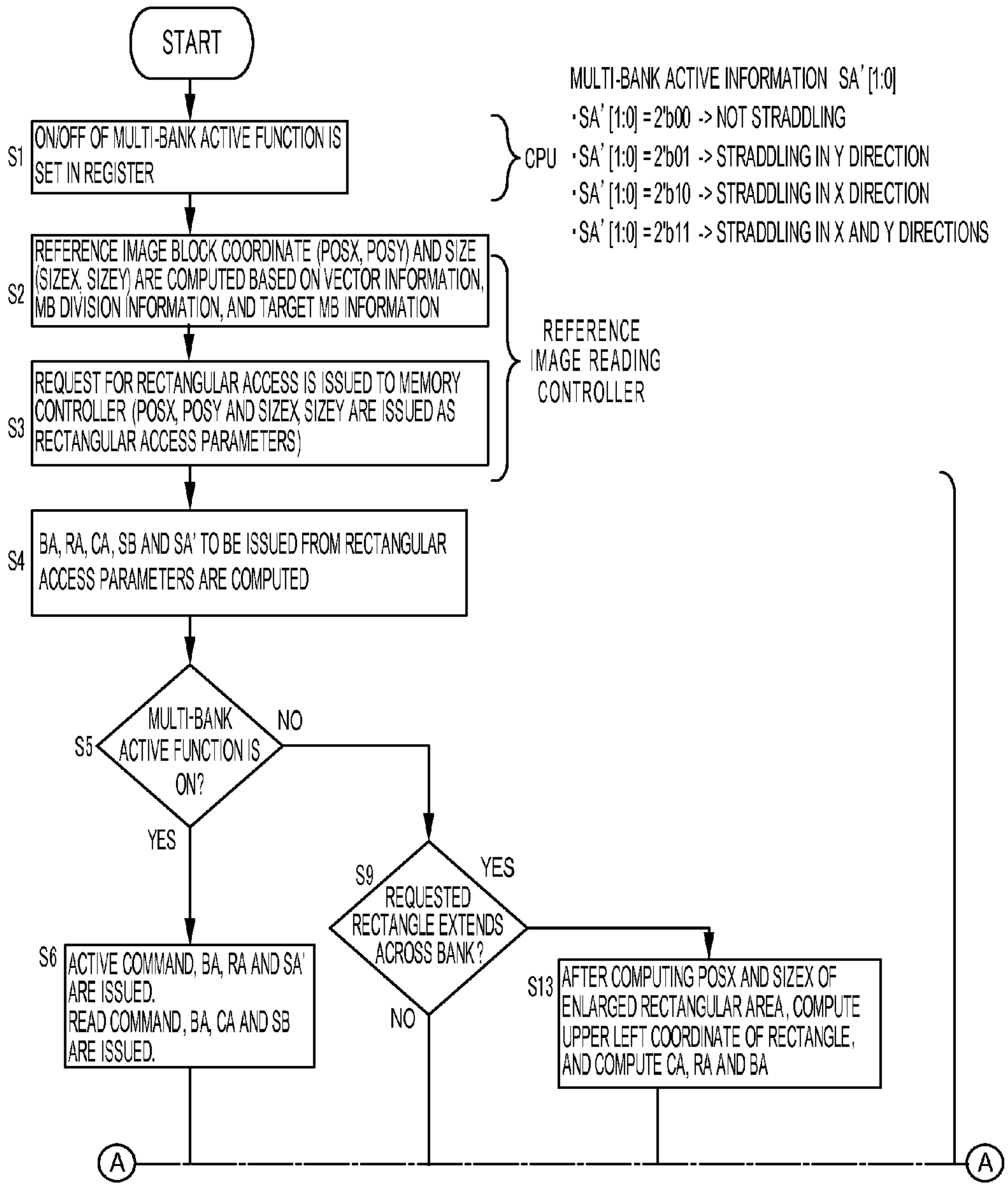
FIG. 65 A flowchart of the control operation of the memory controller.
Figure 65B:
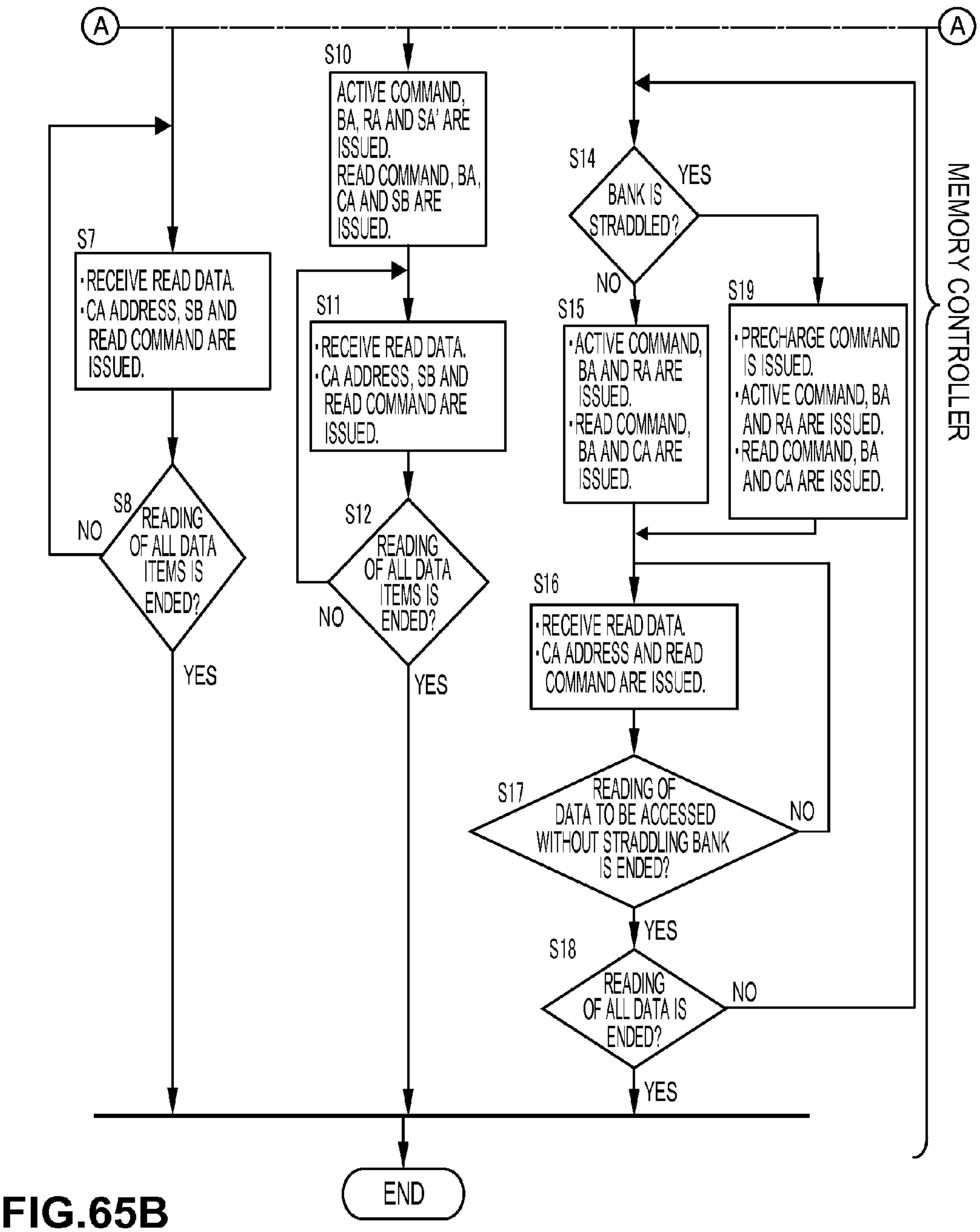

FIG. 65 is a flowchart of the control operation of the memory controller. First, a host CPU sets ON/OFF of the multi-bank active function in the setting register within the memory controller (S1). The reference image reading controller computes the coordinate of a reference image block (POSX, POSY) and the size (SIZEX, SIZEY) on the basis of the motion vector information, macroblock division information, and target macroblock information (S2), and issues a rectangular access request to the memory controller along with the rectangular access parameters for the rectangular access (S3).

The memory controller computes BA, RA, CA, SB and SA' to be issued when making the rectangular access, on the basis of these rectangular parameters (POSX, POSY) (SIZEX, SIZEY), and the memory map information and information on the frame image address that are set in the setting register (S4). When the multi-bank active function is ON (YES in S5), the memory controller receives read data while issuing the BA, RA, and SA' along with an active command ACT and further issuing the BA, CA, and SB along with a read command RD (S6, S7 and S8). In the case of the write operation, the memory controller outputs write data while sequentially issuing the BA, CA and SB along with a write command WR instead of a read command.

Moreover, when the multi-bank active function is OFF (NO in S5), the memory controller checks whether or not the requested rectangle extends across the page area, i.e., bank (S9). If the rectangle does not extend across the bank (NO in S9), the memory controller receive the read data while issuing BA and RA along with the active command ACT and further issuing BA, CA and SB along with the read command RD sequentially (10, 11 and 12). In the case of the write operation, the memory controller outputs write data while sequentially issuing the BA, CA and SB along with a write command WR instead of a read command.

Furthermore, if the rectangle extends across the bank (YES in S9), the byte boundary functions cannot be used, hence the memory controller computes the coordinate POSX and the width SIZEX of the enlarged rectangular area E-RIMG shown in FIG. 56, and computes addresses BA, RA and CA of the upper-left coordinate corresponding to the computed coordinate and width (S13). Then, the memory controller receives the read data while issuing BA and RA along with the active command ACT and further issuing BA and CA along with the read command RD to the enlarged rectangular area (S15, 16 and 17). Then, once reading of the upper-left coordinate within the bank is completed (YES in S17 and YES in S14), a precharge command is generated once. Thereafter an active command is generated to the next bank, and the read data is received while issuing BA and CA along with the read command RD sequentially (S19, S16 and 17). Once all data items within the bank are received (YES in S17) and reading of all data items is finished (S18), the memory control is ended.

It should be noted that when the byte boundary functions are set to OFF in the setting register of the memory controller, the memory controller issues the active command, read command, and required addresses by performing the configurations S13 through S18 of FIG. 65, as in FIG. 61.

In this manner, the memory controller can set ON and OFF of the byte boundary functions and ON and OFF of the multi-bank active functions into the built-in setting register, and appropriately issues required commands and addresses, as well as the multi-bank information, start byte information, and byte combination information such as the up mode, down mode and alternative, in accordance with the functions of the image memory to be controlled.

Figure 66:
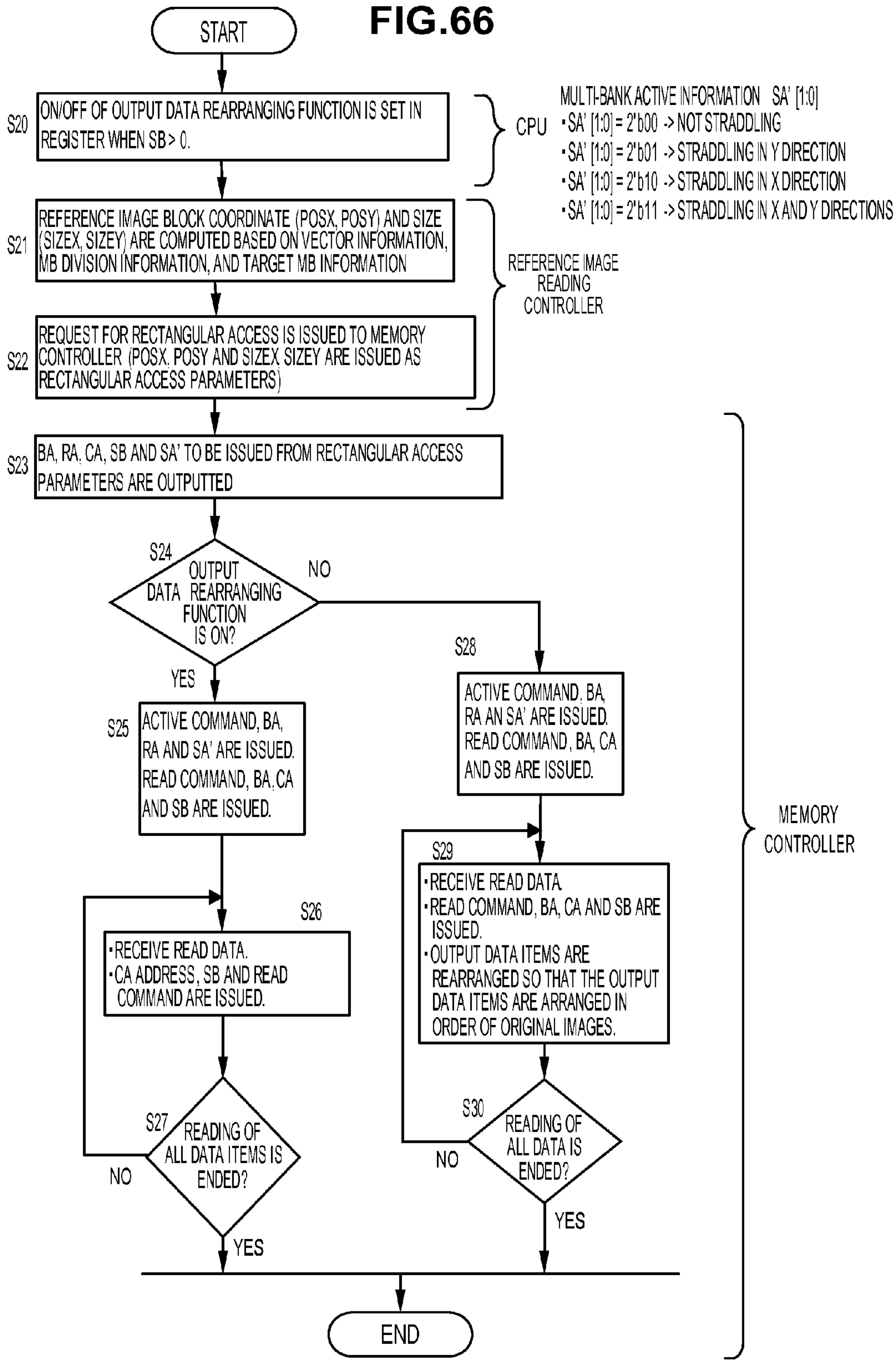
FIG. 66 A flowchart of the control operation of the memory controller.

FIG. 66 is a flowchart of the control operation of the memory controller. In this example, the memory controller can set whether or not the image memory to be controlled has a function of switching the input/output data in accordance with the endians shown in FIGS. 35 and 36. First, into the setting register of the memory controller, the host CPU sets the presence of an output data rearranging function within the image memory (S20). The reference image reading controller then computes the coordinate of the reference image block (POSX and POSY) and the size (SIZEX and SIZEY) on the basis of the motion vector information, macroblock division information, and target macroblock information (S21), and issues a rectangular access request to the memory controller along with the rectangular access parameters for the rectangular access (S22).

Next, the memory controller computes BA, RA, CA, SB and SA' to be issued when making the rectangular access, on the basis of these rectangular parameters (POSX and POSY) (SIZEX and SIZEY), and the memory map information and information on the frame image address that are set in the setting register (S23). Then, when the output data rearranging function is set to ON (YES in S24), the memory controller issues the bank address BA, row address RA and multi-bank information SA' along with the active command, and further issues the bank address BA, column address CA, and start byte information SB along with the read command (S25). Thereafter, the memory controller repeatedly issues the read command, BA, CA, and SB until reading of all data items is finished (S26 and S27).

On the other hand, when the output data rearranging function is set to OFF (NO in S24), the memory controller issues the bank address BA, row address RA, and multi-bank information SA' along with the active command, and further issues the bank address BA, column address CA, and start byte information SB along with the read command (S25). Thereafter, the memory controller repeatedly issues the read command, BA, CA, and SB until reading of all data items is finished, and rearranges the data items so that the received data items are arranged in order of the original image data items (S28, S29 and S30).

FIGS. 65 and 66 described above can be combined appropriately in accordance with the set items in the setting register.

It should be noted that the present embodiment explains an example of the image memory that stores digital image data in which image data items of a plurality of pixels are arranged two-dimensionally. However, the present invention can applied to not only the image memory for storing image data, but also a memory device that stores two-dimensionally arranged data, other than image data, on the basis of a predetermined mapping rule. When the stored data items are arranged two-dimensionally, in the case where an arbitrary rectangular area within the two-dimensionally arranged data is accessed, sometimes the data extending across a plurality of memory unit areas needs to be accessed. In this case as well, the present invention can be applied.

<<Multi-Bank Access>>

Next, there is described multi-bank access for preventing the decrease of access efficiency caused when accessing a rectangular area having a plurality of page areas as a problem of the rectangular access. The multi-bank access function involved in rectangular access has been already described with reference to FIG. 7.

Figure 67:
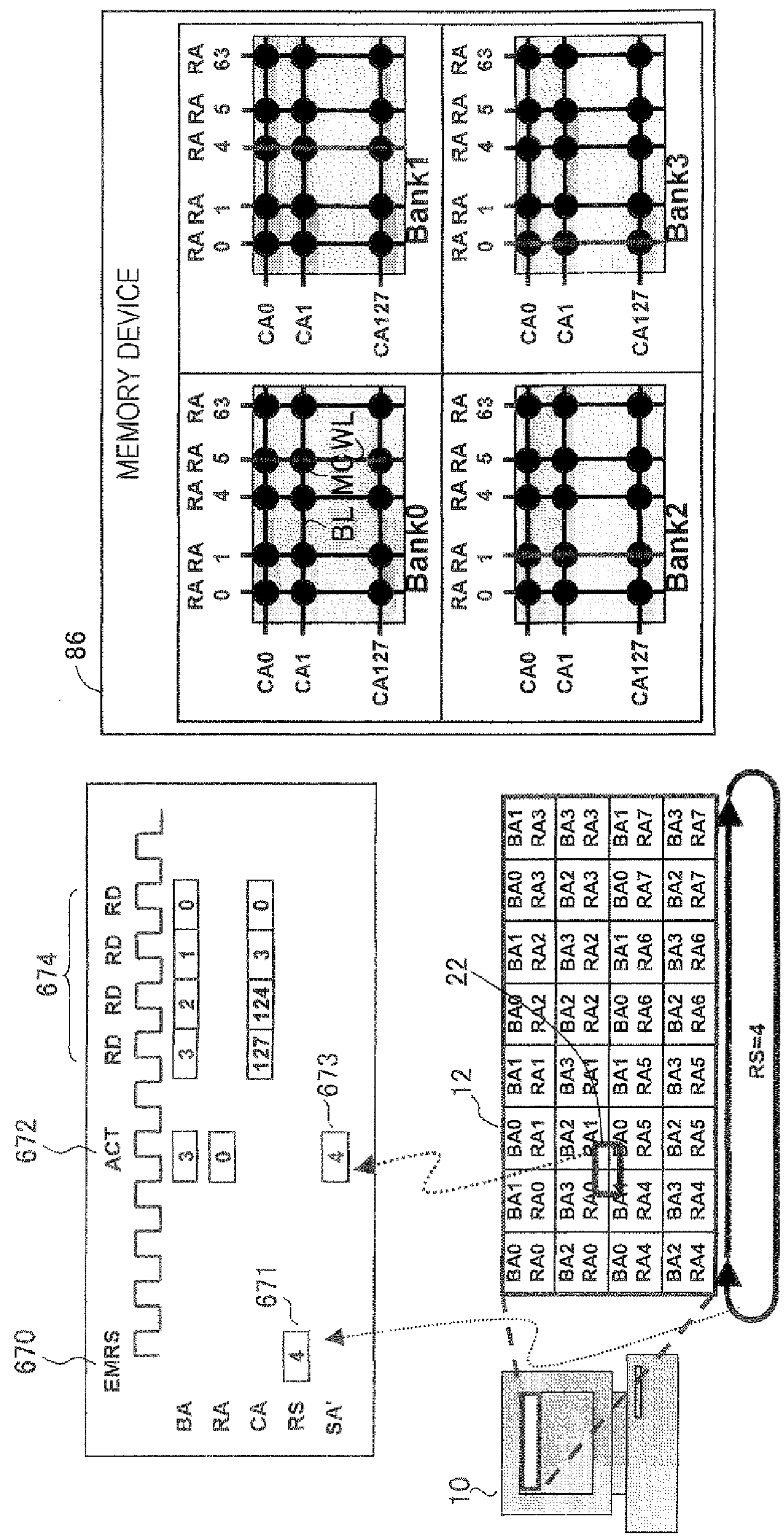
FIG. 67 A schematic explanatory diagram for explaining a multi-bank access according to the present embodiment.

FIG. 67 is a schematic explanatory diagram of multi-bank access according to the present embodiment. An access made to a rectangular area with respect to the image memory is generated in an arbitrary place. Therefore, in some cases, the rectangular access area 22 straddles the boundaries of page areas in the memory map 12, as shown in FIG. 67. In the example shown in FIG. 67, the rectangular access area 22 includes four page areas (page area of BA3 and RA0, page area of BA2 and RA1, page area of BA1 and RA4, and page area of BA0 and RAS).

According to the memory mapping 12, page areas that are adjacent to each other horizontally and vertically are allocated to different banks. Therefore, in order to access the rectangular area 22 shown in FIG. 67, the four banks Bank 0 through Bank 3 within the memory device 86 have to be accessed in order of Bank 3, Bank 2, Bank 1 and Bank 0. In an SDRAM, once the bank address BA and row address RA are specified and an active command is supplied, the word lines within a bank of the SDRAM (page areas) are activated. Thereafter, the memory unit areas within the activated page areas are accessed in response to a read command or write command specifying a bank address BA and column address CA. For this reason, in order to access the rectangular access area 22, the memory controller has to issue the active command for the four banks to the memory device four times. Such memory control results in a decrease of the access efficiency.

In the present embodiment, therefore, the memory device is set into a mode register that incorporates therein raw address step information RS=4 (a reference numeral 671 in the figure) supplied along with a command, in response to an extended mode register set command EMRS (a reference numeral 670 in the figure), as shown in the timing chart in FIG. 67. The row address step information RS indicates the number at which the row addresses RA are wrapped around in a row direction in the memory mapping 12. In the example shown in FIG. 67, since the row addresses RA0-RA3, RA4-RA7 are wrapped around, RS is 4. Since the memory mapping 12 is not changed frequently in a normal image system, the row address step information RS is preferably set into the mode register within the memory device, when the image system is activated.

Once a rectangular access is generated, the memory device is supplied with a bank address BA=3, row address RA=0 and multi-bank information SA'=4 (a reference numeral 673 in the figure) along with an active command ACT (a reference numeral 672 in the figure). More specifically, once the memory controller detects that the rectangular area to be accessed straddles the four page areas on the memory map, i.e., that the access needs to be made to the four banks, the memory controller supplies the number of access target banks, namely "4", as the multi-bank information SA' to the image memory device, in response to a rectangular access request sent from the image processing unit.

In response to this active command ACT and the multi-bank information SA', the memory device activates, the bank BA3, the bank BA2 adjacent thereto in the row direction, the bank BA1 adjacent to the same in the column direction, and the bank BA0 in the lower right. In this case, the row controller within the image memory generates a bank activation signal for each of the plurality of banks, and further generates a row address as a target of active operation within each bank, on the basis of the bank address BA=3, row address RA=0 and multi-bank information SA'=4 that are supplied along with the active command ACT, as well as the row address step information RS=4 that is stored in the mode register. According to the memory mapping 12 shown in the figure, the four row addresses as the target of active operation are, respectively, RA, RA+1, RA+RS, RA+RS+1, with respect to the supplied row address RA. These four row addresses are supplied to the corresponding four banks in response to the supplied bank address BA. Then, the plurality of banks within the memory device perform active operation on the basis of the bank activation signals and row addresses generated within the image memory.

Therefore, in the example shown in FIG. 67, a total of four page areas, namely the page area of BA3 and RA0, the page area of BA2 and RA1, the page area of BA1 and RA4, and the page area of BA0 and RA5, are activated in response to the single active command ACT. In specific operation of activation, the word lines WL are activated, the sense amplifiers are activated, and the potentials of the bit lines corresponding to the data items within the memory cells respectively are amplified.

Then, the memory device repeatedly supplies read commands RD (a reference numeral 674 in the figure) along with the bank address BA and the column address CA, and reads the data item of the corresponding memory unit area specified by a bank address BA and a column address CA, in response to each of the read commands. In the case of a write command, the memory device writes the data item to a memory unit area corresponding to a bank address BA and a column address CA that are supplied along with a write command. In the example shown in FIG. 67, the bank addresses BA=3, 2, 1 and 0 are supplied along with the four read commands RD, and column accesses are made sequentially to the four banks.

In this manner, according to the multi-bank access function of the present embodiment, the memory device responds to a single active command (first operation command) to perform active operation on the page areas of a plurality of access-target banks beforehand, on the basis of the bank address BA and row address RA to be supplied, the multi-bank information SA', and the row address step information RS that is set in advance. Therefore, in a subsequent column access, a bank address BA and a column address CA are supplied along with a read command or a write command properly, whereby the rectangular access is performed.

It should be noted in the example shown in FIG. 67 that the memory device calculates row addresses of a plurality of banks on ground of the row address step information RS=4 in the memory mapping 12. Therefore, if the memory mapping 12 is different, then the arithmetic expression for obtaining row addresses is also different accordingly. Thus, memory mapping information can also be set along with the row addresses by means of the extended mode register set command EMRS. Alternatively, bank address bits may be shuffled in accordance with the memory mapping information to calculate row addresses corresponding to predetermined memory mapping in the memory device.

Also, in the example shown in FIG. 67, although the multi-bank information SA' indicates 4, in the case in which SA'=2 representing two banks in a lateral direction, SA'=3 representing two banks in vertical direction, or SA'=1 representing per unit bank is supplied, the relevant banks are activated respectively. The abovementioned multi-bank information SA' indicating four types consists of two bits.

Figure 68:
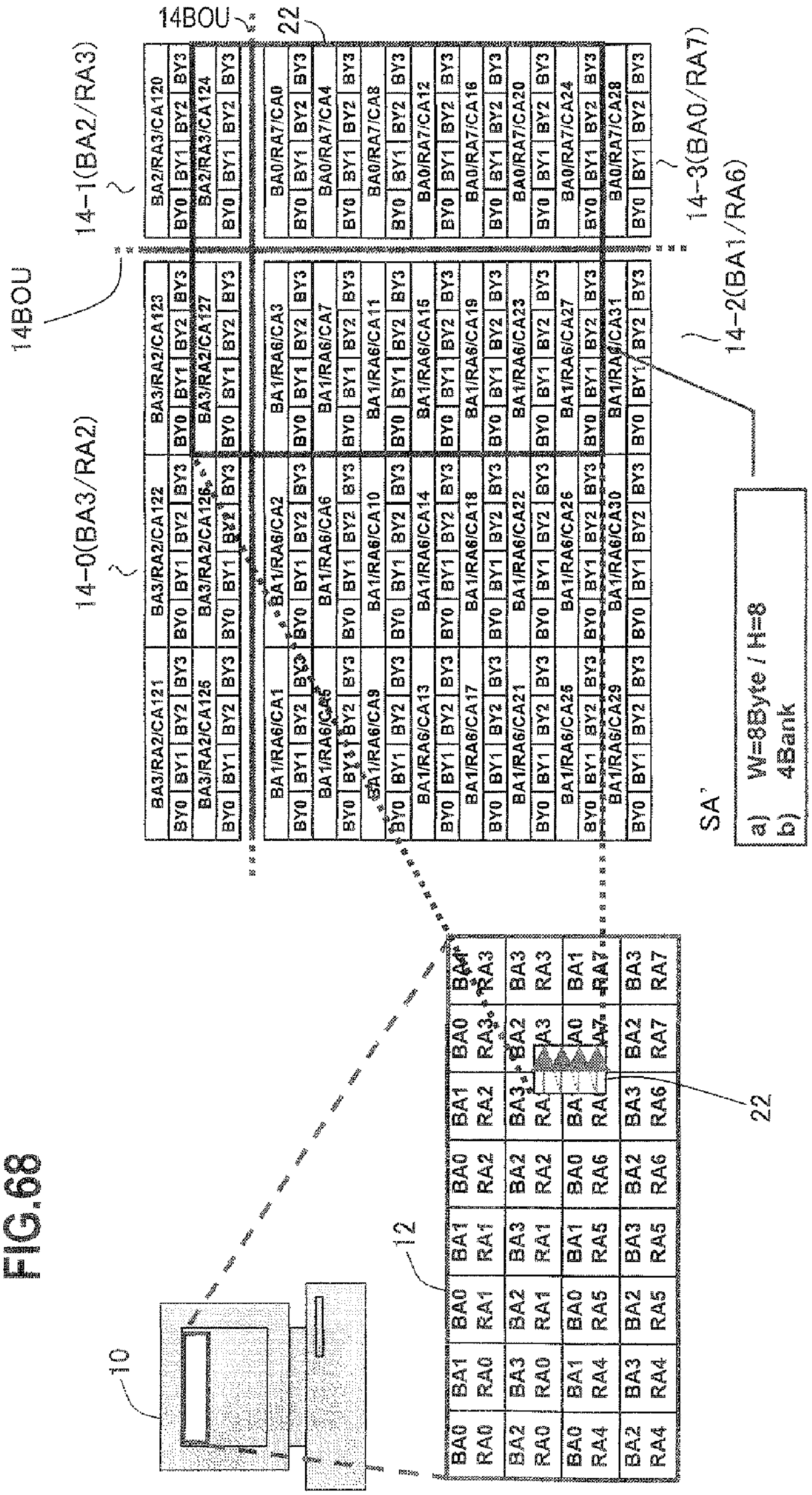
FIG. 68 A figure for explaining the multi-bank access according to the present embodiment.

FIG. 68 is a figure for explaining the multi-bank access according to the present embodiment. In FIG. 68, the rectangular area 22 is the access-target area. This rectangular access area 22 has four page areas, namely four banks 14-0, 14-1, 14-2 and 14-3, and is 2 clocks wide (8 bytes) in the lateral direction by 8 rows high in the vertical direction with the memory unit area of BA3, RA2, CA127 at the top. Therefore, the multi-bank information SA' for specifying the rectangular access area 22 may be either a) size information of the rectangular area (=width W, height H) or b) information on the number of banks (=4), which are shown in the figure.

The operation of the memory device corresponding to the above-described two types of multi-bank information SA' is described hereinafter with reference to FIG. 69 and FIG. 70.

Figure 69:
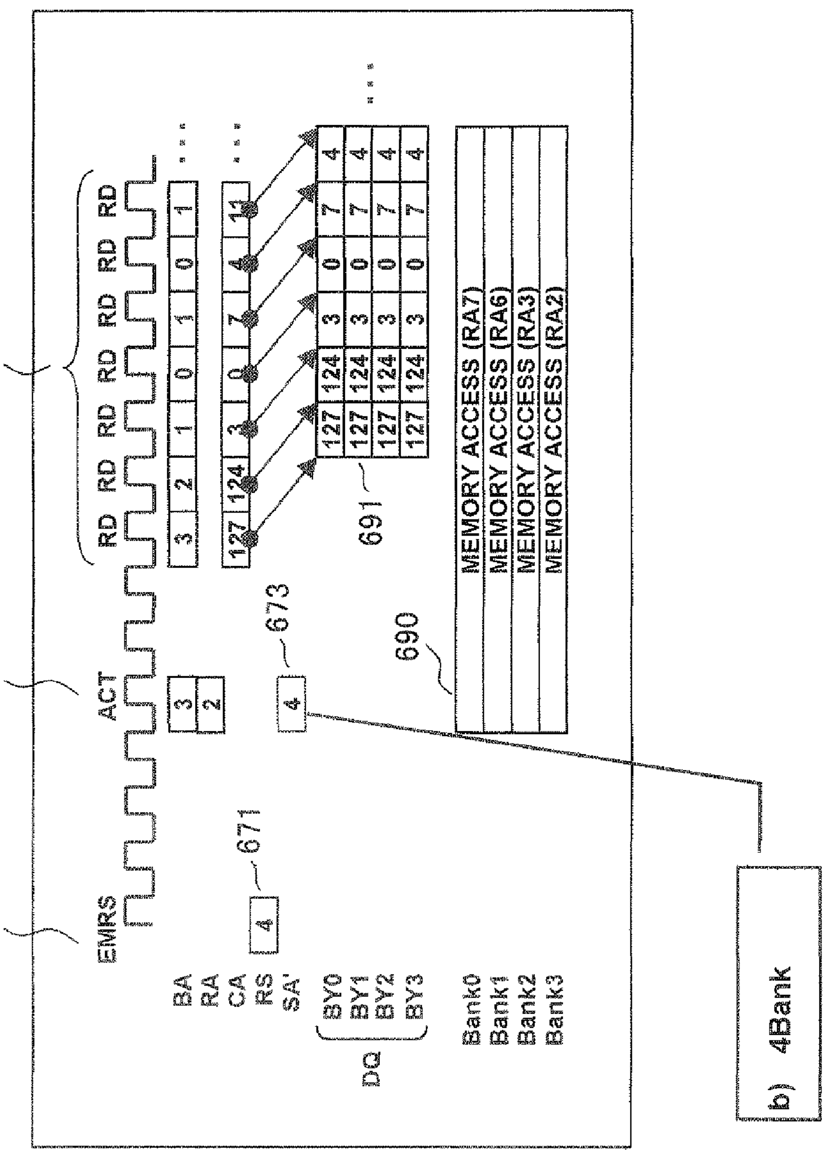
FIG. 69 A timing chart showing the case in which the multi-bank information SA' is the bank number information (=4).

FIG. 69 is a timing chart for the case in which the multi-bank information SA' is the information on the number of banks (=4). FIG. 69 shows the timing chart of FIG. 67, including column addresses CA (a reference numeral 691 in the figure) of output data for four bytes BY 0 through 3 of the input/output terminals DQ, as well as an access state (activation state) of each of the banks Bank 0 through 3 (a reference numeral 690 in the figure).

First of all, the memory device sets step number data RS=4 of the row addresses in the memory mapping to the mode register by means of the extended mode register set command EMRS. Then, in response to the bank address BA3 and row address RA2 for specifying the leading page area, as well as the multi-bank information SA'=4 (a reference numeral 673 in the figure), the bank address BA3, row address RA2 and the multi-bank information SA' being supplied along with the active command ACT, the memory device generates row addresses RA7, 6 and 3 within the four banks Bank 0 through 3, and performs active operation on the page areas corresponding to the four row addresses including the supplied row address RA2 (a reference numeral 690 in the figure). As a result, the four banks enter an active state and memory access thereto is now possible within the memory device.

Thereafter, addresses BA3/CA127, BA2/CA124, BA1/CA3, BA0/CA0 and the like are supplied along with sixteen read commands RD (a reference numeral 674 in the figure), in response to which the memory device outputs 4 bytes of data from the corresponding banks to the input/output terminals DQ respectively, after a predetermined latency.

Supply of SA'=4 as the multi-bank information SA' proves that an access is made to a 2×2 page area, so that the memory device can execute active operation on the four banks in response to the active command ACT. Moreover, once the row address RA of the leading bank is supplied, row addresses of the rest of the banks can be calculated on the basis of the row address step information RS.

Figure 70:
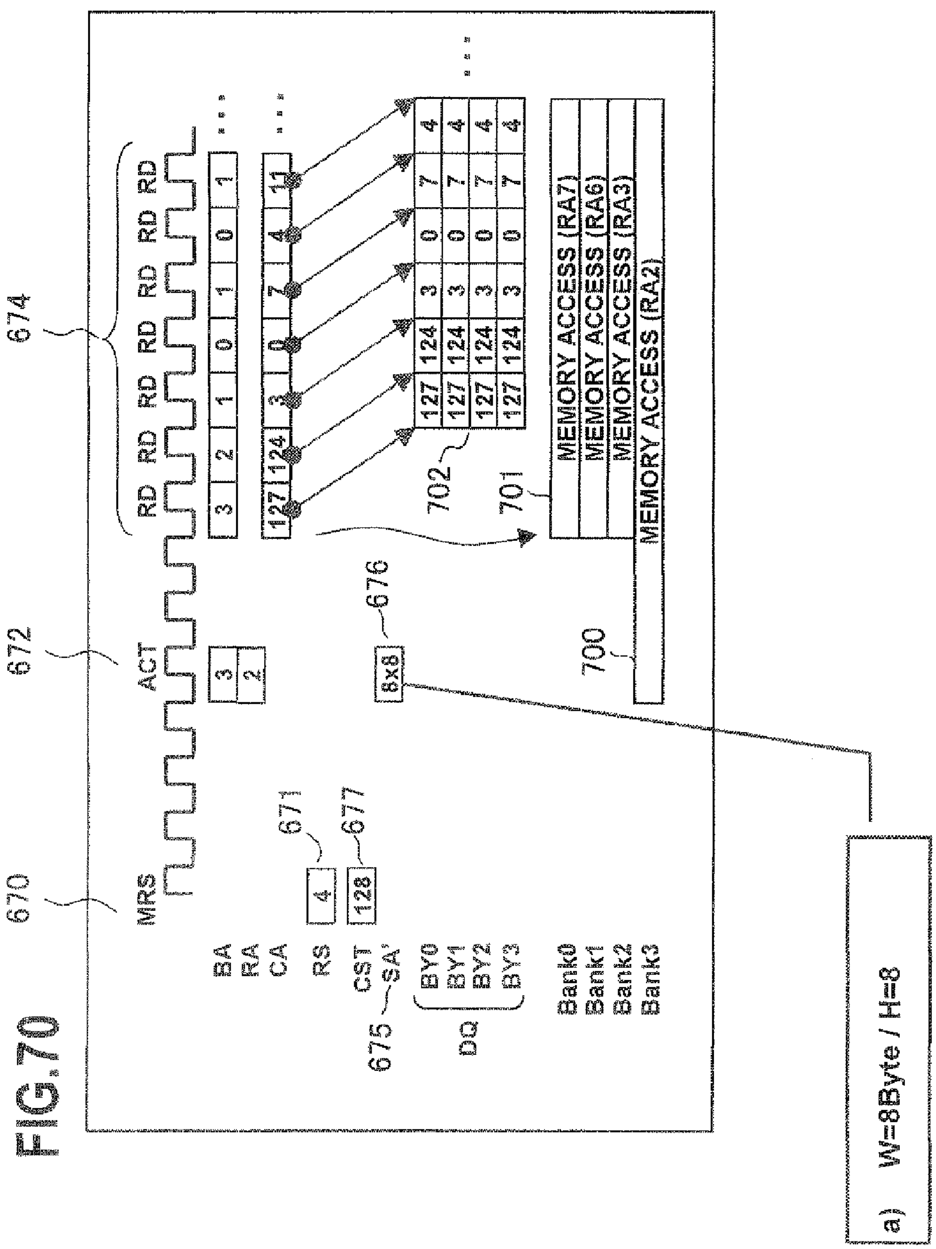
FIG. 70 A timing chart showing the case in which the multi-bank information SA' is the size information of a rectangular area (W=8 bytes, H=8 rows).

FIG. 70 is a timing chart for the case in which the multi-bank information SA' is the size information of the rectangular area (W=8 bytes, H=8 rows). This timing chart also shows the input/output terminals DQ and an access state of each of the four banks Bank 0 through 3.

The row address step number data RS=4 (a reference numeral 671 in the figure) and step number data of the column addresses within the page area, CST=128 (a reference numeral 677 in the figure), are set into the mode register by means of the extended mode register set command EMRS. Further, the bank address BA3 and row address RA2 are supplied along with the active command ACT (a reference numeral 672 in the figure), and the size information 8×8 of the rectangular access area (a reference numeral 676 in the figure) is supplied as the multi-bank information SA' (a reference numeral 675 in the figure). In response to this active command, the memory device performs active operation on the page area having the supplied addresses BA3 and RA2 (a reference numeral 700 in the figure). The memory device then obtains the rest of the banks Bank 0, 1 and 2 to be accessed, and the row addresses thereof RA 7, 6 and 3 on the basis of the step number data CST=128, the column address CA127 supplied along with the first read command RD, and the rectangle size information 8×8, and performs active operation on the page area of each of these banks (a reference numeral 701 in the figure).

Thereafter, the memory device outputs 4 bytes of data from each of the corresponding banks to the input/output terminals DQ (a reference numeral 702 in the figure) in response to the sixteen read commands (a reference numeral 674 in the figure).

In this manner, when the rectangle size is supplied as the multi-bank information SA', the memory device determines whether access is made across a plurality of banks, on the basis of the supplied column addresses and memory mapping (column address step number CST), generates an activation signal for each bank that is a target of active operation, as well as a row address of each bank, and performs active operation sequentially. Therefore, activation operation is performed on the banks Bank 0, 1 and 2 after the leading column address CA=127 is supplied.

Figure 71:
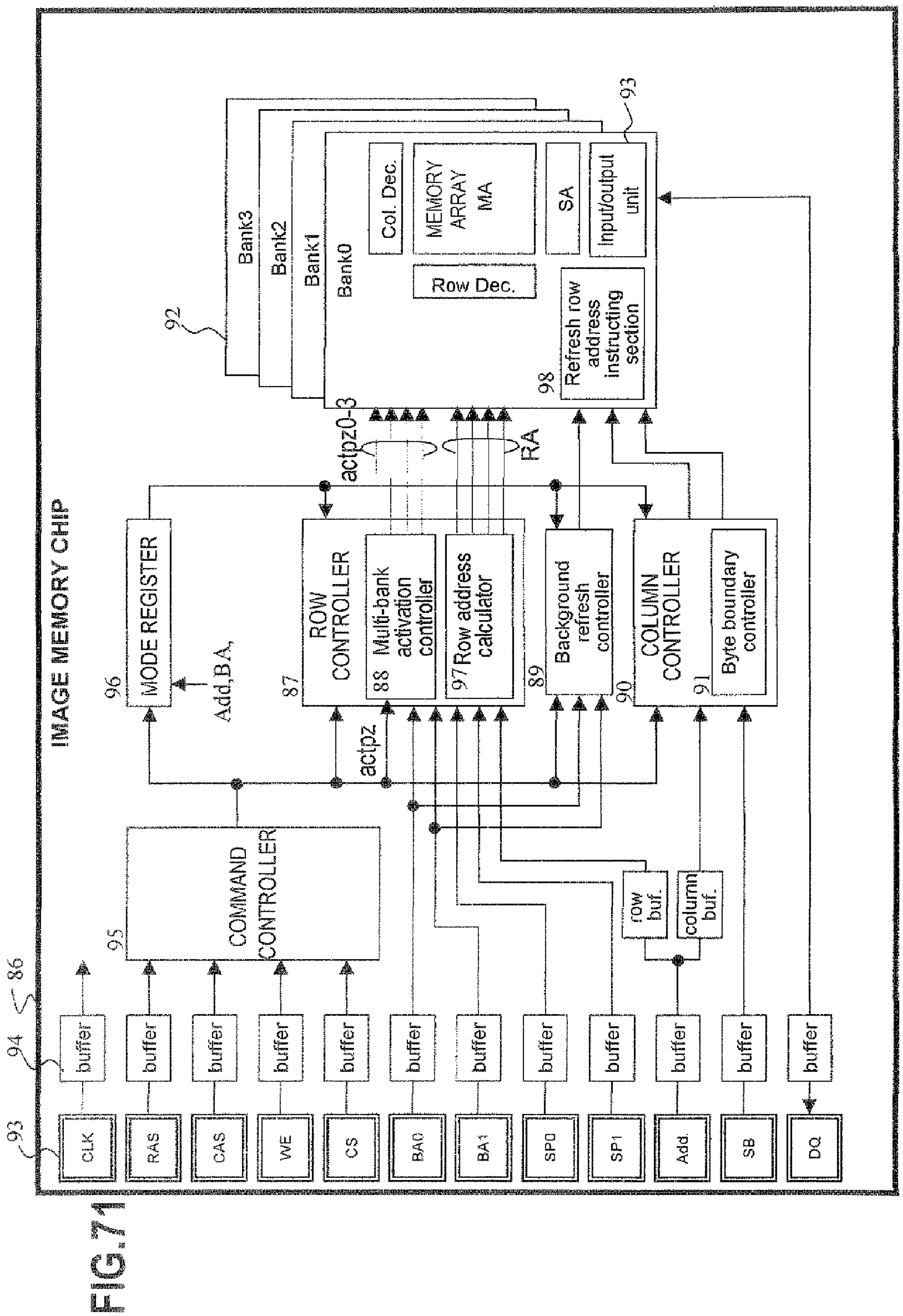
FIG. 71 A configuration diagram of the memory device having the multi-bank access function.

FIG. 71 is a configuration diagram of the memory device having the multi-bank access function. This figure is same as the configuration diagram of the memory device shown in FIG. 9. In the memory device 86, the row controller 87 has, in order to realize the multi-bank access function: a multi-bank activation controller 88 that generates pulsed bank activation signals actpz 0 through 3 provided to the banks to be activated; and a row address calculator 97 that generates row address RA of each bank, which is to be activated. Also, the memory device has special terminals SP0 and SP1 for supplying the multi-bank information SA'.

A command controller 95 decodes a command that is supplied from a combination of signals RAS, CAS, WE and CS specifying commands. The row address step number data RS of the memory mapping is supplied along with the extended mode register set command EMRS from address terminals Add, and the row address step number data RS are set into a mode register 96. In this case, the type of data that is set is specified by a bank address BA, and the step number data RS is set into a register area corresponding to this bank address BA.

The command controller 95 generates an active pulse actpz instructing for start of operation on the row side, in response to the active command ACT. The multi-bank activation controller 88 distributes this active pulse actpz to the banks to be activated, which are determined from the supplied bank address BA and the multi-bank number data SA'. This pulse signal to be distributes is the bank activation signals actpz 0 through 3. The multi-bank information SA' is inputted from the special terminals SP0 and SP1 when the active command ACT is issued. Also, the row addresses RA are inputted from the address terminals Add.

Moreover, the row address calculator 97 generates four row addresses RA, RA+1, RA+RS, and RA+RS+1 on the basis of the bank address BA and row address RA to be supplied, the step number data RS set in the mode register 96, and the memory mapping. Then, these four row addresses are supplied to a group of 2×2 banks having a bank with the supplied bank address BA on the upper left portion.

Each of the banks has a memory core having a memory array MA and a decoder Dec, and a core controller (not shown) that controls the memory core. The core controller performs activation control to the memory core within each bank in response to the bank activation signals actpz 0 through 3 described above. In this case, the abovementioned bank address BA is supplied to each row decoder, the corresponding word lines are driven, and then a group of sense amplifiers are activated. This is the activation operation (active operation) performed in the banks.

Hereinafter, operation of selecting banks to be activated within the memory device, control of the timing of bank activation, row address generating operation, and bank allocation setting operation in the memory mapping are specifically described as the functions required in the multi-bank access.

[Selecting Banks]

Figure 72:
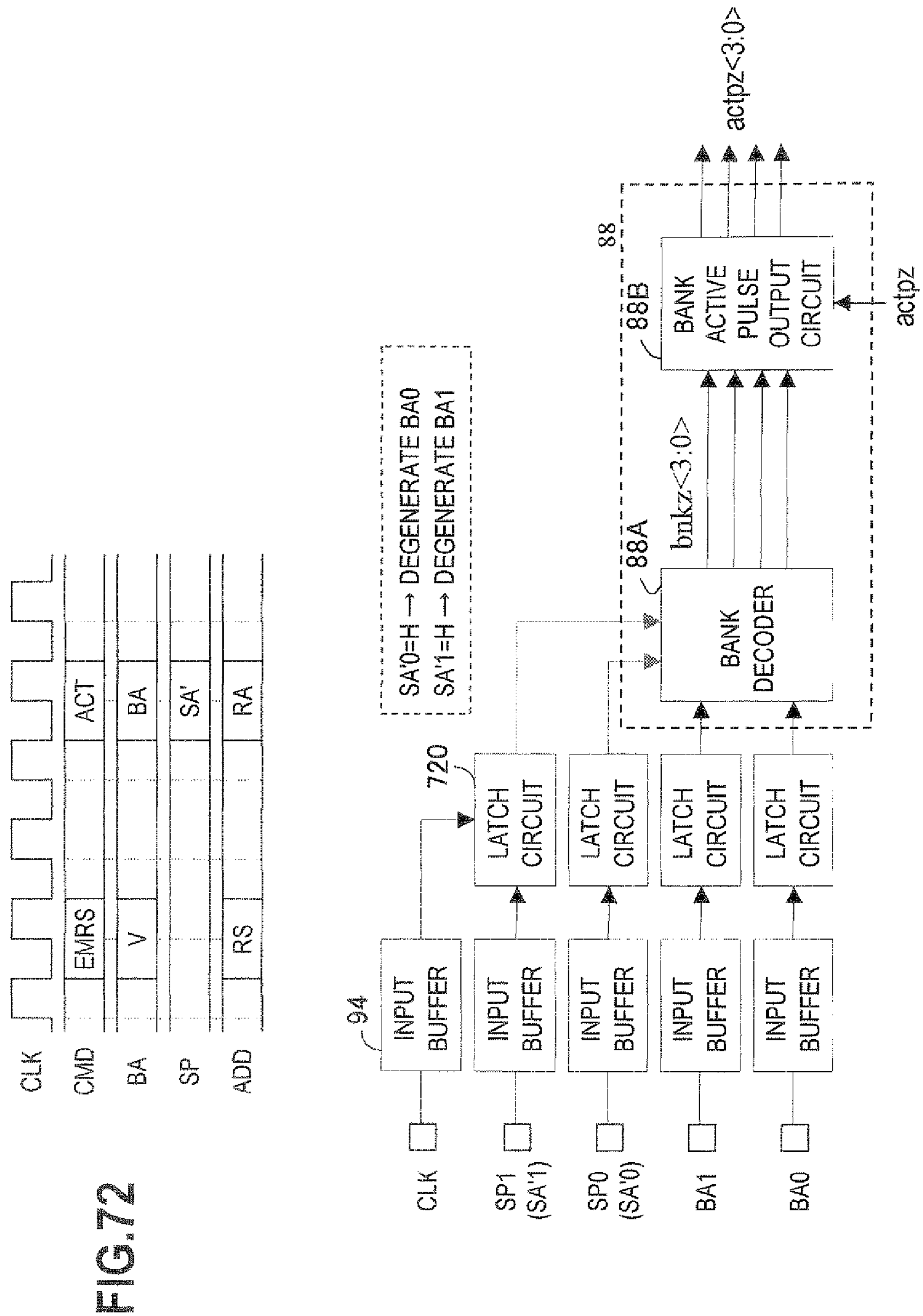
FIG. 72 A figure showing a first example of the multi-bank activation controller 88.
Figure 73:
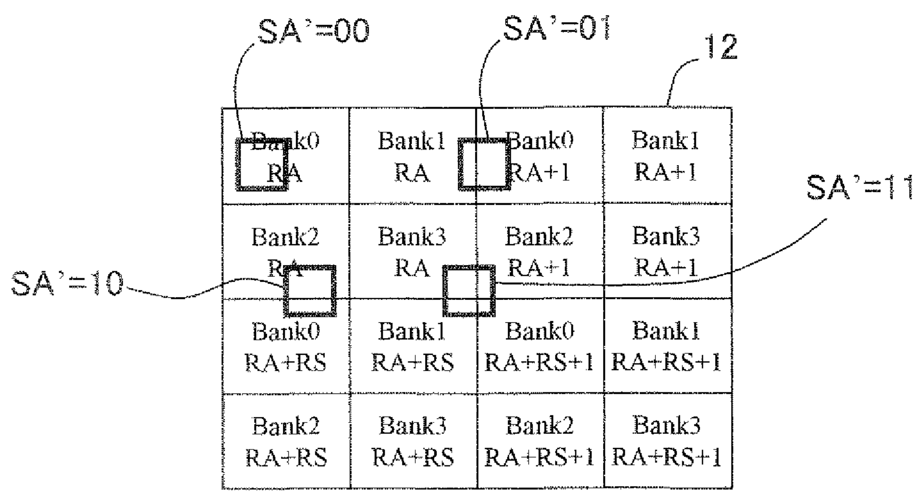
FIG. 73 A figure showing the first example of the multi-bank activation controller 88.

FIG. 72 and FIG. 73 are figures showing a first example of the multi-bank activation controller 88. FIG. 72 shows a configuration of the multi-bank activation controller 88 and a timing chart. In the first example, 2 bits of bank number data are supplied as the multi-bank information SA'.

The timing chart is same as the abovementioned example, wherein, along with the extended mode register set command EMRS, a register setting data V and the step number data RS are inputted to a bank address terminal BA and an address terminal ADD respectively, and then set into the mode register. Furthermore, a bank address BA, a row address RA, and the multi-bank information SA' are inputted along with the active command ACT.

The memory device latches the multi-bank information items SA' 0, 1 and bank addresses BA 0, 1 that are inputted to each input buffer 94 to a latch circuit 720 in synchronization with a clock CLK. The multi-bank activation controller 88 has a bank decoder 88A that decodes the bank addresses BA 0 and 1 to generate four bank selection signals bnkz<3:0>, and a bank active pulse output circuit 88B that generates bank activation signals actpz<3:0> allocated with the active pulses actpz, in response to the bank selection signals.

FIG. 73 shows a logical state of the bank decoder 88A corresponding to a rectangular area to be accessed. FIG. 73(A) shows four types of rectangular areas, and multi-bank information items SA' (00, 01, 10, 11) corresponding thereto.

FIG. 73(B) is a table showing logical processing performed by the bank decoder. As shown, in the case of SA'=00, the number of activated banks is 1 and the bank decoder 88A—decodes the bank addresses BA0 and BA1. Accordingly, the bank decoder 88A brings the bank selection signal bnkz<3:0> of only one bank selected by the supplied bank addresses BA0 and BA1 to H level. Along with this operation, the bank activation signal actpz<3:0> is generated only in the selected bank.

In the case of SA'=01, there are two banks to be activated in the horizontal direction, thus the bank decoder 88A degenerates (ignores) the bank address BA0 and brings the bank selection signal bnkz<3:0> of two banks selected only by the bank address BA1 to H level. Along with this operation, there is generated a bank activation signal actpz<3:0> of the bank selected by the supplied bank address and the adjacent bank, in the row direction.

In the case of SA'=10, there are two banks to be activated in the horizontal direction, thus the bank decoder 88A degenerates (ignores) the bank address BA1 and brings the bank selection signal bnkz<3:0> of two banks selected only by the bank address BA0 to H level. Along with this operation, there is generated a bank activation signal actpz<3:0> of the bank selected by the supplied bank address and the adjacent band, in the column direction.

In the case of SA'=11, there are a total of four banks to be activated in the horizontal and vertical directions, thus the bank decoder 88A degenerates (ignores) the bank addresses BA0 and BA1 and brings the bank selection signals bnkz<3:0> of all four banks to H level. Along with this operation, there are generated bank activation signals actpz<3:0> of four banks adjacent to, in the row and column directions, the banks selected by the supplied bank address.

Degeneration of the bank addresses performed by the bank decoder is a control of bringing the corresponding bank addresses BA and inversion signals/BA thereof to H level. Accordingly, the bank decoder 88A ignores these bank addresses and selects a bank by means of the remaining bank addresses.

Figure 74:
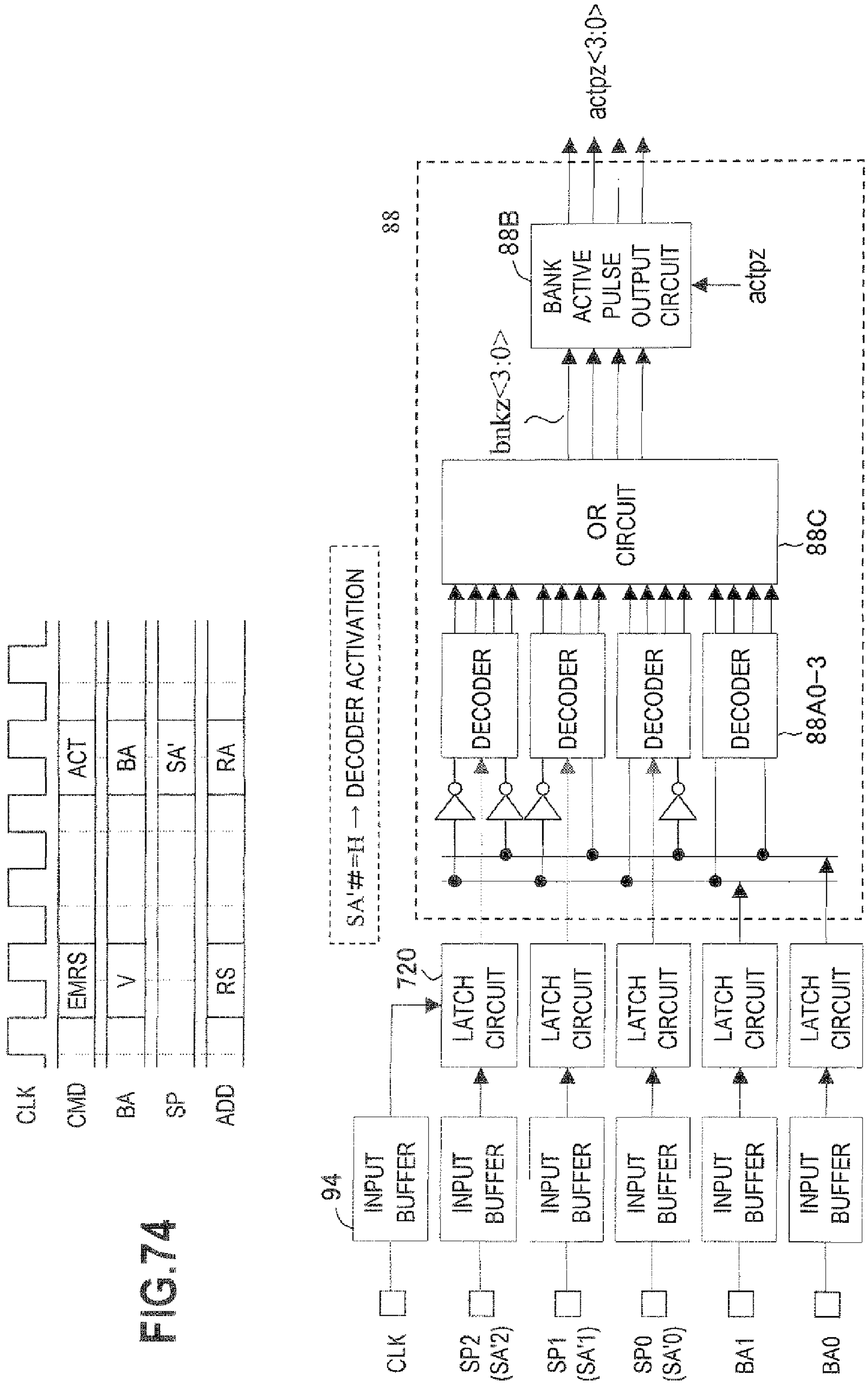
FIG. 74 A figure showing a second example of the multi-bank activation controller 88.
Figure 75:
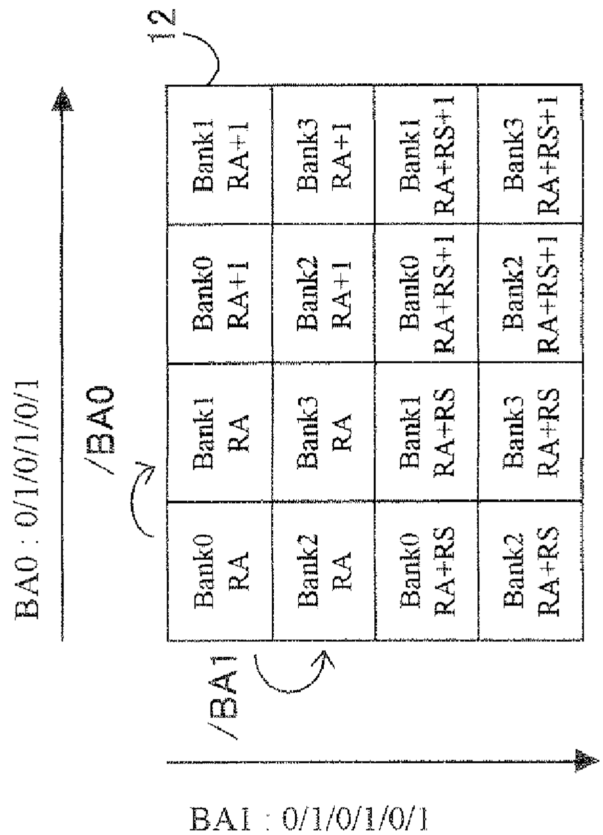
FIG. 75 A figure showing the second example of the multi-bank activation controller 88.

FIG. 74 and FIG. 75 are figures showing a second example of the multi-bank activation controller 88. FIG. 74 shows a configuration of the multi-bank activation controller 88 and a timing chart. In the second example, 3 bits of simultaneously-activated-bank data items SA' 0 through 2 are supplied as the multi-bank information SA'.

FIG. 75(A) shows a relationship of the memory mapping 12 to the bank addresses BA0 and BA1. More specifically, with respect to the supplied bank addresses BA0 and BA1, a bank on the right side can be selected by inverting the bank address BA0 and decoding it, a bank on the lower side can be selected by inverting the bank address BA1 and decoding it, and a bank on the lower right side can be selected by inverting the both bank addresses BA0 and BA1 and decoding them.

FIG. 75(B) shows the simultaneously-activated-bank data items SA' 0 through 2, banks to be selected, and logical processing performed by the bank decoder. More specifically, in the case of SA'0=H, the bank decoder inverts and inputs BA0 in order to select the right side bank in addition to the bank selected by the supplied address. In the case of SA' 1=H, the bank decoder inverts and inputs BA1 in order to select the lower side bank in addition to the bank selected by the supplied address. Furthermore, in the case of SA'2=H, the bank decoder inverts and inputs BA0 and BA1 in order to select the lower right bank in addition to the bank selected by the supplied address.

Returning to FIG. 74, the multi-bank activation controller 88 has four bank decoders 88A 0 through 3, an OR circuit 88C that subjects four decode signals of the bank decoders to a logical sum processing, and a bank active pulse output circuit 88B. The active pulse output circuit 88B is same as the one shown in FIG. 72. The four bank decoders 88A 0 through 3 are, starting from the bottom, a decoder that decodes the supplied bank addresses BA0 and BA1 to select an upper left bank, a decoder that inverts BA0 to select a bank on the right, a decoder that inverts BA1 to select a bank on the lower, and a decoder that inverts both BA0 and BA1 to select a lower right bank. Therefore, the top three bank decoders are activated in accordance with the simultaneously-activated-bank data items SA' 0 through 2 and outputs the corresponding bank selection signals bnkz<3:0>.

According to the second example described above, the upper left leading bank is selected by the supplied bank address, and the right, lower, and lower right banks are accordingly selected by 3 bits of simultaneously activated-bank data items SA' 0 through 2. Therefore, two banks in an oblique direction can be simultaneously activated, or three banks can be simultaneously activated, and a combination of banks to be simultaneously activated can be changed flexibly. Therefore, the second example can be accommodated to an access made to special areas.

Figure 76:
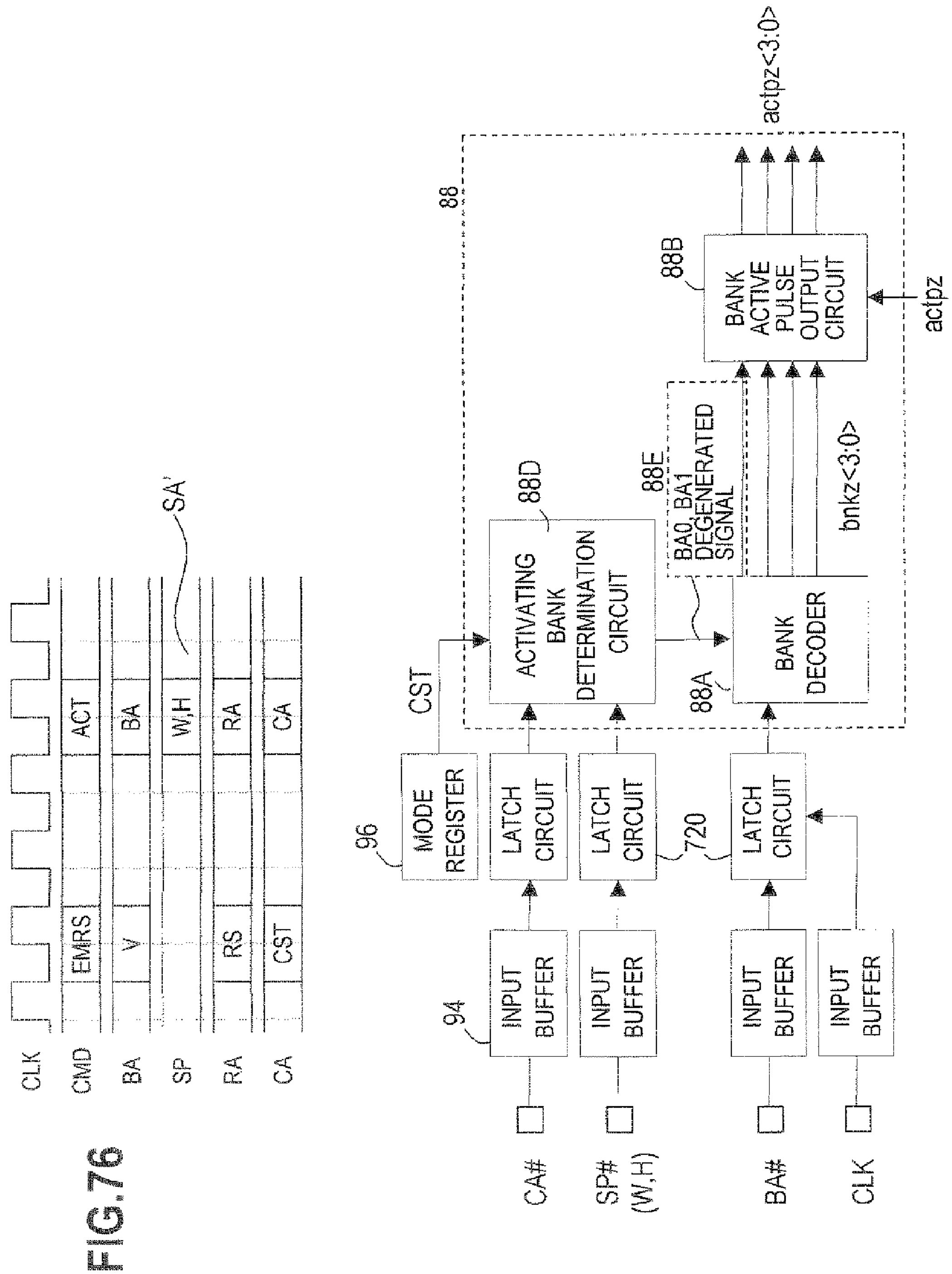
FIG. 76 A figure showing a third example of the multi-bank activation controller 88.

FIG. 76 and FIG. 77 are figures showing a third example of the multi-bank activation controller 88. FIG. 76 shows a configuration of the multi-bank activation controller 88 and a timing chart. In the third example, the rectangle size information W and H are inputted as the multi-bank information from the special input terminal SP. Therefore, the multi-bank activation controller 88 is provided with an activating bank determination circuit 88D. The activating bank determination circuit 88D determines banks to be simultaneously activated, on the basis of the step number data CST of column addresses within the page area, the rectangle size information W and H, and the column address CA.

As shown in the timing chart of FIG. 76, the memory device inputs the step number RS of a row address in the memory mapping and the step number data CST of a column address within a page area along with the extended mode register set command EMRS, and sets these, step number RS and step number data CST to the mode register. Next, the memory device inputs a bank address BA, a row address RA, and rectangular area size data W, H along with the active command ACT. At this moment, when the address of the memory device is inputted in a non-multiple manner, the column address CA is also inputted along with the active command ACT. Since a general SDRAM inputs addresses in a multiple manner, the column address CA is input-ted along with the read command or write command, as shown in FIG. 70.

The activating bank determination circuit 88D of the multi-bank activation controller 88 determines bank to be simultaneously activated, on the basis of the step number data CST, the rectangle size information W, H and the column address CA. This determination algorithm is shown in FIG. 77.

FIG. 77(A) shows information on the inside of a page area of memory mapping. Specifically, according to generalized memory mapping, when the column address consists of M bits, CA[M-1:0], and the step number CST=$2^{S}$, the horizontal direction is mapped by a lower column address CA[S-1:0] and the vertical direction is mapped by an upper column address CA[M-1:S] in the page area 14. Specifically, the positions of the page areas 14 in the horizontal direction can be determined by the lower S bits of column addresses CA, and the positions of same in the vertical direction can be determined by the upper M-S bits, from the column addresses CA to be inputted. Therefore, if the different between the position of the horizontal direction within a page area and the step number $2^S$ of the column address is smaller than the width W of the rectangular area, it means that the rectangular area straddles the banks in the horizontal direction, and if the difference between the position of the vertical direction and the height $2^{M-S}$ of the page area is smaller than the height H of the rectangular area, it means that the rectangular area straddles the banks in the vertical direction.

As shown in the activating bank determination algorithm of FIG. 77(B), (1) the condition of straddling the banks (page areas) in the horizontal direction is: 2S-CA[S-1:0]<W, and (2) the condition of straddling the banks (page areas) in the vertical direction is: 2M-S-CA[M-1:S]<H, with respect to the inputted column addresses CA.

To explain the example shown in FIG. 77(C), a page area 14X has 128 memory unit areas that are selected by 7 bits of column address CA[6:0], wherein the step number CST in the row direction is 16. If, for such page area 14X, the input column address CA=77 (decimal numeral), the rectangle size W=8 (8 clocks, 32 bytes) and H=8, the lower address CA[3:0] is 13 and the upper address CA[6:4] is 4, thus it is determined according to the above condition that the banks can be straddled in the horizontal direction and the vertical direction.

The activating bank determination circuit 88D uses the above-described determination algorithm to determine banks to be simultaneously activated. As a result, the activating bank determination circuit 88D outputs a bank address degenerate signal 88E to the bank decoder 88A. Specifically, in the case in which the banks in the horizontal direction are straddled, the bank address BA0 is degenerated, and in the case in which the banks in the vertical direction are straddled, the bank address BA1 is degenerated. This degenerate signal 88E is the same as the multi-bank information SA'0, 1 shown in FIG. 72.

More specifically, in the third example, the activating bank determination function that the memory controller performs in the first and second examples is provided in the memory device. If the activating bank determination algorithm described above is provided within the memory controller, the multi-bank information SA'0, 1 shown in FIG. 72 can be supplied from the memory controller to the memory device.

As described above, in order to realize the multi-bank activation function, the multi-bank activation controller 88 generates the bank selection signal bnkz<3:0> of a bank to be activated, on the basis of the input data, further generates the bank activation signal actpz<3:0> on the basis of the generated bank selection signal bnkz<3:0>, and controls the activation operation of the banks to be activated.

[Bank Activation Timing]

The multi-bank activation controller 88 supplies the bank activation signal actpz<3:0> to banks to be activated, and each of the banks starts the activation operation on a page area in response to this bank activation signal. In this case, it is preferred to control the timing for activating a plurality of banks. For example, a control for performing the activation control on the plurality of banks simultaneously, and a control for performing the activation operation on the plurality of banks at different times can be considered. In the former case, there are no restrictions on timings for inputting a subsequent read command or write command. In the latter case, on the other hand, the plurality of banks do not perform the activation operation simultaneously, thus an instantaneous increase of consumed current can be avoided.

Figure 78:
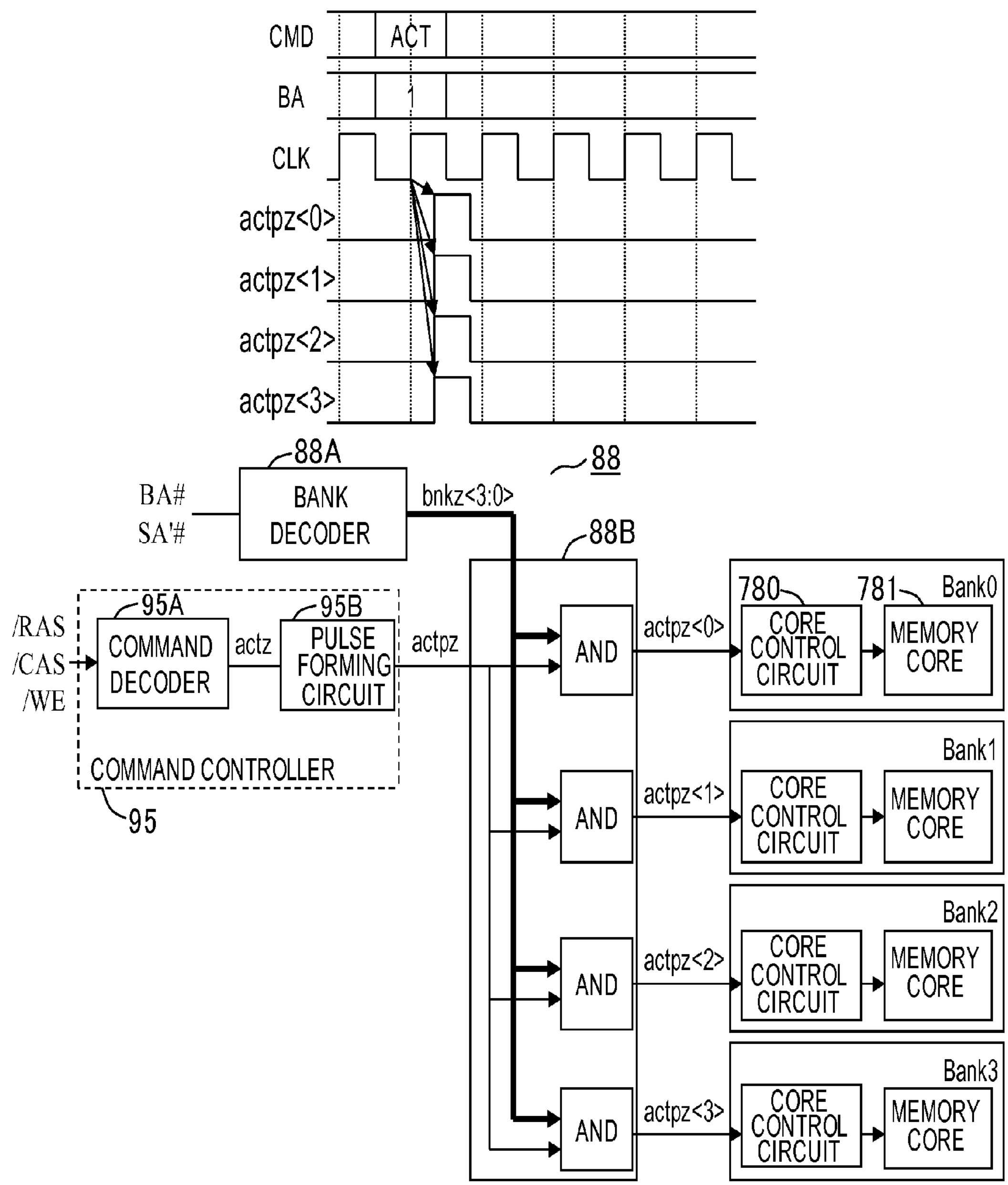
FIG. 78 A figure showing Example 1 of bank activation timing.

FIG. 78 shows Example 1 of the bank activation timing. In this example, a plurality of banks are simultaneously subjected to the activation operation. As described above, the multi-bank activation controller 88 has the bank decoder 88A for selecting banks to be activated, and the bank active pulse output circuit 88B for distributing an active pulse actpz obtained from the command controller 95 to the selected banks, on the basis of an activating bank selection signal bnk<3:0>. As shown in the timing chart of the figure, the bank active pulse output circuit 88B is constituted by four AND gates, and outputs the bank activation signals actpz<3:0> at the same timing.

Each of banks bank 0 through 3 has a memory core 781 including a memory cell array, and a core control circuit 780 for controlling the memory core. In response to the bank activation signals actpz<3:0>, each core control circuit 780 activates a row decoder within the memory core 780, drives the word lines corresponding to the row addresses, and activates a row of sense amplifiers.

In Example 1 shown in FIG. 78, a plurality of banks to be activated are simultaneously subjected to active operation in response to the active command ACT, thus the subsequent read command or write command can be sequentially inputted to access the plurality of banks.

Figure 79:
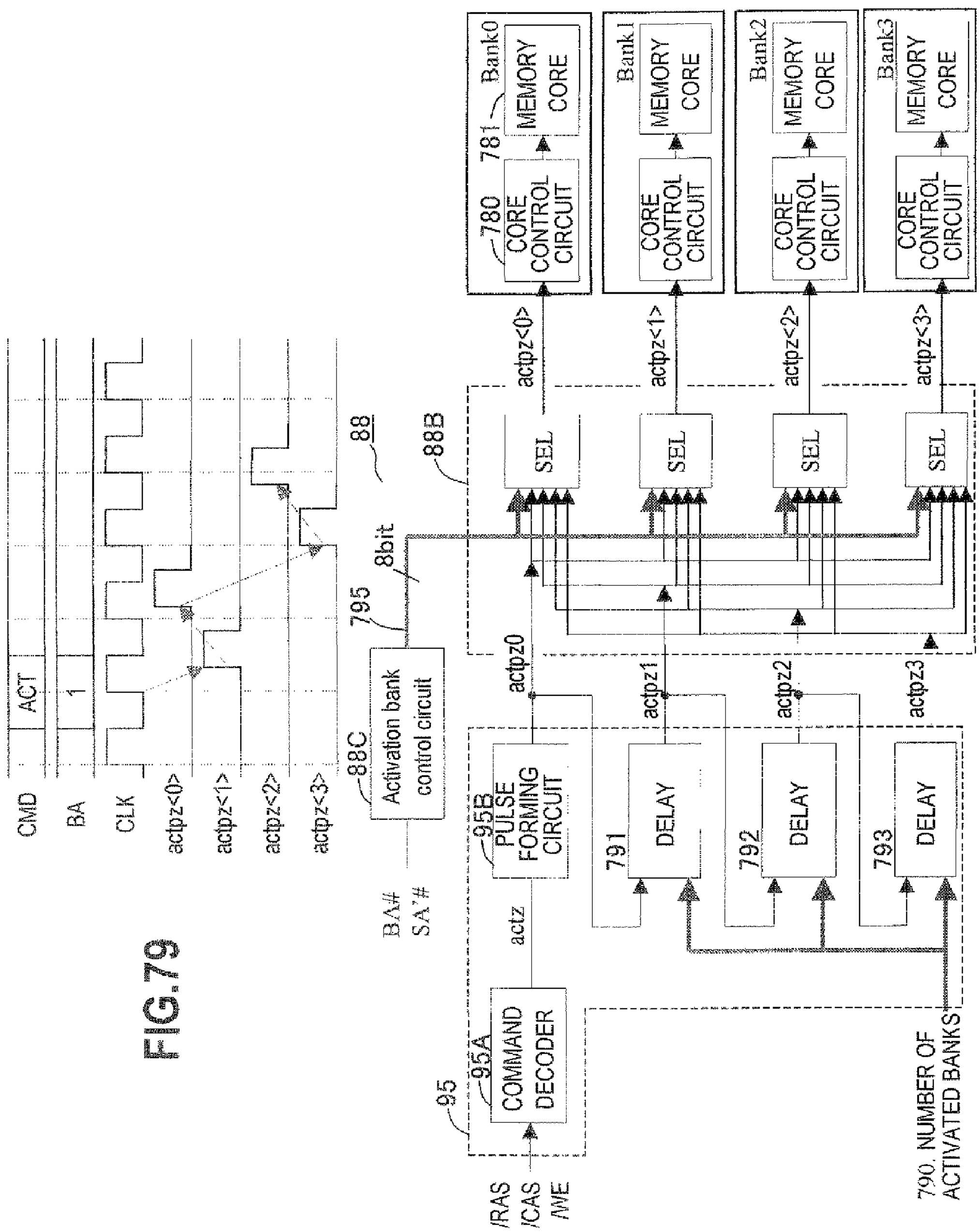
FIG. 79 A figure showing Example 2 of bank activation timing.

FIG. 79 is a figure showing Example 2 of the bank activation timing. In this example, the plurality of banks are subjected to the activation operation sequentially at different timings. The command controller 95 has three delay circuits 791, 792, 793 in addition to a command decoder 95A and a pulse forming circuit 95B. These three delay circuits are activated in response to an activated-bank number signal 790, and delay the active pulse actpz 0 generated by the pulse forming circuit 95B by a predetermined time period, to generate three delay active pulses actpz 1 through 3. The active pulse actpz 0 and the delay active pulses actpz 1 through 3 are supplied to each of four selectors SEL of the bank active pulse output circuit 88B.

The multi-bank activation controller 88 is constituted by an activating bank control circuit 88C and the bank active pulse output circuit 88B. The activating bank control circuit 88C has incorporated therein the function of the bank decoder described above, determines an order of performing activation on banks to be activated, on the basis of the supplied bank address BA[1:0] and the multi-bank data SA'[1:0], and supplies a selection signal 795 to the selectors SEL. This selection signal 795 consists of 8 bits. Two bits of the selection signal are supplied to each selector, and each selector outputs the bank activation signal actpz<3:0> to the banks to be activated, in response to the selection signal 795.

It should be noted that the delay circuits 791 through 793 generate the necessary delay active pulses actpz 1 through 3 in accordance with the activated-bank number data 790, and thereby enables power saving.

FIG. 80 is a figure for explaining the logic of the bank activation timing control performed by the activating bank control circuit 88C. FIG. 80 shows tables 800, 801 and 802 of the data on the order of activating the four banks (2 bits in binary display) for the case where the multi-bank data SA'[1:0]=11, 01, 10.

In the case in which the multi-bank data SA'[1:0]=11, all of the four banks are activated, and the activation order (00, 01, 10, 11) differs according to the supplied bank addresses BA[1:0], as shown in the activation order data table 800. For example, in the case in which the supplied bank address BA[1:0]=00, activation control is performed in order of the banks Bank 0, 1, 2 and 3. The activation order data (8 bits of 00, 01, 10, 11) shown in the table 800 corresponds to the 8-bit selection signal 795 that is generated by the activation bank control circuit 88C shown in FIG. 79. Specifically, each of the four selectors SEL selects the active pulse actpz 0 and the three delay active pulses actpz 1, actpz 2, and actpz 3. As a result, the bank activation signals actpz <0> through <3> are generated sequentially.

Furthermore, in the case in which the supplied bank address BA[1:0]=01, the activation control is performed in order of the banks Bank 1, 0, 3 and 2. The bank activation signals actpz <0> through <3> in this case are shown in the timing chart of FIG. 79. The activation order data (8 bits of 01, 00, 11, 10) shown in the table 800 is supplied as the selection signal 795 to the selectors, and each of the four selectors SEL selects the delay active pulse actpz 1, active pulse actpz 0, and delay active pulses actpz 3 and actpz 2, beginning at the top of selectors. As a result, as shown in the timing chart, the bank activation signals actpz <1>, <0>, <3> and <2> are generated in this order.

Similarly, in the case in which the multi-bank data SA'[1:0]=01, two banks in the horizontal direction are activated, and, as shown in the activation order data table 801, two activation order data items (00, 01) are generated in response to the supplied bank addresses BA[1:0].

Similarly, in the case in which the multi-bank data SA'[1:0]=10, two banks in the vertical direction are activated, and, as shown in the activation order data table 802, two activation order data items (00, 10) are generated in response to the supplied bank addresses BA[1:0]. According to this table 802, in order to activate the two banks, the active pulse actpz 0 and the delay active pulse actpz 2 are used to generate a bank activation signal, since the table 802 and the table 800 are in common. Specifically, as shown in a timing chart 803 below the table 802, the internal active command ACT is generated at the timing of the active pulse actpz 0 and of the delay active pulse actpz 2 in response to a supplied active command ACT.

Therefore, in the case in which the multi-bank data SA'[1:0]=10, the activation order data (00, 01) shown in a table 804 may be generated, in place of the one shown in the table 802. In this case, as shown in a timing chart 805 below the table 804, the internal active command ACT is generated at the timing of the active pulse actpz 0 and of the delay active pulse actpz 1 in response to the supplied active command ACT. Specifically, the two banks to be activated simultaneously are activated successively at different timings.

Figure 81:
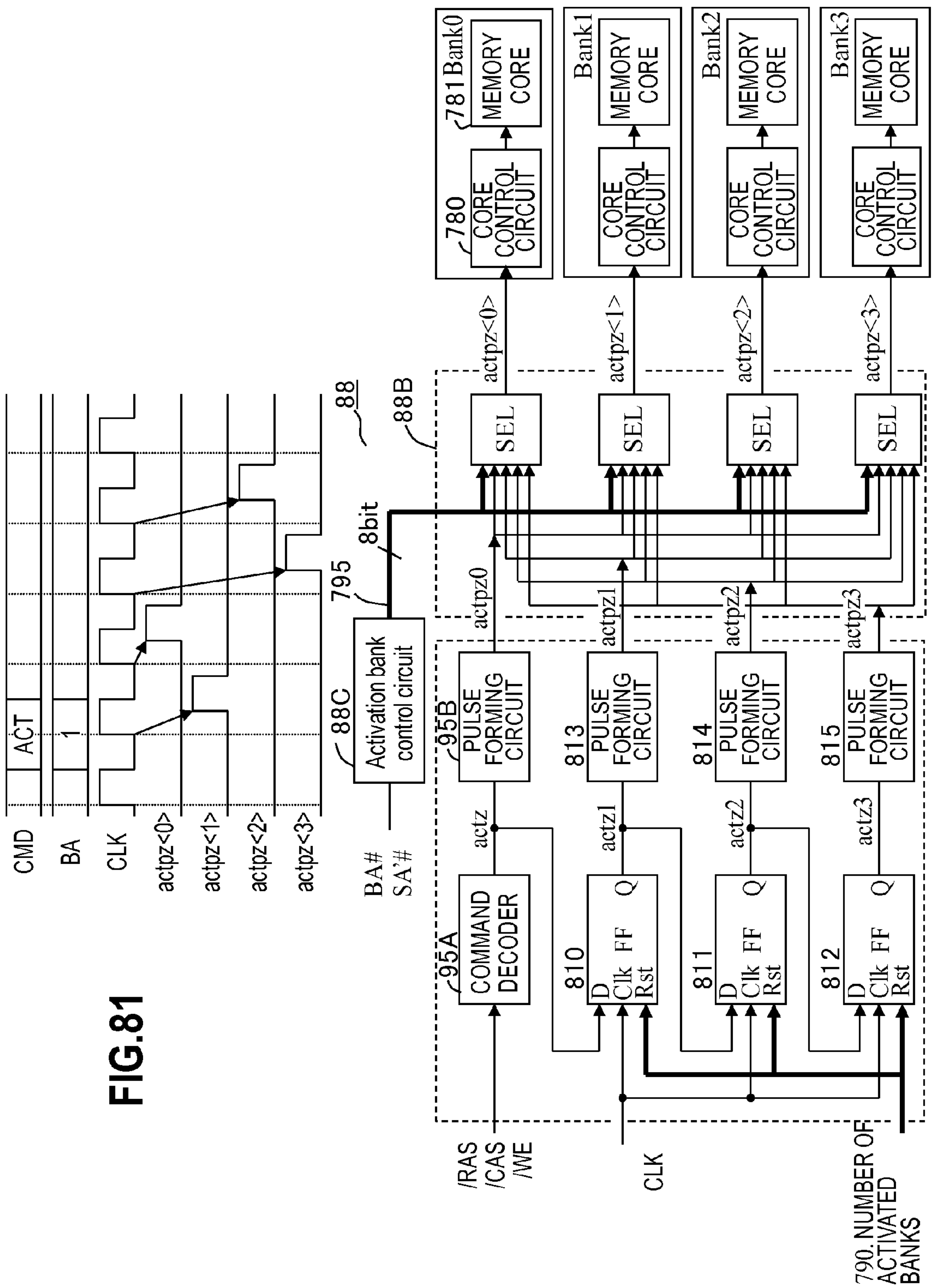
FIG. 81 A figure showing Example 3 of the bank activation timing.

FIG. 81 is a figure showing Example 3 of the bank activation timing. In this example, a plurality of banks are subjected to the activation operation successively at different timings. In FIG. 81, in place of the delay circuits 791 through 793 shown in FIG. 79, there are provided flip-flop circuits 810 through 812 that are operated in synchronization with the clock CLK. Other configurations are the same as those shown in FIG. 79. The activation bank control circuit 88C also is as described in FIG. 79 and FIG. 80.

According to this Example 3, since the delay circuits are the flip-flop circuits 810 through 312 synchronized with the clock CLK, three delay active pulses actpz 1 through 3 are generated from the active pulse actpz 0 at the delay timing synchronized with the clock CLK. Specifically, as shown in the timing chart of FIG. 81, the bank activation signals actpz <0> through <3> are outputted sequentially in synchronization with the clock CLK. Accordingly, when the clock CLK is accelerated, the bank activation signals actpz <0> through <3> follow the acceleration and are generated sequentially at high speed, and when the clock CLK is decelerated, the bank activation signals actpz <0> through <3> are generated sequentially at low speed accordingly. Therefore, clock synchronization can be operated.

[Generating Row Address]

The multi-bank access function of the present embodiment performs activation control on all page areas of the banks required to be accessed, in response to the active command ACT inputted once, a bank address, and a row address. Therefore, on the basis of the supplied bank address and row address, the banks required to be activated need to be determined, and row addresses need to be generated for specifying page areas required to be activated.

Figure 82:
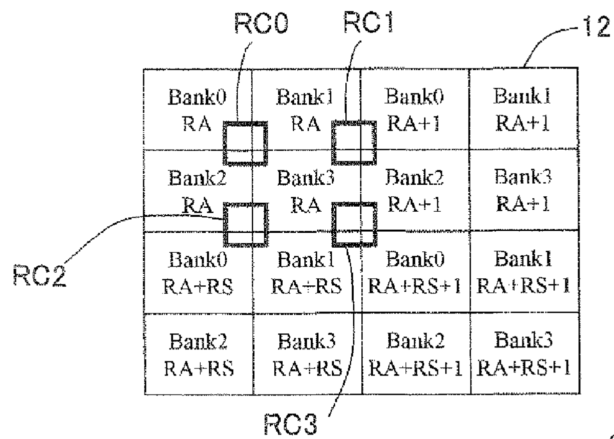
FIG. 82 A figure for explaining generation of row addresses in the multi-bank access according to the present embodiment.

FIG. 82 is a figure for explaining generation of row addresses in the multi-bank access of the present embodiment. This figure shows the memory mapping 12, a logical value table 820 showing supplied bank addresses BA 0, 1 corresponding to rectangular access areas RC 0 through 3, as well as a row address RA as a target of activating each bank. The memory mapping 12 is the same as the one described above, wherein, in the page areas arranged in the row and column directions, the banks of the page areas adjacent to each other vertically and horizontally are different from each other, and the row address is incremented by one for every four banks Bank 0 through 3 adjacent to one another vertically and horizontally.

According to this memory mapping 12, in the case of a rectangular area RC0 to be accessed, it is evident from the supplied bank address BA=BA0 (=00) and the supplied row address RA=RA0 that the addresses of page areas to be activated simultaneously are BA0/RA0, BA1/RA0, BA2/RA0, BA3/RA0. In the case of a rectangular area RC1, it is evident from the supplied bank address BA=BA1 (=01) and row address RA=RA0 that the addresses of page areas to be activated simultaneously are BA1/RA0, BA0/RA1, BA3/RA0, BA2/RA1. In the case of a rectangular area RC2, it is evident from the supplied bank address BA=BA2 (=10) and row address RA=RA0 that the addresses of page areas to be activated simultaneously are BA2/RA0, BA3/RA0, BA0/RA(0+RS), BA2/RA(0+RS). In the case of a rectangular area RC3, it is evident from the supplied bank address BA=BA3 (=11) and row address RA=RA0 that the addresses of page areas to be activated simultaneously are BA3/RA0, BA2/RA(0+1), BA1/RA(0+RS), BA2/RA(0+RS+1).

To generalize the above addresses, in the case in which the supplied row address is RA and the step number of the row address of the memory mapping 12 is RS, a row address to be generated in each of the banks Bank 0 through 3 is as shown in the logical value table 820 in response to the supplied bank addresses BA0, BA1. Specifically, the row addresses to be generated are as follows:

BA=00:RA, RA, RA, RA
BA=01:RA+1, RA, RA+1, RA
BA=10:RA+RS, RA+RS, RA, RA
BA=11:RA+RS+1, RA+RS, RA+1, RA

Therefore, the row address calculator 97 shown in FIG. 71 generates the row address shown in the logical value table 820 in each of the banks Bank 0 through 3, in response to the supplied bank address BA and row address RA.

Figure 83:
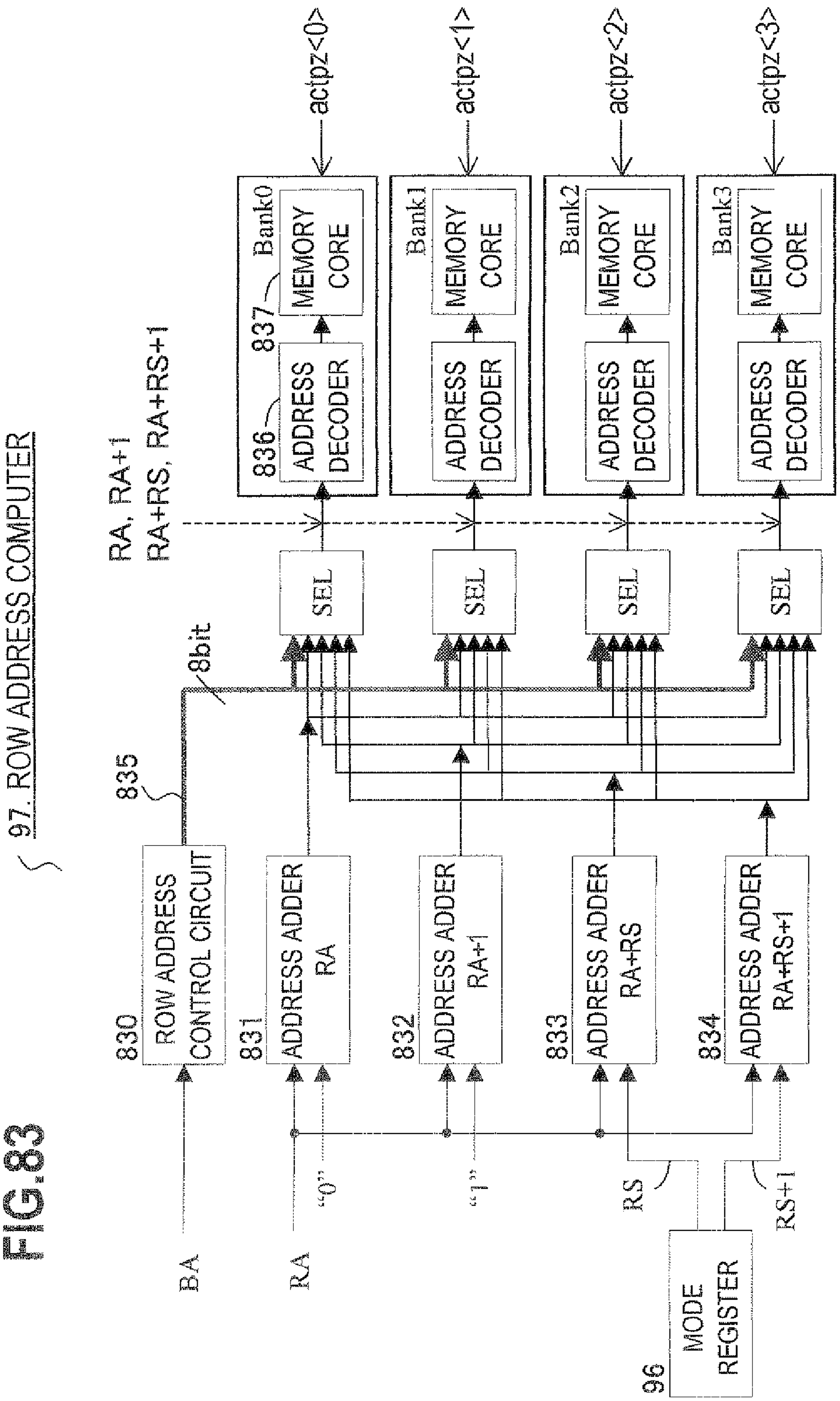
FIG. 83 A figure showing Example 1 of the row address computer according to the present embodiment.

FIG. 83 is a figure showing Example 1 of the row address calculator according to the present embodiment. The row address calculator 97 has: address adders 831 through 834 for adding 0, 1, RS, RS+1 to the supplied row addresses RA; selectors SEL, each of which selects any of the outputs of the address adders and supplies the selected output to an address decoder 836 of each bank; and a row address control circuit 830 that supplies a selection signal 835 to the selectors SEL. The row address control circuit 830 generates the selection signals (2 bits each, 8 bits total) shown in the logical value table 821 of FIG. 82, in response to the bank addresses BA to be supplied. Moreover, the step number data RS and RS+1 of the row address are supplied from the mode register 96 to the address adders 833 and 834 respectively, and fixed values "0" and "1" are supplied to the address adders 831 and 832 respectively. Accordingly, the adder 831 outputs the supplied row address RA as it is.

For example, in the case in which the supplied bank address BA=01, the row address control circuit 832 generates "01, 00, 01, 00" as the selection signal 835, in response to which each of the selectors SEL selects RA+1, RA, RA+1, RA, beginning at the top, and supplies the selected row addresses to the address decoders 836 of the banks respectively. In the banks, the address decoders 836 of selected banks are activated in response to the abovementioned bank activation signal actpz<3:0>, the activated address decoders then decode the above-described row addresses RA+1, RA, RA+1, RA, and corresponding word lines are activated.

Figure 84:
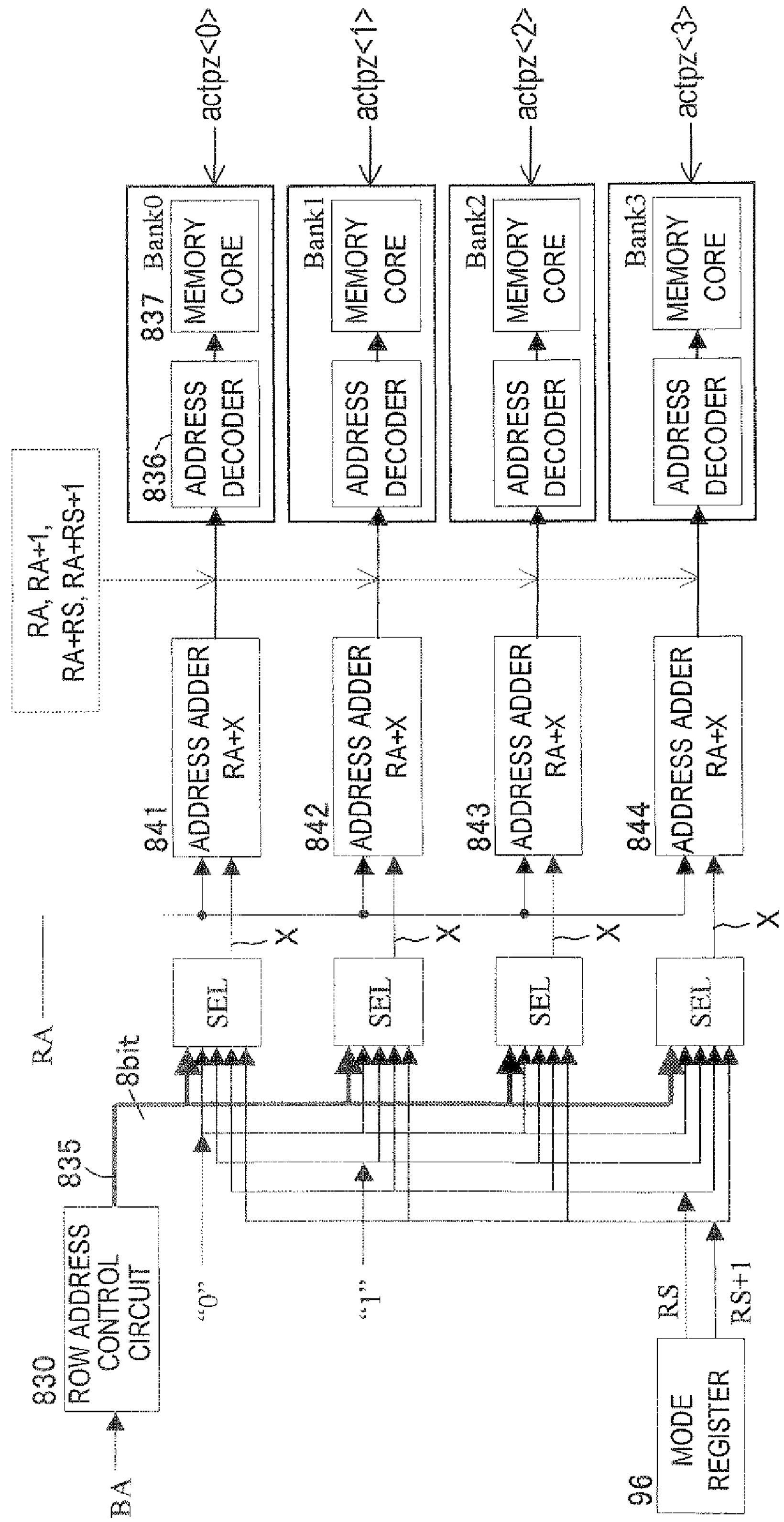
FIG. 84 A figure showing Example 2 of the row address computer according to the present embodiment.

FIG. 84 is a figure showing Example 2 of the row address calculator according to the present embodiment. In this example, the row address calculator 97 has four address adders 841 through 844 that add the constant numbers 0, 1, RS, RS+1 selected by the selectors SEL to row addresses RA to be supplied, and the row address control circuit 830 that supplies the selection signal 835 to the selectors SEL. The row address control circuit 830 is the same as the one shown in FIG. 83. Then, in response to the selection signal of the row address control circuit 830, each of the selectors SEL selects any of the four constant numbers 0, 1, RS, RS+1, and outputs the selected constant number to the address adders. Specifically, the row address computer 97 uses the selectors to select any of the constant numbers 0, 1, RS, RS+1 to be added to the supplied row addresses RA, and sends the selected constant number to the address adders. The row address calculator 97 shown in FIG. 83 uses the selectors to select an output of any of the four address adders, while the row address calculator 97 shown in FIG. 84 uses the selectors to select any of the four constant numbers. This is the only different between these row address computers.

As described above, the row address calculator 97 generates four necessary row addresses from the row addresses RA to be supplied. Therefore, the memory device can internally generate the four necessary row addresses by inputting the row addresses by means of single active command, whereby a plurality of banks can be activated.

[Memory Mapping Setting]

In order to realize the multi-bank activation function, it is necessary to set the memory mapping information in the memory device. For example, as described with reference to FIG. 82, banks to be activated in four rectangular access areas RC 0 through 3 are selected based on the memory mapping 12, and row addresses to be generated are calculated. Therefore, if the memory mappings of the upper systems differ, the memory device is then required to change the processing for determining the page areas to be activated.

FIG. 85 is a figure showing two examples of memory mapping. A memory mapping 12A is the same as the memory mapping described previously, wherein banks Bank 0, 1 are arranged in the odd-numbered rows, banks Bank 2, 3 are arranged in the even-numbered rows, and row addresses RA are arranged as shown. Further, as shown in a memory mapping 12B, even-numbered banks Bank 0, 2 are arranged in the odd-numbered rows, odd-numbered banks Bank 1, 3 are arranged in the even-numbered rows, and row addresses RA are arranged in the same manner as those of 12A.

Figure 86:
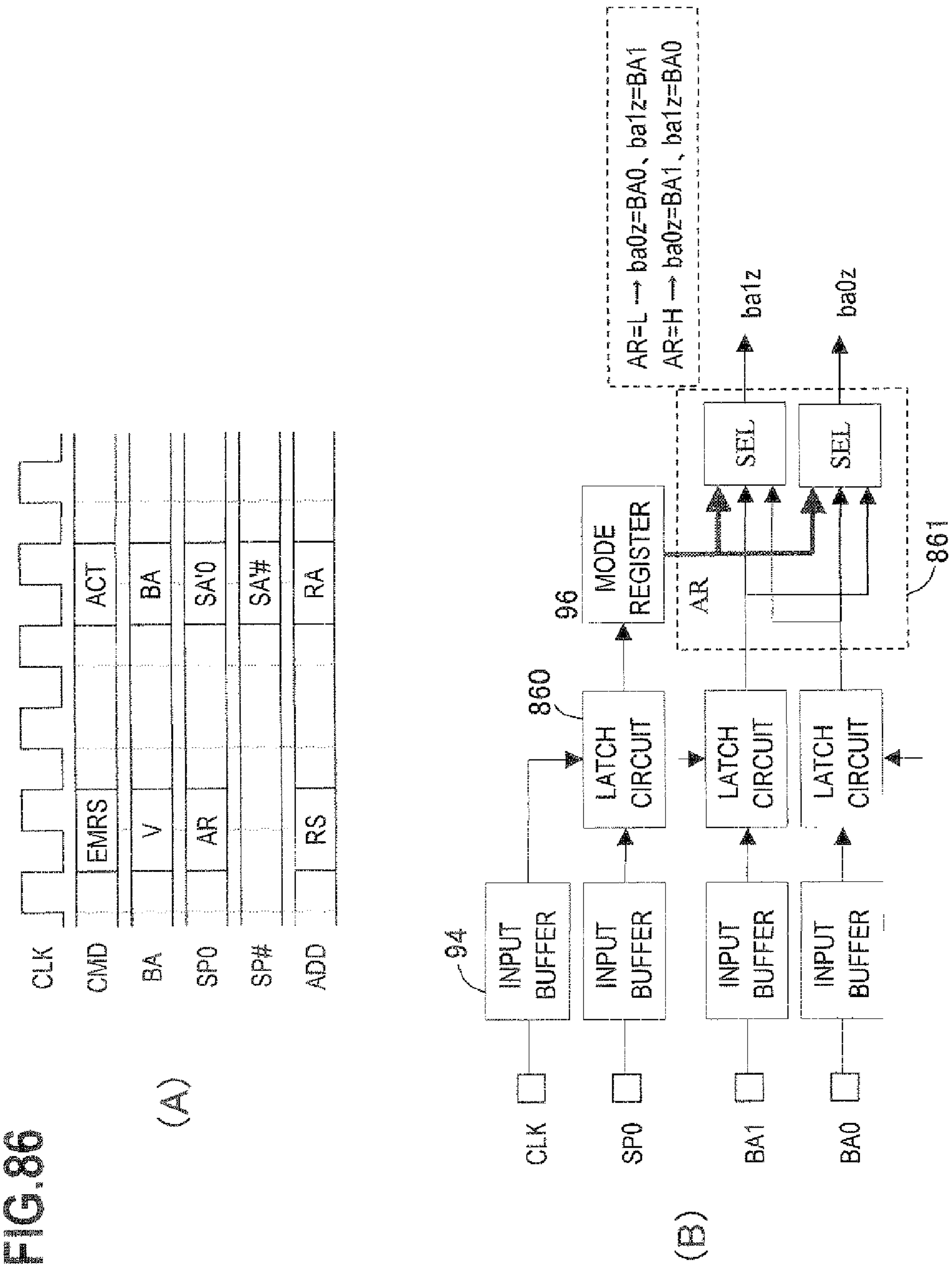
FIG. 86 A figure showing the bank address switching circuit 861 for two types of memory mapping described above.

FIG. 86 is a figure showing a bank address switching circuit 861 for two types of memory mapping described above. In the configuration diagram of FIG. 86(B), the input buffer 94 is provided in a clock terminal CLK, a special input terminal SP0, and bank address terminals BA0, BA1, and a latch circuit 860 for latching signals in synchronization with the clock CLK is also provided.

As shown in the timing chart of FIG. 86(A), setting data V is inputted from a bank address terminal BA, memory mapping information AR is inputted from the special terminal SP0, and step number data RS of a row address is inputted from address terminals ADD, each of these inputs being inputted along with the extended mode register set command EMRS. Then, the setting data V, memory mapping information AR and step number data RS are set into the mode register 96.

In response to the memory mapping information AR set into the mode register 96, the selectors SEL of the bank address switching circuit 861 selects either 2-bit bank address BA0 or BA1 to generate an internal bank addresses ba0Z and ba1*z* respectively. As shown in the figure, in the case where memory mapping information AR=L, the internal bank addresses are set into ba0*z*=BA0 and ba1*z*=BA1, and in the case where memory mapping information AR=H, the internal bank addresses are set into ba0*z*=BA1 and ba1*z*=BA0.

In this manner, by switching the bank addresses BA0, BA1 by means of the input section on the basis of the memory mapping information AR, the bank selection function and row address generation function incorporated in the memory device can be configured based on the common memory mapping 12A.

It should be noted in the above embodiment that although the multi-bank information (SA'), the simultaneously activated bank data (SA' 0 through 2), the rectangular area size data (W, H) and the like are inputted from the special input terminal SP, such input can be realized by unused terminals. For example, in a read operation, if row addresses are inputted by the address terminals Add 0 through 12 and column addresses are inputted by the address terminals Add 0 through 9, the address terminals Add 10 through 12 are not used when the column addresses are inputted. Therefore, these control data items SA', W, H and the like can be inputted from these unused address terminals Add 10 through 12 when inputting the column addresses. The present invention can be applied to such a case.

Moreover, various information items that are set into the mode register by the extended mode register set command EMRS are not limited to the descriptions of the above embodiment, thus the applicable scope of the present invention comprises inputting these various information items from the address terminals.

<<Multi-bank Access and Byte Boundary>>

There has been described that the memory device has the byte boundary function in order to respond to a rectangular access that across the boundary of memory unit area selected by bank address and column address. There has also been described that the memory device has the multi-bank access function in order to respond to the case where a rectangular access is made across the boundary of page area selected by bank addresses and row addresses. Here, in the case in which a rectangular access area acrosses the boundary of page areas as well as memory unit areas, the both functions can allow access to be made by a single input of an active command and can eliminate unnecessary data outputs. Specific examples of this case are described hereinafter.

Figure 87:
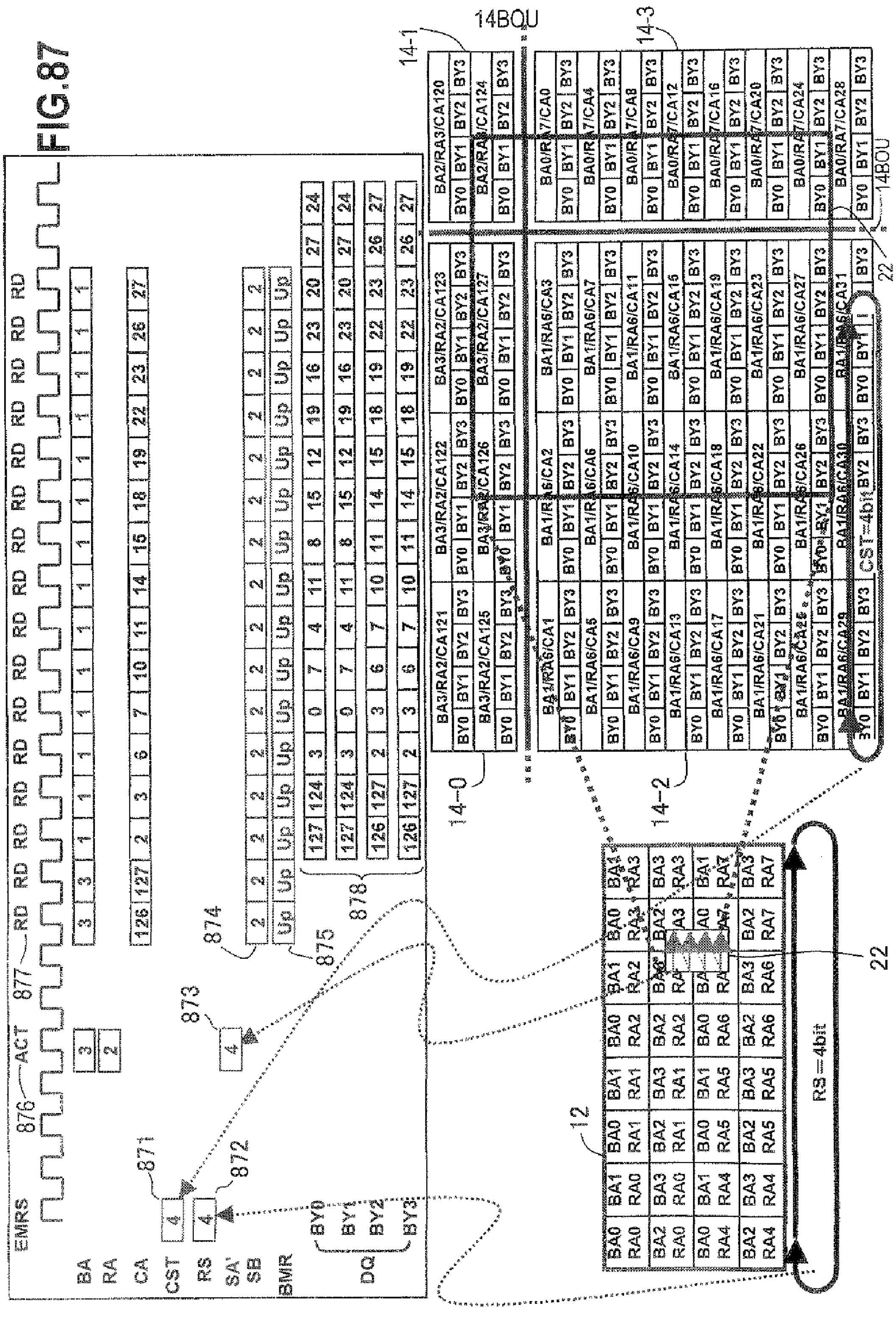
FIG. 87 A figure showing a timing chart showing the case in which multi-bank access and byte boundary are generated.

FIG. 87 shows a timing chart showing the case in which multi-bank access and byte boundary are generated. The figure shows an example in which the rectangular access area 22 extends beyond page areas to straddle a plurality of banks BA3, BA2, BA1 and BA0, and further column access extending beyond memory unit areas needs to be made. In this example, multi-bank information SA'=4 (=11) and start byte signal SB=2 are set.

Figure 88:
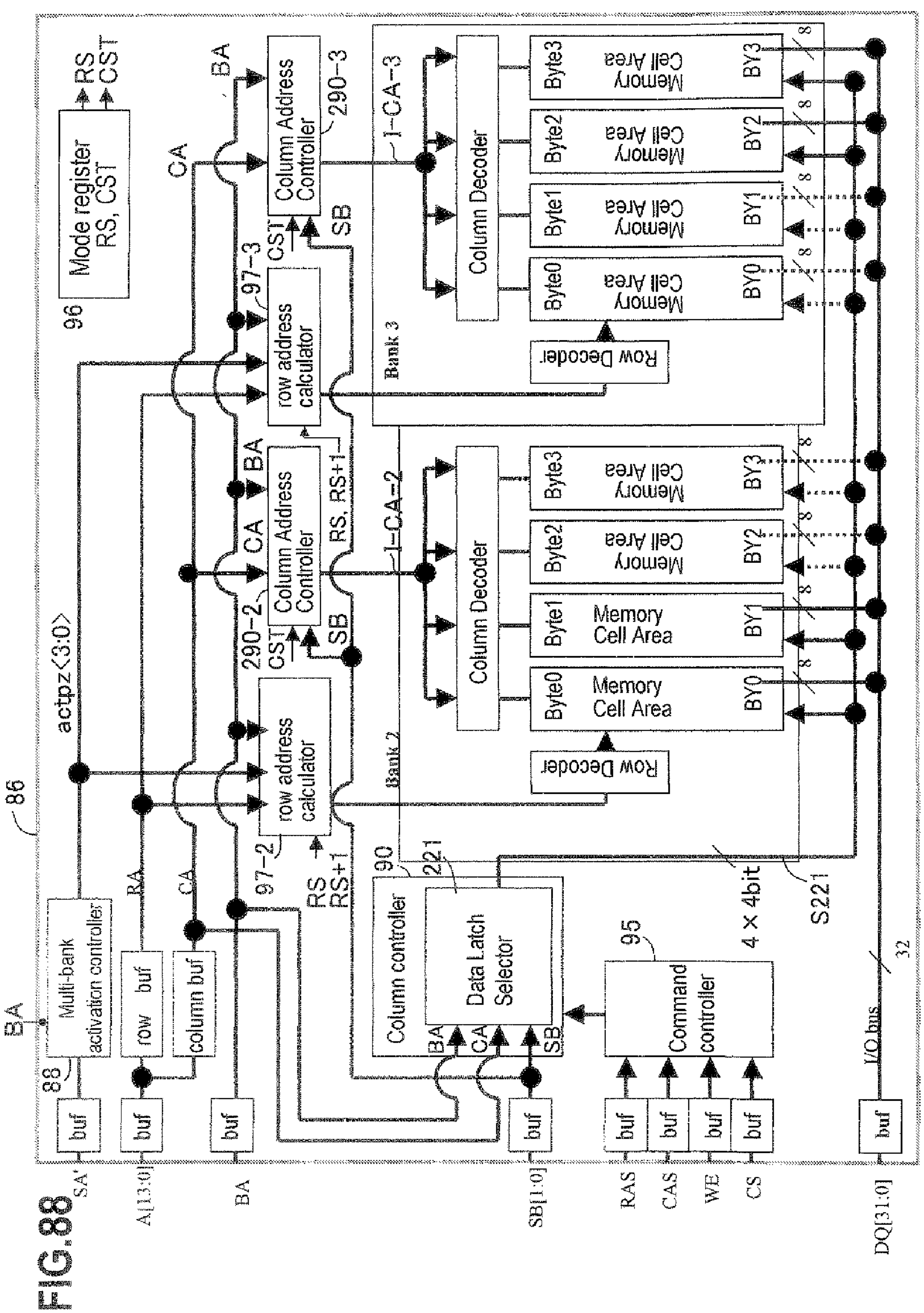
FIG. 88 A configuration diagram of the memory device having the multi-bank access function and byte boundary function.

FIG. 88 is a configuration diagram of the memory device having the multi-bank access function and byte boundary function. Although only two banks Banks 2, 3 are shown in this memory device 86 for sake of simplicity, the memory device 86 is actually provided with two more banks Banks 0, 1 that are not shown. The step number data RS of a column address for memory mapping and the step number data CST of a column address are set in the mode register 96 in advance.

As the row controllers, there are provided the multi-bank activation controller 88 that generates, from a bank address BA and multi-bank information SA', bank activation signals actpz<3:0> of banks to be activated, and row address calculators 97-2, 97-3 that calculate a row address of each bank from a bank address BA, row address RA, and step number data RS of the row address. These row address calculators 97-2, 97-3 are each a part of the configurations described with reference to FIG. 83 and FIG. 84. Also, as described with reference to FIG. 78, the bank activation signals actpz are supplied to the core controller of each bank. However, illustration of the core controllers is omitted in FIG. 88.

The column controller 90 has column address controllers 290-2, 290-3 that generate internal column addresses I-CA-2, 3 in each bank from a column address CA and bank address BA to be supplied, as well as from the start byte signal SB and the step number data CST of the column address. These column address controllers 290 are the same as the column address generating section shown in FIG. 44, and, by adding a bank address BA thereto, column addresses that are required at byte boundaries when the boundaries of the banks are straddled. It should be noted that the step number data CST is the same as the column address wrap data CAWrap shown in FIG. 44.

Moreover, the column controller 90 generates a control signal S221 for selecting data of byte areas Byte 0 through 3 within each bank, on the basis of the bank address BA and column address CA to be supplied, as well as the start byte signal SB. The data latch circuits within these four byte areas Byte 0 through 3 within each bank are selected by the control signal S221, and the selected data latch circuits are connected to an input/output I/O bus. The configurations and operations of the byte areas Bytes 0 through 3 within each bank are the same as those described with reference to FIGS. 22, 24 ad 29. Since each bank has four byte areas, the abovementioned control signal S221 is a selection signal consisting of 4×4=16 bits.

The operation that is performed when the rectangular area 22 shown in FIG. 87 is accessed is described next. As shown in the timing chart of FIG. 87, the step number data CST=4 (a reference numeral 871 in the figure) of column addresses and the step number data RS=4 (a reference numeral 872 in the figure) of row addresses are inputted along with the extended mode register set command EMRS, and set into the mode register 96.

Next, bank addresses BA and row addresses RA of page areas with pixels in the upper left portion of the rectangular access, as well as multi-bank information SA'=4 (a reference numeral 873 in the figure), are inputted along with an active command ACT (a reference numeral 876 in the figure). When SA'=4, simultaneous activation of 2×2=4 banks. In response to this, the multi-bank activation controller 88 outputs the bank activation signals actpz<3:0> to these four banks. Furthermore, the row address calculators 97-2, 3 calculate a row address of each of the banks. Then, row decoders of the four banks decode the calculated row address to drive the corresponding word lines, and then the banks are activated.

Thereafter, a bank address BA=3, a column address CA 126, a start byte signal SB=2 (a reference numeral 874 in the figure), and second information of the byte combination information BMR=UP (a reference numeral 875 in the figure) are inputted along with a read command RD (a reference numeral 877 in the figure). The column address controller 290-3 of Bank 3 corresponding to this bank address BA generates a column address CA=126, 127 on the basis of the supplied column address CA=126 and the start byte signal SB=2, and outputs the column address CA=127 as the internal column address I-CA-3. Accordingly, Bank 3 causes each of the byte areas Bytes 0 through 3 to output data on the column addresses 126, 127. Then, in response to the control signal S221 inputted from a data latch selector 221, the byte areas Bytes 2, 3 and the byte areas Bytes 0, 1 output the data on the column address CA=126 and the data on the column address CA=127 to the I/O bus, respectively.

Next, the bank address BA=3, column address CA=127, SB=2, and BMR=UP are inputted along with the read command RD. In response to this, the column address controller 290-3 generates the internal column address I-CA-3=127, and Bank 3 outputs 4-byte data of the column address 127. On the other hand, the column address controller 290-2 detects, from the bank address BA=3, column address CA=127, and start byte signal SB=2, that the data needs to be read from Bank 2, and refers to the step number data CST of the column address to output a column address CA=124 of Bank 2 as the internal column address I-CA-2. Consequently, Bank 2 reads 4-byte data of the column address CA=124. Then, the data latch selector 221 generates the control signal S221 on the basis of the bank address BA=3, column address CA=127, and start byte signal SB=2, and the data on the byte areas Bytes 2, 3 and the data on the byte areas Bytes 0, 1 are outputted from Bank 3 and Bank 2, respectively, to the I/O bus.

Subsequently, column addresses CA=2, 3, 6, 7, corresponding to the bank address BA=1 are inputted along with the read command RD, the column address controllers 290 similarly generate required column addresses, the data latch selector 221 generate the required control signal S221, and 4-byte data of the position corresponding to the start byte signal SB=2 is outputted from the same bank or an adjacent bank.

Although the above description was about the operation of the read command, the same column access control is performed in the case of a write command as well.

According to the present embodiment, with respect to the rectangular access that is made across page areas and straddles a plurality of banks, access can be made from arbitrary bytes (orbits) within a memory unit area to 4-byte data (or 4-bit data), on the basis of the start byte signal SB and the byte combination information BMR.

[Memory Controller Responding to Multi-Bank Access]

The memory controller for controlling the memory device having the multi-bank access function is described next. As described with reference to FIG. 69 and FIG. 70, the memory controller sets the step number data RS of row addresses, the memory mapping information AR and the like to the mode register within the memory device in advance, issues the active command ACT, bank addresses BA, row addresses RA, and multi-bank information SA' to the memory device in response to a rectangular access request sent from the memory access source, and further issues the bank address BA and the column address CA along with the read command RD or write command WR. Therefore, the memory controller needs to generate the above addresses or data required for the multi-bank access function, in response to a memory access request. The configurations and operations of such memory controller will be described.

Figure 89:
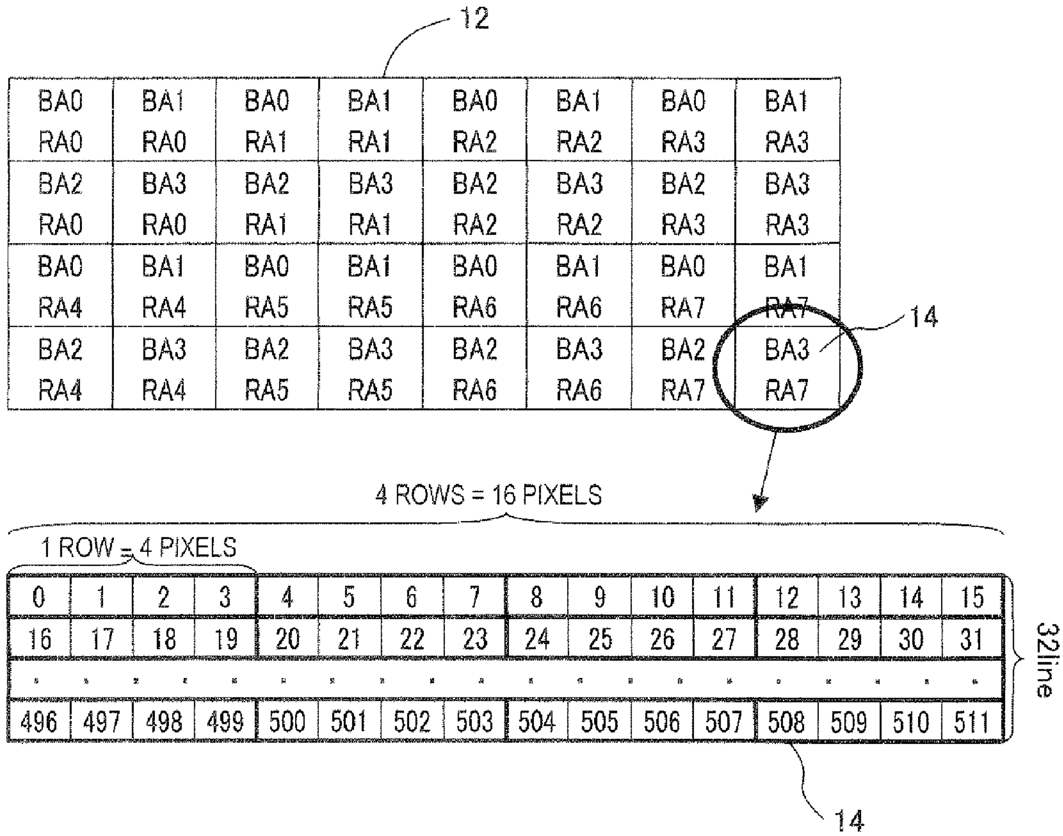
FIG. 89 A figure showing an example of memory mapping.

FIG. 89 is a figure showing an example of memory mapping. The memory mapping 12 corresponds to a frame image. As described above, in this memory mapping 12, bank addresses BA0, 1 are allocated to the odd-numbered rows of the page areas 14 arranged in the form of a matrix, while bank addresses BA2, 3 are allocated to the even-numbered rows. Row addresses RA are incremented sequentially by one in each row, and the row address step number RS is RS=4. Each of the page areas 14 is constituted by 16 pixels×32 rows, wherein a memory unit area consisting of data with four pixels (4-byte data) is specified by one column address. Therefore, one page area 14 has 512/4=128 column address areas (memory unit areas).

In this memory mapping 12, eight page areas are arranged in the horizontal direction, and four page areas are arranged in the vertical direction. Therefore, in this memory mapping 12 the number of pixels in the horizontal direction is 128 (=16 pixels×eight page areas), and the number of pixels in the vertical direction is also 128 (=32 rows×four page areas). Various computation processes are described hereinafter based on this memory mapping.

Figure 90:
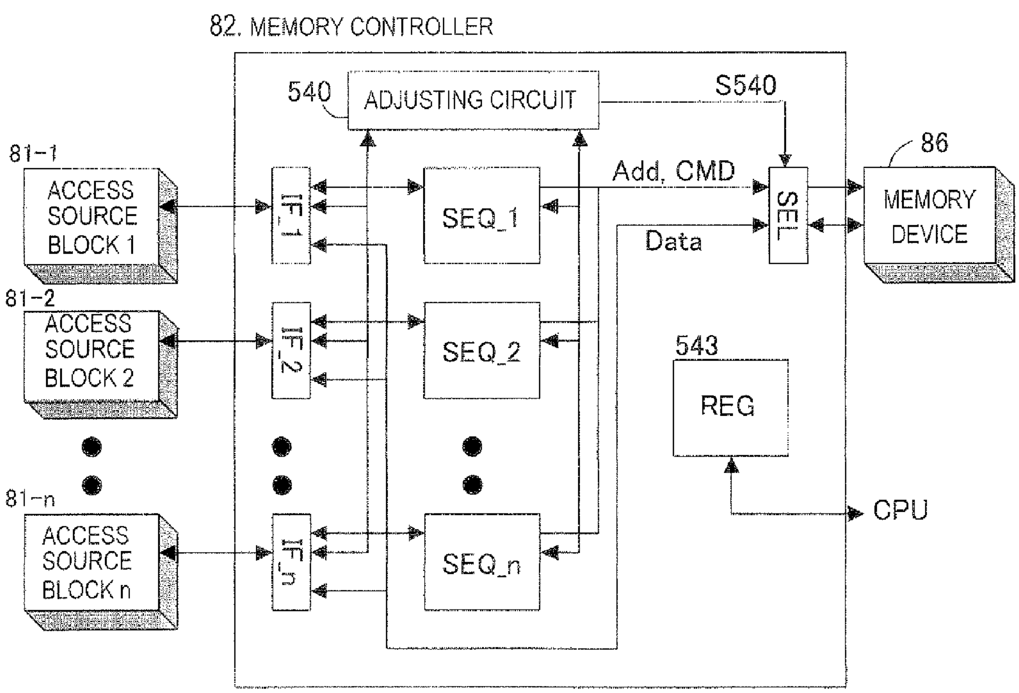
FIG. 90 A configuration diagram of the memory controller according to the present embodiment.

FIG. 90 is a configuration diagram of the memory controller according to the present embodiment. As with FIG. 54, the memory controller 82 receives memory access requests from a plurality of access source blocks 81-1 through 81-*n*, and performs access control on the memory device 86 in response to the memory access requests that are permitted by the arbitration circuit 540. Specifically, the memory controller 82 has interfaces IF_1 through IF_n corresponding to the access source blocks 81-1 through 81-*n*, and further has sequencers SEQ_1 through SEQ_n generating addresses and commands in response to the access requests.

Therefore, the interfaces IF_1 through IF_n exchange data with the access request source blocks 81. There are two types of accesses made from the access source blocks: horizontal access and rectangular access. The arbitration circuit 540 arbitrates the access requests sent from the interfaces, and outputs an access instruction to the sequencer SEQ_n that has acquired the access right. The selector SEL then selects a command and address from the sequencers SEQ_1 through SEQ_n in response to a selections signal S540 sent from the arbitration circuit 540, and outputs the selected command and address to the memory device 86. The selector SEL further selects a data line Data from the interfaces IF_1 through IF_n in response to the selection signal S540.

In a register 543 various parameters are set from the host CPU. The parameters include function data on whether the memory device 86 has the byte boundary function and the multi-bank access function. In addition, configuration parameters include a row address of an upper left pixel on the frame image ROW_BASE_ADR, the number of pixels in the horizontal direction of the frame image PICTURE_MAX_X-SIZE, and the like.

The memory device 86 is an image memory having the abovementioned byte boundary function and multi-bank access function. The memory controller 82 and the memory device 86 shown in FIG. 90 configure the image processing system.

Figure 91:
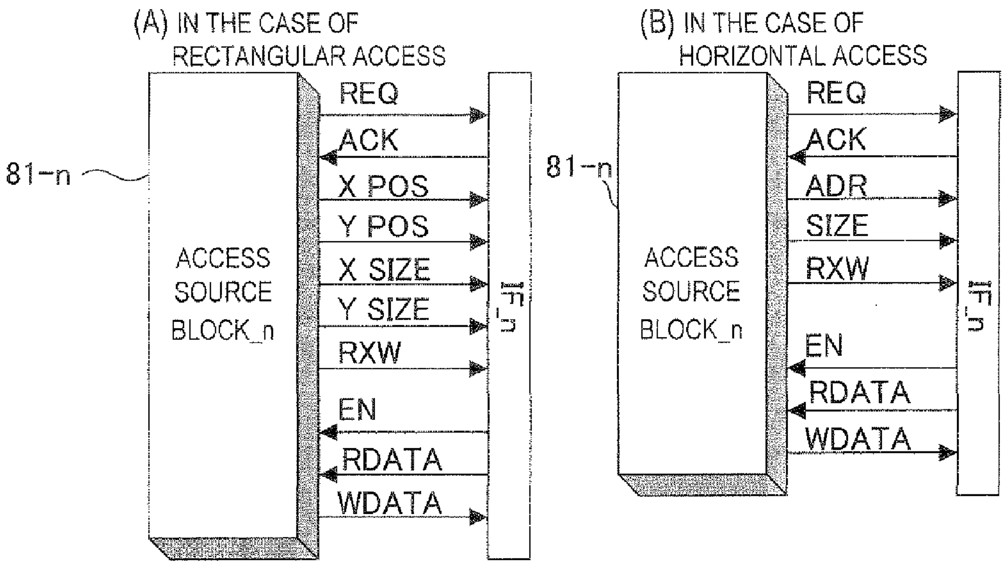
FIG. 91 A figure showing signals between the access source blocks and the interfaces.

FIG. 91 is a figure showing signals between the access source blocks and the interfaces. FIG. 91(A) shows signals sent when the rectangular access is made, and FIG. 91(B) shows signals sent when the horizontal access is made. The access source block 81-*n* outputs an access request signal REQ and data on an access target area. Transmission of the signals that is performed when both accesses are made is described hereinafter.

Figure 92:
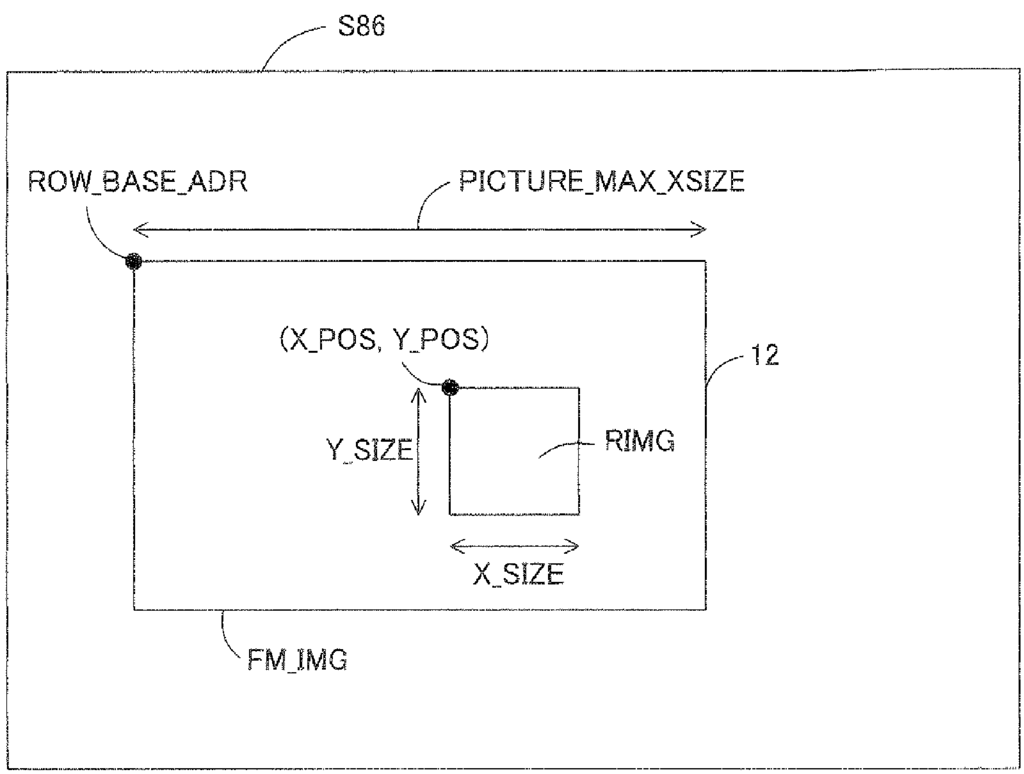
FIG. 92 A figure for explaining the data on the access target area.

FIG. 92 is a figure for explaining the data on the access target area. Data on the frame image FM-IMG is stored in a logical address space S86 of the memory device. As described above, the row address of the upper left pixel ROW_BASE_ADR of this frame image FM-IMG and the number of pixels in the horizontal direction of the frame image PICTURE_MAX_XSIZE are set in the register 543. In the case in which a rectangular area RIMG within this frame image is the access target area, a frame pixel coordinates (X_POS, Y_POS) of the upper left pixel within the frame, the size of the rectangular area in the horizontal direction X_SIZE, and the size of the same in the vertical direction Y_SIZE are supplied from the access source block 81-*n* to the interface IF_n within the memory controller.

It should be noted that the frame image FM-IMG corresponds to the memory mapping 12 in FIG. 89. Specifically, the upper left pixel of the frame image FM-IMG corresponds to the upper left pixel of a page area having bank address BA=0 and local row address RA=0. Therefore, a row address of the logical address space of the memory can be obtained from the row address of the upper left pixel ROW_BASE_ADR of the frame image FM-IMG and the local row address RA within the frame.

FIG. 93 is a timing chart of the signals between the access source blocks and the interfaces. In the rectangular access (at the time of reading) shown in FIG. 93(A), the access source block 81-*n* brings a read/write instruction signal RXW to H level (read), and outputs access target area data X/Y_POS, X/Y_SIZE while asserting the access request REQ. In response to this, the memory controller sends back an acknowledge ACK, performs access control on the memory device 86 after a predetermined arbitration processing is performed, and acquires read data. Then, the interface IF_n of the memory controller outputs the read data RDATA (Data (A0 through A7)) while asserting an enable signal EN. This enable signal EN is asserted one clock cycle ahead, and negated one clock cycle in advance.

On the other hand, in the rectangular access (at the time of writing) shown in FIG. 93(B), the access source block 81-*n* brings a read/write instruction signal RXW to L level (write), and outputs access target area data X/Y_POS, X/Y_SIZE while asserting the access request REQ. In response to this, the memory controller sends back an acknowledge ACK, performs access control on the memory device 86 after a predetermined arbitration processing is performed, and receives write data WDATA (Data (A0 through A7)) while asserting an enable signal EN. This enable signal EN also is asserted one clock cycle ahead, and negated one clock cycle in advance.

In the case of the horizontal access as well, the access source blocks supply the leading address ADR of the horizontal access and horizontal access size SIZE, receive the read data RDATA in the case of reading, and output the write data RDATA in the case of writing. Specifically, as shown in FIG. 91, the access source blocks supply the horizontal access leading address ADR, horizontal access size SIZE, and read/write instruction signal RXW, while asserting the access requests REQ. In response to this, the interfaces sends back the acknowledge signal ACK. Then, the memory controller executes memory access, and outputs the read data RDATA while asserting the enable signal. Furthermore, at the time of writing, the memory controller receives the write data WDATA while asserting the enable signal EN, before executing the memory access.

Figure 94:
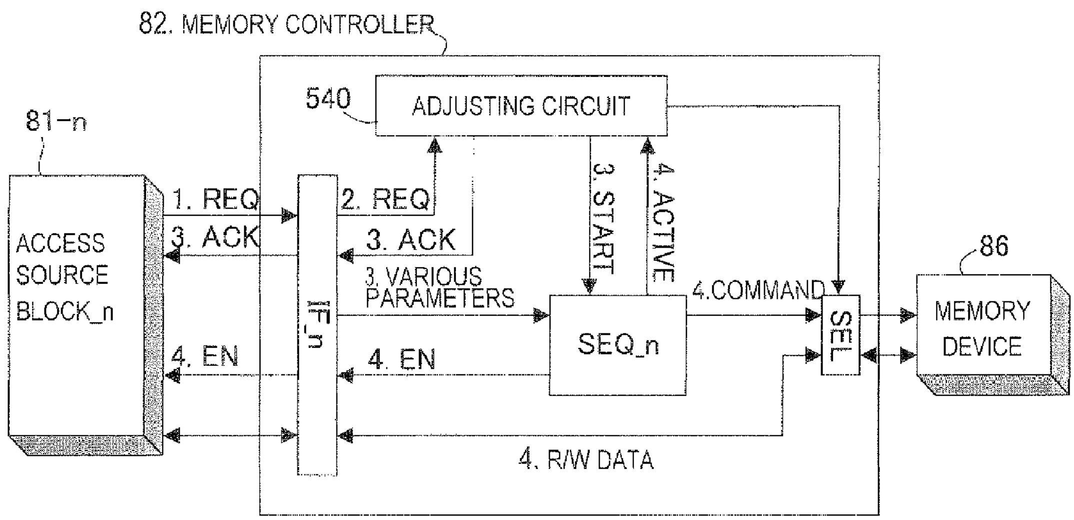
FIG. 94 A figure showing schematic operation of the memory controller.

FIG. 94 is a figure showing schematic operation of the memory controller. The operation steps are executed in order of the reference numerals 1 through 4. First, the access request source block 81-*n* issues an access request REQ, and then, in response to this access request REQ, the interface IF_n transfers the access request to the arbitration circuit 540. Next, if the memory device 86 can be accessed, and the priority of the access request source is the highest, the arbitration circuit 540 sends an acknowledge signal ACK to the interface IF_n, and outputs a command issuance starting instruction START to the sequencer SEQ_n. In response to this command issuance starting instruction START, the sequencer SEQ_n receives various parameters such as X/Y_POS and X/Y_SIZE required for command issuance, from the interface IF_n.

The sequencer SEQ_n issues a command on the basis of the abovementioned parameters and the parameters set in the register, and begins accessing the memory device 86. In accordance with the status of issuance of the command, the sequencer SEQ_n issues the enable signal EN corresponding to the amount of data, and this enable signal EN is transmitted to the access request source 81__*n* via the interface IF_n. In the case in which reading is performed, the read data is transmitted from the memory device 86 to the access request source 81__*n* via the interface IF_n in response to the enable signal EN described above. In the case in which writing is performed, the write data is transferred from the access request source 81__*n* to the memory device 86 via the interface IF_n in response to the enable signal EN described above.

In this manner, during the access control process in which the command is issued to the memory device 86, the sequencer SEQ_n asserts, to the arbitration circuit 540, an active signal ACTIVE indicating that the data is being accessed. Once the access to the memory is ended, the active signal ACTIVE is negated.

Figure 95:
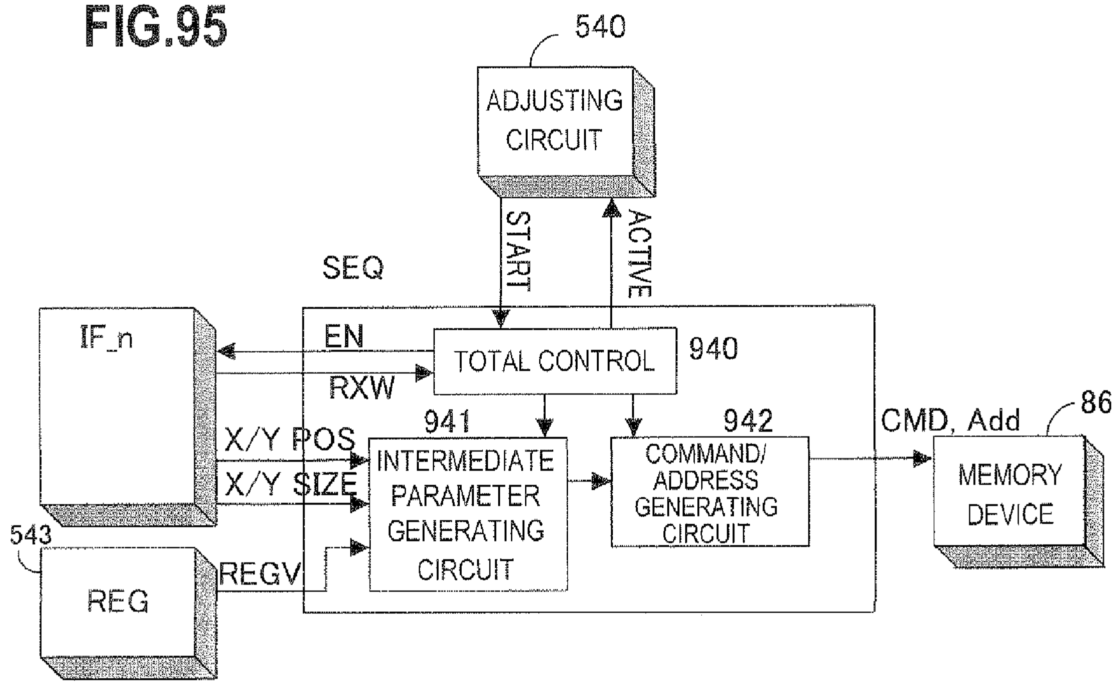
FIG. 95 A configuration diagram of the sequencer SEQ.

FIG. 95 is a configuration diagram of a sequencer SEQ. The sequencer SEQ has: a controller 940 for controlling the entire sequencer; an intermediate parameter generating section 941 that generates an intermediate parameter from the access target area data X/Y_POS, X/Y_SIZE transferred from the interface IF_n, the row address of the upper left pixel ROW_BASE_ADR of the frame image FM-IMG that is set in the register 543, and the number of pixels PICTURE_MAX_XSIZE in the horizontal direction of the frame image; and a command/address generating section 942 that generates commands and addresses on the basis of the intermediate parameter and output the commands and addresses to the memory device 86.

Figure 96:
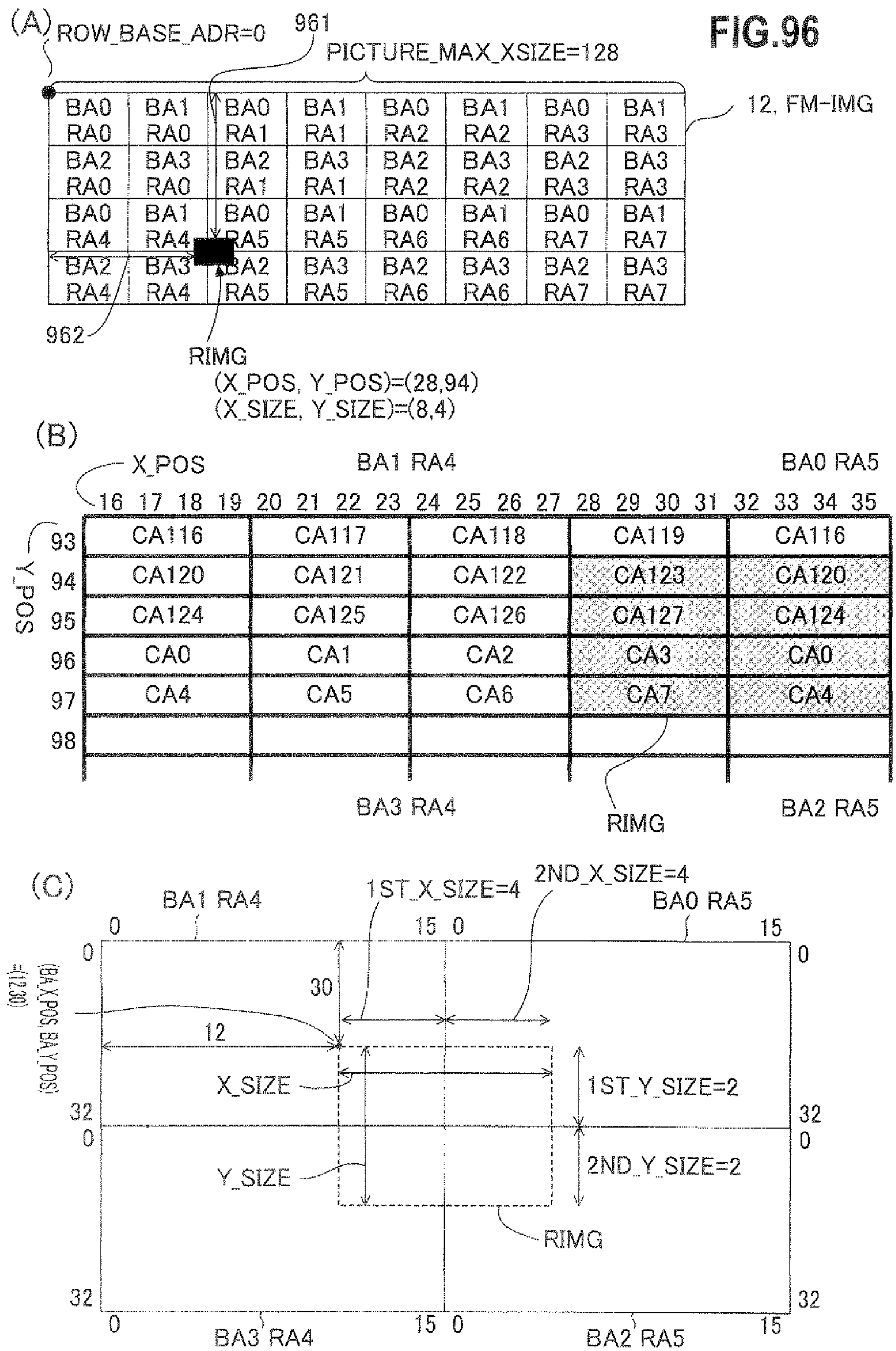
FIG. 96 A figure for explaining the computing equation used for generating the intermediate parameters.

FIG. 96 is a figure for explaining a computing equation used for generating the intermediate parameters. In this example, the rectangular area RIMG within the frame image FM-IMG is accessed, as shown in FIG. 96(A), and data items thereof are as follows:

PICTURE_MAX XSIZE=128

ROW_BASE_ADR=0

(X_POS, Y_POS)=(28, 94)

(X_SIZE, Y_SIZE)=(8, 4)

Moreover, FIG. 96(B) shows pixel numbers in the horizontal direction and pixel numbers (row numbers) in the vertical direction in four page areas BA1/RA4, BA0/RA5, BA3/RA4 and BA2/RA5 in the vicinity of the rectangular area RIMG. These information items are generated as the intermediate parameter in the manner described below.

The intermediate parameter generating section 941 generates the intermediate parameter by means of the following computation.

(1) In the case in which the rectangular data RIMG straddles the four page areas, the upper left bank address BA can be obtained in the manner described next. In the following manner, first of all, the frame pixel coordinates (X_POS, Y_POS) of the upper left pixel of the rectangular data RIMG within the frame image FM-IMG are obtained, and these coordinates are divided by the number of horizontal pixels 16 and the number of vertical pixels 32 of the page area respectively, whereby a bank X address BA_X_ADR and a bank Y address BA_Y_ADR are obtained. Each remainder obtained in this division is rounded.

BA_X_ADR=X_POS/16

BA_Y_ADR=Y_POS/32

The bank X address BA_X_ADR and the bank Y address BA_Y_ADR each indicates which page area in the horizontal direction or vertical direction in the memory mapping 12 the upper left pixel of the rectangular area corresponds. It should be noted that the upper left portion of the memory mapping 12 is located at the $0^{th}$ page area in the horizontal direction and the $0^{th}$ page area in the vertical direction.

The following bank addresses BA[1:0] are obtained depending on whether the obtained bank X address BA_X_ADR and the bank Y address BA_Y_ADR are odd or even.

If the BA_X_ADR is an even number and the BA_Y_ADR is an even number, upper left BA=0

If the BA_X ADR is an odd number and the BA_Y ADR is an even number, upper left BA=1

If the BA_X_ADR is an even number and the BA_Y_ADR is an odd number, upper left BA=2

If the BA_X_ADR is an odd number and the BA_Y_ADR is an odd number, upper left BA=3

(2) The bank address BA on the right side, the bank address BA on the lower side, and the bank address BA on the lower right bank address BA are obtained as follows. Specifically, according to the memory mapping 12, the right BA, lower BA, and lower right BA are obtained, as shown below, from the upper left BA[1:0] obtained in (1) described above. It should be noted that "~" means an inverted bank address.

Right BA=[upper left BA [1], ~upper left BA [0]]

Lower BA=[~upper left BA [1], upper left BA [0]]

Lower right BA=[~upper left BA [1], ~upper left BA [0]]

According to the examples shown in FIG. 96, (X_POS, Y_POS)=(28, 94) is established, thus, for the upper left bank address BA,

BA_X_ADR=X_POS/16=28/16=1

BA_Y_ADR=Y_POS/32=94/32=2 are established. Also, since BA_X_ADR=1 is odd and BA_Y_ADR=2 is even, the upper left bank address BA[1:0]=01 is established. That is, BA1 can be obtained.

Moreover,

The right BA, lower BA, lower right BA, BA0, BA3, BA2, can be obtained from the upper left BA=2'b01, as follows.

Right BA=[upper left BA [1], ~upper left BA [0]]=[00]=0

Lower BA=[~upper left BA [1], upper left BA [0]]=[11]=3

Lower right BA=[~upper left BA [1], ~upper left BA [0]]=[10]=2

(3) An access start row address ROW_ADR within the logical address space S86 of the memory is as follows.

ROW_ADR=ROW_BASE_ADR+[PICTURE_MAX_X-SIZE/(16* 2)]*[Y_POS/(32*2)]+X_POS/(16*2)

Specifically, ROW_BASE_ADR is a row address of an upper left pixel of the frame image, PICTURE_MAX_X-SIZE/(16*2) is the number of row address steps in the horizontal direction within the frame, Y_POS/(32*2) indicates at what number in the vertical direction within the frame the upper left pixel of the rectangular area RIMG is positioned (a reference numeral 961 in FIG. 96), and X_POS/(16*2) indicates at what number in the horizontal direction within the frame the upper left pixel of the rectangular area RIMG is positioned (a reference numeral 962 in FIG. 96).

According to the examples shown in FIG. 96, PICTURE_MAX XSIZE=128, ROW_BASE_ADR=0, and (X_POS, Y_POS)=(28, 94) are set, thus ROW_ADR=ROW_BASE ADR+[PICTURE_MAX_X-SIZE/(16*2)]*[Y_POS/(32*2)]+X_POS/(16*2)=0+(128/32)*(94/(32*1))+28/(16*2)=4 is established.

(4) An access start column address COL_ADR in the logical address space S86 of the memory is a column address within a page, and is obtained as follows:

COL_ADR=4*Y_POS %32+(X_POS/4)%4

Here [%] is a remainder. Specifically, the number of steps of the column address within the page area is 4, the number of columns in the horizontal direction in the page area is 4, and the number of rows in the vertical direction is 32, as shown in FIG. 89, thus Y_POS %32 indicates the number of rows within the page area of BA1, RA4, and (X_POS/4) %4 indicates the number of columns within the page areas.

According to the examples shown in FIG. 96, the access start column address can be obtained as follows:

$$\begin{aligned}COL\_ADR &= 4*Y\_POS\ \%32 + (X\_POS/4)\%4\\ &= 4*94\%32 + (28/4)\%4\\ &= 120 + 3\\ &= 123\end{aligned}$$

(5) Next, since the number of pixels in the horizontal direction of a page area is 16 and the number of pixels within the vertical axis of a page area is 32, the X coordinate (BA_X_POS) and Y coordinate (BA_Y_POS) within the bank are obtained as follows:

BA_X POS=X_POS %16

BA_Y_POS=Y_POS %32

The results correspond to the coordinates (BA_X_POS, BA_Y_POS) of the upper right pixel of the rectangular area RIMG within the upper right bank (BA1/RA4) shown in FIG. 96(C).

(6) X-direction BANK straddling flag and Y-direction BANK straddling flag indicating whether the rectangular area RIMG straddles a bank (page area) are obtained as follows from the X and Y coordinates within the bank, i.e., BA_X_POS, BA_Y_POS, which are obtained in (5), and the sizes of the rectangular area RIMG in the horizontal direction and vertical direction, i.e., X/Y_SIZE:

If BA_X_POS+X_SIZE>15, X-direction BANK straddling flag=1

If BA_Y_POS+Y_SIZE>31, Y-direction BANK straddling flag=1

Specifically, as shown in FIG. 96(C), if the value that is obtained by adding the rectangular area size X/Y_SIZE to the coordinates (BA_X_POS, BA_Y_POS) of the upper left pixel of the rectangular area RIMG exceeds the horizontal direction size 15 and vertical direction size 31 of the page area, it means that the bank is straddled.

To describe the above (5) and (6) by means of the examples shown in FIG. 96, the X coordinate and Y coordinate within the bank are as follows:

BA_X_POS=X_POS %16=28%16=12

BA_Y_POS=Y_POS %32=94%32=30

X-direction BANK straddling flag and the Y-direction BANK straddling flag are as follows:

BA_X_POS+X_SIZE=12+8=20, which is higher than 15, thus X-direction BANK straddling flag=1, and BA_Y_POS+Y_SIZE=30+4=34, which is higher than 31, thus Y-direction BANK straddling flag=1, thus the bank is straddled by RIMG in both X and Y directions.

(7) Next, the sizes in X, Y directions of a rectangular area straddling four banks, i.e., 1ST_X_SIZE, 2ND_X_SIZE, 1ST_Y_SIZE, 2ND_Y_SIZE, are computed as follows:

As shown in FIG. 96(C), if BANK is straddled in X direction, the X_SIZE on the left side of the BANK is 1ST_X_SIZE, and on the right side is 2ND_X_SIZE. If the BANK is straddled in Y direction, the Y_SIZE on the upper side of the BANK is 1ST_Y_SIZE, and on the lower side is 2ND_Y_SIZE. If the BANK is not straddled, only 1STX_SIZE and 1ST_Y_SIZE are effective. Therefore, If X-direction BANK straddling flag=1,

1ST_X_SIZE=16−BA_X_POS

2ND_X_SIZE=X_SIZE−1ST_X_SIZE

If X-direction BANK straddling flag=0,

1ST_X_SIZE=X_SIZE

If Y-direction BANK straddling flag=1,

1ST_Y_SIZE=32−BA_Y_POS

2ND_Y_SIZE=Y_SIZE−1ST_Y_SIZE

If Y-direction BANK straddling flag=0,

1ST_Y_SIZE=Y_SIZE

When the examples shown in FIG. 96 are applied, since X-direction BANK straddling flag=1,

1ST_X_SIZE=16−BA_X_POS=16−12=4

2ND_X_SIZE=X_SIZE−1ST_X_SIZE=8−4=4 and since Y-direction BANK straddling flag=1,

1ST_Y_SIZE=32−BA_Y_POS=32−30=2

2ND_Y_SIZE=Y_SIZE−1ST_Y_SIZE=4−2=2

(8) Finally, the row address step information RS is the number indicating how many row addresses increase when scanning the frame image 12 (FM-IMG) from the left end to the right end in the horizontal direction, and is obtained by the following equation:

$$RS = PICTURE\_MAX\_XSIZE/(16*2)$$

In the examples shown in FIG. 96, RS is obtained as follows:

$$RS = PICTURE\_MAX\_XSIZE/(16*2) = 128/32 = 4$$

As described above, the intermediate parameter generating section 94 computes the intermediate parameters (1) through (8) by means of the above equations, and outputs the results to the command/address generating section 942. Then, the command/address generating section 942 generates a command, bank address BA, row address RA, column address CA, row address step information RS and multi-bank information SA' to be supplied to the memory 86, on the basis of the intermediate parameters.

Figure 97A:
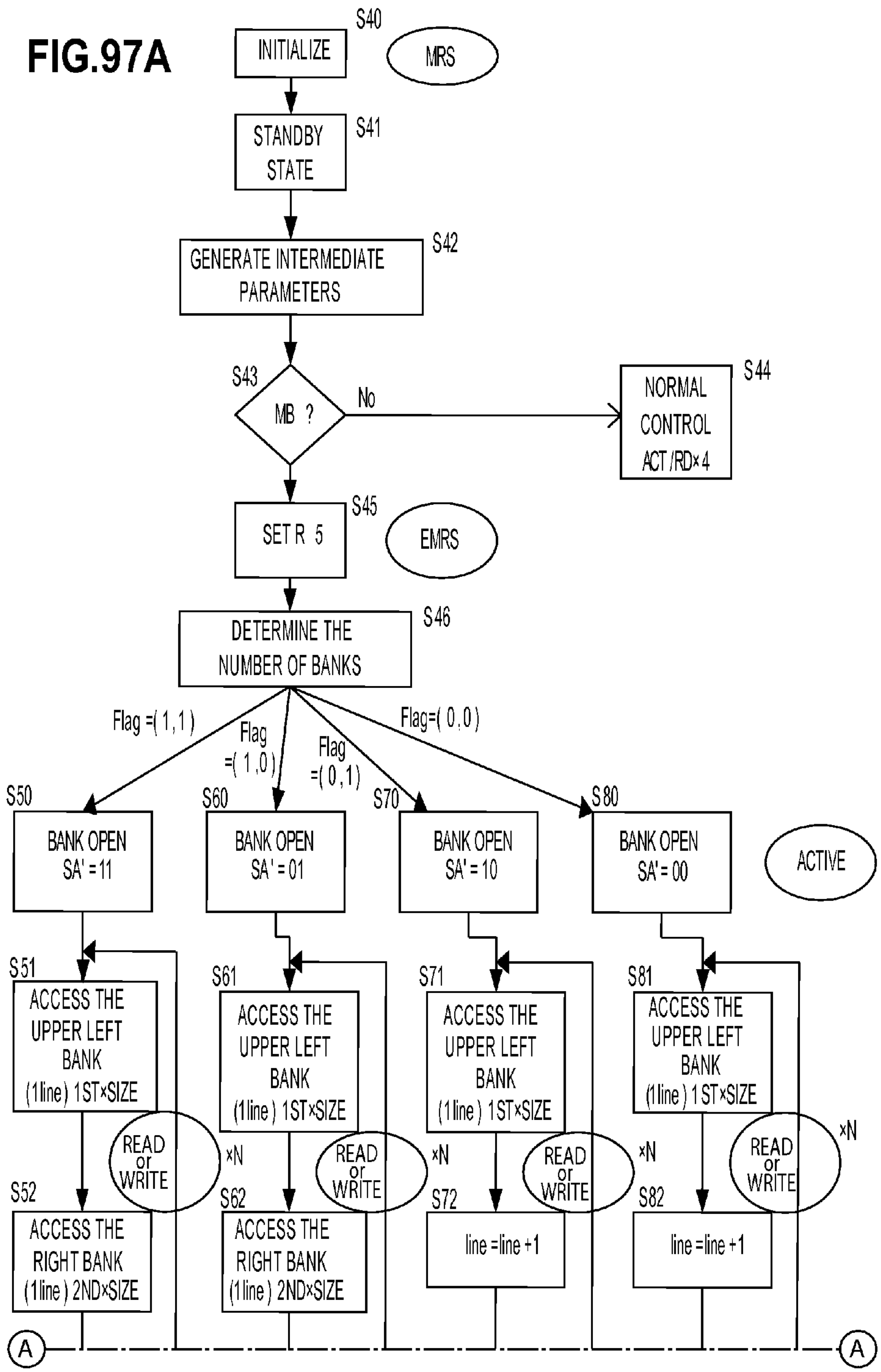
FIG. 97 An operational flowchart of the command/address generating section.
Figure 97B:
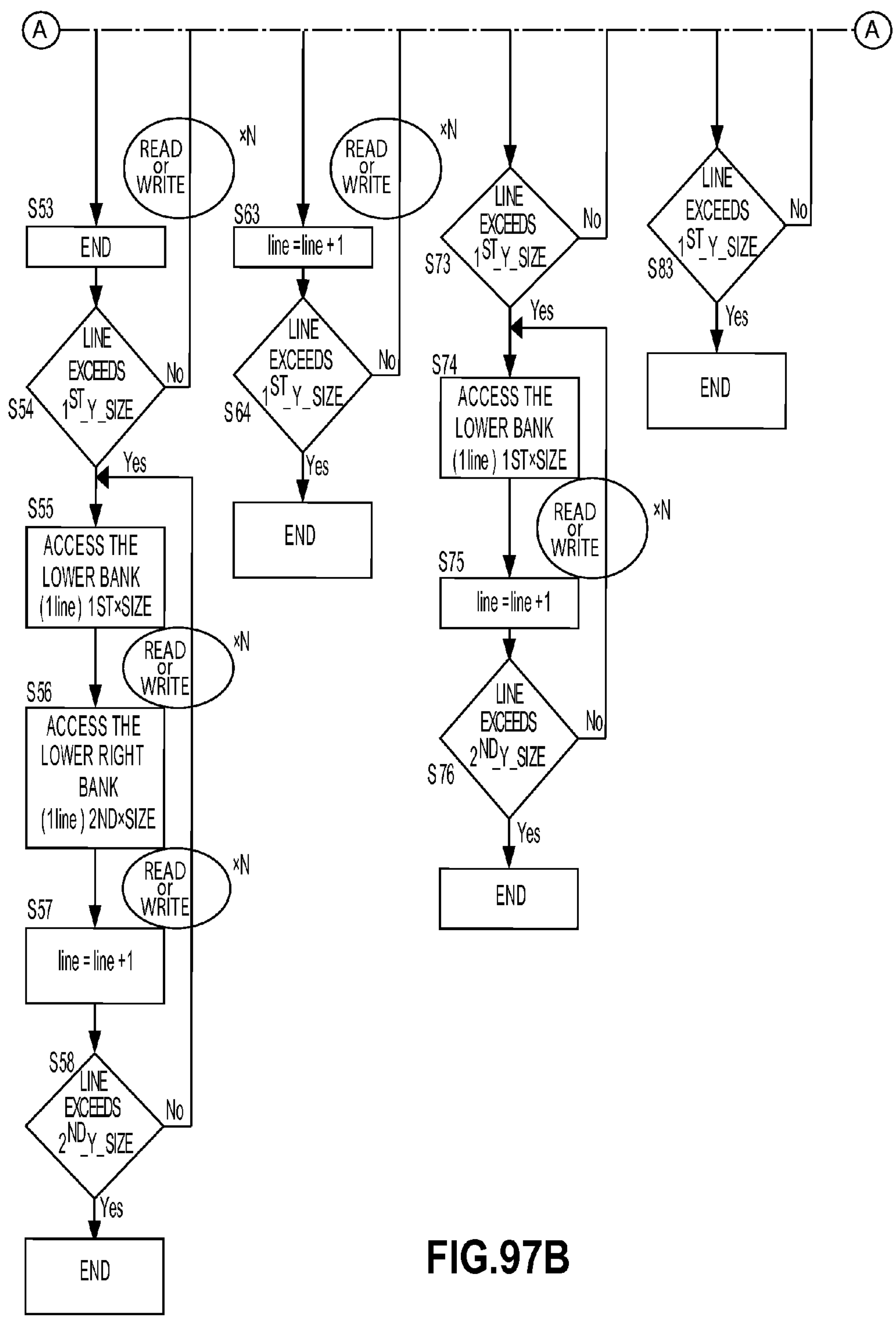

FIG. 97 is an operational flowchart of the command/address generating section. The figure shows generated command in an elliptical shape. First, the memory controller issues a normal mode register set command MRS to perform various initial settings on the mode register within the memory device (S40). These initial settings are performed in a normal SDRAM. Then, the memory controller enters a standby state (S41). Then, when an access request is received from the access source block 81, the intermediate parameter generating section 941 generates the above-described intermediate parameters from the access target area data X/Y_POS and X/Y_SIZE that are received from the access source block, the row address of the upper left pixel within the frame image ROW_BASE_ADR and the number of pixels in the horizontal direction PICTURE_MAX_XSIZE that are set within the register 543 (S42).

Since whether the memory device to be controlled has the multi-bank access function or not is set in the register 543, this matter is checked (S43). If the multi-bank access function is not set, the normal control operation is performed to repeatedly issue the active command ACT and read command RD (or write command) in accordance with the number of banks (S44).

In the case in which the multi-bank access function is set, the command/address generating section 942 determines the number of banks on the basis of a bank straddling flag Flag [X:Y] (S46). As a result, the command/address generating section 942 generates the multi-bank information SA' [1:0] from the bank straddling flag Flag [X:Y]. The relationship therebetween is as follows:

Flag [X:Y]=00 SA'[1:0]=00 (one bank is activated)

Flag [X:Y]=10 SA'[1:0]=01 (two banks are activated in the X direction)

Flag [X:Y]=01 SA' [1:0]=10 (two banks are activated in the Y direction)

Flag [X:Y]=11 SA' [1:0]=11 (four banks are activated)

Therefore, the command/address generating section 942 issues the multi-bank information SA' along with the active command ACT, leading bank address BA, and leading row address RA (S80, S70, S60, S50).

In the case in which the four banks are activated simultaneously, the command/address generating section 942 within the memory controller issues the multi-bank information SA'=11 along with the active command ACT and row address RA (S50). Then, the command/address generating section 942 issues a read command or write command along with the column address CA within the upper left bank (S51). This read or write command is repeatedly issued while incrementing the column address a number of times, i.e., 1ST_X_SIZE=N times, corresponding to the access size in the X direction within the upper left bank. Moreover, a read command or write command is issued along with the column address CA within the right bank (S52). This read or write command is repeatedly issued while incrementing the column address a number of times, i.e., 2ND_X_SIZE=N times, corresponding to the access size in the X direction within the upper left bank. Then, the number of lines is incremented by one (S53), and the steps S51, S52 and S53 are repeated until the number of lines exceeds the 1ST_Y_SIZE, which is the access size in the Y direction within the upper left bank (S54).

Next, the command/address generating section 942 issues a read command or write command along with the column address CA of the lower bank (S55). This read or write command is repeatedly issued while incrementing the column address a number of times, i.e., 1ST_X_SIZE=N times, corresponding to the access size in the X direction within the lower bank. Furthermore, a read command or write command is issued along with the column address CA of the lower right bank (S56). This read or write command is repeatedly issued while incrementing the column address a number of times, i.e., 2ND_X_SIZE=N times, corresponding to the access size in the X direction of the right bank. Then the number of lines is incremented by one(S57), and the steps S55, S56 and S58 are repeated until the number of lines exceeds the 2ND_Y_SIZE, which is the access size in the Y direction within the lower bank (S58).

The command/address generating section 942 obtains the column address to be issued along with the abovementioned read or write command, from the leading column address COL_ADR=123 and the column address step number data CST=4, which are the intermediate parameters, on the basis of the memory map.

In the case in which two banks are activated simultaneously in the X direction, the command/address generating section 942 within the memory controller issues the multi-bank information SA'=01 along with the active command ACT and row address RA (S60). Then, a read or write command and a column address are issued N times to the upper left bank (S61), and a read or write command and a column address are issued N times to the right bank (S62). These steps S61, S62 and S63 are repeated until the number of lines exceeds the 1ST_Y_SIZE (S64).

In the case in which two banks are activated simultaneously in the Y direction, the command/address generating section 942 within the memory controller issues the multi-bank information SA'=10 along with the active command ACT and row address RA (S70). Then, a read or write command and a column address are issued N times to the upper left bank (S71), and these steps S71 and S72 are repeated until the number of lines exceeds the 1ST_Y_SIZE (S73). Similarly, a read or write command and a column address are issued to the lower bank (S74, S75, S76).

Finally, in the case in which only one bank is activated, the command/address generating section 942 within the memory controller issues the active command ACT, row address RA, and multi-bank information SA'=00 (S80). Then, a read or write command and a column address are issued N times to the upper left bank (S81), and these steps S81 and S82 are repeated until the number of lines exceeds 1ST_Y_SIZE (S83).

As described above, once the access request REQ and access target area data X/Y_POS, X/Y_SIZE are received from the access source block, the memory controller 82 generates the intermediate parameter from the row address of the frame area ROW_BASE_ADR and the number of pixels in the horizontal direction PICTURE_MAX_XSIZE that are set in the register 543, then determines the number of banks to be activated simultaneously, issues the multi-bank information SA' corresponding to the result of determination, and then activates the bank within the memory device simultaneously. Accordingly, a plurality of banks can be activated by issuing the active command once, whereby memory access can be performed efficiently.

Figure 98:
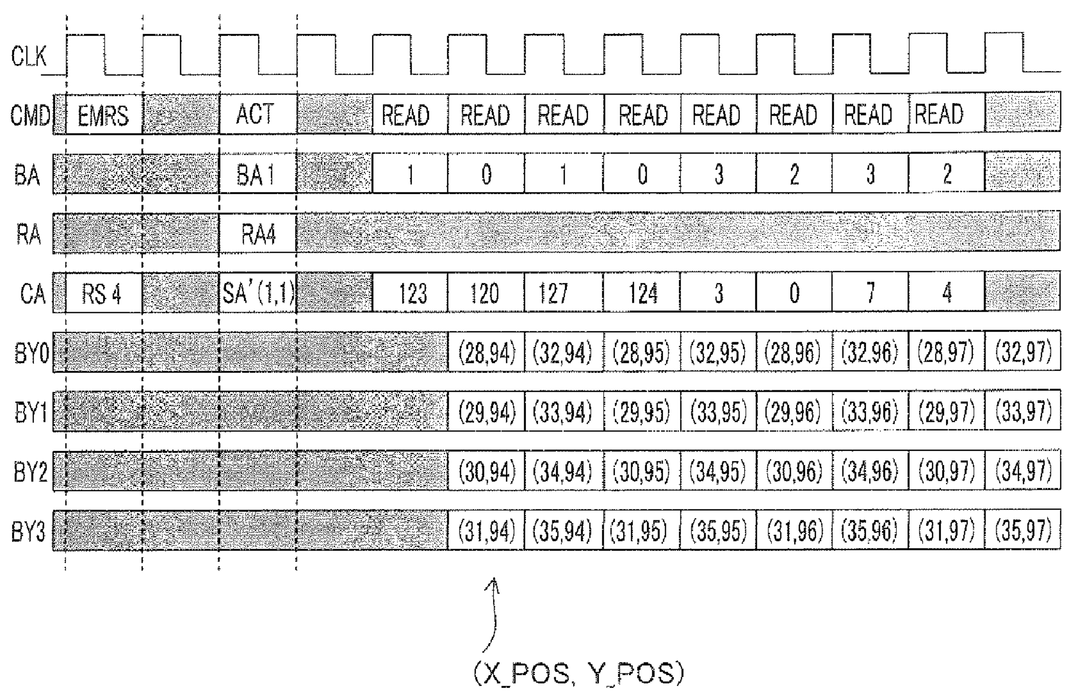
FIG. 98 A timing chart between the memory controller and the memory device.

FIG. 98 is a timing chart between the memory controller and the memory device. This is a timing chart showing the case in which access is made to the rectangular area RIMG that straddles four banks as shown in FIG. 96. First of all, the memory controller issues the extended mode register set command EMRS and row address step information RS4, and sets row address step information RS into the register within the memory device. Next, the memory controller issues the active command ACT, upper left bank address BA1, leading row address RA4 and multi-bank information SA' (1, 1). In response to this, four banks are simultaneously activated in the memory device.

In the example shown in FIG. 98, the multi-bank information SA' is inputted from the column address terminal CA. However, in the case in which the memory device adopts an address multiplex configuration for inputting the row address RA and column address CA from a common address terminal, the multi-bank information SA' needs to be inputted from the special terminals SP as shown in FIG. 72.

Furthermore, the memory controller repeatedly issues a read command RD, a bank address BA and a column address CA. As shown in FIG. 96(B), the bank address BA and the column address CA are as follows: (BA, CA)=(1, 123), (0, 120), (1, 127), (0, 124), (3, 3), (2, 0), (3, 7), (2, 4). In response to this, 4-byte data of the pixel coordinates (X_POS, Y_POS) shown in FIG. 98 is outputted from the 4-byte input/output terminals BY 0 through 3 of the memory, and the memory controller receives these 4-byte data items. In this manner, the active command ACT is issued only once.

In the case in which a plurality of banks are activated by a single active command by means of the multi-bank access function, when the byte boundary function is used to access image data in the middle of a 4-byte area, the memory controller issues a read or write command, a bank address BA, a column address CA, start byte information SB, and memory map information BMR, as shown in FIG. 87. Accordingly, the memory controller can reduce the number of times that the read or write command is issued, and can further receive or output, with a single access, the data that is effective to all data buses.

It should be noted that the above embodiment has described an example of an image memory that stores the digital image data in which image data items of a plurality of pixels are arranged two-dimensionally. However, the present invention can be applied to not only the image memory for storing the image data, but also a memory device that can also store two-dimensionally arrayed data items besides the image on the basis of predetermined mapping rules. If the stored data items are arranged two-dimensionally, sometimes the data items of a plurality of page areas need to be accessed when accessing any rectangular area within the two-dimensionally arrayed data. The present invention can be applied in such a case as well.

<<Background Refresh>>

The overview of the background refresh has been described with reference to FIG. 6. Specifically, in the case in which the memory controller causes the memory device to successively execute the access operation, such as horizontal access, on a specific bank over a predetermined period of time, the memory controller specifies a bank that is not accessed, and issues a background refresh command to cause the memory device to execute the refresh operation on the specified bank. The memory controller then issues a normal operation command during this refresh operation, and thereby causes the memory device to execute the normal access operation on the bank in which the refresh operation is not performed.

Figure 99:
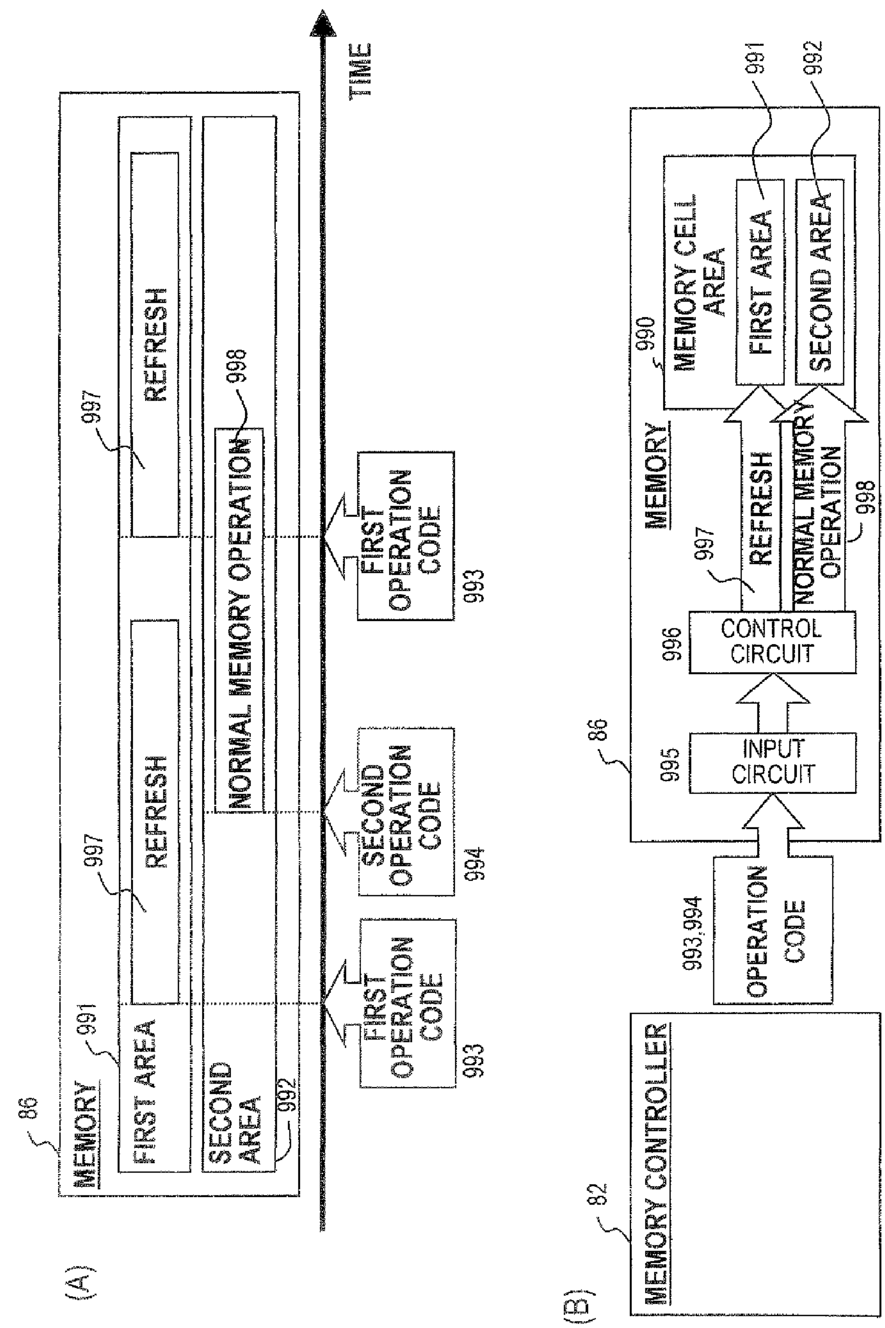
FIG. 99 A schematic explanatory diagram of the background refresh in the present embodiment.

FIG. 99 is a schematic explanatory diagram of the background refresh in the present embodiment. FIG. 99(A) shows a background refresh operation, and FIG. 99(B) shows a configuration of the memory device. The memory device 86 has a first area 991 and a second area 992 within a memory cell area 990. The first and second areas 991 and 992 correspond to the bank areas, and each can perform the active operation, read and write operations, and pre-charge operation independently. Furthermore, the memory device 86 has an input circuit 995 for inputting operation codes 993, 994 from the memory controller 82, and a control circuit 996 for causing either one of the first and second areas 991 and 992 of the memory cell area to perform the refresh operation, and causes the other one to perform the normal memory operation, in response to the operation codes. The operation codes are commands that are issued by, for example, the memory controller. Alternatively, the operation codes are a combination of a command and a signal value of a specific input terminal.

As shown in FIG. 99(A), the control circuit 996 starts a refresh operation 997 on the first area 991 within the memory, in response to the first operation code 993. This first operation code 993 corresponds to the background refresh command BREN shown in FIG. 6. In synchronization with this first operation code 993, or before the first operation code 993 is issued, a refresh target area (first area) is set, and the number of refresh operations (refresh burst length) to be executed in response to a single background refresh command, and the number of blocks of the memory (refresh block count) to be refreshed simultaneously in a single refresh cycle are also set. In response to these settings, the control circuit 996 causes the refresh target area (first area) to execute the refresh operation 997.

The background refresh is performed only in a partial area within the memory device (first area). Therefore, in the case of an area other than the refresh target area, the normal memory operation can be performed in parallel with the background refresh. Then, the control circuit 996 executes normal memory operation 998 corresponding to the second operation code 994, in the selected second area 992 in response to the second operation code sent from the memory controller. The second operation code 994 is, for example, an active command, read/write command, or the like. Specifically, the control circuit 996 causes the second area 992 to execute the normal memory operation 998 in response to the second operation code 994 even prior to the completion of the refresh operation 997 executed by the first area 991. The control circuit 996 also causes the first area 991 to execute the refresh operation 997 in response to the first operation code 993 even prior to the completion of the normal memory operation 998 executed by the second area 992.

In this manner, in the background refresh of the present embodiment, the refresh operation in the first area and the normal memory operation in the second area can be executed without waiting for the completion of the other operation. Accordingly, it can be prevented that by executing the refresh operations in all areas within the memory device, the normal memory operations are interrupted during the refresh operation period, and of the effective access efficiency is decreased.

Figure 100:
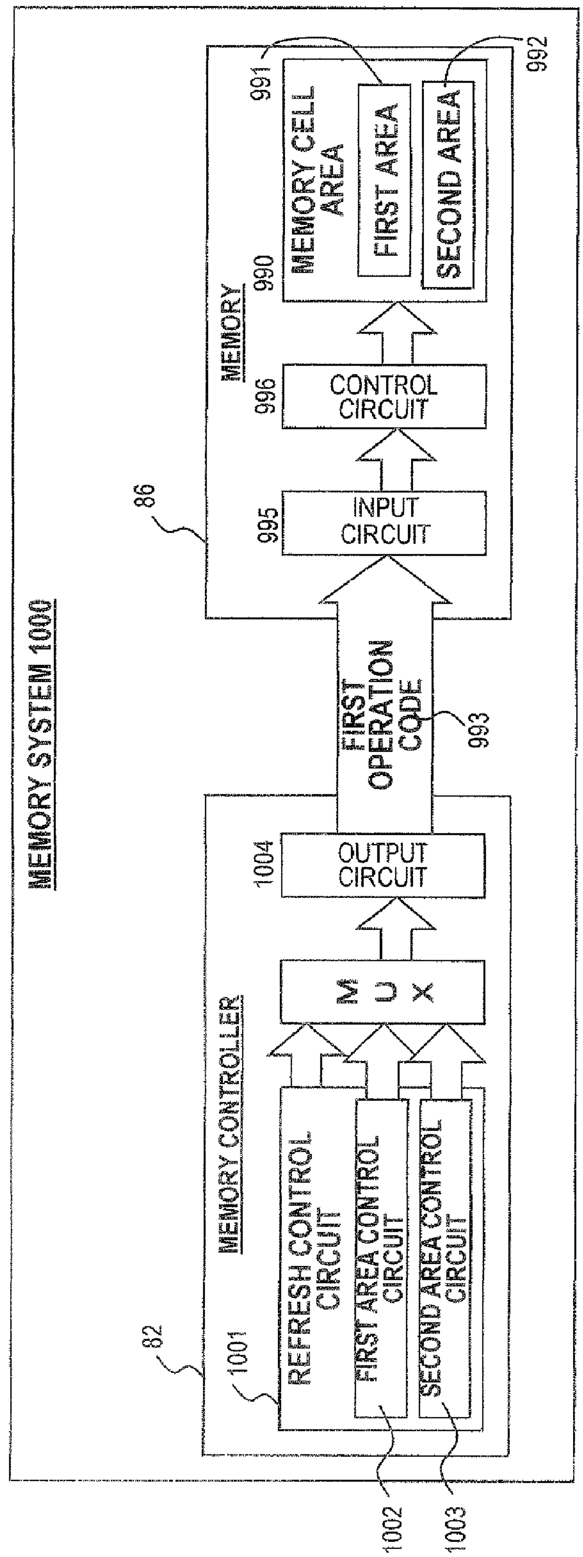
FIG. 100 A schematic explanatory diagram of the memory system in which the background refresh of the present embodiment is performed.

FIG. 100 is a schematic explanatory diagram of the memory system in which the background refresh of the present embodiment is performed. A memory system 1000 is constituted by the memory controller 82 and the memory device 86. The memory device 86 is the same as the one shown in FIG. 99, and the memory controller 82 is constituted by a refresh control circuit 1001, a multiplexer MUX, and an output circuit 1004. The refresh control circuit 1001 is provided with first and second control circuits 1002 and 1003 that perform the refresh control of the first and second areas 991 and 992 of the memory respectively. Specifically, in the background refresh function, while the memory device causes either the first or second area 991 or 992 to perform refresh operation, the memory device causes the other area to perform normal memory operation. In order to do so, it is required that the first and second areas 991 and 992 be subjected to refresh control individually.

According to the memory refresh specification, the period of time in which all memory areas need to be refreshed, and the number of times that the refresh operation is performed are defined. For example, in a 64 M-bit memory, "64 ms/4096 cycles" is defined. In this case, in order to refresh all of the 64 Mbits of cells within 64 ms, the refresh operation is performed at a frequency of every 15, 6 μs (=64 ms/4096), wherein 16 Kbits (=64M/4096) of cells are refreshed in one refresh operation.

On the other hand, in the case in which the memory cell area 990 is constituted by the first and second areas 991 and 992 as shown in FIG. 100, all of the 32 Mbits of cells in each area need to be refreshed 2048 times within 64 ms. Therefore, in order to perform the refresh operation on the first and second areas by randomly switching between the two areas, the control circuits 1002 and 1003 for separately controlling the first and second area are required.

Figure 101:
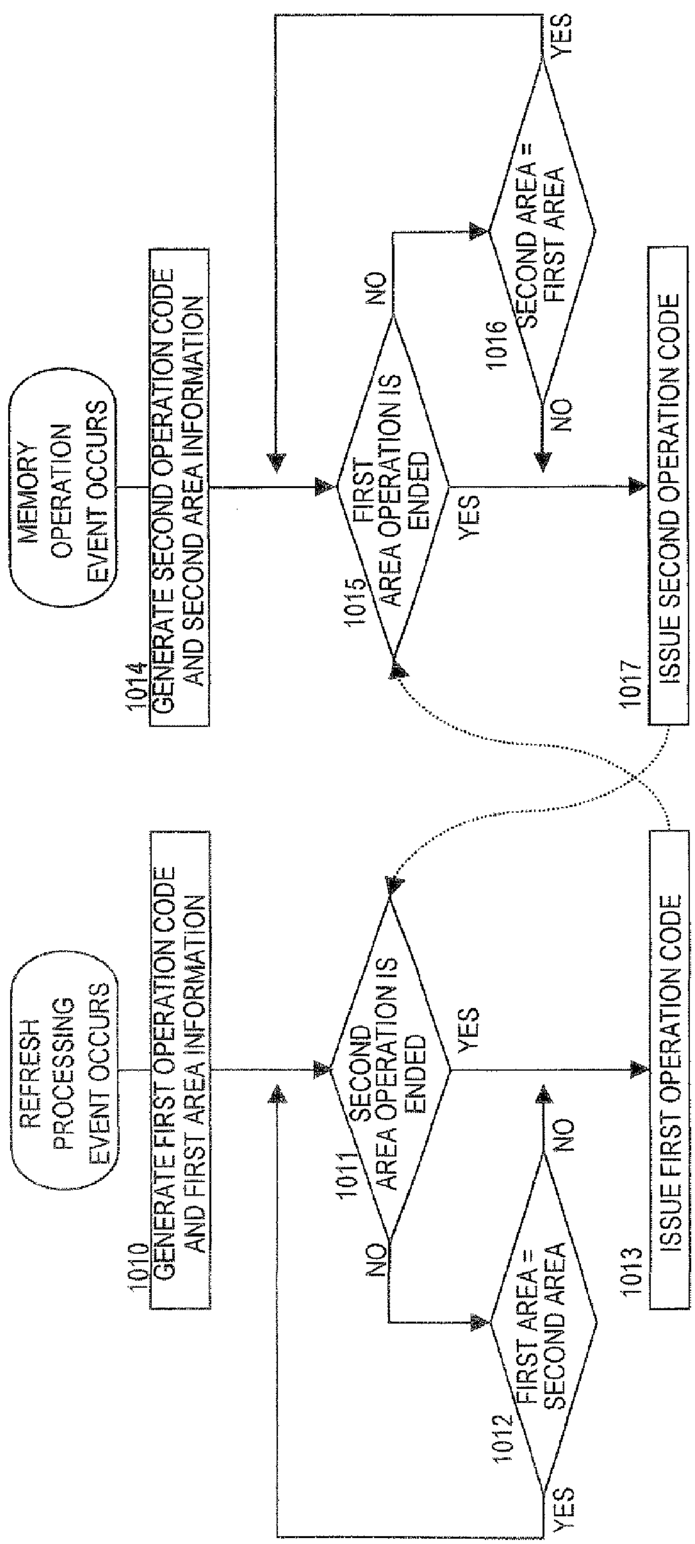
FIG. 101 An operational flowchart of the memory controller for controlling the background refresh.

FIG. 101 is an operational flowchart of the memory controller for controlling the background refresh. In the image processing system, the image processing device outputs a memory operation request to the memory controller, and a memory operation event occurs within the memory controller in response to the memory operation request. Moreover, a refresh processing event also occurs within the memory controller. Therefore, the memory operation event and the refresh processing event need to be adjusted. In the above example, in case of horizontal access, if the both events do not occur within the same area (bank), a command for one of the events can be issued even when the processing on the other event is not completed.

For example, if a refresh event occurs, the memory controller generates a first operation code and first area information (1010), and issues the first operation code (1013) even if an operation on the second area is not completed (NO in 1011) if the first area and the second area are different (No in 1012). If the first area as a refresh event target is the same as the second area which is being operated (Yes in 1012), the processing is kept in standby until the operation of the second area is completed (Yes in 1011).

Similarly, once the memory operation event occurs, the memory controller generates a second operation code and second area information (1014), and issues the second operation code (1017) as with the above manner even if an operation on the first area is not completed (NO in 1015) if the second area and the first area are different (No in 1016). If the second area as a memory operation event target is the same as the first area which is being operated (Yes in 1016), the processing is kept in standby until the operation on the first area is completed (Yes in 1015).

Figure 102:
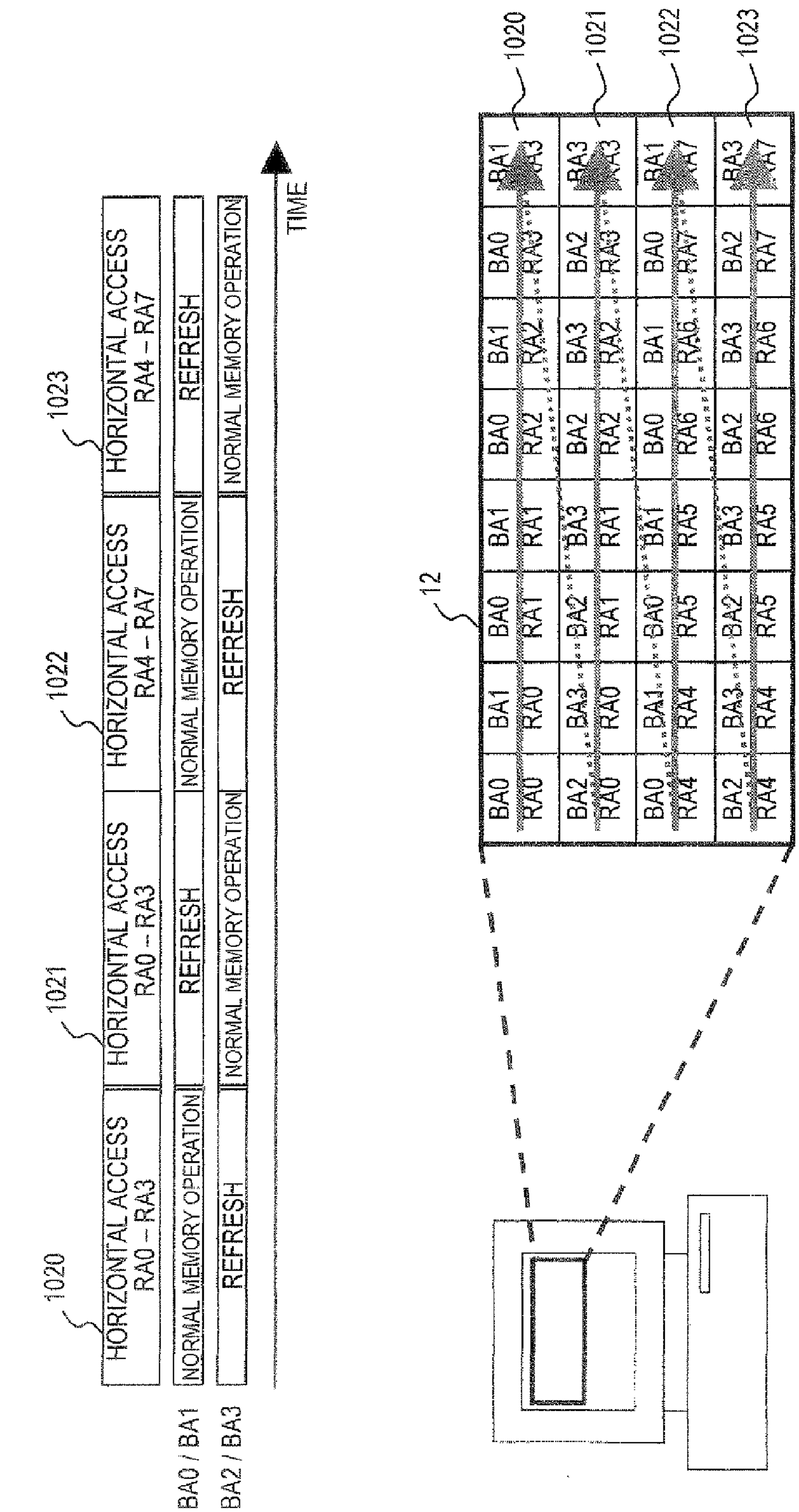
FIG. 102 A figure showing a relationship between the background refresh and horizontal access according to the present embodiment.

FIG. 102 is a figure showing a relationship between the background refresh and horizontal access according to the present embodiment. In the memory map 12 the background refresh is executed in banks BA2 and BA3 during the execution of a horizontal access 1020 to banks BA0 and BA1. Similarly, the background refresh is executed in the banks BA0 and BA1 during the execution of a horizontal access 1021 to the banks BA2 and BA3. The same applies to horizontal accesses 1022 and 1023. In this manner, when execution of horizontal accesses is started successively, a bank in which no access is generated for a certain period of time can be determined, thus the refresh operation can be performed on this bank in which no access is made. By performing such control, it is not happen that a refresh operation command is issued to all banks during the horizontal access, and so the horizontal access is interrupted. Therefore, in the case in which the image data or other two-dimensionally arrayed data is raster scanned and accessed from the upper left to the lower right, dead cycles that are caused by the refresh operation can be eliminated, whereby high-speed raster scanning can be performed.

Figure 103:
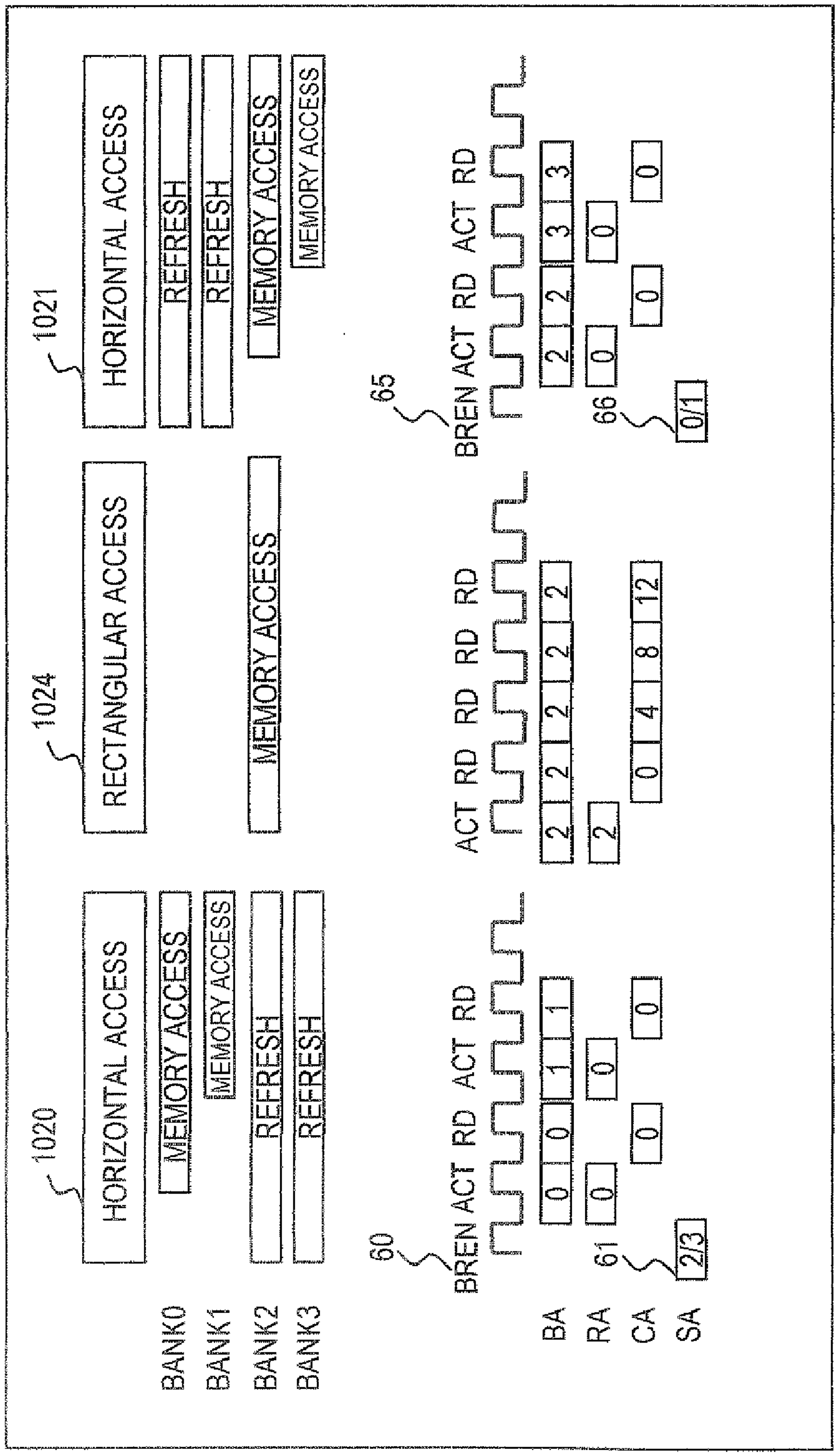
FIG. 103 A figure showing a relationship of the background refresh to horizontal accesses and rectangular access according to the present embodiment.

FIG. 103 is a figure showing a relationship of the background refresh to horizontal accesses and rectangular access according to the present embodiment. There is shown an example in which a rectangular access 1024 is generated between the abovementioned horizontal accesses 1020 and 1021. In the image processing system constituted by the image memory, memory controller and image processing device, a combination of a horizontal access and rectangular access is requested against the image memory. In the rectangular access, an arbitrary address of the memory is accessed every time when compression/expansion processing is performed on the image data, thus it is difficult to predict which bank is accessed. In the horizontal access, on the other hand, an access is generated only in a specific bank for a certain period of time, and no access is generated in the rest of the banks.

Therefore, in the horizontal access 1020, the background refresh command BREN (a reference numeral 60 in the figure) is inputted along with the refresh bank information SA (a reference numeral 61 in the figure) indicating the refresh target bank. In this example, the horizontal access 1020 is generated with respect to the banks BA0, BA1, thus the refresh target banks are BA2 and BA3. In response to the background refresh command BREN, the control circuit within the memory device instructs the refresh target banks BA2 and BA3 to perform the refresh operation. In this horizontal access 1020, an active command ACT is inputted along with a bank address BA=0 and a row address RA=0, the page areas of BA0 and RA0 are activated, then a read command RD is inputted along with a bank address BA=0 and a column address CA=0, and the data is read. Similarly, a active command ACT is inputted along with a bank address BA=1 and a row address RA=0, the page areas of BA1 and RA0 are activated, a read command RD is inputted along with a bank address BA=1 and a column address CA=0, and the data is read. In the horizontal access, these operations are repeated for a certain period of time. In the meantime, the refresh operation is repeated in the banks BA2 and BA3.

The operations similar to those described above are carried out in the horizontal access 1021 as well. Specifically, the background refresh command BREN (a reference numeral 65 in the figure) is inputted along with BA0, 1 as the refresh bank information SA (a reference numeral 66 in the figure), and the refresh operation is performed in the banks BA0, 1. In parallel with this refresh operation, and an active command and a read command are repeatedly inputted, whereby the horizontal access operation is performed on the banks BA2, 3. During the rectangular access 1024, the background refresh operation is not performed.

The abovementioned background refresh command BREN corresponds to the first code. Also, the active command ACT and read command RD or write command WT (not shown) correspond to the second code.

Figure 104:
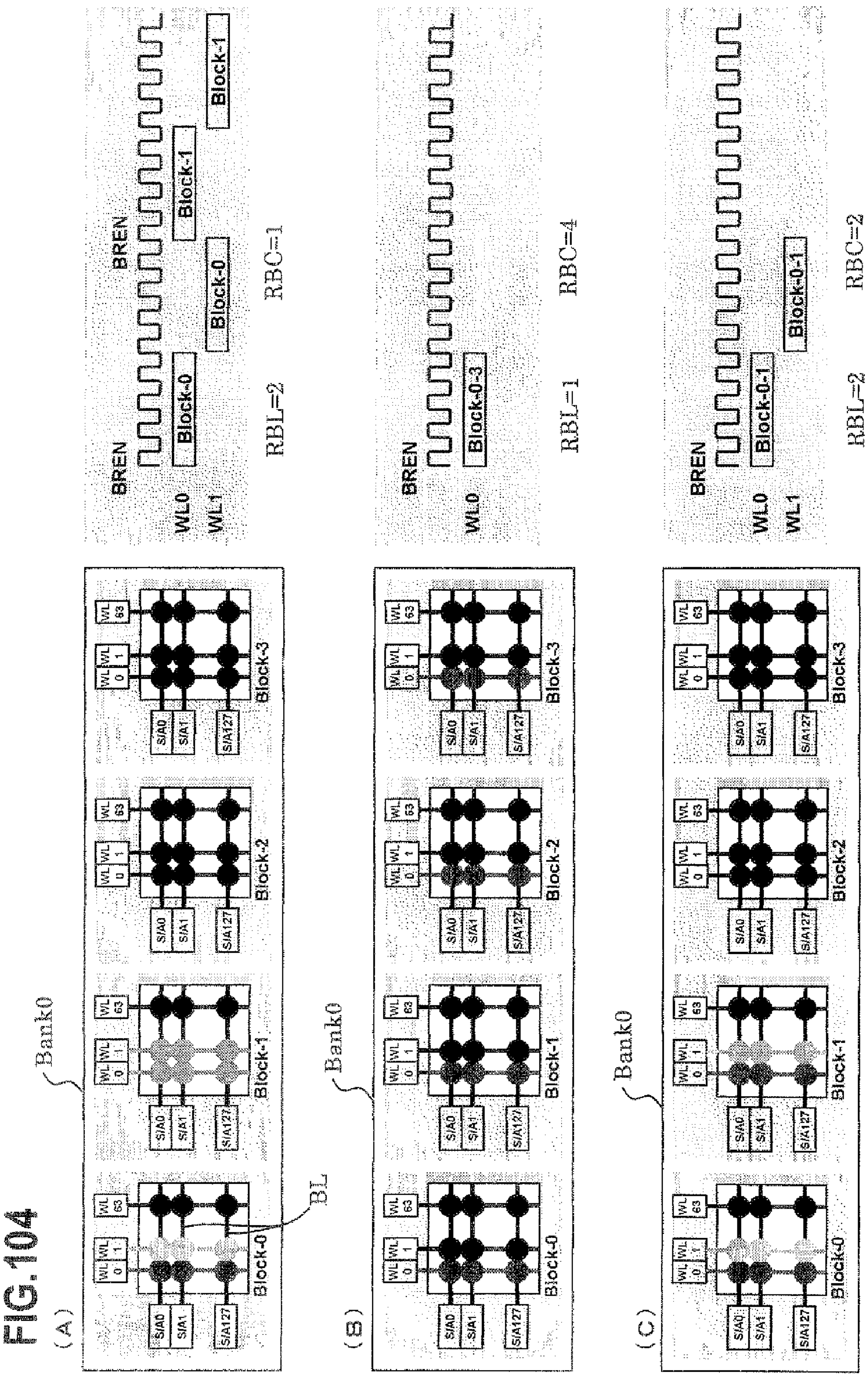
FIG. 104 A figure for explaining the number of times and the number of blocks the background refresh is performed according to the present embodiment.

FIG. 104 is a figure for explaining the number of times and the number of blocks the background refresh is performed according to the present embodiment. The background refresh is executed on a bank in which access is not generated, when access is generated only in a specific bank in a certain period of time or when horizontal access is generated. In the present embodiment, in addition to the refresh bank information SA indicating the refresh target bank, the memory device is supplied, from the memory controller, with refresh burst length RBL, which indicates the number of times the refresh is executed in response to a single background refresh command BREN, and the refresh block count RBC, which indicates the number of blocks, or precisely, the number of word lines, which are refreshed simultaneously in a signal refresh operation.

Specifically, in the horizontal access a part of banks are repeatedly accessed during a certain period of time in accordance with the size of the access target image. However, the time period of the horizontal access varies, and the horizontal access occurs randomly. Therefore, it is required that the refresh operation be executed on the desired number of addresses in the refresh target bank during the horizontal access. For example, in the case in which the refresh operation needs to be performed on an address N during a horizontal access period T, if $T \div \tau \geqq N$ is satisfied where $\tau$ is a cycle time required in a single refresh operation, the refresh operation may be executed N times on one block (one word line). However if T÷τ≧N is not satisfied, a plurality of blocks (a plurality of word lines) are subjected to a single refresh operation simultaneously, whereby the number of N needs to be reduced effectively. The number of blocks that are subjected to the refresh operation simultaneously is the refresh block count RBC.

Furthermore, if the size of access target data is larger than predetermined size, the horizontal access period is extended by a certain amount. In this case, the number of commands issued can be reduced by repeating the refresh operation a number of times on a single background refresh command BREN. In this case, the number of times the refresh can be executed during the horizontal access period T is T÷τ, which is the refresh burst length RBL. By specifying the refresh burst length RBL when the horizontal access is started, the refresh cycle is ended at the point of time when the horizontal access period T is ended, thus the memory device, immediately thereafter, can issue an active command to enter the cycle of the normal memory operation.

Returning to FIG. 104, with regard to the example in which the bank Bank0 is constituted by four blocks Block-0 through 3 in the figure, there is shown an example of three combinations of the refresh burst length RBL and the refresh block count RBC. Each of the block has word lines WL, bit lines BL, and a group of sense amplifiers S/A that are connected to the bit lines BL respectively. Each of the four blocks Block-0 through 3 has the group of sense amplifiers S/A and are capable of performing the refresh operation simultaneously. It should be noted that the refresh operation is constituted by active operation and pre-charge operation. Also, the normal operation is constituted by the active operation, read or write operation, and pre-charge operation.

FIG. 104(A) shows an example in which RBL=2 and RBC=1. In response to the background refresh command BREN, the refresh operation is performed by the word lines WL0 and WL1 of the block Block-0 continuously, and, in response to the subsequent command BREN, the refresh operation is performed by the word lines WL0 and WL1 of the block Block-1 continuously. In this case, since RBC=1, the refresh operation is performed only in one block, thus the amount of current consumed in the refresh operation can be reduced.

FIG. 104(B) shows an example in which RBL=1 and RBC=4. In response to the background refresh command BREN, the refresh operation is performed by the word lines WL0 of the respective four blocks Block-0 through 3 simultaneously. Although only one refresh cycle is executed, the refresh is performed by the four blocks simultaneously, thus four addresses are refreshed. However, a large amount of current is consumed instantly.

Finally, FIG. 104(C) shows an example in which RBL=2 and RBC=2. In response to the background refresh command BREN, the refresh operation is performed continuously by the word line WL0 and the word line WL1 of two blocks Block-0, 1 respectively. Accordingly, the number of row addresses to be refreshed is 4. However, since the refresh operation is performed by two memory blocks simultaneously, the amount of current consumed instantly is lower than that in the example of FIG. 104(B).

As described above, in the background refresh of the present embodiment, the refresh bank information SA indicating the refresh target bank, the refresh burst length RBL, and the refresh block count RBC are inputted along with the command BREN or the register set command EMRS so as to flexibly respond to the occurrence and period of random horizontal accesses.

Incidentally, the memory controller can cause the memory device to execute the background refresh operation a number of times by setting the refresh burst length RBL, but once the refresh operation is started, it is inconvenient if the number of refresh operations corresponding to the refresh burst length RBL cannot be changed. Therefore, as will be described hereinafter, in the present embodiment, the refresh burst length RBL can be increased by addition or reset to obtain new burst length RBL, or the refresh operation can be stopped. In order to flexibly respond to random horizontal accesses, the background refresh command can be issued beforehand by means of a function of adding burst length RBL. The function of resetting the burst length can be used in new horizontal access is generated. Moreover, the command for stopping the refresh operation is effective when the refresh burst length RBL that has been set once is excessively long.

Further, in the present embodiment, a refresh-all command for executing the refresh operation on all remaining addresses can be used. Accordingly, the memory area without effective data can be forcibly caused to perform the refresh operation to reset a refresh counter. This will be described hereinafter.

Figure 105:
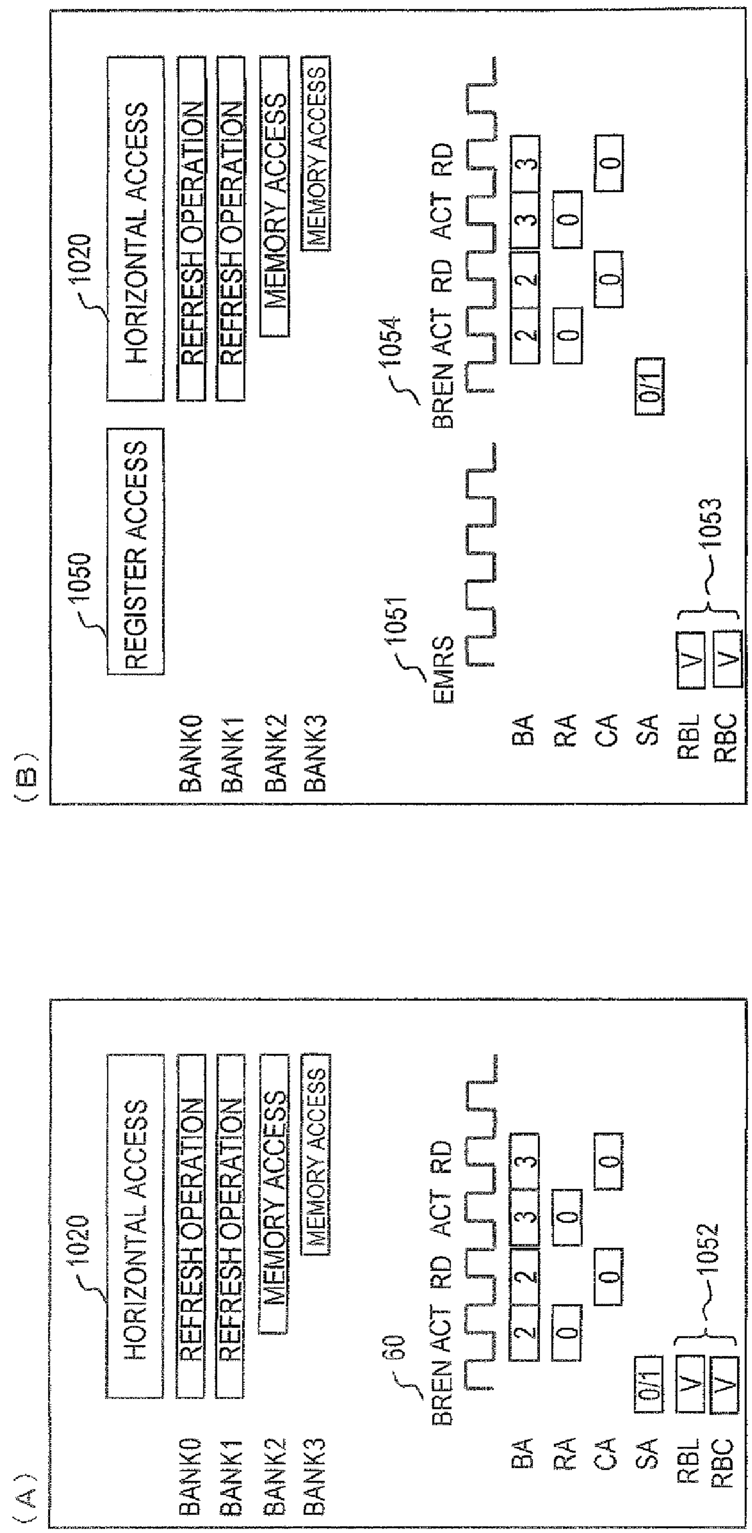
FIG. 105 A timing chart of the background refresh operation according to the present embodiment.

FIG. 105 is a timing chart of the background refresh operation according to the present embodiment. FIG. 105(A) shows an example in which the banks BA0, 1 are caused to perform the refresh operation when the horizontal access 1020 is made to the banks BA2, 3, wherein the refresh burst length RBL and the refresh block count RBC (a reference numeral 1052 in the figure) are issued along with the background refresh command BREN (a reference numeral 60 in the figure) to the memory device. Thereafter, the active command ACT and the read command RD corresponding to the horizontal access are repeatedly issued.

In FIG. 105(B), on the other hand, before the horizontal access 1020 is started, the refresh burst length RBL and the refresh block count RBC are issued (a reference numeral 1053 in the figure) along with an extended mode register set command EMRS (a reference numeral 1051 in the figure). Accordingly, the memory device sets the RBL and RBC into an internal mode register. Thereafter, in the horizontal access 1020, the refresh bank information SA is supplied along with the background refresh command BREN (a reference numeral 1054 in the figure), in response to which the memory device performs the refresh operation corresponding to the registered RBL and RBC. Then, the active command ACT and read command RD corresponding to the horizontal access are repeatedly issued.

As described above, the refresh burst length RBL and the refresh block count RBC may be set each time along with the command BREN, or set into the mode register beforehand. By setting the refresh burst length RBL, and the refresh block count RBC into the mode register, the refresh burst length RBL and the refresh block count RBC do not have to be set each time along with the command BREN.

Figure 106:
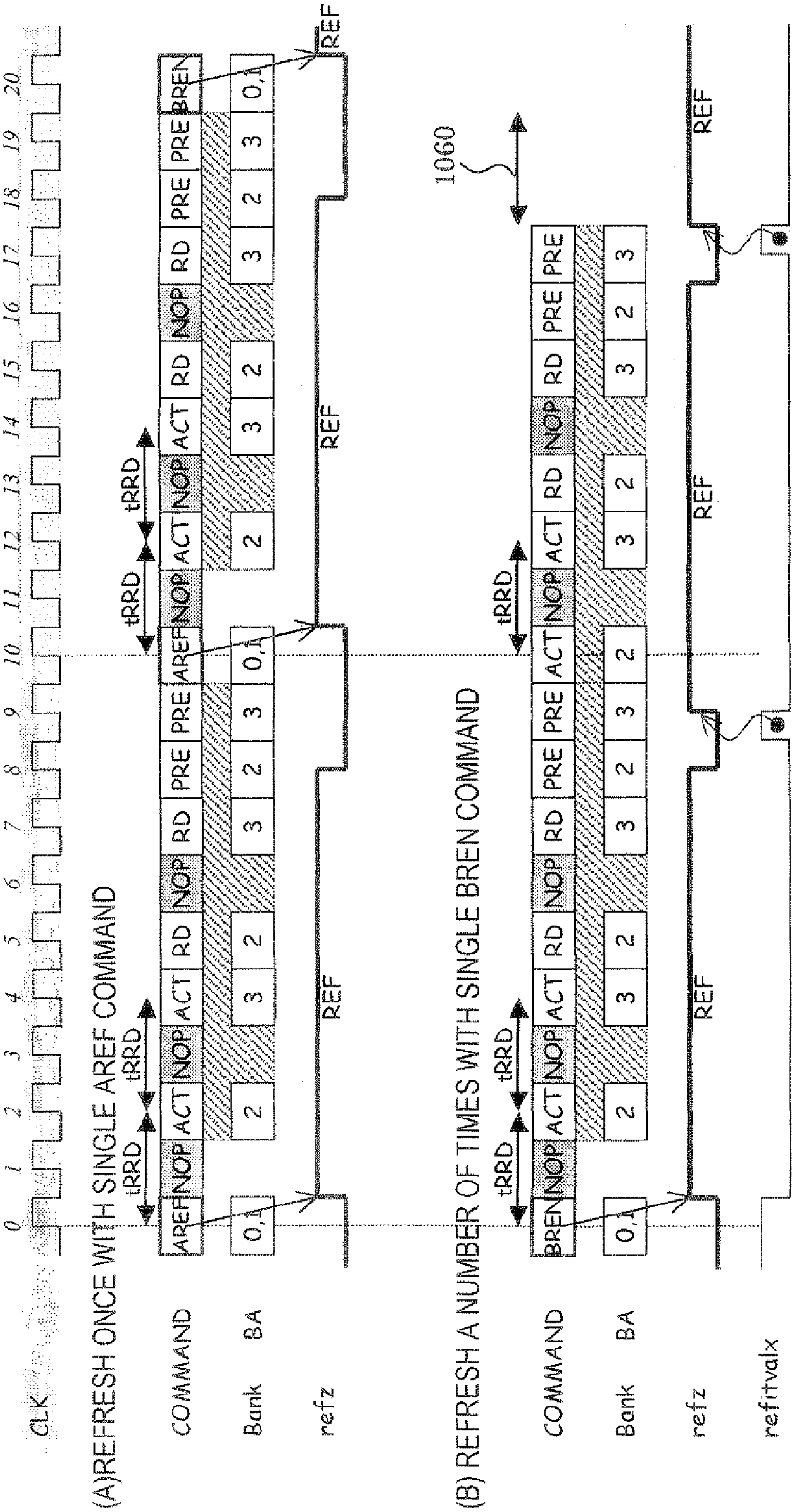
FIG. 106 A figure for explaining the refresh burst length according to the present embodiment.

FIG. 106 is a figure for explaining the refresh burst length according to the present embodiment. FIG. 106(A) is a timing chart showing the case in which the refresh is performed once on the auto-refresh command AREF. FIG. 106(B), on the other hand, is a timing chart showing the case in which the refresh is performed a number of times (RBL) with respect to a single background refresh command BREN, according to the present embodiment. Both figures show an example in which the refresh is performed on the banks BA0, 1 during the horizontal access to the banks BA2, 3.

As shown in FIG. 106(A), the refresh bank information (0, 1) is supplied along with the auto-refresh command AREF to a bank address terminal BA, the refresh control signal refz is brought to the H level in the memory device, and the refresh operation REF is performed. After a lapse of time tRRD between commands, an active command ACT is issued to BA2 and BA3, in response to which a read command RD is issued to BA2 and BA3, and then a pre-charge command PRE is issued to BA2 and BA3. Thereafter, an auto-refresh command AREF is issued again at the timing of a clock number 10, and a refresh is executed on the banks BA0, 1. Accordingly, the refresh operation REF is performed only once in response to a single auto-refresh command AREF, thus it is necessary to the auto-refresh command AREF a number of times.

On the other hand, as shown in FIG. 106(B), in response to the background refresh BREN, the refresh operation REF is repeated a number of times corresponding to the refresh burst length RBL that is set beforehand. Specifically, the control circuit within the memory activates the refresh control signal refz to execute the refresh operation, and, upon completion thereof, further activates the refresh control signal refz in response to a refresh interval signal refintvalx to execute the refresh operation. In this manner, the refresh operation is repeated a number of times corresponding to the refresh burst length RBL. Therefore, it is not necessary to issue a refresh command a number of times. More specifically, a refresh command is not issued at the clock number 10. Consequently, since the second refresh operation is completed earlier by time of 1060 shown in the figure, the refresh operation cycle becomes substantially short. Therefore, by setting the refresh burst length RBL and automatically executing the refresh a number of times, the memory controller can issue the command more efficiently.

Figure 107:
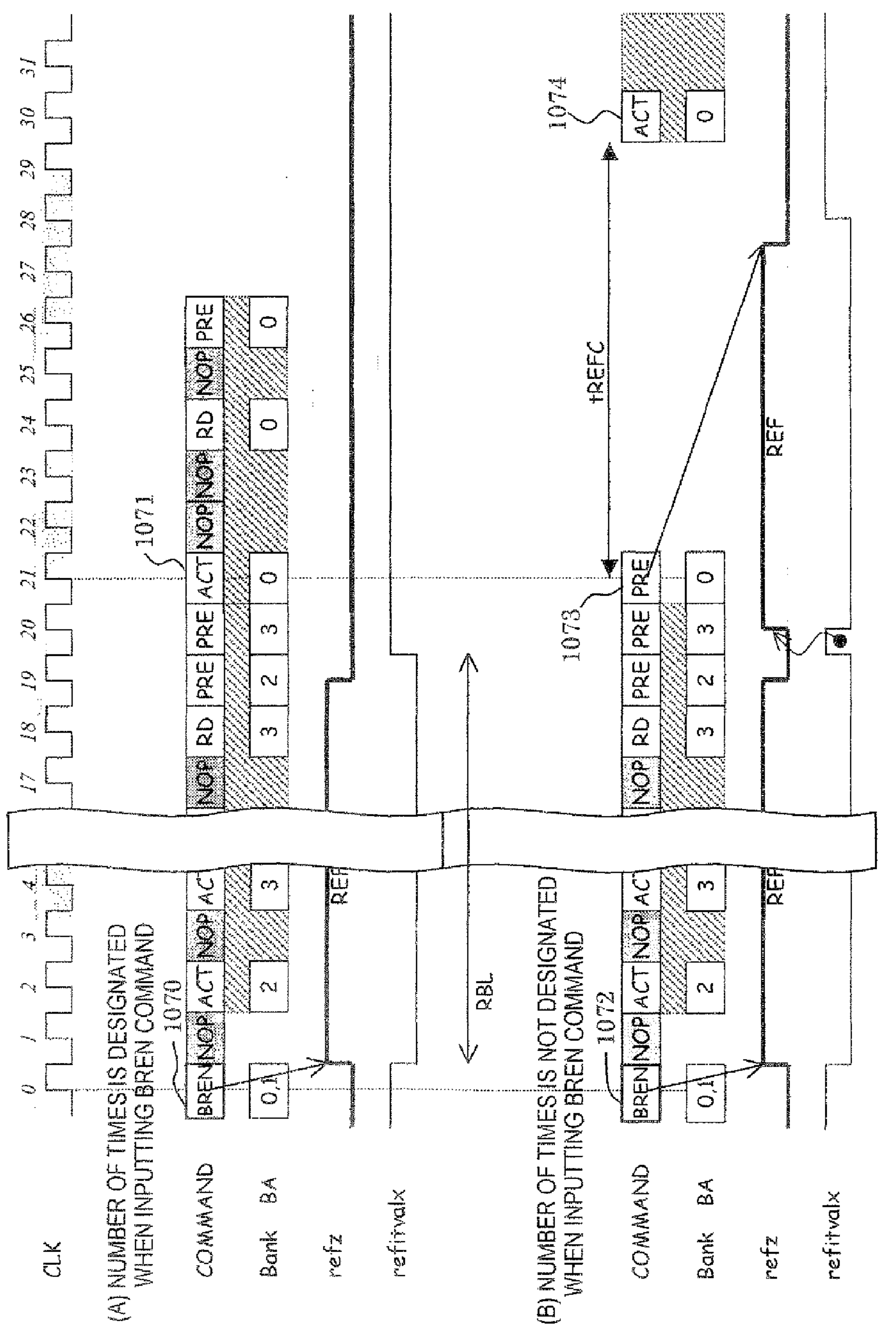
FIG. 107 A figure for explaining the refresh burst length according to the present embodiment.

FIG. 107 is a figure for explaining the refresh burst length according to the present embodiment. FIG. 107(A) is a timing chart showing the case in which the refresh burst length RBL is specified to perform the background refresh, and FIG. 107(B) is a timing chart showing the case in which the background refresh is performed without specifying the RBL. However, both figures show an example in which the refresh operation is performed a number of times in response to the command BREN.

In the case of FIG. 107(A), in response to a background refresh command BREN (a reference numeral 1070 in the figure), the memory device repeats the refresh operation REF internally by the refresh burst length RBL that is set beforehand. Therefore, the internal refresh operation is completed, and the pre-charge operation, which is performed on the banks BA0, 1, is ended at a clock number 20. Therefore, the memory controller can issue an active command ACT (a reference numeral 1071 in the figure) to the bank BA0 at a clock number 21 to perform the normal access.

In the case of FIG. 107(B), on the other hand, since the number of times the refresh is performed is not specified, the memory device internally repeats the refresh operation REF in response to the command BREN (a reference numeral 1072 in the figure). The memory controller issues a pre-charge command PRE (a reference numeral 1073 in the figure) to the bank BA0 at the clock number 21 in order to stop the repeated refresh operation. However, a new internal refresh operation REF is started at the clock number 20, thus this refresh operation cannot be stopped at the clock number 21 in response to the pre-charge command PRE. Therefore, the memory controller cannot issue an active command ACT (a reference numeral 1074 in the figure) until the started refresh operation is completed, and can eventually issue an active command ACT after a lapse of time REFC (approximately several 10 ns) since the pre-charge command PRE has been issued, the time being required for the refresh operation. Specifically, if the number of times the refresh is performed is not specified in advance, the memory controller needs to stop the refresh operation by issuing a pre-charge command. However, since the refresh operation cannot be stopped immediately by issuing a pre-charge command for stopping the refresh operation, issuance of an active command to be issued next becomes delayed.

The invention described in the abovementioned Patent Literature 6, U.S. Patent Application Publication No. US2005/0265104A1, corresponds to FIG. 107(B) described above. On the other hand, the present embodiment corresponds to FIG. 107(A).

Above has described the overview of the background refresh function. A configuration of the memory device for realizing this function is described hereinafter.

[Memory Device with Background Refresh Function]

Figure 108:
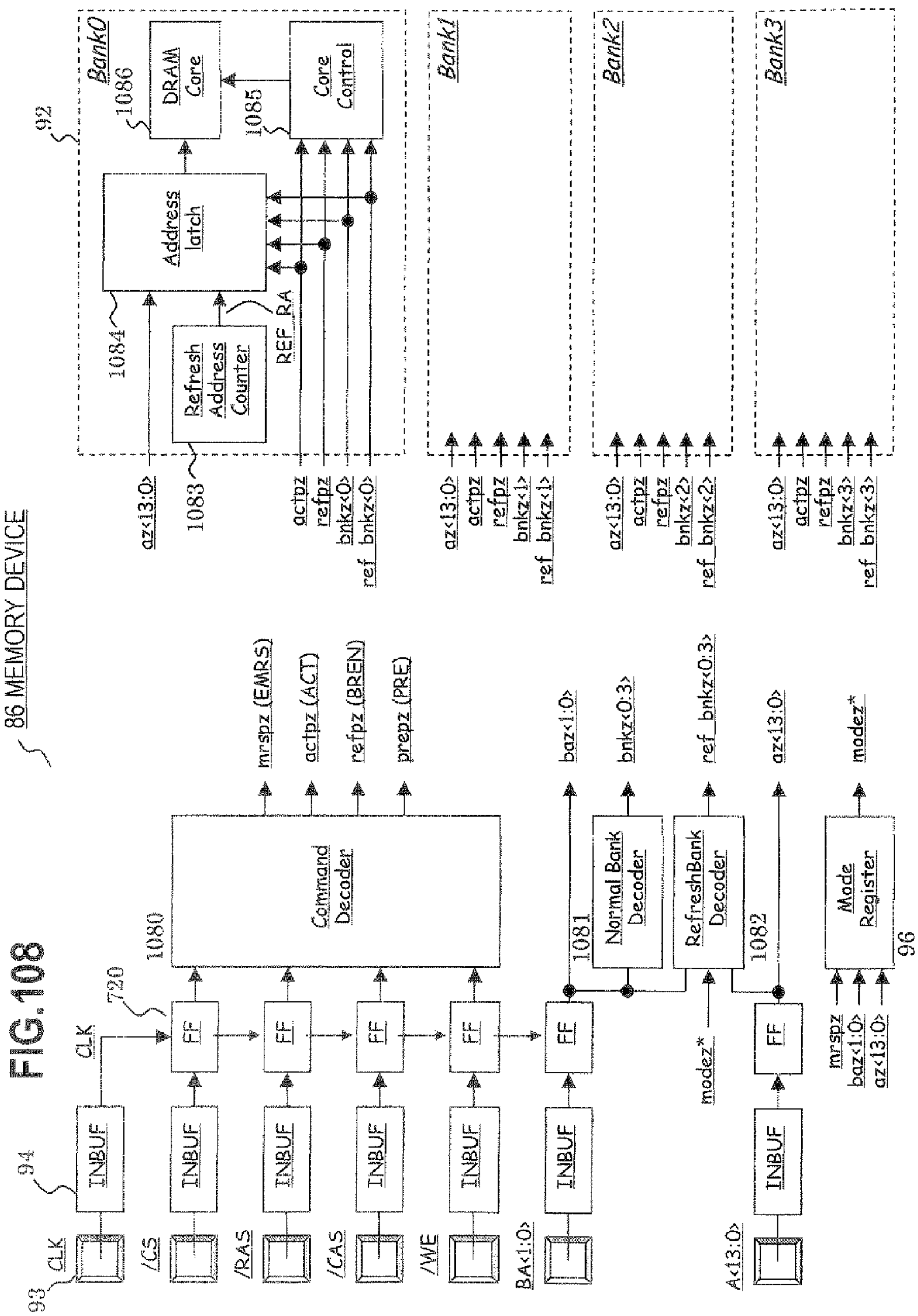
FIG. 108 A configuration diagram of the entire memory device having the background refresh function.

FIG. 108 is a configuration diagram of the entire memory device having the background refresh function. In the figure, a group of input terminals 93 shows terminals of a clock CLK, command signals/CS, /RAS, /CAS, /WE, 2-bit bank addresses BA<1:0>, and 14-bit addresses A<13:0> respectively, and each of the input signals is inputted to an input buffer 94 and latched into a latch circuit 720 in synchronization with a clock CLK. A command decoder 1080 is provided within the command controller 95 shown in FIG. 9, and decodes the command signals/CS, /RAS, /CAS and /WE to output a mode register set pulse signal mrspz, an active pulse signal actpz, a refresh pulse signal refpz, and a pre-charge pulse signal prepz as internal control signals corresponding to commands EMRS, ACT, BREN, and PRE. The bank addresses BA<1:0> are latched and become internal bank addresses baz<1:0>, based on which a normal bank decoder 1081 generates bank selection signals bnkz<0:3>. Moreover, a refresh bank decoder 1082 generates a refresh bank selection signal ref_bnkz<0:3> on the basis of the bank address baz<1:0>, a signal inputted from an address terminal, and a set value modez* that is set in the mode register 96. The mode register 96 sets set values that are inputted from the bank address baz<1:0> and an address az<13:0>, in response to the mode register set pulse signal mrspz.

The memory device 86 has four banks 92 in addition to the abovementioned control circuit. Each of the banks has a core 1086 having a memory cell array, a decoder and a sense amplifier, a core control-circuit 1085 for controlling the core, a refresh address counter 1083 for generating a refresh address (row address) REF_RA of each bank, and an address latch circuit 1084 for latching the address az<13:0> supplied from outside or any of the refresh addresses REF_RA. Although the figure shows only a detailed configuration of the bank Bank0, other banks Banks 1, 2 and 3 have the same configuration.

The core control circuit 1085 of each bank activates the internal core if the bank selection signal bnkz<0:3> is in a selected state, in response to the active pulse signal actpz that is generated in response to the active command ACT. In this case, the address latch circuit 1084 latches the address az<13:0> supplied from the outside, supplies the address to the decoder within the core 1086. In response the refresh pulse signal refpz generated in response to the background refresh command BREN, the core control circuit 1085 activates the internal core and causes the core to perform the refresh operation, if the refresh bank selection signal ref_bnkz<0:3> is in a selected state. In this case, the address latch circuit 1084 latches the refresh address REF_RA of the refresh address counter 1083, supplies the address to the decoder within the core.

[Example of Configuration of Banks of Memory Device]

Figure 109:
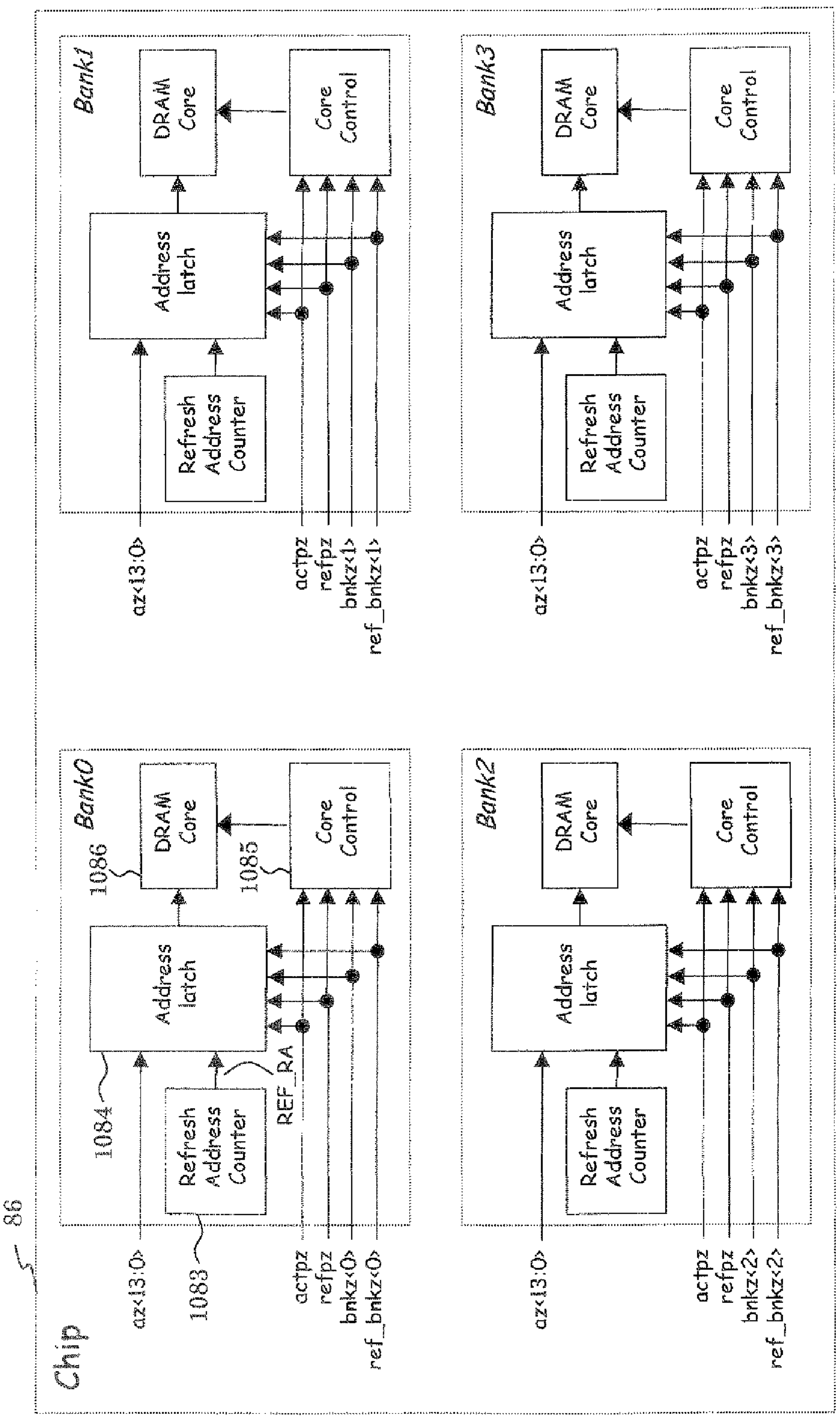
FIG. 109 A configuration diagram of the banks of the memory device having the background refresh function.

FIG. 109 is a configuration diagram of the banks of the memory device having the background refresh function.

FIG. 109 shows the configurations of four banks shown in FIG. 108. All of the four banks, Banks 0 through 3, have the refresh address counter 1083, address latch circuit 1084, core 1086, and core control circuit 1085. The bank selection signal bnkz<0:3> and the refresh bank selection signal ref_bnkz<0:3> are inputted to each of the four banks Banks 0 through 3, and, when these signals are in the selected state, the core control circuit 1085 brings the core into an active state in response to the active pulse signal actpz, and further brings the core into the active state in response to the refresh pulse signal refpz. In this example, since each bank has the refresh address counter 1083, refresh control can be performed independently on each bank. Therefore, while one bank performs the normal memory operation, the refresh control can be performed on one, two or three banks of the rest of the banks. The refresh control that is performed independently on each bank is described with reference to FIG. 100.

Figure 110:
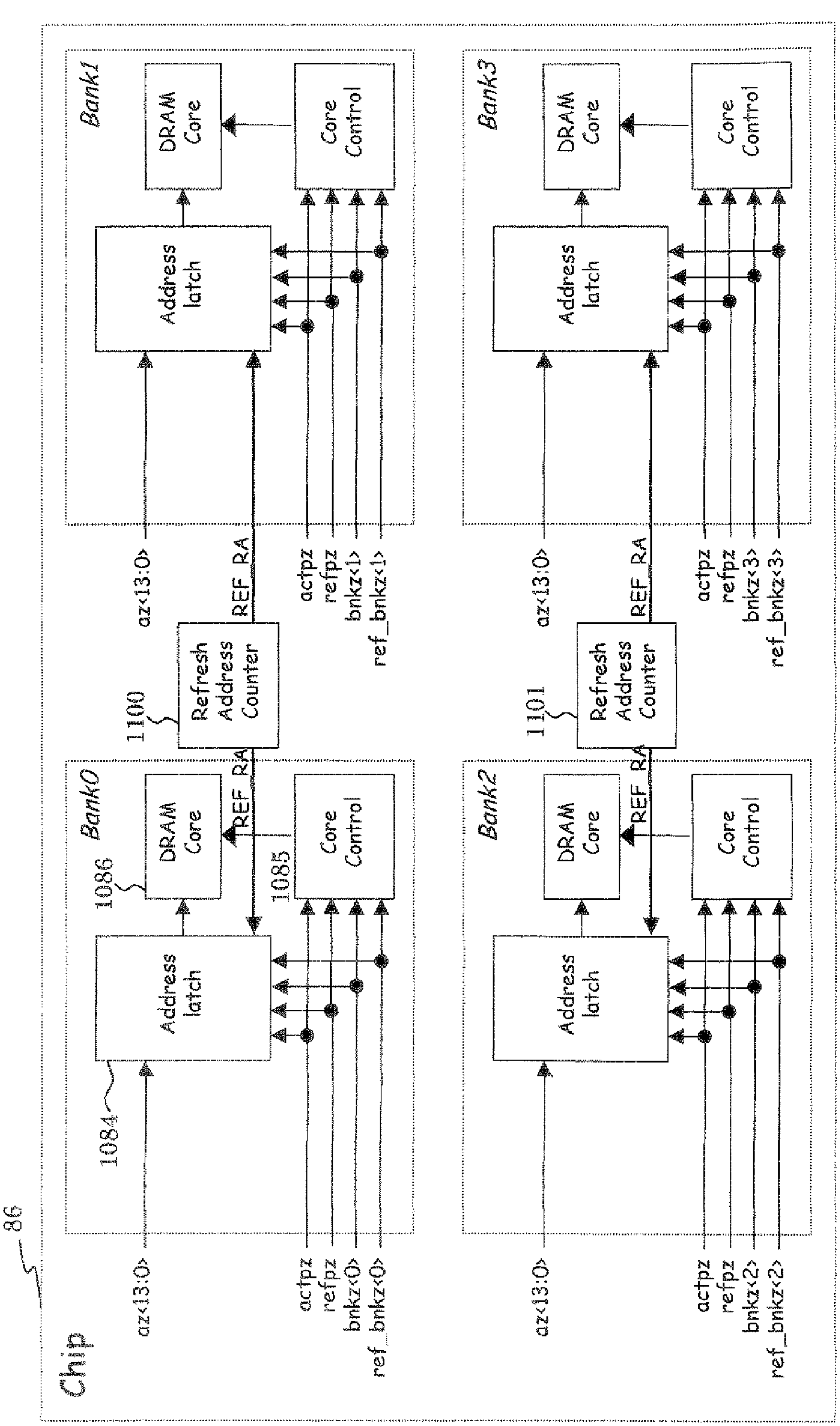
FIG. 110 A configuration diagram of the banks of the memory device having the background refresh function.

FIG. 110 is another configuration diagram of the banks of the memory device having the background refresh function. In this example, each of the Banks 0 through 3 has the core 1086, address latch circuit 1084, and core control circuit 1085. Furthermore, a refresh address counter 1100 is provided in each of two banks, Banks 0 and 1, and the refresh address REF_RA is supplied to both Banks 0 and 1. Moreover, a refresh address counter 1101 is provided in each of two banks, Banks 2 and 3, and the refresh address REF_RA is supplied to both Banks 2 and 3. In this example, the refresh control can be performed independently for every two banks. Specifically, while Banks 0 and 1 perform the normal memory operation, the refresh operation can be performed on Banks 2 and 3 simultaneously, and the reverse is also possible. Of course, the four banks can be subjected to the refresh operation simultaneously.

Figure 111:
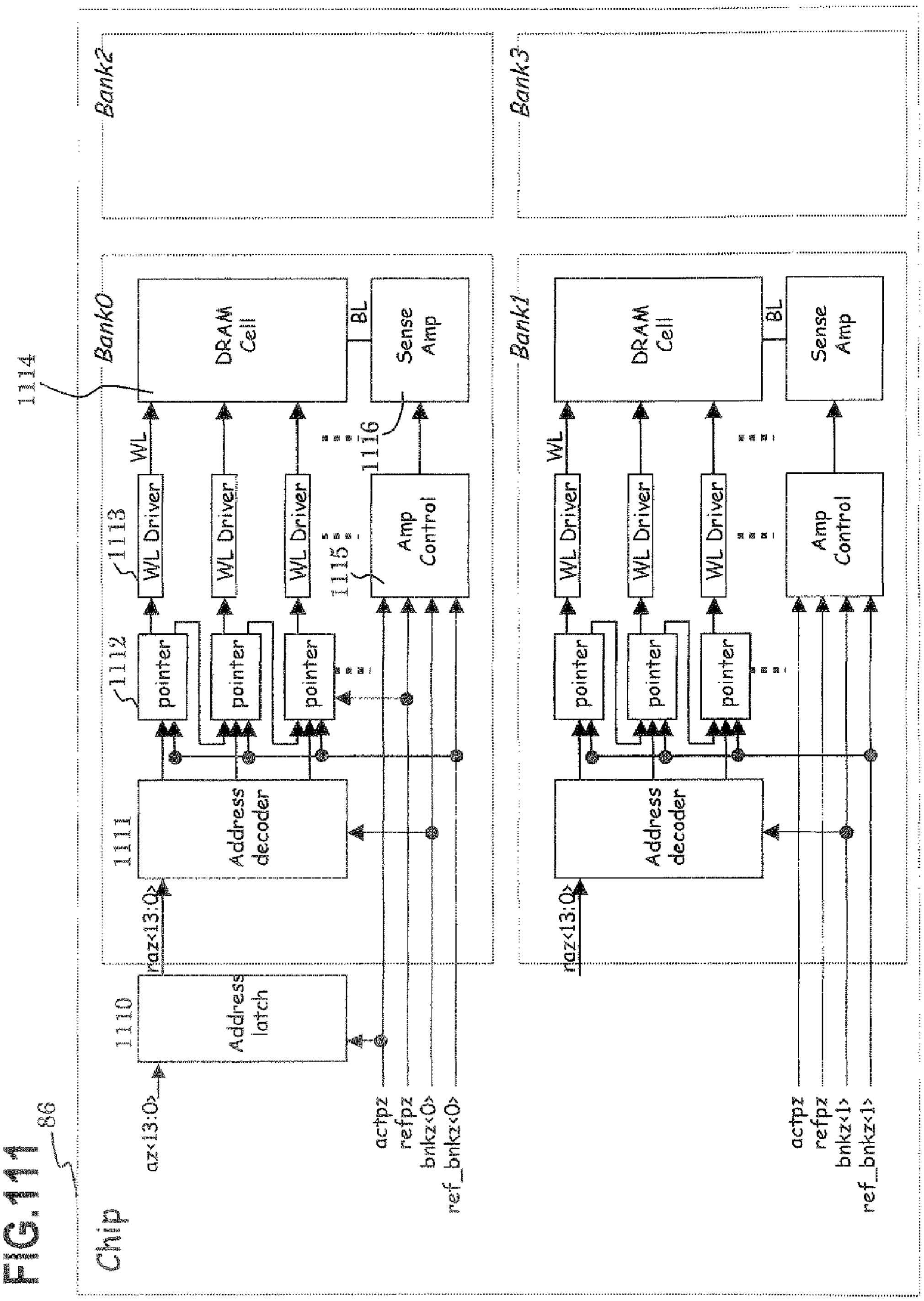
FIG. 111 Another configuration of the banks of the memory device.

FIG. 111 is yet another configuration of the banks of the memory device. In this example, the refresh address counter is not provide within the bank, but pointers 1112 indicating word lines to be refreshed are provided between an address decoder 1111 and word drivers 1113. In the normal memory operation, the address latch circuit 1100 that is provided in each bank is activated in response to the active pulse signal actpz, and latches the external address az<13:0>. The address decoder 1111 within each bank is activated when the bank selection signal bnkz<0:3> is in the selected state, and decodes the address. The word drivers 1113 selected by the decoder drives the word lines, and bring a memory cell are 1114 into the active state. Then, an amplifier control circuit 1115 activates a sense amplifier 1116 at a predetermined timing.

On the other hand, at the time of the background refresh, a pointer 1112 is activated by the refresh pulse signal refpz when the refresh bank selection signal ref_bnkz<0:3> is in the selected state, the word driver 1113 corresponding to the pointer in the selected state drives the word line, and the refresh operation is performed by the memory cell area 1114 and the sense amplifier 1116. Once the refresh operation is ended, the pointer 1112 changes the next pointer to the selected state. In this manner, every time the refresh operation is ended, the group of pointers 1112 moves the selected positions successively so that the word lines within the memory cell area can be driven sequentially.

In the example shown in FIG. 111, the pointers 1112 for refresh are provided in all of the four banks respectively, thus the refresh control can be performed on the four banks independently.

Figure 112:
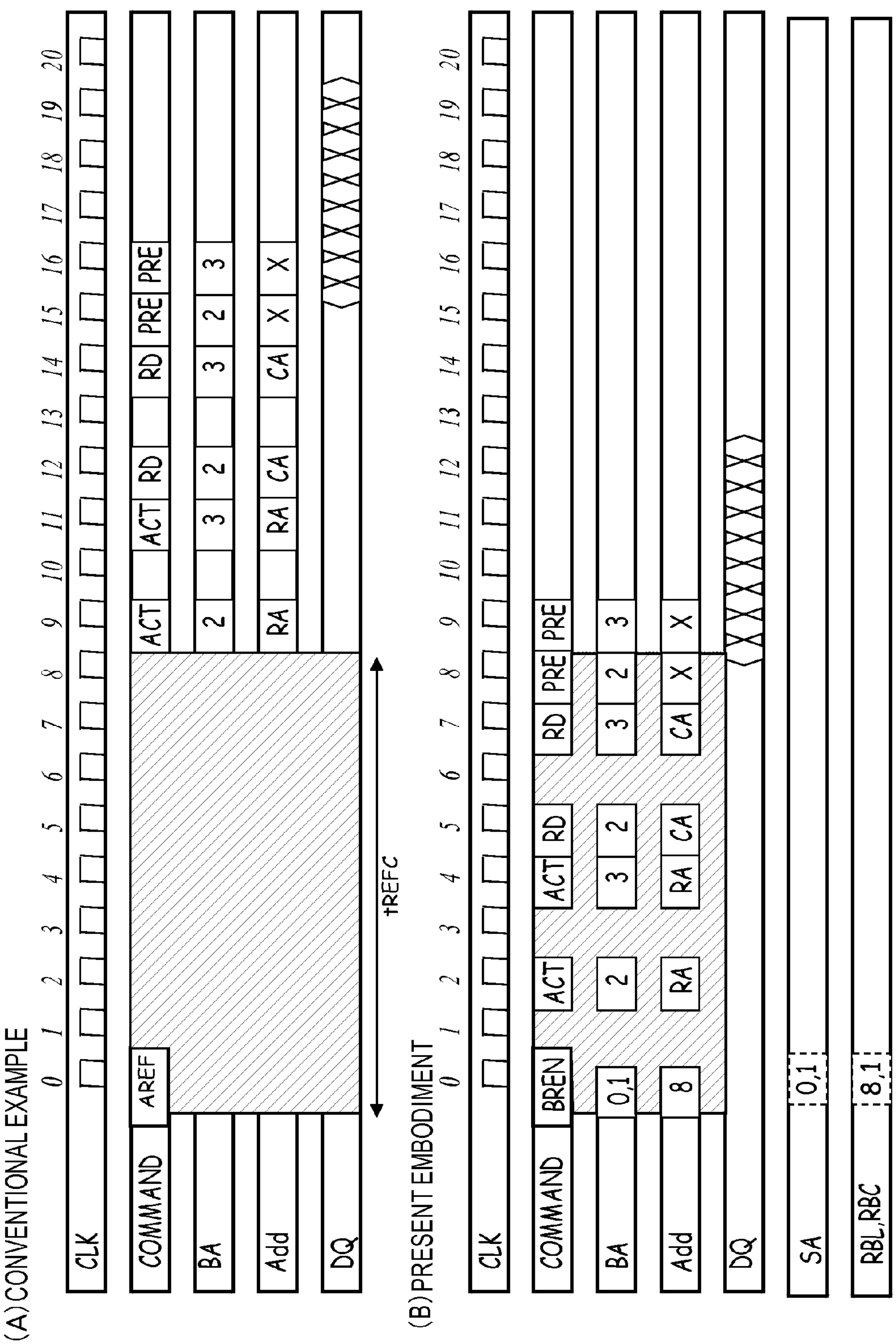
FIG. 112 A figure for explaining the background refresh operation according to the present embodiment.

FIG. 112 is a figure for explaining the background refresh operation according to the present embodiment. FIG. 112(A) is a conventional example, herein the memory device performs the refresh operation on all of the internal banks once an auto-refresh command AREF is received. This figure shows an example in which the number of times the refresh is performed is one. In the refresh cycle tREFC the normal memory operation can not be executed, thus the normal memory operation is performed again upon reception of an active command ACT from a clock number 9.

On the other hand, FIG. 112(B) shows the present embodiment, wherein the memory device starts the refresh operation on the banks BA0 and 1 that are specified by the bank address BA, in response to the background refresh command BREN. In parallel with this, the memory device receives the active command ACT and read command RD corresponding to the banks BA2 and BA3, and performs read operation. After reception of the read command RD, the memory device receives a pre-charge command PRE and causes the banks BA2 and BA3 to perform pre-charge operation.

It should be noted that in the example shown in FIG. 112(B), the refresh bank information "0, 1" and the refresh burst length "8" are inputted from the bank address terminal BA and an address terminal Add respectively, simultaneously with the background refresh command BREN. However, as shown in the figure, the refresh bank information "0, 1" may be inputted from a terminal SA that is specially provided, and the refresh burst length "8" and a refresh block count "1" may be inputted from terminals RBL and RBC respectively.

As shown in FIG. 112, according to the background refresh function of the present embodiment, the refresh operation is performed in parallel with the normal memory operation, thus the normal memory operation is not interrupted by the refresh operation.

[Refresh Bank Decoder, Core Control Circuit, and Address Latch Circuit]

Next, specific examples of the refresh bank decoder, core control circuit and address latch circuit shown in FIGS. 108 through 111 are described. It should be noted that the relationship between bank addresses BA<1:0> and a bank to be selected is shown hereinafter as a premise.

Bank selected by BA<1>=0 and BA<0>=0 is Bank 0
Bank selected by BA<1>=0 and BA<0>=1 is Bank 1
Bank selected by BA<1>=1 and BA<0>=0 is Bank 2
Bank selected by BA<1>=1 and BA<0>=1 is Bank 3

Figure 113:
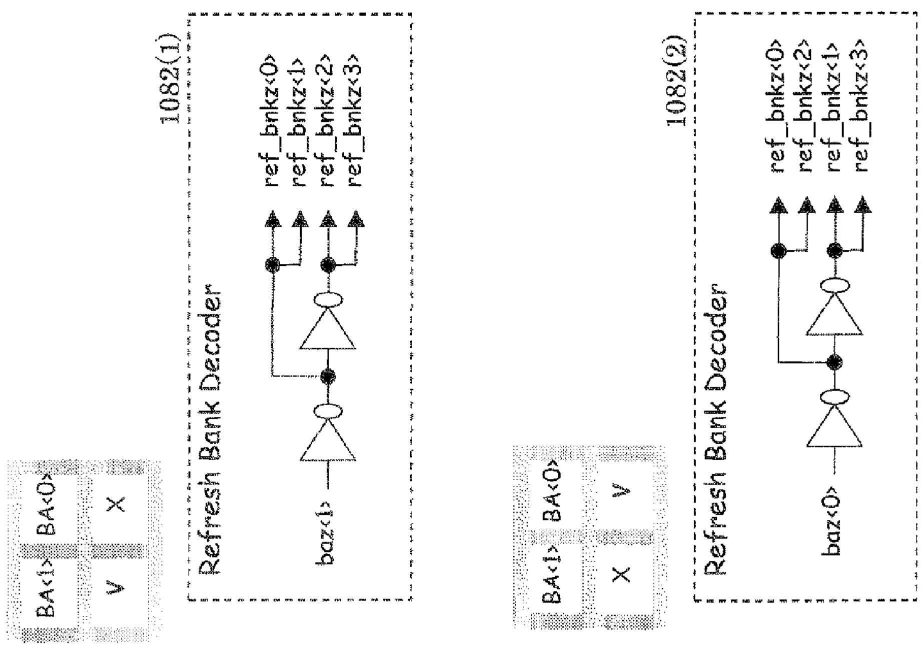
FIG. 113 A figure showing circuits of first and second refresh bank decoders.

FIG. 113 is a figure showing circuits of first and second refresh bank decoders. A first example of a refresh bank decoder 1082(1) shown in FIG. 113(A) is applied when the memory device performs the refresh operation for every two banks, and control is performed so as to select Banks 0, 1 or Banks 2, 3 on the basis of the logic of the bank address terminal BA<1> when a background refresh command BREN is inputted. Therefore, the logic of the bank address terminal BA<1> is valid (V: Valid), while the logic of the bank address terminal BA<0> is invalid (Don't care). Specifically, if the bank address terminal BA<1>=H, the refresh bank selection signal ref_bnkz<2, 3>=H, thus Banks 2, 3 are selected. If the bank address terminal BA<1>=L, the refresh bank selection signal ref_bnkz<0, 1>=H, thus Banks 0, 1 are selected.

A second example of a refresh bank decoder 1082(2) shown in FIG. 113(B) is applied when the memory device performs the refresh operation for every two banks, and control is performed so as to select Banks 0, 2 or Banks 1, 3 on the basis of the logic of the bank address terminal BA<0> when a background refresh command BREN is inputted. Therefore, the logic of the bank address terminal BA<1> is invalid (Don't care). The specific operation is the same as the one of the first example.

In the case in which a combination of banks configuring one line in the horizontal direction is Bank 0, 1 (or Bank 2, 3), it is preferred that the first example be used for the background refresh that is performed at the time of horizontal access. On the other hand, in the case in which a combination of banks configuring one line in the horizontal direction is Bank 0, 2 (or Bank 1, 3), it is preferred that the second example be used as the background refresh. The combination of banks in the horizontal direction depends on the memory mapping of the memory system that uses the memory. Therefore, the memory device needs to have the refresh bank decoder of the first or second example, depending on the memory mapping.

Figure 114:
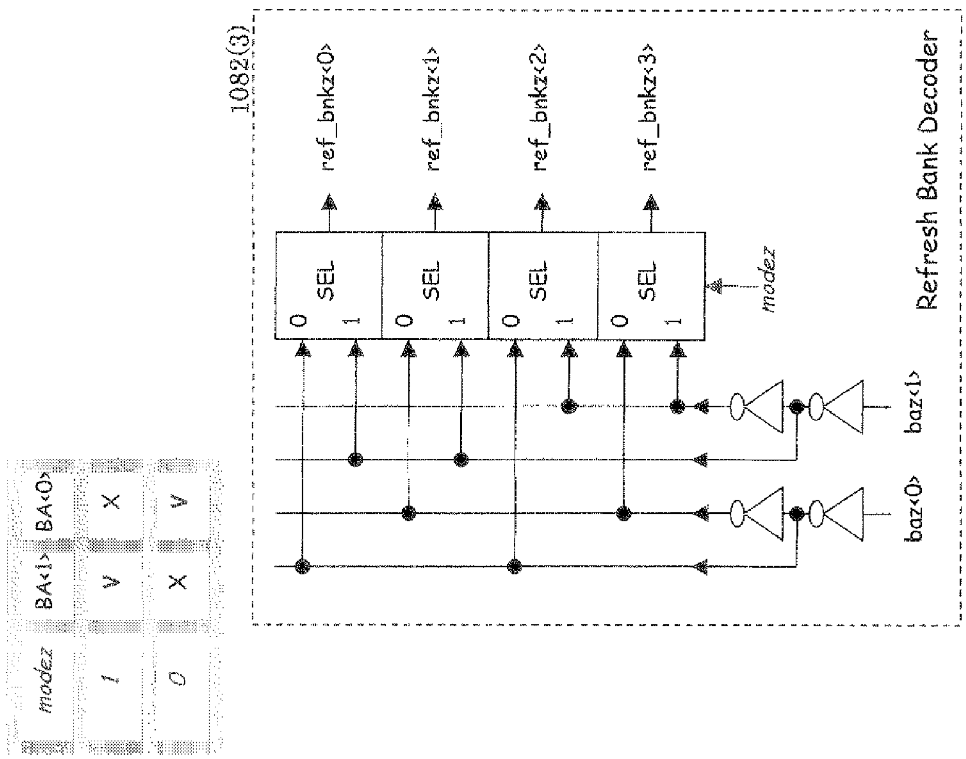
FIG. 114 A figure showing a circuit of a third refresh bank decoder.

FIG. 114 is a figure showing a circuit of a third refresh bank decoder. The example of the third refresh bank decoder 1082(3) is obtained by combining the first and second examples. The third refresh bank decoder 1082(3) has four selectors SEL for selecting either a decode signal on a bank address baz<0> side or a decode signal on baz<1> side in accordance with the set value modez that is set in the mode register. As shown in the logical value table in the figure, if modez=1, the bank address baz<1> becomes valid (V: Valid), whereby the decode signal on baz<1> side is selected in a combination of the refresh bank selection signals ref_bnkz<0, 1> and ref_bnkz<2, 3>. On the other hand, if modez=0, the bank address baz<0> becomes valid (V: Valid), whereby the decode signal on baz<0> side is selected in a combination of the refresh bank selection signals ref_bnkz<0, 2> and ref_bnkz<1, 3>. Therefore, by setting the set value modez in the mode register in advance in accordance with the memory mapping, any types of memory mapping can be responded.

Figure 115:
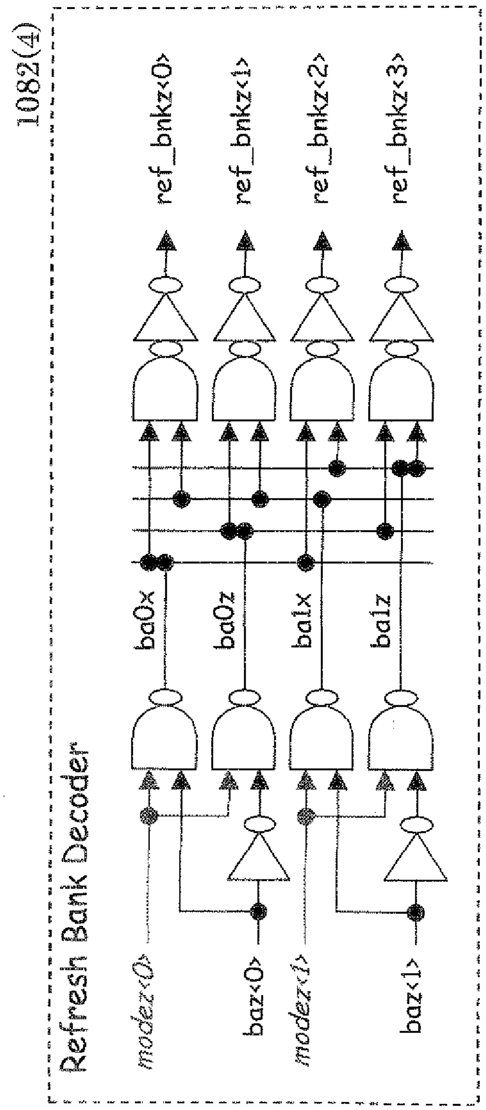
FIG. 115 A figure showing a circuit of a fourth refresh bank decoder.

FIG. 115 is a figure showing a circuit of a fourth refresh bank decoder. In the fourth refresh bank decoder 1082(4), a bank selecting mode is switched by 2-bit set value modez<1:0> that is set in the mode register. The four types of bank selecting modes are as follows, as shown in the table of the figure.

(1) When modez<1:0>=1, 1, one bank that is specified by the bank address terminals BA<1> and BA<0> is selected. Specifically, only one bank is selected from the four banks.
(2) When modez<1:0>=1, 0, a combination of two banks, i.e. Banks 0, 1 or Banks 2, 3 that are selected by the bank address terminal BA<1>, is selected.
(3) When modez<1:0>=0, 1, a combination of two banks, i.e. Banks 0, 2 or Banks 1, 3 that are selected by the bank address terminal BA<0>, is selected.
(4) When modez<1:0>=0, 0, all of the refresh bank selection signals ref_bnkz<0:3> enter the selected stated. Therefore, once the refresh command BREN is inputted, the refresh is executed in the four banks.

In the refresh bank decoder 1082(4), two NAND gates to which the bank address baz<0> is inputted are activated when modez<0>=1, pre-decode signals ba0x, z become 1 or 0, and banks are selected in a combination of the refresh bank selection signals ref_bnkz<0, 2>, <1, 3>. On the other hand, two NAND gates to which the bank address baz<1> is inputted are activated when modez<1>=1, a pre-decode signals ba1*x, z* become 1 or 0, and banks are selected in a combination of the refresh selection signal ref_bnkz<0, 1>, <2, 3>.

In the case of this example, in the system that has the combination of Banks 0, 1 (Banks 2, 3) configuring the one line in the horizontal directions, the mode register set value may be set to modez<1:0>=1, 0. Also, in the system that has the combination of Banks 0, 2 (Banks 1, 3) configuring the one line in the horizontal direction, the mode register set value may be set to modez<1:0>=0, 1. Furthermore, in the system in which the refresh is performed in units of banks, modez<1:0>=1, 1 may be set, and in the system in which the refresh is performed on all banks simultaneously as in the conventional manner, modez<1:0>=0, 0 may be set.

Figure 116:
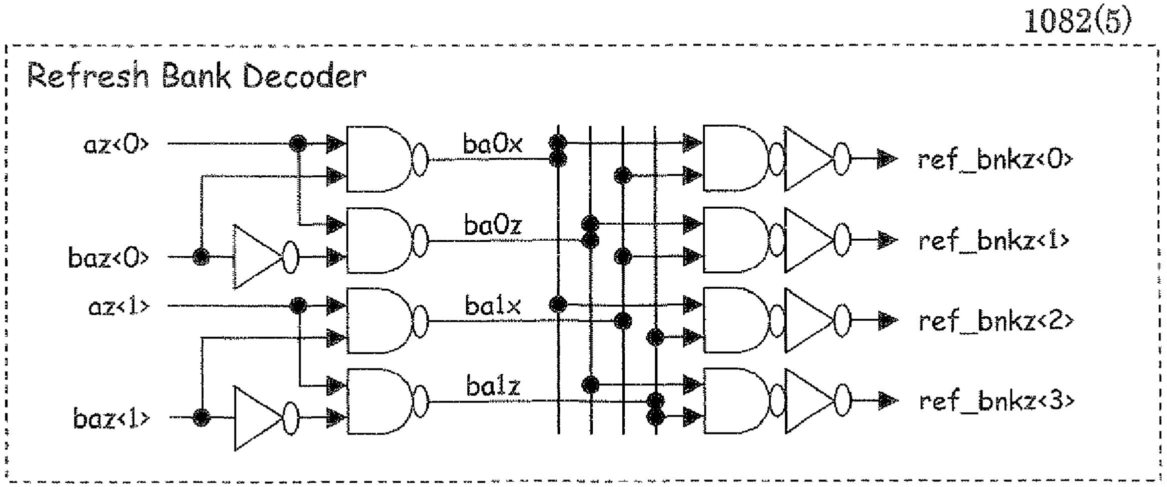
FIG. 116 A figure showing a circuit of a fifth refresh bank decoder.

FIG. 116 is a figure showing a circuit of a fifth refresh bank decoder. The fifth refresh bank decoder 1082(5) can switch the bank selecting mode (1 bank, 2 banks, 2 banks or 4 banks) by means of a 2-bit address terminal A<1:0> that is supplied simultaneously with the command BREN. Specifically, in this example, the set value that is inputted from the 2-bit address terminal A<1:0> is used in place of the mode register set value modez<1:0> of the fourth example shown in FIG. 115. Switching of the bank selecting mode is the same as that of FIG. 115. According to the fifth example, the combination of the refresh bank selections can be changed every time the command BREN is issued. Therefore, even in the case of the rectangular mode, the combination of the refresh target bank selections can be changed to perform the refresh in the background.

Figure 117:
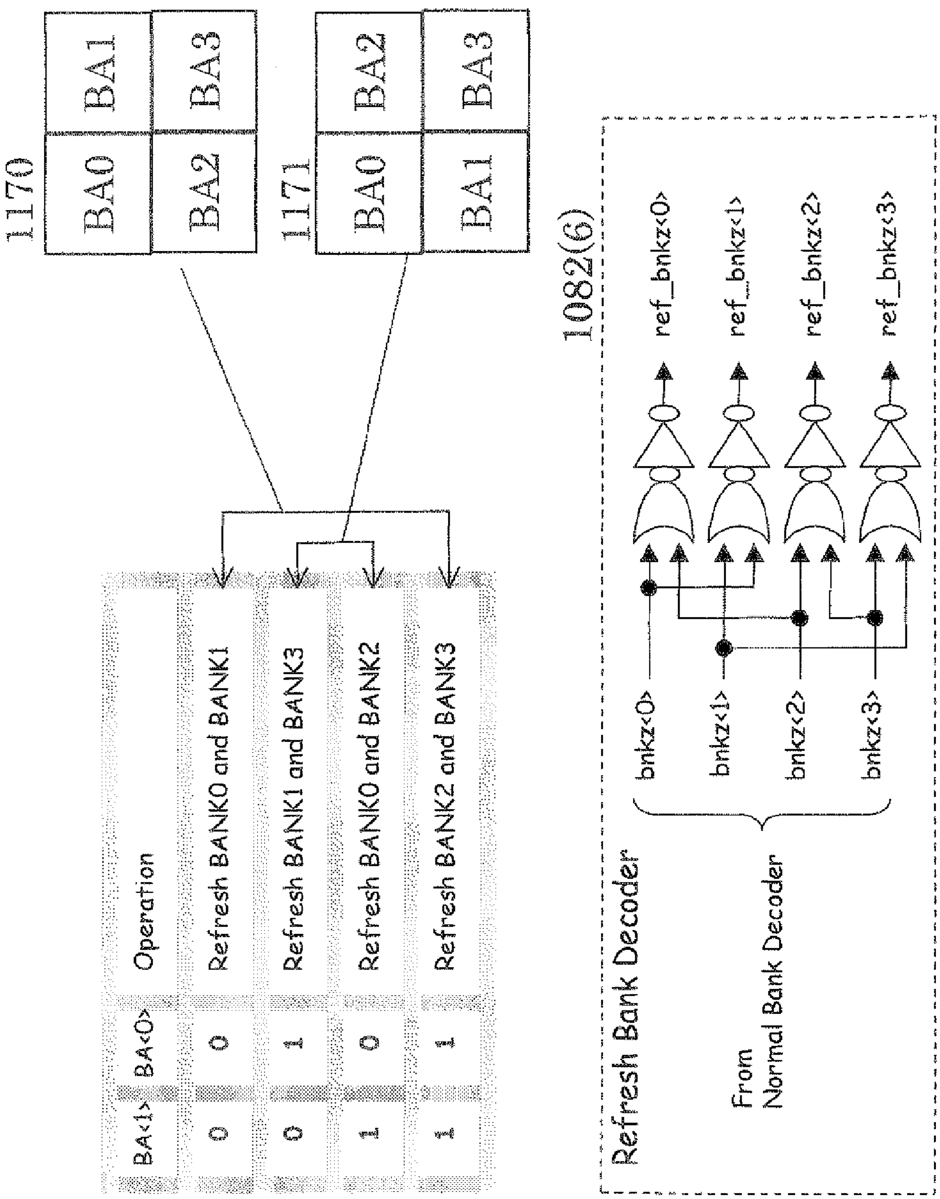
FIG. 117 A figure showing a circuit of a sixth refresh bank decoder.

FIG. 117 is a figure showing a circuit of a sixth refresh bank decoder. The sixth refresh bank decoder 1082(6) can use the bank address terminal BA<1>, BA<0> when the refresh command BREN is inputted, to specify a combination of two banks on which a refresh is performed simultaneously. Switching of a combination of two banks is the same as the third example shown in FIG. 114, but the combination switching of the fifth example can be performed without using the mode register set value, but using only the logics of the bank address terminals BA<1>, BA<0> that are inputted along with the command.

The refresh bank decoder 1082(6) inputs the bank selection signals bnkz<3:0> that are generated from the bank addresses BA<1:0> by the normal bank decoder, and then generate refresh bank selection signals ref_bnkz<0:3>

First of all, as shown in a memory map 1170, in the system in which the combination of the banks configuring one line in the horizontal direction is Banks 0, 1 (or Bank 2, 3), a bank selection signal bnkz<0> is selected if BA<1>=0 and BA<0>=0 (bankz<0>=High, and the rest is Low), and Bank 0 and Bank 1 are selected. If BA<1>=1 and BA<0>=1, a bank selection signal bnkz<3> is selected (bankz<3>=High, the rest is Low), and Bank 2 and Bank 3 are selected.

On the other hand, as shown in a memory map 1171, in the system in which the combination of the banks configuring one line in the horizontal direction is Banks 0, 2 (or Bank 1, 3), a bank selection signal bnkz<1> is selected if BA<1>=0 and BA<0>=1, and Bank 1 and Bank 3 are selected. If BA<1>=1 and BA<0>=0, a bank selection signal bnkz<2> is selected, and Bank 0 and Bank 2 are selected.

Figure 118:
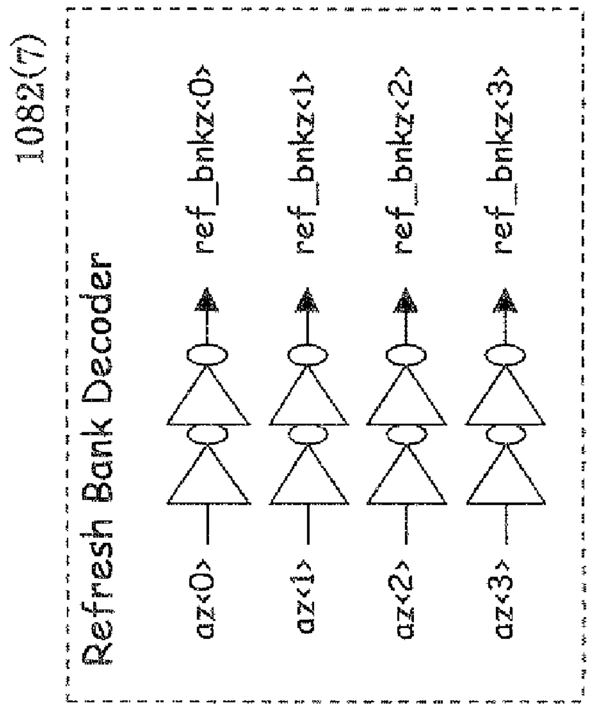
FIG. 118 A figure showing a circuit of a seventh refresh bank decoder.

FIG. 118 is a figure showing a circuit of a seventh refresh bank decoder. The seventh refresh bank decoder 1082(7) selects one refresh target bank in response to a 4-bit address terminal A<3:0> that is inputted along with the command BREN. For example, an address terminal A<0> is associated with Bank 0, an address terminal A<1> is associated with Bank 1, an address terminal A<2> is associated with Bank 2, and an address A<3> terminal is associated with Bank 3. Then, when inputting a background refresh command, (1) Bank 0 and Bank 1 are selected if A<3>=0, A<2>=0, A<1>=1 and A<0>=1,
(2) Bank 2 and Bank 3 are selected if A<3>=1, A<2>=1, A<1>=0 and A<0>=0, (3) Bank 0 and Bank 2 are selected if A<3>=0, A<2>=1, A<1>=0 and A<0>=1, (4) Bank 1 and Bank 3 are selected if A<3>=1, A<2>=0, A<1>=1 and A<0>=0, and (5) Bank 0, Bank 1, Bank 2 and Bank 3 are all selected if A<3>=1, A<2>=1, A<1>=1 and A<0>=1.

(6) If any of A<3:0> is 1, one corresponding bank is selected. In this case, the bank address terminal BA<1:0> or the rest of the address terminals A<13:4> are ignored.

Figure 119:
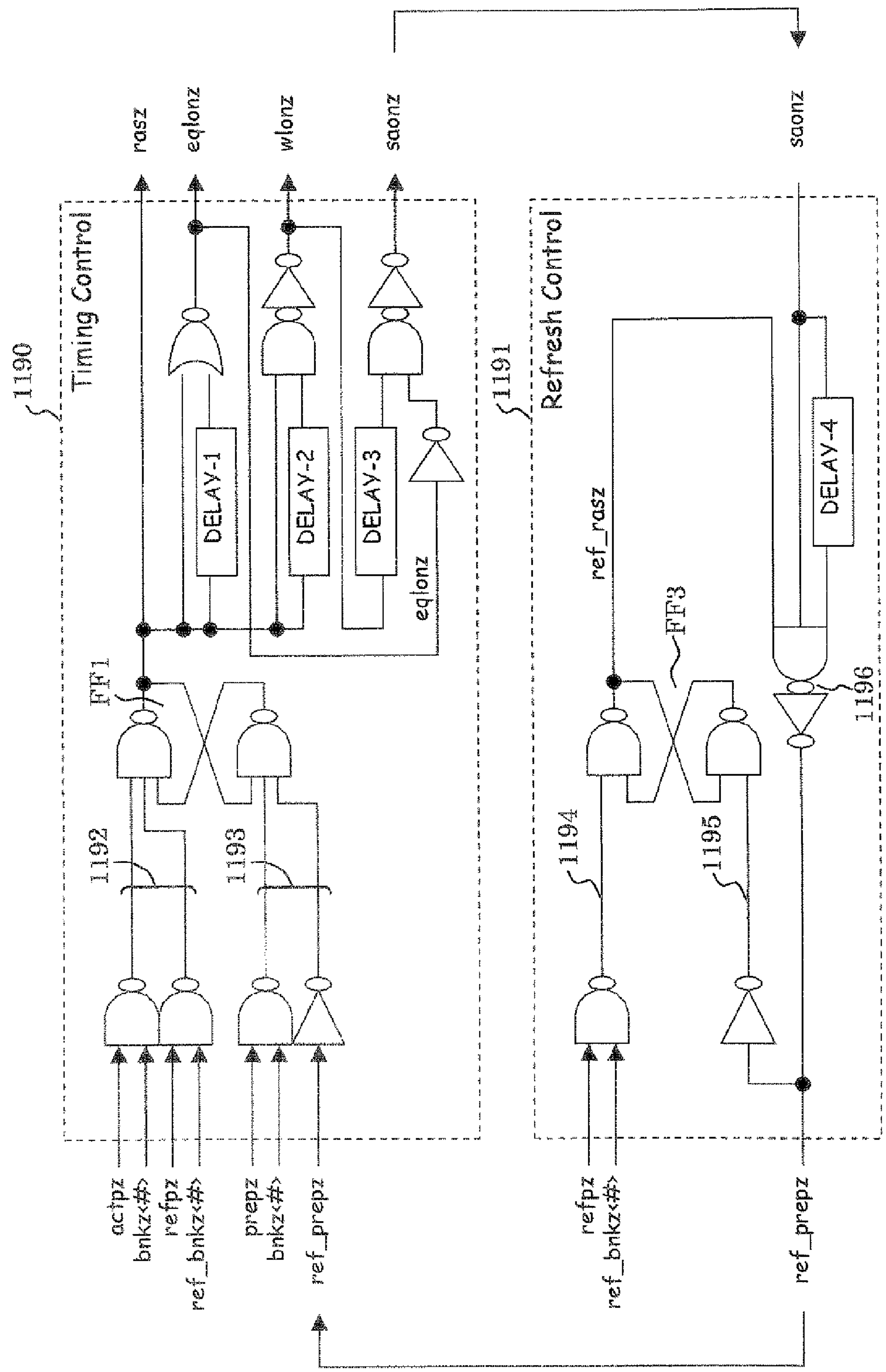
FIG. 119 A configuration diagram of the core control circuit.

FIG. 119 is a configuration diagram of the core control circuit. The core control circuit is provided in each bank as shown in FIG. 108. In the illustrated example, the core control circuit performs a refresh operation only once in response to a refresh command. A control circuit for controlling a refresh operation performed a number of times corresponding to the refresh burst length RBL of the present embodiment will be described hereinafter.

First of all, this core control circuit 1085 has a timing control circuit 1190 that generates various timing signals in response to an active pulse signal actpz, refresh pulse signal refpz, and pre-charge pulse signal prepz, and a refresh control circuit 1191 that controls a refresh in response to the refresh pulse signal refpz. An RS flip-flop FF1 constituted by two NAND gates latches an active state, and an RS flip-flop FF3 latches a refresh state. A set input 1192 and a reset input 1193 are inputted to the RS flip-flop FF1. Furthermore, a set input 1194 and a reset input 1195 are inputted to the RS flip-flop FF3.

In the figure, an active state signal rasz shows an active state at H level, and also shows a pre-charge state at L level. An equalizing signal eqlonz equalizes a pair of bit lines of the memory cell array at the H level, and cancels the equalization at the L level. A word line activation signal wlonz activates a word line at the H level, and deactivates the word line at the L level. A sense amplifier activation signal saonz activates a sense amplifier at the H level, and deactivates the sense amplifier at the L level. The active pulse signal actpz is brought to the H level by the command decoder in response to an active command ACT. The refresh pulse signal refpz is brought to the H level when a refresh command is inputted. The pre-charge pulse signal prepz is brought to the H level when a pre-charge command PRE is inputted. A bank selection signal bnkz<#> is an output signal of the normal bank decoder and specifies a bank that executes an active or pre-charge operation when Bnkz<#> is brought to the H level. A reference numeral "#" is the number of a bank. The refresh bank selection signal ref_bnkz<#> is an output signal of the refresh bank decoder, and is used to specify a bank that executes a refresh operation when ref_bnkz<#> is brought to the H level.

FIG. 120 is a timing chart showing an operation of the core control circuit. A command decoder that is not shown generates a refresh pulse signal refpz in response to an auto-refresh command AREF at a clock number 0, whereby the RS flip-flops FF1 and FF3 of the bank specified by the ref_bnkz are set. As a result, the active state signal rasz is brought to H level, the equalizing signal eqlonz is brought to the L level, and the word line activation signal wlonz is brought to H level after a lapse of a delay time of a delay circuit DELAY-2. In response to this, a word line that is selected by a row address is driven. Next, the sense amplifier activation signal saonz is brought to H level after a lapse of a delay time of a delay circuit DELAY-3, whereby the sense amplifier is activated and rewriting is performed.

On the other hand, in the state in which the RS flip-flop FF3 is set, a refresh active state signal ref_rasz is also brought to H level. The refresh pre-charge pulse ref_prepz is brought to the H level from a rising edge of the sense amplifier activation signal saonz by an AND gate 1196 after a lapse of a delay time of a delay circuit DELAY-4, and the RS flip-flops FF3 and FF1 are reset. By resetting the RS flip-flop FF1, the active state signal rasz is brought to the L level, the word line activation signal wlonz is also brought to the L level, and the word line is brought to the L level. Then, the equalizing signal eqlonz is brought to the H level after a lapse of a delay time of DELAY-1, the pair of bit lines of the memory cell is then equalized, and the pre-charge of the memory cell array is completed. As a result, one cycle of pre-charge operation is ended.

It should be noted that in the normal operation, once the active pulse signal actpz corresponding to the active command ACT received at the clock number 9 is brought to the H level, the RS flip-flop FF1 is set, the equalizing signal eqlonz is brought to the L level, the signals rasz, wlonz and saonz are brought to the H level sequentially, and the memory cell array is activated. Then, once the pre-charge pulse prepz corresponding to the pre-charge command PRE is brought to the H level, the RS flip-flop FF1 is reset, the signals rasz, wlonz and saonz are brought to the L level sequentially, the equalizing signal eqlonz is then brought to the H level, and the memory cell array is pre-charged. This is one cycle of normal operation. At the time of the normal operation, the refresh control circuit 1191 is not operated.

As described above, the refresh operation is constituted by the active operation and the pre-charge operation, while the normal operation is constituted by the active operation, the read or write operation, and the pre-charge operation. It should be noted that the illustration of a read command or a write command is omitted in FIG. 120. In a refresh burst operation described hereinafter, abovementioned one cycle of pre-charge operation is repeated a number of times corresponding to the refresh burst length.

FIG. 121 is a figure showing a configuration and an operation of the address latch circuit. The address latch circuit 1084 is provided in each bank as shown in FIG. 108, and outputs row addresses RA<13:0> to the memory core. Therefore, thirteen address latch circuits 1084 shown in the figure are provided in parallel. If the bank selection signal bnkz<#> is in the H level, a switch 1201 is conducted, and the address latch circuit latches address signals az<13:0> sent from the outside in a latch circuit 1200 in response to an active pulse signal actpz. On the other hand, if the refresh bank selection signal ref_bnkz<#> is in the H level, a switch 1202 is conducted, and the address latch circuit latches refresh addresses REF_RA<13:0> of the refresh address counter 1083 in the latch circuit 1200 in response to a refresh pulse signal refpz.

Further, as shown in the timing chart of FIG. 121, a refresh row address strobe pulse signal Ref_ra_strbpz is generated in response to the refresh pulse signal refpz, in response to which the refresh address counter 1083 increments the addresses. The incremented refresh addresses REF_RA<13:0> are latched in the latch circuit 1200 in response to the subsequent refresh pulse signal refpz.

[Refresh Burst Control]

Next, characteristic refresh burst control of the background refresh operation of the present embodiment is described. In the refresh burst control, the memory device repeatedly performs a refresh operation a number of times corresponding to the refresh burst length in response to a single background refresh command. Accordingly, as shown in FIG. 106, the number of issuances of the command can be reduced, and the access efficiency can be enhanced.

FIG. 122 is a timing chart showing a refresh burst operation. In this example, in an upper right memory map 12 shown in the figure, the second row is accessed horizontally while performing a refresh operation on the first row. Refresh bank information SA=0, 1 and refresh burst length RBL=4 are supplied from the memory controller to the memory device along with a background refresh command BREN at the clock number 0. Moreover, although the refresh block count RBC is also supplied, but this is omitted in this example. As shown in FIG. 105, the refresh bank information SA and the refresh burst length RBL are set in the mode register by means of the mode register set command, or supplied along with a refresh command BREN. External terminals to which these items are supplied are, for example, a bank address terminal, address terminal, special terminal, and the like. A specific example is described hereinafter.

Once the background refresh command BREN is received at the clock number 0, the memory device repeatedly executes refresh operation four times on Banks 0, 1. Furthermore, the memory controller issues an active command ACT to Banks 2, 3 at clock numbers 2, 4, issues a read command RD at clock numbers 5, 7, and further issues a pre-charge command PRE at clock numbers 8, 9. Similarly, an active command ACT is issued to Banks 2, 3 at clock numbers 11, 13, and a read command RD and a pre-charge command PRE are also issued. In response to this, the memory device executes an active operation on Banks 2, 3. The active operation performed on Banks 2, 3 is executed in parallel with the refresh operation performed on Banks 0, 1.

By specifying the refresh burst length RBL, the four refresh operations are completed at a clock number 16, and an active command ACT can be issued to Banks 0, 1 immediately after a clock 19.

FIG. 123 is a configuration diagram of the core control circuit that controls the refresh burst operation. By referring to FIG. 119 and FIG. 120, this core control circuit becomes clearer. The core control circuit 1085 has, in addition to the timing control circuit 1190 and refresh control circuit 1191 shown in FIG. 119, a refresh burst length register 1231 in which the refresh burst length RBL is set, a refresh burst length counter 1230 for counting the number of refresh operations, and a refresh burst end detection circuit 1232 that detects the end of a refresh burst operation by comparing the outputs of the refresh burst length register 1231 and the refresh burst length counter 1230. The core control circuit 1085 shown in FIG. 123 is an example in which the refresh burst length RBL (four bits: 1 through 16 times) is inputted along with a background refresh command BREN into address terminals A<7:4> (corresponding to FIG. 105(A)).

As shown in a table 1231T in the figure, refresh burst lengths RBL=1 through 16 corresponding to 4-bit information inputted from address terminals az<7:4> are set in the refresh burst length register 1231, the refresh burst lengths being shown in the table 1231T. This setting is performed when the refresh pulse signal refpz and refresh bank selection signal ref_bnkz<#> that are generated in response to the background refresh command BREN are equal to H.

The refresh burst length counter 1230 is set when refresh pulse signal refpz=H and refresh bank selection signal ref_bnkz<#>=H. Every time one cycle of refresh operation is ended, the refresh control circuit 1191 outputs an internal refresh pulse signal int_refpz (=H) for directing the next refresh operation, in response to which the refresh burst length counter 1230 increments a count value. Then, when the count value of the counter 1230 matches the burst lengths RBL that are set in the refresh burst length register 1231, the refresh burst end detection circuit 1232 outputs a refresh burst end signal rb_endz (=H). In response to this, the refresh control circuit 1191 resets the RS flip-flop circuit that latches a refresh state, and stops outputting the subsequent internal refresh pulse signal int_refpz and refresh pre-charge pulse signal ref_prepz.

FIG. 124 is another configuration diagram of the core control circuit that controls the refresh burst operation. This core control circuit 1085 is an example in which the refresh burst length RBL that are inputted to the address terminals az<7:4> along with a mode register set command EMRS are set in the mode register 96 (corresponding to FIG. 105(B)). In response to a mode register set pulse mrspz, 4-bit data that is inputted to the address terminals az<7:4> is set as the refresh burst length <the table 1231T shown in FIG. 123), and information on a refresh target bank to be inputted to the bank address terminals baz<1:0> is also set. Furthermore, the refresh block count RBC may also be set.

The refresh burst end detection circuit 1232 inputs, from the mode register 96, signals modez<7:4> indicating the refresh burst length, and compares these signals with the count value of the refresh burst length counter 1230. The other configurations are the same as those shown in FIG. 123.

FIG. 125 shows a detailed circuit diagram of the timing control circuit 1190 and of the refresh control circuit 1191 within the core control circuit. The configurations shown by the arrows 1250 through 1254 in the figure are added to the configuration shown in FIG. 119. Specifically, an RS flip-flop FF2 that latches a refresh state is set in response to a refresh pulse signal refpz generated by a refresh command BREN, so that a refresh state signal ref_statez shown by the arrow 1250 is set to the H level. This refresh state signal ref_statez is held in the H during the refresh burst operation.

In order to control the repetition of the refresh operation, the refresh control circuit 1191 brings the internal refresh pulse signal int_refpz (arrows 1251, 1252) to the H level (pulse width of DELAY-0) after a lapse of a delay time of DELAY-5 once the equalizing signal eqlonz is brought to the H level at the end of the refresh cycle. This internal refresh pulse signal int_refpz sets the RS flip-flop FF1 (arrow 1253), and directs the start of the next refresh cycle. This internal refresh pulse signal int_refpz increments the refresh counter as described above.

Then, in order to stop the refresh operation, in the refresh control circuit 1191, when the refresh burst end signal rb_endz (arrow 1254) is brought to the H level when the refresh cycle corresponding to the burst length is ended, and when the refresh pre-charge pulse signal ref_prepz is brought to the H level when the refresh operation cycle is ended, the RS flip-flop FF2 is reset by the reset input 1195, and the refresh state signal ref_statez is reset to L. As a result, the output of an AND gate 1197 is fixed to the L level, and the internal refresh pulse signal int_refpz that directs the start of the next refresh cycle is no longer outputted.

FIG. 126 shows another detailed circuit diagram of the timing control circuit 1190 and of the refresh control circuit 1191 within the core control circuit. The refresh control circuit 1191 of this core control circuit is provided with, in place of the AND gate 1197 or delay circuit DELAY-5 shown in FIG. 125, an oscillator 1260 that is activated by the H level of the refresh state signal ref_statez. The oscillator 1260 is oscillated at a frequency that is substantially same as that of a refresh cycle, and constantly outputs the internal refresh pulse signal int_refpz for instructing the start of the next refresh cycle. When the refresh burst end signal rb_endz is brought to the H level and the refresh pre-charge pulse signal ref_prepz is brought to the H level at the end of one cycle of refresh operation, the RS flip-flop FF2 is reset, the refresh state signal ref_statez is reset to L, and the oscillator 1260 is stopped. The other configurations are the same as those shown in FIG. 124.

The detailed operations of the core control circuit shown in FIGS. 125 and 126 are described with reference to FIG. 129 after explaining FIGS. 127 and 128.

FIG. 127 is a configuration diagram showing the refresh burst length counter 1230, refresh burst length register 1231, and refresh burst end detection circuit 1232. This figure is a specific example of FIG. 123 and also a specific example without the register shown in FIG. 124. The counter within the refresh burst length counter 1230 is reset to "0" in response to a refresh pulse signal refpz, and is incremented in response to an internal refresh pulse signal int_refpz for directing the start of a refresh cycle. Counter values rblcz<3:0> are outputted to the refresh burst end detection circuit 1232.

The refresh burst length register latches the signals of the address terminals az<7:4> in response to the refresh pulse signal refpz, and outputs the latched rblrz<3:0> indicating the refresh burst length to the refresh burst end detection circuit 1232.

The refresh burst end detection circuit 1232 compares the counter values rblcz<3:0> with the refresh burst lengths rblrz<3:0>, and, when both match, outputs a refresh burst end signal rb_endz. The subsequent refresh operation is stopped by this refresh burst end signal rb_endz.

FIG. 128 is a configuration diagram of the address latch circuit. In addition to the configuration shown in FIG. 121, there is a configuration in which the address latch circuit 1084 latches the refresh addresses REF_RA<13:0>, which are the outputs of the refresh address counter 1083, into the latch circuit 1200 via the switch 1202 in response to the internal refresh pulse signal int_refpz shown by the arrow 1280. Specifically, in the refresh burst operation, in order to repeat the refresh cycle, the internal refresh pulse signal int_refpz (=H) is repeatedly outputted. Therefore, in response to this, the address latch circuit 1084 needs to latch a new refresh address from the refresh address counter 1083, and increment the same counter.

FIG. 129 is a timing chart of the refresh burst operation. The refresh burst operation that is performed by the core control circuit shown in FIGS. 125 through 128 is explained with reference to FIG. 129 and FIG. 120. First, the refresh burst operation is started in response to a background refresh command BREN. In this example as well, the refresh target banks, Banks 0, 1, and the refresh burst length RBL=4 are specified.

A refresh pulse signal refpz is outputted by the refresh command BREN, in response to which the values of the address terminals A<7> through A<4> are incorporated into the refresh burst length registers 1231 of the refresh target banks, Banks 0 and 1. The rblrz<3:0>=0011b in the figure is an example in which the burst length RBL=4. At the same time, the counter values of the refresh burst length counters 1230 of the Banks 0 and 1 are reset to rblcz<3:0>=0000b. Moreover, the refresh state signal ref_statez is set to the H level by the RS flip-flop FF2 within the refresh controller circuit 1191.

At this moment, the RS flip-flop FF1 within the timing control circuit 1190 is also set, the active state signal rasz=High is set, and the refresh cycle operation is started. At the same time, the timing control circuit 1190 sets the equalizing signal eqlonz to Low, the word line activation signal wlonz to High, and the sense amplifier activation signal saonz to the H level as with FIG. 120 (not shown). Accordingly, Banks 0 and 1 enter the active state, and the data of the cells are rewritten.

After a lapse of the delay time DELAY-4 since the sense amplifier activation signal saonz has been inputted, the refresh pre-charge signal ref_prepz is outputted by the AND gate 1196, the RS flip-flop FF1 is reset, the active state signal rasz is set to Low, the equalizing signal eqlonz is set to High, and the pre-charge operation is started. At this moment, the value of the refresh burst length register 1231 is different from the value of the refresh burst length counter 1230 (rblrz<3:0>≠rblcz<3:0>), thus the refresh end signal rb_endz remains Low.

The refresh control circuit 1191 outputs the internal refresh pulse signal int_refpz via the AND gate 1197 after lapse of the delay time DELAY-5 since the equalizing signal eqlonz=High has been set, sets the RS flip-flop FF1, and starts the subsequent refresh operation. At this moment, the value of the refresh burst length counter is counted up to become 0001b. Moreover, the address latch circuit 1084 (FIG. 128) latches the count value of the refresh address counter 1083. Thereafter, the similar refresh operation is repeated.

Once the third internal refresh pulse signal int_refpz is outputted, and the fourth refresh operation is started, the value of the refresh burst length counter is counted up to become rblcz<3:0>=0011b. At this moment, the value of the refresh burst length register rblrz<3:0> and the value of the refresh burst length counter rblcz<3:0> are equal to each other (rblrz<3:0>=rblcz<3:0>=0011b), and the refresh burst end detection circuit 1232 sets the refresh burst end signal rb_endz=High. Once the fourth refresh operation is ended, the pre-charge signal ref_prepz is outputted and the active state signal rasz becomes Low. However, the refresh end signal rb_endz=High, thus the RS flip-flop FF2 is reset by the reset input 1195, as a result of which the refresh state signal ref_statez transits to a Low state. When the equalizing signal eqlonz is set to High as the pre-charge operation is performed, the internal refresh signal int_refpz for starting the subsequent refresh operation is not outputted according to ref_statez=Low, thus the four refresh burst operations are ended.

In the example shown in FIG. 126 as well, the internal refresh signal int_refpz is outputted by the oscillator 1260. However, when the fourth refresh operation is started and the refresh state signal ref_statez is reset to L, the oscillator 1260 is stopped, and thereafter the internal refresh signal int_refpz is not outputted. As a result, the refresh operation is stopped at the fourth time.

[Refresh Burst Stop Control]

The refresh burst function inputs the background refresh command once and repeats the fresh cycles by the specified burst length, thus the number of inputs of the command can be reduced and the access efficiency can be enhanced. However, if the burst length is longer, and access is not allowed to the bank until the background refresh operation that has been started once is ended, the flexibility of the memory control is lost. For this reason, the memory device of the present embodiment has a refresh burst stop function.

FIG. 130 is a figure showing an overview of refresh burst stop operation. The memory device inputs a background refresh command BREN at the clock number 0, and starts the refresh operation on the banks BNK 0, 1 four times=burst length RBL. However, once the memory device inputs a stop command STOP during the third refresh cycle, the subsequent refresh cycle is not started after the refresh cycle in progress is ended. Since the refresh cycle in progress cannot be stopped, the stop operation that is performed by means of the stop command STOP means that a new refresh cycle is not started.

The stop command STOP is specified by, for example, a refresh command (e.g., /CS=L, /RAS=L, /CAS=L, /WE=H) and a signal of an address terminal that is obtained at the time of command input. Specifically, the stop command has the same command signal as the refresh command and is distinguished by the address terminal signal. Alternatively, a pre-charge command (e.g., /CS=L, /RAS=L, /CAS=H, /WE=L) is used as the stop command STOP.

FIG. 131 is a configuration diagram of the core control circuit having the refresh burst stop function. The refresh control circuit 1191 of the core control circuit shown in FIGS. 123 and 124 is constituted by a refresh state control circuit 1191B and the refresh state control circuit 1191. The command decoder 1080 outputs the refresh pulse signal refpz in response to the background refresh command, and a refresh stop pulse signal ref_stoppz in response to the stop command.

The refresh state control circuit 1191B sets the refresh state signal ref_statez to the H level in response to the refresh pulse signal refpz, and resets the refresh state signal ref_statez to the L level in response to the refresh stop pulse signal ref_stoppz. By means of this refresh state signal ref_statez, the start and stop of refresh performed by the refresh control circuit 1191 are controlled. Also, the refresh control circuit 1191 ends the refresh operation as described above when a refresh cycle is ended by the refresh burst end signal rb_endz indicating the end of the refresh cycle, the number of the refresh cycles corresponding to the burst length.

FIG. 132 shows a circuit diagram of the refresh state control circuit. FIG. 132(A) shows an example in which the stop command is provided by the background refresh command BREN and the address terminal signal. FIG. 132(B) shows an example in which the pre-charge command is provided as the stop command. The RS flip-flop FF2 that is incorporated therein corresponds to the RS flip-flop FF2 shown in FIGS. 125 and 126, and controls the refresh state signal ref_statez indicating either the refresh state or refresh stop state.

In either one of the refresh state control circuits 1191B, the RS flip-flop FF2 is set by the refresh pulse signal refpz=H to obtain the refresh state signal ref_statez=H, and is reset by a NAND gate 1321 to obtain the refresh state signal ref_statez=L in response to a refresh burst end signal rb_ends<#> H and the refresh pre-charge pulse signal ref_prepz=H. The above is the normal refresh burst operation.

Then, in FIG. 132(A), the RS flip-flop FF2 is reset via an invertor 1322 in response to the refresh stop pulse signal ref_stoppz generated by the stop command, and the refresh state signal ref_statez=L is set. In this case, only the RS flip-flop FF2 within the refresh target bank is in a set state (refresh state, ref_statez=H), thus only the RS flip-flop FF2 within the refresh target bank is reset in response to the common refresh stop pulse signal ref_stoppz=H within the memory device.

On the other hand, in FIG. 132(B), the RS flip-flop FF2 is reset only in a bank selected by the refresh bank selection signal ref_bnkz<#>, in response to the pre-charge pulse signal prepz=H generated in response to the pre-charge command. In the normal operation cycle, the refresh bank selection signal ref_bnkz<#>=L is set, thus the RS flip-flop FF2 is not reset by the pre-charge command.

FIG. 133 shows a circuit diagram of the timing control circuit 1190 and of the refresh control circuit 1191 of the core control circuit. Difference with the circuit diagram of FIG. 125 is that, in addition to the RS flip-flop FF2 of the refresh state control circuit 1191 shown in FIG. 132, the RS flip-flop FF3 for managing the active state and pre-charge state in a refresh operation is also provided, and this RS flip-flop FF3 generates the refresh active state signal ref_rasz. Then, an AND gate 1332 outputs the refresh pre-charge pulse signal ref_prepz for directing pre-charge during a refresh cycle, on the basis of the refresh active state signal ref_rasz=H, regardless of the state of the refresh state signal ref_statez. The operation of this refresh active state signal ref_rasz is the same as the operation of the active state signal rasz during the refresh.

Moreover, the difference with FIG. 125 is that an arbitrating circuit 1334 monitors the timing that comes after a lapse of the delay time DELAY-5 since the equalizing signal eqlonz=H for directing the start of pre-charge has been inputted, and the timing of the refresh state signal ref_statez=L by means of the stop command or pre-charge command. When the refresh state signal ref_statez=H, the arbitrating circuit 1334 outputs an internal refresh pulse signal int_refp=H for directing the start of a new refresh cycle, and, when the refresh state signal ref_statez=L, does not output the internal refresh pulse signal int_refpz=H for directing the start of a new refresh cycle.

FIG. 134 shows another circuit diagram of the timing control circuit 1190 and of the refresh control circuit 1191 of the core control circuit. In this example, in place of the AND gate 1333 shown in FIG. 133, the oscillator 1260 is provided, and this example corresponds to the example shown in FIG. 126. As with FIG. 126, the oscillator 1260 enters an enabled state when the refresh state signal ref_statez=H, and outputs an internal refresh pulse signal int_refpz=H for directing the start of the subsequent refresh cycle. The oscillator enters a disabled state when the refresh state signal ref_statez=L. Then, the arbitrating circuit 1334 monitors the output of the oscillator and the timing of the refresh state signal ref_statez, causes the oscillator output to pass while the refresh state signal ref_statez is H, and prohibits the passage of the oscillator output when the refresh state signal ref_statez is L.

FIG. 135 is a timing chart showing an operation of FIG. 133. The operations of the timing control circuit 1190 and the refresh control circuit 1191 shown in FIG. 133 and FIG. 134 are as follows. The RS flip-flops FF1 and FF3 are set in response to the refresh pulse signal refpz=H by means of the background refresh command BREN, and the active state signal rasz and the refresh active state signal ref_rasz are brought to the H level. In response to this, the word lines and sense amplifiers are drive, and the active operation is performed.

When the active operation is ended, the refresh pre-charge pulse signal ref_prepz=H is outputted after the del-ay time DELAY-4 in response to the sense-amplifier activation signal saonz=H, the RS flip-flops FF1 and FF3 are reset, and the active state signal rasz and the refresh active state signal ref_rasz are brought to the L level. Accordingly, the pre-charge operation is started. After a lapse of the delay time DELAY-5 since the equalizing signal eqlonz for starting the pre-charge operation has been inputted, the internal refresh pulse signal int_refpz=H for directing the start of the subsequent refresh cycle is outputted, whereby the subsequent refresh cycle is started.

Then, the stop command STOP is inputted during the active operation of the third refresh cycle. In response to this, the refresh stop pulse signal Ref_stoppz=H is outputted from the command decoder, and the refresh state control circuit 1191B outputs the refresh state signal ref_statez=L. At the timing that indicates the end of the active operation in the third refresh cycle, i.e., the timing that comes after a lapse of the delay time DELAY-4 since the sense amplifier activation signal saonz=H has been inputted, the AND gate 1332 outputs the refresh pre-charge pulse signal ref_prepz=H for directing the start of pre-charge, on the basis of the refresh active state signal ref_rasz=H. Accordingly, the pre-charge operation in the third refresh cycle is executed reliably.

In response to the refresh pre-charge pulse signal ref_prepz=H, the RS flip-flops FF1 and FF3 are reset, and the equalizing signal eqlonz=H is set, whereby the pre-charge operation is started. Then, at the timing that comes after a lapse of the delay time DELAY-5, the arbitrating circuit 1334 does not output the internal refresh pulse signal int_refpz=H for directing the start of the subsequent refresh cycle, on the basis of the refresh state signal ref_statez=L.

In this manner, according to the core control circuit described above, once the stop command STOP to be inputted at arbitrary timing is generated using the refresh state signal ref_statez and the refresh active state signal ref_rasz, the pre-charge operation of the refresh cycle in progress is ended reliably, and a new re-fresh cycle is prohibited from starting after the stop command STOP is inputted.

FIG. 136 shows a circuit diagram of the command decoder that realizes the refresh stop function. A node 1361 of the command decoder 1080 is brought to the H level when /CS=L, /RAS=L, /CAS=L, and /WE=H. Then, an address terminal A<8> 1360 is brought to the L level, and the refresh pulse signal refpz is set to H by an AND gate 1363 when az<8>=L, whereby the refresh operation is started. On the other hand, when the address terminal A<8> 1360 is in the H level and az<8>=H, the refresh stop pulse signal ref_stoppz is set to H by an AND gate 1362, whereby the refresh operation is stopped.

[Countdown Refresh Burst Control]

Next, an embodiment in which the refresh burst control is performed using a down counter is described. In the example described above, the refresh burst counter is counted up for every refresh cycle, but in the following embodiment each refresh burst counter is counted down for every refresh cycle, and when all count values of the refresh burst counters become 0 the refresh burst operation is ended. Therefore, all of the refresh burst counters are reset to zero in response to the stop command inputted during the background refresh operation, whereby stop control can be performed.

By using this down counter, a new background refresh command can be inputted before the refresh burst operation is ended, so that control for overwriting the refresh burst counter onto burst length that is specified by a new command, and control for adding the burst length specified by a new command to the current refresh burst counter can be performed.

Furthermore, the following embodiment describes that, although the refresh address counter is incremented or decremented in every refresh cycle, control is performed for returning the refresh address counter from the existing count value to the initial value by means of a refresh-all command for integrally refreshing all of the remaining refresh addresses.

FIG. 137 is a configuration diagram of the core control circuit 1085 that performs countdown refresh burst control. In this example, the start and stop of a refresh are controlled by means of the background refresh command BREN and address terminal A<5>.

As with the circuit diagram of FIG. 131, the core control circuit 1085 has the timing control circuit 1190 that generates control signals for an active operation and pre-charge operation performed on the core, and the refresh control circuit 1191 that performs refresh control in a background refresh operation. Further, the core control circuit has the refresh burst length register 1231 that sets the refresh burst length RBL that is inputted from the address terminals A<:0> in response to the refresh pulse signal refpz, and the refresh burst length counter 1230 that inputs the refresh burst length RBL in response to the refresh pulse signal refpz, is counted down by a down signal downz, and sets all count vales to 0 in response to the address terminal A<5> corresponding to the stop command.

A refresh burst operation is started by means of the refresh pulse signal refpz corresponding to a background refresh command, the down signal downz is outputted for every refresh cycle, whereby the refresh burst length counter 1230 is down counted, and the internal refresh pulse signal int_refpz for directing the start of the subsequent refresh cycle is outputted. The refresh control circuit 1191 repeats the above-described refresh cycle operation during a period in which all of the count values rblcz<3:0> of the refresh burst length counters are not zero (L level). If the all count values rblcz<3:0> become zero (L level), the refresh control circuit 191 does not output the internal refresh pulse signal int_refpz for directing the start of anew refresh cycle. If the all count values rblcz<3:0> are changed to zero (L level) by the stop command from the address terminal A<5>, the refresh control circuit 1191 also does not output the internal refresh pulse signal int_refpz anymore.

The core control circuit 1085 shown in FIG. 137 has a refresh address comparison circuit 1370. This refresh address comparison circuit 1370 sets the refresh-all signal rblcallz to H in response to the refresh-all command REFALL, and monitors the refresh addresses ref_az<13:0> of the refresh address counters 1083. When the refresh address comparison circuit 1370 detects that all refresh addresses ref_az<13:0> are H, the refresh address comparison circuit 1370 sets the refresh-all signal rblcallz to L. In response to the refresh-all command REFALL, the refresh pulse signal int_refpz is outputted, whereby a refresh operation is started. During a period where the refresh-all signal rblcallz=H until all of the refresh addresses ref_az<13:0> of the refresh address counter 1083 become H, the refresh control circuit 1191 continues outputting the internal refresh pulse signal int_refpz. Then, when the refresh-all signal rblcallz is brought to L by the refresh addresses ref_az<13:0>=all H, the refresh control circuit 1191 stops outputting the internal refresh pulse signal int_refpz, whereby the subsequent refresh cycles are no longer generated. It should be noted that the refresh address counter 1083 counts down the refresh addresses ref_az<13:0> in response to the sense amplifier activation signal saonz. The countdown may be performed in response to the internal refresh pulse signal int_refpz in place of this sense amplifier activation signal saonz.

FIG. 138 is a truth table showing a relationship between a refresh burst length set in the refresh burst length register 1231 and the address terminals A<3:0>. The values of the address terminals A<3:0> are set in the register 1231 directly as the refresh burst length.

FIG. 139 is a configuration diagram of the core control circuit 1085 that performs the countdown refresh burst control. In this circuit the refresh burst length counter 1230 is reset to ALL=0 in response to a stop command REFSTOP. The other configurations are the same as those of the circuit diagram shown in FIG. 137.

FIG. 140 shows a circuit diagram of the timing control circuit 1190 and of the refresh control circuit 1191 within the core control circuit 1085. As in the above explanation, the timing control circuit 1190 has the RS flip-flop FF1 that is set in response to the signals, the active pulse signal actpz that is inputted at the time of a normal operation, the refresh pulse signal refpz that is inputted at the time of a background refresh operation, and the internal refresh pulse signal int_refpz that is inputted during a refresh burst operation.

When the flip-flop FF1 is set, the active state signal rasz<#> and the like are outputted, whereby the core is subjected to an active operation.

Then, the refresh control circuit 1191 sets the refresh interval signal refitvalx to H after a lapse of a delay time DELAY-6 after the active state signal rasz<#> is brought to the L level, and outputs the internal refresh pulse signal int_refpz for directing the start of the subsequent refresh cycle. Furthermore, the refresh control circuit 1191 outputs the down signal downz=H of the pulse width of a delay time DELAY-7 in response to a word line drive signal wlonz<#>=H, and counts down the count value of the refresh burst length counter 1230.

An output of a NAND gate 1400 is brought to the L level when all of the refresh burst length count values rblcz<3:0>=L and when the refresh-all signal rblcallz=L, whereby the output of the internal refresh pulse signal int_refpz is prohibited via an AND gate 1401. In the normal state, the refresh-all signal rblcallz=L, thus when all of the refresh burst length count values rblcz<3:0> become L during the refresh burst operation, the output of the internal refresh pulse signal int_refpz is prohibited. Moreover, during a period where the refresh-all signal rblcallz corresponding to the refresh-all command is H, the internal refresh pulse signal int_refpz is outputted regardless of the refresh burst length count values rblcz<3:0>.

It should be noted that the address-terminal A<10> shown in FIG. 140 is a signal for directing a pre-charge operation for all banks that the SDRAM has, and resets the RS flip-flop FF1 to control the pre-charge operation. The specific operation of the above-described circuit is described hereinlater.

FIG. 141 and FIG. 142 each shows a circuit diagram of the refresh burst length register 1231 and of the refresh burst length counter 1230. FIG. 141 is an example in which the stop command is inputted by the background refresh command BREN and address terminal A<5>, while FIG. 142 is an example in which the stop command is inputted by a dedicated command REFSTOP. The other configurations are the same with each other.

The refresh burst length register 1231 incorporates the refresh burst length from the address terminals A<3:0> into latch circuits 1410, 1412 in response to a refresh pulse signal refpz. Gates 1411, 1413 outputs the latched values directly as the refresh burst length register values rblrz<3:0>, since normally a down signal downz and a self refresh mode signal srefz are both in the L level. Furthermore, the refresh burst length register 1231 sets the register values rblrz<3:0> to 0001 in response to the self refresh signal srefz=H that directs the conventional refresh operation of the SDRAM.

The refresh burst length counter 1230 has a down counter 1414 that incorporates the register value rblrz<3:0> in response to the refresh pulse signal refpz=H, and down counts the register values in response of the down signal downz=H. The down counter 1414 resets all rblcz<3:0> to L in response to the refresh pulse signal refpz=H and address terminal A<5>=H corresponding to the stop command (in response to the refresh stop command REFSTOP in the example shown in FIG. 142).

FIG. 143 shows a circuit diagram of the refresh address counter 1083 and of the refresh address comparison circuit 1370. The refresh address counter 1083 is a 14-bit counter, and counts down the refresh addresses ref_az<13:0> in response to the refresh bank selection signal ref_bnkz<#>=H and the sense amplifier activation signal saonz<#>=H.

The refresh address comparison circuit 1370 has an RS flip-flop FF4 that is set in response to the refresh-all command REFALL, and a group of NAND gages 1432 for detecting whether all of the refresh addresses ref_az<13:0> are H. In the normal state, the RS flip-flop FF4 is reset, a node 1430 is in the H level, and the refresh-all signal rblcallz is L. Then, the RS flip-flop FF4 is set in response to the refresh-all command REFALL, whereby the node 1430 is brought to the L level, and the refresh-all signal rblcallz becomes H. During a period where rblcallz=H, the refresh operation is repeated by the refresh control circuit 1191, and the refresh address counter 1083 is down counted every time the sense amplifier activation signal saonz becomes H. When all of the refresh addresses ref_az<13:0> are changed from L to H, the NAND group 1432 detects this change, brings the node 1431 to the H level, and sets the refresh-all signal rblcallz to L. In response to this, the refresh control circuit 1191 stops the refresh operation, and the RS flip-flop FF4 is reset. Accordingly, a refresh-all operation for refreshing all of the remaining addresses within the refresh address counter 1083 is ended.

FIG. 144 is a timing chart showing the case in which the RBL of the countdown core control circuit is 3. The refresh pulse signal refpz=H is generated in response to the background refresh command BREN, in response to which the register 1231 and counter 1230 shown in FIGS. 141 and 142 are reset, and the refresh burst length register values rblrz<3:0> and the refresh burst length counter values rblcz<3:0> are all set to 0011b. The output of the NAND 1400 of the refresh control circuit 1191 shown in FIG. 140 is changed from L to H by rblcz<3:0>=0011b, and the internal refresh pulse signal int_refpz=H is outputted. Also, the RS flip-flop FF1 of the timing control circuit 1190 shown in FIG. 140 is set, the active state signal rasz is brought to the H level, and the refresh control circuit 1191 sets the refresh interval signal refitvalx to L by means of an AND gate 1402, whereby the internal refresh pulse signal int_refpz=L is set.

Then, the core is subjected to the active operation, and the refresh control circuit 1191 outputs the down signal downz=H via an AND gate 1430 in response to the sense amplifier activation signal saonz=H. In response to this, the refresh burst length counter 1230 shown in FIGS. 141 and 142 counts down the count values rblcz<3:0>. The refresh control circuit 1191 sets the refresh interval signal refitvalx to H after a lapse of the delay time DELAY-6 since the active state signal rasz has been brought to the L level, and outputs a new internal refresh pulse signal int_refpz.

Then, once the abovementioned refresh cycle is repeated three times, the count values rblcz<3:0> of the refresh burst length counter becomes 0000b, then the output of the NAND gate 1400 of the refresh control circuit 1191 is brought to the L level, and subsequent internal refresh pulse signals int_refpz are not outputted by the AND gate 1401. In this manner, the refresh operation of the burst length 3 is ended.

FIG. 145 is a timing chart of a refresh stop operation performed by the countdown core control circuit. In this example, a refresh operation is stopped by the stop command during the refresh operation of the refresh burst length RBL=3. Once a refresh start command is inputted by the background refresh command BREN and address terminal A<5>=L, a refresh operation is started. The starting operation is the same as the one shown in FIG. 144. Then, when the refresh stop command is inputted by the background refresh command BREN and address terminal A<5>=H at a lock number 7, the refresh burst length counter 1230 (FIG. 141) is reset, and the counter values rblcz<3:0> thereof become 0000b. In response to this, the output of the NAND gate 1400 of the refresh control circuit 1191 is brought to the L level, and subsequent internal refresh pulse signals int_refp are not outputted. It should be noted that the pre-charge of the refresh cycle is controlled by the timing control circuit 1190 in the same manner as the control of the normal operation.

FIG. 146 is a timing chart of the refresh stop operation of the countdown core control circuit. Unlike FIG. 145, the stop control is performed by the refresh stop command REFSTOP. The other configurations are the same as those shown in FIG. 145.

FIG. 147 is a timing chart showing the refresh-all operation of the countdown core control circuit. REFALL=H is set in response to the refresh-all command REFALL, the RS flip-flop FF4 of the refresh address comparison circuit 1370 (FIG. 143) is set, the node 1430 is brought to the L level, and the refresh-all signal rblcallz=H is set. Accordingly, the output of the NAND gate 1400 of the refresh control circuit 1191 (FIG. 140) is brought to the H level, and the internal refresh pulse signal int_refpz=H is outputted, whereby the refresh cycle is started.

The refresh addresses ref_az<13:0> of the refresh address counters 1083 (FIG. 143) are counted down in every refresh cycle. When all of the ref_az<13:0> are L (count value 0000h) and all of the ref_az<13:0> are H (count value 3FFFh), the NNAD gate group (FIG. 143) detects such change, whereby the refresh-all signal rblcallz=L is set, the NAND gate 1400 of the refresh control circuit 1191 (FIG. 140) is brought to the L level, and then the output of the internal refresh pulse signal int_refpz is stopped. Accordingly, the refresh operation performed on each of the remaining refresh addresses is ended, and the count values of the refresh address counters 1081 are all reset to 1.

FIG. 148 is a timing chart showing an operation for resetting the refresh command, the operation being performed by the countdown core control circuit. In this figure, at the first background refresh command BREN, the refresh burst length RBL=14 (A<3:0>=1110b) is set to start a refresh operation, and the refresh burst length counter is counted down in every refresh operation. Then, the refresh burst length RBL=2 (A<3:0>=0010b) is further inputted at the second command BREN before the refresh burst length counter values rblcz<3:0> become 0000b, and new refresh burst length RBL=2 (A<3:0>=0010b) is added to these counter values rblcz<3:0>=1101b, whereby the counter values rblcz<3:0> become 1101b (thirteen times remaining).

In this manner, the function of adding the refresh burst length by means of a new background refresh command is provided in the refresh burst control, whereby the memory controller can preferentially issue the background refresh command in order to perform the background refresh operation in the future.

FIG. 149 is a timing chart showing an operation for resetting the refresh command, the operation being performed by the countdown core control circuit. In this example, the refresh burst length RBL=2 (A<3:0>=0010b) is inputted at the second command BREN, the new refresh burst length RBL=2 (A<3:0>=0010b) is overwritten in place of the counter values rblcz<3:0> obtained at that moment, and the counter values rblcz<3:0> become 0010b (two times remaining).

In this manner, the function of rewriting the refresh burst length by means of a new background refresh command is provided in the refresh burst control, whereby the memory controller can cancel the background refresh operation that has been started once, to start new background refresh operation. By adding and rewriting the burst length RBL by means of the new background refresh command as shown in FIGS. 148 and 149, after the refresh operation is started the contents thereof can be changed freely, and the flexibility of the control of the memory controller can be improved.

[Active and Refresh Interlocking Control]

Next, control for interlocking an active operation and a refresh operation is described. In the embodiment described above, the active command ACT in the normal memory operation and the command BREN in the background refresh operation are different commands. The memory controller issues these commands separately, and thereby causes the memory device to execute the normal memory operation and the background refresh operation.

In the following embodiment, on the other hand, setting is performed so as to execute the background refresh operation in conjunction with an active command in the mode register or the like beforehand, whereby the memory device performs a normal active operation in a selected bank and a refresh operation in a refresh target bank in response to the input of the active command for the normal memory operation. Such a function is provided so that the memory controller does not have to issue the background refresh command.

FIG. 150 is a timing chart showing the active and refresh interlocking control. At a clock number 2, an active command ACT and a bank address BA=2 are inputted, in response to which the memory device executes an active operation in BANK2 and a refresh operation in BANK1. Furthermore, at a clock number 4, an active command ACT and a bank address BA=3 are inputted as shown in the table in the figure, in response to which the memory device executes the active operation in BANK3 and the refresh operation in BANK0.

Specifically, as shown in the table in the figure, in response to the values of the bank addresses BA<1:0> that are inputted along with the active commands ACT, the memory device executes the refresh operation in a specific bank. More specifically, if the BANK0 is selected by the active command, the refresh operation is performed in the BANK3, if the BANK1 is selected by the active command, the refresh operation is performed in the BANK2, if the BANK2 is selected by the active command, the refresh operation is performed in the BANK1, and if the BANK3 is selected by the active command, the refresh operation is performed in the BANK0. By using such combinations, even in either the memory mapping 1170 or 1171 shown in FIG. 117, the active command issued when horizontal access is made can be used to perform a background refresh on a bank, which is not a horizontal access target.

In the present embodiment, the background refresh operation is executed once in response to the active command ACT. Therefore, the refresh burst length RBL is fixed to 1.

FIG. 151 is a circuit diagram of the refresh bank decoder in the active and refresh interlocking control. When the mode value modez=H, an AND gate group 1510 within the refresh bank decoder 1082 outputs a refresh bank selection signal ref_bnkz<#>=H in response to each of the bank selection signals bnkz<#>=H outputted by the normal bank decoder. The relationship between the bank selected in the normal active operation and the refresh selection bank is as shown in the table of FIG. 150. On the other hand, when the mode value modez=L, the AND gate group 1510 sets all of the refresh bank selection signals ref_bnkz<3:0> to L and prohibits the refresh operation performed in collaboration.

The mode value modez=H/L is set in an incorporated register beforehand by the mode register set command EMRS. Alternatively, the mode value modez=H/L is inputted from a predetermined external terminal. Therefore, according to the example described above, preferably the mode value modez=H is set in the case of a horizontal access, and the background refresh operation is performed in conjunction with the active command ACT. In the case of a rectangular access, preferably the mode value modez=L is set, and the background refresh operation is prohibited.

FIG. 152 is a circuit diagram of the core control circuit in the active and refresh interlocking control. The core control circuit 1085 is provided in each bank, thus the controls performed in the banks are distinguished from one another by the bank selection signals bnkz<#> and refresh bank selection signals ref_bnkz<#>. First, in a selected bank (bnkz<#>=H), the RS flip-flop FF1 of the timing control circuit 1190 is set via a NAND gate 1520 in response to the active pulse signal actpz=H, and the active state signal rasz is brought to the H level, whereby the core is subjected to the active operation.

In the refresh selection bank (ref_bnkz<#>=H), on the other hand, the RS flip-flop FF1 is set via a NAND gate 1521 in response to the active pulse signal actpz =H, and the active state signal rasz is brought to the H level, whereby the core is subjected to the active operation. At the same time, the RS flip-flop FF3 within the refresh control circuit 1191 is also set via a NAND gate 1522 in response to the active pulse signal actpz=H, and the refresh active state signal ref_rasz is set to the H level. The refresh operation is started by setting the active state signal rasz to the H level, and then the RS flip-flop FF1 is reset by the refresh pre-charge pulse signal ref_prepz=H brought in response to the sense amplifier activation signal saonz=H, whereby the pre-charge operation is performed. At the same time, the RS flip-flop FF3 is reset.

FIG. 153 is a circuit diagram of the address latch circuit in the active and refresh interlocking control. This circuit also is provided in each bank. In the selected bank (bnkz<#>=H), the address latch circuit 1084 latches an external address az<13:0> in the latch circuit 1200 in response to the active pulse signal actpz=H. In the refresh selection bank (ref_bnkz<#>=H), on the other hand, the latch circuit 1200 latches the refresh address ref_az<13:0> of the refresh address counter 1083 in response to the active pulse signal actpz=H. Moreover, in response to a normal refresh pulse signal refpz=H as well, the latch circuit 1200 latches the refresh address ref_az<13:0>. The other configurations are the same as those shown in FIG. 128.

As described above, in response to the normal active command, the normal active operation and the background refresh operation are executed in parallel in accordance with a combination of banks that is set beforehand.

[Control using Refresh Block Count]

Next, control that is performed using the refresh block count RBC according to the present embodiment is described. In the background refresh operation of the present embodiment, in addition to the refresh burst length RBL that defines the number of refresh cycles, the number of blocks (the number of word lines) RBC that are activated simultaneously in a single refresh cycle can be set.

By increasing the refresh block count RBC, a refresh can be executed on a larger number of refresh addresses simultaneously. Therefore, when a period in which the background refresh can be performed is short, it is desired that the refresh block count RBC be large. On the other hand, if the refresh block count RBC is increased, the refresh operation is executed on a larger number of word lines simultaneously, and the amount of power that is consumed instantly is increased. Therefore, if the period in which the background refresh can be performed is long, it is desired that the refresh block count be small as much as possible. Thus, the memory controller sets the refresh block count RBC to an optimal value in accordance with the period in which the background refresh can be performed and the conditions of the power consumption.

FIG. 154 is a configuration diagram of a bank circuit. As described with reference to FIG. 108, each bank 92 has the refresh address counter 1083, the address latch circuit 1084, a memory cell array 1086M configuring the core circuit, and a row decoder 1086D. The memory cell array 1086M has four blocks, RBLK 0 through 3, that are constituted by memory cell arrays MCA 0 through 3 and pairs of sense amplifier columns SA00, 01 through SA30, 31. All of the four blocks RBLK 0 through 3 have the sense amplifier column SA, and thus are activated simultaneously so that a refresh operation can be performed. Then, one or both of the upper two bits of the count value REF_A<13:0> of the refresh address counter 1083 degenerate (inverted and non-inverted addresses are set to the H level). Due to this degeneration, the row address RA<13:0> that is inputted to the row decoder 1086D becomes an address that can perform any of the operations of activating the four blocks RBLK 0 through 3 simultaneously, activating two blocks simultaneously, and activating one block.

FIG. 155 is a figure showing control of the memory block within the core corresponding to the refresh block count. In the case in which the refresh block count RBC=1 (modez<1:0>=00), the word line WL of the memory block RBLK0, which is a refresh target within the core, is driven in response to the background refresh command BREN, whereby a refresh operation is performed. In the case in which the refresh block count RBC=2 (modez<1:0>=01), the word lines WL of two memory blocks RBLK0, 2, which are the refresh targets within the core, are driven in response to the background refresh command BREN, whereby the refresh operation is performed. In the case in which the refresh block count RBC=4 (modez<1:0>=11), the word lines WL of the four memory blocks RBLK 0, 1, 2 and 3, which are the refresh targets within the core, are driven in response to the background refresh command BREN, whereby the refresh operation is performed.

FIG. 156 is a circuit diagram of the address latch circuit. As shown in a truth table in the figure, 1, 2 or 4 indicates the number of word lines that are activated simultaneously by the signals modez <0> though <1> setting the refresh block count RBC set in the mode register.

The address latch circuit 1084 has a latch group 1564 that latches a non-inverted signal and inverted signal of an upper 2-bit address out of 14-bit row address, and a latch group 1565 that latches lower 12-bit address. The latch group 1564 latches non-inverted signals of external addresses az <13> and <12> and inverted signals obtained by inventors 1566 and 1567, in response to an active pulse signal actpz. Similarly, the latch group 1564 latches non-inverted signals of refresh addresses REF_A <13> and <12> and inverted signals obtained by invertors 1568 and 1569, in response to a refresh pulse signal refpz. However, the non-inverted signals and inverted signals of the refresh address REF_A <13> and <12> are caused to degenerate to the H level by NAND gates 1560 through 1563 in response to signals modez <0> and <1> set in the mode register. Accordingly, the word lines of a plurality of memory blocks can be driven simultaneously.

FIG. 157 is a circuit diagram of a predecoder circuit within the row decoder. This predecoder circuit generates block selection signals rblkz<3:0> for selecting four memory blocks by means of a combination of non-inverted signals raz <12> and <13> and inverted signals rax <12> and <13> of an upper 2-bit row address. An operation performed by the predecoder circuit is shown in the table in the figure.

The operations shown in FIG. 156 and FIG. 157 are as follows.

First of all, in the case in which RBC=1, modez<0>=modez<1>=0, raz<13> and REF_A<13> are in-phase, rax<13> and REF_A<13> are reversed-phase, and raz<12> and REF_A<12> are in-phase, rax<12> and REF_A<12> are reversed-phase.

One of the four Blocks RBLK is selected by the pre-decoder circuit 1086D, whereby one word line WL of the selected block is activated.

Next, in the case in which RBC=2, modez<0>=1, modez<1>=0, raz<13> is set to High, rax<13> is also set to High, raz<12> and REF_A<12> are in-phase, and rax<12> and REF_A<12> are reversed-phase. Then, two of the four Blocks RBLK are selected by the pre-decoder circuit 1086D, whereby two word lines WL of the selected blocks are activated.

Finally, in the case in which RBC=4, modez<0>=1, modez<1>=1, raz<13> is set to High, rax<12> is also set to High, raz<13> is set to High, and rax<12> is also set to High. Then, four of the four Blocks RBLK are selected by the pre-decoder circuit 1086D, whereby four word lines WL of the selected blocks are activated.

The above is the explanation of the memory device having the background refresh-function. Next, the memory controller that controls the memory device and causes the memory device to perform the background refresh operation is described.

[Memory Controller Controlling Background Refresh]

In order to cause the memory device to execute the background refresh function, the memory controller needs to provide the background refresh command BREN, refresh bank information SA, and refresh burst length RBL to the memory device. Furthermore, it is preferred that the memory controller provide the refresh block count RBC to the memory device. Hereinafter, the memory controller that controls a background refresh is described.

FIG. 158 is a configuration diagram of a memory system having the background refresh function. An image processing device 81 outputs a horizontal access request or rectangular access request for accessing two-dimensionally arrayed image data to the memory controller 82, and the memory controller performs access control on the memory device 86. The image processing device 81 outputs an access request signal REQ, an access type signal ATYP, an image address ADR, an image size signal SIZE, and a read/write signal RWX to the memory controller 82, in response to which the memory controller 82 replies with an acknowledge signal ACK. Further, write data or read data is transferred by means of a data bus DATA, while asserting a strobe signal STB.

On the basis of the access request and various information sent from the image processing device 81, the memory controller 82 outputs the background refresh command, refresh bank information SA, refresh burst length RBL, and the refresh block count RBC to the memory device 86 in the case of a horizontal access, and further outputs an active command CMD, a bank address BA, a row address RA, a read or write command CMS, a bank address BA, and a column address CA that correspond to the horizontal access, to the memory device 86. Further, the memory controller 82 outputs similar signals corresponding to a rectangular access to the memory device 86. Then, the memory controller 82 outputs write data DQ to the memory device 86 in the case of a write access, and inputs read data DQ from the memory device 86 in the case of a read access.

FIG. 159 is a figure showing an example of memory mapping. The figure shows a relationship between the various information items that the memory controller 82 receives from the image processing device 81. This memory mapping 12 correspond to frame image data constituted by a total of 2048 pixels in which 64 pixels are arranged in an X direction and 32 pixels are arranged in a Y direction. A block constituted by 8×8 pixels is associated with a page area that is specified by a bank address BA and a row address RA. Each of the pixels has, for example, one byte of image data. In the page areas, the odd-numbered rows are associated with bank addresses BA0, BA1, and the even-numbered rows are associated with bank addresses BA2, BA3.

In such memory map 12, an upper left pixel corresponds to an image address of ADR=0x00, POSX, POSY=0, 9. A right end pixel in the first row corresponds to an image address of ADR=0x03F, POSX, POSY=0, 63. A left end pixels in the 32$^{nd}$ row corresponds to an image address of ADR=0x7C0, POSX, POSY=31, 0. In this case, the image address ADR can be expressed by the position information POSX, POSY of the upper left pixels in an access area. Specifically, for the 12 bits of image addresses ADR[11:0],

POSY[5:0]=ADR[11:6], POSX[5:0]=ADR[5:0].

Therefore, the memory controller 82 can obtain the position information POSX and POSY of the upper left pixel of the access area from the image addresses ADR received from the image processing device 81. It should be noted that in the example shown in FIG. 159, since there are thirty-two pixels in a vertical direction, the position information POSY[5:0] in the vertical direction may have 5 bits.

Next, the size in a horizontal direction of the access area, SIZEX, and the size in a vertical direction, SIZEY, are supplied by the image size signal SIZE and access type signal ATYP respectively. Specifically, SIZEX=SIZE and SIZEY=ATYP. In the case of a horizontal access, SIZEY=ATYP=0_0000b is supplied, and in the case of a rectangular access, the value of SIZEY=ATYP is any value other than 0. Therefore, the memory controller 82 can discriminate whether an access is a horizontal access or rectangular access, based on whether the value of the access type signal ATYP is 0 or not.

FIG. 160 is a figure showing a front pixel address and the size information in a horizontal access and a rectangular access. In the case of the horizontal access (A), the front pixel address and the size are SIZEX=SIZE, SIZEY=ATYP=0, as shown. In the case of the rectangular access (B), the front pixel address and the size are SIZEX=SIZE, SIZEY=ATYP, as shown.

Also, on the basis of the memory map 12, the memory controller 82 can obtain the bank address BA and row address RA of the front pixel in the access area from the position information POSX, POSY of the upper left pixel in the access area. The memory controller 82 can discriminate whether to access a plurality of banks, on the basis of the position information POSX and POSY of the upper left pixel of the access area, and the size information SIZE and ATYP.

Furthermore, the memory controller 82 can obtain the number of pixels accessing the memory device, on the basis of the size information SIZE and ATYP, and can further determine that the next memory access request is not generated for a period of time corresponding to the number of clock cycles required for transferring at least the data on the number of pixels to the image processing device. The memory controller 82 can further obtain the refresh burst length RBL in a background refresh on the basis of such period of time, and can also obtain the refresh block count RBC.

FIG. 161 is a configuration diagram of the memory controller. This memory controller 82 has a horizontal access determination section 1610, a refresh burst length RBL calculator 1611, an active bank number generating section 1612, a background refresh bank number generating section 1613, a memory interface 1614, a controller 1615 incorporated in the memory interface 1614, and the like. These components configure one of a plurality of sequencers SEQ shown in FIG. 90. Therefore, a plurality of sequencers SEQ shown in FIG. 161 are provide in accordance with a plurality of access sources.

The horizontal access determination section 1610 uses a first comparator CMP1 to determine whether the access type signal ATYP indicating the size in a vertical direction SIZEY is "0" or not. The output of the first comparator CMP1 is "1" if ATYP=0. The horizontal access determination section 1610 further uses a second comparator CMP2 to determine whether the size signal SIZE indicating the size in a horizontal direction SIZEX exceeds the number of clocks MEMREF in a single refresh cycle. The output of the second comparator CMP2 is "1" if SIZE≧MEMREF. Therefore, if the outputs of both comparators are "1", an AND gate outputs a background refresh enable signal "1", and requests the controller 1615 to issues a background refresh command. The number of clocks MEMREF described above is set in, for example, a register within a memory controller.

Next, the refresh burst length RBL calculator 1611 calculates the refresh burst length RBL in a background refresh. Specifically, by dividing the size in a horizontal direction SIZE by the number of clocks MEMREF, the possible number of refresh cycles can be obtained. This division is performed by a bit shift circuit SFT. Then, the refresh burst length RBL is outputted by the address terminals A[7:4] to the memory device as 0 through 15 or 1 through 16, as shown in, for example, FIG. 123 and FIG. 138.

Also, the active bank number generating section 1612 has an adder ADD, a third comparator CMP3, a decoder DEC0, a selector SEL0, and a decoder DEC1. The decoder DEC1 converts an input signal to an output signal with reference to a table. The active bank number generating section 1612 obtains a bank address corresponding to an access area, on the basis of the size signal SIZE and image address ADR supplied from the image processing device. This bank address BA[1:0] indicates a bank number to be outputted along with an active command.

FIG. 163 is a table for explaining the decoder DEC0 and selector SEL0 of the active bank number generating section. In the active bank number generating section 1612, the adder ADD adds a lower 3-bit ADR[2:0] of an image address ADR and the size signal SIZE, which is the size in a horizontal direction. The lower 3-bit ADR[2:0] of the image address is the lower three bits of the position information POSX=ADR [5:0] on a position in a horizontal direction of a front pixel, and is the information indicating the position of a pixel within a page area composed of 8×8 pixels in the memory map 12 shown in FIG. 159. Then, the comparator CMP3 determines whether the value, which is obtained by adding the size in the horizontal direction SIZE to the lower 3-bit ADR[2:0] of the image address ADR, exceeds "8" or not. If the value does not exceed "8", only one page area is accessed horizontally, thus only one bank is subjected to an active operation. If the value exceeds "8", a plurality of page areas are accessed horizontally, thus two banks have to be subjected to an active operation. Then, the decoder DEC0 outputs selection control signals 0 through 7 of the selector SEL0 on the basis of the output of the comparator CMP3 that indicates that one bank or two banks are active, as well as ADR[9]=POSY[3] and ADR[3]=POSX[3], which is the fourth bit of the position information of the front pixel in the access area.

In the memory map shown in FIG. 159, each page area is constituted by 8×8 pixels, thus the relationship between ADR [9]=POSY[3] and ADR[3]=POSX[3]which are the fourth bit of the position information POSX, POSY of the front pixel, and the bank address BA[1:0] is as follows.

ADR[9]=POSY[3], ADR[3]=POSX[3]=0, 0 BA[1:0]=0, 0 (bank BA0)

ADR[9]=POSY[3], ADR[3]=POSX[3]=0, 1 BA[1:0]=0, 1 (bank BA1)

ADR[9]=POSY[3], ADR[3]=POSX[3]=1, 0 BA[1:0]=1, 0 (bank BA2)

ADR[9]=POSY[3], ADR[3]=POSX[3]=1, 1 BA[1:0]=1, 1 (bank BA3)

Also, in a memory map that is different from the one shown in FIG. 159, the relationship with the above bank addresses differs.

FIG. 163 shows output signals of the decoder DEC0 (selection control signals 0 through 7 of the SEL0) corresponding to a combination of an output SIZE+ADR[2:0] of the adder ADD and ADR[9]=POSY[3], ADR[3]=POSX[3]. Furthermore, FIG. 163 shows input terminals ACTBA 0 through 7 of the selector SEL0 that are selected in accordance with the output signals of the decoder DEC0 (selection control signals 0 through 7 of the SEL0).

Specifically, the decoder DEC0 outputs the outputs "0" through "7" with respect to the four combinations of ADR[9]=POSY[3], ADR[3]=POSX[3] for the case in which SIZE+ADR[2:0] exceeds or does not exceed 8. As described above, the four combinations of ADR[9]=POSY[3], ADR[3]=POSX[3] are associated with bank addresses in which the front pixels of an access area are positioned. Also, in the case in which SIZE+ADR[2:0] does not exceed 8, only one bank may be active, and in the case in which [SIZE+ADR [2:0]] exceeds 8, two banks have to be activated.

The active bank number generating section 1612 shown in FIG. 161 has the selector SEL0 that selects values set to ACTBA 0 through 7 of a register 543 in response to selections signals constituted by the outputs 0 through 7 of the decoder DEC0, and the decoder DEC1 that converts the set values of ACTBA 0 through 7 of the register 543, which are selected by the selector SEL0, to an active bank number ACT_BA[1:0], with reference to the Table.

FIG. 164 is a table for explaining the meanings of values 000b through 111b that can be set to ACTBL of the register 543. It should be noted that "b" means a binary notation. The set values 000b through 011b correspond to the case in which an active bank, which is subjected to an active operation in accordance with an access area, is any of BA 0 through 3, and set values 100b, 101b, 110b, and 111b each corresponds to the case in which the active bank is BA0&1, BA0&2, BA2&3, or BA1&3. A bank, which is a target of background refresh operation, is as shown in FIG. 164, with respect to the bank activated in the normal memory operation, in accordance with the memory maps Maps 1, 2 and in accordance with whether the background refresh is executed in two banks or one bank. Specifically, the background refresh operation target bank is as follows.

In the case of an active bank BA0 (set value 000b), refresh banks are BA2&3 (MAP1) or BA1&3 (Map2) in two-bank refresh, and the refresh bank is BA2 (Map1) or BA1 (Map2) in one-bank refresh.

In the case of an active bank BA1 (set value 001b), the refresh banks are BA2&3 (MAPL) or BA0&2 (Map2) in two-bank refresh, and the refresh bank is BA3 (Map1) or BA0 (Map2) in one-bank refresh.

In the case of an active bank BA2 (set value 010b), the refresh banks are BA0&1 (MAPL) or BA1&3 (Map2) in two-bank refresh, and the refresh bank is BA0 (Map1) or BA3 (Map2) in one-bank refresh.

In the case of an active bank BA3 (set value 011b), the refresh banks are BA0&1 (MAPL) or BA0&2 (Map2) in two-bank refresh, and the refresh bank is BA1 (Map1) or BA2 (Map2) in one-bank refresh.

In the case of active banks BA0&1 (set value 100b), the refresh banks are BA2&3 (MAP1) in two-bank refresh, and the refresh bank is BA2 or 3 (Map1) in one-bank refresh. The memory map Map 2 is not applicable.

In the case of active banks BA0&2 (set value 101b), the refresh banks are BA1&3 (MAP2) in two-bank refresh, and the refresh bank is BA1 or 3 (Map2) in one-bank refresh. The memory map Map 1 is not applicable.

In the case of active banks BA2&3 (set value 110b), the refresh banks are BA0-&1 (MAPL) in two-bank refresh, and the refresh bank is BA0 or 1 (Map1) in one-bank refresh. The memory map Map 2 is not applicable.

In the case of active banks BA1&3 (set value 111b), the refresh banks are BA0&2 (MAP2) in two-bank refresh, and the refresh bank is BA0 or 2 (Map2) in one-bank refresh. The memory map Map 1 is not applicable.

By defining the set values into the register 543 as described above, it is possible to arbitrarily set a memory mapping to be adopted in the system, the active bank number ACT_BA[1:0] corresponding to the eight cases of the outputs 0 through 7 of the decoder DEC0 in accordance with whether a refresh is a two-bank refresh or one-bank refresh, and the background refresh bank number BR_BA[1:0], BR_A[3:0].

FIG. 165 is a figure showing a conversion table of the decoder DEC1. Active banks are associated with the outputs of the selectors SEL0 (inputs of the DEC1), 0 through 7. This relationship is shown in FIG. 164 as well. Here, the operation of the decoder DEC1 corresponding to the examples of the register set values is described.

FIG. 166 is a table showing a conversion operation performed by the decoder DEC1 corresponding to a first example of the register set values. The register set values of the first example correspond to the memory map Map1, and "01234466" are set in eight input terminals of the selector SEL0. Along with this, the decoder DEC1 generates outputs shown in FIG. 166 (DEC1 Output) with reference to the table of FIG. 165, in response to the output values "01234466" of the selector SEL0, which are selected in accordance with the selection signals of the selector SEL0 (output signals of the decoder DEC0). When the selector output values are "0123", one bank is selected, and when the selector output values are "4466", two banks are selected.

FIG. 167 is a table showing a conversion operation of the decoder DEC1 corresponding to a second example of the register set values. The register set values of the second example correspond to the memory map Map2, and "01235577" are set in the eight input terminals of the selector SEL0. Along with this, the decoder DEC1 generates outputs shown in FIG. 167 (DEC1 Output) with reference to the table of FIG. 165, in response to the output values "01235577" of the selector SEL0. In this case as well, when the selector output values are "0213", one bank is selected, and when the selector output values are "6677", two banks are selected.

The background refresh bank number generating section 1613 shown in FIG. 161 has a selector SEL1 that selects the set values set in BRBA 0 through 3 of the register 543 by means of lower two bits of the output of the selector SEL0, and a decoder DEC2 that converts the selector output to a background refresh target bank numbers BR_BA[1:0], BR_A[3:0]. The background refresh target bank number BR_BA[1:0] corresponds to the case in which two-bank refresh is performed, and corresponds to, for example, the bank address BA[1:0] shown in FIG. 117. Moreover, the background refresh target bank number BR_A[3:0] corresponds to the case in which one-bank refresh is performed, and corresponds to, for example, the address terminal A[3:0] shown in FIG. 118.

FIG. 168 is a table showing an operation of the selector SEL1. The values of the BRBA 0 through 3 that are set in the register 543 are selected by using the lower two bits of the selector SEL0 as the selection signal.

FIG. 169 is a table showing a conversion table of the decoder DEC2. Decoder inputs (DEC2, Input) are values 0 through 7 that can be set in the register 543 in accordance with BRBA 0 through 3, wherein values "0, 1, 2, 3" correspond to one-bank refresh to refresh banks 0 through 3. Further, values "4" and "6" correspond to two-bank refresh when Map1 is used, and banks 0&1, 2&3 are refreshed. Also, values "5" and "7" correspond to two-bank refresh when Map2 is used, and banks 0&2, 1&3 are refreshed. In this case as well, any values can be set in the register 543 in accordance with the memory maps Map1 or Map2, and in accordance with whether a refresh is the one-bank refresh or two-bank refresh.

FIG. 170 is a figure showing an operation of the decoder DEC2 in the case of the first register set value. This example is applied to the two-bank refresh in the memory map Map1, and BRBA 0 through 3 are "6644" respectively in the case of the first register set value. The selector SEL1 selects these set values in accordance with the lower two bits of the output of the selector SEL0, and the decoder DEC2 outputs the background refresh bank number BA[1:0] with reference to the conversion table (FIG. 169). Specifically, if the input of the decoder DEC2 is "6", banks Bank2&3 are refreshed, and if the input is "4", banks Bank0&1 are refreshed.

FIG. 171 is a figure showing an operation of the decoder DEC2 in the case of the second register set value. This example is applied to the two-bank refresh in the memory map Map2, and BRBA 0 through 3 are "7755" respectively in the case of the second register set value. The selector SEL1 selects these set values in accordance with the lower two bits of the output of the selector SEL0, and the decoder DEC2 outputs the background refresh bank number BA[1:0] with reference to the conversion table (FIG. 169). Specifically, if the input of the decoder DEC2 is "7", banks Bank1&3 are refreshed, and if the input is "5", banks Bank0&2 are refreshed.

FIG. 172 is a figure showing an operation of the decoder DEC2 in the case of the third register set value. This example is applied to the one-bank refresh in the memory map Map1, and BRBA 0 through 3 are "2301" respectively in the case of the third register set value. The selector SEL1 selects these set values in accordance with the lower two bits of the output of the selector SEL0, and the decoder DEC2 outputs the background refresh bank number A[3:0] with reference to the conversion table (FIG. 169). Specifically, Banks 2, 3, 0, 1 are refreshed in accordance with the inputs of the decoder DEC2, "2, 3, 0, 1", respectively.

FIG. 173 is a figure showing an operation of the decoder DEC2 in the case of the fourth register set-value. This example is applied to the one-bank refresh in the memory map Map2, and BRBA 0 through 3 are "1302" respectively in the case of the fourth register set value. The selector SEL1 selects these set values in accordance with the lower two bits of the output of the selector SEL0, and the decoder DEC2 outputs the background refresh bank number A[3:0] with reference to the conversion table (FIG. 169). Specifically, Banks 1, 0, 3, 2 are refreshed in accordance with the inputs of the decoder DEC2, "1, 3, 0, 2", respectively.

As described above, there are only four types of combinations of the refresh target banks with respect to the active banks in a normal access operation. Therefore, the inputs of the selector SEL1 are limited to four, but any of the four inputs of the selector SEL1 is selected in accordance with the lower two bits of the three-bit output value of the selector SEL0, whereby the refresh banks corresponding to the active banks can be generated.

Returning to FIG. 161, a background refresh mode signal BRMD is inputted to the controller 1615. This mode signal BRMD is a signal indicating whether a refresh is a four-bank refresh or two- or one-bank refresh, and is set into the register 543. In the casein which the mode signal BRMD is the four-bank refresh, the background refresh operation is prohibited.

The controller 1615 supplies selection signals S2, S3, S4 corresponding to commands BREN, ACT to selectors SEL 2, 3, 4 respectively, when outputting the commands to a command CMD in response to the background refresh enable signal BR_EN. In the case in which the background refresh enable signal BR_EN is in the H level, the controller 1615 causes the selector SEL2 to selects refresh burst length RBL A[7:4], causes the selector SEL3 to select a background refresh bank number BR_BA[1:0], and causes the selector SEL4 to select a background refresh address BR_A[3:0], when outputting the command BREN. As a result, the refresh burst length RBL is outputted from the address terminal A[7:4], and the background refresh bank number BR_BA[1:0] is outputted from the bank address terminal BA[1:0]. The controller 1615 then causes the selector SEL2 to select other A[7:4], causes the selector SEL3 to select an active bank number ACT_BA[1:0], and causes the selector SEL4 to select other A[3:0], when outputting the command ACT. As a result, a normal address A[7:4] is outputted from the address terminal A[7:4], and an active target selection bank address BA[1:0] is outputted from the bank address terminal BA[1:0].

FIG. 162 is a timing chart of the operation of the memory controller. In this example, the image processing device 81 outputs an image address ADR=0x000, size signal SIZE=32, access type signal ATYP=000b, and read/write signal RWX=H, while asserting the access request signal REQ from a clock number 3, and further inputs 32 bytes of read data DATA in 32-clock cycles, while asserting the strobe signal STB from a clock number 22.

On the other hand, the memory controller 82 determines, based on the image address ADR=0x000, size signal SIZE=32, and access type signal ATYP=000b, that a horizontal access is made to the position of a front pixel of image data, POSX, POSY=0, 0, active bank ACT_BA=BA0, BA1, row address RA0, A1, and column address CA0, and that a background refresh is performed on banks BR_BA=BA2, BA3 when the refresh burst length RBL=4. The memory controller 82 then outputs a background refresh command BREN, refresh banks BA 2, 3, and refresh burst length RBL=4 at a clock number 6, further outputs an active command ACT, bank address BA0, and row address RA0 at a clock number 8, outputs an active command ACT, bank address BA1, and row address RA1 at a clock number 10, subsequently outputs a read command RD, bank address BA0, and column address CA0, then outputs a read command RD, bank address BA1, and column address CA0, and outputs a pre-charge command PER, bank address BA0, pre-charge command PER, and bank address BA1. The burst length BL of each read command is 8. Therefore, the memory controller further outputs two pairs of the above-mentioned commands ACT, RD, PRE. As a result, 32 bytes of data d0 through d31 are received from the data terminals DQ of the memory device. Then, the memory controller outputs the data d0 through d31 to the image processing device from the clock number 22 in 32-clock cycles.

The memory controller 82 outputs the appropriate refresh block count RBC to the memory along with the register set command EMRS, and sets the refresh block count RBC and the register set command EMRS into the register of the memory. In this case, the memory controller 82 determines the refresh burst length RBL from the number of clock cycles required in data transfer, in view of the refresh block count RBC, the data being obtained from the size signal SIZE. Moreover, the memory controller 82 outputs the refresh burst length RBL to the memory along with the register set command EMRS, and sets the refresh burst length RBL and the register set command EMRS into the register within the memory.

<<Method of Inputting Parameters>>

The above has described the function for various accesses and refreshes performed on the memory device that stores two-dimensionally arrayed data such as image data. In this case, parameters that are required for realizing various functions are inputted from the memory controller to the memory device. The method of inputting these parameters is described hereinafter.

FIG. 174 is a figure showing a start byte signal SB in a byte boundary. As already described above, in the byte boundary, a start byte signal SB indicating the front byte within four bytes of memory unit area is inputted to the memory device. In FIG. 174, in the case in which an access target is an area 1740 straddling two adjacent page areas that are selected by banks 0, 1 and a row address RA5, a start byte signal SB=2 is supplied to the memory device. Accordingly, two bytes of data B2 and B3 out of the four bytes of data B0 through B3 selected by the column address CA7, which are within a page area with bank 0 and row address RA5, and two bytes of data B0, B1 out of the four bytes of data B0 through B3 selected by the column address CA4, which are within a page area with bank 0 and row address RA5 are associated with the input/output terminals, and the four bytes of data are inputted/outputted. The association of the four bytes of data corresponds to the case in which the memory map 12 is in an up mode. In a down mode, the association of the four bytes of data differs.

Moreover, in the memory device, since the column address CA4 of the adjacent page area is calculated from the column address CA7 of the access area 1740, the step number data CST of the column address within the page area is set to 4 in the register in advance.

FIG. 175 is a figure showing a relationship between second information BMR and first information SB (start byte) of the byte combination data. In the upper half of FIG. 175, the second information BMR corresponds to the up mode, and in the lower half the second information BMR corresponds to the down mode. Each of these parts shows a 4-byte combination that is associated with the input/output terminals in accordance with the start byte SB=0 through 3. The up mode is as shown in FIG. 174. In the down mode, the arrangement of four bytes within a 4-byte area is opposite to that of the up mode. Along with this, the relationship between the start byte SB and the 4-byte combination associated with the input/output terminals is opposite to that of the up mode. The second information BMR is also inputted to the memory device, and is set according to need.

FIG. 176 is a figure showing the row address step RS. In a multi-bank access, on the basis of the bank address and row address of the upper left page area of a rectangular access page area 1760, the memory device obtains the remaining bank addresses and row addresses. In order to do so, step information RS of the row addresses is required as the information on the memory map 12. Therefore, the memory device inputs the row address step information RS and sets the row address step information RS into the register according to need. In the case of the rectangular access area 1760, the bank address BA3 and row address RA1 are provided along with an active command, and, in the case of four-bank access (multi-bank information SA'=4), row addresses RA2, RA5, RA6 are obtained based on RS=4.

FIG. 177 is a figure showing the memory mapping information AR. The figure shows two types of memory mapping. For example, in the case of Type A, AR=0 is inputted, and in the case of Type B, AR=1 is inputted into the memory device, and both are set into the register. In multi-bank access, the access target banks are calculated based on the memory mapping information AR. Moreover, even in a background refresh, the refresh target banks are obtained based on the memory mapping information AR. In the Type A, the odd-numbered rows are constituted by banks 0, 1, while the even-numbered rows are constituted by banks 2, 3. In the Type B, the odd-numbered rows are constituted by banks 0, 2, while the even-numbered rows are constituted by banks 1, 3. The row addresses RA are the same. The example of FIG. 176 shows the Type A.

FIG. 178 is a figure showing the refresh burst length RBL and the refresh block count RBC in a background refresh. In the background refresh, a refresh operation is repeated a number of times corresponding to the refresh burst length RBL in response to a command, and each refresh operation is performed in parallel in the blocks of the refresh block count RBC. FIG. 178(A) is an example in which RBC=2 and RBL=6, wherein a refresh is performed six times by means of a total of twelve word lines. FIG. 178(B) is an example in which RBC=3 and RBL=4, and in this case as well, a refresh is performed four times by means of a total of twelve word lines. FIG. 178(C) is an example in which RBC=4 and RBL=3, and in this case well, a refresh is performed three times by means of a total of twelve word lines.

As described above, the memory device needs to input required parameters in order to realize various accesses. As the method of inputting these parameters, there is a method of using a special input terminal, and a method of using an unused address input terminal. Furthermore, the method of inputting the parameters varies according to whether the memory device is constituted by a single data rate or double data rate SDRAM. The method of inputting the parameters also varies according to whether the address is subjected to multiple input (multiplex system) or non-multiple input (non-multiplex system) These matters are descried hereinafter.

FIG. 179 is a figure showing a configuration of the special input terminal of the memory device, an input buffer thereof, and a mode register. A parameter signal that is inputted by the special input terminal SP is inputted to a special input buffer 1790, a latched signal 1792 is then set into a mode register 1791, and the set signal 1793 is supplied to an unshown internal circuit. However, in the case in which the function corresponding to the parameter signal (byte boundary function, multi-bank access function, background refresh function) is disabled, the corresponding parameter needs to be set to a default value.

Here, in accordance with an enable signal 1794, which indicates whether the functions are enabled disabled, if the functions are enabled, the inputted parameters are set in the mode register 1791, and if the functions are disabled, the default values are set into the mode register 1791 as the parameters. Moreover, the input buffer 1790 introduces signals from the special input terminal SP if the functions are enabled, but the enable signal 1794 is clamped to the H level if the functions are disabled. Therefore, in the case of the disabled functions, it is not necessary to connect the special input terminal SP and the input buffer 1790 by means of a bonding wire.

FIG. 180 is a figure showing a configuration of the special input terminal, input buffer thereof, and mode register within the memory device. Here, there is shown an example in which, out of the various parameters, the start byte SB, multi-bank information SA', and refresh bank information SA are inputted from the special input terminal.

A two-bit start byte SB is inputted from a special input terminal SP0, then introduced to an input buffer 1790-0, and set into a mode register 1791-0. Setting into the mode register 1791-0 is performed in response to a mode register set pulse MRSPZ. However, in the case in which an enabled signal 1800 is disabled, the mode register 1791-0 is set to a default value (SB=0, start byte=0), and the output of the input buffer 1790-0 is clamped. This enable signal 1800 is supplied from a mode register MRS, bonding option, fuse circuit and the like, which are not shown.

Similarly, two-bit multi-bank information SA' then inputted from a special input terminal SP1, and introduced into an input buffer 1790-1, and is set into a mode register 1791-1. Setting into the mode register 1791-1 is performed in response to the mode register set pulse MRSPZ. In the case in which the enable signal 1800 is disabled, the value of the mode register is set to a default value in the same manner described above (SA'=0, only one bank is selected), and the output of the input buffer is clamped.

Similarly, two-bit refresh bank information SA is inputted from a special input terminal SP2, and set into a mode register 179102. Further, in the case in which an enable signal 1802 is disabled, the value of the mode register is set to a default value in the same manner described above (SA=3, all banks are selected), and the output of the input buffer is clamped. The two-bit information items SB, SA' are inputted from two special terminals in parallel, respectively. Alternatively, these information items may be inputted serially from one special terminal.

FIG. 181 is a figure showing an example of the mode register. In this example, the abovementioned parameters are set inputted from address terminals and set into the mode register. The figure shows mode register areas 1810, 1811 and 1812. Input values and set values of address terminals A0 through A6 are shown in accordance with each combination of bank addresses BA0, BA1, and a rising edge RiseEdge and a falling edge FallEdge of a synchronous clock.

First, when a mode register set command MRS is inputted along with the bank addresses BA0=0, BA1=0, burst lengths that are inputted from the address terminals A0 through A2 and read latencies that are inputted from the address terminals A3 through A5 are set into the mode register 1810 at the clock rising edge RiseEdge, while write recovery values that are inputted from the address terminals A0 through A2 are set at the falling edge FallEdge.

Next, when the mode register set command MRS is inputted along with the bank addresses BA0=1, BA1=0, values (not shown) that are inputted from the address terminals A0 through A5 are set into the mode register 1811 at the clock rising edge RiseEdge, and a byte shift function flag BS, second information BMR of the byte combination information, multi-bank function flag MB, a background refresh function flag BR, and memory mapping information AR that are inputted from the address terminals A0 through A4 are set at the falling edge FallEdge. It should be noted that there are shown only the information items that indicate whether the signals are enabled or disabled. However, as described above, information that indicates the byte shift information SB, multi-bank information SA', refresh bank information SA, refresh block count RBC or the like can also be set.

Furthermore, when the mode register set command MRS is inputted along with the bank addresses BA1=0, BA1=1, the row address step information RS that is inputted from the address terminals A0 through A5 is set into the mode register 1812 at the clock rising edge RiseEdge, and the row address step information RS that is inputted from the address terminals A0 through A5 is set at the falling edge FallEdge.

It should be noted that the mode register areas are used when test setting is performed when the bank addresses are BA0=1, BA1=1. A table 1813 shows a normal mode register MRS and an extended mode register EMRS that correspond to the combinations of the bank addresses BA0, BA1. Moreover, tables 1814 through 1819 each shows the values of the address terminals A0 through A6 in the mode register area 1811, and the set values thereof.

FIG. 182 is a figure showing an example of an enable signal generating circuit. FIG. 182(A) shows enable signal generating circuits 1820, 1821 that are set by bonding options. The enable signal generating circuit 1820 has a bonding operation terminal 1825, a power source terminal Vdd, and a ground terminal Vss. The bonding operation terminal 1825 is connected to the power source terminal Vdd by means of a bonding wire, whereby the enable signal 1794 becomes Vdd, and a special access functions is enabled. On the other hand, the enable signal generating circuit 1821 connects the bonding operation terminal 1825 and the ground terminal Vss by means of a bonding wire, whereby the enable signal 1794 becomes Vss, and disables the access function.

FIG. 182(B) shows enable signal generating circuits 1822, 1823 that are set by fuse FS. The enable signal generating circuit 1822 is constituted by a power source Vdd, ground power source Vss, resistance R1, and fuse FS. By fusing the fuse FS, the enable signal 1794 becomes Vdd and enters an enabled state. The enable signal generating circuit 1823 does not fuse the fuse, thus the enable signal 1794 becomes Vss and enters a disabled state.

FIG. 183 is a figure showing an input method in a single data rate (SDR). The figure shows an example in which the parameters are inputted from special terminals (Special Pin 0, 1). In (A) of the figure, along with a background refresh command BREN, the bank addresses BA0, BA1 are inputted from the bank address terminals, and the refresh bank information SA0, SA1 are inputted from the special terminals, in synchronization with a rising edge of a clock CLK (solid line). In (B) of the figure, along with an active command ACT, the bank addresses BA0, BA1 are inputted from the bank address terminals, and the multi-bank information SA'0, SA'1 are inputted from the special terminals, in synchronization with the rising edge of the clock CLK. Although not shown, parameters such as RBL, RBC, AR, RST, CS and the like are inputted from the special terminals along with an extended mode register set command EMRS, in synchronization with the rising edge of the clock CLK.

FIG. 184 is a figure showing an input method in a double data rate (DDR). In this example as well, the parameters are inputted from the special terminals (Special Pin). The relationship between each command and each parameter is the same as the one shown in FIG. 183. Since double data rate is shown in FIG. 184, the bank addresses BA0, 1, and the parameters SAO, SA1, SA'0, SA'1, SB0, and SB1 are inputted in synchronization with the rising edge and falling edge of the clock.

Next, there is described a method of inputting the parameters from unused address terminals without using the special terminals.

FIG. 185 is a figure showing an input method using an ADQ multiplex input system. In the ADQ multiplex input system, an address input terminal and a data input/output terminal are configured by a common terminal, wherein a command is inputted along with an address, and thereafter data is inputted/outputted. Then, in the case in which the number of address terminals is higher than the number of data terminals, the parameters can be inputted from the common terminal along with the addresses, when inputting/outputting the command.

FIG. 185(A) shows a configuration of the input circuit, which is provided with common terminals ADQ (A/DQ0 through A/DQ20, 21 bits) and data terminals DQ (DQ21 through DQ31, 11 bits). The addresses and data share the common terminals ADQ, and only the data use the data terminals DQ. These data terminals DQ can be used to input the parameters. The common terminal ADQ is connected to an address buffer 1850 and an input/output buffer 1852-0, and the address buffer 1850 and the input/output buffer 1852-0 are connected to an address latch circuit 1851 and a memory cell 1853-0 respectively. Also, the data terminal DQ is connected to a special buffer 1854 and an input/output buffer 1852-1, and the special buffer 1854 and the input/output buffer 1852-1 are connected to a mode selector 1855 and a memory cell 1853-1 respectively.

FIG. 185(B) shows a timing chart, and is an example of SDR. First, a 21-bit address ADD is inputted along with a write command WR from the common terminal ADQ, and a parameter SP is inputted from the data terminal DQ. The address ADD is introduced into the address buffer 1850, and the parameter SP is introduced into the special buffer 1854. 32-bit data is inputted from the common terminal ADQ and the data terminal DQ after a lapse of three clocks since the command WR has been inputted. If the command is a read command, data is outputted. The parameter SP that is inputted along with the command is, for example, the multi-bank information SA', refresh bank information SA, start byte SB, or the like.

In the ADQ multiplex, row and column addresses are inputted at once along with the command, and thereafter the data is inputted/outputted, without inputting the active command and the write command in a time-division manner as in an SDRAM. Therefore, when the command and the address are inputted, the parameters can be inputted from unused data terminals DQ.

FIG. 186 is a figure showing an in input method using an address multiplex input system. As the address multiplex input system, there is an input system for an SDRAM or the like. An address terminal Add is shared by a row address and a column address, and the row address and the column address are inputted from the common address terminal Add at a RAS cycle and a CAS cycle respectively. However, in the case in which the number of row addresses is higher than the number of column addresses due to the configuration of the memory cell array, the parameters can be inputted from an address terminal that is not used at the time of the CAS cycle. For example, the start byte SB can be inputted at the CAS cycle.

FIG. 186(A) shows a configuration of an input circuit, wherein the address terminals Add (Add 0 no through 7, 8 bits) are connected to an address buffers 1850-0, 1850-1, and the address buffers are connected to a row address latch circuit 1851-0 and a column address latch circuit 1851-1 respectively. Also, address terminals Add (Add 8 through 13, 6 bits) are connected to an address buffer 1850-2 and a start byte buffer 1860, and the address buffer 1850-2 and start byte buffer 1860 are connected to a row address latch circuit 1851-2 and a start byte selector circuit 1861 respectively.

FIG. 186(B) shows a timing chart, and is an example of SDR. First, an active command AC and 14 bits of row address RA are inputted at a RAS cycle from the address terminals Add[7:0], Add[13:8], and 8 bits of column address CA and a start byte SB[1:0] are inputted at a CAS cycle from the address terminals Add[7:0] and any of the address terminals Add[13:8] respectively, along with a read or write command RD/WR.

FIG. 187 is a figure showing the input method using the address multiplex system in the double data rate (DDR). At the RAS cycle in which the active command ACT is inputted, the 14-bit row address RA is inputted from the address terminals Add[7:0] and Add[13:8] in synchronization with the clock rising edge, and the parameter SP is inputted from the address terminals add[7:0] and Add[13:8] in synchronization with the clock falling edge. This parameter SP is, for example, the row address step information RS, memory map information AR, multi-bank information SA', or the like.

Also, at the CAS cycle in which the read or write command RD/WR is inputted, the 8-bit column address CA is inputted from the address terminals Add[7:0] in synchronization with the clock rising edge, and the parameter SP is inputted from any of the address terminals Add[7:0] in synchronization with the clock falling edge. This parameter SP is, for example, the start byte SB, column address step information CST, access rectangle size information (W, H), bite combination second information BMR (UP, DOWN, ALL, EVEN, ODD), or the like.

In the case of DDR and address multiplex system, there are a total of four input timings, thus unused address terminals can be used to input the parameters.

FIG. 188 is a figure showing the input method using the address multiplex system in the double data rate (DDR). In this example, the number of address terminals is reduced to eight bits of Add[5:0] and Add[7:6]. In the case of DDR and address multiplex system, there are a total of four input timings, thus the unused address terminals still exist even if the number of address terminals is reduced as described above. Therefore, the parameters can be inputted from the unused address terminals.

First of all, at the RAS cycle in which an active command ACT is inputted, an 8-bit row address RA is inputted from the address terminals Add[5:0] and Add[7:6] in synchronization with the clock rising edge, a 6-bit row address RA is inputted from the address terminals Add[5:0] in synchronization with the clock falling edge, and the parameter SP is inputted from the address terminals Add[7:6]. This parameter SP is, for example, the multi-bank information SA', row address step information RS, memory map information AR, or the like.

Also, at the CAS cycle in which a read or write command RD/WR is inputted, an 8-bit column address CA is inputted from the address terminals Add[5:0] and Add[7:6] in synchronization with the clock rising edge, and the parameter SP is inputted from any of the address terminals Add[5:0], Add [7:6] in synchronization with the clock falling edge. This parameter SP is, for example, the start byte SB, column address step information CST, access rectangle size information (W, H), bits combination second information BMR (UP, DOWN, ALL, EVEN, ODD), or the like.

As described above, the parameters that are required for realizing the special functions for byte boundary access, multi-bank access and background refresh can be inputted from the special terminals or unused address terminals. The method of inputting the optimum parameters is selected, the method corresponding to the input system of the memory device.

According to the present invention, the memory cores are caused to execute the refresh operation a number of times corresponding to a plurality of refresh counts, which is set in the refresh target bank, thus the normal memory operation can be started on the refresh target bank within a short time after the background refresh operation is ended, and the decrease of the effective bandwidth can be prevented.

According to the present invention, during the normal memory operation executed by the other memory bank, the memory cores are caused to execute the refresh operation a number of times corresponding to a plurality of refresh counts, which is set in the set refresh target bank, thus the refresh operation and the normal memory operation can be executed in parallel, and the decrease of the effective bandwidth in the normal memory operation, which is caused by the refresh operation, can be prevented. Moreover, the number of times of the background refresh operation performed during the normal memory operation is set beforehand, thus the normal memory operation can be started in the refresh target bank within a short time after the background refresh operation is ended, and the decrease of the effective bandwidth can be prevented.

Further, since the memory device repeats an ordinary memory operation at a specific bank during the horizontal access period, the memory device performs the ordinary memory operation at the selected bank, and performs the refresh operation at a refresh target bank other than the horizontal access target bank. On the other hand, since it can not be predictable which bank will be a memory access target bank during the rectangular access period, it is prohibited to perform the refresh operation together with the ordinary memory operation. The horizontal access can be continued during the back ground refresh operation, accordingly, so that the effective bandwidth can be larger.

What is claimed are:

1. A memory device which is operated in response to a command sent from a memory controller, the memory device comprising:

a plurality of banks which respectively have memory cores including memory cell arrays and are selected by bank addresses; and a control circuit which controls operation of the memory cell arrays within the banks, wherein each of the plurality of banks stores two-dimensionally arrayed data on the basis of a memory mapping of which a memory logical space has a plurality of page areas that are selected by the bank addresses and row addresses, in which the plurality of page areas are arranged in rows and columns, and in which adjacent page areas are associated with different bank addresses, and during a period of horizontal access in which the two-dimensionally arrayed data is accessed horizontally, the control circuit causes the memory cores within banks selected by the bank addresses to execute normal memory operation corresponding to a normal operation command in response to the normal operation command corresponding to the horizontal access, and further causes a memory core within a refresh target bank other than the horizontal access target bank to execute refresh operation in response to a background refresh command.

2. The memory device according to claim 1, wherein, during a period of rectangular access in which an arbitrary rectangular area of the two-dimensionally arrayed data is accessed, the control circuit causes the memory cores within the banks selected by the bank addresses and within banks adjacent to the selected banks, to execute the normal memory operation in response to the normal operation command, and prohibits the refresh operation during the normal memory operation.

3. A memory system, comprising:

a memory controller; and a memory device which is operated in response to a command from the memory controller, wherein the memory device has a plurality of banks which respectively have memory cores including memory cell arrays and are selected by bank addresses, each of the plurality of banks stores two-dimensionally arrayed data on the basis of a memory mapping of which a memory logical space has a plurality of page areas that are selected by the bank addresses and row addresses, in which the plurality of page areas are arranged in rows and columns, and in which adjacent page areas are associated with different bank addresses, and the memory device further has a control circuit which causes the memory cores within banks selected by the bank addresses to execute normal memory operation corresponding to a normal operation command in response to the normal operation command during a period of horizontal access in which the two-dimensionally arrayed data is accessed horizontally, and further causes a memory core within a refresh target bank other than the horizontal access target bank to execute refresh operation in response to a background refresh command.

4. The memory system according to claim 3, wherein, during a period of rectangular access in which an arbitrary rectangular area of the two-dimensionally arrayed data is accessed, the control circuit causes the memory cores within the banks selected by the bank addresses and within banks adjacent to the selected banks, to execute the normal memory operation in response to the normal operation command, and prohibits the refresh operation during the normal memory operation.

* * * * *